United States Patent
Moslehi

(10) Patent No.: US 7,999,174 B2
(45) Date of Patent: *Aug. 16, 2011

(54) SOLAR MODULE STRUCTURES AND ASSEMBLY METHODS FOR THREE-DIMENSIONAL THIN-FILM SOLAR CELLS

(75) Inventor: Mehrdad Moslehi, Los Altos, CA (US)

(73) Assignee: Solexel, Inc., Milpitas, CA (US)

( * ) Notice: Subject to any disclaimer, the term of this patent is extended or adjusted under 35 U.S.C. 154(b) by 253 days.

This patent is subject to a terminal disclaimer.

(21) Appl. No.: 11/868,491

(22) Filed: Oct. 6, 2007

(65) Prior Publication Data

US 2009/0301549 A1 Dec. 10, 2009

Related U.S. Application Data

(60) Provisional application No. 60/828,678, filed on Oct. 9, 2006, provisional application No. 60/886,303, filed on Jan. 24, 2007.

(51) Int. Cl.
*H02N 6/00* (2006.01)
*H01L 31/042* (2006.01)
*H01L 31/00* (2006.01)
(52) U.S. Cl. ......... 136/251; 136/255; 136/256; 136/261
(58) Field of Classification Search .............. 136/251, 136/255, 256, 261
See application file for complete search history.

(56) References Cited

U.S. PATENT DOCUMENTS

| | | |
|---|---|---|
| 4,043,894 A | 8/1977 | Gibbs |
| 4,070,206 A | 1/1978 | Kressel et al. |

(Continued)

FOREIGN PATENT DOCUMENTS

JP 06-260670 A 9/1994

OTHER PUBLICATIONS

Alvin D. Compaan, Photovoltaics: Clean Power for the 21st Century, Solar Energy Materials & Solar Cells, 2006, pp. 2170-2180, vol. 90, Elsevier B.V.

(Continued)

*Primary Examiner* — Basia Ridley
*Assistant Examiner* — Allison Bourke
(74) *Attorney, Agent, or Firm* — Hulsey, P.C.; William N. Hulsey, III; John Temple Keller

(57) ABSTRACT

Solar module structures 210 and 270 and methods for assembling solar module structures. The solar module structures 210 and 270 comprise three-dimensional thin-film solar cells 110 arranged in solar module structures 210 and 270. The three-dimensional thin-film solar cell comprises a three-dimensional thin-film solar cell substrate (124 and 122, respectively) with emitter junction regions 1352 and doped base regions 1360. The three-dimensional thin-film solar cell further includes emitter metallization regions and base metallization regions. The 3-D TFSC substrate comprises a plurality of single-aperture or dual-aperture unit cells. The solar module structures 270 using three-dimensional thin-film solar cells comprising three-dimensional thin-film solar cell substrates with a plurality of dual-aperture unit cells may be used in solar glass applications. The solar module structures 210 using three-dimensional thin-film solar cells comprising three-dimensional thin-film solar cell substrates with a plurality of single-aperture unit cells may be used in building façade and rooftop installation applications as well as for centralized solar electricity generation.

5 Claims, 186 Drawing Sheets

U.S. PATENT DOCUMENTS

| Patent No. | | Date | Inventor(s) | Ref. |
|---|---|---|---|---|
| 4,082,570 | A | 4/1978 | House et al. | |
| 4,165,252 | A | 8/1979 | Gibbs | |
| 4,249,959 | A | 2/1981 | Jebens | |
| 4,251,679 | A | 2/1981 | Zwan | |
| 4,348,254 | A | 9/1982 | Lindmayer | |
| 4,361,950 | A * | 12/1982 | Amick | 438/98 |
| 4,409,423 | A | 10/1983 | Holt | |
| 4,427,839 | A | 1/1984 | Hall | |
| 4,461,922 | A | 7/1984 | Gay et al. | |
| 4,479,847 | A | 10/1984 | McCaldin et al. | |
| 4,626,613 | A | 12/1986 | Wenham et al. | |
| 4,672,023 | A | 6/1987 | Leung | |
| 4,922,277 | A | 5/1990 | Carlson | |
| 5,024,953 | A | 6/1991 | Uematsu et al. | |
| 5,073,230 | A | 12/1991 | Maracas et al. | |
| 5,112,453 | A | 5/1992 | Behr et al. | |
| 5,208,068 | A | 5/1993 | Davis | |
| 5,248,621 | A | 9/1993 | Sano | |
| 5,316,593 | A * | 5/1994 | Olson et al. | 136/262 |
| 5,348,618 | A | 9/1994 | Canham et al. | |
| 5,397,400 | A * | 3/1995 | Matsuno et al. | 136/256 |
| 5,458,755 | A | 10/1995 | Fujiyama et al. | |
| 5,459,099 | A | 10/1995 | Hsu | |
| 5,494,832 | A | 2/1996 | Lehmann et al. | |
| 5,538,564 | A | 7/1996 | Kaschmitter | |
| 5,645,684 | A | 7/1997 | Keller | |
| 5,660,680 | A | 8/1997 | Keller | |
| 5,681,392 | A | 10/1997 | Swain | |
| 5,882,988 | A | 3/1999 | Haberern et al. | |
| 5,899,360 | A | 5/1999 | Mack et al. | |
| 5,928,438 | A | 7/1999 | Salami | |
| 5,994,640 | A * | 11/1999 | Bansemir et al. | 136/244 |
| 6,058,945 | A | 5/2000 | Fujiyama et al. | |
| 6,091,021 | A | 7/2000 | Ruby | |
| 6,096,229 | A | 8/2000 | Shahid | |
| 6,114,046 | A | 9/2000 | Hanoka | |
| 6,127,623 | A | 10/2000 | Nakamura et al. | |
| 6,143,629 | A | 11/2000 | Sato | |
| 6,204,443 | B1 * | 3/2001 | Kiso et al. | 136/259 |
| 6,225,193 | B1 | 5/2001 | Simpson et al. | |
| 6,294,725 | B1 | 9/2001 | Hirschberg et al. | |
| 6,331,208 | B1 | 12/2001 | Nishida et al. | |
| 6,399,143 | B1 | 6/2002 | Sun et al. | |
| 6,416,647 | B1 | 7/2002 | Dordi et al. | |
| 6,428,620 | B1 | 8/2002 | Yamagata et al. | |
| 6,429,037 | B1 | 8/2002 | Wenham et al. | |
| 6,441,297 | B1 | 8/2002 | Keller et al. | |
| 6,448,155 | B1 | 9/2002 | Iwasaki et al. | |
| 6,461,932 | B1 | 10/2002 | Wang | |
| 6,524,880 | B2 | 2/2003 | Moon et al. | |
| 6,534,336 | B1 | 3/2003 | Iwane | |
| 6,551,908 | B2 | 4/2003 | Ukiyo et al. | |
| 6,555,443 | B1 | 4/2003 | Artmann et al. | |
| 6,566,235 | B2 | 5/2003 | Nishida et al. | |
| 6,602,760 | B2 | 8/2003 | Poortmans et al. | |
| 6,602,767 | B2 | 8/2003 | Nishida et al. | |
| 6,613,148 | B1 | 9/2003 | Rasmussen | |
| 6,624,009 | B1 | 9/2003 | Green et al. | |
| 6,645,833 | B2 | 11/2003 | Brendel | |
| 6,649,485 | B2 | 11/2003 | Solanki et al. | |
| 6,653,722 | B2 | 11/2003 | Blalock | |
| 6,664,169 | B1 | 12/2003 | Iwasaki et al. | |
| 6,756,289 | B1 | 6/2004 | Nakagawa et al. | |
| 6,818,104 | B2 | 11/2004 | Iwasaki et al. | |
| 6,881,644 | B2 | 4/2005 | Malik et al. | |
| 6,946,052 | B2 | 9/2005 | Yanagita et al. | |
| 6,964,732 | B2 | 11/2005 | Solanki | |
| 7,014,748 | B2 | 3/2006 | Matsumura et al. | |
| 7,022,585 | B2 | 4/2006 | Solanki et al. | |
| 7,026,237 | B2 | 4/2006 | Lamb | |
| 7,309,658 | B2 | 12/2007 | Lazovsky et al. | |
| 7,368,756 | B2 | 5/2008 | Bruhns et al. | |
| 7,402,523 | B2 | 7/2008 | Nishimura | |
| 2002/0079290 | A1 | 6/2002 | Holdermann | |
| 2002/0153039 | A1 | 10/2002 | Moon et al. | |
| 2002/0168592 | A1 | 11/2002 | Vezenov | |
| 2002/0179140 | A1 * | 12/2002 | Toyomura | 136/251 |
| 2003/0017712 | A1 | 1/2003 | Brendel | |
| 2003/0039843 | A1 | 2/2003 | Johnson | |
| 2003/0124761 | A1 | 7/2003 | Baert | |
| 2004/0028875 | A1 | 2/2004 | Van Rijn | |
| 2004/0173790 | A1 | 9/2004 | Yeo | |
| 2004/0175893 | A1 | 9/2004 | Vatus et al. | |
| 2004/0192044 | A1 | 9/2004 | Degertekin et al. | |
| 2004/0235406 | A1 | 11/2004 | Duescher | |
| 2004/0259335 | A1 | 12/2004 | Narayanan | |
| 2004/0265587 | A1 | 12/2004 | Koyanagi | |
| 2005/0160970 | A1 | 7/2005 | Niira | |
| 2005/0172998 | A1 | 8/2005 | Gee et al. | |
| 2005/0176164 | A1 | 8/2005 | Gee et al. | |
| 2005/0177343 | A1 | 8/2005 | Nagae | |
| 2005/0199279 | A1 | 9/2005 | Yoshimine et al. | |
| 2005/0274410 | A1 | 12/2005 | Yuuki et al. | |
| 2005/0281982 | A1 | 12/2005 | Li | |
| 2006/0021565 | A1 | 2/2006 | Zahler et al. | |
| 2006/0043495 | A1 | 3/2006 | Uno | |
| 2006/0054212 | A1 | 3/2006 | Fraas et al. | |
| 2006/0070884 | A1 | 4/2006 | Momoi et al. | |
| 2006/0105492 | A1 | 5/2006 | Veres et al. | |
| 2006/0177988 | A1 | 8/2006 | Shea et al. | |
| 2006/0196536 | A1 | 9/2006 | Fujioka et al. | |
| 2006/0231031 | A1 | 10/2006 | Dings et al. | |
| 2006/0266916 | A1 | 11/2006 | Miller et al. | |
| 2006/0283495 | A1 | 12/2006 | Gibson | |
| 2006/0286775 | A1 | 12/2006 | Singh et al. | |
| 2007/0077770 | A1 | 4/2007 | Wang et al. | |
| 2007/0082499 | A1 | 4/2007 | Jung et al. | |
| 2008/0047601 | A1 | 2/2008 | Nag et al. | |
| 2008/0128641 | A1 | 6/2008 | Henley et al. | |
| 2008/0157283 | A1 | 7/2008 | Moslehi | |
| 2008/0210294 | A1 | 9/2008 | Moslehi | |
| 2008/0264477 | A1 | 10/2008 | Moslehi | |
| 2008/0289684 | A1 | 11/2008 | Moslehi | |
| 2008/0295887 | A1 | 12/2008 | Moslehi | |
| 2009/0042320 | A1 | 2/2009 | Wang et al. | |
| 2009/0107545 | A1 | 4/2009 | Moslehi | |
| 2009/0301549 | A1 | 12/2009 | Moslehi | |
| 2010/0022074 | A1 | 1/2010 | Wang et al. | |
| 2010/0116316 | A1 | 5/2010 | Moslehi et al. | |

OTHER PUBLICATIONS

C.Berge, 150-mm Layer Transfer for Monocrystalline Silicon Solar Cells, Solar Energy Materials & Solar Cells, 2006, pp. 3102-3107, vol. 90, Elsevier B.V.

C.Oules et al, Silicon on Insulator Structures Obtained by Epitaxial Growth of Silicon over Porous Silicon, Journal of the Electrochemical Society, Inc., 1992, p. 3595, vol. 139, No. 12, Meylan Cedex, France.

C.S.Solanki, et al, Porous Silicon Layer Transfer Processes for Solar Cells, Solar Energy Materials & Solar Cells, 2004, pp. 101-113, vol. 83, Elsevier B.V., Leuven, Belgium.

C.S.Solanki, et al, Self-Standing Porous Silicon Films by One-Step Anodizing, Journal of Electrochemical Society, 2004, pp. C307-C314, vol. 151, The Electrochemical Society, Inc., Leuven, Belgium.

F.Duerinckx, et al, Reorganized Porous Silicon Bragg Reflectors for Thin-Film Silicon Solar Cells, IEEE Electron Device Letters, Oct. 2006, vol. 27, No. 10.

Francois J. Henley, Layer-Transfer Quality Cleave Principles, SiGen, Jul. 8, 2005 pp. 1-6, The Silicon Genesis Corporation, San Jose, California.

H.J.Kim, et al, Large-Area Thin-Film Free-Standing Monocrystalline Si Solar cells by Layer Transfer, Leuven, Belgium, IEEE, 2006.

J.H.Werner et al, From Polycrystalline to Single Crystalline Silicon on Glass, Thin Solid Films, 2001, pp. 95-100, vol. 383, Issue 1-2, Elsevier Science B.V., Germany.

J.J. Schermer et al., Epitaxial Lift-Off for large area thin film III/V devices, phys. Stat. sol. (a) 202, No. 4, 501-508 (2005).

K. Van Nieuwenhuysen et al., Progress in epitaxial deposition on low-cost substrates for thin-film crystalline silicon solar cells at IMEC, Journal of Crystal Growth, 2006, pp. 438-441, vol. 287, Elsevier B.V., Leuven, Belgium.

K.L. Chopra et al., Thin-Film Solar Cells: An Overview, Progress in Photovoltaics: Research and Applications, 2004, pp. 69-92, vol. 12, John Wiley & Sons, Ltd.

Lammert et al., The Interdigitated Back Contact Solar Cell: A Silicon Solar Cell for Use in Concentrated Sunlight, IEEE Transactions on Electron Devices, pp. 337-342, 1977.

MacDonald et al., "Design and Fabrication of Highly Topographic Nano-imprint Template for Dual Damascene Full 3-D Imprinting," Dept. of Chemical Eng., University of Texas at Austin, Oct. 24, 2005.

Martin A. Green, Consolidation of Thin-Film Photovoltaic Technology: The Coming Decade of Opportunity, Progress in Photovoltaics: Research and Applications, 2006, pp. 383-392, vol. 14, John Wiley & Sons, Ltd.

Martin A. Green, Silicon Photovoltaic Modules: A Brief History of the First 50 Years, Progress in Photovoltaics: Research and Applications, 2005, pp. 447-455, vol. 13, John Wiley & Sons, Ltd.

Nobuhiko Sato et al, Epitaxial Growth on Porous Si for a New Bond and Etchback Silicon-on-Insulator, Journal of Electrochemical Society, Sep. 1995, vol. 142, No. 9, The Electrochemical Society, Inc., Hiratsuka, Japan.

P.J. Verlinden, et al, Sliver® Solar Cells: A New Thin-Crystalline Silicon Photovoltaic Technology, Solar Energy Materials & Solar Cells, 2006, pp. 3422-3430, vol. 90, Elsevier B.V.

P.R. Hageman et al., Large Area, Thin Film Epitaxial Lift Off III/V Solar Cells, 25th PVSC, May 13-17, 1996, Washington D.C., IEEE.

Photovoltaic Technology Research Advisory Council, A Vision for Photovoltaic Technology, 2005, pp. 1-41, European Commision Publications Office.

Prometheus Institute, U.S. Solar Industry Year in Review: U.S. Solar Energy Industry Charging Ahead, (SEIA) The Solar Energy Industry Association, 2006.

R. Brendel, et al, Sol-Gel Coatings for Light Trapping in Crystalline Thin Film Silicon Solar Cells, Journal of Non-Crystalline Solids, 1997, pp. 391-394, vol. 218, Elsevier Science B.V., Germany.

Richard Auer et al, Simplified Transfer Process for High-Current Thin-Film Crystalline Si Solar Modules, 3rd World Conference on Photovoltaic Energy Conversion, May 11-18, 2003, Osaka, Japan.

Richard M. Swanson, A Vision for Crystalline Silicon Photovoltaics, Progress in Photovoltaics: Research and Applications, 2006, pp. 443-453, vol. 14, John Wiley & Sons, Ltd.

Rolf Brendel, A Novel Process for Ultrathin Monocrystalline Silicon Solar Cells on Glass, 14th European Photovolaic Solar Energy Conference, Jun. 30-Jul. 4, 1997, Barcelona, Spain.

Rolf Brendel, Review of Layer Transfer Processes for Crystalline Thin-Film Silicon Solar Cells, The Japan Journal of Applied Physics, 2001, pp. 4431-4439, vol. 40, Part 1, No. 7, The Japan Society of Applied Physics, Japan.

Rolf Brendel, Thin-Film Crystalline Silicone Mini-Modules Using Porous Si for Layer Transfer, Solar Energy, 2004, pp. 969-982, vol. 77, Elsevier Ltd., Germany.

S. Hegedus, Thin Film Solar Modules: The Low Cost, High Throughput and Versatile Alternative to Si Wafers, Progress in Phovltaics: Research and Applications, 2006, pp. 393-411, vol. 14, John Wiley & Sons, Ltd.

Toshiki Yagi, et al, Ray-Trace Simulation of Light Trapping in Silicon Solar Cell with Texture Structures, Solar Energy Materials & Solar Cells, 2006, pp. 2647-2656, vol. 90, Elsevier B.V.

* cited by examiner

Competitive Advantages of Current Invention

1. < 1 gram of silicon per watt
2. Decoupled from silicon supply chain
3. No polysilicon feedstock cost
4. No crystal growth cost
5. No wire saw cost
6. No wafer saw damage removal cost
7. No texturing cost
8. No lithography cost for cell processing
9. Fewer process steps - self aligned flow
10. Reduced PV fab capital cost
11. >60% reduction in module mfg. cost/Wp
12. Ultra-high-efficiency cells & modules

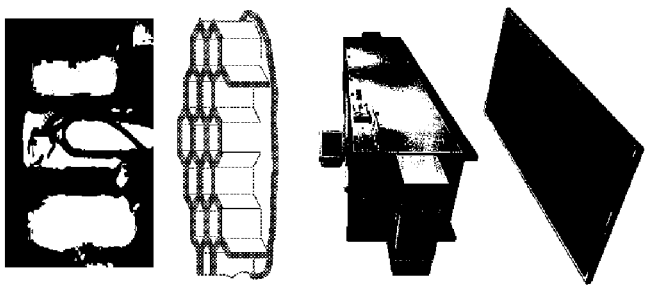

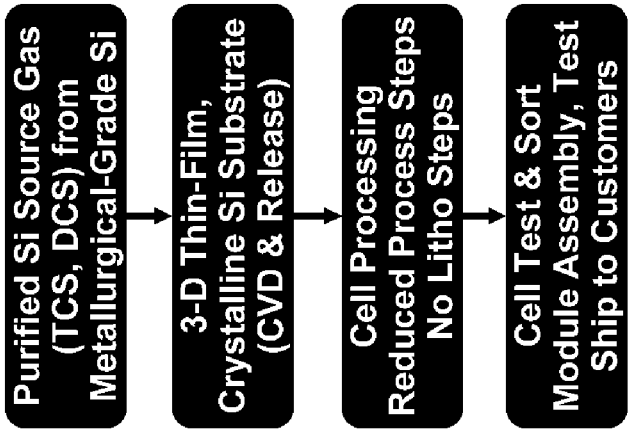

Purified Si Source Gas (TCS, DCS) from Metallurgical-Grade Si → 3-D Thin-Film, Crystalline Si Substrate (CVD & Release) → Cell Processing Reduced Process Steps No Litho Steps → Cell Test & Sort Module Assembly, Test Ship to Customers

*FIG. 4*

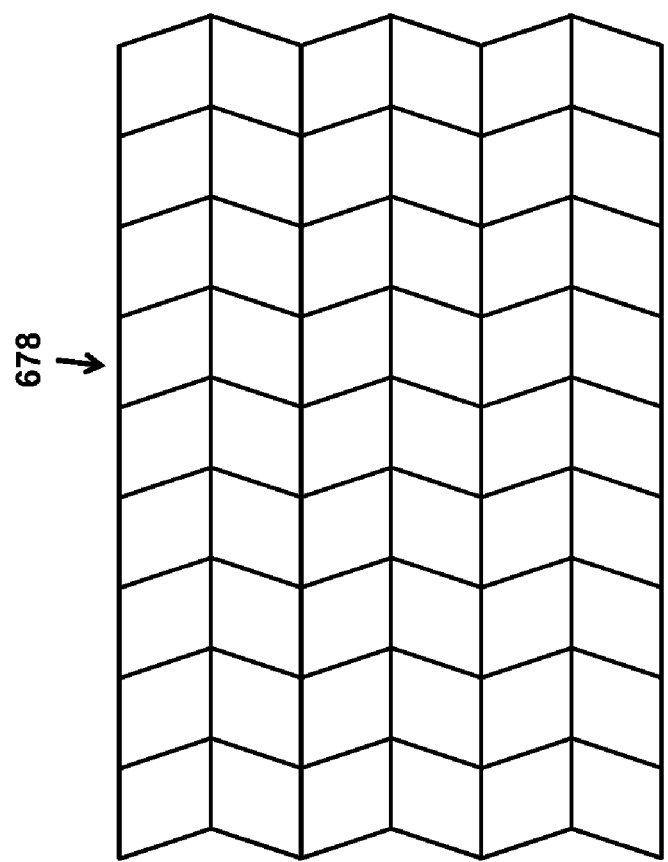
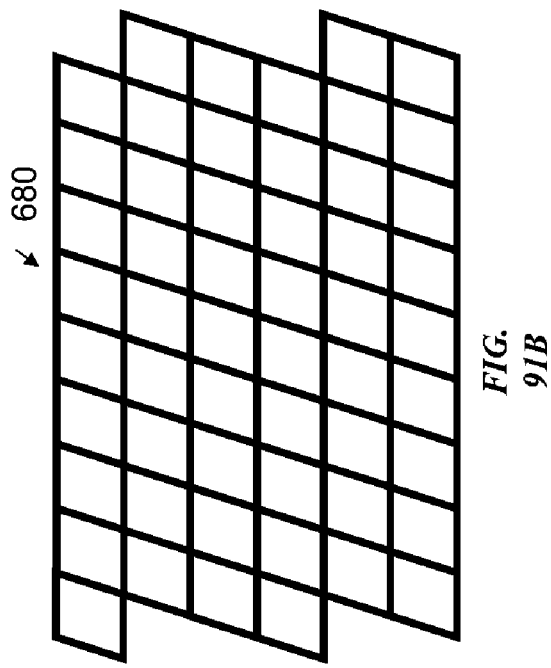
FIG. 91A
FIG. 91B

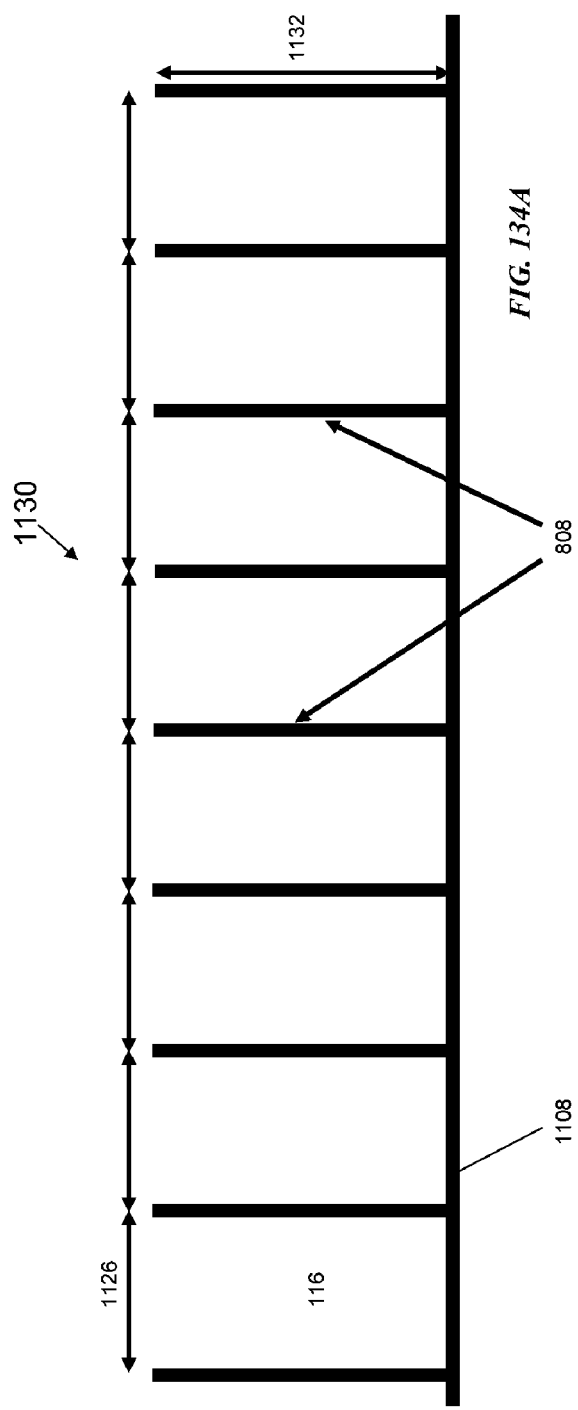
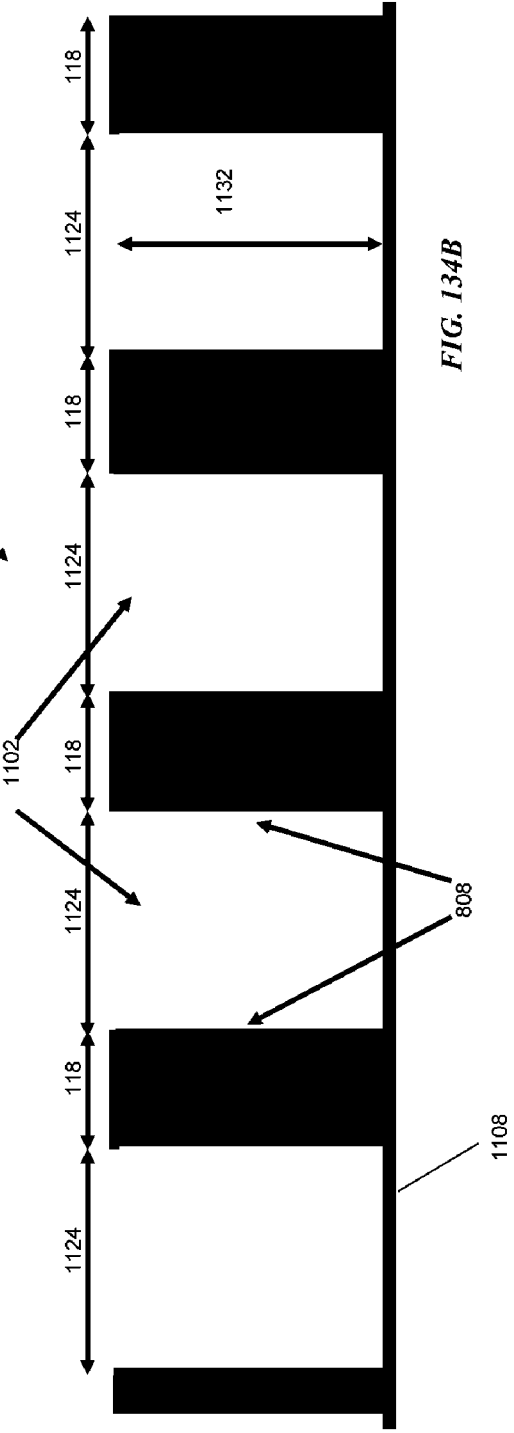
FIG. 134A
FIG. 134B

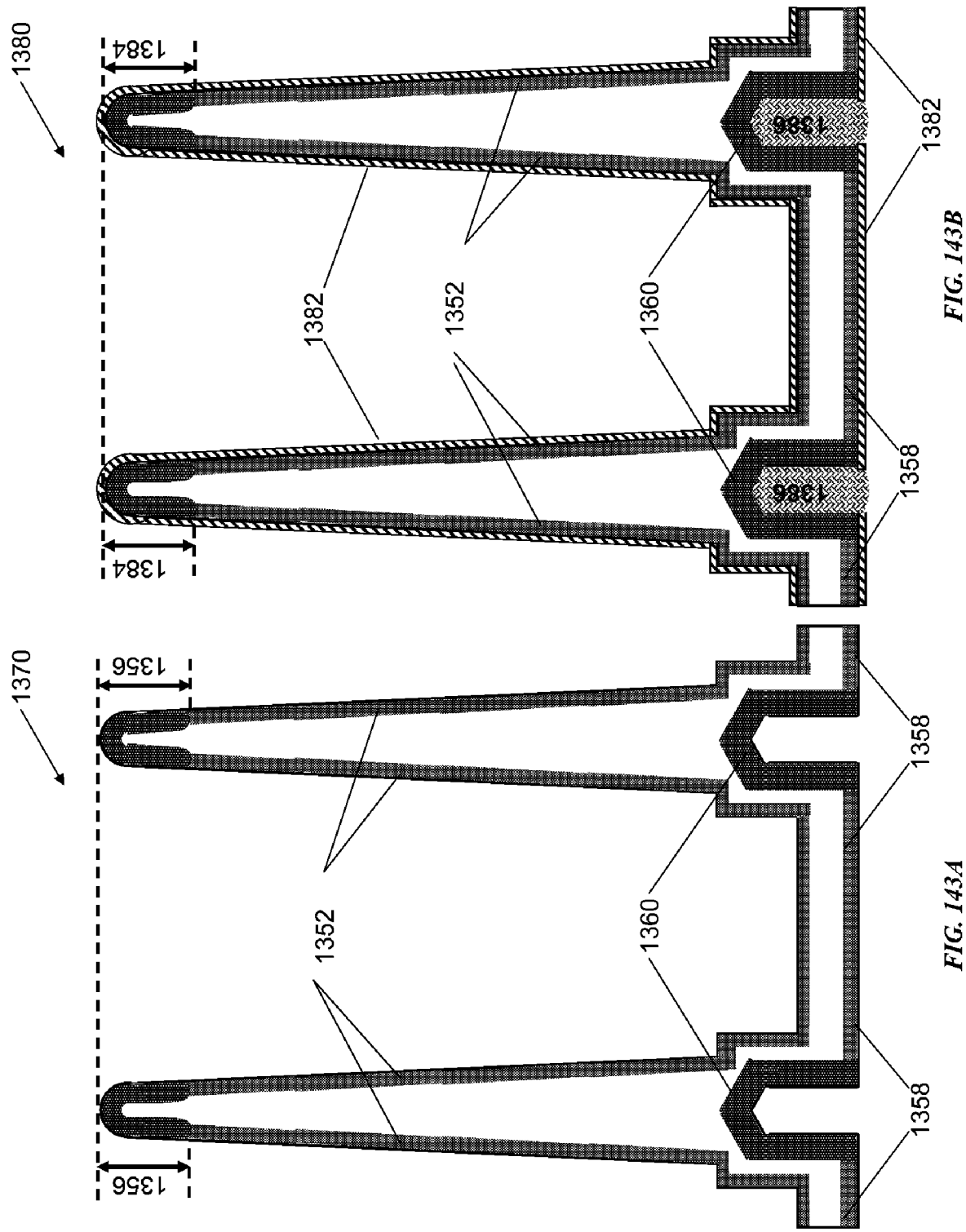

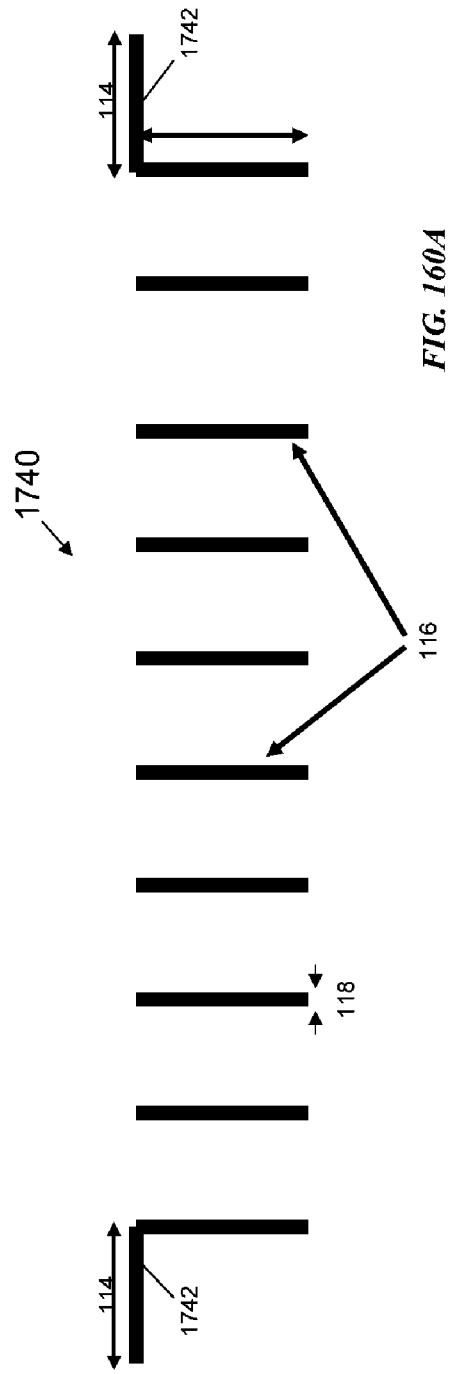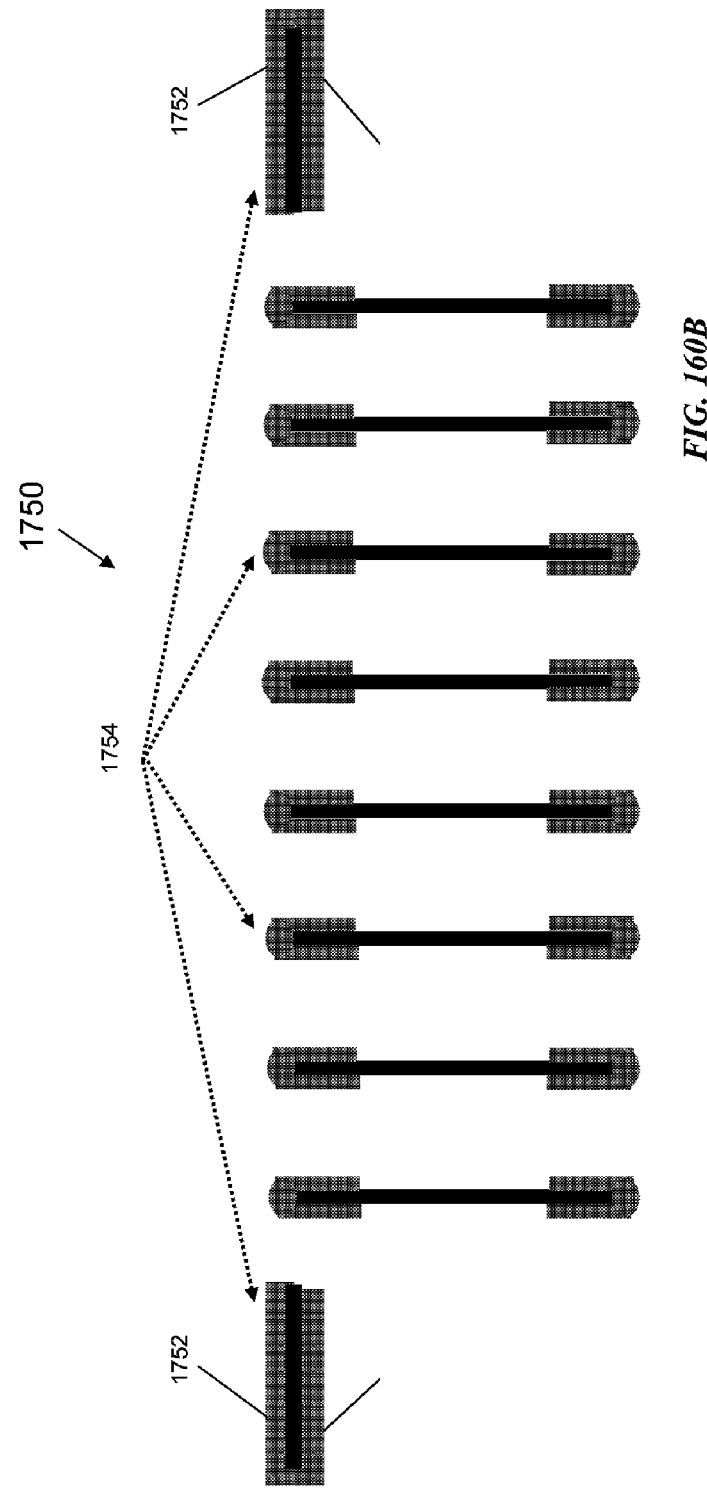

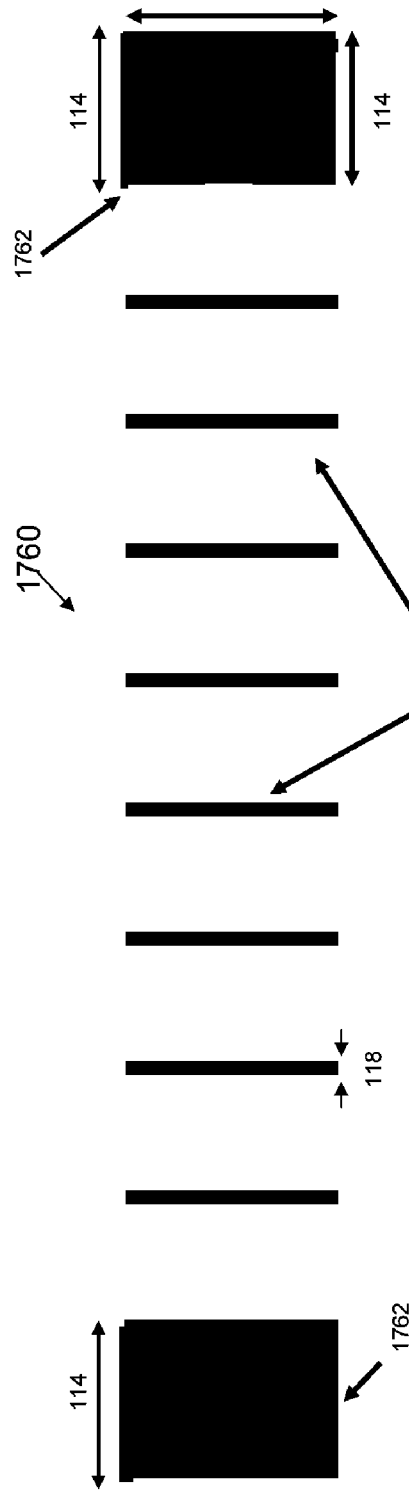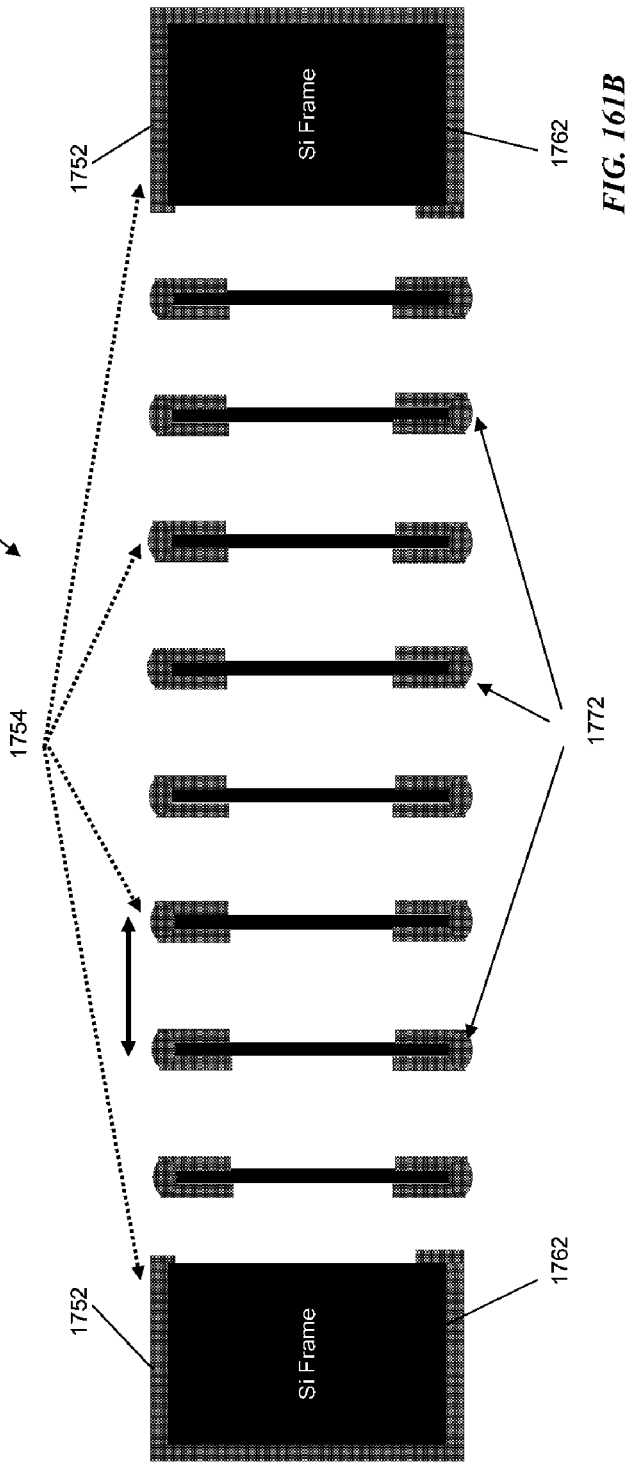
FIG. 161A
FIG. 161B

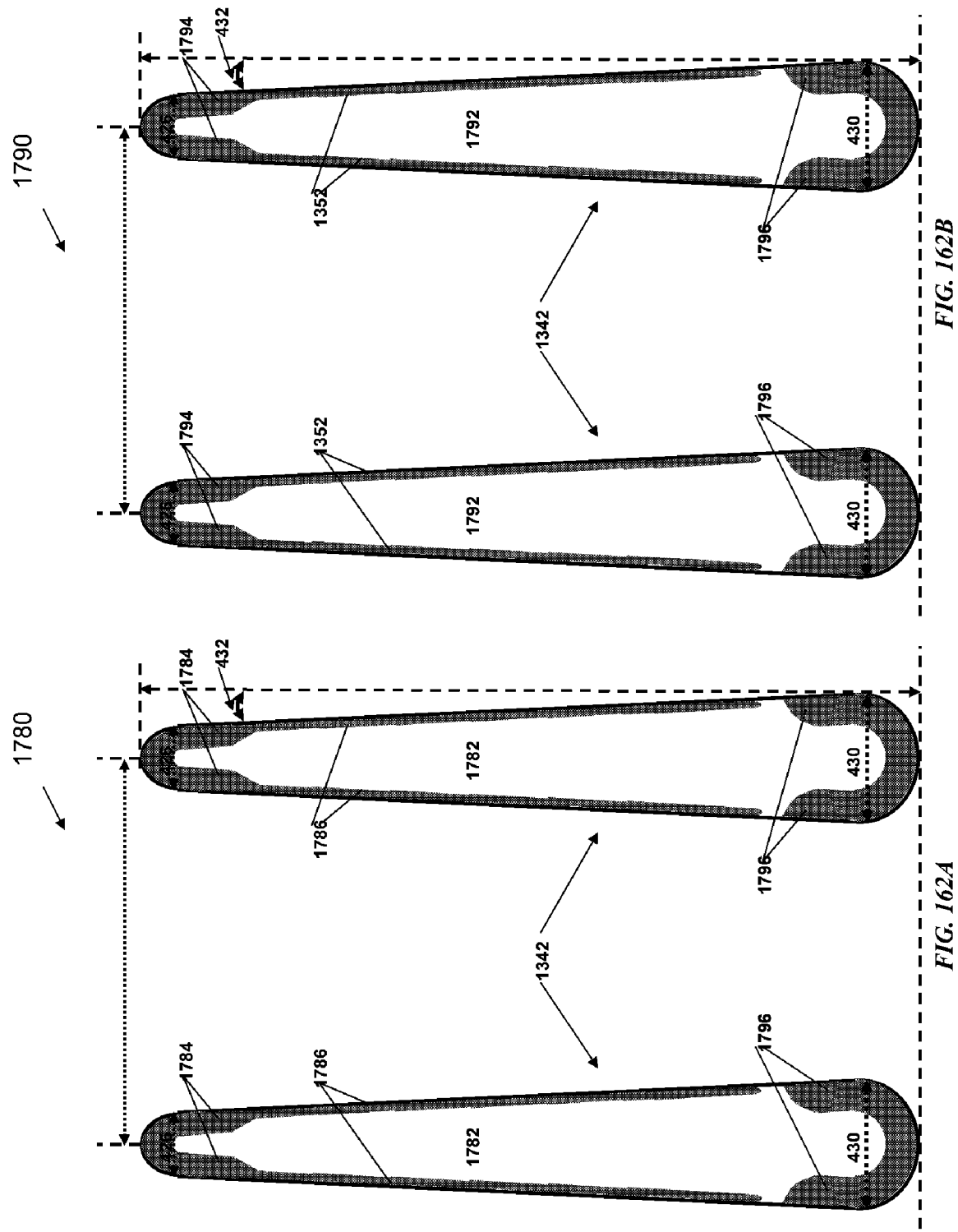

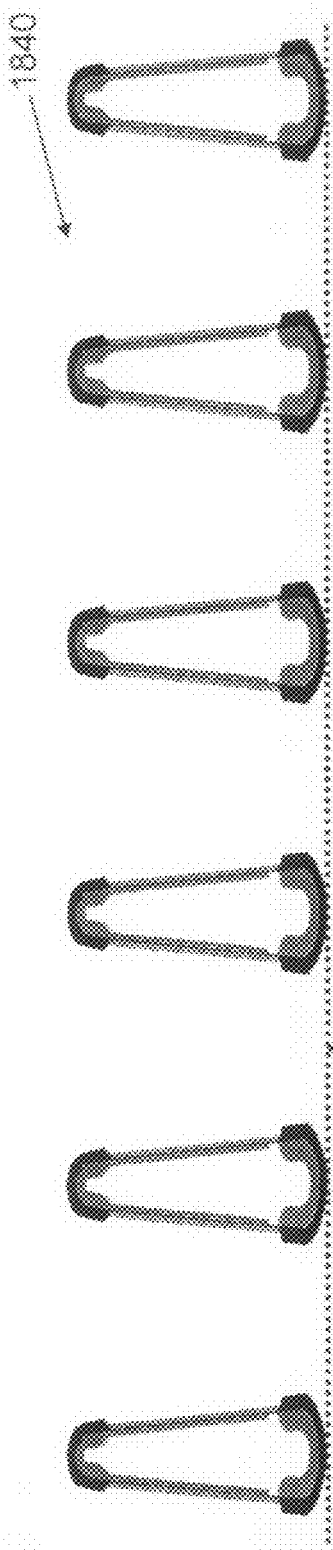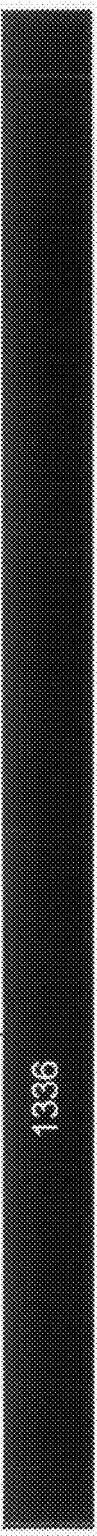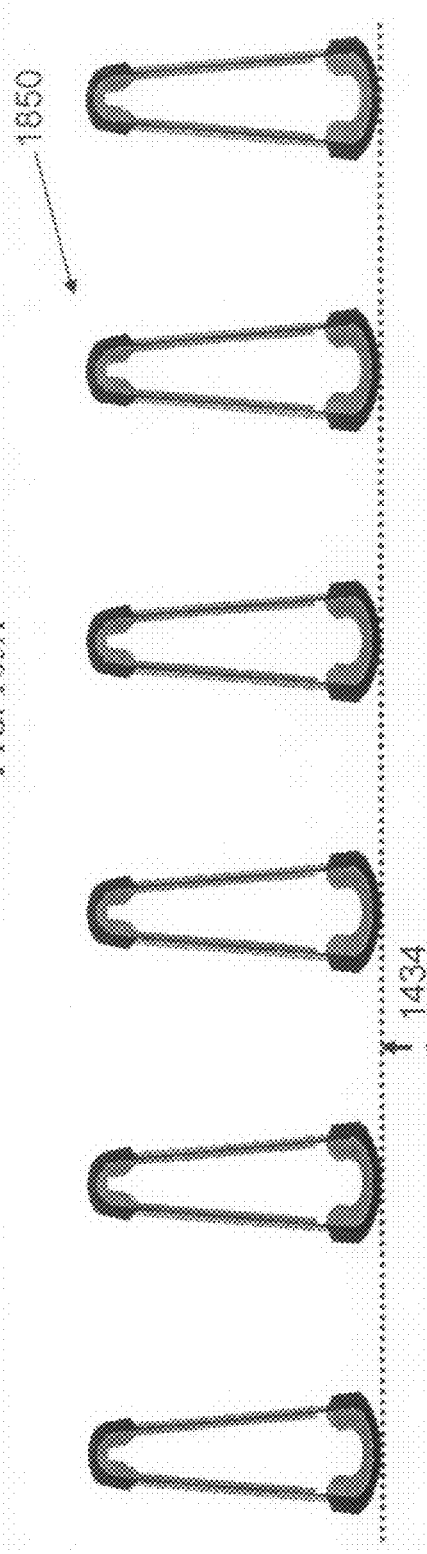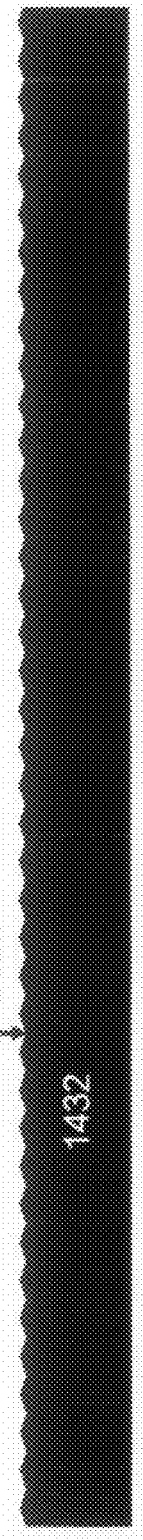
FIG. 165A
FIG. 165B

| Hexagonal prism Si Film Thickness (roughly Base Thickness) | Maximum Base Resistivity (to make base ohmic losses <0.1% of maximum cell power) | Approximate Base p-Type (Boron) Doping Concentration |
|---|---|---|
| 2 μm | 0.06 Ω.cm | roughly $5.0 \times 10^{17}$ cm$^{-3}$ |
| 5 μm | 0.15 Ω.cm | roughly $1.2 \times 10^{17}$ cm$^{-3}$ |
| 10 μm | 0.30 Ω.cm | roughly $6.0 \times 10^{16}$ cm$^{-3}$ |
| 15 μm | 0.45 Ω.cm | roughly $3.2 \times 10^{16}$ cm$^{-3}$ |
| 20 μm | 0.60 Ω.cm | roughly $2.3 \times 10^{16}$ cm$^{-3}$ |
| 30 μm | 0.90 Ω.cm | roughly $1.4 \times 10^{16}$ cm$^{-3}$ |

*FIG. 187*

SOLAR MODULE STRUCTURES AND ASSEMBLY METHODS FOR THREE-DIMENSIONAL THIN-FILM SOLAR CELLS

This application claims the benefit of provisional patent applications 60/828,678 filed on Oct. 9, 2006 and 60/886,303 filed on Jan. 24, 2007, which are hereby incorporated by reference.

FIELD

This disclosure relates in general to the field of photovoltaics and solar cells, and more particularly to solar module structures and assembly methods. Even more particularly, the presently disclosed subject matter relates to solar module structures and assembly methods for three-dimensional (3-D) thin-film solar cells (TFSCs).

DESCRIPTION OF THE RELATED ART

Renewable, high-efficiency, and cost-effective sources of energy are becoming a growing need on a global scale. Increasingly expensive, unreliable, and environmentally-risky fossil fuels and a rising global demand for energy, including electricity, have created the need for alternate, secure, clean, widely available, cost-effective, environmentally-friendly, and renewable forms of energy. Solar photovoltaic (PV) electricity generation using solar cells is uniquely suited to meet the needs of residential, commercial, industrial, and centralized utility applications. Key attributes that make solar energy attractive are the abundant, worldwide, point-of-use supply of sunlight, environmental friendliness, scalability (from milliwatts to megawatts), secure point-of-use generation of solar electricity, and excellent distributed energy economics. The sun provides more energy to the earth in one hour than the annual energy consumption of the entire world. Much of the earth's surface receives a significant amount of annual sun-hours which may be effectively harnessed for clean and secure electricity generation. A key driver for this market pull is a rising public awareness of environmentally-benign technologies. However, due to relatively low solar cell efficiencies (e.g., less than 12% for most thin-film technologies and roughly 12% to 18% for most crystalline silicon solar cell technologies), high costs of raw materials (e.g., silicon for crystalline silicon wafer solar cells) and manufacturing processes, limitations on cost-effective and efficient electrical storage, and a general lack of infrastructure to support solar cell proliferation, to date there has been limited use of this energy solution (currently, electricity generation by solar photovoltaics accounts for less than 0.1% of total worldwide electricity generation).

For commercial applications, cost of energy to the end-user (e.g., in cents/kWh for electricity) should be sufficiently low and comparable to or even better than that from utility grids using conventional electricity generation sources. The solar photovoltaic electricity generation, which currently accounts for less than 0.1% of the global electricity generation, may be substantially expanded if it achieves cost parity with conventional grid electricity. As the costs of solar cells and modules (typically expressed as $/W$_p$) are reduced, grid-tied solar photovoltaic applications are gaining acceptance at an accelerated pace, making them an attractive option for significant proliferation in electricity generation.

In the price-sensitive solar cell market, two principal technology options exist. On the one hand, crystalline silicon (c-Si) wafers may serve as the basis for solar cell formation (currently accounting for more than 90% of the solar PV market). On the other hand, thin-film (amorphous and polycrystalline) technologies using silicon and other semiconductor absorber materials (such as amorphous silicon, CdTe, or CIGS) may offer significant cost advantages compared to crystalline silicon wafer-based solar cells. These different approaches are at opposite ends of the price-performance scale. Crystalline silicon wafers offer higher performance, but at higher costs (due to the relatively high cost of starting monocrystalline and multicrystalline silicon wafers). Thin-film technologies may offer lower manufacturing costs, but typically at lower performance levels (i.e., lower efficiencies). For both approaches, the price-per-watt typically increases as cell efficiencies rise (due to higher material and/or manufacturing costs).

Due to a rapid annual growth rate of more than 40% during the past ten years and the concurrent demands for silicon material by both semiconductor microelectronics and solar PV industries, the solar PV industry has been experiencing a shortage of polysilicon feedstock supply. The polysilicon feedstock shortage has significantly constrained the solar PV industry growth, particularly during the past several years. In fact, the solar cell industry currently consumes over half of the worldwide production of high-purity polysilicon feedstock. Within the last few years, the contract price of polysilicon has increased from roughly $30/kg to roughly $85/kg, with spot prices exceeding $250/kg. This has led to large increases in the price of monocrystalline and multicrystalline silicon wafers, which now account for roughly half of the total solar module manufacturing cost.

The trend in the mainstream crystalline silicon (c-Si) wafer solar cell industry has been to scale down wafer thicknesses to below 200 microns (in order to reduce the amount of silicon material in grams used per watt of solar cell rated peak power). For example, monocrystalline silicon wafer solar cells are projected to scale down to a thickness of roughly 120 microns by 2012, from a current wafer thickness of roughly 200 microns. Multicrystalline silicon wafer solar cells are projected to scale down to a thickness of roughly 180 microns by 2012, from a current average wafer thickness of roughly 260 microns. This wafer thickness reduction, however, presents additional challenges related to mechanical rigidity, manufacturing yield, and solar cell efficiency. Despite its high cost, crystalline silicon (c-Si) technology still dominates the solar cell market, mainly due to higher efficiencies and synergies with the established microelectronics industry and supply chain. Currently, c-Si accounts for slightly over 90% of the solar cell market (95% when ribbon silicon is included).

Historically, crystalline silicon solar cells have achieved a 20% cost reduction for each doubling of cumulative global cell production (measured in megawatts or MW$_p$ and gigawatts or GW$_p$). It is projected that through innovative cost reduction and efficiency enhancement methods, the cost of electricity derived from grid-connected rooftop solar photovoltaic modules may become comparable to the cost of electricity purchased from the utility grid in five to ten years. A 2005 survey of the commercially available monocrystalline silicon and multicrystalline silicon solar modules reports the solar module efficiencies then in the range of 9.1% to 16.1%, with a median efficiency value of about 12.5%. Commercial crystalline silicon modules usually show a rapid initial efficiency degradation of 1% to 3% (relative) due to various effects, including photodegradation effects in wafered solar cells (e.g., wafer minority carrier lifetime degradation). Monocrystalline silicon wafer solar cell efficiencies are projected to increase to roughly 20.5% by 2012, from a current efficiency of roughly 16.5% (leading-edge commercially available monocrystalline silicon solar cell and solar module efficiencies are currently about 21.5% and 18%, respectively). Multicrystalline silicon wafer solar cell efficiencies are projected to increase to roughly 18% by 2012, from a current efficiency level of roughly 15.5%.

State-of-the-art crystalline silicon solar cell manufacturing currently uses about 10 grams of high-purity polysilicon feedstock per peak watt (g/$W_p$), resulting in a polysilicon feedstock material cost of about $0.85/$W_p$ (assuming a polysilicon price of $85/kg). Over the next five years, the projected trends of solar cell wafer thickness reduction (e.g., to less than 200 micron wafers) and a long-term assumed price of about $20/kg for solar-grade polysilicon may reduce the polysilicon feedstock cost (in g/$W_p$) by about a factor of four to eight to about $0.10/$W_p$ to $0.20/$W_p$. Thus, any competing solar cell technologies should benchmark their manufacturing cost goals against this reduced raw material cost number. For a given cell efficiency, silicon wafer thickness reduction presents a prime opportunity for solar cell cost reduction by reducing the amount of polysilicon feedstock consumed per watt of peak solar power.

The cost associated with wire saws, amounting to about $0.25/$W_p$ for current silicon solar cells provides another wafer-related cost component for silicon wafer solar cells. Innovative and cost-effective technologies that eliminate the kerf losses associated with sawing and slicing should further facilitate silicon solar cell cost reductions. It is projected that the wafer-based crystalline silicon solar module manufacturing cost (which is currently on the order of $2.10 per watt to more than $2.70 per watt) may be reduced to the range of roughly $1.50/$W_p$ to $1.80/$W_p$ by the year 2012, in part due to wafer sawing kerf loss reduction to roughly 130 microns by 2012 from the current value of roughly 200 microns. The overall cost reductions for wafer-based crystalline silicon solar cells may come from various sources including: lower cost polysilicon feedstock, thinner wafers, higher cell-level efficiencies, reduced wafer sawing kerf losses, and increased economy of scale or manufacturing volume.

State-of-the-art silicon wafer solar cell fabrication facilities ("solar fabs") typically produce 125 mm×125 mm up to 156 mm×156 mm solar cells today. The trend in crystalline silicon wafer solar cells is toward thinner and larger wafers. The monocrystalline and cast (as well as ribbon) multicrystalline silicon solar cell wafer thicknesses in leading-edge solar cells used for power generation modules are projected to be reduced to around 150 and 200 microns, respectively, by around 2009-2010. Any cost-effective, high-efficiency, innovative silicon solar cell technology which enables a substantial reduction of the silicon material consumption (e.g., wafer or film thickness) per $W_p$ of cell power compared to the above-mentioned current and projected 2009-2010 numbers may offer significant promise as a viable commercial solar cell technology for solar photovoltaic applications (e.g., residential, commercial, and industrial rooftop as well as large-scale centralized utilities electrical power generation applications).

Higher solar cell efficiencies have favorable effects on the entire solar cell value chain and levelized cost of energy (LCOE in $/kWh) due to reduced material consumption and cost as well as reduced balance-of-system (BOS) costs (e.g., area-related solar module installation and inverter costs). The current mainstream commercial crystalline solar cells provide efficiencies on the order of 14% to 17%. It is expected that the projected crystalline silicon solar cell efficiencies in commercial solar cells may approach around 19% and 17% for monocrystalline and multicrystalline silicon solar cells, respectively, by the year 2009. A key area for new solar cell business opportunities is development of innovative cell structures and simplified process flows which may drive efficiencies up while lowering overall solar cell and module manufacturing costs. For alternative (e.g., thin-film PV) approaches to succeed over the mainstream wafer-based crystalline silicon solar cell technologies, they should provide higher efficiencies at even lower manufacturing costs compared to the projected efficiency and cost numbers for the mainstream wafer-based crystalline silicon solar cells when the new technology is fully commercialized.

Economy-of-scale fab cost reduction associated with high-volume solar fab capacities is a key factor impacting LCOE. The state-of-the-art high-volume solar photovoltaic fabs have annual production capacities on the order of or in excess of 50 $MW_p$ to 100 $MW_p$ ($MW_p$=1 million $W_p$). High-volume solar photovoltaic fab capacities are expected to increase substantially to annual production rates of several hundred $MW_p$ or even approaching 1 $GW_p$ ($GW_p$=1 billion $W_p$) in the coming decade. While very-high-volume solar fabs in the range of 100 $MW_p$ to 1 $GW_p$ should facilitate longer term cost reductions (including LCOE) through high-volume manufacturing economies of scale, the relatively high initial fab investment costs, which may easily exceed $100M, may impose certain limits on solar photovoltaic fab construction options. Ideally, the preference may be to develop innovative crystalline silicon solar cell designs and simplified manufacturing processes which facilitate substantial manufacturing cost reductions in solar cells and modules even in smaller-scale (and less capital intensive) fabs with modest production volumes (e.g., annual production volumes in the range of 5 $MW_p$ to 50 $MW_p$). This type of technology would allow for modest-volume solar photovoltaic fabs with modest fab setup and operation costs. Reduced fab setup and operation costs would further facilitate global proliferation of cost-effective solar modules, enabling construction of a multitude of very affordable modest-volume fabs (in contrast to having to set up very expensive high-volume fabs in order to achieve sufficient economy of scale for manufacturing cost reduction). Of course, an innovative solar cell technology that meets the above-mentioned criteria for cost-effective, modest-volume fabs (i.e., meeting the LCOE roadmap requirements even at modest production volumes in low-cost fabs set up for simplified solar cell processing), may also be applicable to very-high-volume (e.g., greater than 100 $MW_p$) solar fabs. Such solar photovoltaic fabs can take further advantage of the economies of scale associated with increased volume.

Thin-film solar cell (TFSC) technologies (e.g., amorphous silicon, CdTe, and CIGS) require little absorber material (usually much less than 10 microns in thickness) to absorb typical standard "Air Mass 1.5" (AM-1.5) solar illumination due to absorption bands that are well matched to the solar spectrum. The TFSC absorber material may be deposited on inexpensive substrates such as glass or flexible metallic or non-metallic substrates. TFSCs typically offer low cost, reduced module weight, reduced materials consumption, and a capability for using flexible substrates, but are usually much lower in efficiency (e.g., usually 5% to 12%). In the case of prior art thin crystalline silicon films, there are a number of major problems and challenges with the use of flat silicon films (such as epitaxially growth silicon films with thicknesses below 50 microns) for low-cost, high-performance solar cells. These include: relatively low solar module efficiencies (typically 7% to 12%), field degradation of module efficiencies, scarce and expensive absorber materials (e.g., In and Se for CIGS and Te for CdTe), limited validation of system field reliability, and adverse environmental impact of non-silicon technologies such as CIS/CIGS and CdTe.

Prior art FIG. 1 shows process flow 10 for fabricating c-Si TFSCs using planar silicon thin-film absorber layers produced by epitaxial silicon. This prior art TFSC fabrication process flow uses several shadow mask process steps to form the cell structure. The cell absorber is simply a thin planar film of c-Si formed by silicon epitaxial growth processing. The cell uses frontside silicon texturing to improve light trapping and a detached rear aluminum mirror to improve the cell efficiency. Step 12 starts with single-crystal $p^+$ CZ silicon. Step 14 involves electrochemical HF etching of silicon to form 2-layer porous silicon comprising a 1 micron top layer with 20% porosity and a 200 nanometer rear layer with greater than 50% porosity. Step 16 involves a hydrogen ($H_2$) anneal at 1100° C. for 30 minutes. Step 18 involves epitaxial silicon growth at 1100° C. using trichlorosilane or $SiHCl_3$ (deposition rate of 1 micron per minute), forming 2 microns of $p^{+-}Si$ and 30 microns of p-Si. Step 20 involves frontside surface texturing by wet KOH etching to form upright surface pyramids. Step 22 involves the first shadow mask process, with LPCVD silicon nitride ($SiN_x$) deposition through a shadow mask to define emitter diffusion windows. Step 24 involves solid source phosphorus diffusion at 830° C. (to achieve 80 Ω/square for the $n^+$ doped junction). Step 26 involves the second shadow mask process, with frontside metallization (titanium/Pd/silver grid) by evaporation through shadow mask. Step 28 involves emitter surface passivation by hydrogenated PVD or PECVD $SiN_x$. Step 30 involves contact frontside busbar by a conductive adhesive. Step 32 involves gluing the cell frontside to $MgF_2$-coated glass using clear glue. Step 34 involves separating the cell from silicon wafer by mechanical stress. Step 36 involves the third shadow mask process, with backside aluminum metallization using evaporation through shadow mask. Finally, step 38 involves attaching an aluminum reflector at 200 micron spacing from the cell backside.

Prior art FIG. 2 shows another process flow method 40 for fabrication of solar cells on silicon wafers with self-aligned selective emitter and metallization. This prior art process uses laser processing to pattern the top cell dielectric layer while melting the underlying silicon to form the heavily-doped $n^{++}$ emitter contact diffusion regions (after formation of the lightly diffused selective emitter regions by rapid thermal annealing). Step 42 starts with single-crystal p-type silicon. Step 44 involves saw damage removal etch and anisotropic texturing etch in dilute NaOH at 90° C. Step 46 involves spin-on application and drying of phosphorus diffusion source. Step 48 involves rapid thermal annealing to form lightly diffused emitter (80 to 200 Ω/square). Step 50 involves application of backside metal contact by vacuum evaporation or screen printing of aluminum or silver/aluminum alloy, followed by drying. Step 52 involves backside metal sintering/firing (e.g., at 820° C. in oxygen/nitrogen) for a screen-printed contact (fires the metal paste while oxidizing the dielectric to raise its resistance to the metal plating solution). Step 54 involves laser processing to pattern the top dielectric layer while melting the underlying silicon to form the $n^{++}$ contact diffusion region. Step 56 involves dilute HF etch to prepare metal plating surface. Step 58 involves electroless nickel plating at 90° C. for five minutes. Step 60 involves nickel sintering at 350° C. to 450° C. (in nitrogen, argon, or forming gas). Step 62 involves an additional 2 minutes of nickel plating followed by long electroless copper plating to form thick high-conductivity copper film. Step 64 involves flash immersion silver (silver) deposition on copper surface. Finally, step 66 involves edged junction isolation (e.g., using laser grooving, edge cleavage, or plasma etching).

With regard to the prior art crystalline silicon (c-Si) thin-film solar cell (TFSC) technology, there are difficulties associated with sufficient surface texturing of the thin silicon film to reduce surface reflectance losses, while reducing the crystalline silicon film thickness. This places a limit on the minimum flat (co-planar) monocrystalline silicon thickness due to production yield and cell performance (efficiency) considerations. In the case of a flat or co-planar film, it is essential to use surface texturing since the reflectance of an untextured crystalline silicon film is quite excessive (can be greater than 30%) and results in substantial optical reflection losses and degradation of the external quantum efficiency. Thus, reduction of reflectance-induced photon losses in co-planar epitaxial silicon films requires effective surface texturing which itself places a limit on the minimum epitaxial silicon layer thickness. Depending on the film surface texturing requirements and processes, the minimum crystalline silicon layer thickness may be on the order of at least 10 microns (so that the texturing process does not break through any portions of the crystalline silicon layer).

In addition, substantially reduced mean optical path lengths in thin planar crystalline silicon films result in reduced photon absorption, particularly for photons with energies near the infrared bandgap of silicon (800 to 1100 nanometers), resulting in reduced solar cell quantum efficiency (reduced short-circuit current or $J_{sc}$). This results in serious degradation of the solar cell efficiency due to reduced cell quantum efficiency and reduced $J_{sc}$. For instance, in a co-planar (flat) crystalline silicon absorber layer with thickness of 20 microns, a solar light beam impacting the cell at a near-normal angle would have an effective path length equal to the film thickness, far too short for the solar radiation photons with energies near the infrared bandgap of silicon (i.e., with wavelengths of roughly 800 to 1100 nanometers) to be absorbed effectively in the silicon thin film. In fact, a reduction of the active cell silicon thickness to below roughly 50 microns results in appreciable reduction of $J_{sc}$ and the resulting solar cell efficiency, with this degradation effect rapidly accelerating when the silicon film thickness is reduced below roughly 20 microns. Thus, a co-planar thin crystalline silicon film may also require effective light trapping using both top surface texturing and rear surface back reflection of the light exiting the back surface of the crystalline silicon film in order to create effective optical path lengths equal to a large multiple of the crystalline silicon film thickness.

The prior art technologies using this approach mostly use either back reflection through internal reflection of the light at the crystalline silicon film/silicon substrate, or reflection from a blanket backside contact (such as a back surface field aluminum contact/mirror). The back reflectance provided by these techniques may not be great (e.g., roughly 70% effective near-IR rear reflectance), constraining the performance gain that would have otherwise been achieved by an optimal back reflector. The problem with this approach is that the primary incident beam always passes the crystalline silicon film only once. Any subsequent second passes of the primary incident beam photons are dependent on the back surface reflection.

There is also the problem of lack of rigidity and mechanical support of the thin film during cell and module processing steps. This problem relates to the mechanical strength of a large-area (e.g., 200 mm×200 mm) thin silicon film. It is well known that reducing the large-area crystalline silicon wafer thickness to below 100 microns results in a substantial loss of TFSC substrate mechanical strength/rigidity, and such thin wafers tend to be flexible and very difficult to handle without breakage during cell fabrication process flow.

Large-area, co-planar (flat) crystalline silicon films thinner than, for instance, 50 microns must be properly mounted and supported on a cost-effective support or handle substrate in order to achieve acceptable yield for solar cell and module manufacturing. One approach is to grow and retain the thin epitaxial film on a relatively low-cost (e.g., metallurgical-grade) silicon substrate (over which the epitaxial layer is grown); however, this approach suffers from some inherent problems constraining the ultimate solar cell efficiency. Another approach is to release or lift off the epitaxial silicon film from its (reusable) parent silicon substrate and subsequently place it on a cheaper non-silicon support or handle substrate to provide mechanical strength through the solar cell process flow. This approach may suffer from any thermal coefficient of expansion (TCE) mismatch between the support/handle substrate and silicon film during any high-temperature oxidation and anneal processes, as well as potential contamination of the thin epitaxial silicon film from the non-silicon support substrate (both creating possible manufacturing yield and performance/efficiency degradation problems).

The cost of the monocrystalline silicon film growth process using silicon epitaxy, particularly for thicker epitaxial films with thicknesses in excess of 30 microns is an additional issue which should be addressed. Using a relatively small epitaxial film thickness (in one embodiment, much below 30 microns) may lower the cost of epitaxy to an attractive range. However, this would present various challenges for fabrication of planar silicon thin-film solar cells. As stated, thinner co-planar (flat) epitaxial films (e.g., in the range of much less than 30 microns) produce a number of problems and challenges, including a lack of film mechanical strength, constraints limiting effective surface texturing of thin silicon films for low surface reflectance and reduced optical reflectance losses, relatively short optical path lengths, and reduced cell quantum efficiencies. Effective light trapping is essential for enhanced thin-film c-Si solar cell efficiencies. The requirement for effective light trapping is based on a combination of front surface texturing and back surface mirror, while achieving sufficiently low surface recombination velocities (for high cell efficiencies). This is very difficult to achieve in the co-planar (flat) c-Si thin film solar cells.

High-performance c-Si thin-film solar cells require some patterning steps or patterned processing steps (e.g., for formation of selective emitter, frontside emitter or backside emitter wrap-through metallization contacts, backside base metallization contacts, etc.). These patterning steps are usually achieved using photolithography, screen printing, and/or shadow-mask deposition (e.g., shadow-mask sputtering or evaporation) processes. The use of photolithography and/or screen printing and/or shadow-mask deposition patterning steps usually increases the manufacturing process flow complexity and cost, and may also detrimentally impact the fabrication yield as well as the ultimate achievable solar cell efficiency.

Therefore a need has arisen for a thin-film solar cell (TFSC) which corrects the problems identified above.

Yet a further need exists to address shortcomings of existing mainstream c-Si solar cell technology. This includes reducing the amount of polysilicon feedstock consumed per peak watt of solar power, and eliminating the kerf losses associated with sawing and slicing; thus, substantially reducing the overall solar cell manufacturing cost.

A further need exists for innovative solar cell structures and simplified process flows, increasing cell and module efficiencies while significantly lowering the overall solar cell and module manufacturing costs. A still further need exists for innovative c-Si solar cell designs and simplified self-aligned manufacturing processes which facilitate substantial solar cell and module cost reduction even in fabs with modest production volumes, enabling low to mid-volume solar cell fabs with modest fab setup and operation costs (thus, achieving economies of scale for manufacturing cost reduction at substantially lower fab volumes than the prior art fabs).

A still further need exists to address shortcomings of existing TFSC technology. This includes addressing difficulties associated with sufficient surface texturing of the thin planar silicon films to reduce surface reflectance losses, which currently places a limit on the minimum flat (co-planar) crystalline silicon thickness due to production yield and cell performance considerations. A still further need exists for effective light trapping based on a combination of front surface texturing and back surface mirror, while achieving low surface recombination velocities (for high cell efficiencies).

A still further need exists to address additional shortcomings of existing TFSC technologies. This includes the problem of lack of rigidity and mechanical support of the thin film substrate during cell and module processing steps, thus, necessitating the use of support or handle substrates (made of silicon or another material) for the thin-film TFSC substrates. This further includes the cost of the epitaxial silicon film growth process, particularly for thicker epitaxial films required for planar crystalline silicon TFSCs. This further includes the requirement of multiple photolithography and/or screen printing and/or shadow-mask processing/patterning steps which usually increase the manufacturing process flow complexity and cost, and may also detrimentally impact the fabrication yield as well as the ultimate achievable solar cell efficiency.

SUMMARY

In accordance with the present disclosure, solar module structures utilizing three-dimensional thin-film solar cells (3-D TFSCs) and methods of assembling such solar module structures are provided. The solar module structures of the disclosed subject matter utilizing 3-D TFSCs substantially eliminate or reduce disadvantages and problems associated with previously developed TFSCs, both in terms of efficiency and manufacturing cost.

According to one aspect of the disclosed subject matter, there is provided a solar module structure comprising a top protective layer, a plurality of 3-D TFSCs, a printed circuit boar, and a protective back plate. Each 3-D TFSC comprises a 3-D TFSC substrate comprising emitter and base regions, and where the 3-D TFSC substrate comprises a plurality of unit cells.

According to another aspect of the disclosed subject matter, there is provided a solar module structure comprising a top glass plate, a plurality of 3-D TFSCs, and a bottom glass plate. Each 3-D TFSC comprises a 3-D TFSC substrate comprising emitter and base regions, and where the 3-D TFSC substrate comprises a plurality of unit cells.

According to still another aspect of the disclosed subject matter, there is provided a solar module structure comprising a top protective layer, a plurality of 3-D TFSCs, and a bottom protective layer. Each 3-D TFSC comprises a 3-D TFSC substrate comprising emitter and base regions, and where the 3-D TFSC substrate comprises a plurality of unit cells.

According to still another aspect of the disclosed subject matter, there is a provided a solar module structure. The solar module structure comprises a top encapsulant layer, a plurality of 3-D TFSCs, a printed circuit board (PCB), a rear encapsulant layer and a protective back plate. The 3-D TFSC comprises a 3-D TFSC substrate with emitter junction regions doped base regions. The 3-D TFSC further includes emitter metallization regions and base metallization regions. The 3-D TFSC substrate comprises a plurality of single-aperture unit cells.

According to still another aspect of the disclosed subject matter, there is a provided a method for assembling a solar module structure. The method includes a first step of patterning a frontside and a backside of a double-sided printed circuit board coated with metallic foils according to desired frontside and backside interconnect layouts. The method includes a next step of applying a first coating layer to the rear side of a plurality of 3-D TFSCs. The 3-D TFSC comprises a 3-D TFSC substrate with emitter junction regions doped base regions. The 3-D TFSC further includes emitter metallization regions and base metallization regions. The 3-D TFSC substrate comprises a plurality of single-aperture unit cells. The method includes a next step of placing the plurality of 3-D TFSCs on the frontside of the double-sided printed circuit board. The method includes a next step of preparing a solar module assembly. The solar module assembly includes a glass layer, a top encapsulant layer, the plurality of 3-D TFSCs on the frontside of the double-sided printed circuit board, a rear encapsulant layer, and a protective back plate. Finally, the method includes sealing and packaging the solar module assembly.

According to still another aspect of the disclosed subject matter, there is a provided a solar module structure. The solar module structure comprises a top glass plate, a plurality of 3-D TFSCs, a rear patterned cell interconnect layer, and a bottom glass plate. The 3-D TFSC comprises a 3-D TFSC substrate with emitter junction regions doped base regions. The 3-D TFSC further includes emitter metallization regions and base metallization regions. The 3-D TFSC substrate comprises a plurality of dual-aperture unit cells.

According to still another aspect of the disclosed subject matter, there is a provided a method for assembling a solar module structure. The method includes a first step of applying a rear patterned cell interconnect layer to the rear side of a 3-D TFSC. The 3-D TFSC comprises a 3-D TFSC substrate with emitter junction regions doped base regions. The 3-D TFSC further includes emitter metallization regions and base metallization regions. The 3-D TFSC substrate comprises a plurality of dual-aperture unit cells. The method includes a next step of preparing a solar module assembly. The solar module assembly includes a top glass plate, the plurality of 3-D TFSCs with the rear patterned cell interconnect layer applied to the rear side, and a bottom glass plate. Finally, the method includes sealing and packaging the solar module assembly.

These and other advantages of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGURES and detailed description. It is intended that all such additional systems, methods, features and advantages be included within this description, be within the scope of the accompanying claims.

BRIEF DESCRIPTIONS OF THE DRAWINGS

The features, nature, and advantages of the disclosed subject matter may become more apparent from the detailed description set forth below when taken in conjunction with the drawings in which like reference characters identify correspondingly throughout and wherein.

Figure 1:
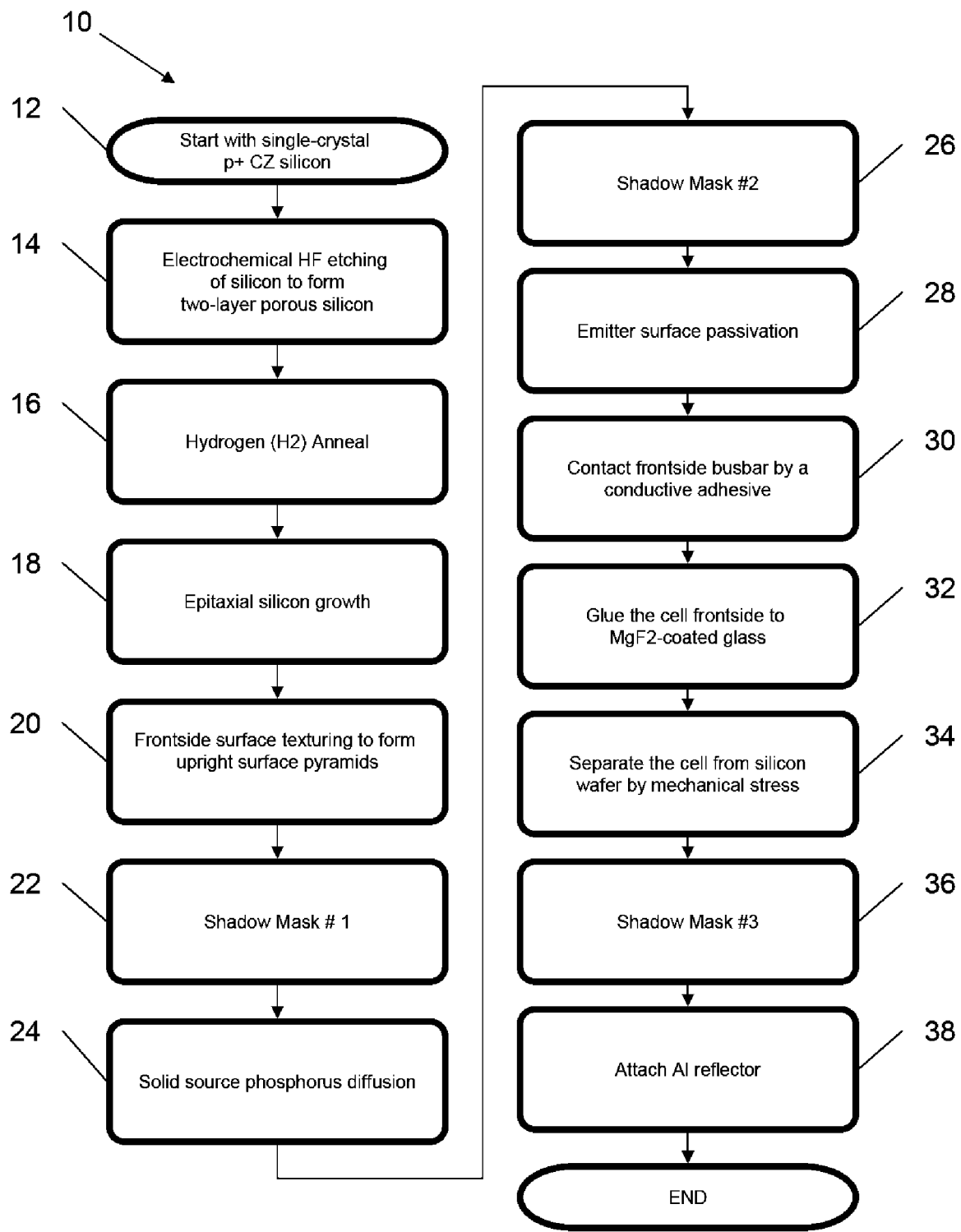
FIG. 1 (PRIOR ART) shows a prior art process flow for fabricating crystalline silicon (c-Si) thin-film solar cells (TFSCs) using planar silicon thin-film absorber layers produced by silicon epitaxy.
Figure 2:
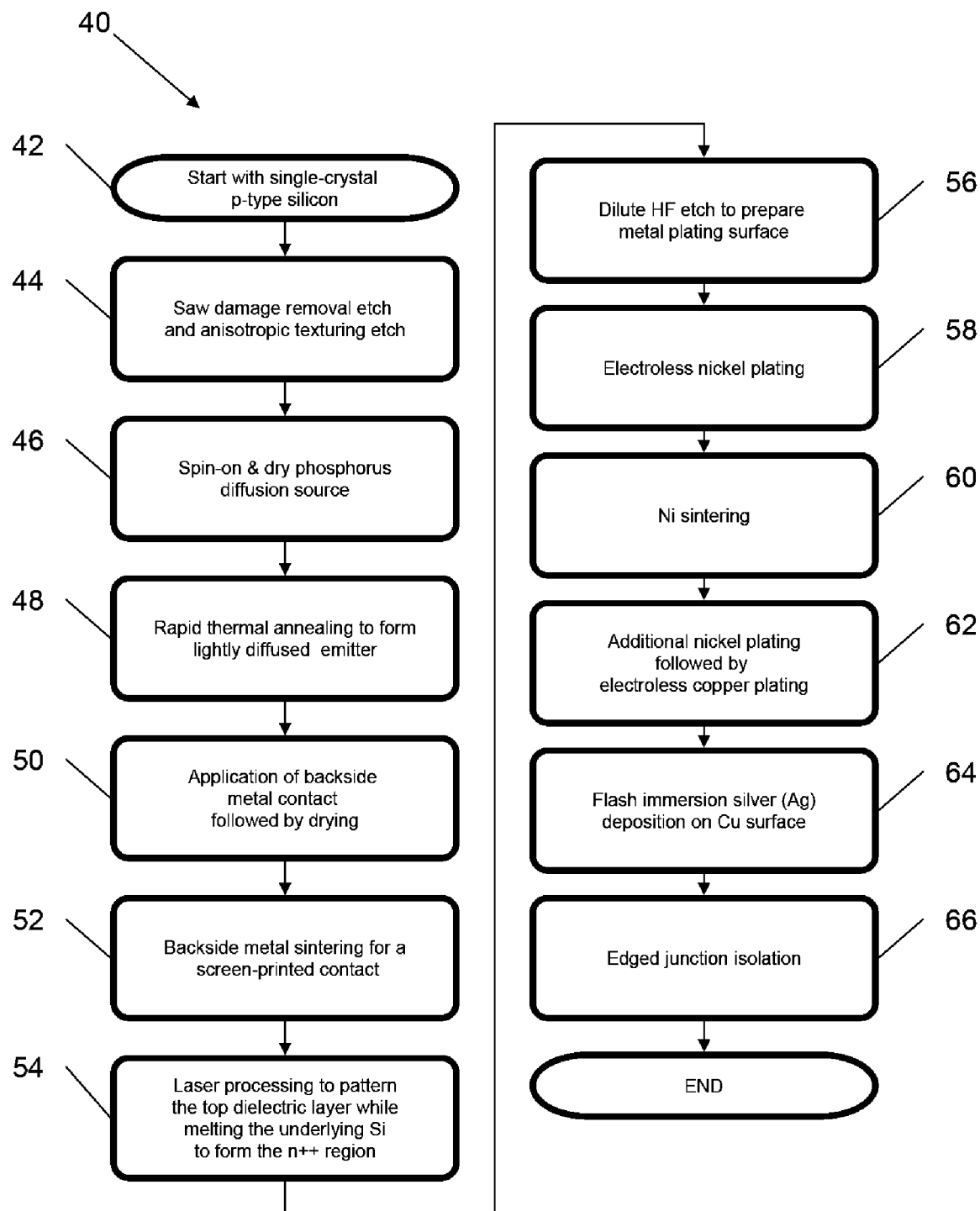
FIG. 2 (PRIOR ART) shows a prior art process flow for fabrication of solar cells on silicon wafers including self-aligned selective emitter and metallization.
Figure 3:
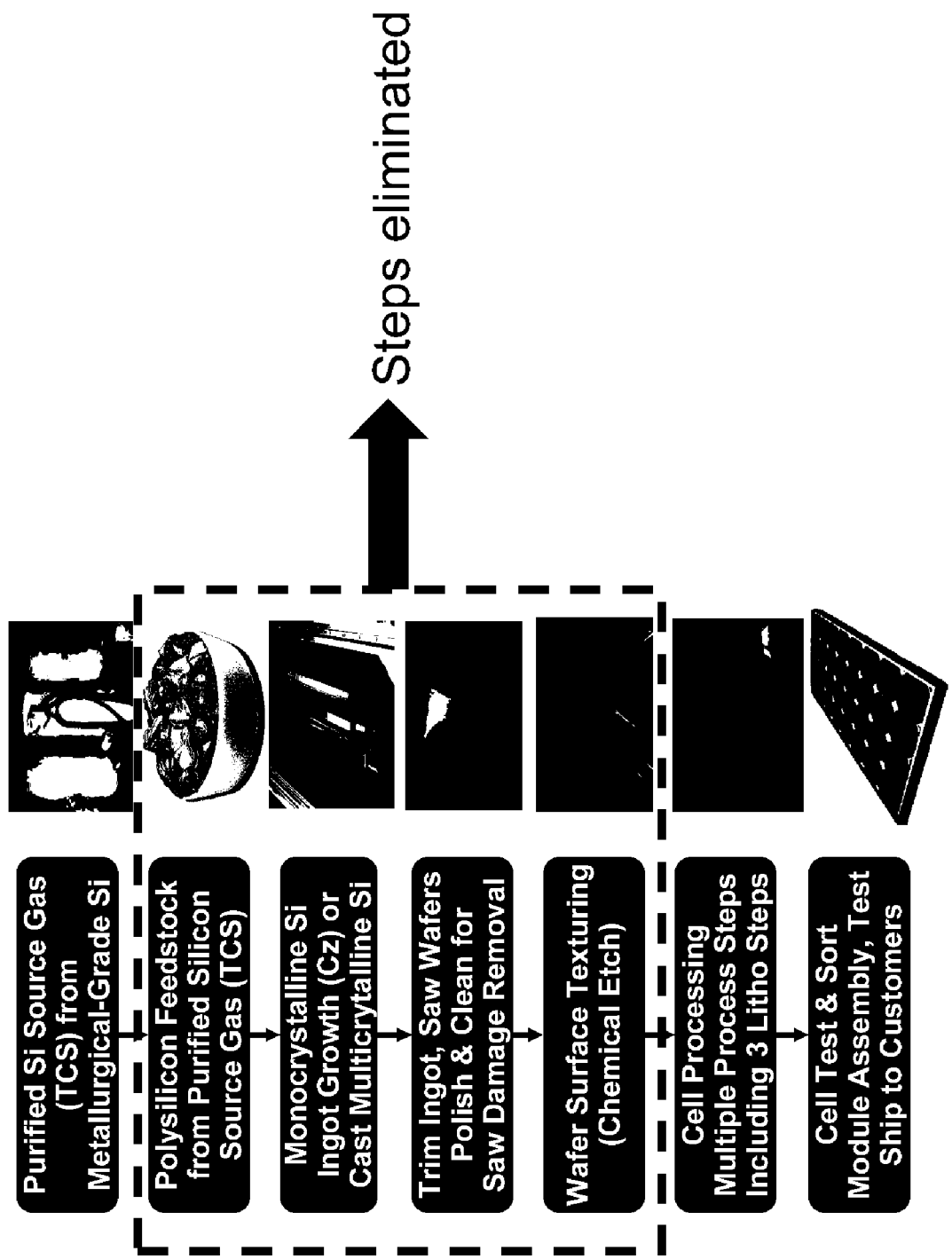
Figure 5:
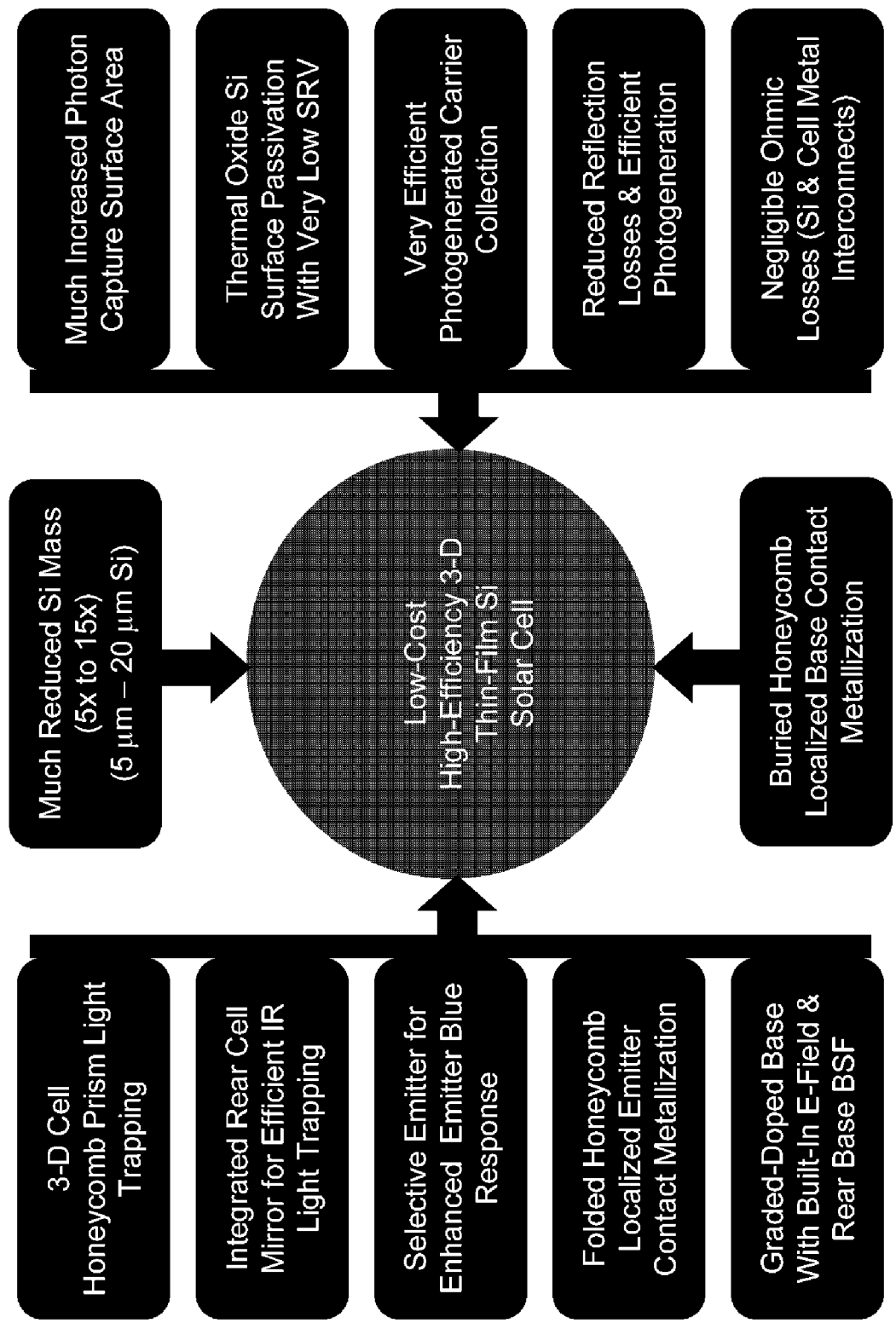
Figure 6:
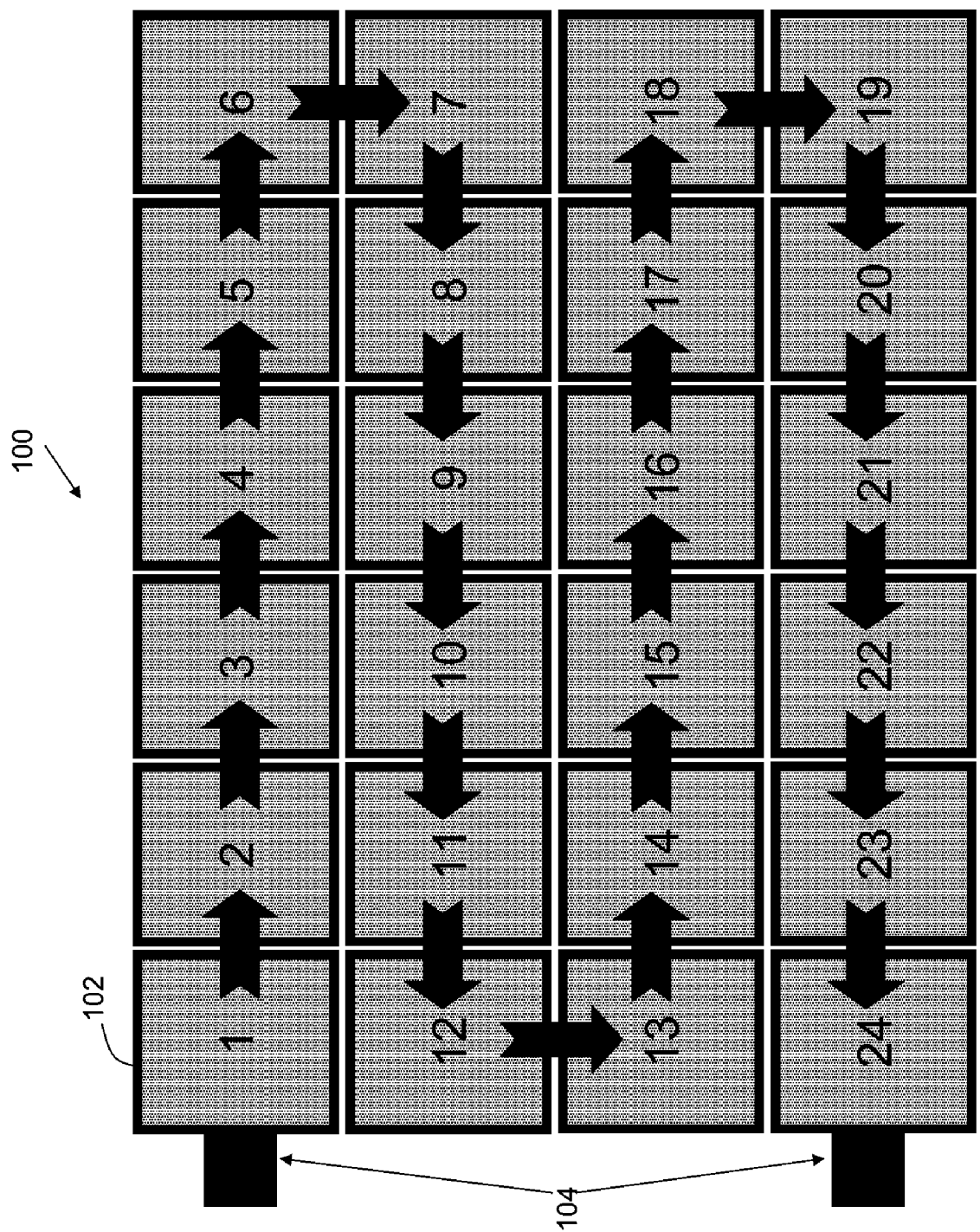
Figure 7:
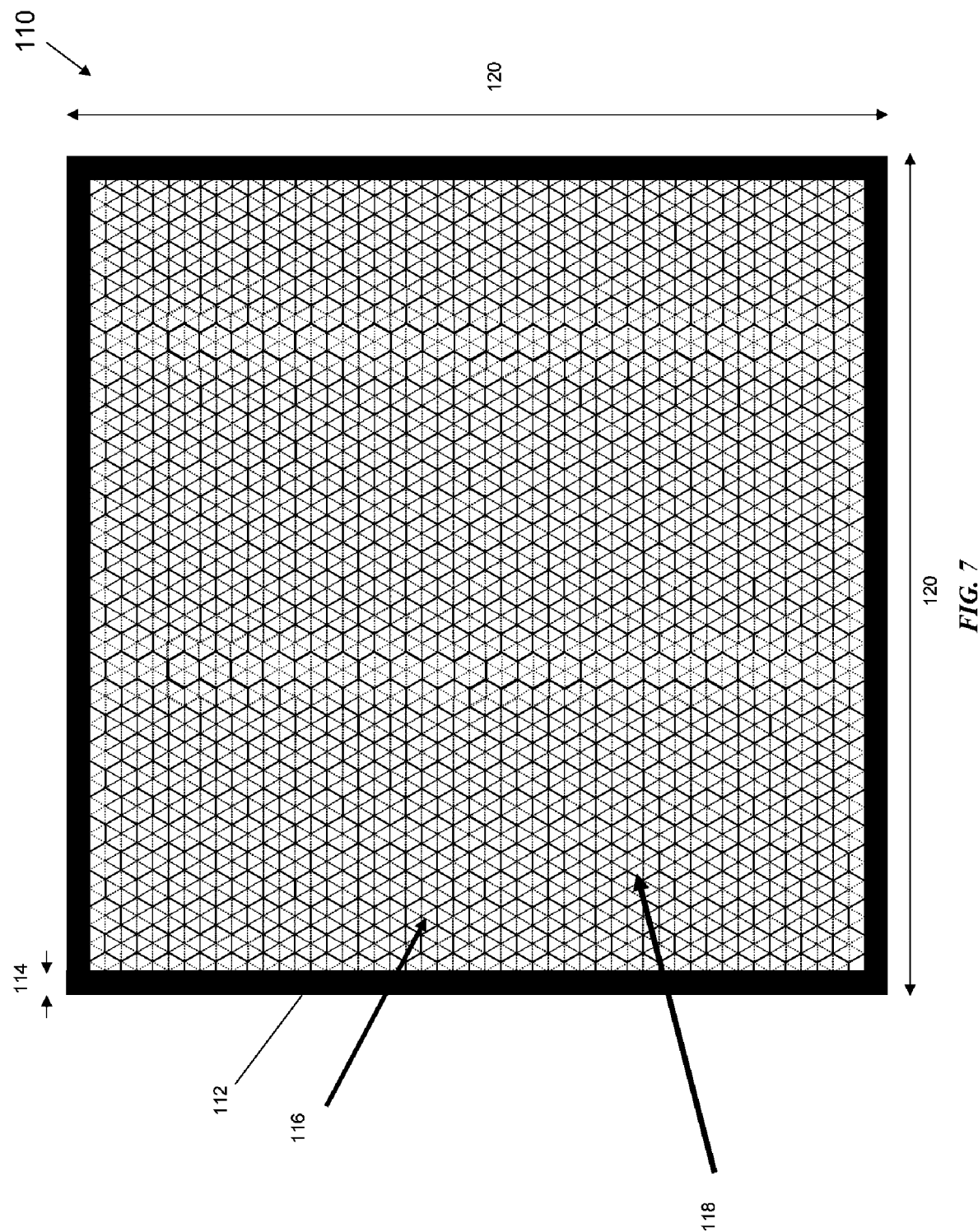
Figure 8B:
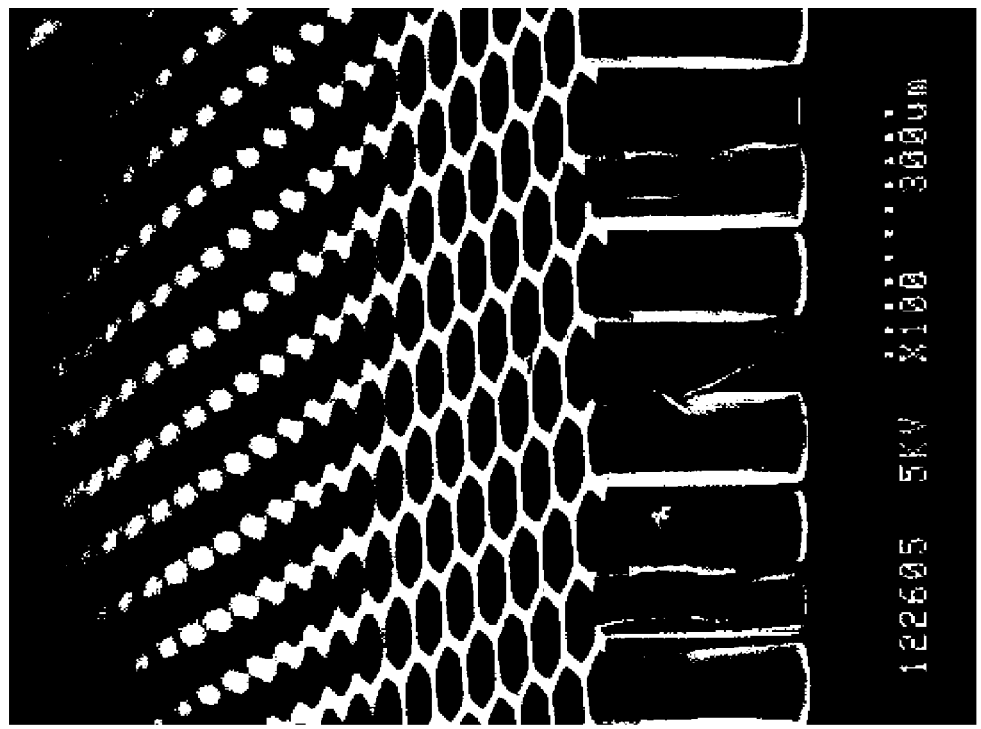
Figure 8A:
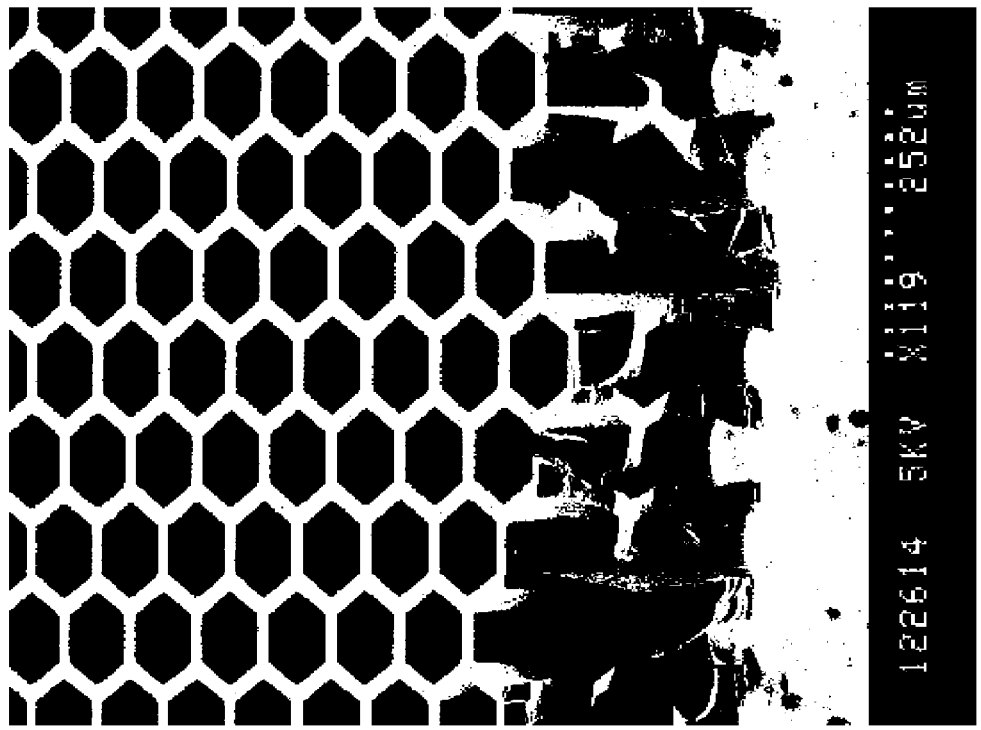
Figure 9:
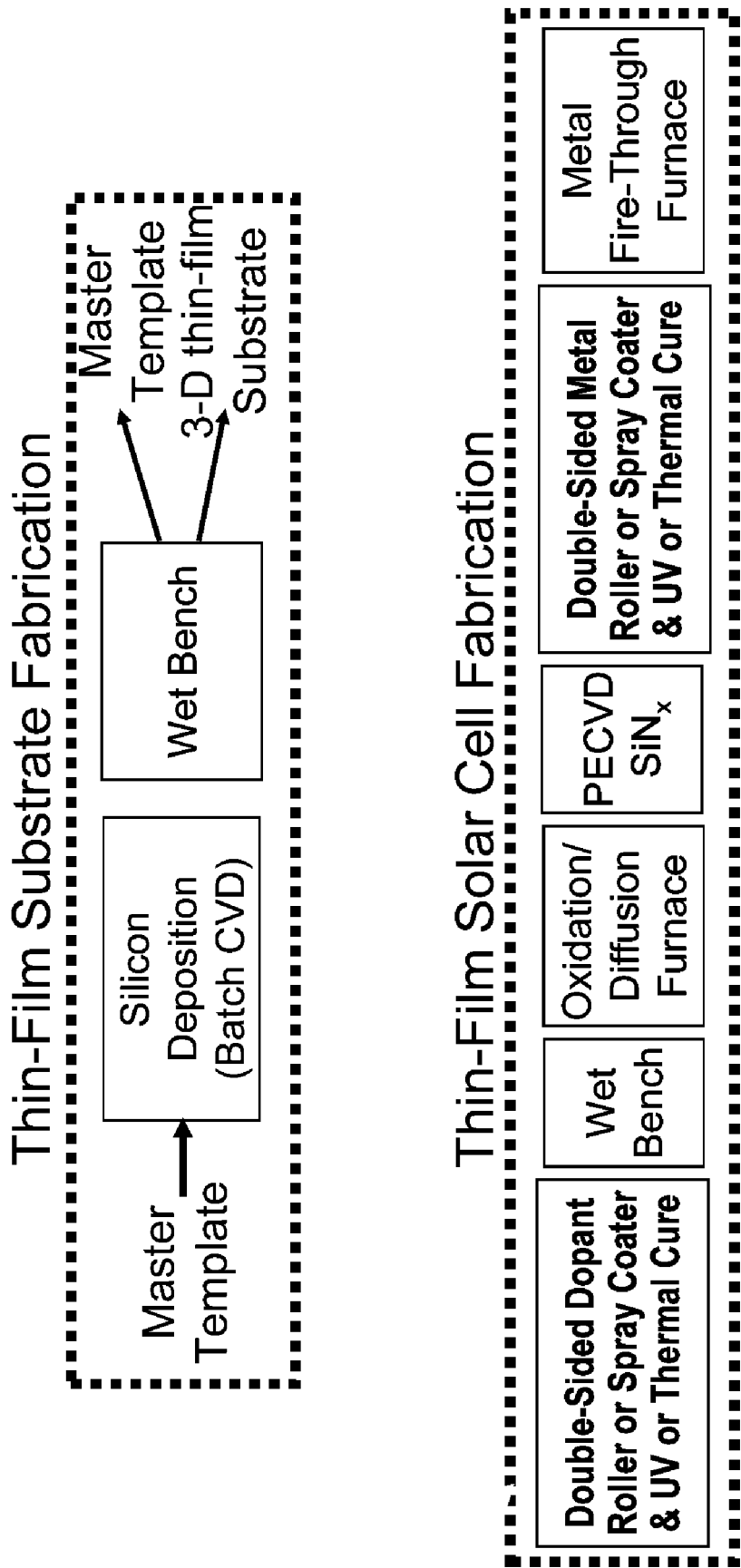
Figure 10:
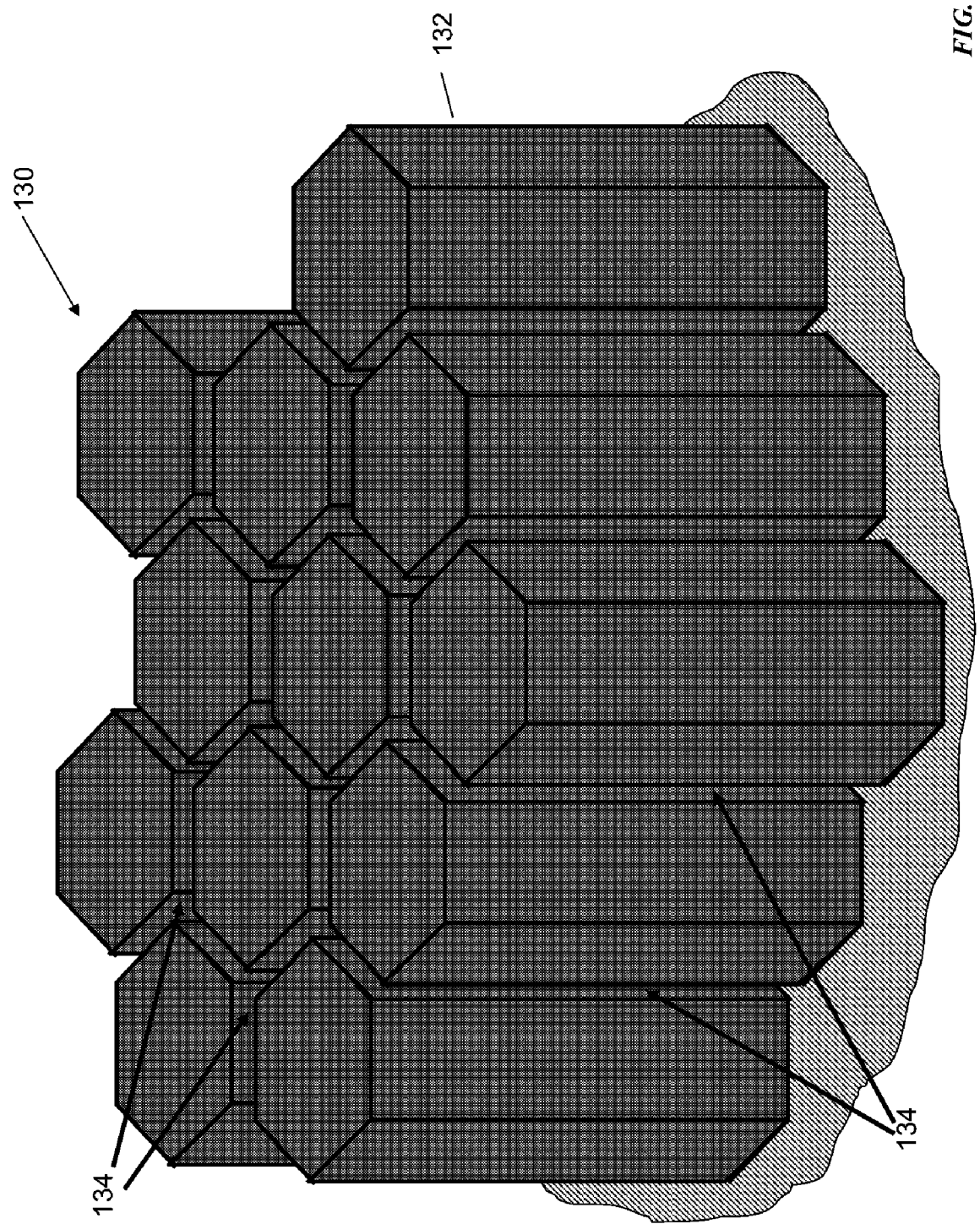
Figure 11B:
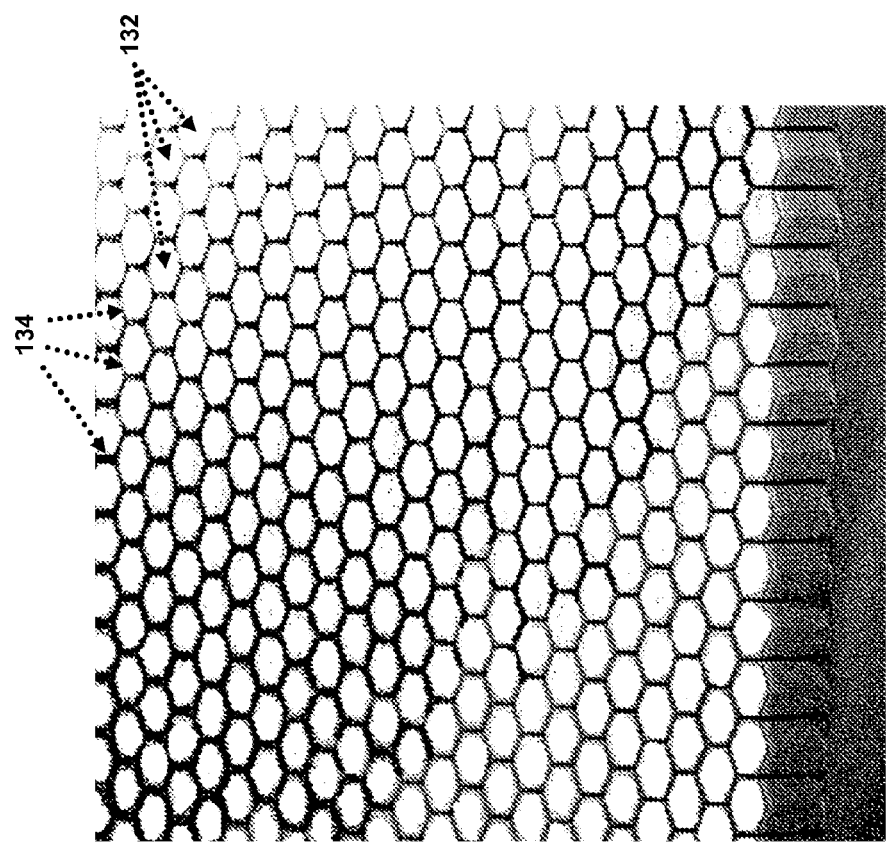
Figure 11A:
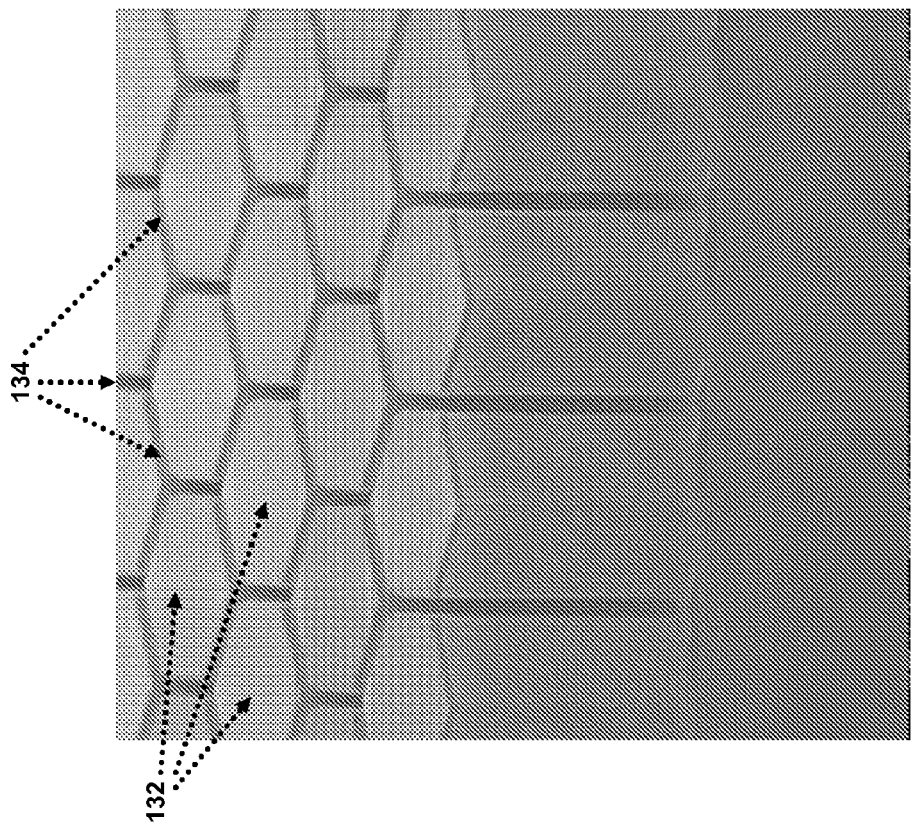
Figure 12:
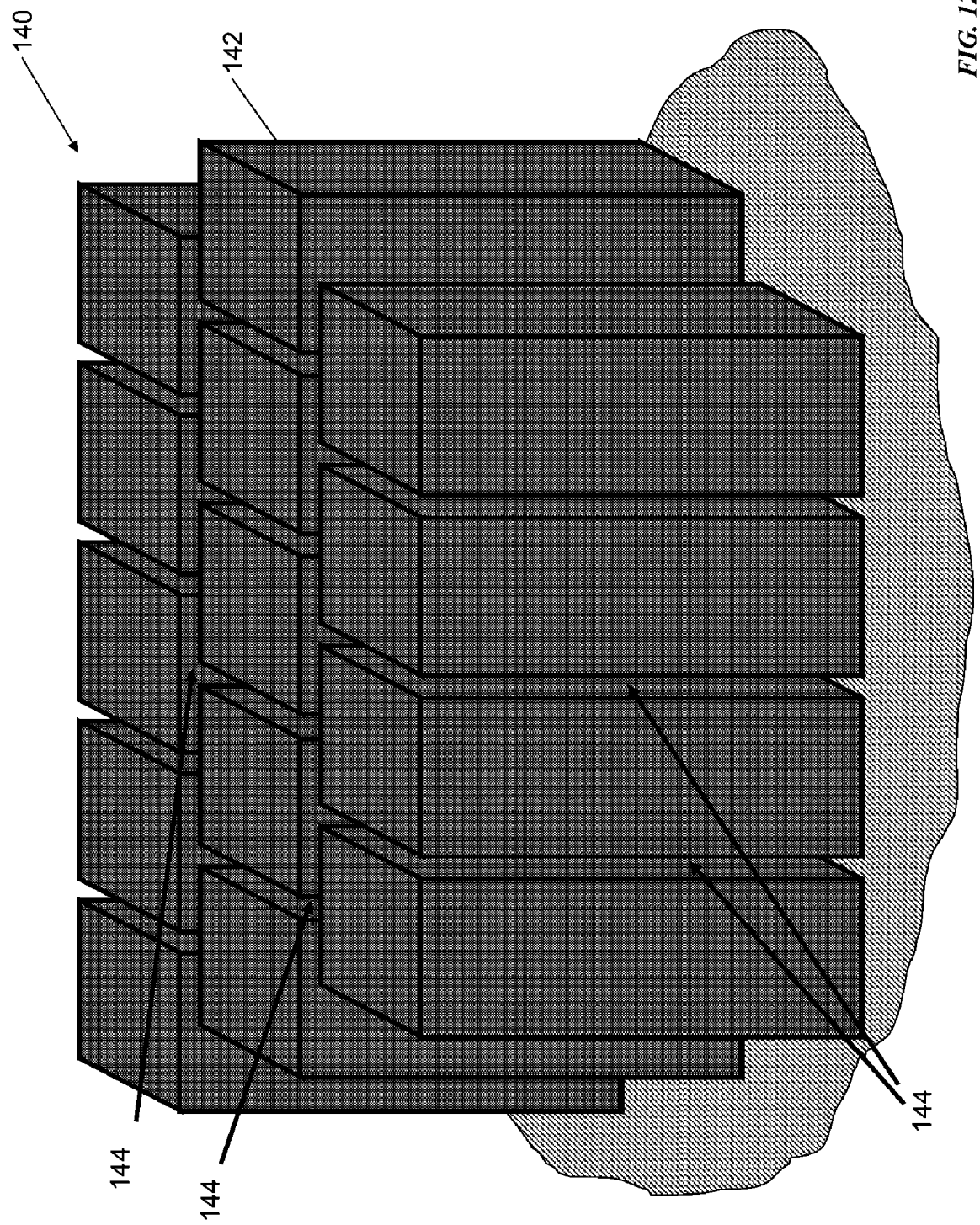
Figure 13:
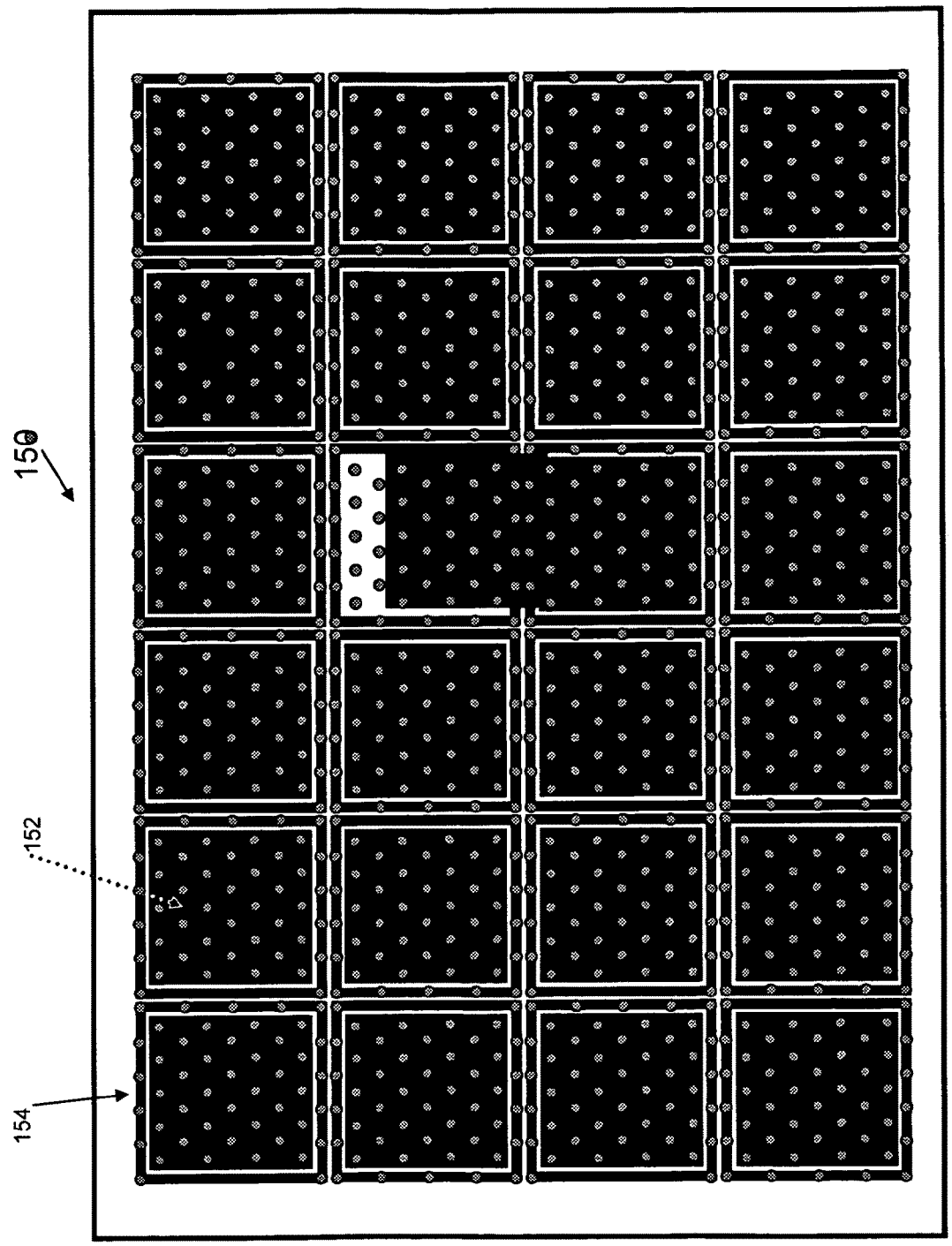
Figure 14:
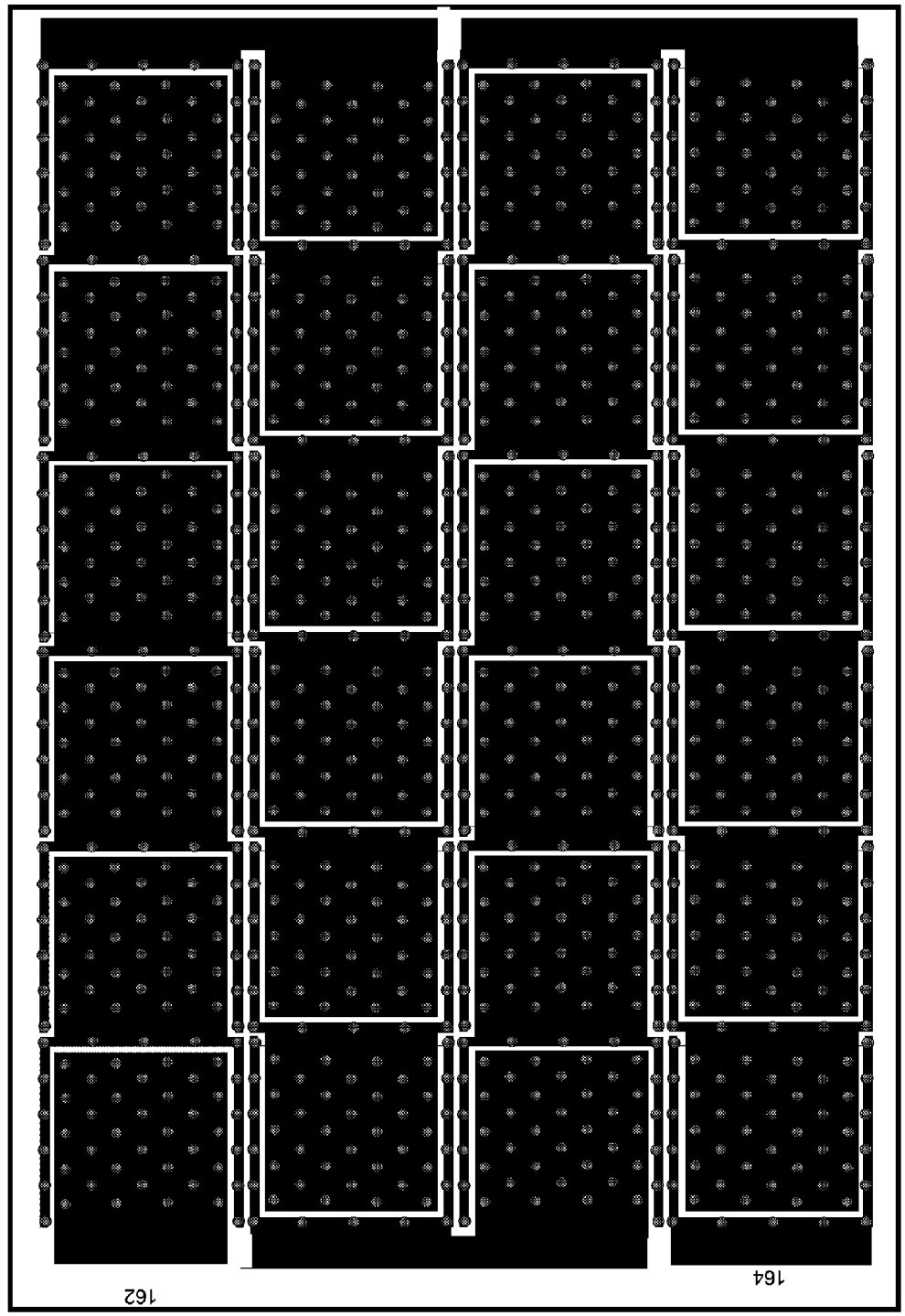
Figure 15:
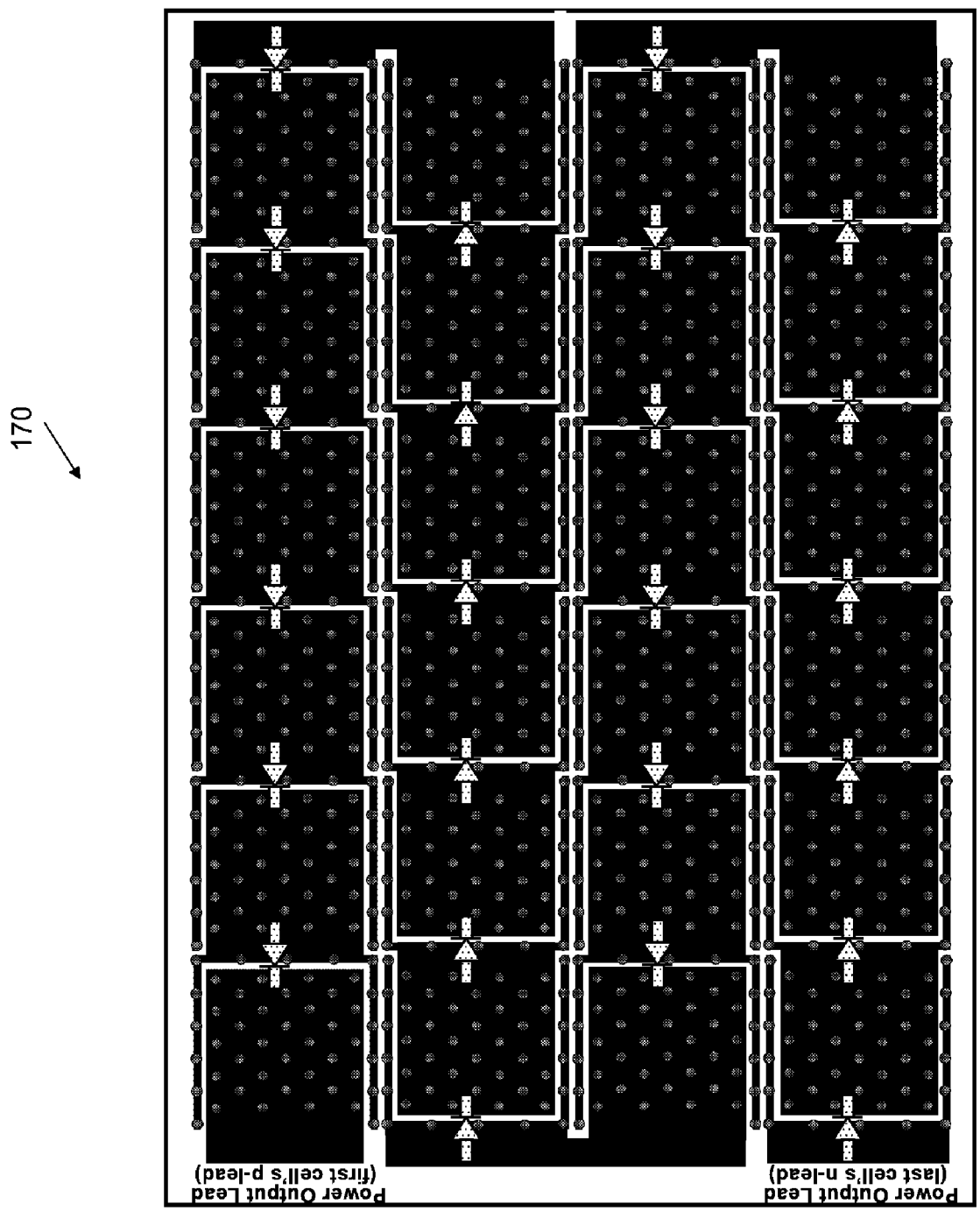
Figure 16:
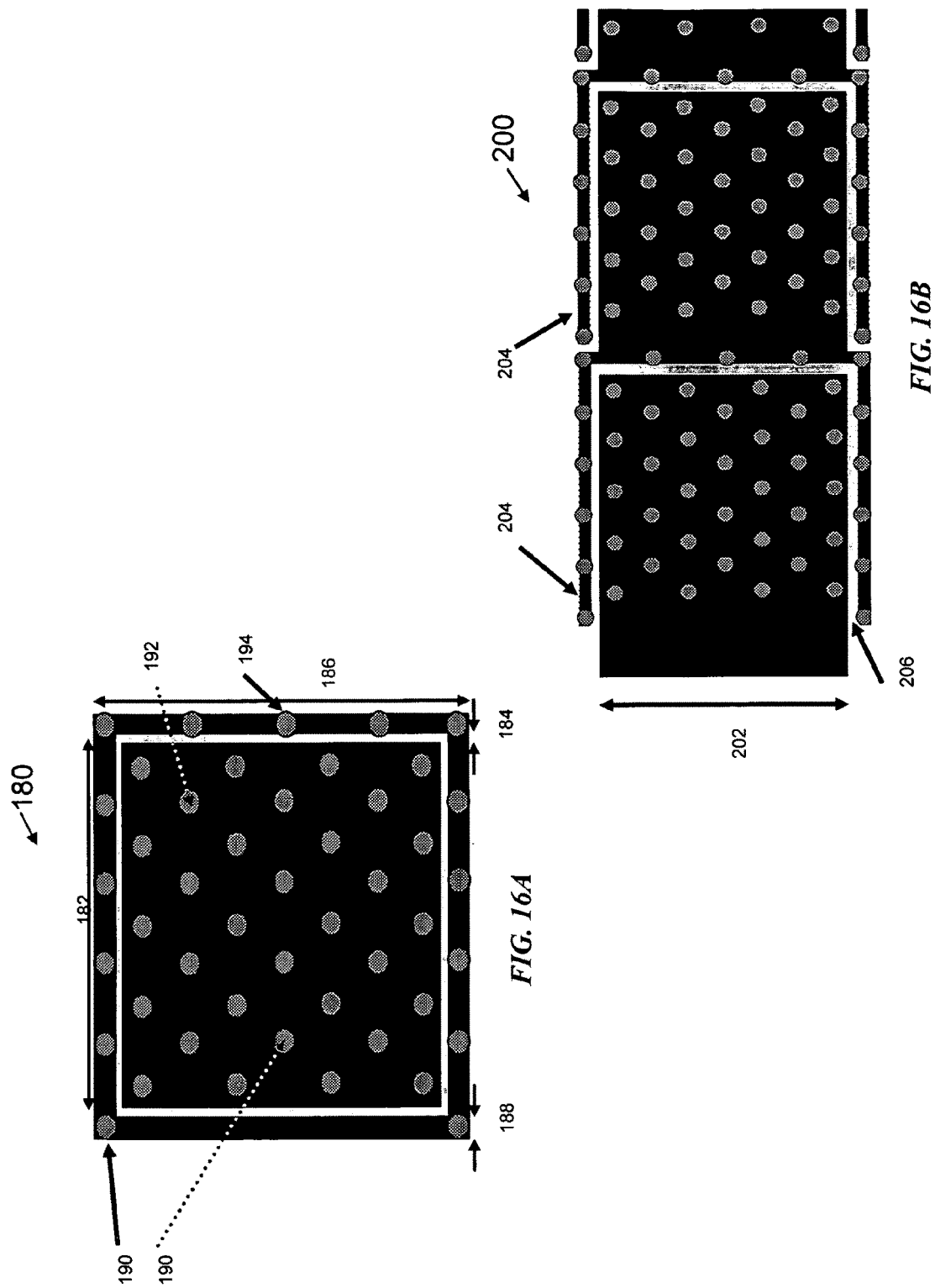
Figure 17:
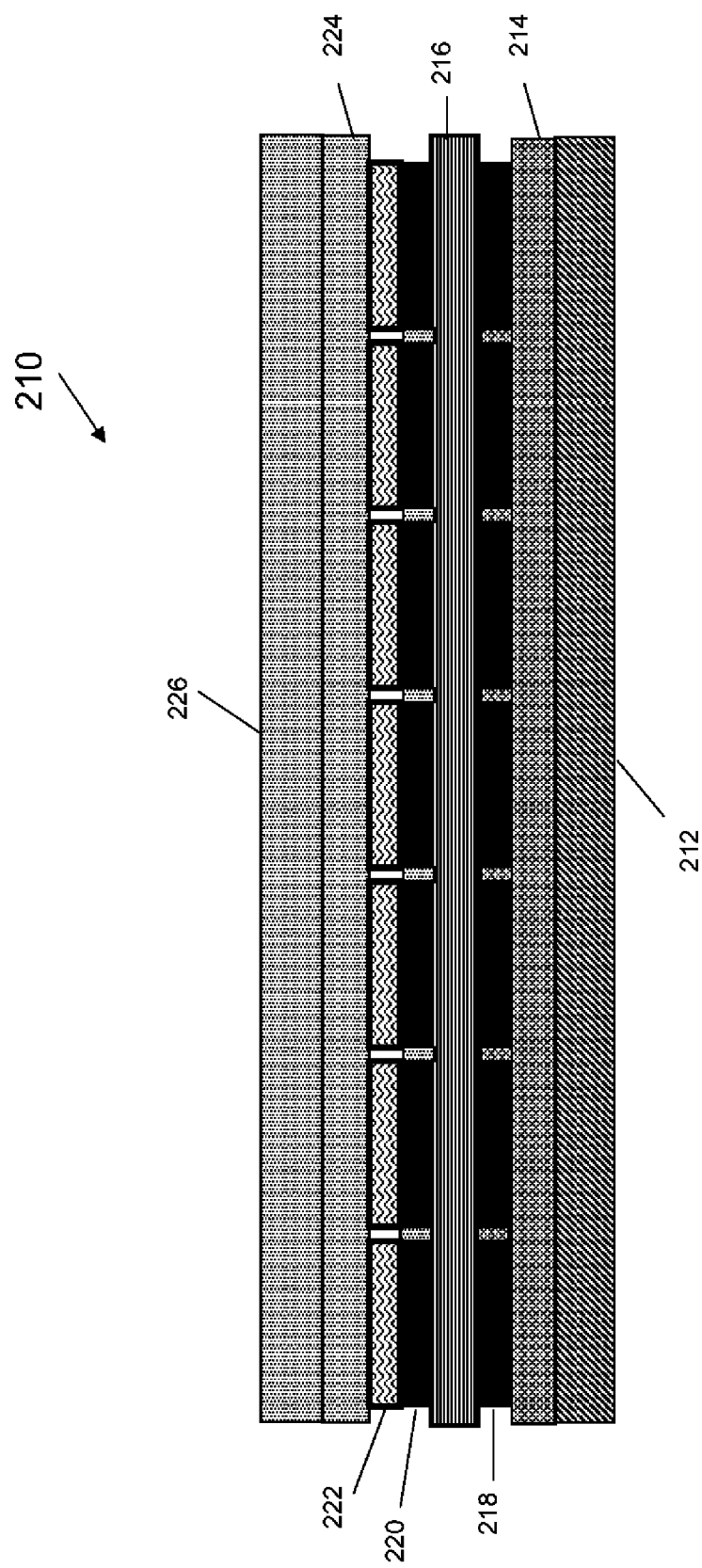
Figure 18:
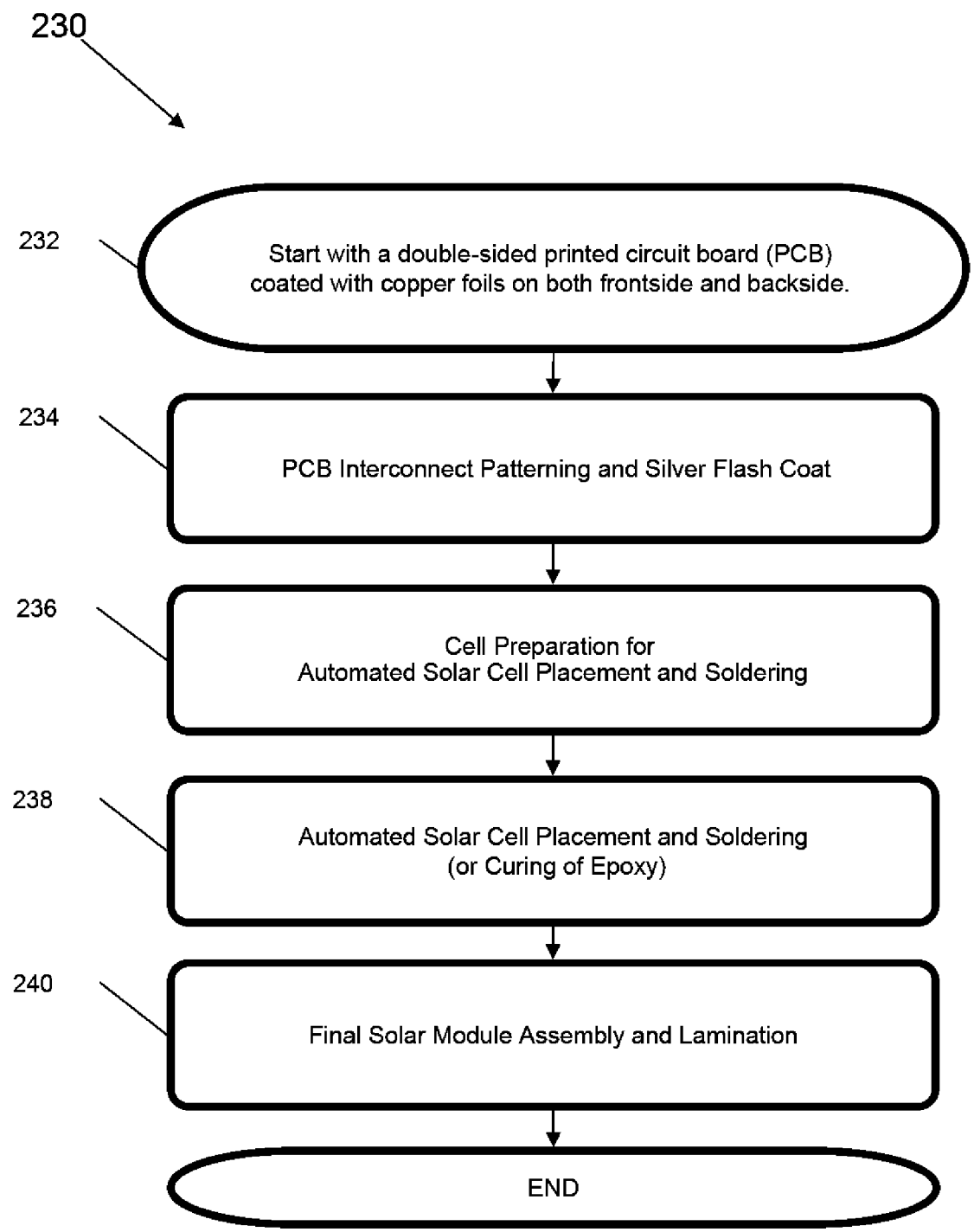
Figure 19:
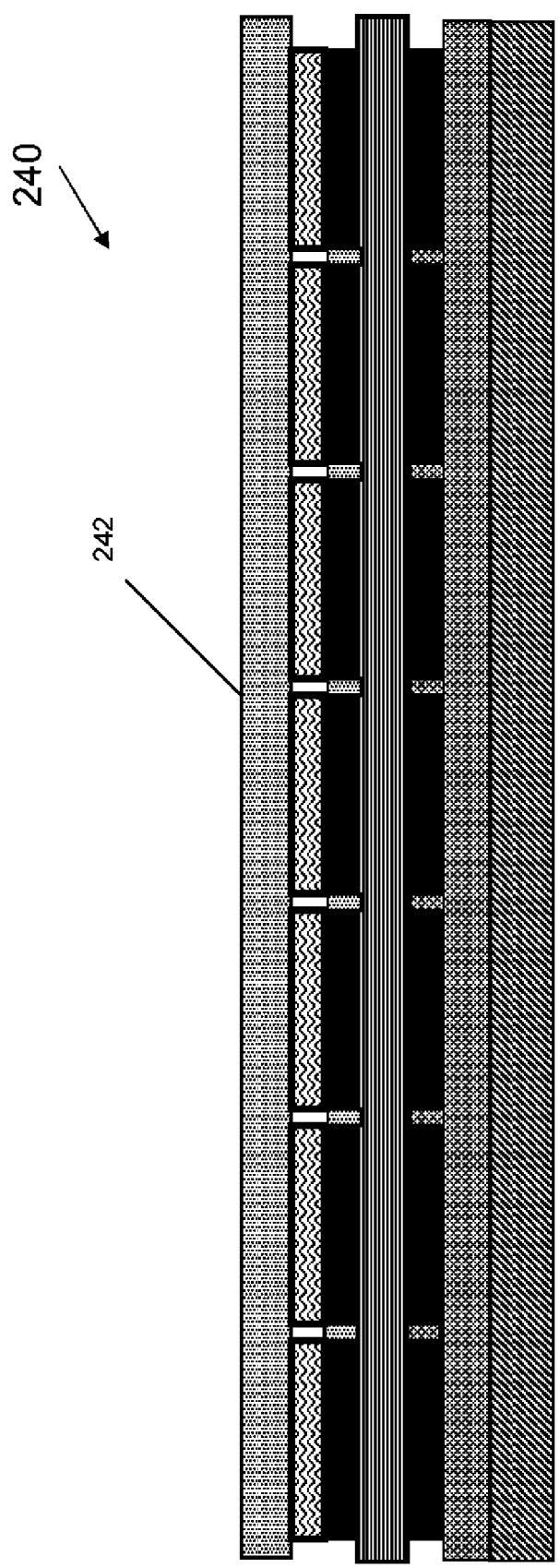
Figure 20:
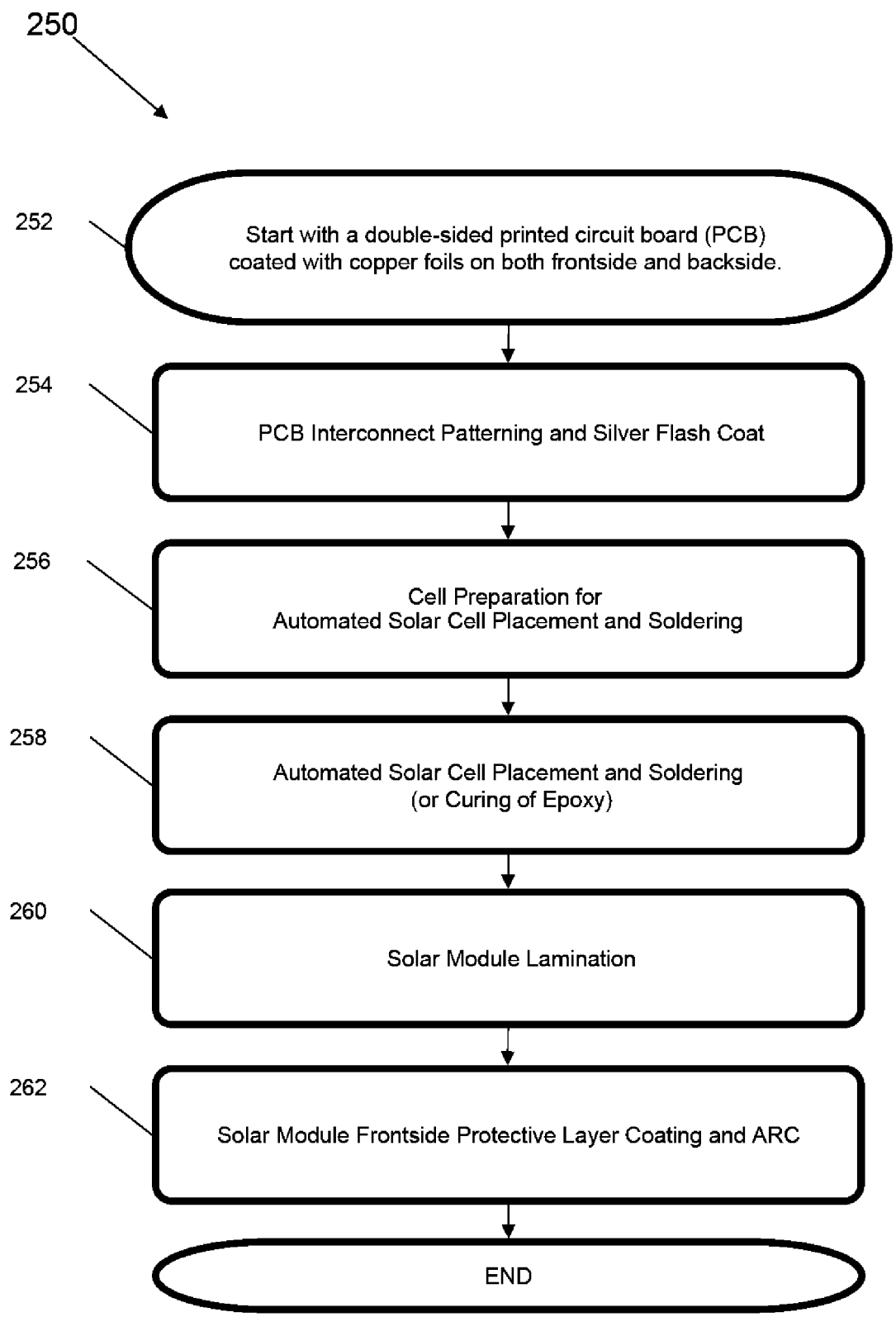
Figure 21:
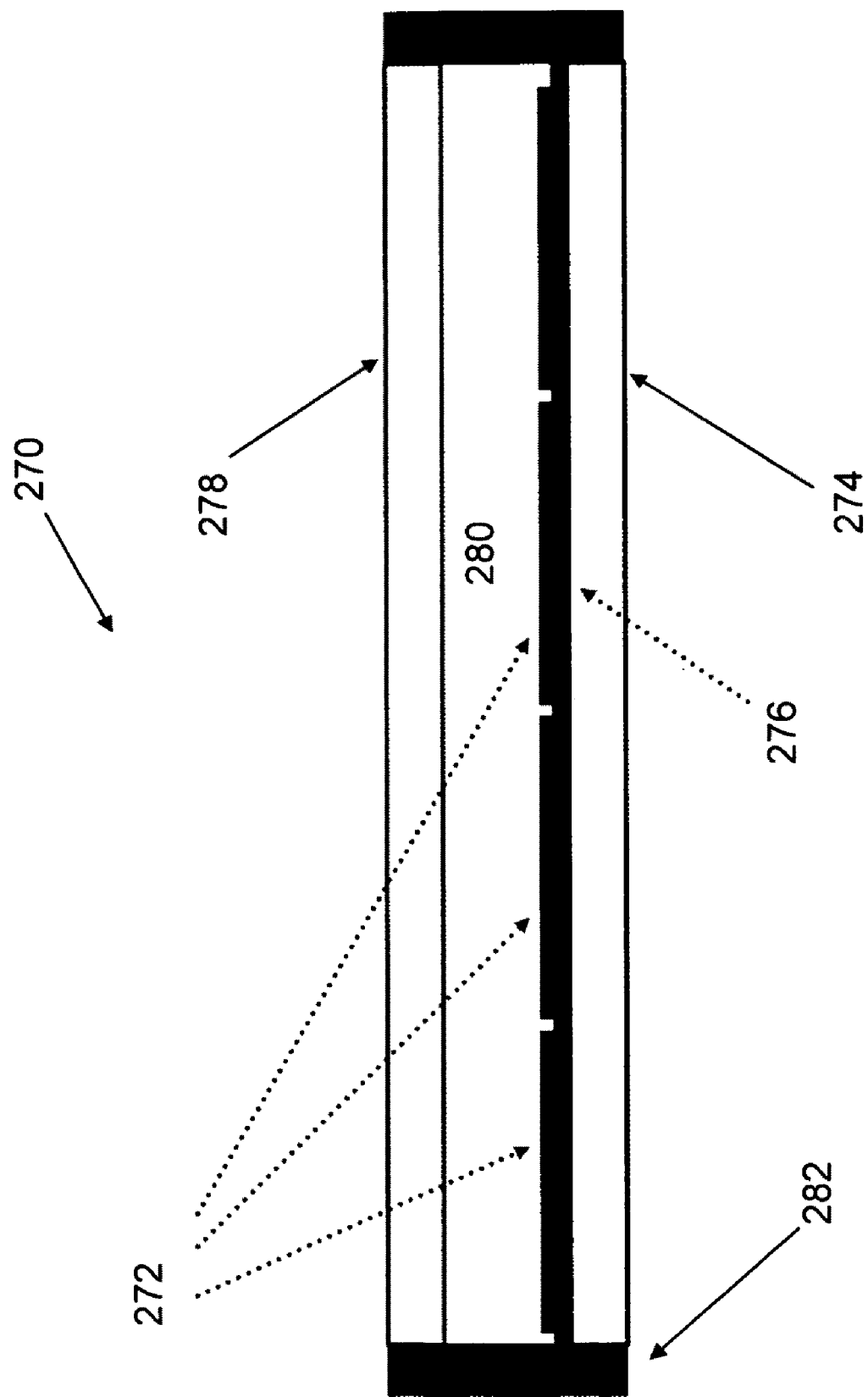
Figure 22:
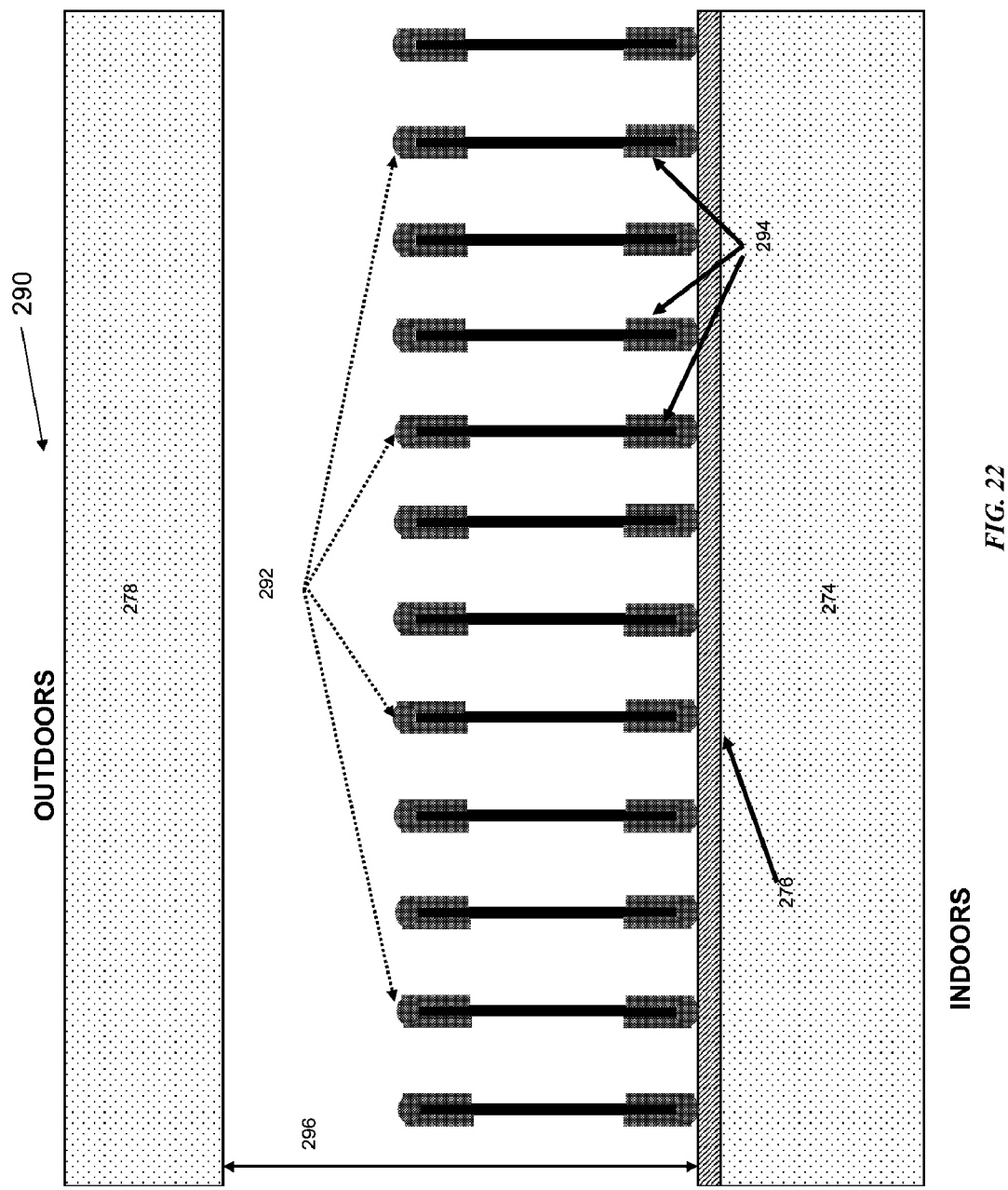
Figure 23:
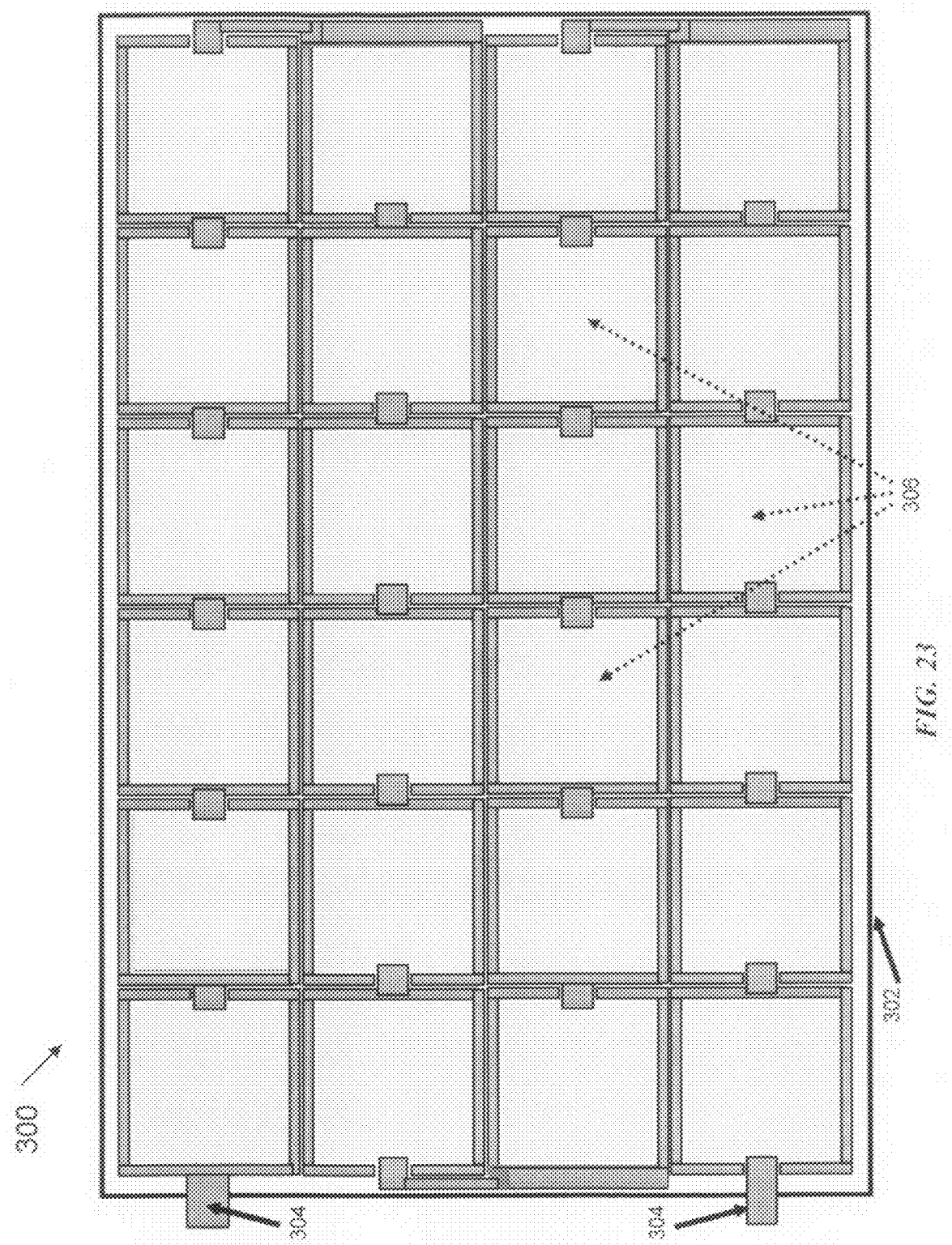
Figure 24:
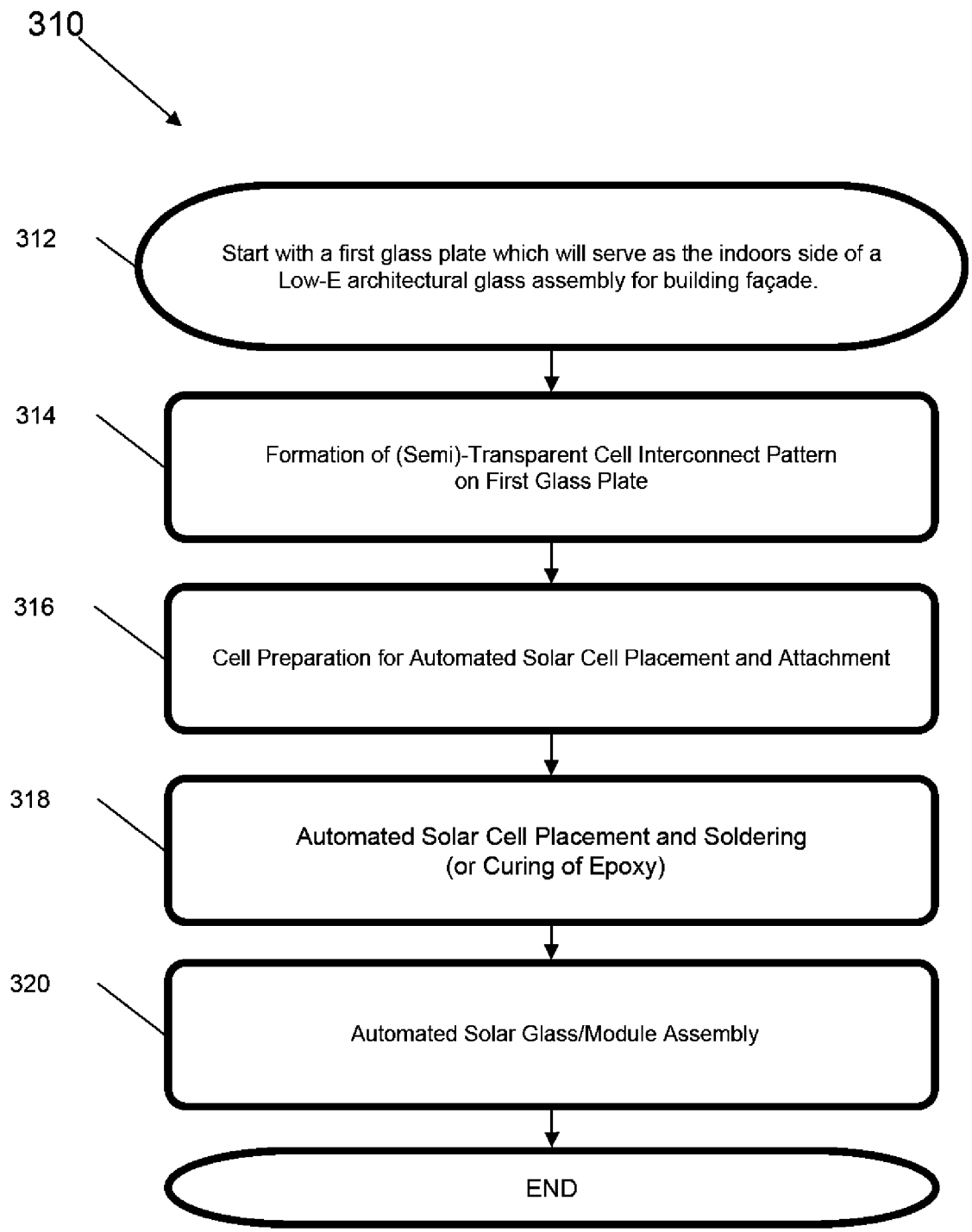
Figure 25:
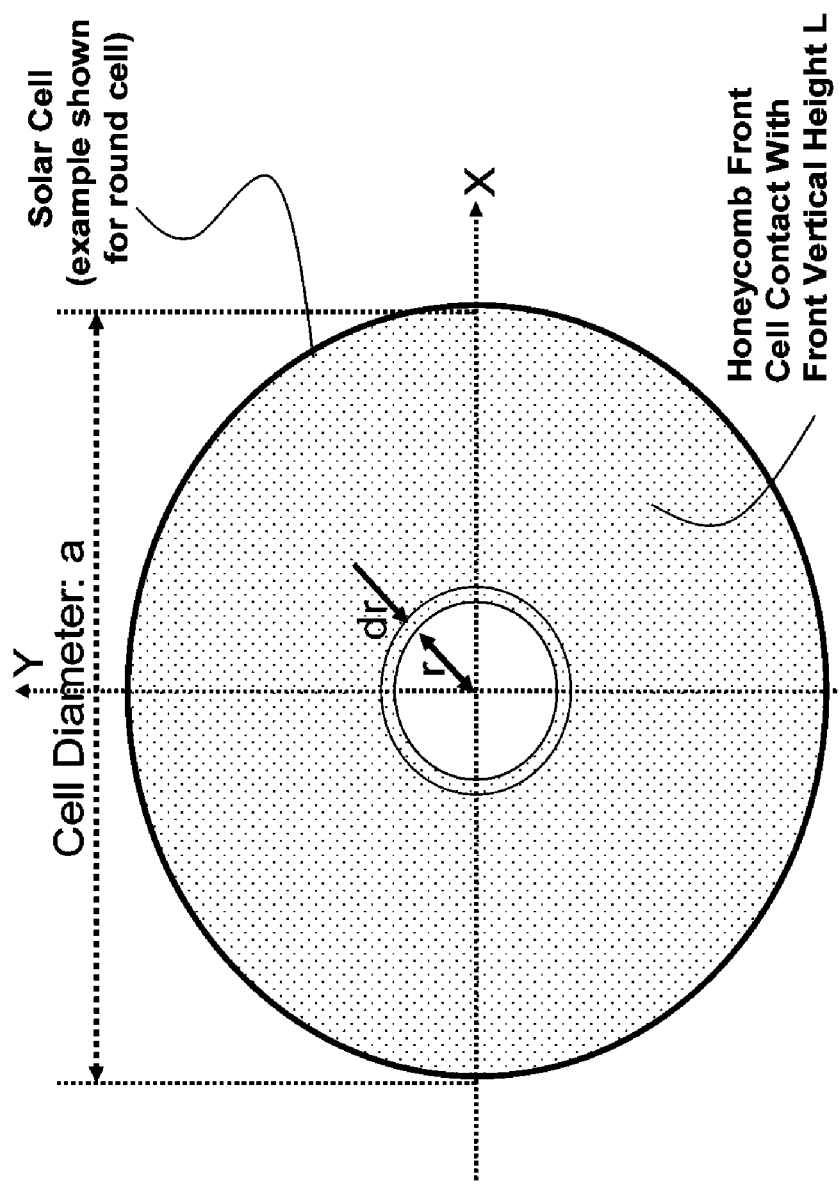

FIG. 3 (PRIOR ART) summarizes the key process steps eliminated by the current disclosure, compared to the prior art;

FIG. 4 summarizes the high-level process flow and the competitive advantages of the current disclosure, compared to the prior art;

FIG. 5 provides another summary of the key features and benefits of the current disclosure;

FIG. 6 shows a view of series connections of TFSCs in a solar module assembly;

FIG. 7 shows a top view of an embodiment of a hexagonal-prism TFSC including a square-shaped hexagonal-prism 3-D TFSC substrate with a planar peripheral silicon frame;

FIGS. 8A and 8B show scanning electron microscopic views of two embodiments of a hexagonal-prism 3-D TFSC, without and with a rear base layer, respectively (FIGS. 8A and 8B show the dual-aperture and single-aperture 3-D TFSC substrates, respectively);

FIG. 9 provides an overview of the 3-D TFSC substrate and solar cell fabrication process flow;

FIG. 10 shows a view of an embodiment of a template including hexagonal prism posts;

FIGS. 11A and 11B show magnified scanning views (with two different magnifications) of one embodiment of a template including hexagonal prism posts;

FIG. 12 shows a view of an embodiment of a template including staggered (shifted) square prism posts;

FIG. 13 shows a view of the frontside metallization pattern of a printed-circuit board (PCB) used for solar module assembly using the TFSCs of the current disclosure;

FIGS. 14 and 15 show views of the backside metallization pattern of a PCB used for solar module assembly using the TFSCs of the current disclosure;

FIG. 16A shows an enlarged top view of the frontside of a solar module PCB, showing one of the PCB patterned metallization sites for placement of one of the solar cells of the current disclosure;

FIG. 16B shows an enlarged top view of the backside of a solar module PCB, showing the series connections of the adjacent cells on the PCB;

FIG. 17 shows a cross-sectional view of an embodiment of a solar module structure comprising the TFSCs of the current disclosure and a tempered glass cover;

FIG. 18 shows an embodiment of a process flow for fabrication of solar modules using a tempered glass cover;

FIG. 19 shows a cross-sectional view of an embodiment of a solar module structure comprising the TFSCs of the current disclosure and a coated layer cover;

FIG. 20 shows an embodiment of a process flow for fabrication of solar modules without a tempered glass cover;

FIGS. 21 and 22 show cross-sectional views of a solar glass assembly for building façade applications;

FIG. 23 shows a view of an electrically conductive layer formed on a glass plate to interconnect cells in series for solar glass applications;

FIG. 24 shows an embodiment of a process flow for fabrication of solar modules for solar glass applications;

FIG. 25 serves as a reference FIGURE for calculation of TFSC interconnect ohmic losses;

FIGS. 26 through 31 show graphs of interconnect (emitter contact metallization) ohmic losses at maximum cell power versus the ratio of emitter contact metal coverage height for various emitter metal sheet resistance values.

Figure 32:
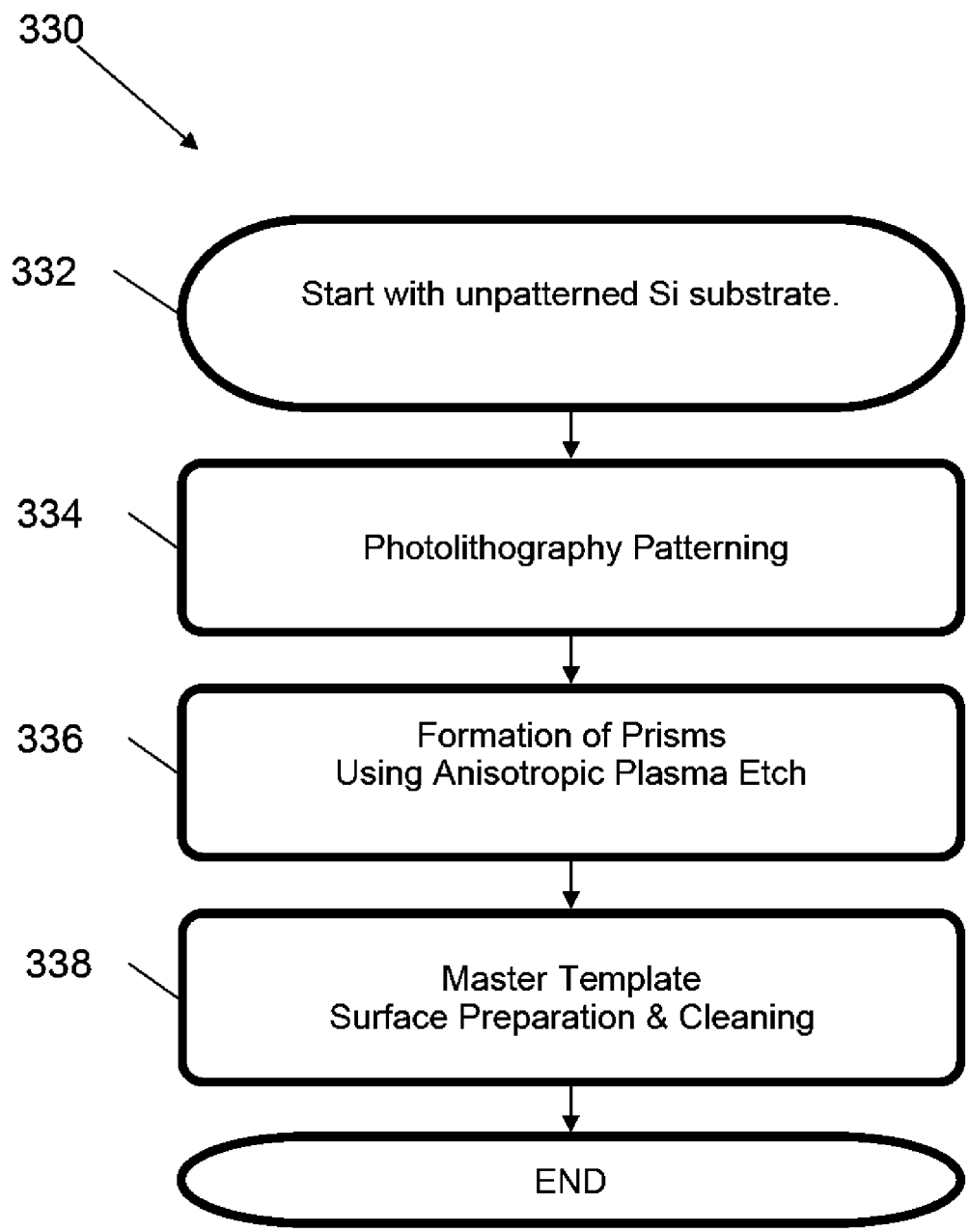
Figure 33:
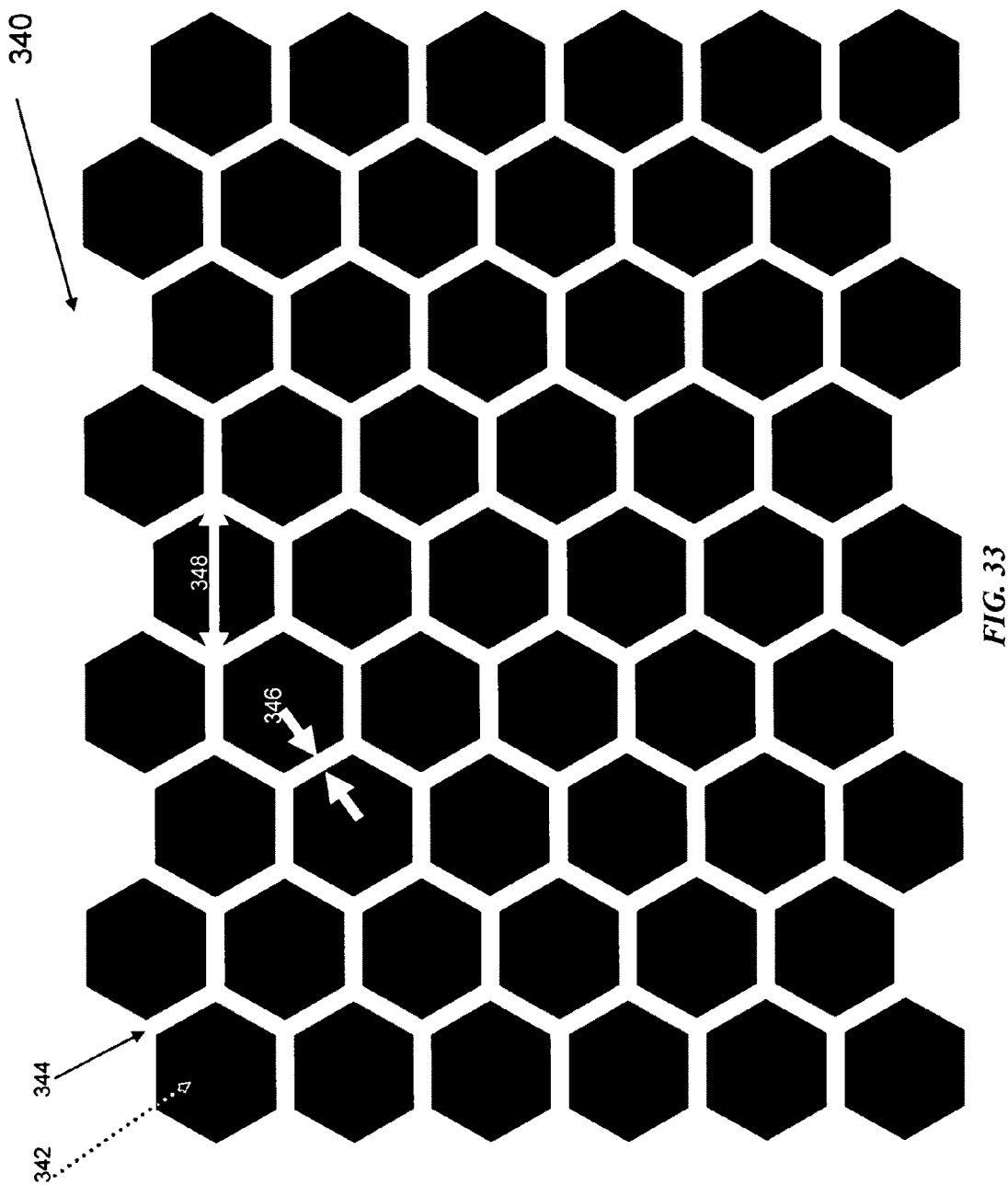
Figure 36:
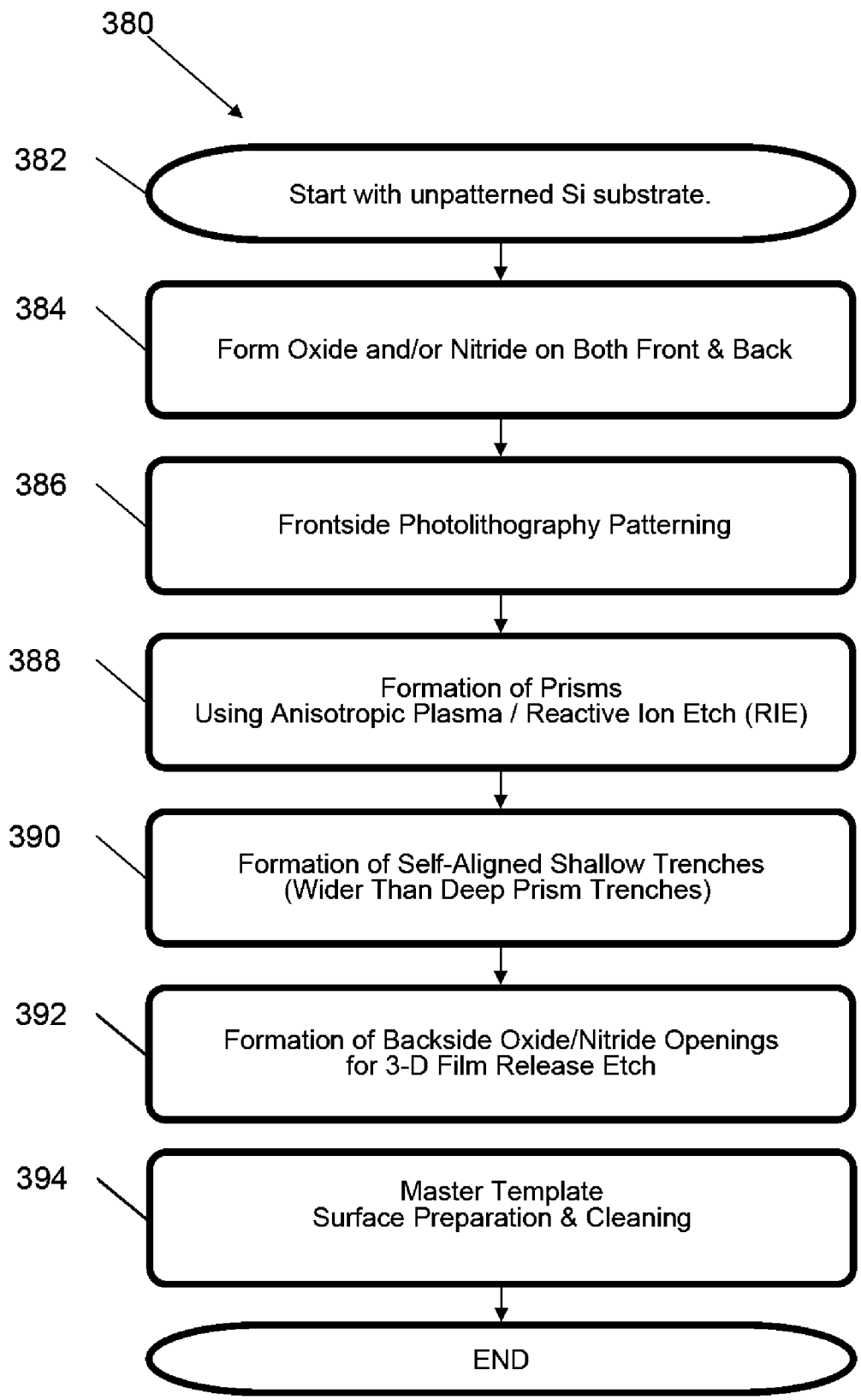
Figure 37:
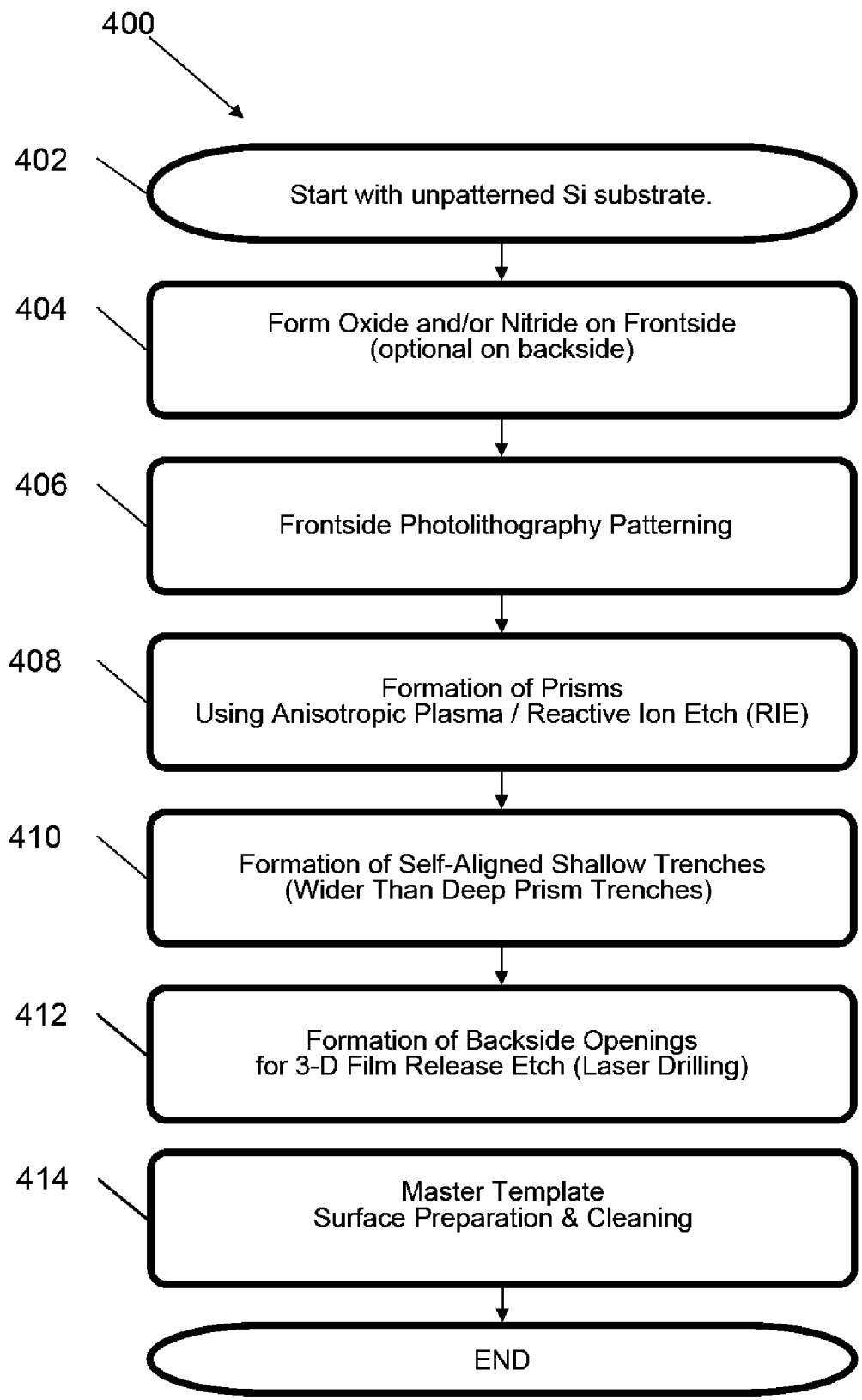
Figure 38:
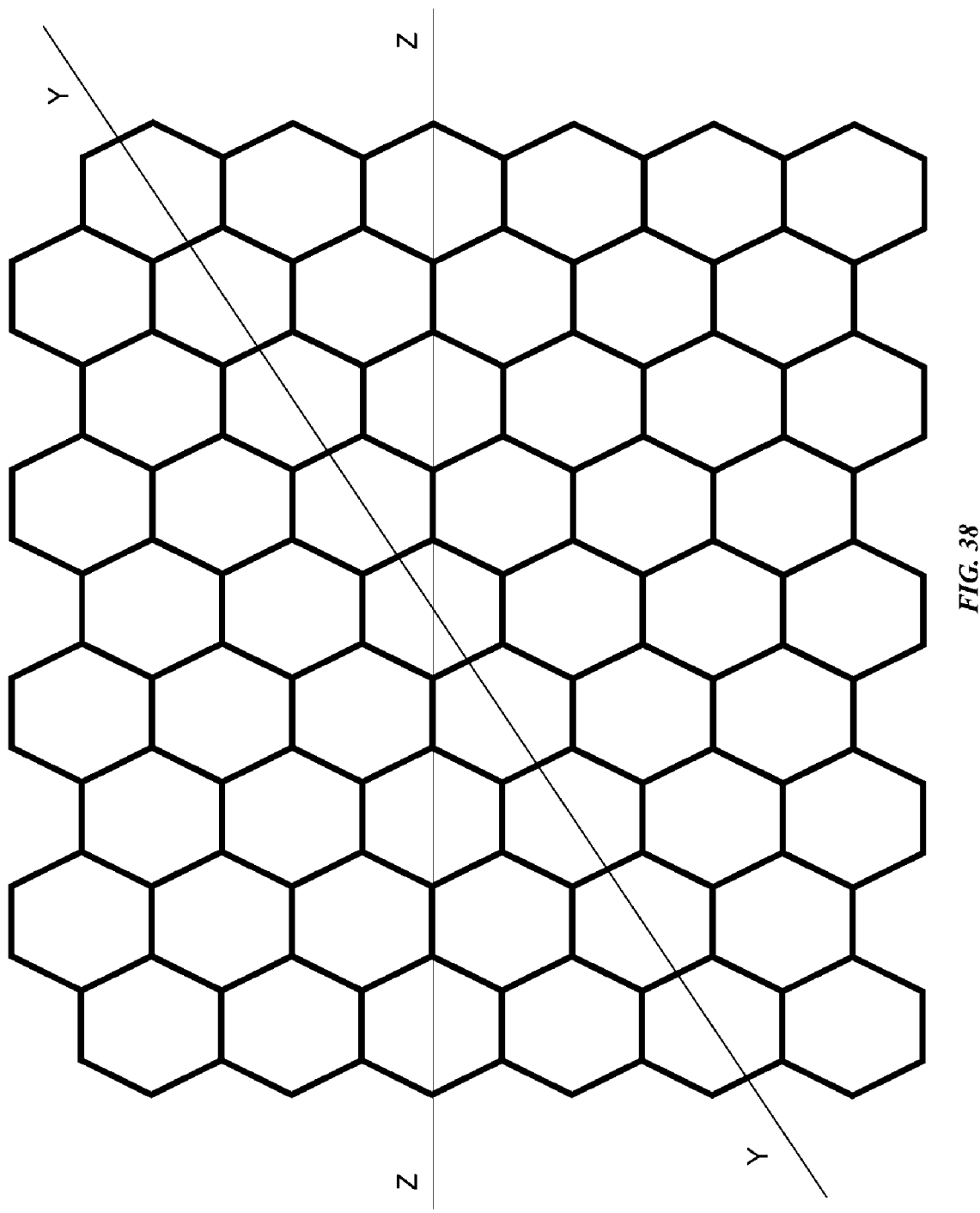
Figure 39:
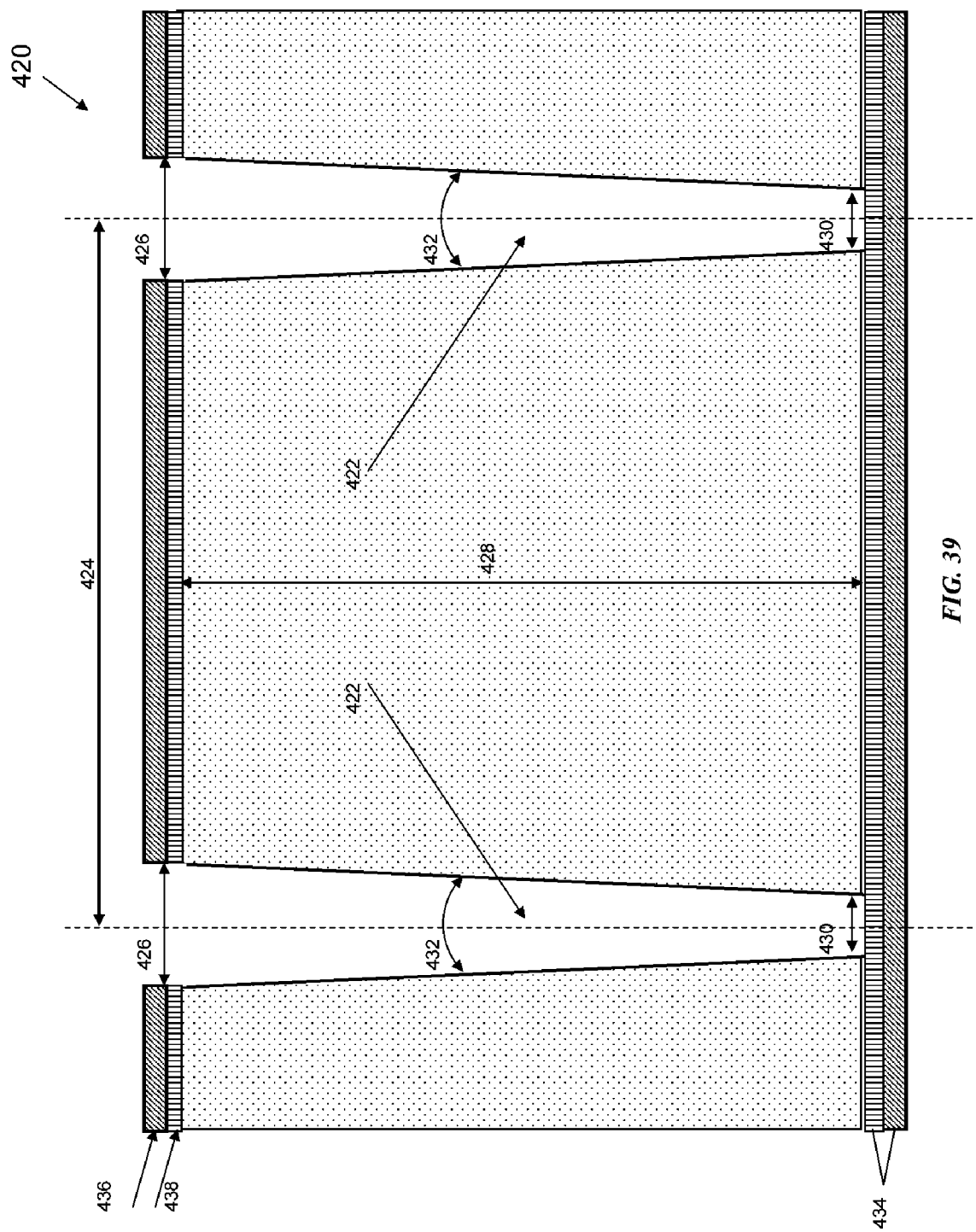
Figure 40:
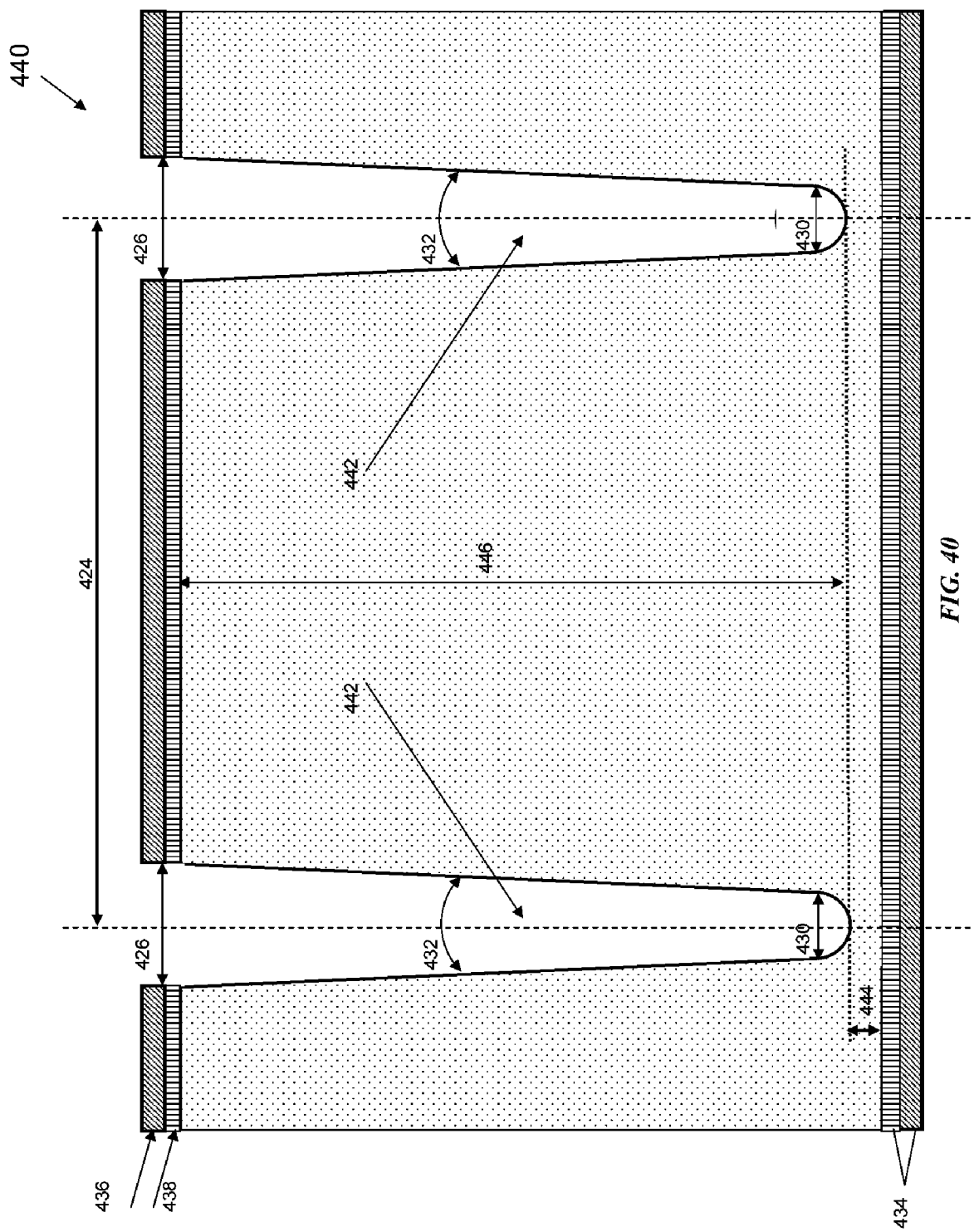
Figure 53:
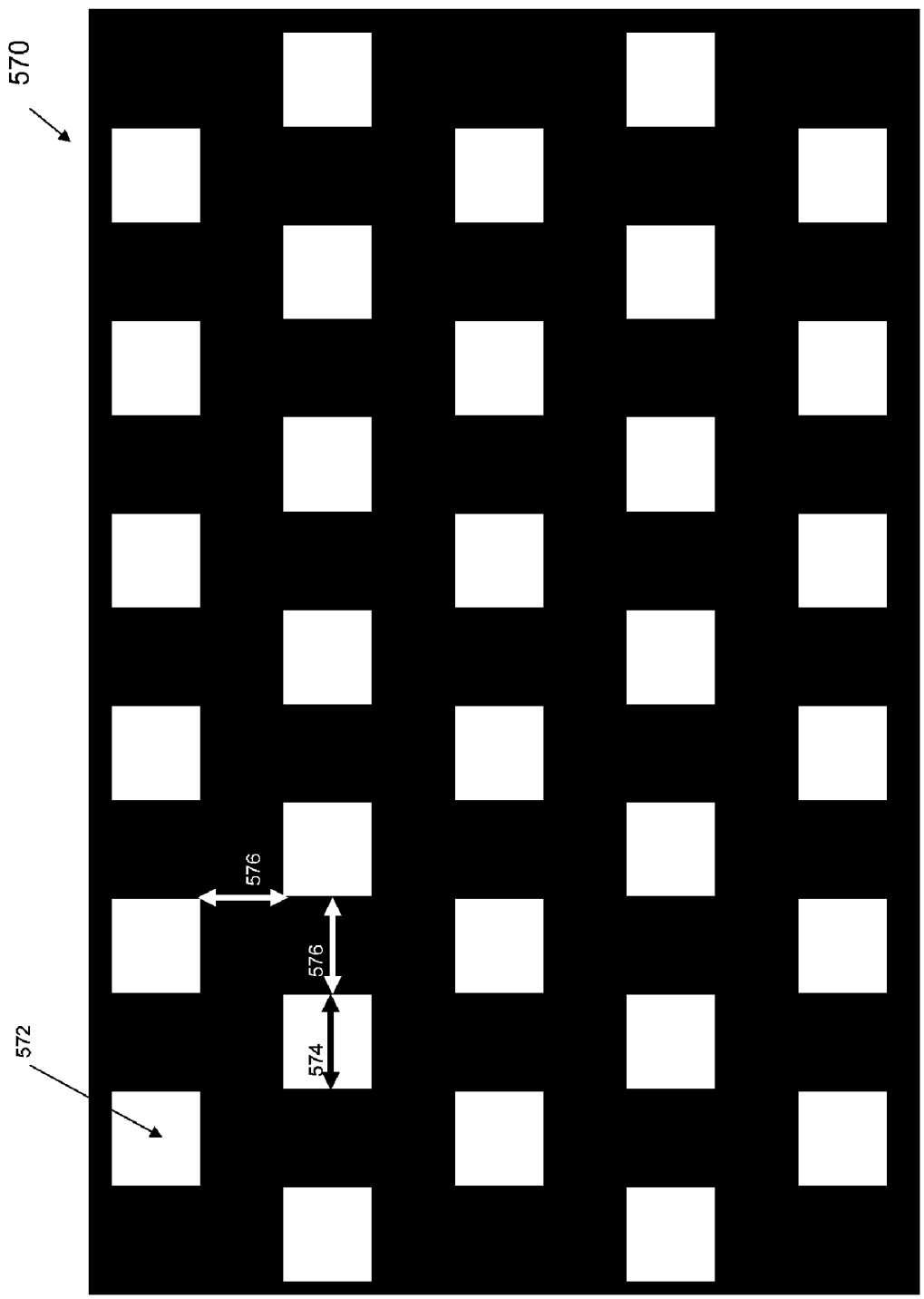
Figure 54:
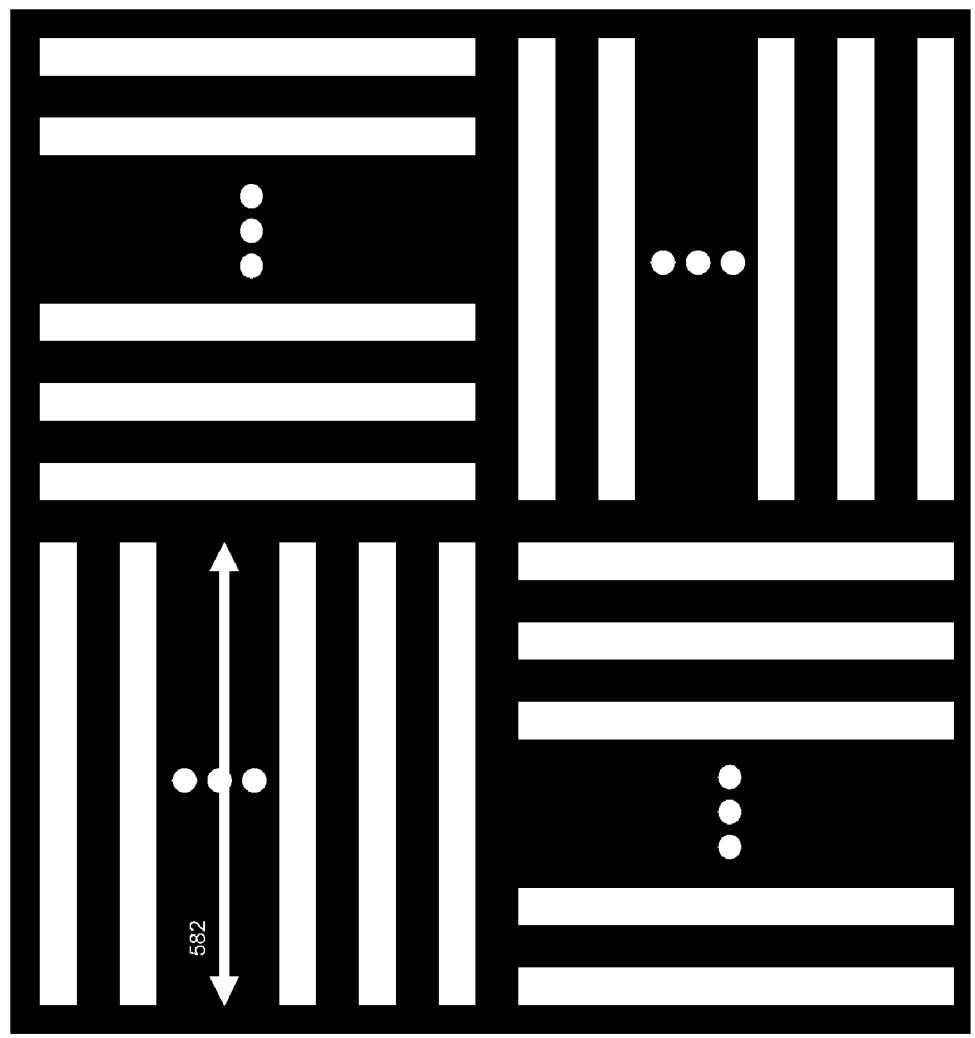
Figure 55:
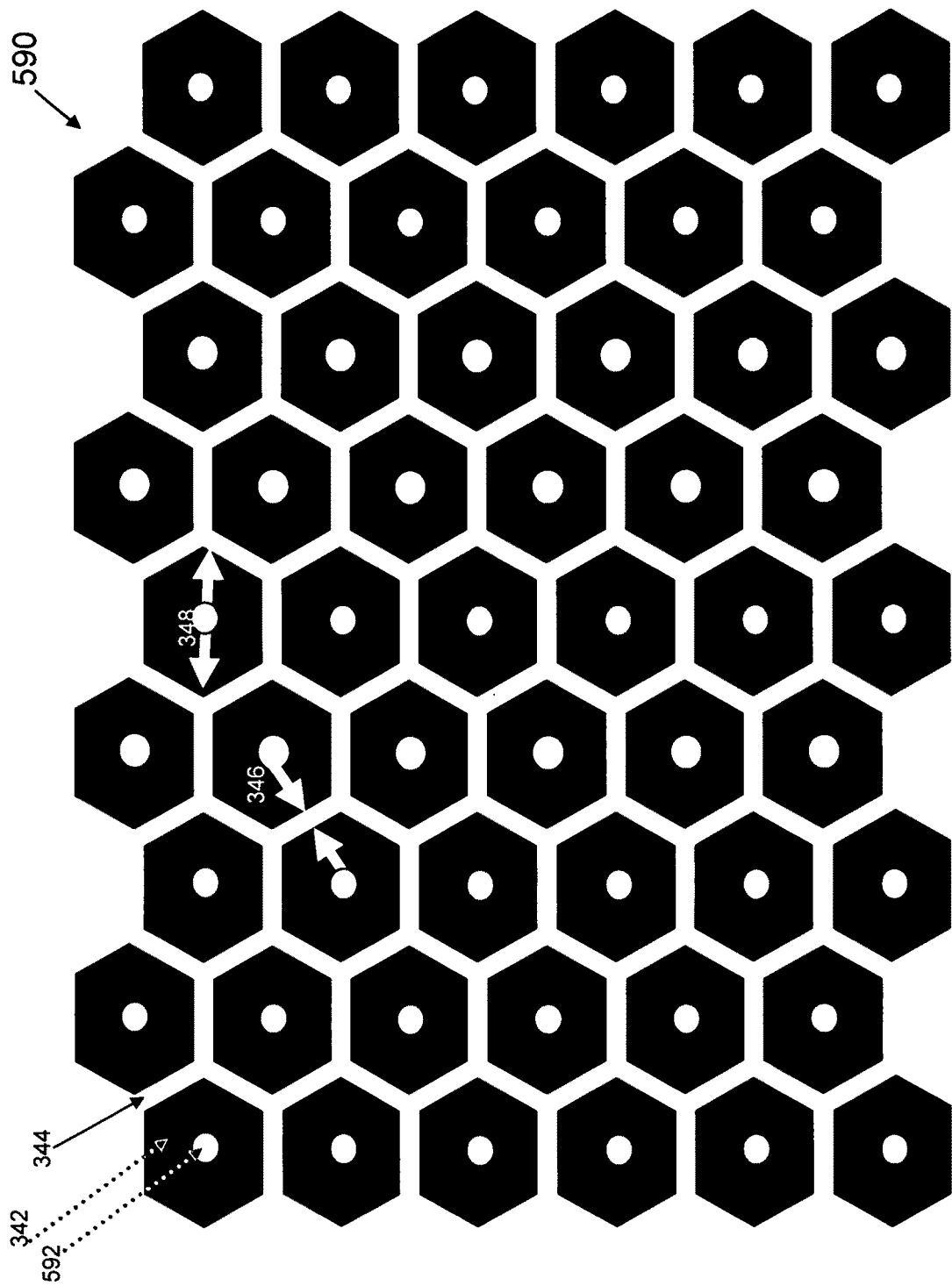
Figure 56:
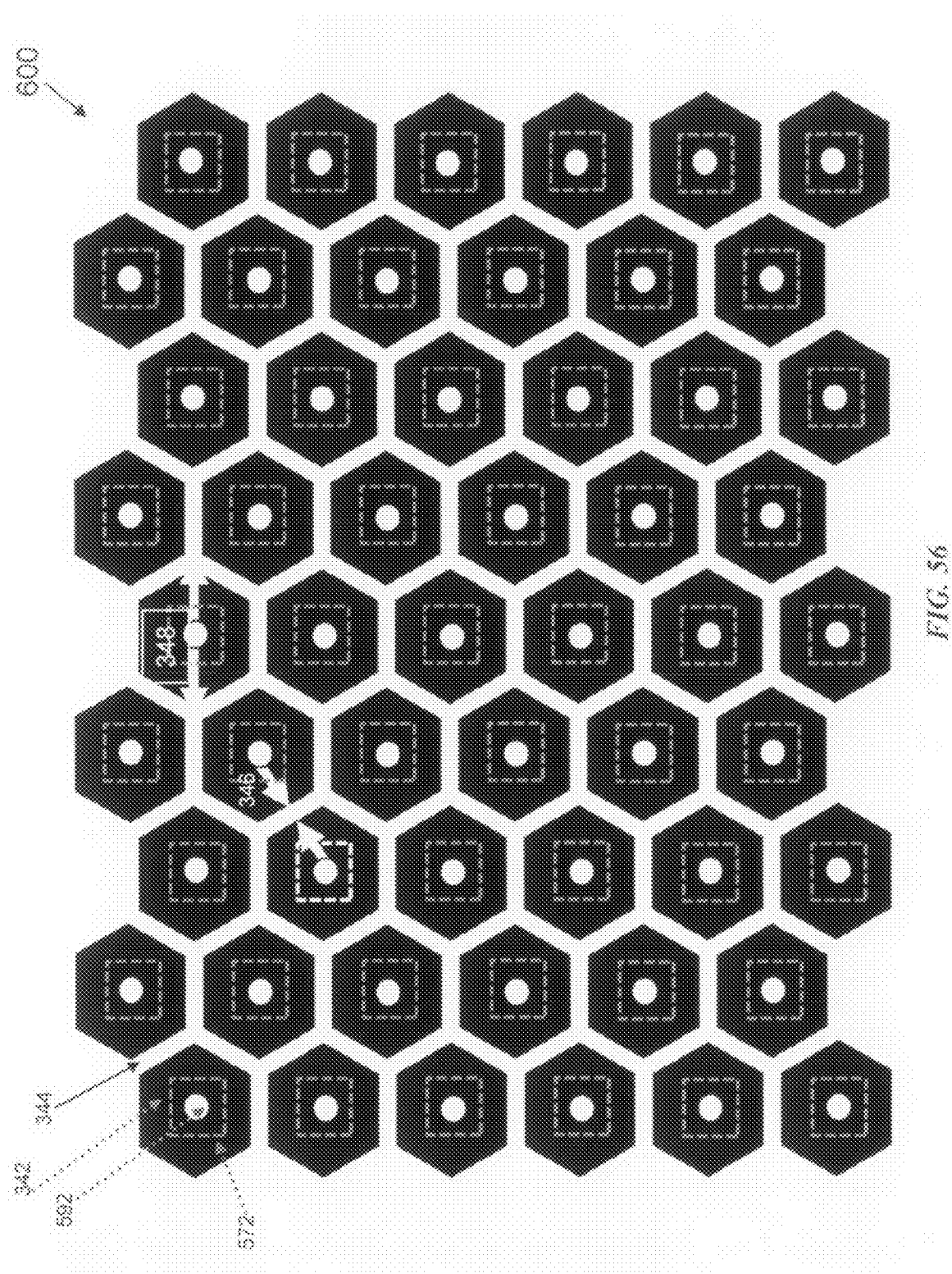
Figure 57:
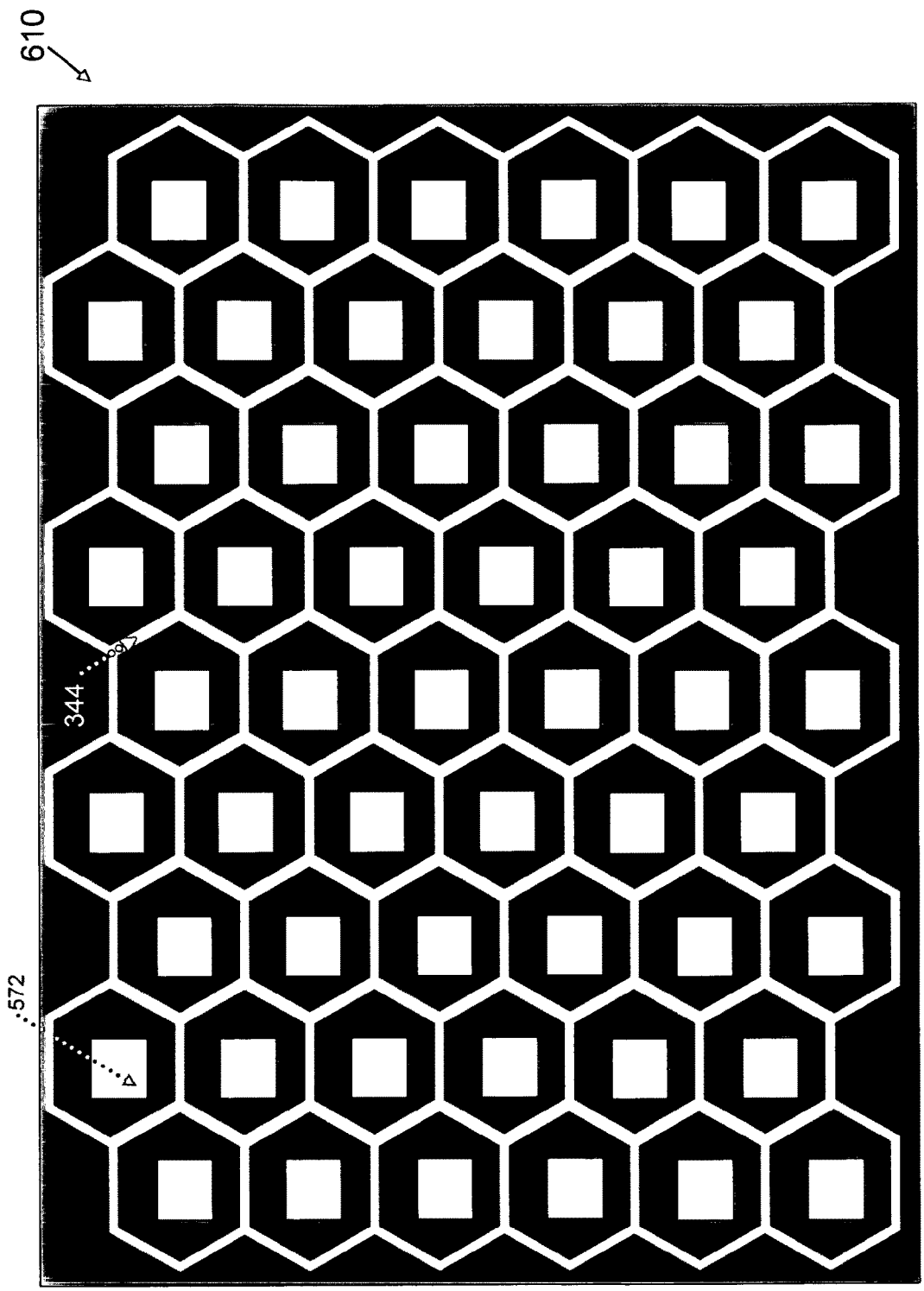
Figure 77:
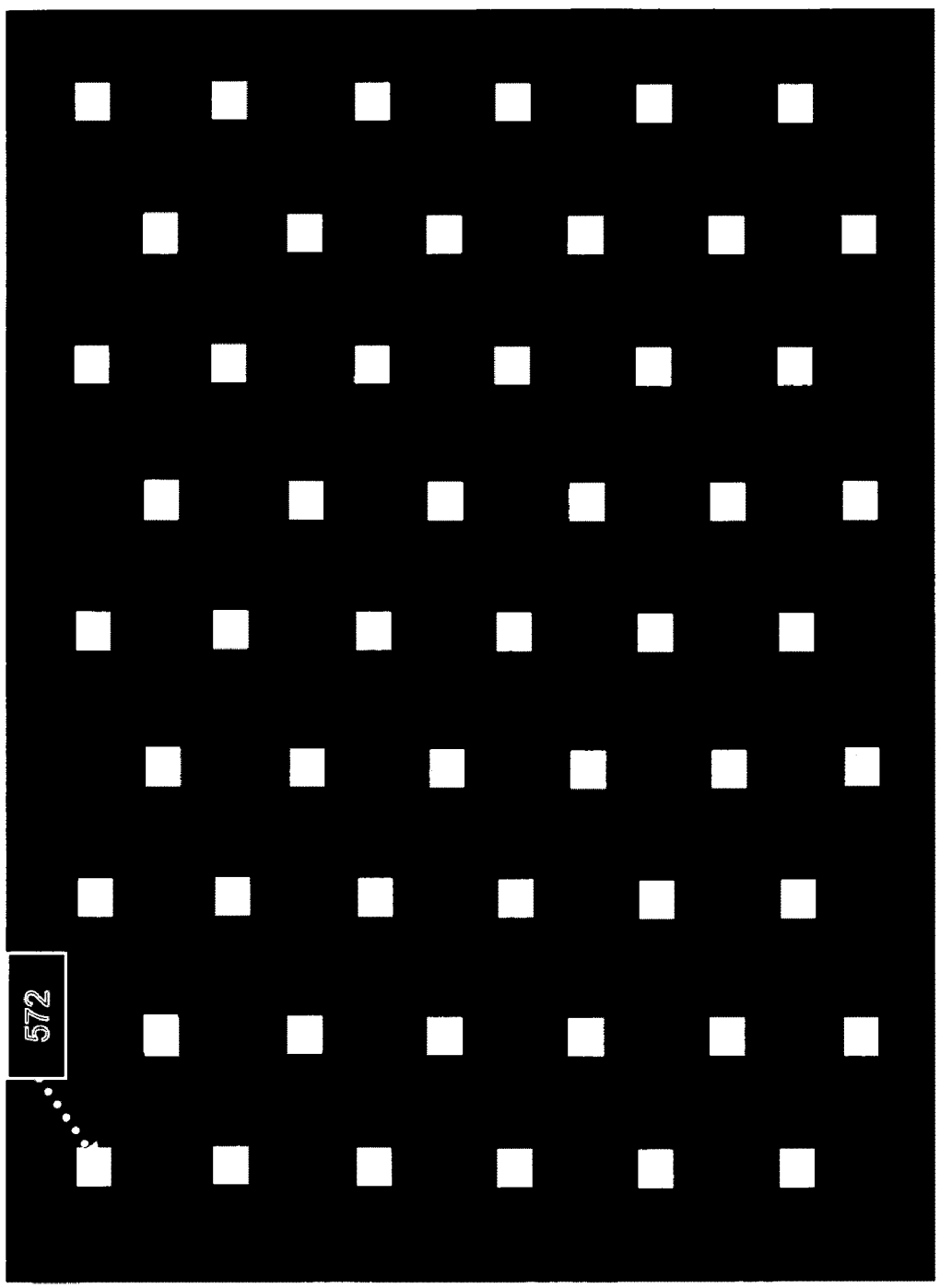
Figure 78:
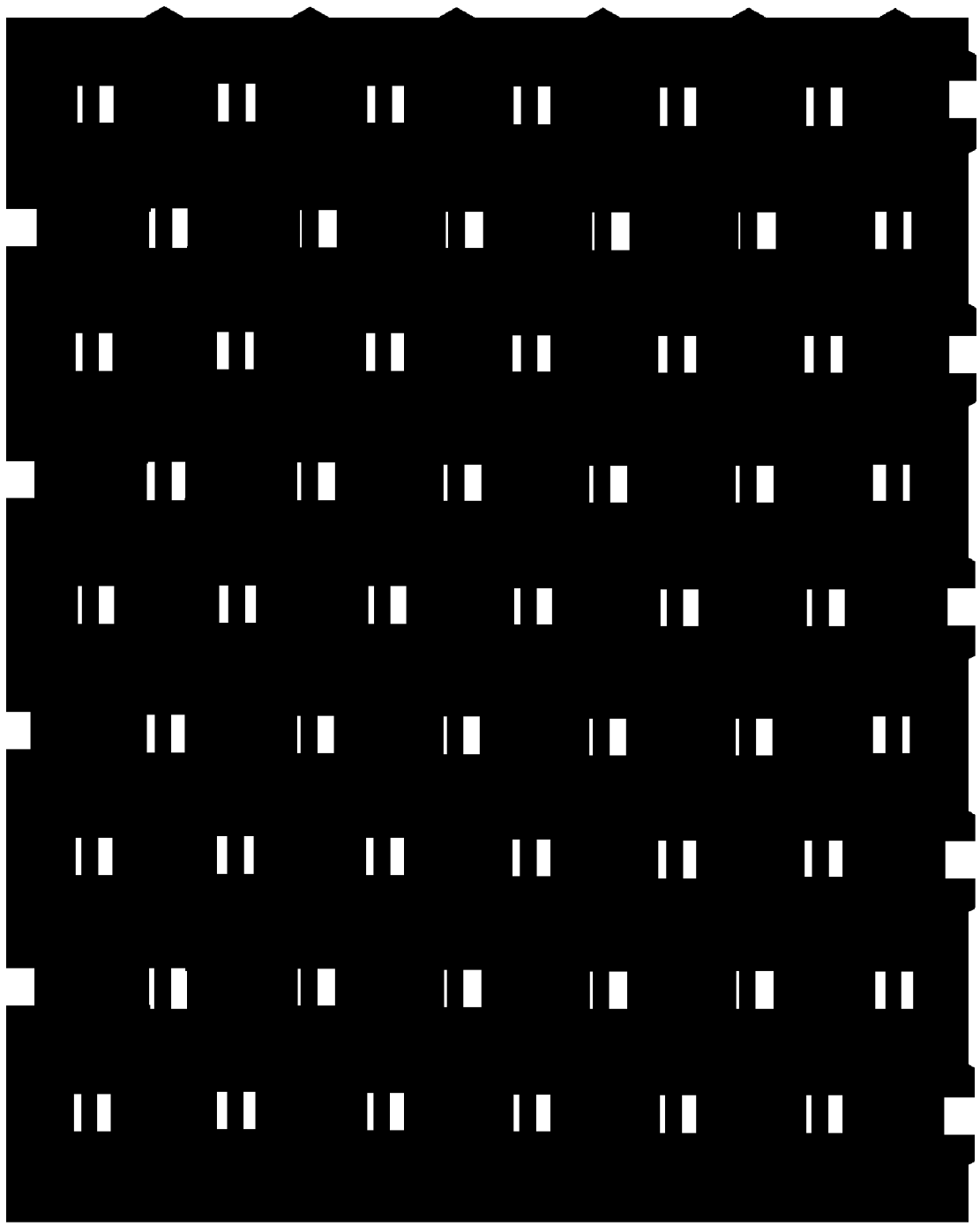

FIG. 32 outlines an embodiment of a process flow for fabrication of a template using photolithography patterning;

FIG. 33 shows a top view of an embodiment of a lithography mask design to produce a hexagonal array (honeycomb) pattern;

FIGS. 34 through 37 outline various embodiments of process flows for fabrication of a template using either direct laser micromachining or photolithography patterning;

FIG. 38 shows the Y-Y and Z-Z cross-sectional axes on an embodiment of a hexagonal-prism (honeycomb) 3-D TFSC substrate;

FIGS. 39 and 40 show Y-Y cross-sectional views of an embodiment of a template including through-wafer and within-wafer trenches, respectively;

FIGS. 41 through 47 show Y-Y cross-sectional views of a silicon substrate during the fabrication process flow for making an embodiment of a template based on the process flows of FIG. 36 or FIG. 37;

FIGS. 48 through 52 show Y-Y cross-sectional views of alternative embodiments of templates;

FIGS. 53 and 54 show embodiments of mask designs for patterning a semiconductor (silicon) wafer rear to produce backside openings on a template;

FIG. 55 shows an alternative frontside lithography mask with an array of hexagonal array openings for formation of template trenches and an array of holes for formation of an array of release channels from the template backside to the template frontside;

FIG. 56 shows the frontside patterning mask in FIG. 55 with a backside square array pattern (to be used for backside patterning with relative alignment as shown to the frontside pattern) superimposed for reference;

FIG. 57 shows the backside lithography mask pattern (square array) in FIG. 56 with the frontside mask hexagonal array pattern from FIG. 55 superimposed for reference;

FIGS. 58 through 66 show Y-Y cross-sectional views of a semiconductor (silicon) substrate during the fabrication process flow for making an embodiment of a template based on the process flows of FIG. 36 or FIG. 37;

FIGS. 67 through 75 show Y-Y cross-sectional views of a silicon substrate during the fabrication process flow for making an embodiment of a template based on the process flows of FIG. 36 or FIG. 37;

FIG. 76 and FIGS. 79 through 86 show Y-Y cross-sectional views of a semiconductor (e.g., silicon) substrate during the fabrication process flow for making an embodiment of a template based on the process flows of FIG. 36 or FIG. 37;

FIGS. 77 and 78 show backside lithography mask designs; FIG. 78 shows the relative alignment of the backside square array pattern with respect to the frontside hexagonal array pattern whereas FIG. 77 shows the backside square array pattern used for formation of chemical release channels on the template.

Figure 87:
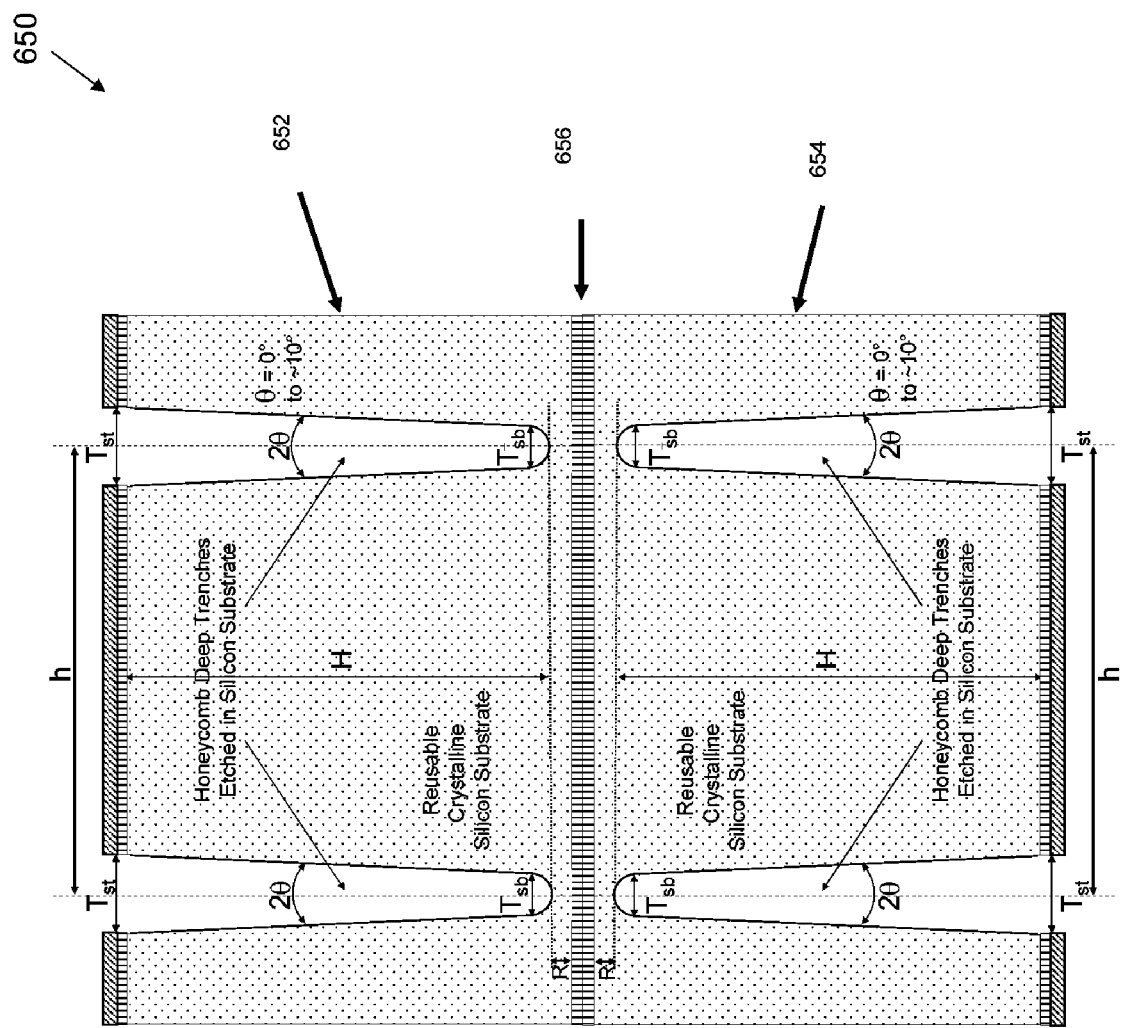
Figure 88:
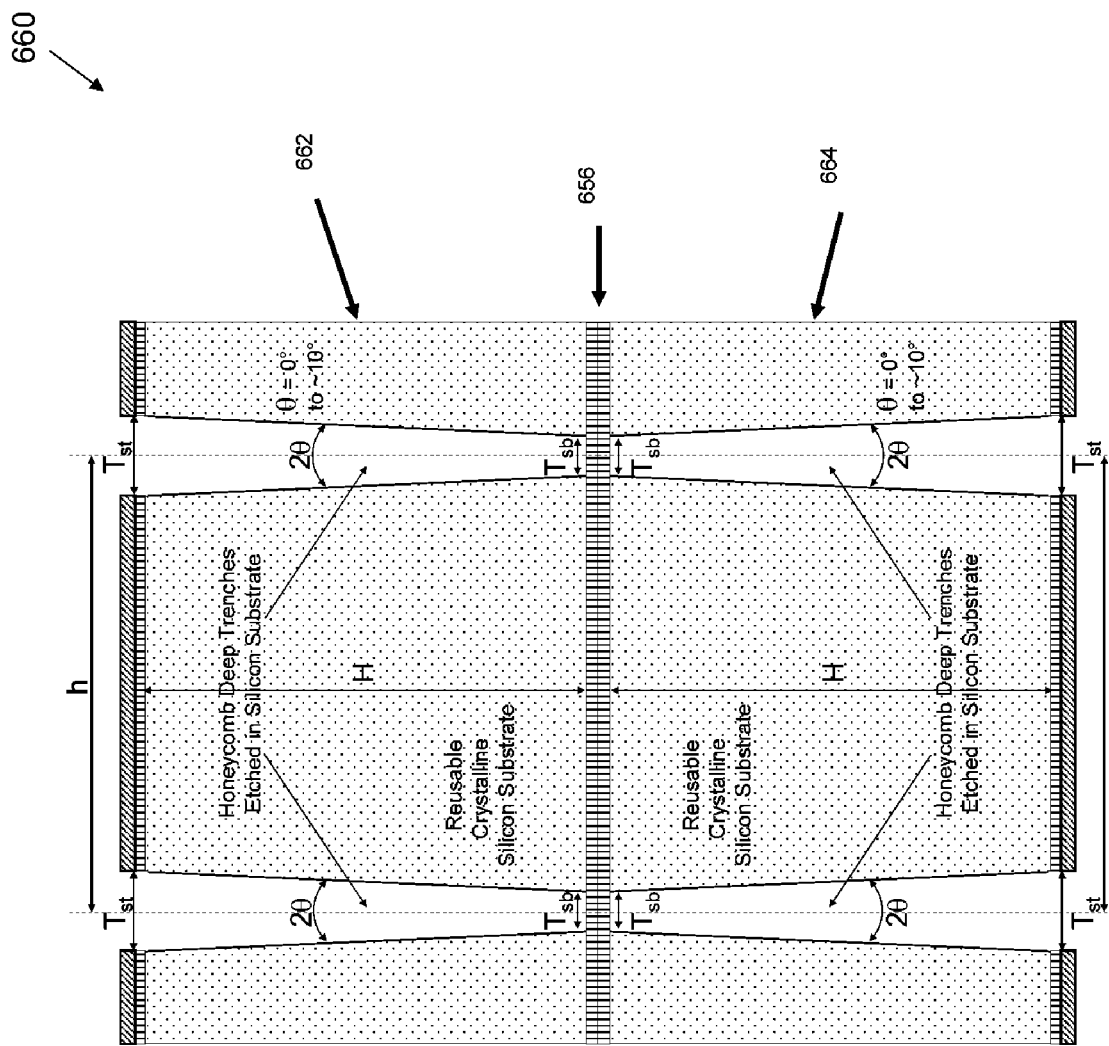
Figure 96:
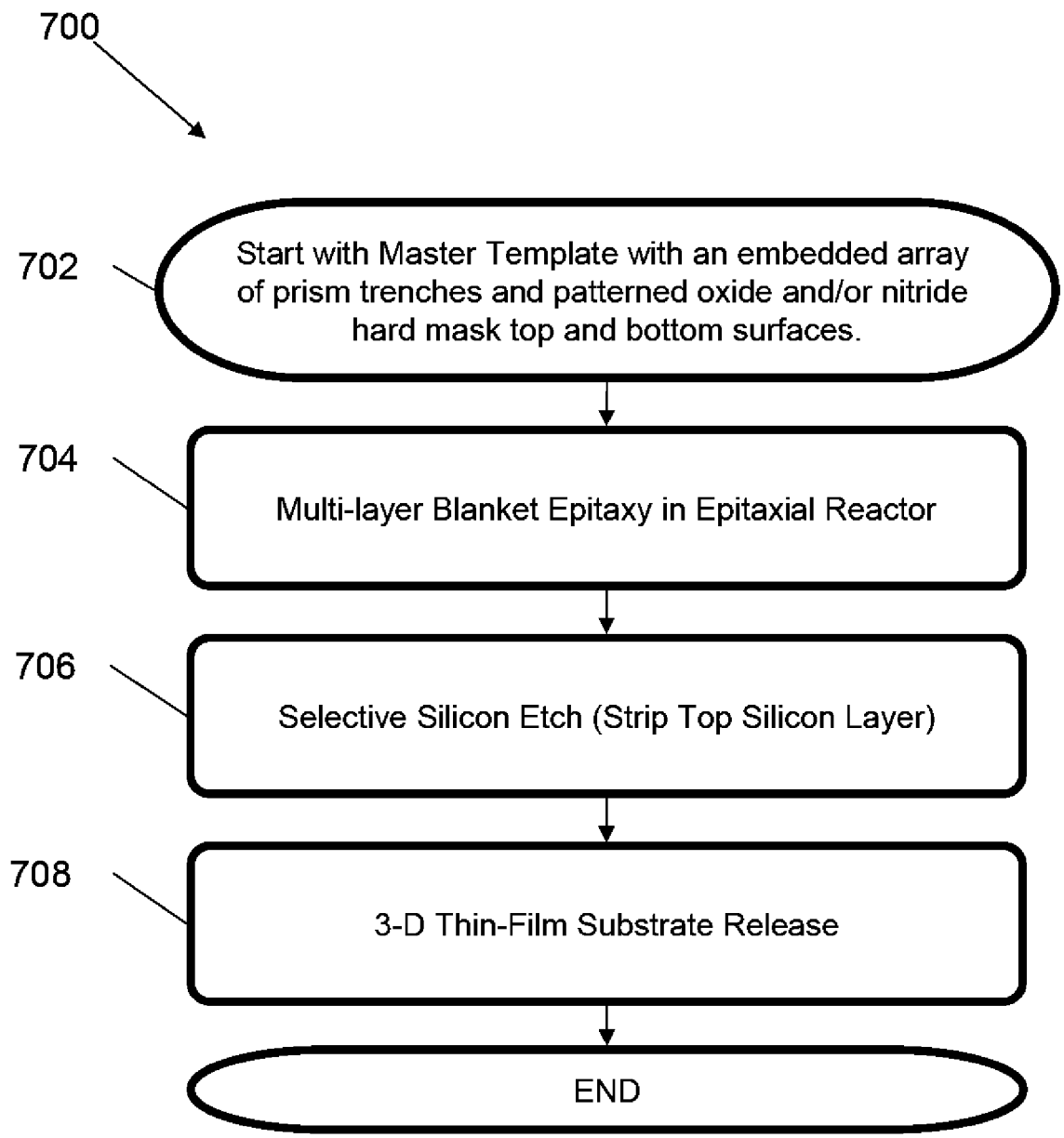
Figure 116:
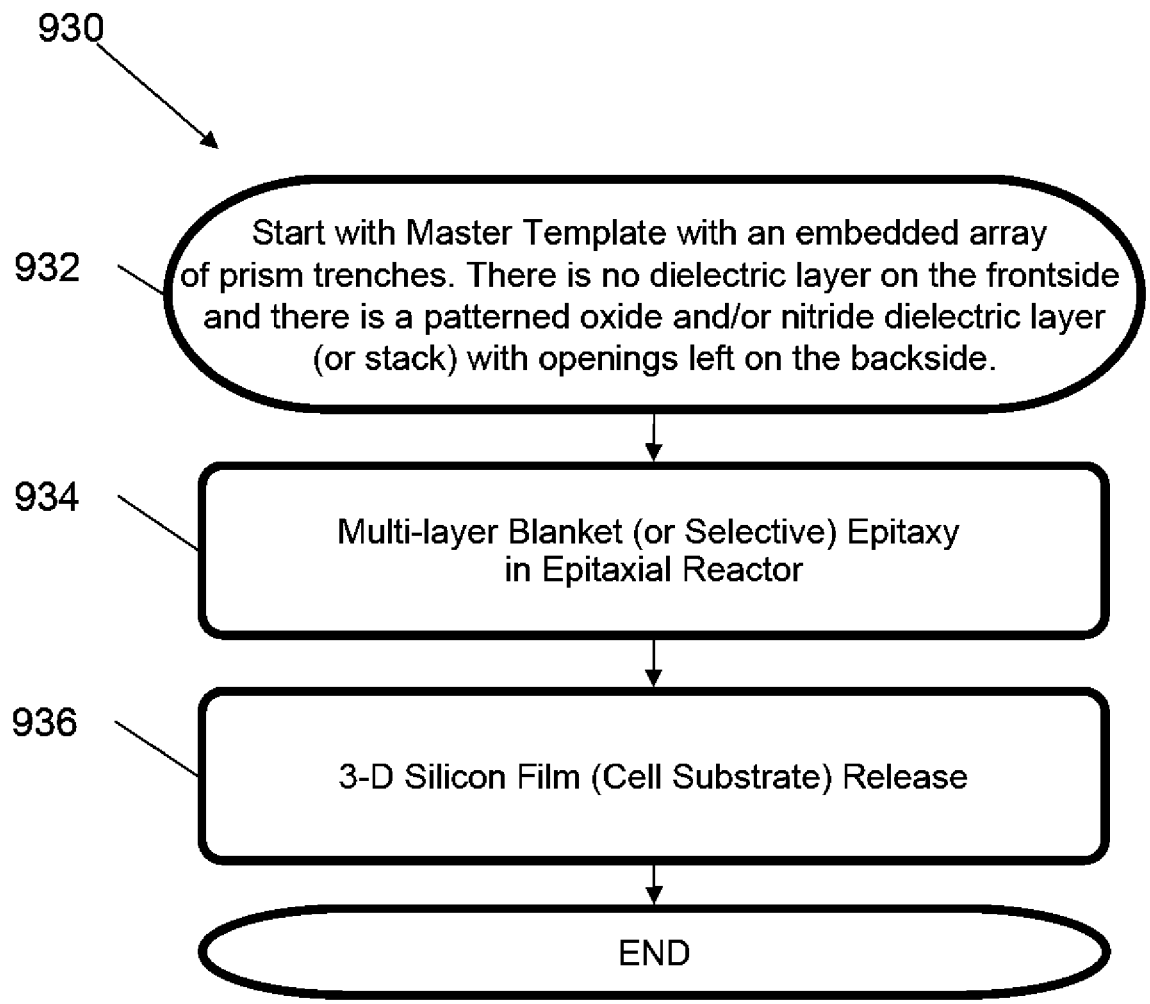
Figure 117:
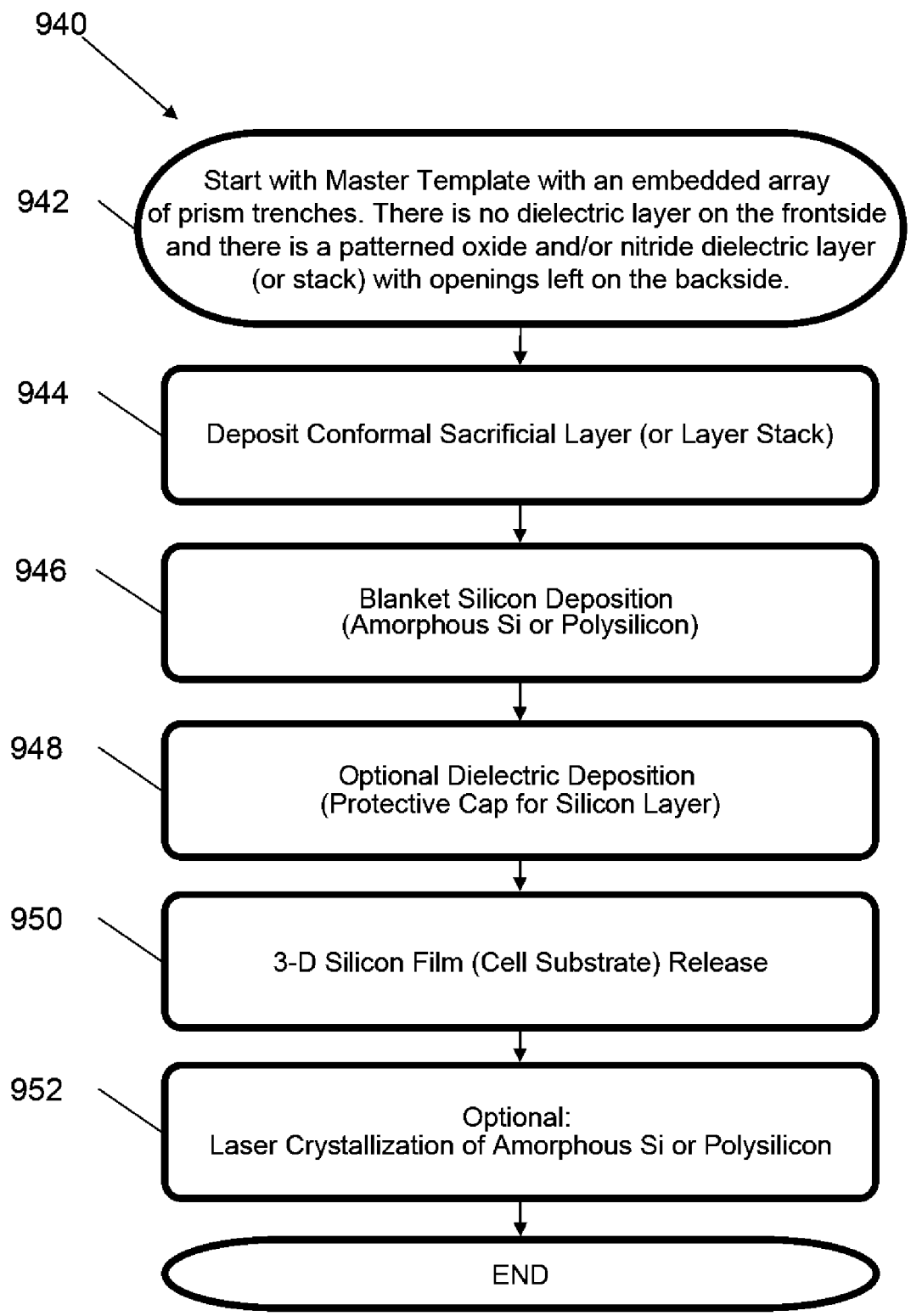
Figure 119:
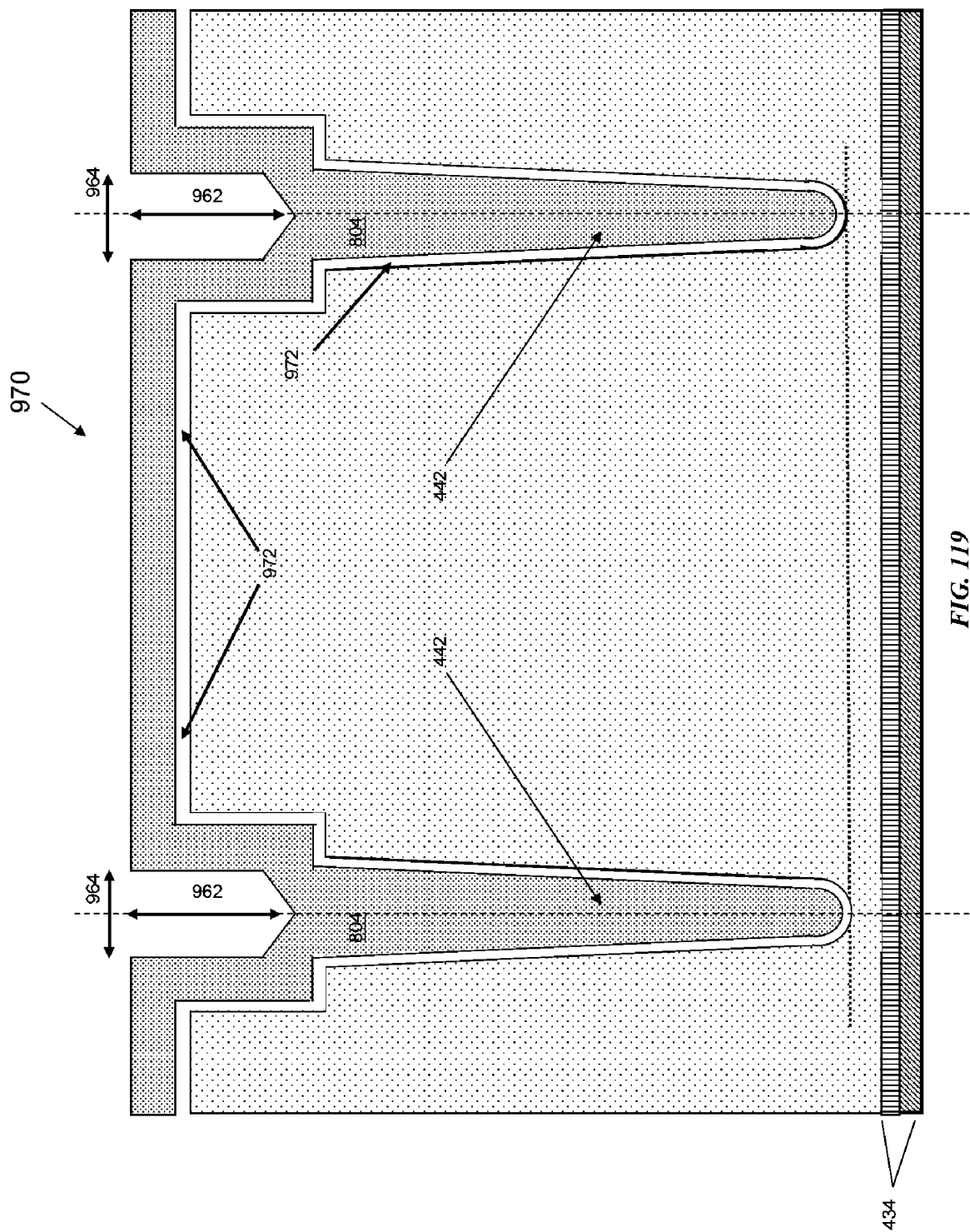
Figure 120:
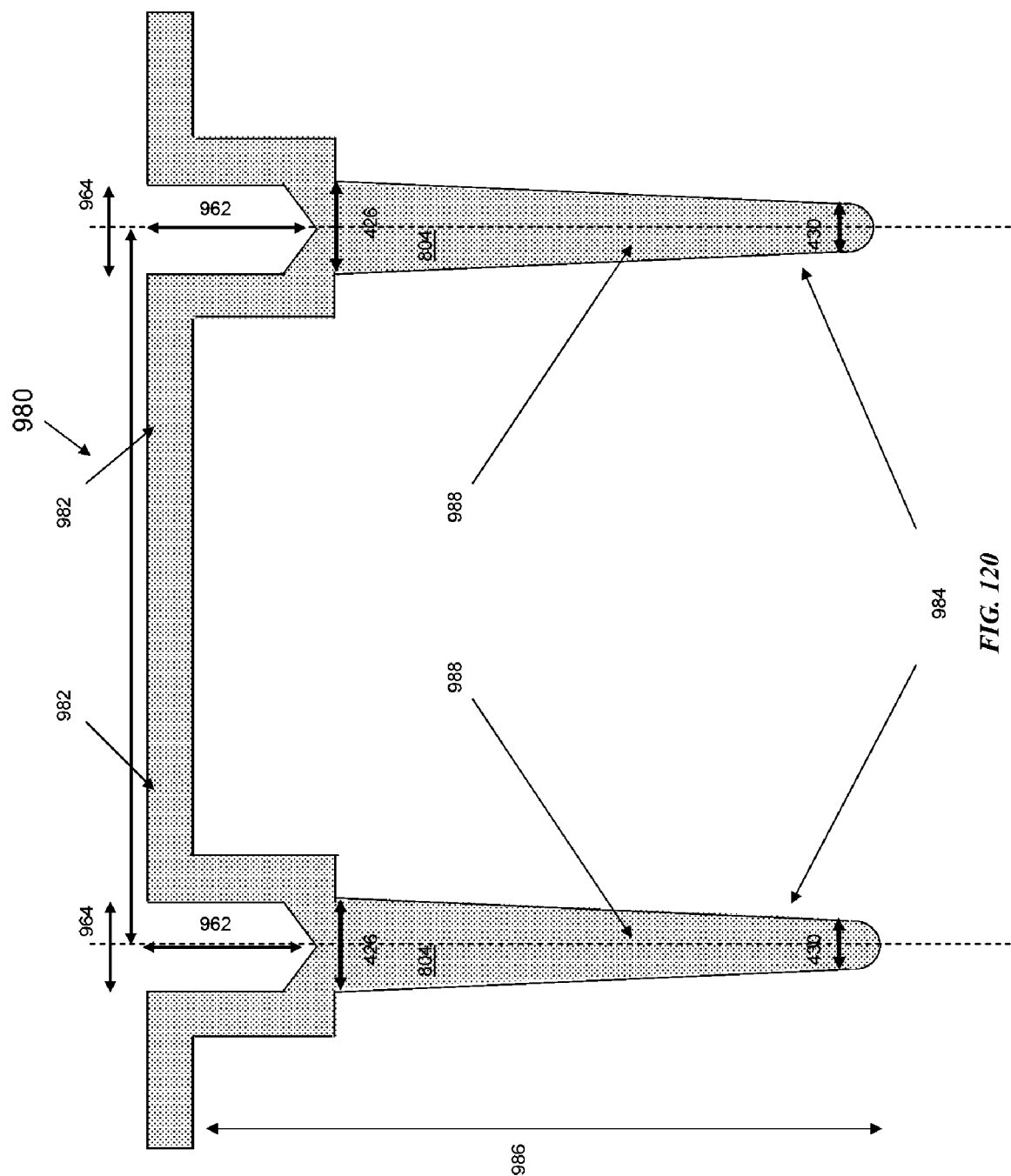
Figure 121:
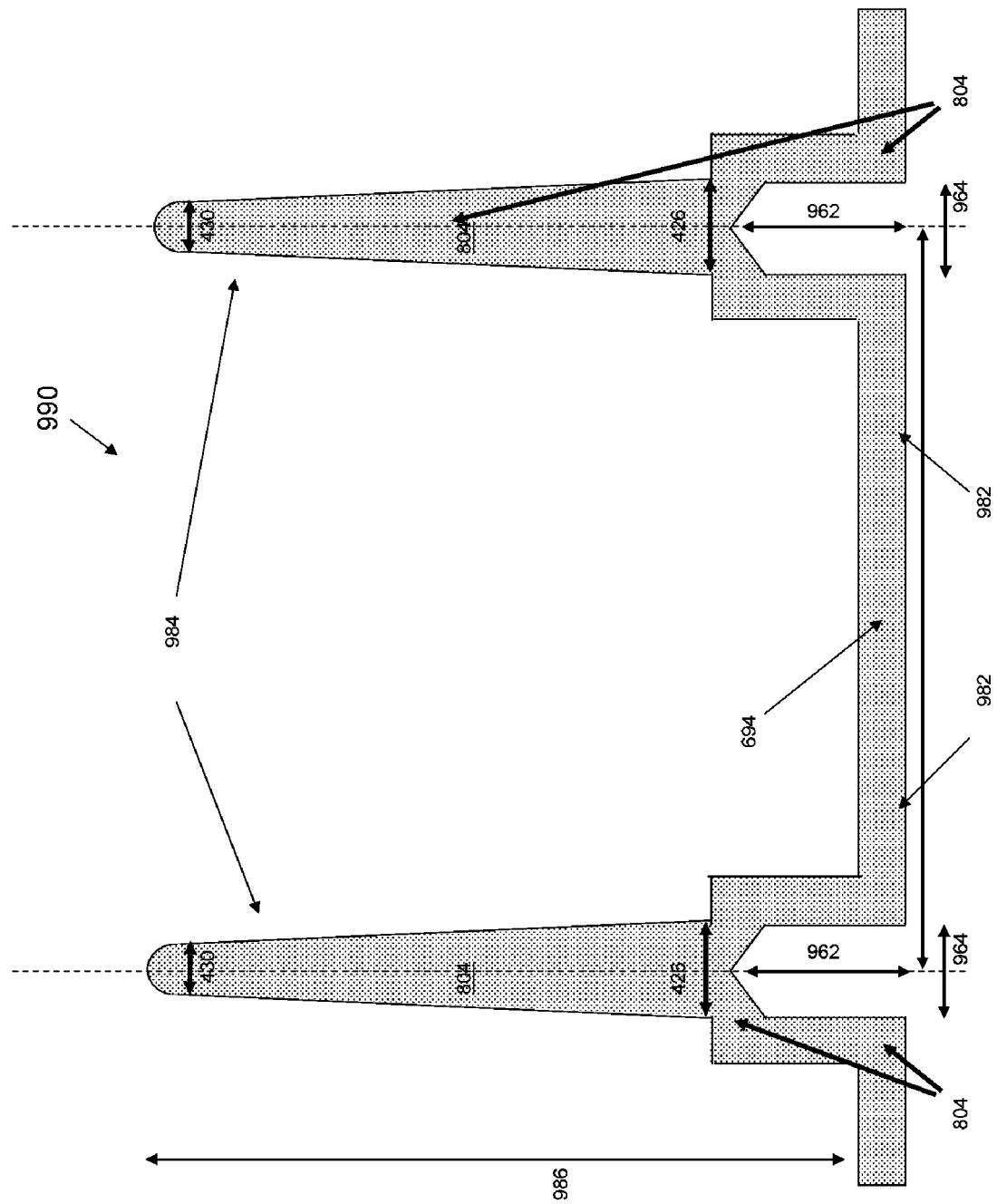
Figure 122:
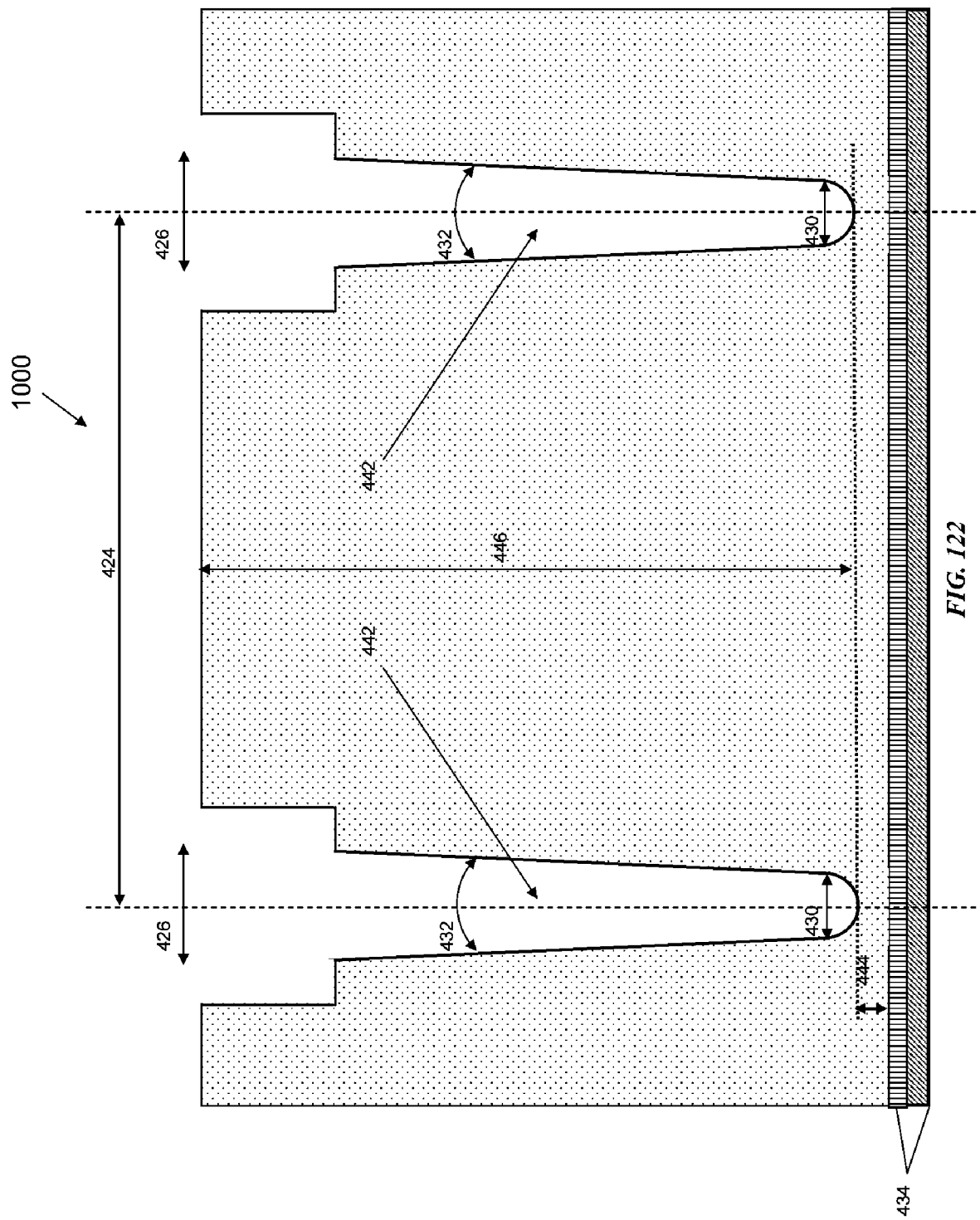

FIGS. 87 and 88 show cross-sectional views of stacked template structures for concurrently fabricating and releasing two hexagonal-prism 3-D TFSC substrates per process pass (FIGS. 87 and 88 show the stacked templates within-wafer trenches and through-wafer trenches, respectively);

FIGS. 89A through 95C show examples of several embodiments of 3-D polygon-prism TFSC substrates including various prism unit cell geometrical designs and arrangements;

FIG. 96 shows an embodiment of a process flow for fabrication of self-supporting hexagonal prism 3-D TFSC substrates using layer release processing;

FIGS. 97 through 102 show alternative embodiments of process flows for fabrication of self-supporting hexagonal-prism (as well as other prism array patterns) 3-D TFSC substrates without rear base layers (to form dual-aperture 3-D TFSC substrates; i.e., 3-D TFSC substrates with top and bottom unit cell openings);

FIGS. 103 through 107 show Y-Y cross-sectional views of the evolution of one prism unit cell of a template with through-wafer trenches, as it goes through several key process steps for fabricating a hexagonal-prism 3-D TFSC substrate (dual-aperture 3-D TFSC substrate) without a rear base layer;

FIGS. 108 through 111 illustrate Y-Y cross-sectional views of an embodiment of a template with in-wafer trenches and no dielectric layers on the template frontside or template backside, as it goes through several key process steps for fabricating a hexagonal-prism 3-D TFSC substrate (dual-aperture 3-D TFSC substrate) without a rear base layer;

FIGS. 112 through 115 illustrate Y-Y cross-sectional views of an embodiment of a template with through-wafer trenches and no dielectrics on the template frontside, as it goes through several key process steps for fabricating a hexagonal-prism 3-D TFSC substrate (dual-aperture 3-D TFSC substrate) without a rear base layer;

FIGS. 116 and 117 show alternative embodiments of a process flows for fabrication of self-supporting hexagonal prism 3-D TFSC substrates including rear base layers (single-aperture 3-D TFSC substrates with single-aperture unit cells);

FIGS. 118 through 122 illustrate Y-Y cross-sectional views of a template with in-wafer trenches and no dielectrics on the template frontside, as it goes through the key process steps to fabricate a hexagonal prism 3-D TFSC substrate (single-aperture 3-D TFSC substrate) with a rear base layer; FIGS. 121 and 122 show the released 3-D TFSC substrate with a base layer and the reusable template after the 3-D TFSC substrate release, respectively.

Figure 66:
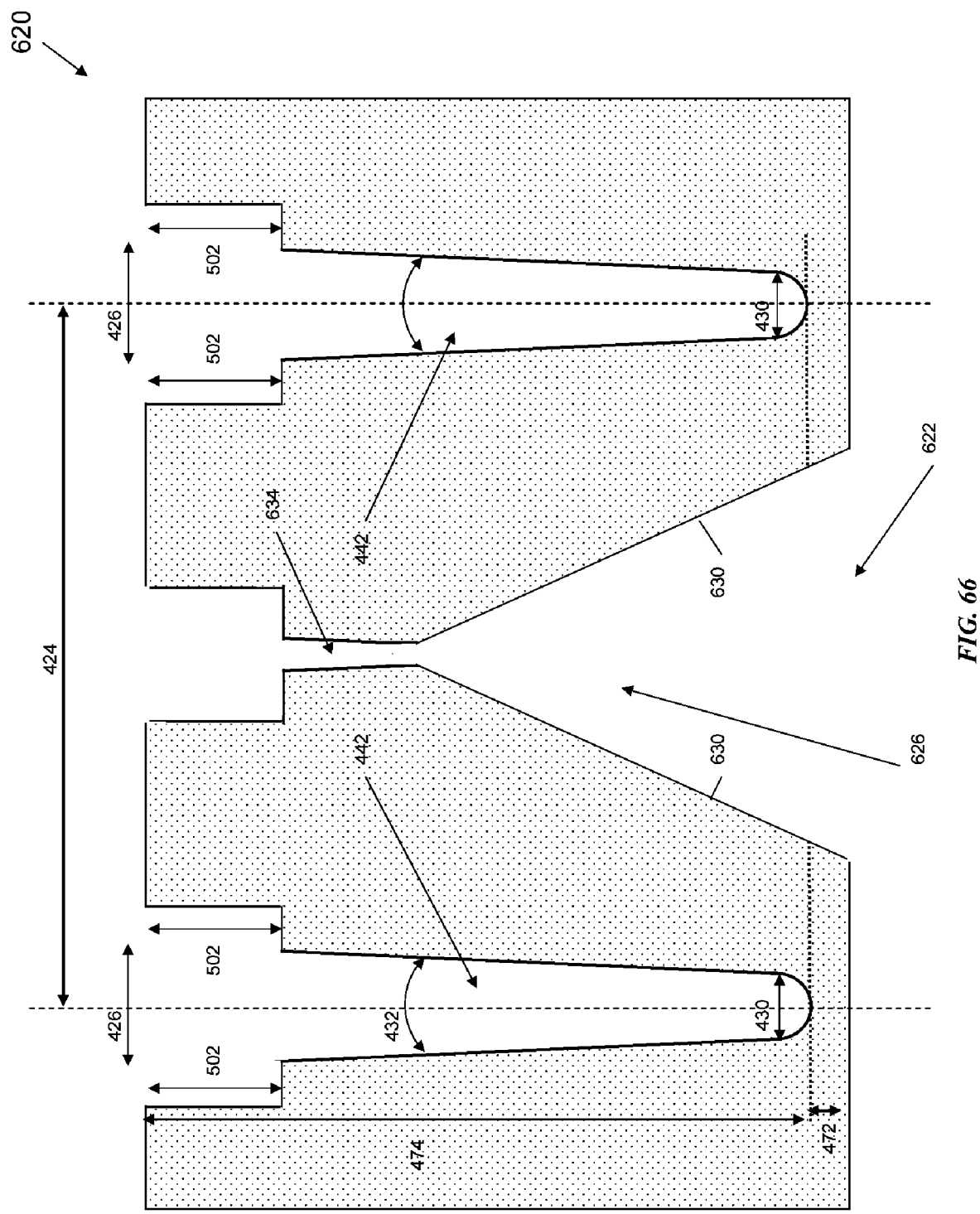
Figure 67:
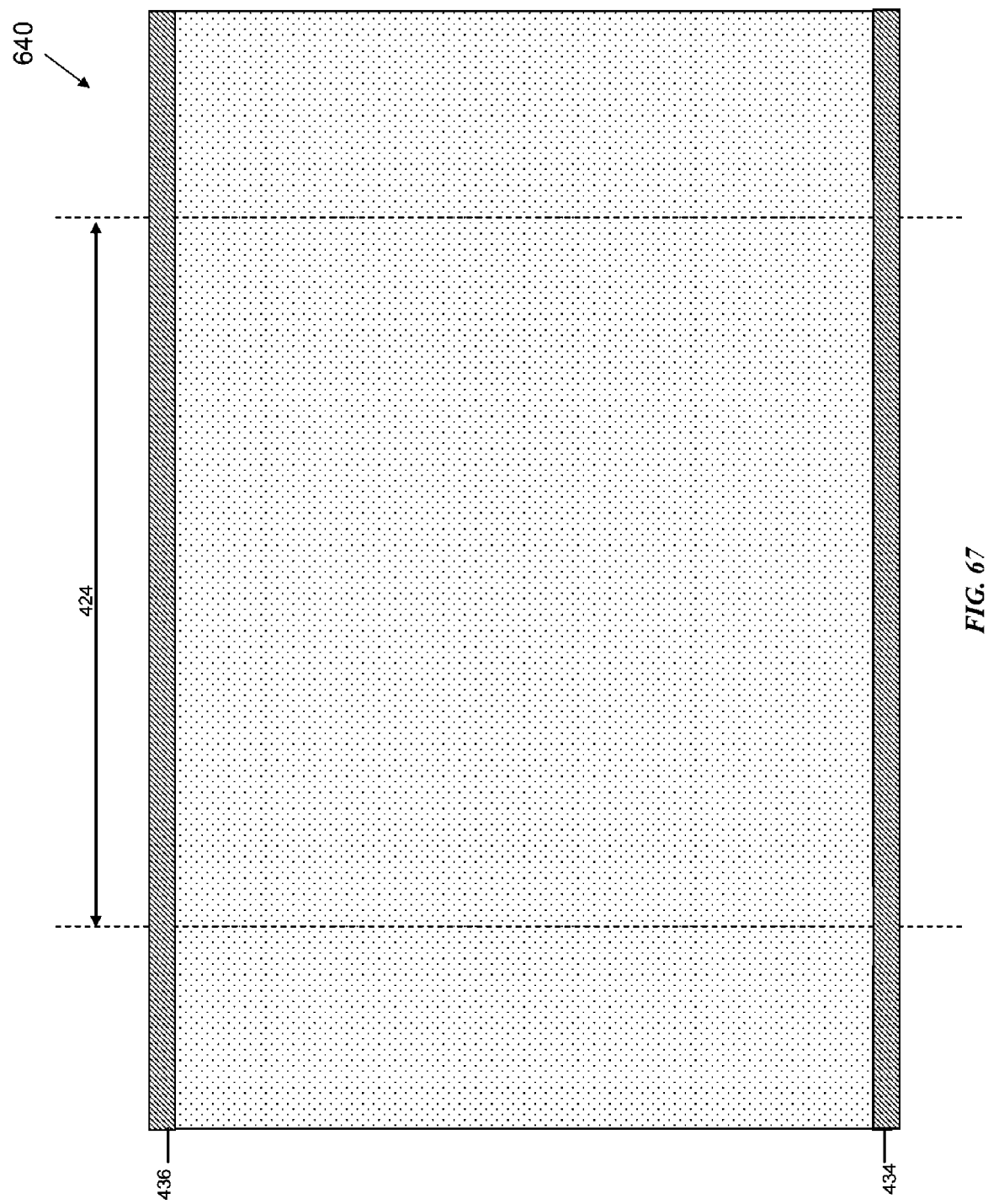
Figure 75:
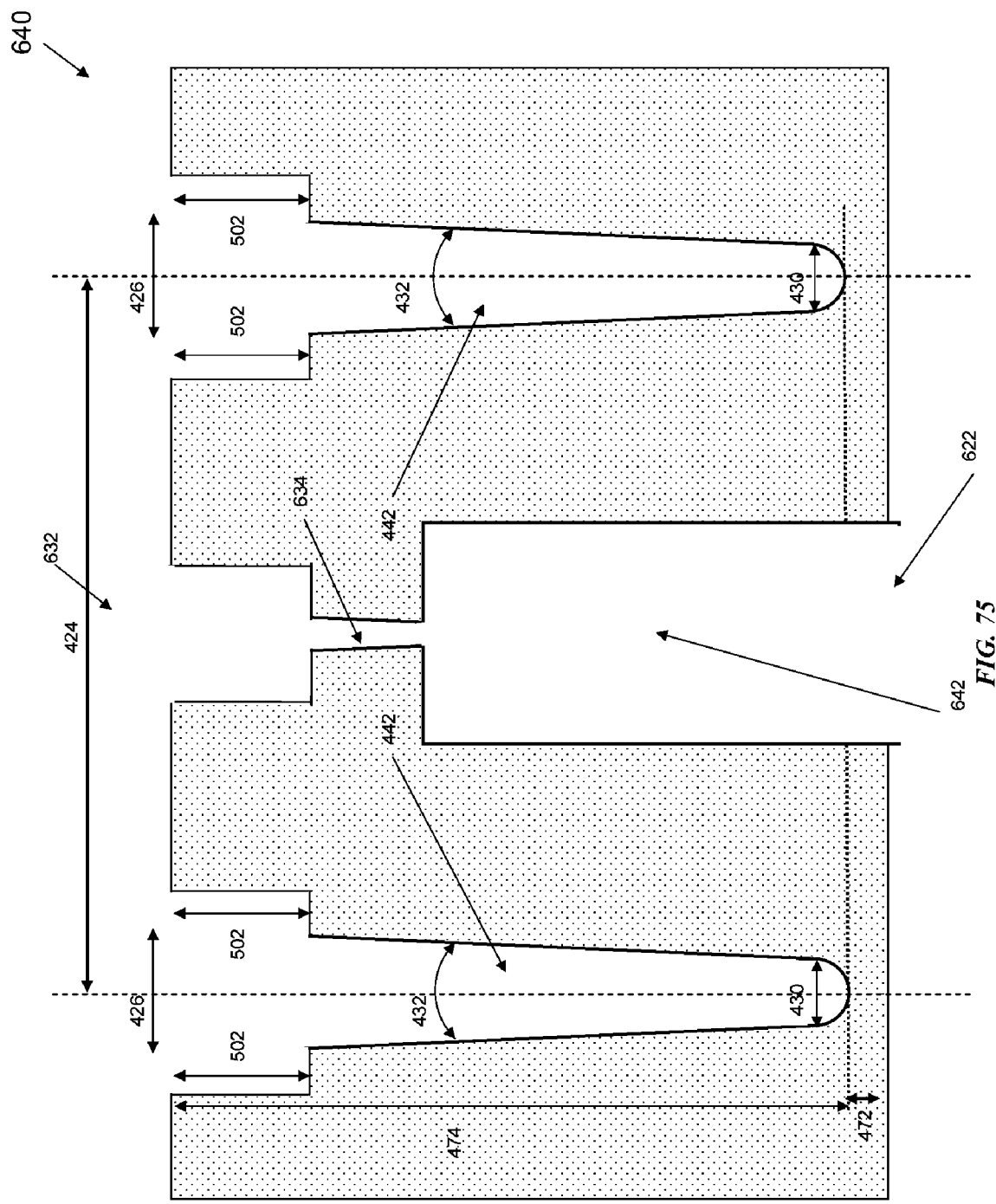
Figure 86:
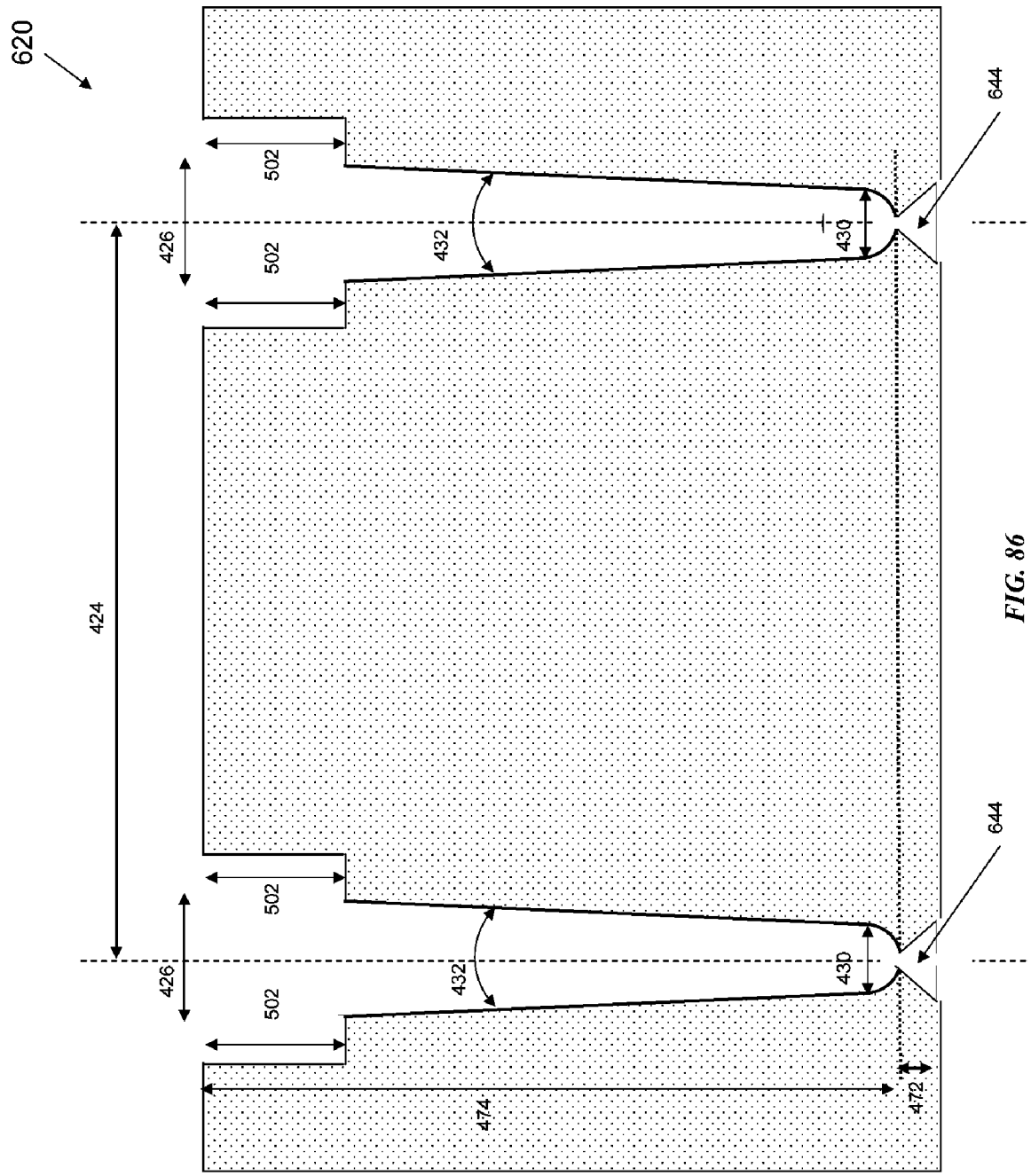
Figure 123:
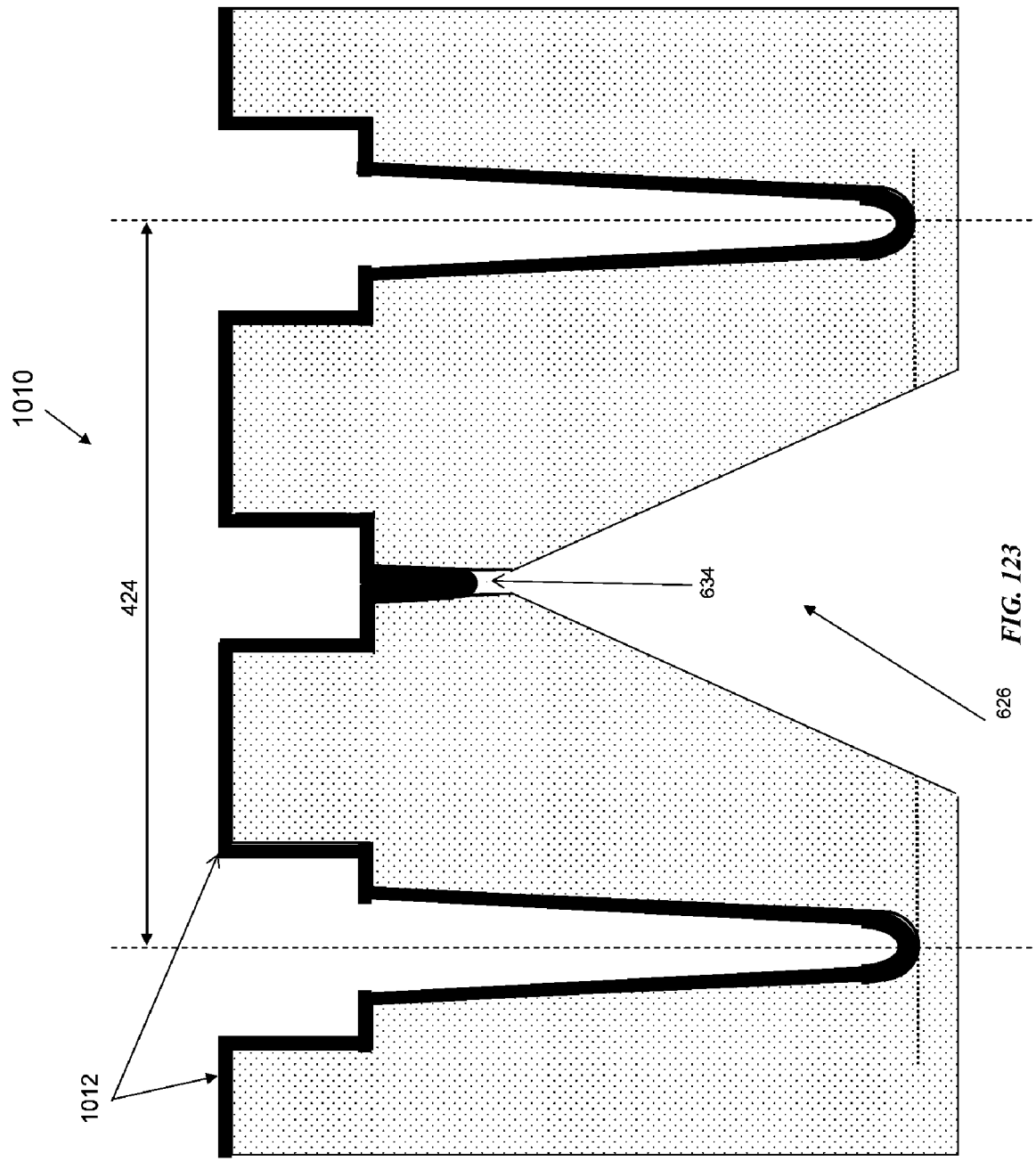
Figure 124:
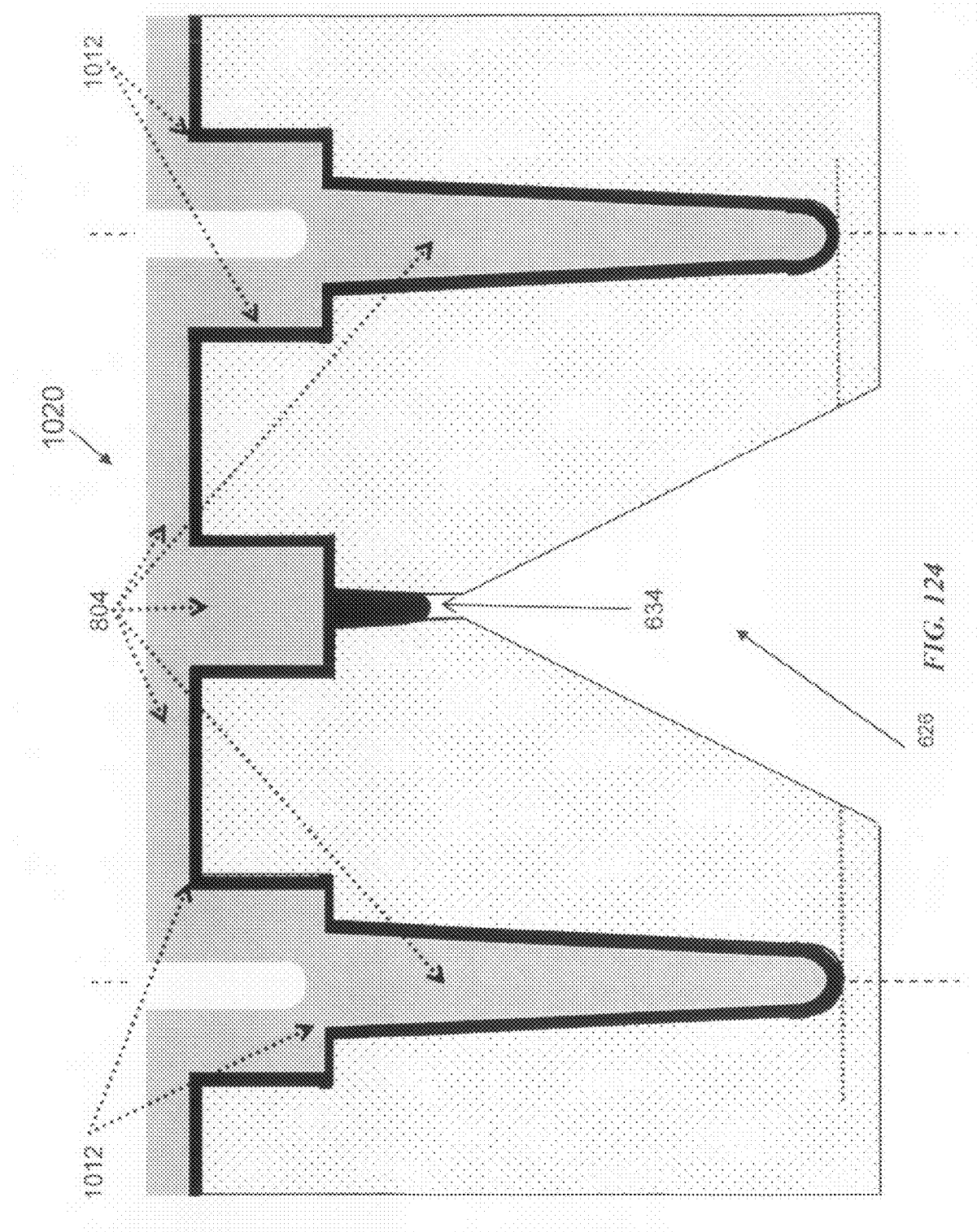
Figure 125:
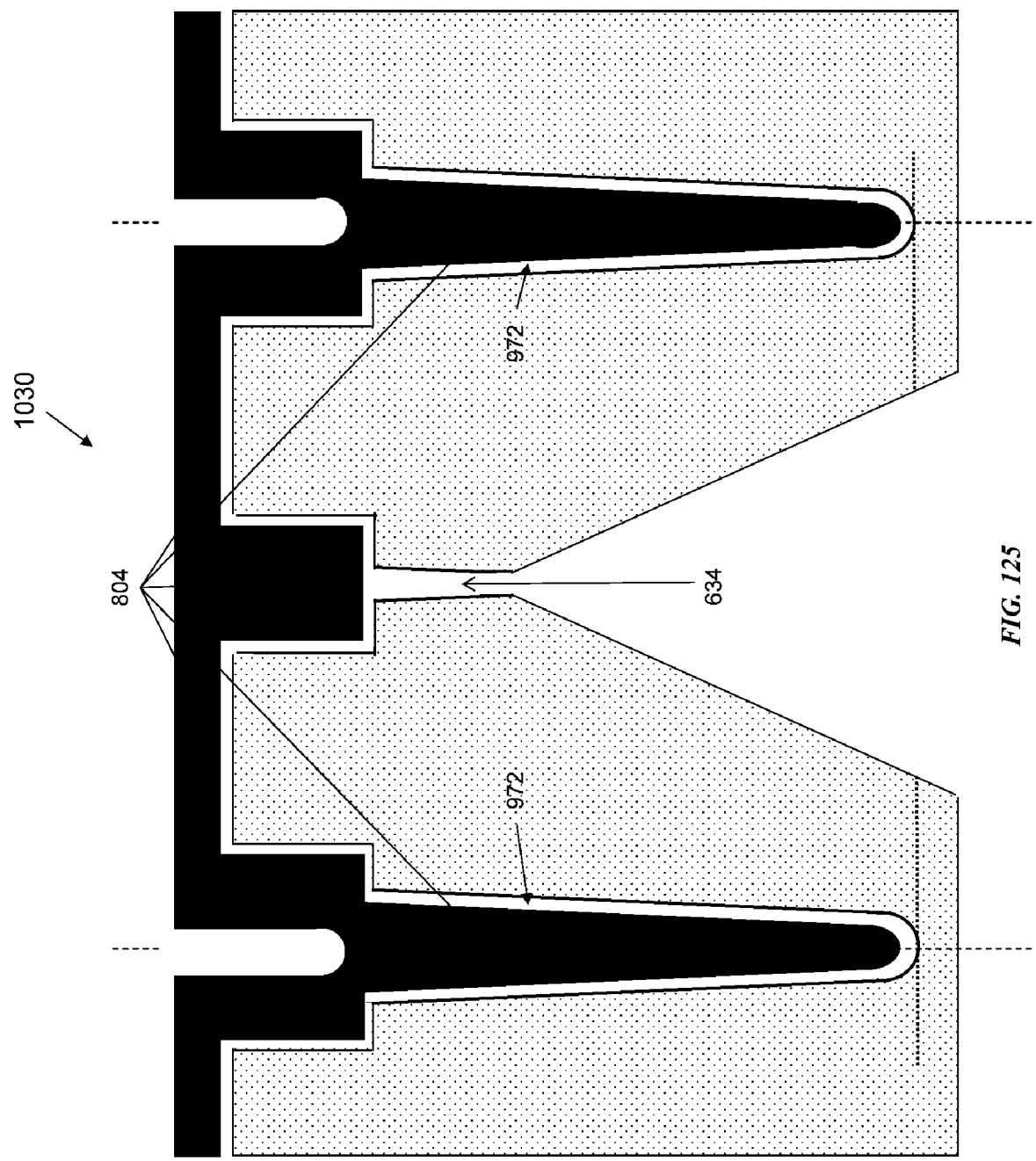
Figure 126:
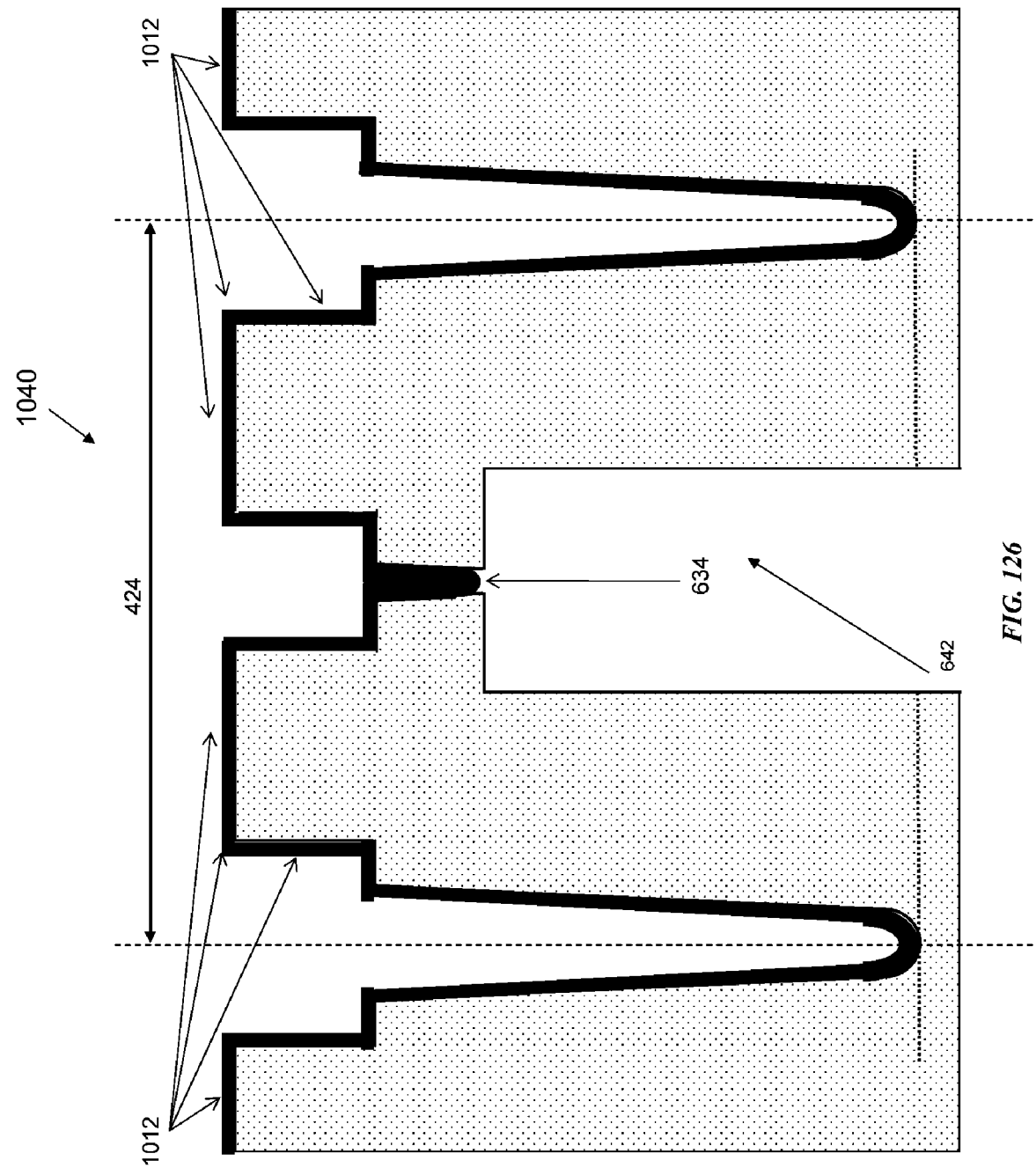
Figure 127:
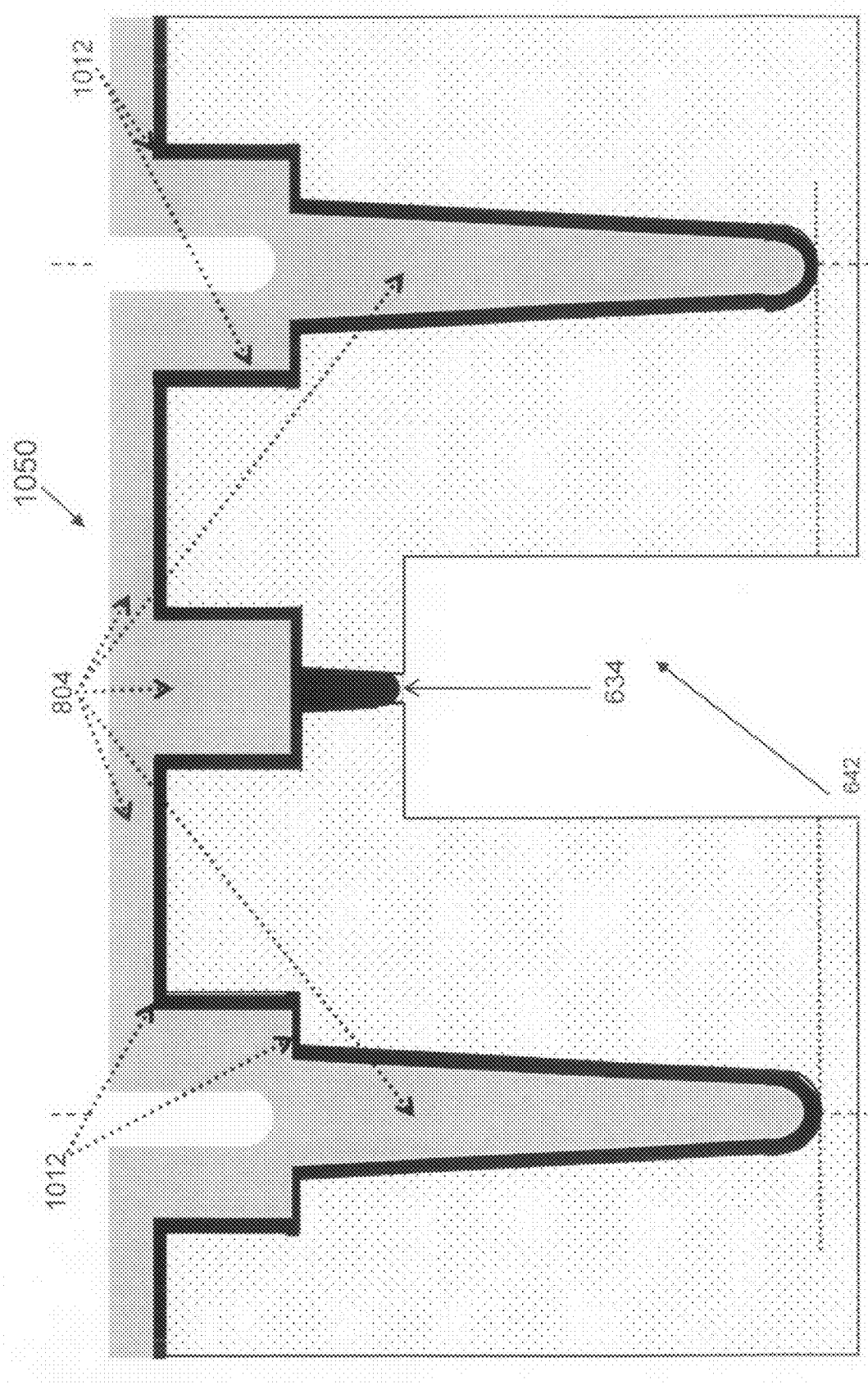
Figure 128:
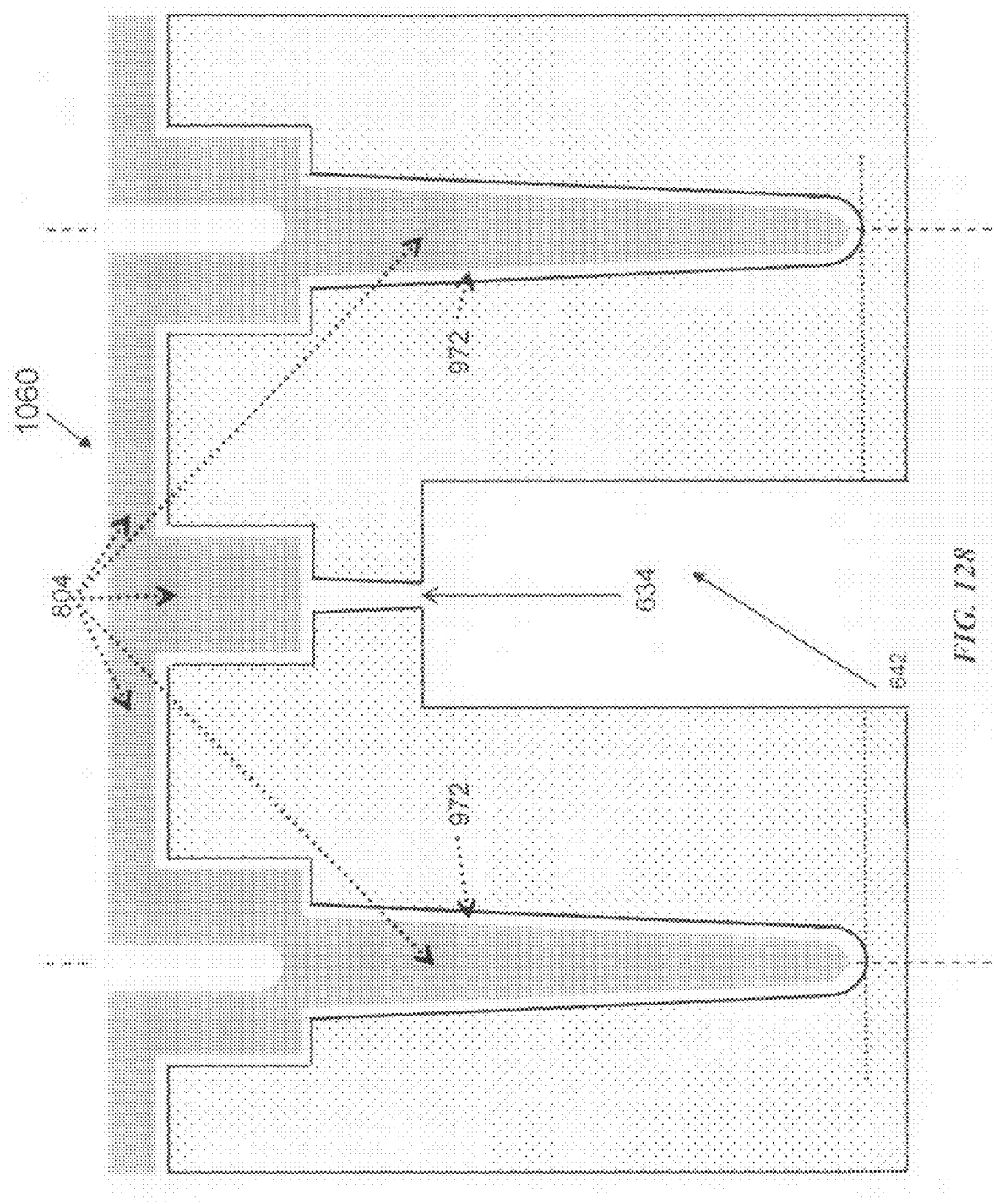
Figure 129:
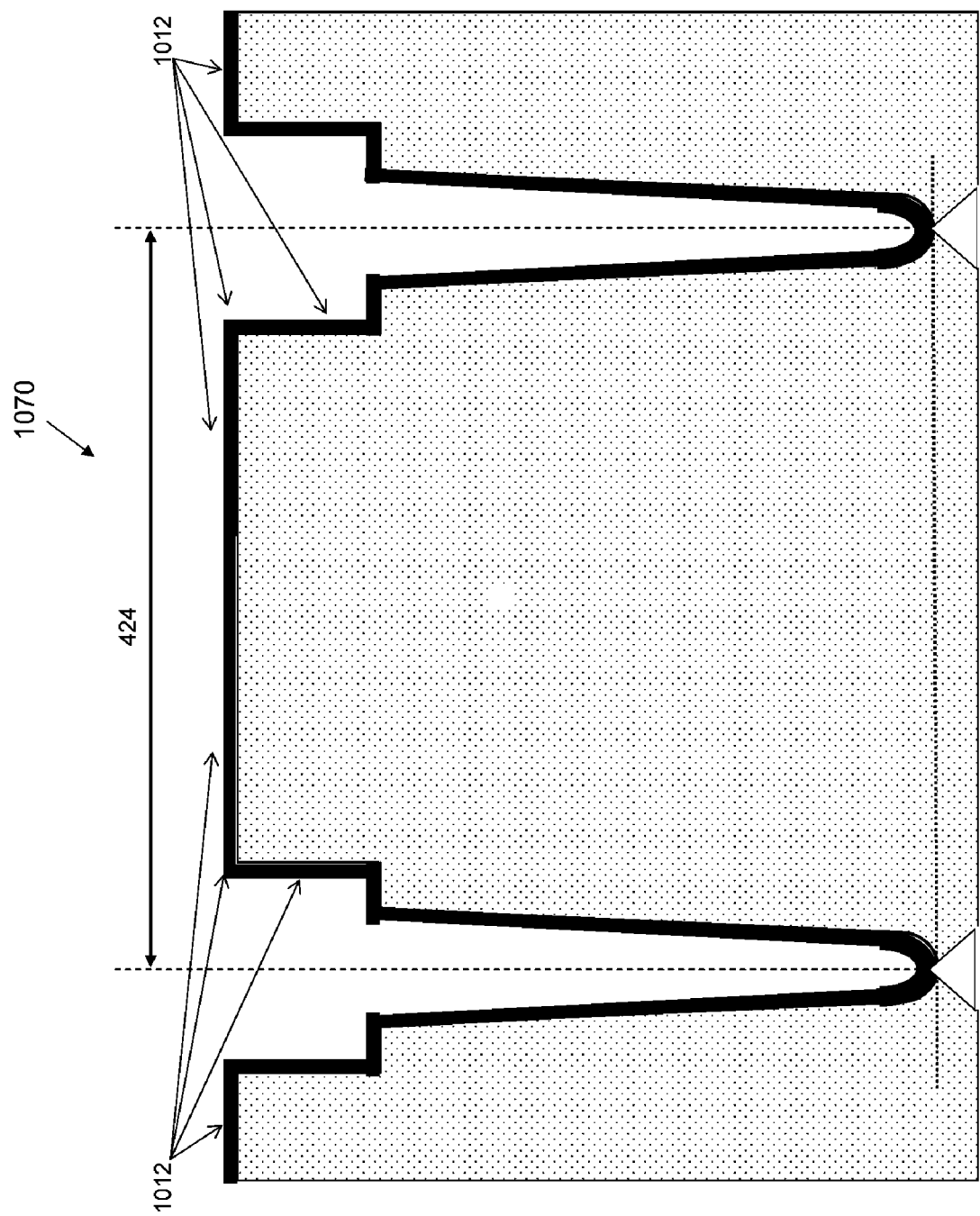
Figure 130:
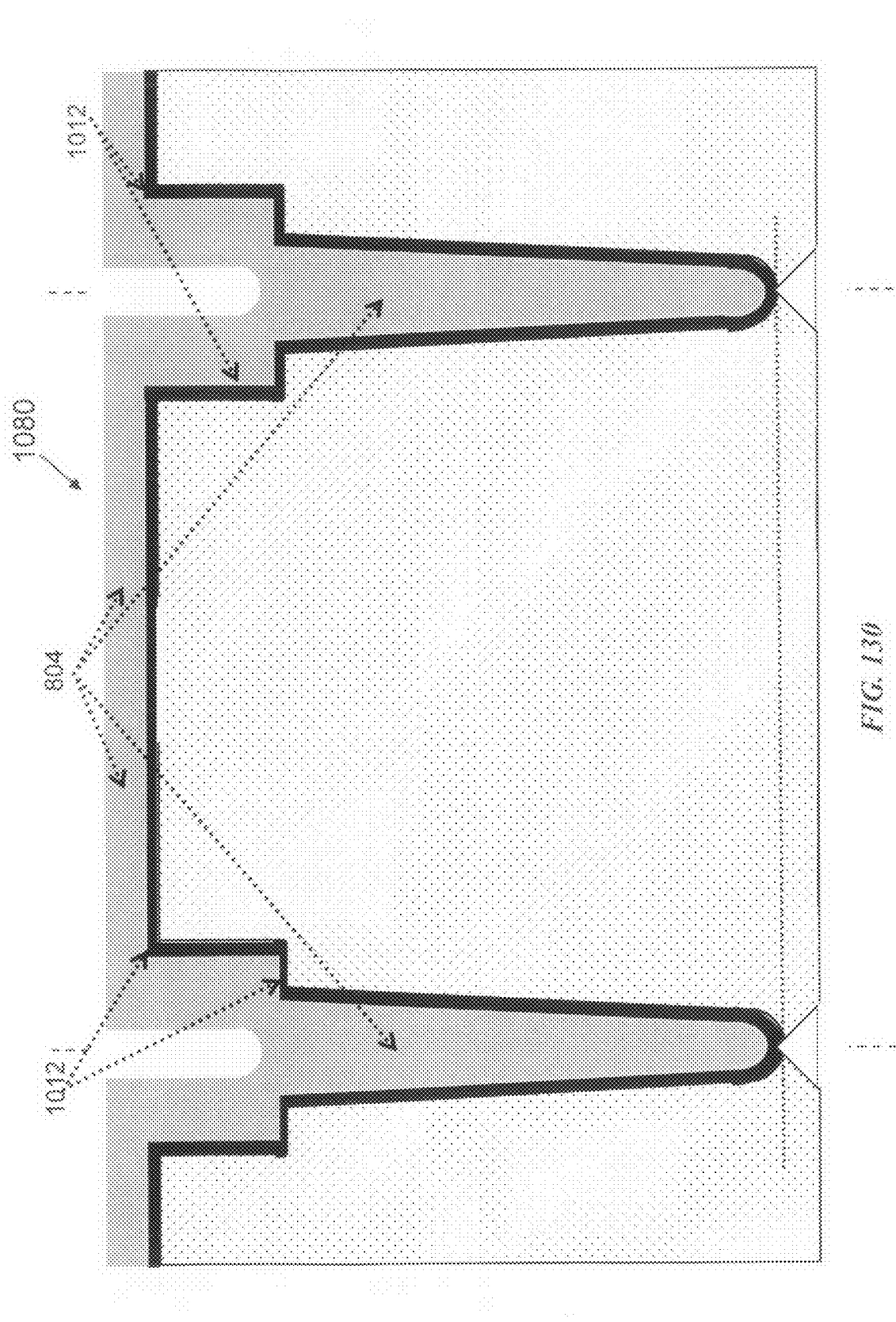
Figure 131:
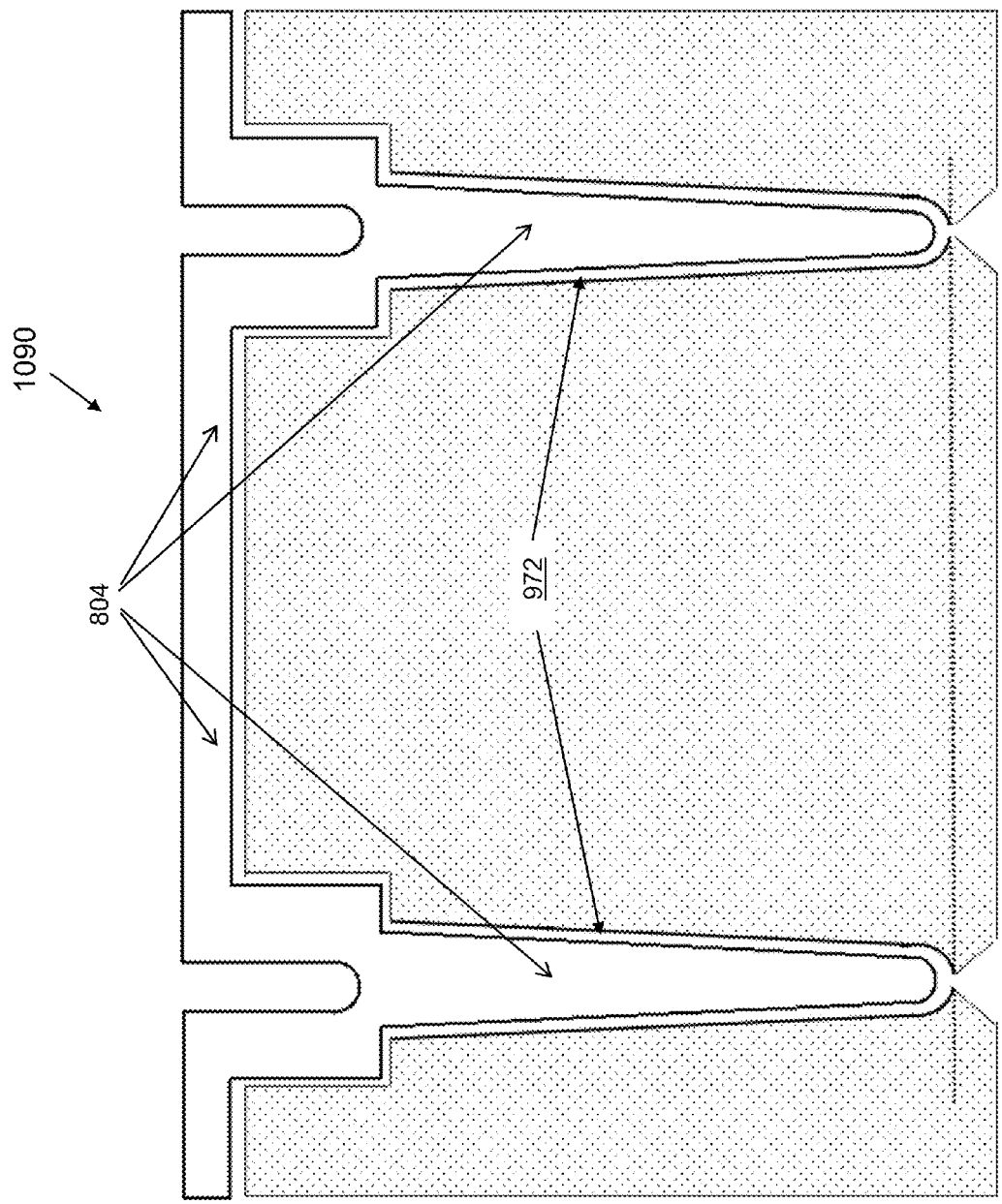
Figure 132:
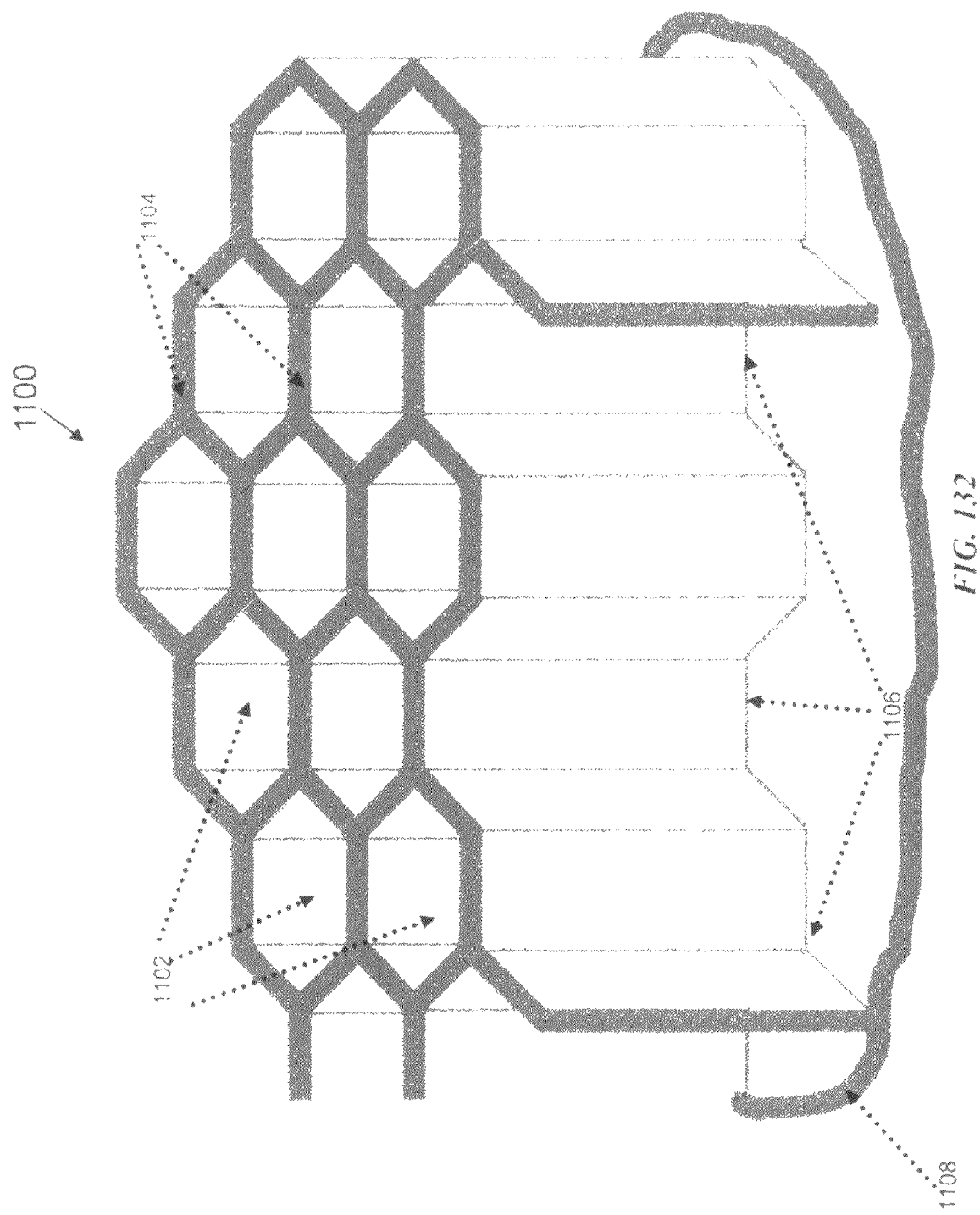
Figure 133:
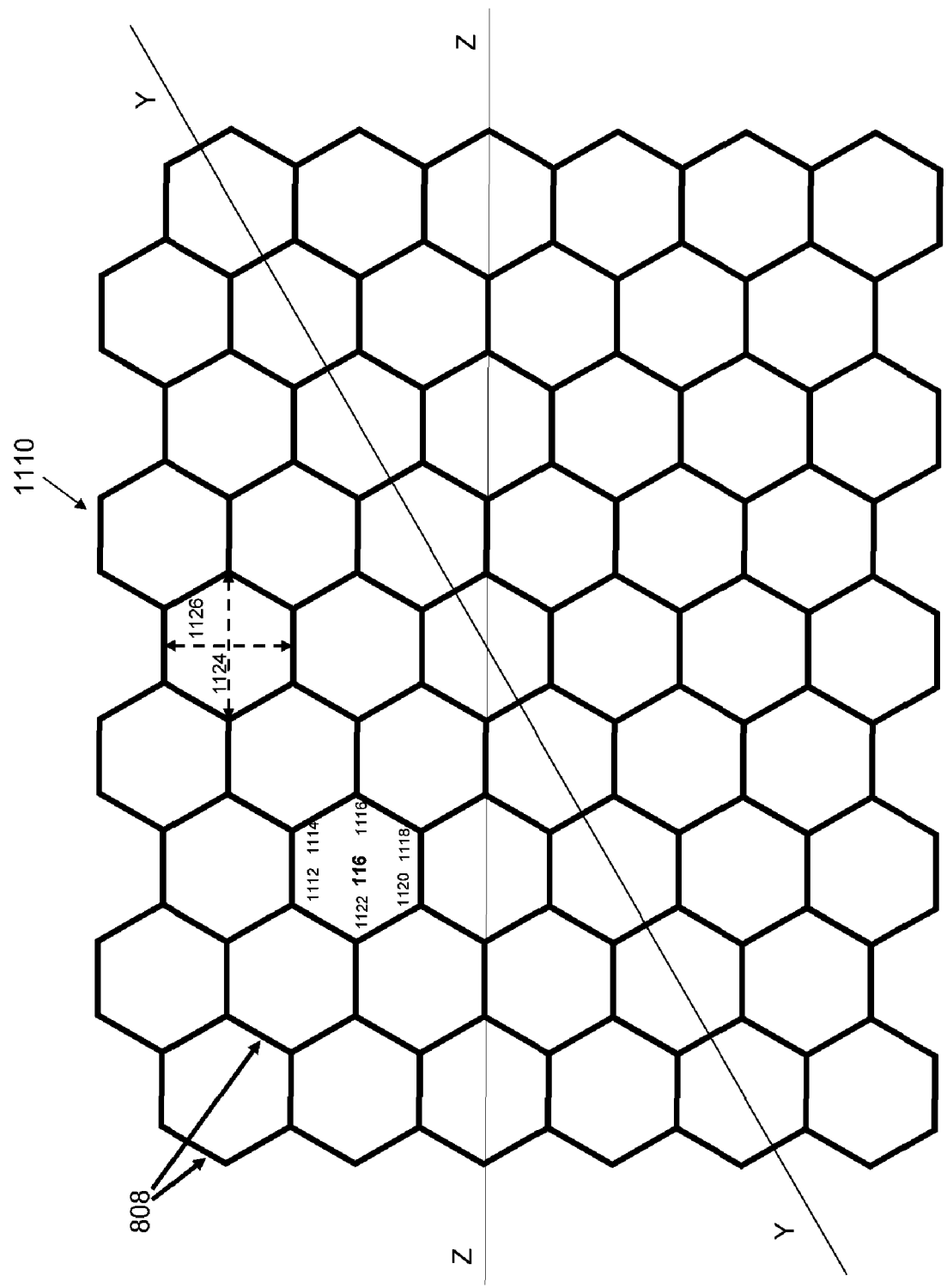
Figure 141:
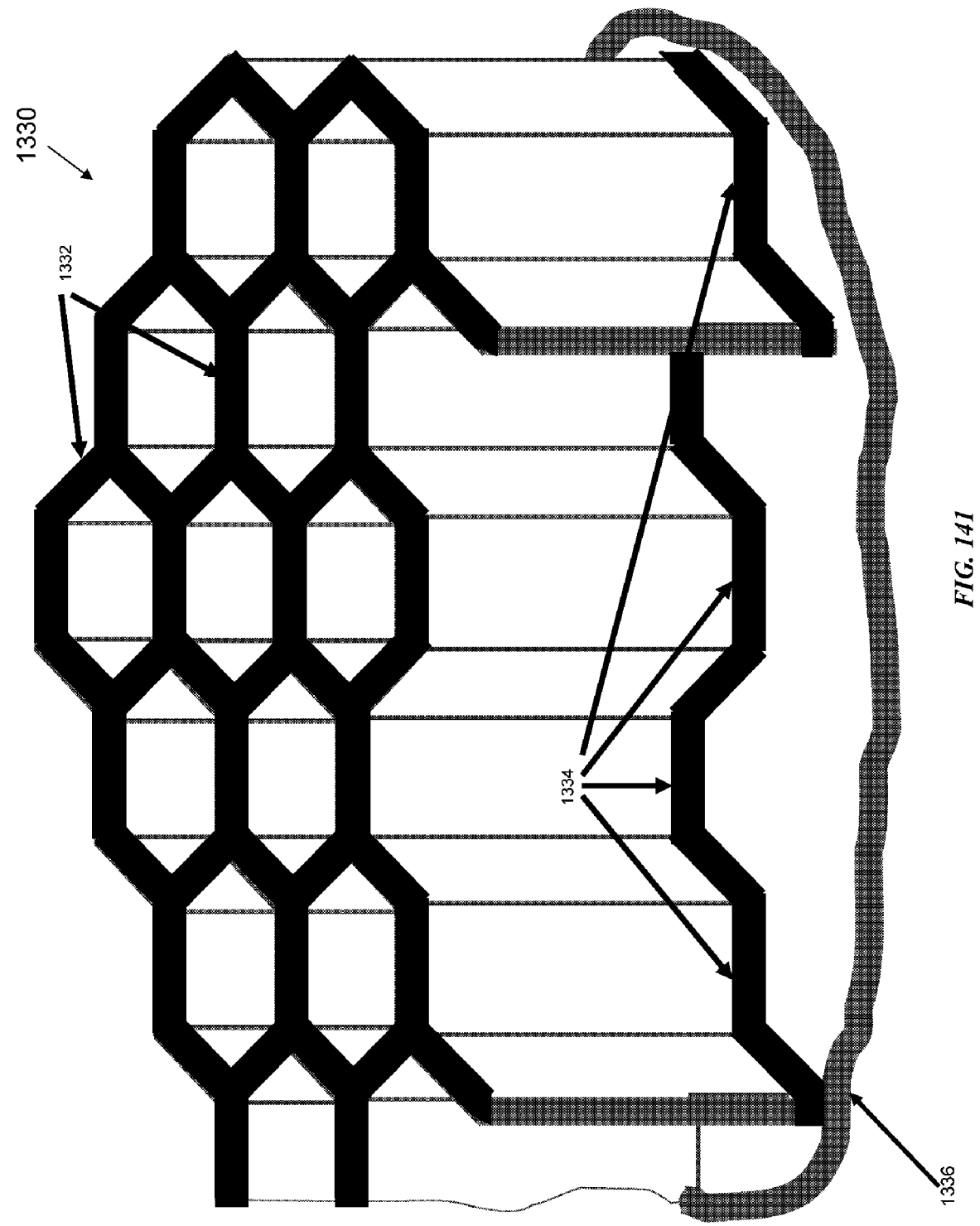
Figure 149:
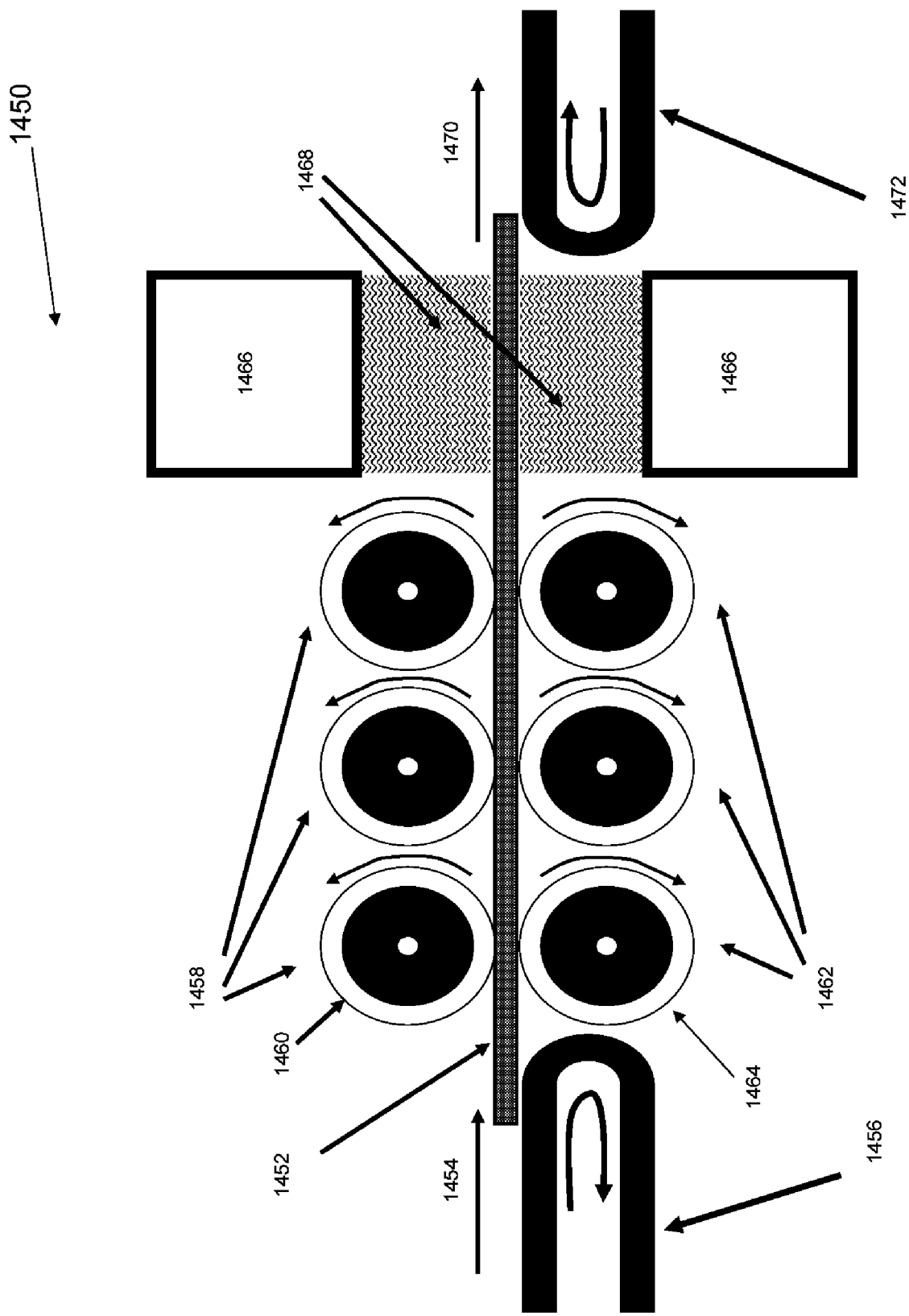
Figure 150:
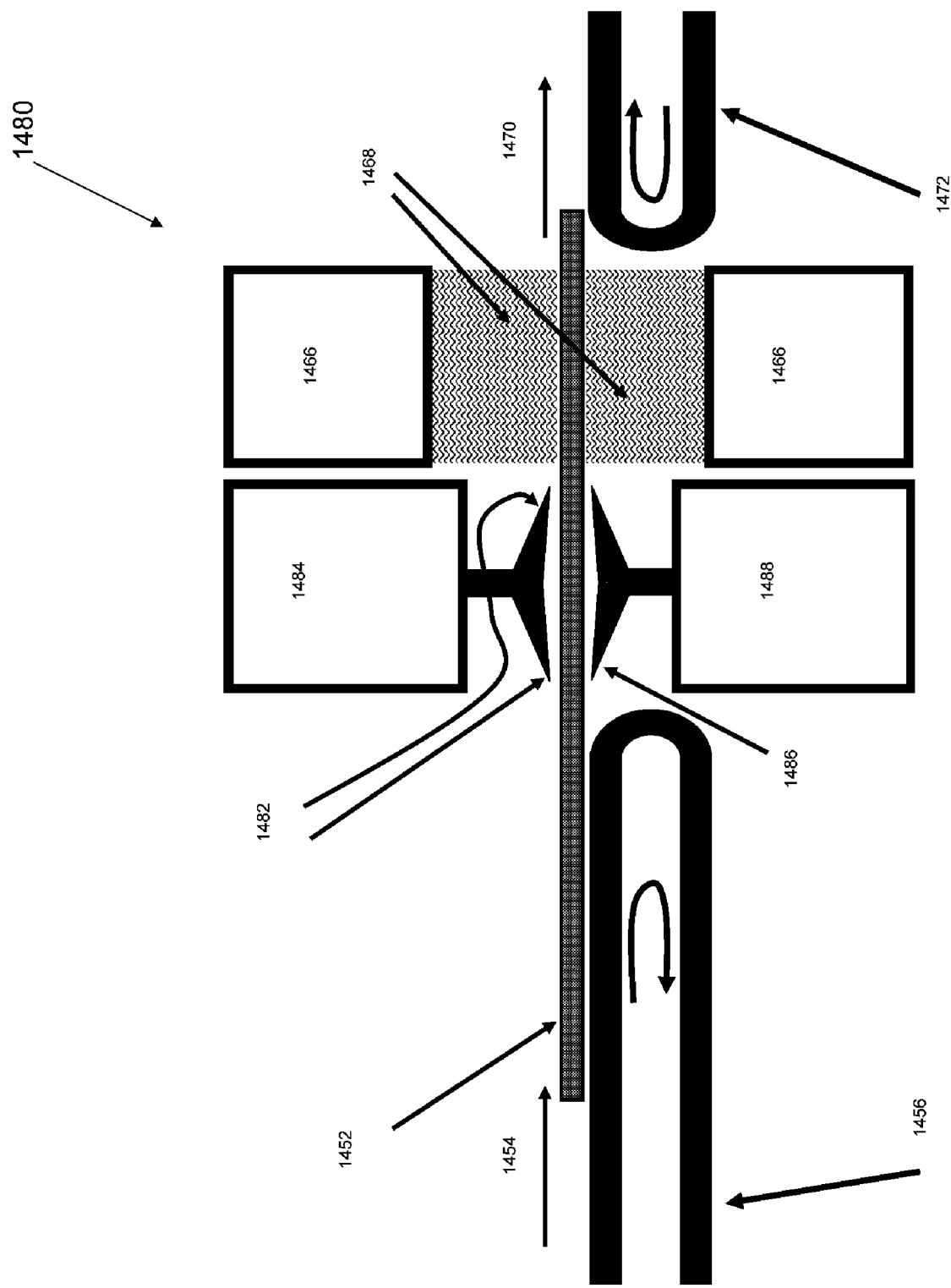
Figure 151:
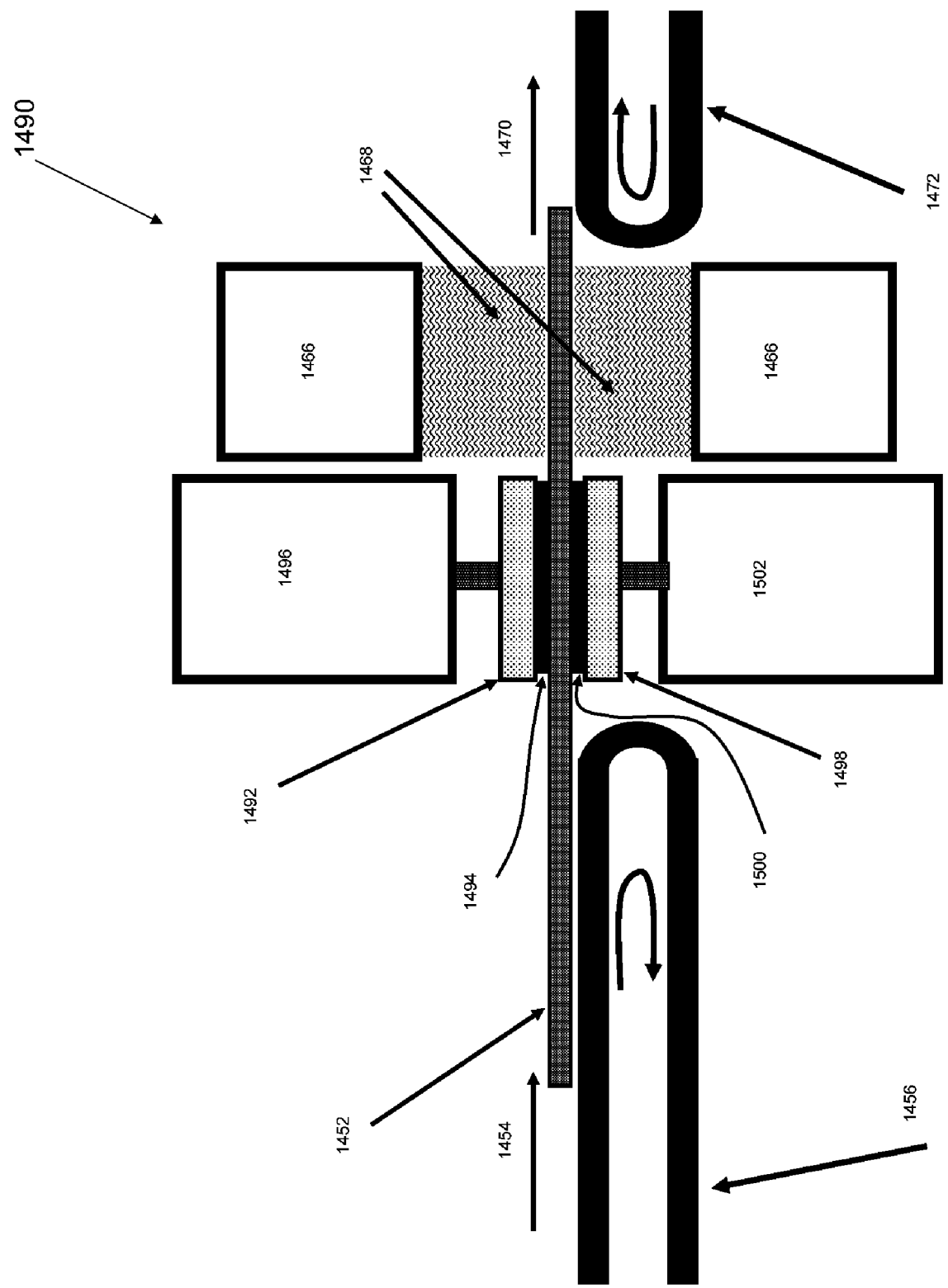
Figure 152:
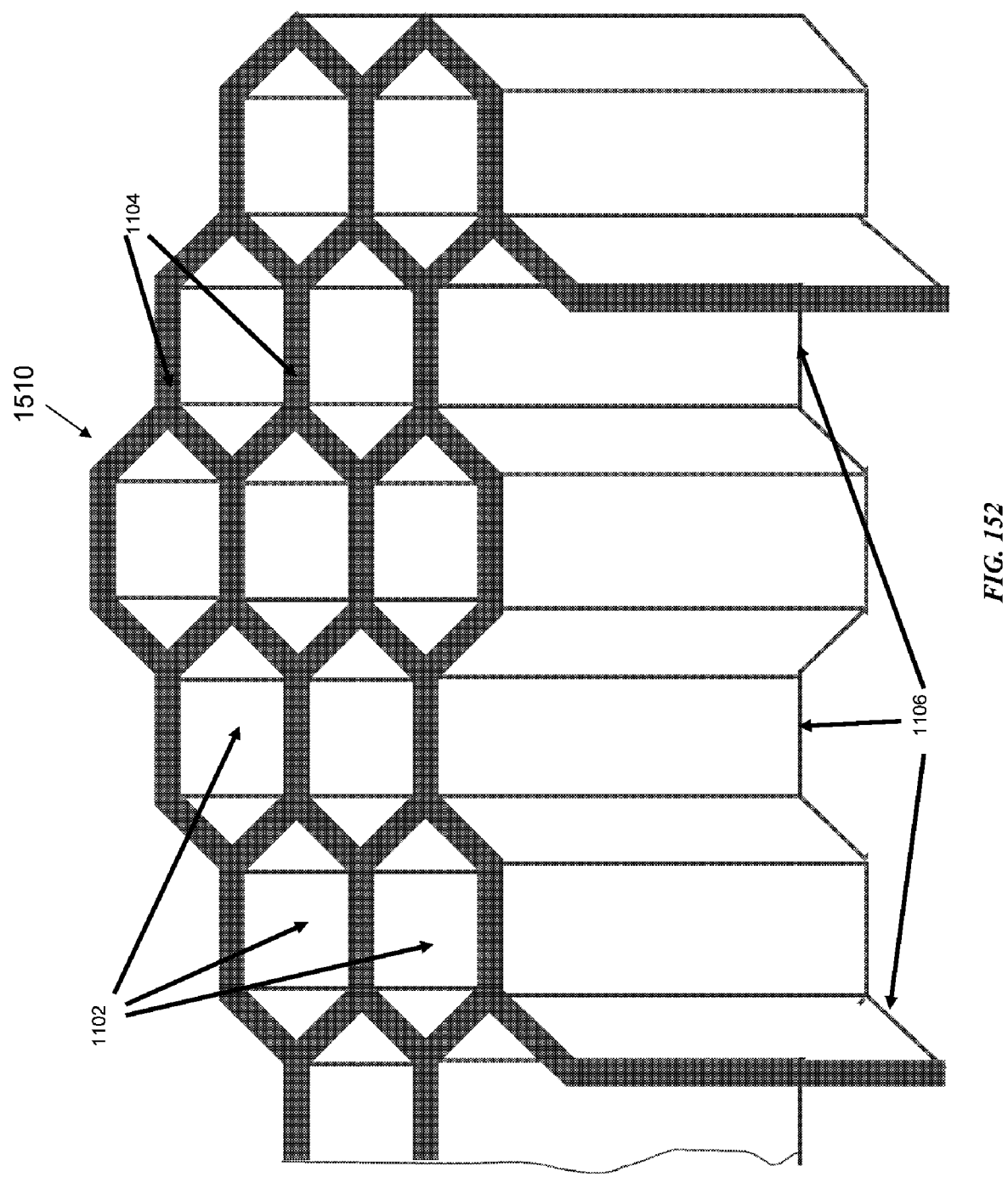
Figure 153:
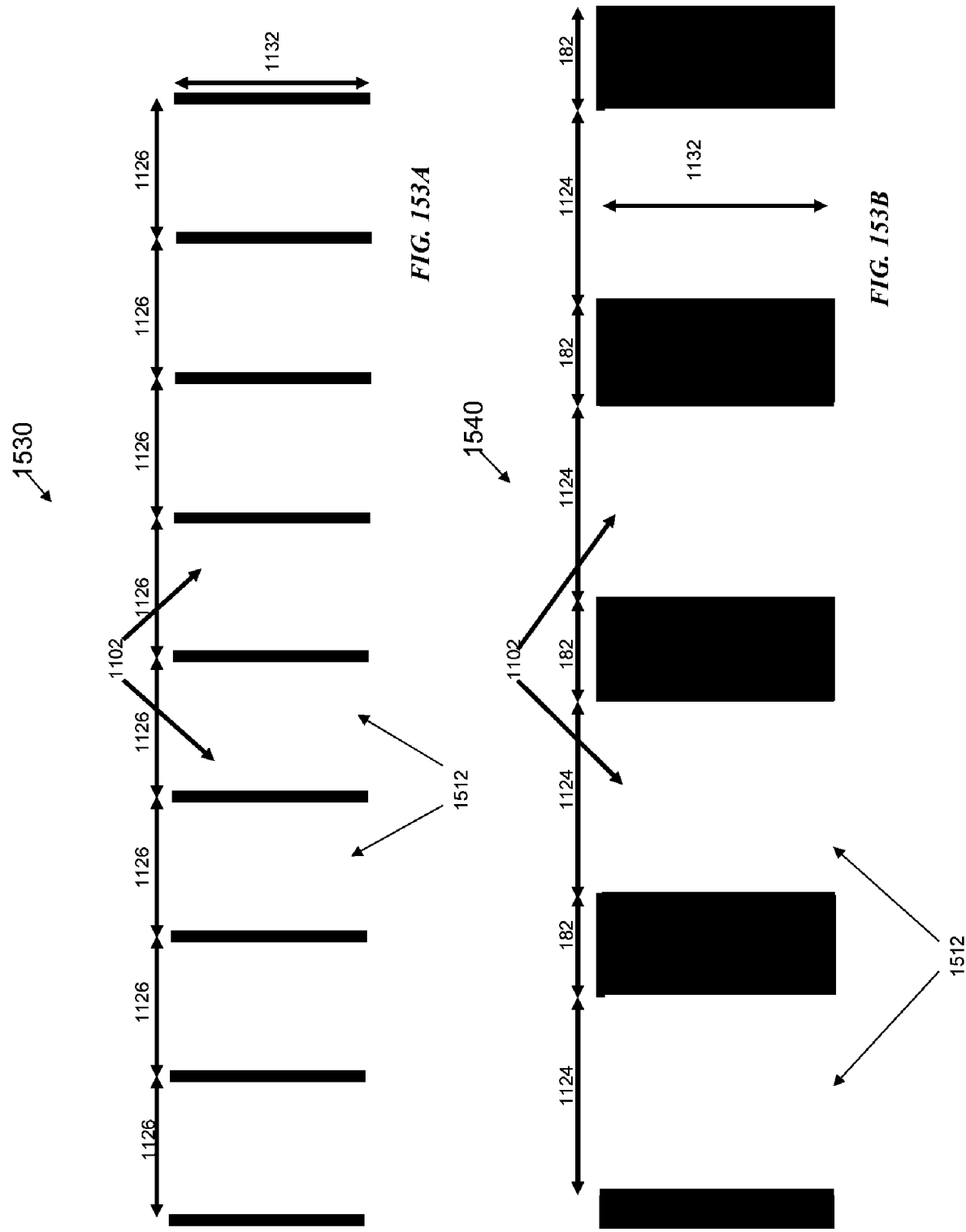
Figure 164A:
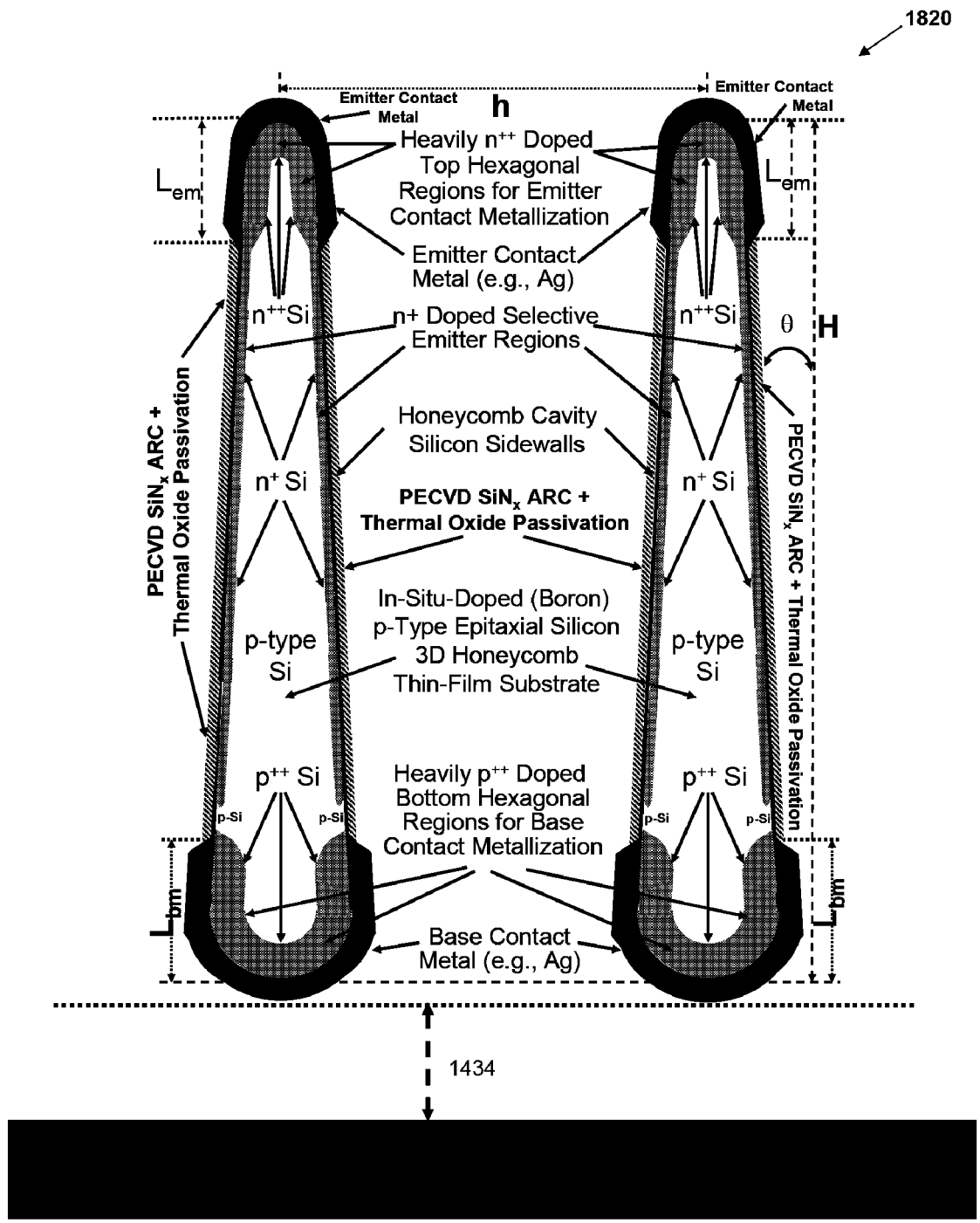
Figure 164B:
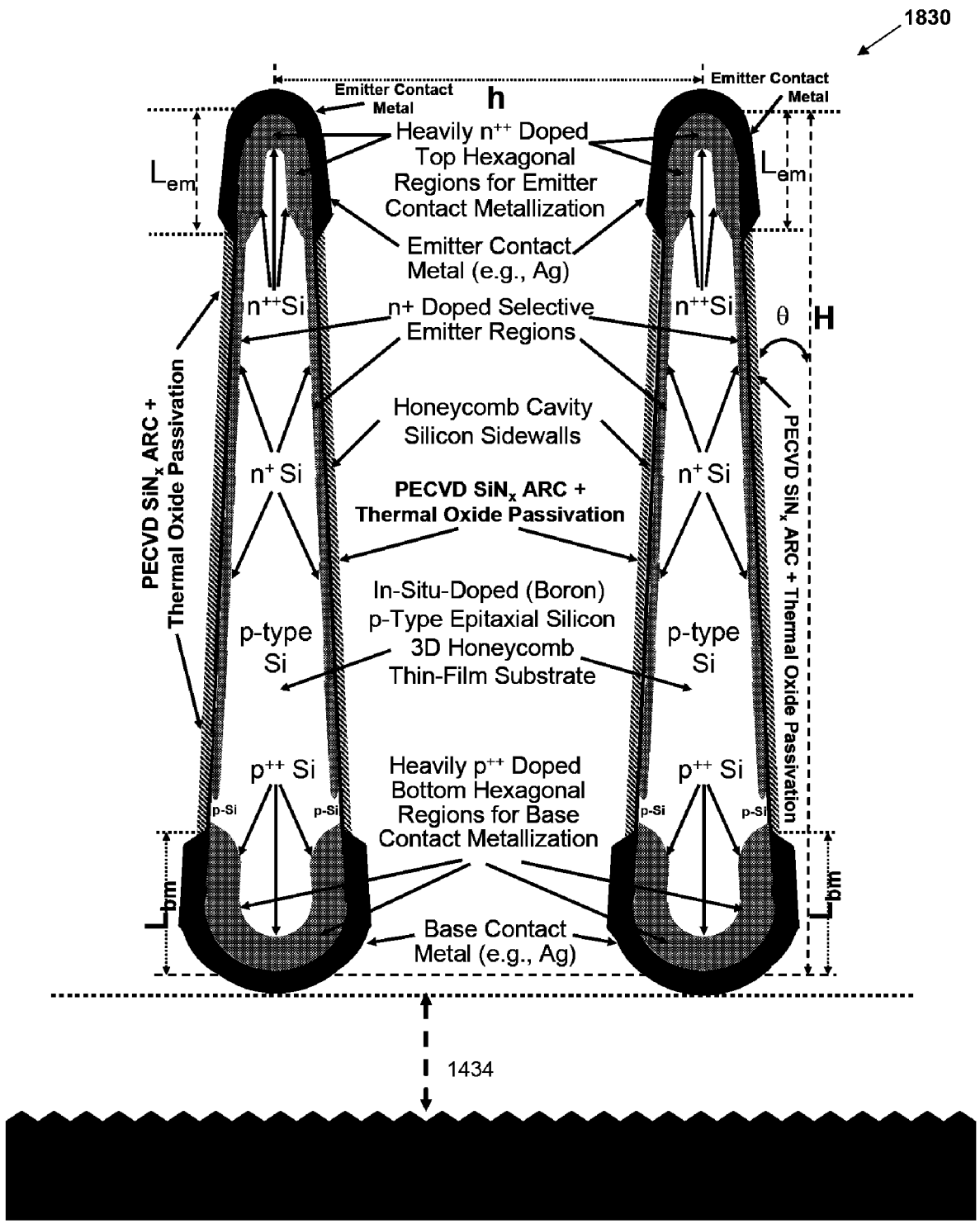
Figure 166:
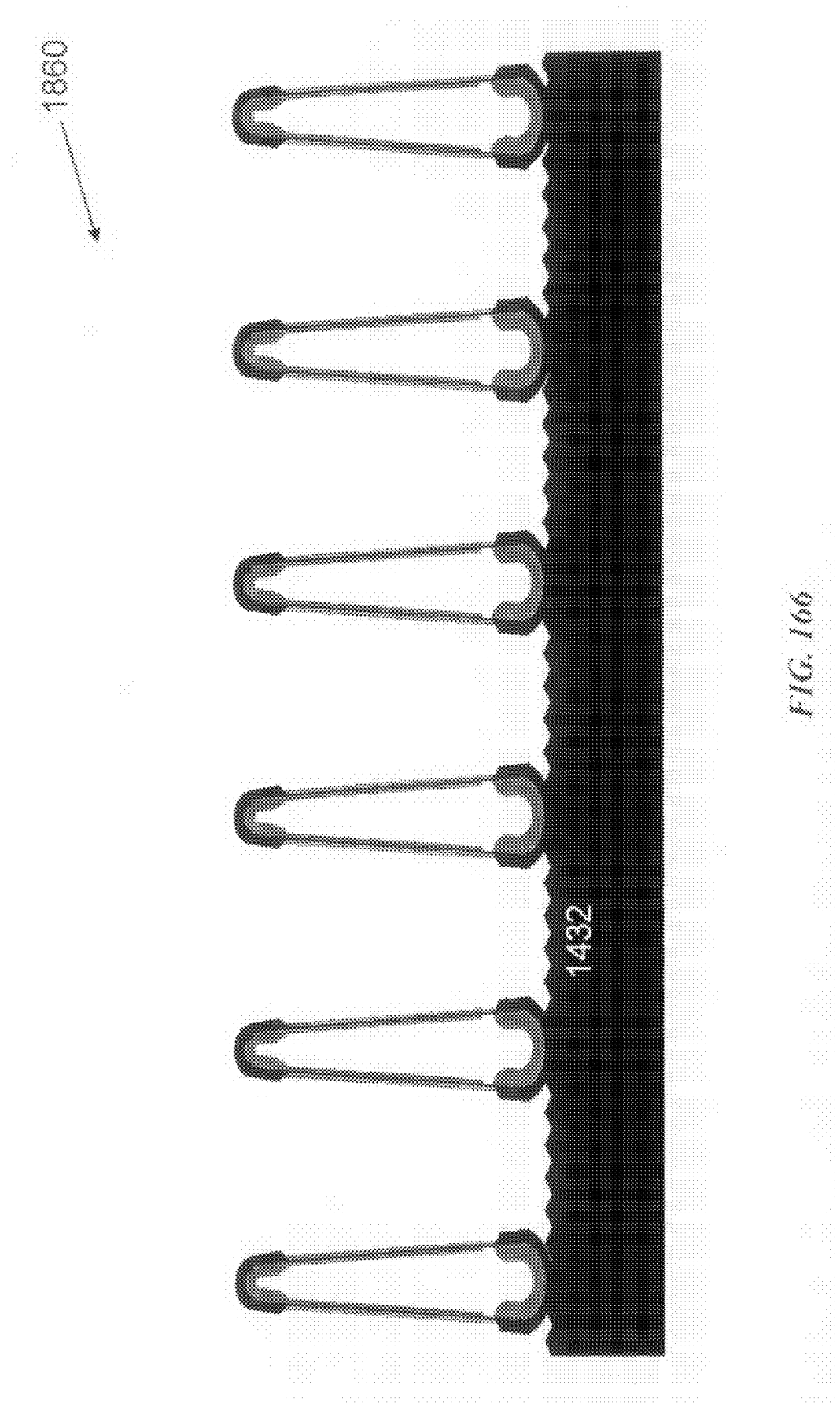
Figure 172B:
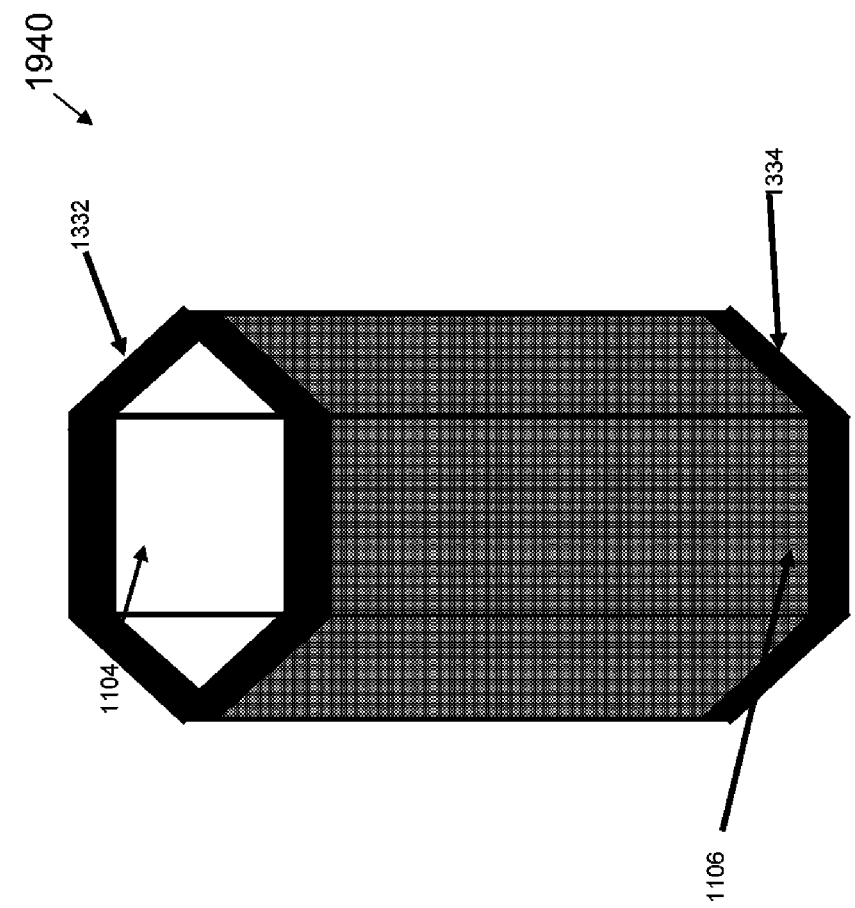
Figure 172A:
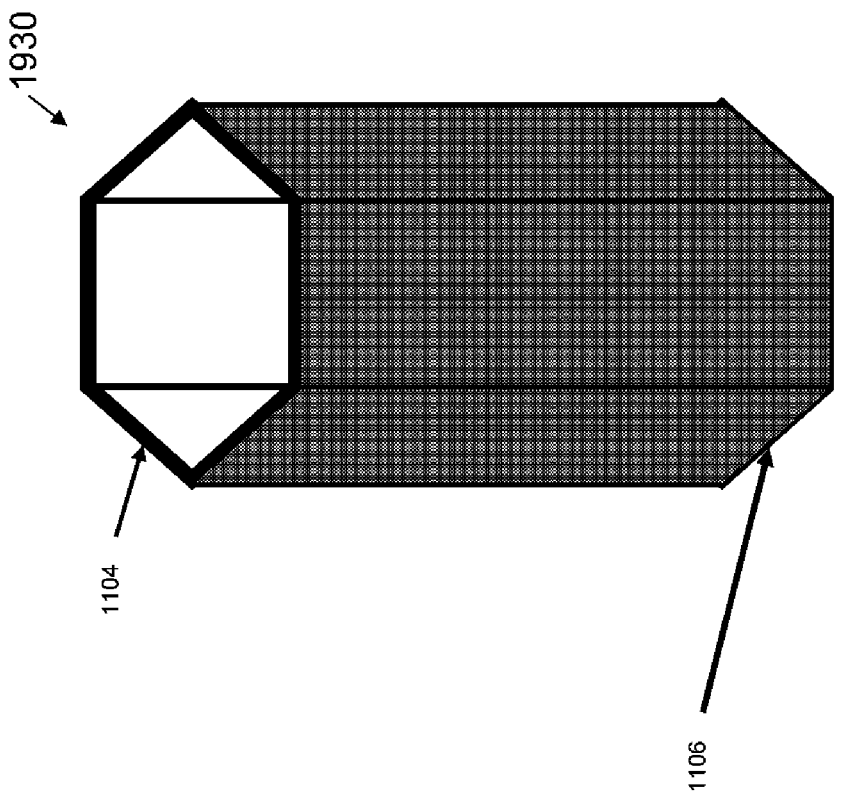
Figure 173:
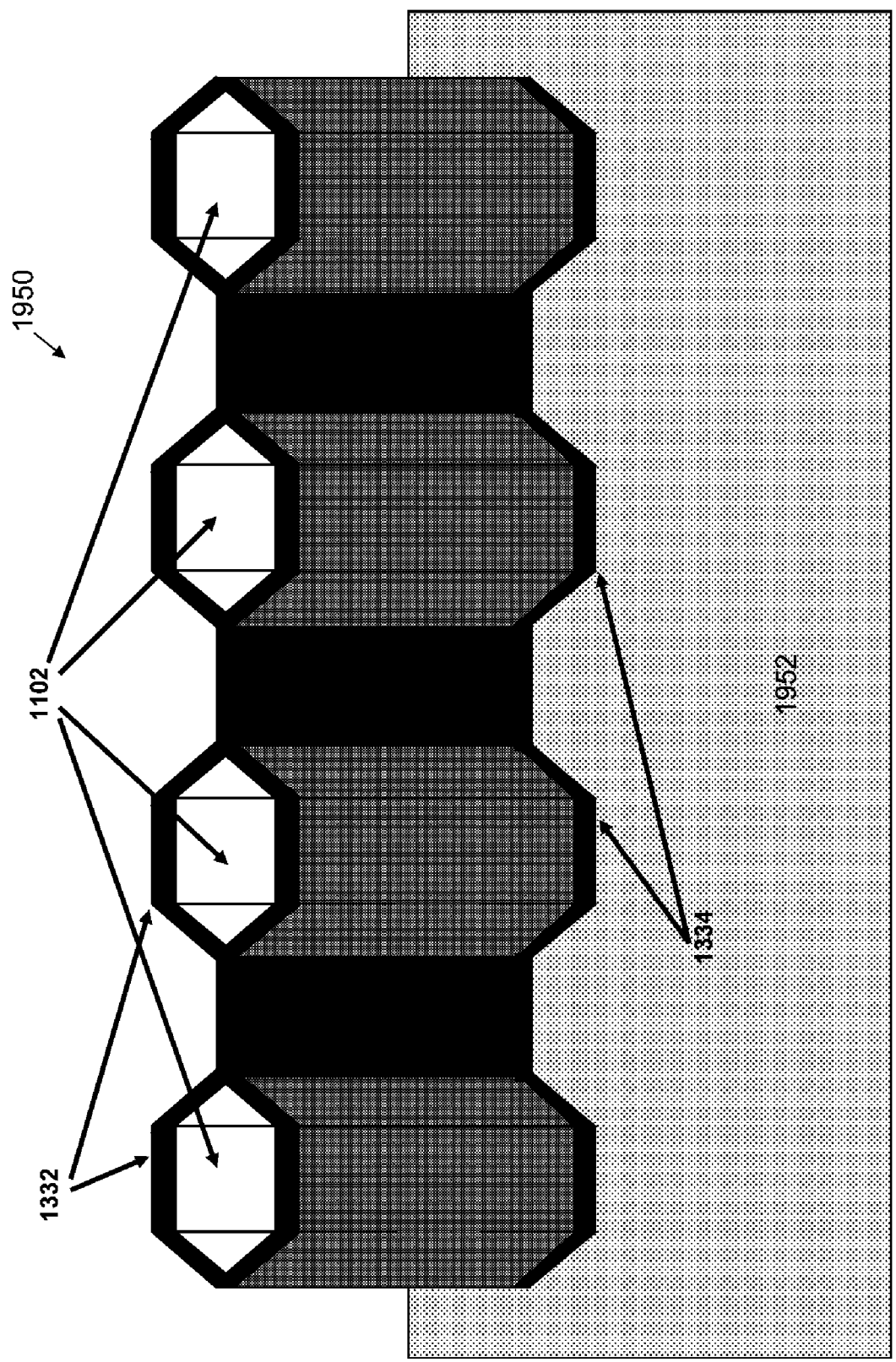
Figure 174:
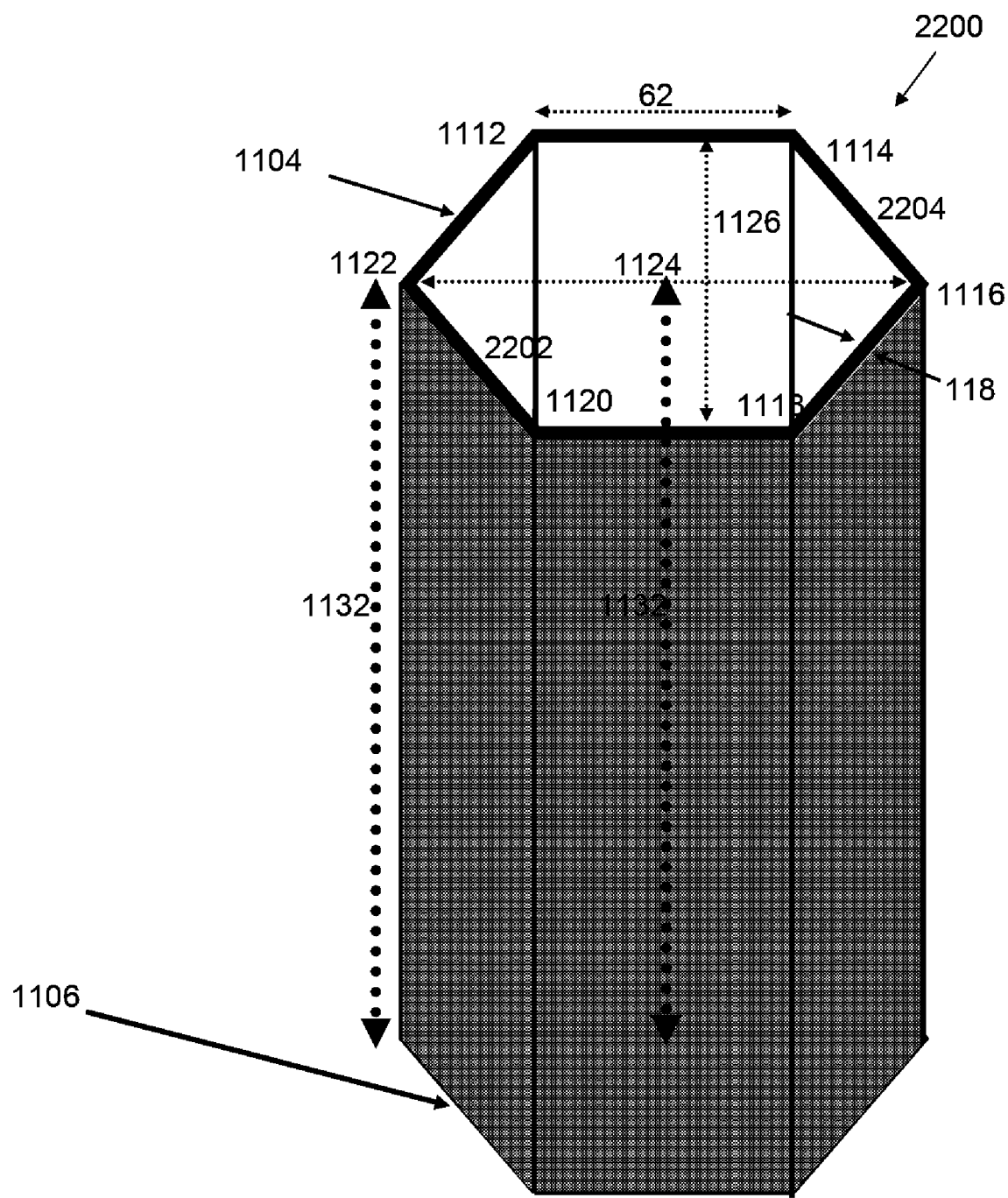
Figure 175:
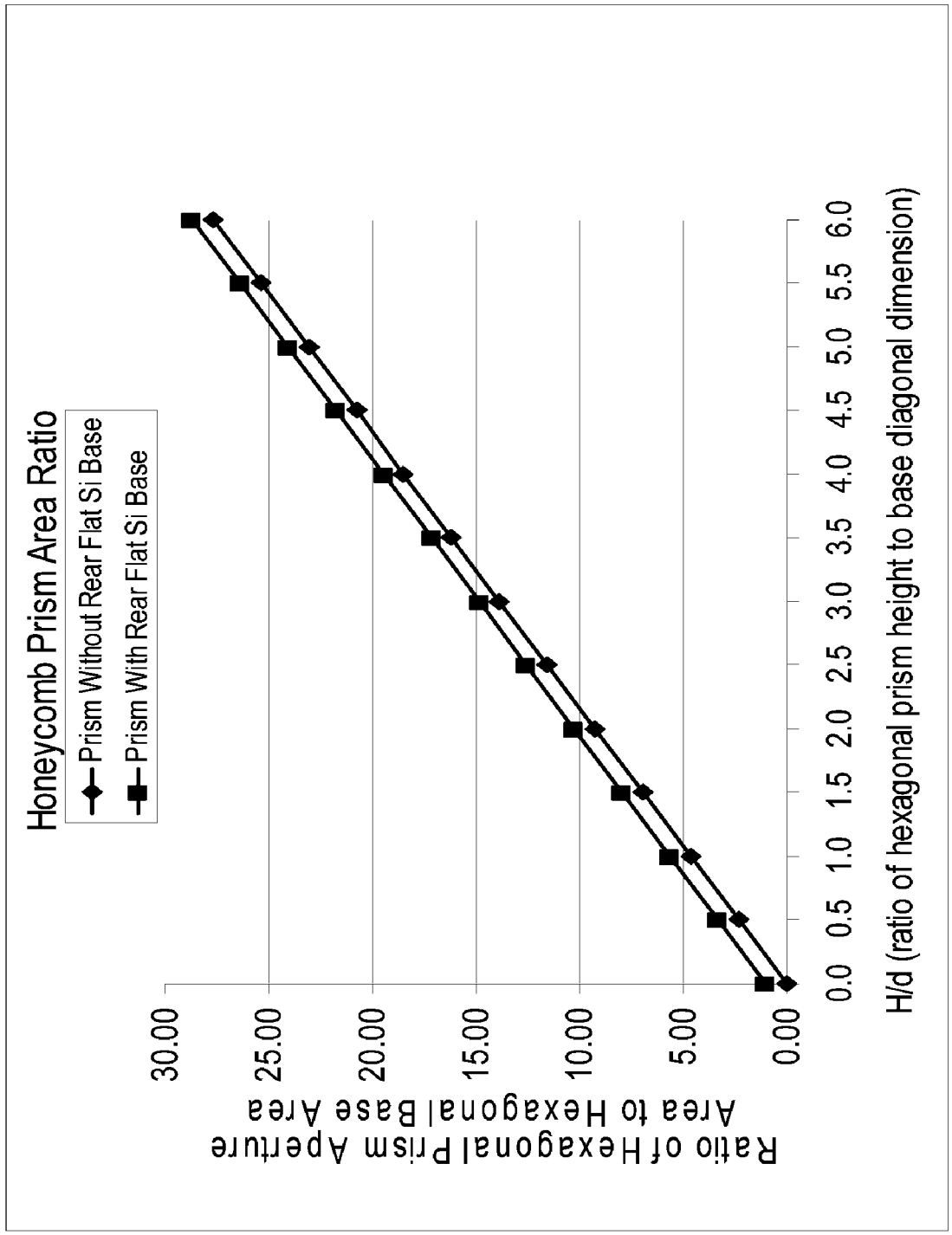
Figure 176:
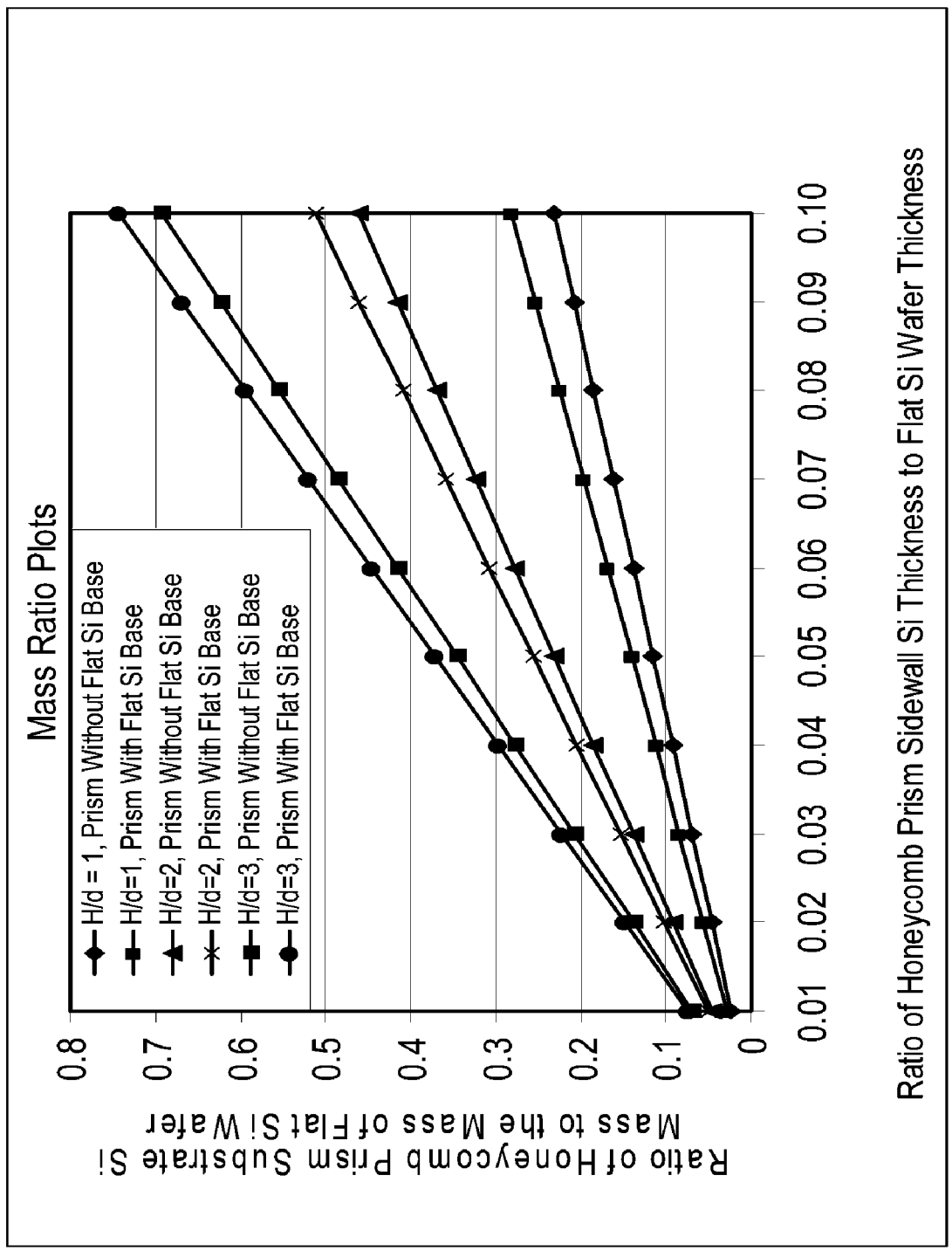
Figure 177:
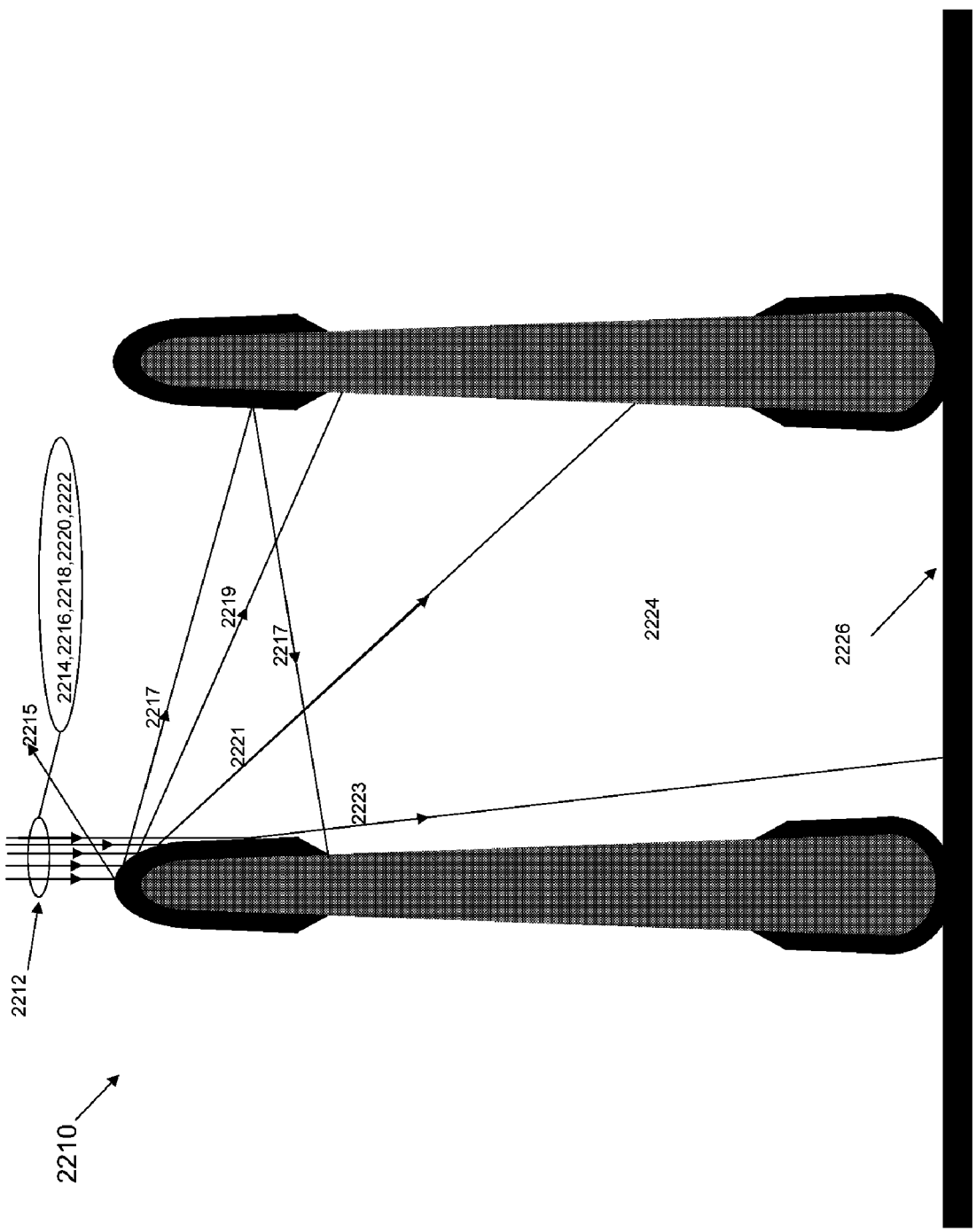
Figure 182:
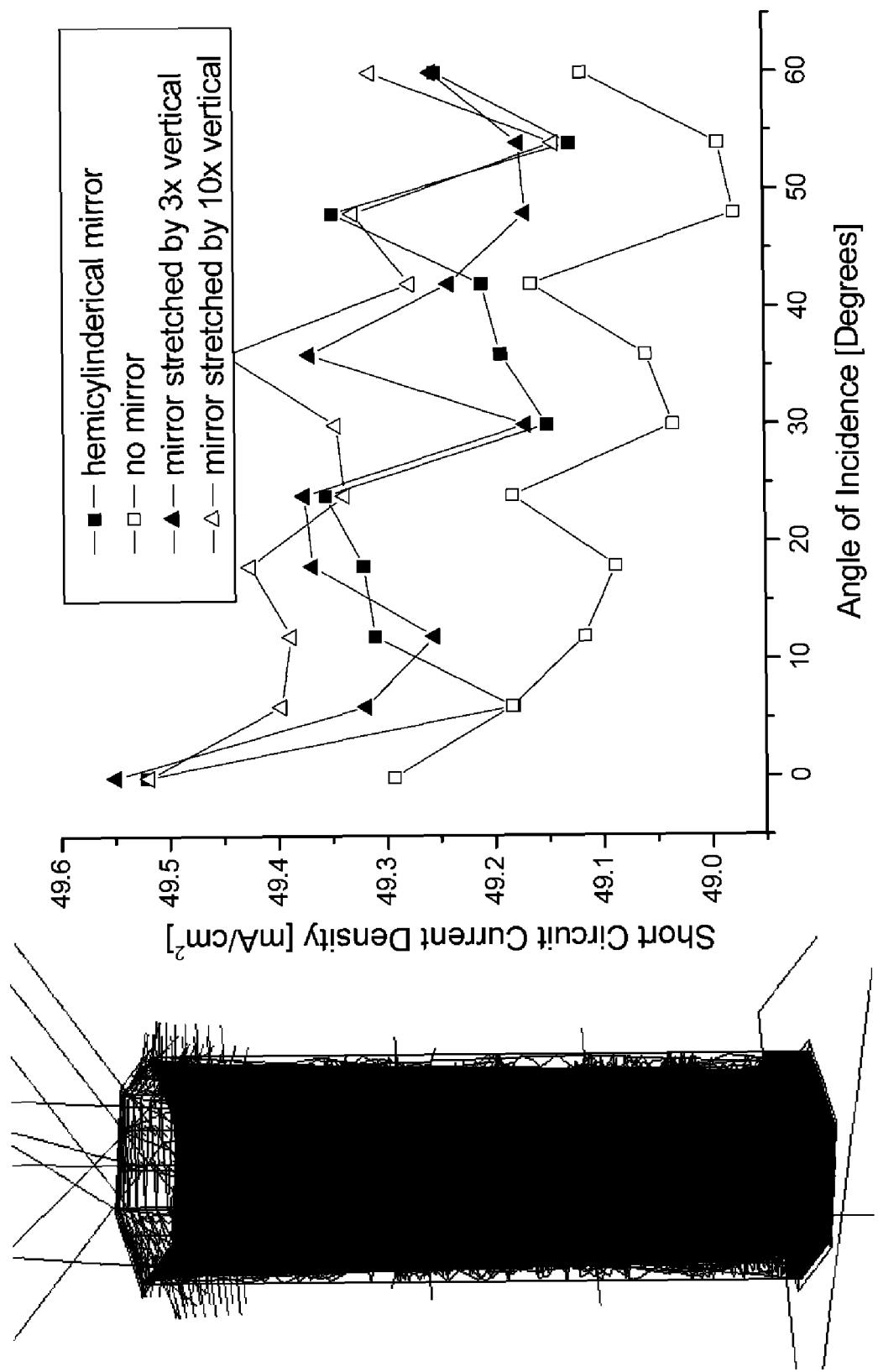
Figure 183:
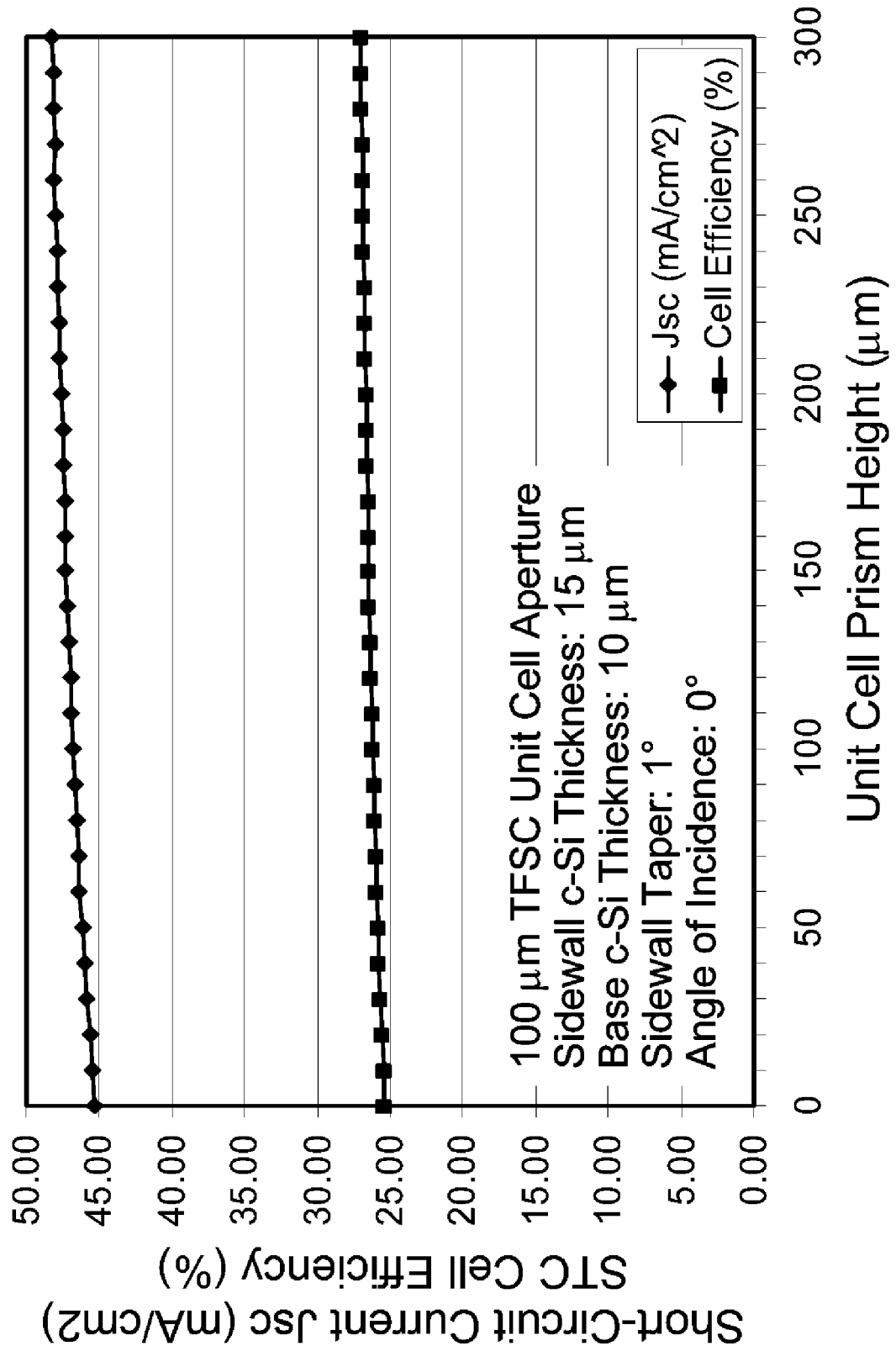
Figure 184:
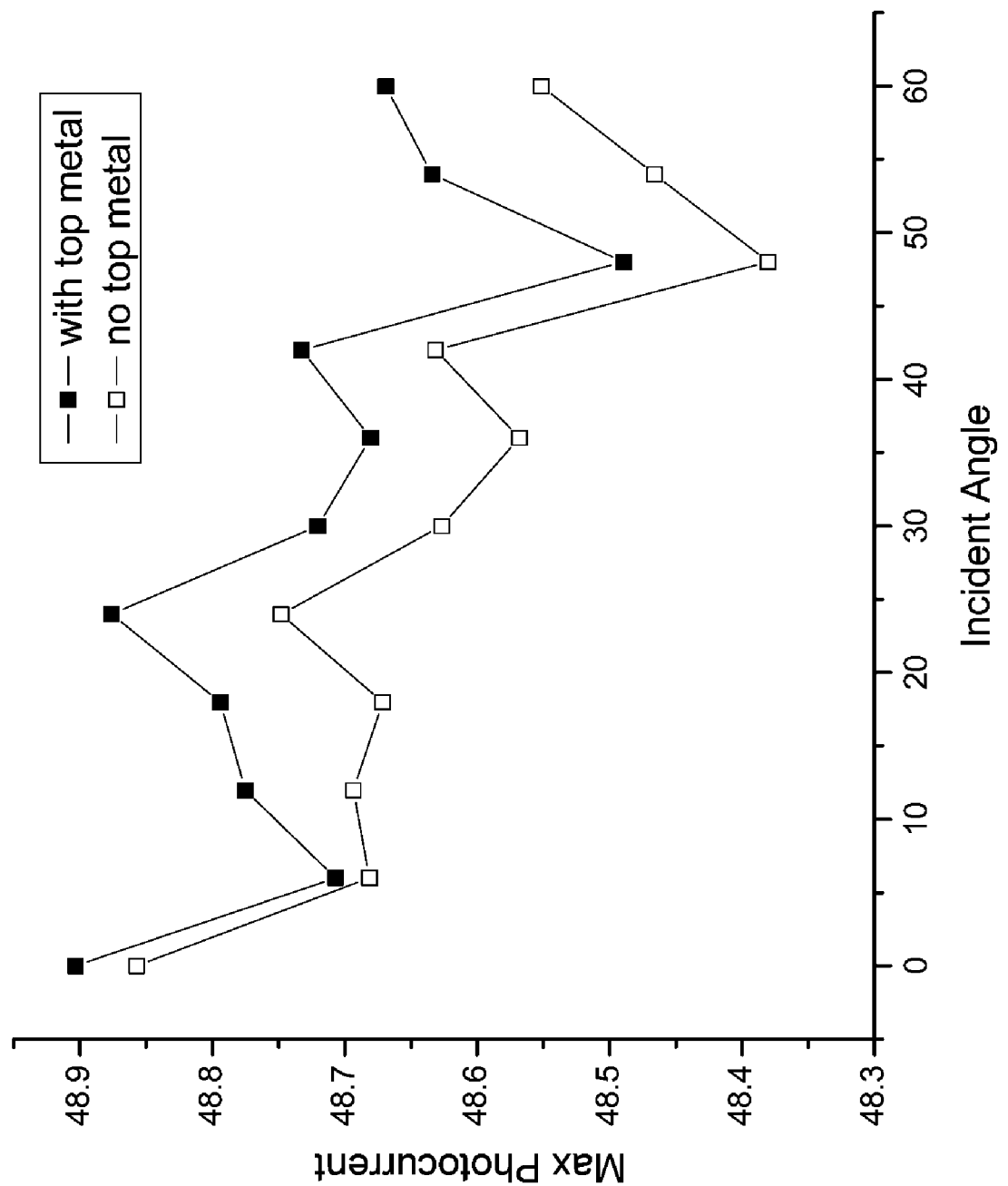
Figure 185:
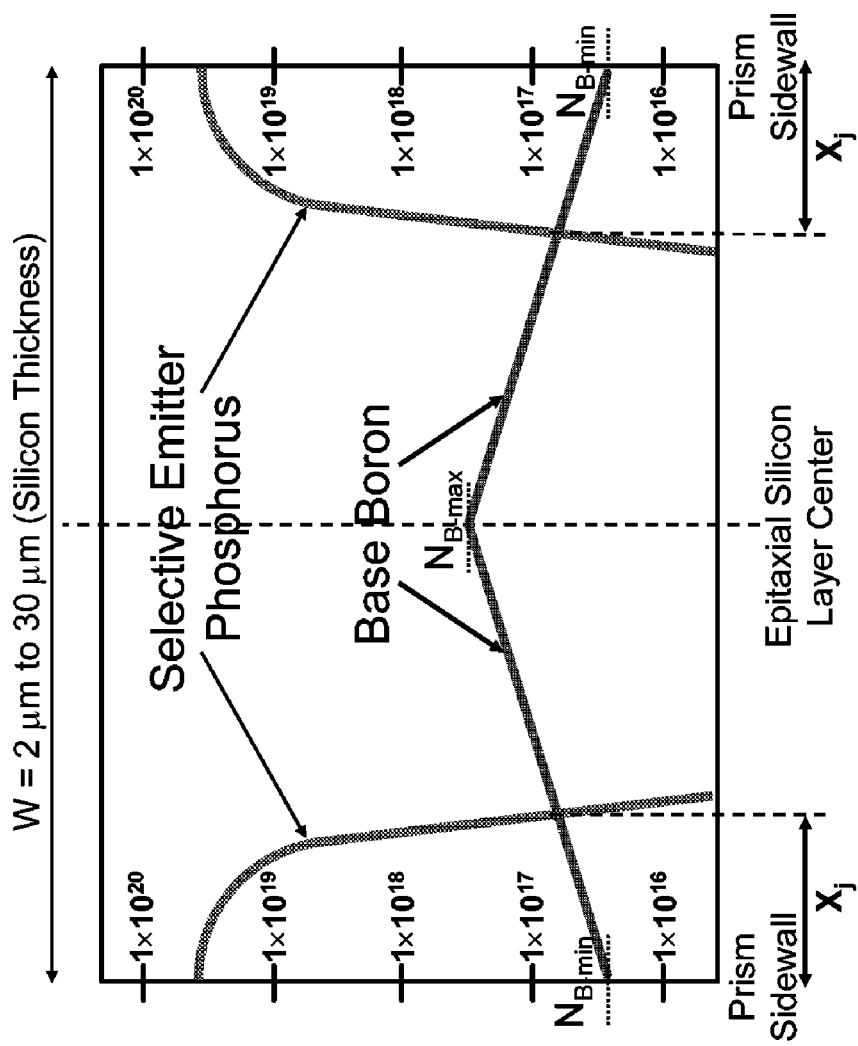
Figure 186:
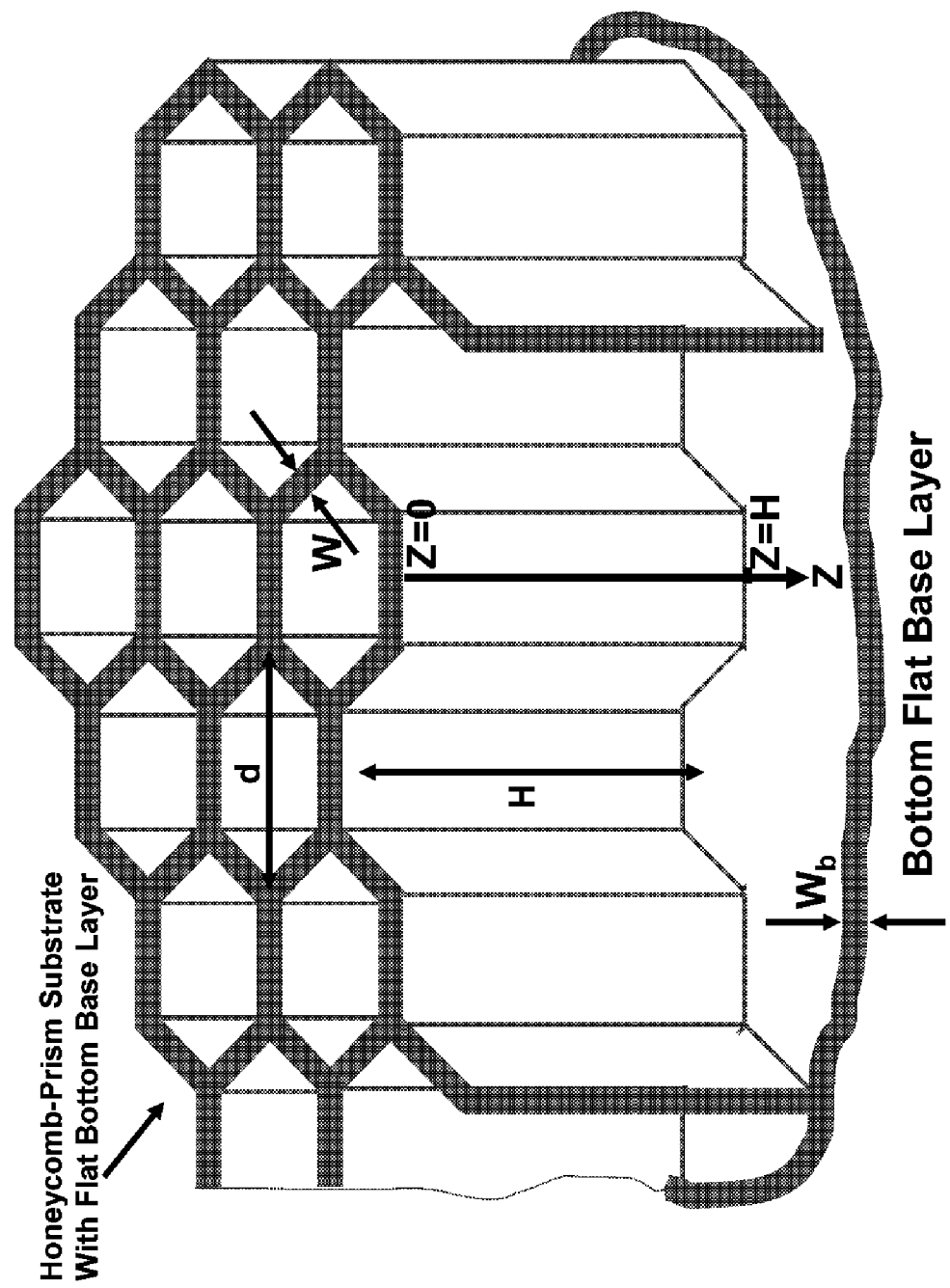
Figure 188:
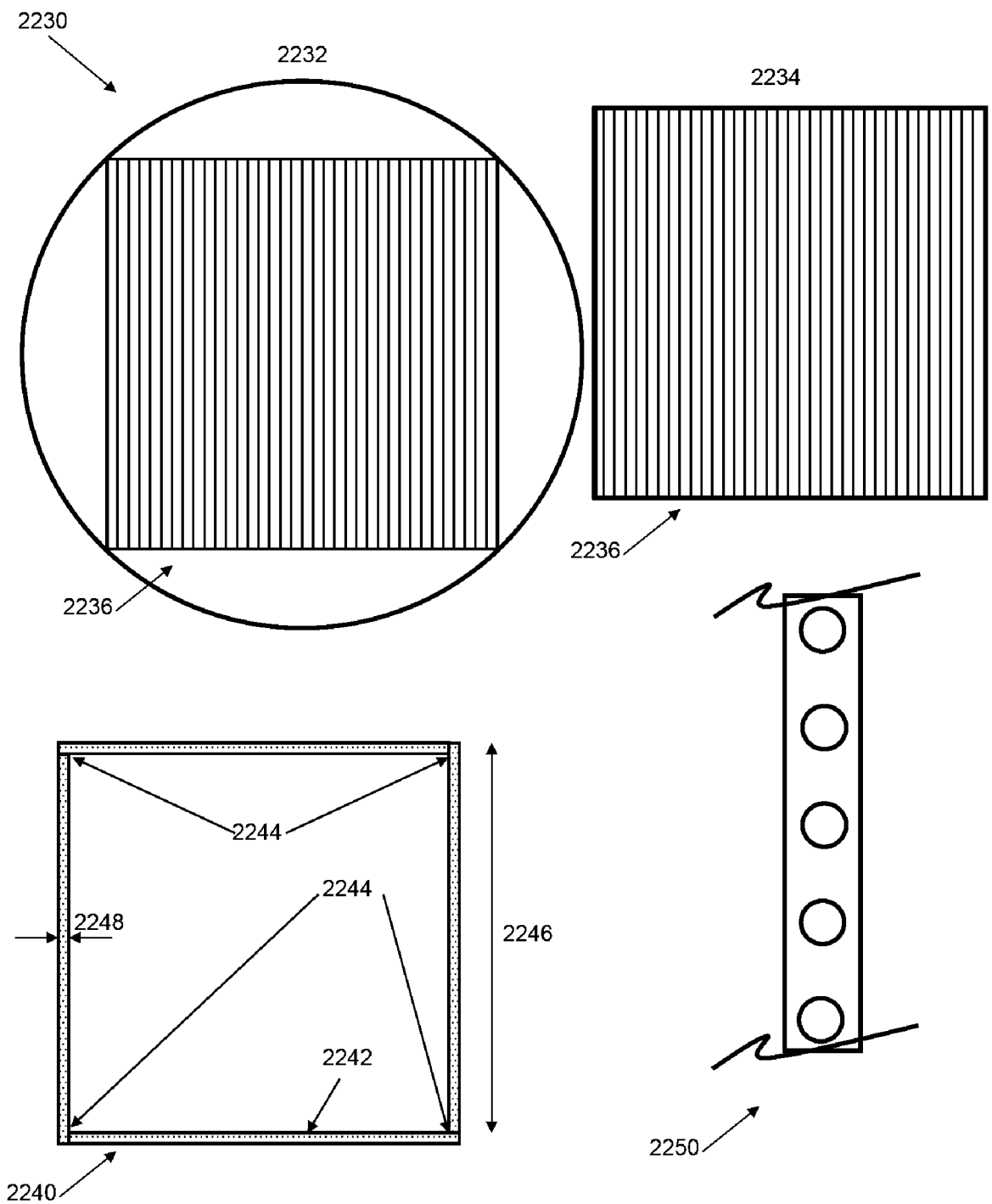

FIGS. 123 through 125 illustrate Y-Y cross-sectional views of the template in FIG. 66 with the rear-to-front release channels, as it goes through the key process steps to fabricate a hexagonal-prism 3-D TFSC substrate (single-aperture 3-D TFSC substrate) with a rear base layer (template is made on <100> silicon substrate);

FIGS. 126 through 128 illustrate Y-Y cross-sectional views of the template in FIG. 75 with the rear-to-front release channels, as it goes through the key process steps to fabricate a hexagonal-prism 3-D TFSC substrate (single-aperture TFSC substrate) with a rear base layer (template is made on <110> silicon substrate);

FIGS. 129 through 131 illustrate Y-Y cross-sectional views of the template in FIG. 86 with backside release channels aligned to the bottom of hexagonal-prism trenches, as it goes through the key process steps to fabricate a hexagonal-prism 3-D TFSC substrate with a rear base layer (single-aperture 3-D TFSC substrate);

FIG. 132 shows a 3-D cross-sectional view of an embodiment of a single-aperture hexagonal-prism 3-D TFSC substrate (i.e., 3-D TFSC substrate with an integral base layer), including the substrate rear monolithically (integrally) connected to a substantially flat planar thin semiconductor film;

FIG. 133 shows a top view of an embodiment of a regular (equilateral) hexagonal-prism 3-D TFSC substrate;

FIG. 134A shows a Y-Y cross-sectional view of an embodiment of a single aperture hexagonal prism 3-D TFSC substrate, while FIG. 134B shows a Z-Z cross-sectional view;

FIGS. 135 through 140 show alternative process flow embodiments for fabricating hexagonal-prism 3-D TFSCs using single-aperture 3-D TFSC substrates including rear base layers;

FIG. 141 shows multiple adjacent hexagonal-prism unit cells, after completion of the TFSC fabrication process and after mounting the cell rear base side onto a rear mirror;

FIGS. 142A through 144A show Y-Y cross-sectional views of a unit cell within an embodiment of a single-aperture hexagonal-prism 3-D TFSC substrate including a rear base layer;

FIGS. 144B through 148 show Y-Y cross-sectional views of an embodiment of a single-aperture hexagonal-prism 3-D TFSC substrate including a rear base layer, and including either a detached or an integrated rear mirror;

FIG. 149 shows a schematic view of a double-sided coater setup for self-aligned application (coating) of dopant liquid or paste layers on 3-D TFSC substrate hexagonal-prism top ridges and hexagonal-prism rear surface or ridges by roller coating and in-line curing of the applied liquid/paste layers (shown in conjunction with an integrated belt-driven process equipment);

FIG. 150 shows a view of an alternative spray coater and curing setup to perform the same processes as the roller coater and curing setup of FIG. 149;

FIG. 151 shows a view of another alternative setup design using liquid-dip coating or liquid-transfer coating to perform the same processes as the roller coater and curing setup of FIG. 149 and the spray coater and curing setup of FIG. 150;

FIG. 152 shows a 3-D view of an embodiment of a hexagonal-prism 3-D thin-film semiconductor substrate after release and removal from a template;

FIG. 153A shows a schematic Y-Y cross-sectional view of an embodiment of a dual-aperture hexagonal-prism 3-D TFSC substrate, while FIG. 153B shows a Z-Z cross-sectional view of the same substrate;

FIGS. 154 through 159 show alternative process flow embodiments for fabricating hexagonal-prism 3-D TFSCs using dual-aperture 3-D TFSC substrates without rear base layers;

FIG. 160A shows a schematic Y-Y cross-sectional view of an embodiment of a self-supporting (free-standing) hexagonal-prism dual-aperture 3-D TFSC substrate (without a base layer) including a thin peripheral semiconductor (silicon) frame, before 3-D TFSC fabrication;

FIG. 160B shows a schematic Y-Y cross-sectional view of the 3-D TFSC substrate of FIG. 160A after TFSC fabrication;

FIG. 161A shows a schematic Y-Y cross-sectional view of an embodiment of a self-supporting (free-standing) hexagonal-prism dual-aperture 3-D TFSC substrate including a thick peripheral semiconductor (silicon) frame, before TFSC fabrication;

FIG. 161B shows a schematic Y-Y cross-sectional view of the 3-D TFSC substrate of FIG. 161A after cell fabrication;

FIGS. 162A through 163B show schematic Y-Y cross-sectional views of a single unit cell from a dual-aperture 3-D TFSC substrate within an embodiment of a hexagonal-prism 3-D TFSC fabricated using a 3-D TFSC substrate without a rear base layer;

FIGS. 164A and 164B show Y-Y cross-sectional views of a single unit cell from a dual-aperture 3-D TFSC substrate after mounting the cell onto a rear mirror;

FIGS. 165A through 166 show Y-Y cross-sectional views of multiple unit cells from a dual-aperture 3-D TFSC substrate, after mounting onto a rear mirror (with and without a spacing between the mirror and the rear cell);

FIGS. 167A through 171 show schematic Y-Y cross-sectional views of an embodiment of a hexagonal-prism 3-D TFSC formed on a dual-aperture 3-D TFSC substrate without a rear base layer, with substantially vertical hexagonal-prism sidewalls;

FIGS. 172A and 172B show 3-D views of a single unit cell in a dual-aperture hexagonal-prism 3-D TFSC substrate, before and after self-aligned base and emitter contact metallization, respectively;

FIG. 173 shows multiple adjacent hexagonal-prism unit cells, after completion of the TFSC fabrication process and after mounting the cell rear base side onto a rear mirror;

FIG. 174 shows a schematic view of a single unit cell from an embodiment of a hexagonal-prism 3-D TFSC substrate for reference including certain 3-D TFSC substrate calculations;

FIG. 175 shows a graph of the computed 3-D TFSC substrate hexagonal-prism area ratio (ratio of 3-D cell surface area to the flat cell base area) versus hexagonal-prism aspect ratio (unit cell height to aperture diameter ratio);

FIG. 176 shows a graph of the ratio of the hexagonal-prism 3-D TFSC substrate mass to a reference flat semiconductor wafer mass for both types of 3-D honeycomb-prism TFSC substrates (single and dual aperture substrates), versus various ratio of the honeycomb-prism sidewall silicon thickness to the reference flat silicon wafer thickness;

FIG. 177 shows a schematic diagram of ray tracing for solar rays incident on a dual-aperture hexagonal-prism unit cell employing reflective emitter metallization contact;

FIGS. 178 through 181 show various numbers of solar light rays incident at various angles of incidence, demonstrating efficient light trapping characteristics of the current disclosure;

FIG. 182 shows simulated light trapping in a unit cell and short circuit current density versus angle of incidence for various emitter contact metallization embodiments of the solar cell designs of the current disclosure;

FIG. 183 shows Standard Test Condition (STC) cell efficiency and short-circuit current density for the solar cell of the current disclosure versus unit cell prism height;

FIG. 184 shows maximum photocurrent density versus incident angle, also indicating the effect of emitter contact metallization (assuming 100% optical reflectance for emitter contact metal);

FIG. 185 shows a graph of the representative selective emitter phosphorus and 3-D TFSC substrate boron doping profiles in hexagonal-prism 3-D TFSCs of this disclosure, shown with graded boron doping profile to create a built-in electric field;

FIG. 186 serves as a reference FIGURE for calculation of the hexagonal-prism TFSC internal ohmic losses due to the base current along the hexagonal-prism vertical sidewalls;

FIG. 187 shows maximum base resistivity and approximate p-type base doping concentration values for various 3-D honeycomb-prism sidewall film thicknesses in order to limit the base current ohmic losses to less than 0.1%; and FIG. 188 shows various views of silicon frames and silicon frame slivers for the hexagonal-prism TFSCs of the current invention.

DETAILED DESCRIPTION OF THE SPECIFIC EMBODIMENTS

Preferred embodiments of the present disclosure are illustrated in the drawings, like numbers being used to refer to like and corresponding parts of the various drawings. The innovative solar cell designs and technologies of the current disclosure are based on the use of a three-dimensional (3-D), self-supporting, doped (in one embodiment, in-situ-doped) semiconductor thin film, deposited on and released from a reusable crystalline (embodiments include monocrystalline or multicrystalline silicon) semiconductor template.

A preferred semiconductor material for the 3-D TFSC substrate is crystalline silicon (c-Si), although other semiconductor materials may also be used. One embodiment uses monocrystalline silicon as the thin film semiconductor material. Other embodiments use multicrystalline silicon, polycrystalline silicon, microcrystalline silicon, amorphous silicon, porous silicon, and/or a combination thereof. The designs here are also applicable to other semiconductor materials such as germanium, silicon germanium, silicon carbide, a crystalline compound semiconductor, or a combination thereof. Additional applications include copper indium gallium selenide (CIGS) and cadmium telluride semiconductor thin films.

The 3-D TFSC designs and production technologies as well as associated module structures and assembly approaches of this disclosure effectively overcome the above-mentioned problems and challenges and enable cost-reduced fabrication of very-high-efficiency solar cells and modules using self-aligned cell process flows without the use of any photolithography patterning or screen printing or shadow-mask deposition process steps during cell fabrication (i.e., during 3-D TFSC substrate and cell fabrication after fabrication of the reusable 3-D template). The 3-D TFSC technologies of this disclosure are based on the formation of a 3-D prism-array thin-film TFSC substrate structure on a low-cost reusable template and its subsequent release and lift-off from the template to form a free-standing, self-supporting 3-D thin-film semiconductor substrate structure.

The current disclosure combines the benefits of TFSC fabrication on a proven high-efficiency crystalline silicon (c-Si) platform. The 3-D c-Si TFSC designs and technologies of this disclosure enable significant advancements in the areas of c-Si solar cell and module efficiency enhancement as well as manufacturing cost reduction. Based on innovative thin-film process steps, dependence on an expensive and constrained silicon wafer supply-chain is eliminated. Some of the unique advantages of the cells designs and technologies of this disclosure which enable achieving ultra-high-efficiency at reduced manufacturing cost are substantial decoupling from the traditional solar PV silicon supply chain, performance enhancement, cost reduction, and reliability improvement.

The disclosed subject matter improves solar cell efficiency by using a 3-D c-Si film as an absorber layer in conjunction with highly efficient light trapping. Use of the crystalline silicon absorber layer leverages known solar cell manufacturing techniques and supply chain, while reducing absorber layer thickness (e.g., reduced by a factor of ten or more compared to silicon wafers used for wafer-based solar cells). The disclosed method and system eliminates or substantially reduces photo-degradation and enhances open-circuit voltage ($V_{oc}$) of cells. In addition, the disclosed method and system provides efficient frontside and rear side light-trapping in conjunction with a highly reflective rear mirror for maximum absorption of incident solar flux. Also, the disclosed method and system provides a selective emitter to enhance blue response and external quantum efficiency, with minimal shadowing of the cell and reduced ohmic losses due to a unique folded emitter metallization contact design and improved module assembly.

Manufacturing cost is reduced by decreasing silicon usage (by a significant factor, e.g., 3× to over 10×), with thinner deposited c-Si films also reducing the finished solar module energy payback time to less than 1 to 2 years. Manufacturing cost is further reduced by eliminating wire sawing and related kerf losses associated with mainstream solar cell wafer manufacturing technology. Manufacturing cost is still further reduced by using self-aligned processing without any lithography or patterning steps used during the substrate and cell fabrication process flow, and a reduced number of fabrication process steps, with improved yield and cycle time. Production cost is still further reduced by using a simplified interconnection and cell-module assembly process and lightweight monolithic modules.

Operational reliability is improved by using thinner silicon films, eliminating photo-degradation and reducing temperature coefficients. Operational reliability is further improved by using a simple distributed high-conductance electrical interconnection, minimizing field failures. Operational reliability is still further improved by eliminating module glass cover (for glassless module assembly), thus reducing cost and facilitating field installation and operation. Operational reliability is still further improved by reducing the number of manufacturing process steps and process variations using in-line manufacturing process control.

The current disclosure reduces the solar module cost per watt for the user (by at least 30% to 50%) and cuts balance-of-system (BOS) and installation costs for the integrators and installers. This may offer major benefits to the global grid-tied end-users and solar system installers and integrators. The current disclosure reduces the module integration and installation cost and installed solar cell system cost per $W_p$ for the user, thereby lowering finished system cost per $W_p$. The current disclosure increases module efficiency, with higher module efficiency resulting in lower BOS cost. The lower installed solar cell system cost results in reduction of the economic break-even time to a lower fraction of the system lifetime, from roughly ½ to ⅓ for current best-of-breed c-Si solar cell systems to less than ¼ to ⅛ for the embodiments of this disclosure. The current disclosure reduces energy pay-back time (EPBT) from 3 to 7 years for best-of-breed c-Si solar cell systems to less than 1 to 2 years for the embodiments of this disclosure. Reduced EPBT substantially increases the net lifetime energy output (in kWh) for field-installed modules. The cell designs and module assemblies of this disclosure also provide stable degradation-free field operation over an extended time (e.g., 30 to 40 year life of the module), further increasing the net lifetime electrical energy output. Module manufacturing costs are expected to be 30% to 65% lower than that of the leading high-performance c-Si solar cells/modules at the time of market entry. This may shorten the ROI break-even time for the users compared to the current industry roadmap and projections. Further benefits include increased field performance stability and reliability and reduced environmental impact (non-toxic materials and shortened EPBT). Further, the cell and module designs of this disclosure are ideal for grid-tied applications where it is advantageous to maximize electricity generation from a limited building rooftop or façade area.

The absorber silicon film thickness of the current disclosure may be a value in the range of roughly 1 to 30 microns, where a thinner silicon layer is preferred for less material consumption (in one embodiment, in the range of 1 to 10 microns). Even after taking into account the effective surface area increase due to the 3-D geometric structure of the 3-D TFSC substrates, the 3-D TFSC substrates of this disclosure consume substantially less silicon material than the state-of-the-art wafer-based c-Si solar cells. Moreover, there are no sawing or kerf losses. Similarly, there is no requirement for saw damage removal since the 3-D crystalline silicon film is process-ready upon release from the reusable template. This substantially reduces the solar cell cost associated with silicon consumption. The self-supporting 3-D epitaxial silicon thin film is deposited on and released from a low-cost reusable crystalline (monocrystalline or multicrystalline) silicon substrate (template). The template may be reused numerous times before being reconditioned or recycled. The template may even be chosen from the much lower cost metallurgical-grade c-Si since any metallic impurities are prevented from contaminating the 3-D crystalline silicon film.

FIG. 3 summarizes the overall crystalline solar cell fabrication process flow of prior art techniques and highlights the specific steps eliminated by the current disclosure, compared to the prior art. FIG. 4 summarizes the overall cell and module fabrication process flow and the competitive advantages of the current disclosure, compared to the prior art. As highlighted here, the current disclosure enables fabrication of 3-D thin-film solar TFSC substrates and cells, thus, substantially reducing consumption of semiconductor absorber material (e.g., silicon) and the cell and module manufacturing costs. FIG. 5 provides another summary of the benefits of the embodiments of the current disclosure.

In the next section, various embodiments of this disclosure for making solar modules suitable for building rooftops and façades, centralized power generation, and other applications are described. Usually solar modules are made by arranging a plurality of solar cells and connecting them in series (series electrical connections) within a solar module assembly protected by a top glass layer and a rear protective material layer such as Tedlar. The cells may be connected in series in order to step up the DC voltage (while maintaining the solar module current at the same level at the level of the cell current) to facilitate high-efficiency DC-to-AC power conversion.

FIG. 6 shows a view of a representative example of series connections of TFSCs of this disclosure in a solar module assembly 100. This example shows 24 squared-shaped cells 102 connected in series (in a 6×4 array). The electrical connections in series are shown by arrows between the adjacent cells connected in series. Module power input and output leads 104 are also shown. In actual module assemblies, the numbers of cells may be smaller or larger and the cells may be connected in series or in a combination of series and parallel. As mentioned earlier, series connection of the cells within the module assembly allows for stepping up the DC voltage for the DC-to-AC inverter (and also limiting the DC current of the solar modules for ease of module installation in the field and reliability of the module-to-module electrical connections). The printed-circuit-board (PCB) based module assembly of this disclosure supports any number of cells assembled in a module and any electrical connection configuration (series, series/parallel combination, or parallel). The TFSCs and modules of this disclosure may provide relatively lightweight solar modules with areas from less than 1 m² to several m² (e.g., 10 m²) for various applications. The cells connected in series within a module assembly are chosen based on sorting to be matched in terms of their photogenerated current (e.g., short-circuit current $I_{sc}$ and/or maximum-power current $I_m$).

FIG. 7 shows a top view 110 of a hexagonal-prism 3-D TFSC with a peripheral planar silicon frame 112 for use in the above solar module assembly 100, shown in FIG. 6. The top surface of the frame 112 may also be used as the top 3-D TFSC interconnect and may be used to produce a wrap-through or wrap-around emitter metallization for making contacts to the cell emitter at the bottom of the cell (in module assembly). The frame 112 is metallized, along with the top hexagonal emitter contacts, and is electrically connected to the hexagonal emitter contacts. The frame 112 may have the same thickness as the 3-D TFSC substrate or may be much thicker. In one embodiment, frame width 114 is between 5 and 500 microns. The hexagonal prism 3-D TFSC substrate is composed of hexagonal-prism unit cells 116. In one embodiment, the width 118 of the silicon film forming the sidewalls of the hexagonal prism unit cell is preferably 2 to 30 microns, and more preferably 2 to 10 microns. Typically, there are thousands to millions of hexagonal-prism unit cells 116 on a large-area 3-D TFSC. In one embodiment, frame length (S) 120 ranges from 125 to over 200 millimeters (e.g., 210 mm×210 mm). The hexagonal-prism 3-D TFSC substrates of this disclosure may have a thin silicon frame, a thick silicon frame, or no peripheral frame at all.

FIGS. 8A and 8B show microscopic views of 3-D thin-film TFSC substrates of a 3-D TFSC as illustrated in FIG. 7. FIG. 8A shows a view of a dual-aperture TFSC substrate without a base layer whereas FIG. 8B shows a view of a single-aperture TFSC substrate with a base layer.

FIG. 9 provides an overview of the 3-D TFSC substrate and cell fabrication process flow. Focusing on the top of FIG. 9 illustrating the 3-D TFSC substrate fabrication, note that the first step in this process flow uses a pre-fabricated template. The template with a pre-fabricated 3-D trench or groove pattern may be used for formation of 3-D TFSC substrates, which are then used in the formation of 3-D TFSCs, substantially eliminating or reducing disadvantages and problems associated with previously developed TFSCs and the wafer-based crystalline silicon cell technologies. The template is capable of being used numerous times (e.g., tens to hundreds of times) to fabricate numerous 3-D TFSC substrates before being reconditioned or recycled. In one embodiment, the template may be used hundreds of times to fabricate 3-D TFSC substrates before being recycled. The template may be reused for as long as it remains relatively free of dislocations and/or for as long as it maintains an acceptable trench or groove pattern with widths and surface conditions within acceptable control limits (e.g., as gauged by in-line metrology).

FIG. 10 shows a view 130 of a template with hexagonal-prism posts (pillars) 132. A hexagonal-prism 3-D thin-film TFSC substrate (not shown) is fabricated by first forming a suitable relatively conformal thin sacrificial layer (in one embodiment, porous silicon) on the template, then filling in the relatively deep trenches 134 between hexagonal-prism posts 132, and subsequently releasing the hexagonal prism 3-D TFSC substrate by selectively etching the sacrificial layer (not shown) deposited between the hexagonal-prism 3-D TFSC substrate and the template. In one embodiment, the template has deep interconnected hexagonal-prism trenches with slightly tapered sidewalls (i.e., larger trench widths near the top of the trenched compared to near the bottom of the trenches. Moreover, the trench widths near the top of the trenches may be made about one to several microns larger than the trench widths near the bottom of the trenches. FIGS. 11A and 11B show magnified views of one embodiment of a template with hexagonal-prism posts 132 and trenches 134. This embodiment was prepared using photolithography and deep reactive-ion etching (DRIE).

Note that the terms "honeycomb" and "hexagonal" are used interchangeably throughout this disclosure. The term "honeycomb" refers to the fact that embodiments of the 3-D TFSC substrates resemble a natural honeycomb.

FIG. 12 shows a view 140 of an alternative embodiment of a template (or master stencil) with staggered square prism posts 142. A square-prism 3-D TFSC substrate (not shown) is formed by first depositing or forming a relatively conformal sacrificial layer (e.g., porous silicon), filling in the trenches 144 between square prism posts 142, and subsequently releasing the 3-D TFSC substrate by selectively etching the sacrificial layer formed between the 3-D TFSC substrate and the template.

In the next section, various embodiments of this disclosure for making solar modules suitable for building rooftops and façades, centralized power generation, and other applications are described. Usually solar modules are made by arranging a plurality of solar cells and connecting them in series (series electrical connections) within a solar module assembly protected by a top glass layer and a rear protective material layer such as Tedlar. The cells may be connected in series in order to step up the DC voltage (while maintaining the solar module current at the same level at the level of the cell current) to facilitate high-efficiency DC-to-AC power conversion.

The solar module structures and assembly methods of this disclosure are based on the use of a printed-circuit board (PCB) to assemble the hexagonal prism 3-D TFSCs in a closely packed array and to connect the cells (in one embodiment in series) using the PCB plate within a module assembly. The PCB plate may have a single patterned metal (in one embodiment, copper) interconnect layer on the top of the PCB or two patterned copper layers on the top and rear surfaces of the PCB plate. FIG. 13 shows a view 150 of the frontside silver-coated copper layout of the printed-circuit board (PCB) used for solar module assembly (the square islands serve both as rear mirrors (if no integrated mirror is used with single-aperture cells, or if the cells are dual-aperture cells without base layers) and base interconnects; the peripheral square-shaped copper bands connect to the wrap-around emitter contact at the TFSC peripheral frame rear side; copper-filled via plugs connecting select regions of the PCB frontside and backside are shown as small circles). This example is shown for an array of 24 TFSCs arranged in 4 rows of 6 cells in each row (the PCB may be designed for any number and various arrangements of TFSCs). The PCB conductor (copper or aluminum) thickness may be in the range of roughly 10 to over 100 microns to provide high electrical and thermal conductivities. The PCB also serves as an effective heat sink to minimize temperature cycling of the TFSCs in operation. The PCB material may be selected to be a lightweight, high-strength material (such as carbon composite materials used in aerospace industry), or even a relatively thin flexible material. The larger-area square-shaped silver-coated copper regions 152 are connected to the TFSC rear base regions (bottoms of the rear base layers for the single-aperture cells or the bottom ridges of the dual-aperture cells for the dual-aperture cells). The peripheral silver-coated copper lines 154 are electrically connected to the TFSC emitter contact metallization regions.

FIG. 14 shows a top view 160 of the backside (optionally silver-coated) copper layout of the printed-circuit board (PCB) used for solar module assembly, showing the series connection of the TFSCs. The PCB backside may also include thin-film shunt diodes for shade protection of the TFSCs (as shown in FIG. 15). The copper-filled via plugs (shown as circles) connect the PCB frontside and backside metallization patterns in the corresponding areas. While the example shown here is for connecting 24 TFSCs in series on a solar panel, similar PCB design methodology may be applied to configure and connect any number of cells in any desired arrangements on the module. The frontside view of this PCB is shown in FIG. 13. This example is shown for an array of 24 TFSCs arranged in 4 rows of 6 cells in each row (the PCB may be designed for any number and various arrangements of TFSCs), all connected in series. The PCB conductor (copper or aluminum) thickness may be in the range of roughly 10 to over 100 microns to provide high electrical and thermal conductivities. The PCB also serves as an effective heat sink to minimize temperature cycling of the TFSCs in operation. The PCB material may be selected to be a lightweight, high-strength material (such as suitable carbon composite materials used in aerospace industry). FIG. 14 also shows power Output Lead 162 (first cell's p-lead) and power output lead 164 (last cell's n-lead).

FIG. 15 shows a backside view 170 of the copper pattern on the PCB and is essentially similar to FIG. 14. This picture also shows the use of protective thin-film shunt diodes mounted on the PCB backside pattern (for cell shadow protection).

FIG. 16A shows an enlarged top view 180 of the silver-coated copper pattern (the pad for mounting one cell) on the frontside of the solar module printed-circuit board (PCB) used for rear mirror and also emitter and base interconnects for one of the TFSCs (relative dimensions are not shown to scale). FIG. 16A shows dimensions of $L_1$ 182 and $L_2$ 184 (in one embodiment, 150 millimeters to greater than 200 millimeters, where $L_2=L_1+2(W+S)$). S 186 may be on the order of 25 to 250 microns. The width of the peripheral copper conductor band (W) 188 may be on the order of 50 to 500 microns. The copper-filled via plugs 190 are shown as circles (connecting the interconnect patterns on the PCB frontside and backside in a pre-designed arrangement in order to connect the TFSCs in series or in any other desired arrangement such as series/parallel; the representative example shown here is for connecting all the cells in series in order to step up the module open-circuit voltage). The via plug 190 diameters may be on the order of roughly 50 to 500 microns (and may be smaller than W 188). The large central square pad serves both as the rear cell mirror (for dual-aperture cells or single-aperture cells without integrated rear mirrors) and also base interconnect plane (connecting to the hexagonal-prism base contact metallization). The number of vias in the center square (p-region contact) (N) 192 may be on the order of hundreds to thousands. The number of vias in the peripheral line (n-region contact) (M) 194 may be on the order of tens to hundreds (or even thousands). The vias on the peripheral line contacting the TFSC emitter (n) regions are placed on three sides. The PCB conductor (copper or aluminum) thickness may be in the range of roughly 10 to over 100 microns to provide high electrical and thermal conductivities. The PCB plate also serves as an effective heat sink to minimize temperature cycling of the TFSCs in field operation. This FIGURE shows one of the copper interconnect/mirror pads shown in the full module PCB array of FIG. 13.

FIG. 16B shows an enlarged top view 200 of the silver-coated copper interconnect pattern on the backside of the solar module printed-circuit board (PCB) used for emitter and base electrical interconnects for a couple of adjacent TFSCs of this disclosure (a portion of the PCB view). FIG. 16B shows the PCB backside silver-coated copper interconnect pattern for TFSCs 1 and 2 in the array. The copper pattern here is shown for connecting the TFSCs in series to step up the module open-circuit voltage. FIG. 16B shows dimensions of $L_1'$ 202; peripheral emitter (n-region) connector linewidth W' 204 (in one embodiment, 2 to 10 millimeters); spacing between the center base (p-region) connector plate and the peripheral emitter (n-region) connector line S' 206 (in one embodiment, 100 microns to 1 millimeter). Note that $L_1'$ 202 is less than $L_1$ from FIG. 16A by roughly 2 to 10 millimeters. This enables larger peripheral emitter (n-region) connector linewidth and substantially reduced ohmic losses on the PCB backside.

The PCB assembly described above may be used to create the final solar module assembly in a number of ways (with or without a frame, with or without top tempered glass, etc.).

FIG. 17 shows a cross-sectional view 210 of a solar module (solar panel) structure with a protective back plate 212 made of a proven prior art material (e.g., Tedlar or polyvinyl fluoride film); a rear encapsulant layer 214 (EVA), a 2-sided printed-circuit board (PCB) 216 of this disclosure with rear patterned electrical interconnects 218 and top patterned electrical interconnects 220; cell rear mirrors (if applicable for instance, for single-aperture cells with integrated rear mirrors) and TFSCs 222 with rear base and wrap-around (or wrap-through) emitter contacts mounted on the frontside of the PCB, a top encapsulate layer (EVA) 224, and an anti-reflection-coated (ARC) tempered glass (in one embodiment, textured tempered glass) 226 (from rear to top), with greater than 98% transmission, with sputtered or sprayed or liquid-coated anti-reflection coating). This module structure may be assembled as a hermetically sealed package either as a frameless module or with a frame (e.g., made of aluminum). In one embodiment, the module assembly is a frameless assembly (also for reduced materials energy content and reduced energy payback time).

FIG. 18 illustrates a first embodiment of a process flow 230 for fabrication of solar modules with top protective glass plates and embedded PCBs of this disclosure (corresponding to the solar module structure of FIG. 17 with a PCB and a TFSC mounted on the PCB). This manufacturing flow is compatible with a fully automated module assembly line. This module assembly flow is based on the use of a double-sided printed-circuit board (PCB) with the cell rear mirrors/base interconnects on the PCB topside (silver-coated patterned copper on the PCB topside). For hexagonal-prism 3-D TFSCs with rear base layers and integrated/embedded (or attached) rear mirrors fabricated prior to module assembly (e.g., hexagonal-prism cells with rear base layers and thin-film rear mirrors deposited on the rear surfaces of the rear base layers using PVD or plating or roller coating/spray coating and curing), the patterned PCB copper layer does not have to be coated with a high-reflectivity mirror material (silver). In step 232, module assembly starts with a double-sided PCB coated with copper foils on both frontside and backside. The PCB area should support the desired number/layout of TFSCs (e.g., $\geq 1$ m$^2$, with a copper foil thickness on each side of roughly 10 to over 100 microns). Step 234 involves PCB interconnect patterning and silver flash coating (the latter if needed for PCB rear mirror). The PCB frontside and backside copper foils are patterned according to the desired frontside and backside interconnect layouts. Copper patterns are flash coated with a thin layer of highly reflective silver (and/or aluminum). A highly reflective diffuse mirror may be used, though a specular mirror may also be used. Step 236 involves cell preparation for automated TFSC placement and soldering. The rear hexagonal metallized side of the TFSCs is roller coated (or spray coated or dip coated) with lead-free solder or an electrically conductive and thermally-conductive epoxy paste. For cells fabricated using a honeycomb-prism TFSC substrate without a rear flat silicon base layer, the rear metallized hexagonal-prism ridges are coated to a vertical height of roughly 2 to 20 microns depending on the hexagonal prism unit cell dimensions. For single-aperture cells fabricated using honeycomb prism TFSC substrates with a rear flat silicon base layer, only the hexagonal base interconnect ridges are coated. For single-aperture cells fabricated using honeycomb prism TFSC substrates with a rear flat silicon base layer and an integrated rear base mirror, the coating may cover the entire rear base mirror bottom surface if desired. Step 238 involves automated TFSC placement and soldering (or curing of epoxy). TFSCs are automatically picked and placed in a closely-packed array on the frontside of the PCB. The rear side of each cell sits on its designated site on the frontside of the double-sided PCB with patterned copper interconnects. The TFSC rear hexagonal prism base interconnect is soldered to the PCB frontside silver-coated patterned copper islands using thermal or ultrasonic soldering. In case of using epoxy instead of solder, the epoxy layer is cured using thermal and/or IR/UV curing. The protective thin-film shunt diodes are mounted and soldered (or epoxied) on the PCB backside. An optional step is to flash coat the metal regions with a thin layer of highly reflective silver. Step 240 involves final solar module assembly and lamination. A stack of low-reflection tempered (in one embodiment, also textured) top glass, an encapsulant layer, the cell-mounted PCB, another encapsulant layer and a Tedlar or polyvinyl fluoride back sheet is prepared. Next, the module stack assembly is hermetically sealed and packaged, for instance, using vacuum-pressure lamination.

FIG. 19 shows a cross-sectional view 240 of another embodiment of a solar module structure. Instead of a top encapsulate layer (EVA) 224, and an anti-reflection-coated (ARC) tempered glass 226, as shown in FIG. 17, there is a single frontside protective layer and anti-reflective coating layer 242. The frontside protective layer and anti-reflective coating (ARC) layer 242 is formed by liquid spray coating/curing, liquid roller coating/curing, liquid-dip coating/curing, plasma spray coating, or another suitable low-temperature coating technique. This frontside protective coating and ARC layer 242 is effectively textured for the coating layer as deposited as a result of the 3-D structure of the TFSCs (thus, no separate texturing process is needed). This is due to the fact that the coating layer may have dips (low points) over the TFSC hexagonal-prism cavities and peaks (high points) over the hexagonal-prism emitter ridges. The frontside protective layer and anti-reflective coating layer 242 may have a combined thickness in the range of tens to hundreds of microns. In one embodiment, the thickness may be approximately 30 to 300 microns. In addition to providing an anti-reflection coating (ARC) function, the stacked frontside protective/ARC layer provides excellent protection against weather/elements and force impact (e.g., hail impact) in actual outdoor field operation. Since the frontside coating is effectively and automatically textured as a result of the 3-D structure of the TFSCs, the use of a separate ARC layer on the frontside coating is optional. The textured coating may provide effective light trapping in the frontside coating for effective coupling of a very high fraction (e.g., greater than 95%) of the incident solar light intensity to the TFSCs. The frontside protective layers may also provide an optical waveguiding function to eliminate or reduce any reflection losses associated with the top emitter contact metallization.

FIG. 20 outlines an alternative embodiment of an assembly process flow 250 for fabrication of reduced cost and reduced weight (lightweight) solar modules (corresponding to the solar module structure of FIG. 19). This flow is compatible with a fully automated module assembly. This process flow shows the assembly process without the use of a thick glass plate (thus, further reducing the weight, cost, and energy payback time of the solar modules of this disclosure) and without an EVA encapsulant layer on the top of the cells. The module topside (the frontside of assembled cells) is covered with a hard protective glass-type layer (if desired, also including a top ARC layer) with a combined thickness on the order of tens to hundreds of microns. As deposited, this frontside protective layer is effectively textured as a result of the 3-D structure of the TFSCs. The top layer may be formed by a liquid coating technique (e.g., spray coating, liquid-dip coating, or roller coating) following by a thermal or UV curing process. The thermal (or UV) cure for the liquid-spray-coated (or liquid-dip coated or roller coated) protective/AR layers may be performed as a single step together with the vacuum-pressure thermal lamination process. This embodiment results in a lightweight module assembly with reduced materials consumption, reduced cost, and reduced energy payback time. Step 252 (providing PCB) corresponds to step 232 in FIG. 18; step 254 (PCB patterning and silver flash coat) corresponds to step 234; step 256 (cell preparation) corresponds to step 236; and step 258 (automated TFSC placement) corresponds to step 238. Step 260 involves solar module lamination. A stack of the cell-mounted PCB, an encapsulant layer, and a back sheet is prepared. Next, a suitable hermetic sealing/packaging process such as vacuum-pressure lamination is performed. Step 262 involves deposition of the solar module frontside protective coating (which may be automatically textured as deposited and provides efficient light trapping for effective coupling to the TFSCs) layer and an optional ARC layer. The frontside of the solar panel is coated with a thin layer of protective material (e.g., a glass-type transparent material) and an optional top anti-reflection coating (ARC) layer using a suitable coating method. This coating (roughly tens to hundreds of microns) may be performed using liquid spray coating, liquid roller coating, liquid-dip coating, plasma spray coating or another suitable method. Next, a thermal/UV curing process is performed.

The hexagonal-prism 3-D TFSCs of this disclosure (both the single-aperture and dual-aperture cells with and without the rear base layers) are inherently bifacial. The hexagonal-prism 3-D TFSCs of this disclosure (particularly hexagonal-prism cells without rear base layers) are uniquely suited for aesthetically appealing solar glass modules with uniform controlled light transmissivity for building façade applications. The hexagonal-prism 3-D TFSCs of this disclosure (the designs without rear base layers and without rear mirrors) provide very uniform partial sunlight transmissivity through the cells. The average level of sunlight transmissivity may be set by adjusting the prism unit cell aspect ratio (higher prism aspect ratios reduce the average sunlight transmissivity through the cells).

FIG. 21 shows the schematic cross-sectional view 270 of a solar glass assembly using the hexagonal-prism TFSCs of this disclosure for building façade (architectural solar glass) applications. This is an embodiment of solar module assembly of this disclosure wherein the semi-transparent versions of the hexagonal-prism TFSCs of this disclosure (primarily the dual-aperture cells without rear base layers and without rear mirrors) are used for partially transparent solar glass modules for building façade applications. This example shows the semi-transparent hexagonal-prism cells 272 (the version without the rear base layer and without the rear mirror such that it provides some level of sunlight or diffuse daylight transparency through the cell from frontside or outdoors through the cell backside, to allow a portion of the incident sunlight/daylight through the cell) mounted within a dual-pane argon-filled (gas-filled) low-E glass assembly. The partially transparent TFSCs of this disclosure are closely packed and placed on the lower glass plate 274 (the glass plate facing the building indoors) which is coated with an optically transparent (or semi-transparent) patterned cell interconnect layer 276 to connect the cells in the solar glass in electrical series. The patterned cell interconnect layer 276 may be made of a transparent conductive oxide (TCO) such as Indium Tin Oxide (ITO), a thin semi-transparent layer of silver, or a combination thereof. The top glass plate 278 shown here may face the façade outdoors while the lower glass plate 274 (the one with the patterned transparent/semi-transparent interconnect 276 formed on its inner surface) may face the building indoors. There is a sealed argon-filled space 280 between the glass plates 274 and 2008. Further, there is a sealing/support window frame 282 shown. This design allows for a very uniform level of partial light transparency through the dual-pane solar glass module, thus, providing an aesthetically appealing solar glass design for architectural solar glass applications. The level of partial transparency may be set by the hexagonal-prism cell geometrical parameters such as the unit cell hexagonal aperture size and the unit cell aspect ratio H/d. The level of partial light transparency may be increased by reducing the unit cell aspect ratio H/d and/or by increasing the unit cell aperture diagonal dimension d (see FIGS. 132 and 190). Conversely, the level of partial light transparency may be lowered by increasing the unit cell aspect ratio H/d and/or by decreasing the unit cell aperture diagonal dimension d. Moreover, it is possible to use a partially transparent rear mirror layer (in one embodiment, a thin silver layer formed on the glass plate to form a diffuse partial rear mirror) as part of the patterned cell interconnect formed on the glass plate holding the attached cells. The partially reflecting/partially transparent rear mirror increases the effective cell conversion efficiency, while reducing the partial light transmissivity through the solar glass assembly.

FIG. 22 shows another view 290, which is an enlarged, alternative view of a portion of the solar glass module assembly shown in FIG. 21 for building façade applications. This FIGURE has a magnified view of a portion of the solar glass with the hexagonal-prism cells (thus, the relative dimensions of the hexagonal prism cell and the solar glass are not shown to scale). FIG. 22 shows frontside TFSC hexagonal emitter interconnects 292 and self-aligned backside hexagonal base contact 294. The distance 296 between the top glass plate 278 and bottom glass plate 274 may be between 1 and 12 millimeters. The hexagonal-prism cell parameters may be designed to allow for a desired level of light transmission through the cell (e.g., roughly 10% to 90%). The level of average light transmissivity can be controlled by the aspect ratio of the TFSCs.

FIG. 23 shows a view 300 of a representative patterned semi-transparent or transparent electrically conductive layer 276 used for connecting the honey-comb-prism TFSCs placed within the solar glass assembly in series (such as a transparent conductive oxide—TCO including indium-tin-oxide or ITO layer, or a thin semi-transparent layer of silver, or a combination thereof; which may also include a partially transparent cell rear mirror made of a suitable material such as an ultrathin semitransparent layer of silver) formed on a glass plate 302 such as the lower glass plate 274 of FIG. 21. This example shows connection of 6×4=24 TFSCs in series within a solar glass module assembly. Of course, a similar patterning methodology may be used for connecting any number of TFSCs in series, or in a combination of series/parallel configuration within the solar glass assembly. Series connection of all the cells within a solar glass module assembly is a preferred electrical connection method (in order to step up the solar glass output voltage, while maintaining the solar glass module current at the TFSC current level). This pattern also shows the output electrical leads 304 of the solar module (solar glass) assembly. The solar glass power electrical leads 304 may be fed through the solar glass frame assembly via a junction box for electrical connections to the adjacent solar glass modules. Patterned IR mirror and cell interconnects 306 are visible to transparent light. The pattern of deposited thin film layer (or multiple layer structure) is formed by sputtering and/or plating. Note that the clear spaces shown between island and lines are typically smaller than those shown (FIGURE not to scale).

FIG. 24 shows an alternative embodiment of a module assembly process flow 310 for solar glass applications. This embodiment outlines fabrication of semi-transparent solar glass modules for building façade applications (corresponding to the solar module structures of FIGS. 21, 22, and 23). This solar glass module assembly flow is compatible with a fully automated solar glass module assembly. This flow shows the assembly process using a dual-pane low-E glass structure (other glass structures may be employed as well). This embodiment results in a lightweight solar glass module assembly with reduced materials consumption, reduced cost, and reduced module energy payback time. In step 312, solar glass manufacturing starts with a first glass plate which may serve as the indoors side of a low-E architectural glass assembly for building façade. The glass area may be in a range from less than one m$^2$ to several m$^2$ depending on the application. Step 314 involves formation of (semi)-transparent cell interconnect pattern on first glass plate. The glass plate is cleaned, and a patterned layer of optically transparent or semi-transparent electrically conducting layer is deposited to serve as the cell electrical interconnect plane. The patterned interconnect layer may be made of a transparent conductive oxide (TCO) such as Indium-Tin-Oxide (ITO), a thin semi-transparent layer of silver, or a combination thereof. The patterned layer may be formed by physical-vapor deposition (PVD) through a shadow mask or another suitable technique. Step 316 involves cell preparation for automated TFSC placement and attachment. The rear hexagonal metallized side of the TFSCs is roller coated with lead-free solder or an electrically conductive and thermally-conductive epoxy paste/liquid. For cells fabricated using a honeycomb-prism TFSC substrate without a rear flat silicon base layer, the rear metallized hexagonal-prism ridges are coated to a vertical height of roughly 1 to 20 microns depending on the hexagonal prism unit cell and base metal contact coverage dimensions. This process coats the base hexagonal array interconnects and the emitter wrap-around/wrap-through interconnects in preparation for cell placement and attachment. Step 318 involves automated TFSC placement and soldering (or curing of epoxy). TFSCs are automatically picked and placed in a closely-packed array on the glass plate surface with the patterned (semi)-transparent interconnects. The rear base sides of honeycomb-prism cells are placed on the glass plate. The TFSC rear hexagonal prism base interconnect is soldered (attached) to the patterned cell interconnect layer on glass using thermal or ultrasonic soldering. In case of using epoxy instead of solder, the epoxy is cured using thermal or UV curing. Step 320 involves automated solar glass/module assembly. In one embodiment, the solar glass module assembly is prepared in an atmospheric argon-filled automated assembly ambient by: mounting the glass plate with the attached cells onto a solar glass frame (e.g., a metallic frame such as aluminum frame with a peripheral seal); and attaching a glass plate (in one embodiment with an AR coating (ARC) layer) in parallel to and spaced apart (e.g., by roughly 1 to 30 millimeters) from the other glass plate (comprising the cells), to the solar glass frame such that the cells are confined within an argon-filled cavity formed between the two glass plates sealed by the metallic frame. This forms the low-E solar glass assembly with the cells confined and protected within the argon-filled cavity. The solar glass module frame also provides the electrical lead feedthroughs which are attached to the leads from the patterned interconnect. Module frame peripheral seals maintain the argon-filled cavity and prevent gas leakage.

One important consideration in the TFSC and module interconnects is the total power loss associated with the electrical interconnects in the TFSCs and the solar module assembly. The hexagonal-prism 3-D c-Si TFSC and PCB-based module designs of this disclosure effectively address this issue, resulting in very low interconnect ohmic losses in the cells and within the module. This feature (in conjunction with the highly efficient packing of the TFSCs on the PCB-based solar module assembly) substantially narrows the efficiency gap between the TFSCs and the solar module assembly in the technology of this disclosure.

The next section relates to the basic calculations of the emitter contact metallization ohmic losses in the hexagonal-prism 3-D TFSCs of this disclosure. The calculations of ohmic losses for emitter contact metallization are also applicable to the hexagonal base contact metallization. However, since several embodiments of this disclosure mount the hexagonal prism 3-D TFSCs on patterned printed circuit boards (PCBs), the base contact metallization is electrically connected in a planar format to a very high conductivity copper pad; this substantially reduces the base interconnect ohmic losses (compared to the emitter interconnect ohmic losses). Therefore, in practical embodiments of this disclosure, the interconnect ohmic losses are dominated by the emitter contact metallization.

FIG. 25 may be used for reference with an approximate analytical calculation of the TFSC interconnect ohmic losses, assuming a circular substrate with hexagonal-prism array of unit cells base on the cell design embodiments of this disclosure. Since the overall cell interconnect ohmic losses are dominated by the top emitter contact metallization, the ohmic power loss due to the hexagonal emitter contact metallization is calculated as a function of cell current at maximum power and emitter contact metal vertical height coverage ratio L/d (ratio of the height of emitter contact metal coverage on the prism sidewall to the prism unit cell long hexagonal diagonal dimension). The analytical calculations shown here were used to produce the plots shown in the following FIGURES (FIGS. 26-31). The calculations performed and trends obtained for round substrates are also approximately applicable to square-shaped TFSC substrates.

For the following calculations: $I_0$ is the total cell current at peak power; $R_{thm}$ is the sheet resistance of top hexagonal-coverage emitter contact metal; C is the effective flat surface coverage of hexagonal emitter contact metal with vertical height L; $R_{eff}=R_{thm}/C$, where $R_{eff}$ is the effective flat surface sheet resistance of top contact metal; $A=(\pi a^2)/4$; and $J_0=(4I_0)/(\pi a^2)$.

Interconnect Ohmic Losses @ Max Cell Power:

$$P_1 \cong (R_{eff}I_0^2)/(8\pi)$$

$$C=[(8\sqrt{3})/3](L/d)$$

$$R_{eff}=(\sqrt{3}/8)(d/L)R_{thm}$$

$$P_1 \cong (R_{thm}I_0^2)[\sqrt{3}/(64\pi)](d/L) \cong 8.62\times10^{-3}(R_{thm}I_0^2)(d/L)$$

FIGS. 26 through 31 show plots of the calculated hexagonal-prism 3-D TFSC interconnect (due to the dominant emitter contact metallization) ohmic losses versus L/d (ratio of the vertical coverage height of the emitter contact metal coverage on the prism sidewall to the long diagonal dimension of the hexagonal aperture of the hexagonal-prism unit cell), for various values of emitter contact metal sheet resistance ($R_{thm}$). Assuming a cell efficiency of 20%, a 200 mm×200 mm square-shaped cell based on one of the embodiments of this disclosure produces roughly 8 W of photogenerated power (AM1.5) and a cell current of roughly 12 A. Thus, in order to limit the maximum emitter contact metallization ohmic losses to roughly 1% of the peak photogenerated power of roughly 8 W, the ohmic power losses should be limited to 0.08 W.

Figure 26:
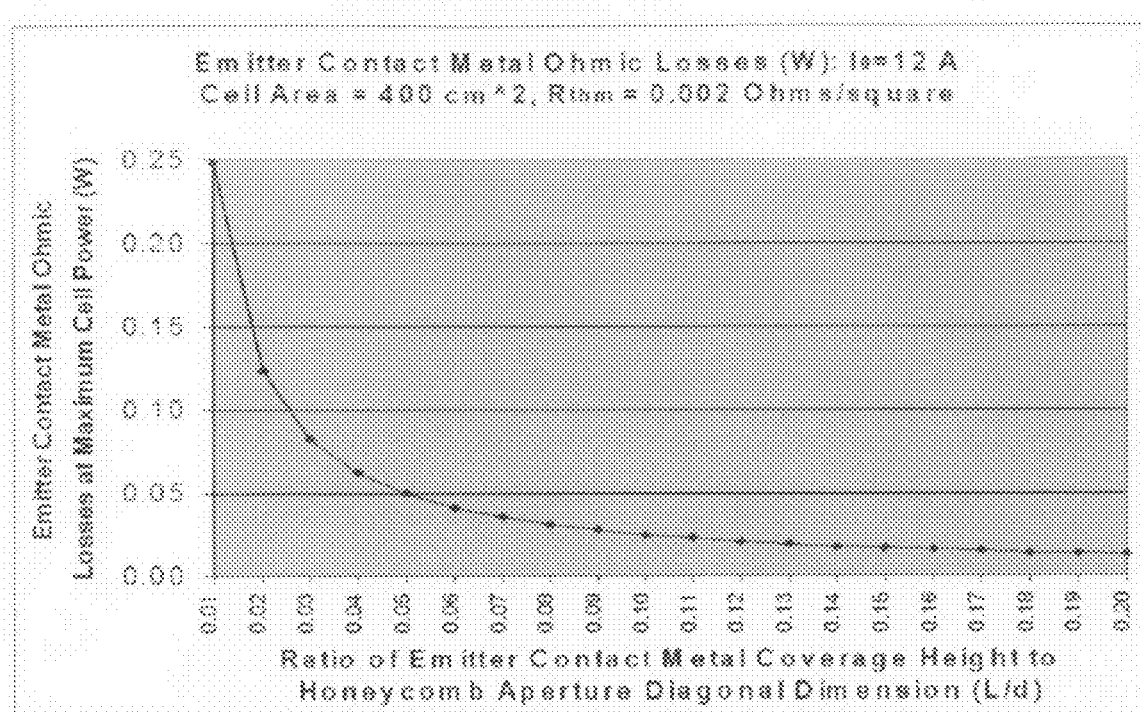

FIG. 26 shows the interconnect (emitter contact metallization) ohmic losses at maximum cell power (200 W/m$^2$) versus the ratio of emitter contact metal coverage height (coverage height of emitter contact metal on the prism unit cell sidewall) to hexagonal aperture diagonal dimension (L/d) for an emitter contact metal sheet resistance of $R_{thm}$=0.002 Ω/square (assuming a silver bulk resistivity of roughly 1.6 μΩ/square, this corresponds to an 8 microns thick silver layer used as the emitter contact metallization layer). In this case, L/d of more than 0.03 may meet the requirement of less than 1% interconnect ohmic losses (power loss less than 0.08 W). Thus, for d=150 microns, L≧4.5 microns may meet the negligible (<1%) interconnect power loss requirement. Similarly for d=300 microns, L≧9 microns may meet the less than 1% interconnect loss requirement.

Figure 27:
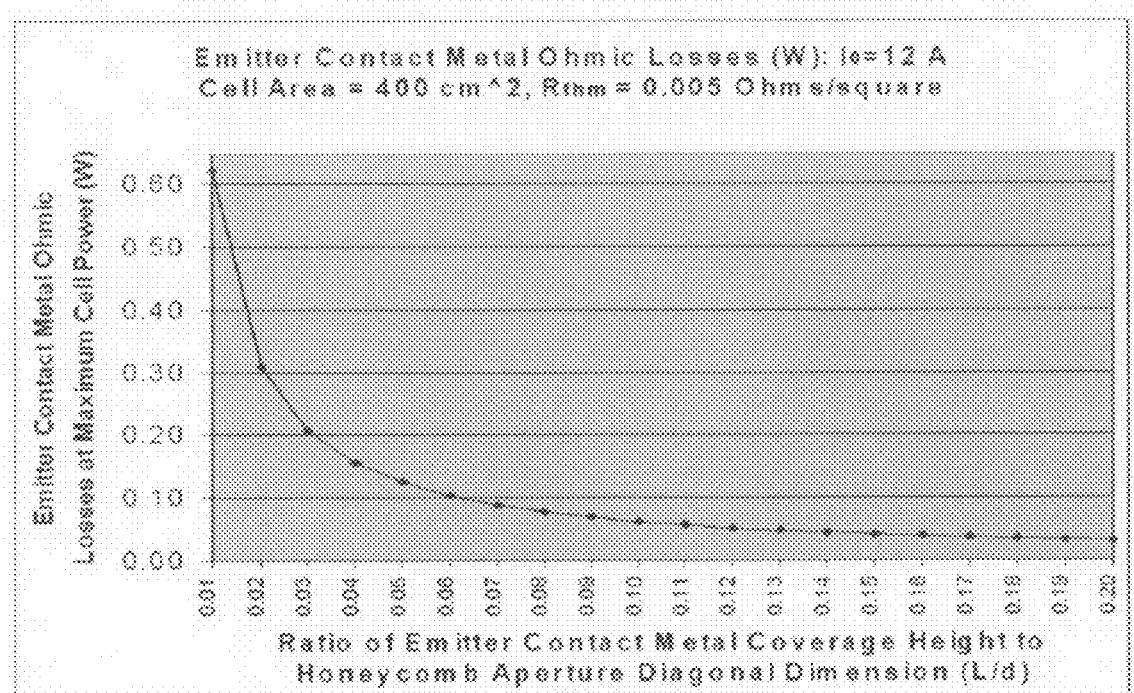

FIG. 27 shows interconnect (emitter contact metallization) ohmic losses at maximum cell power (200 W/m$^2$) versus the ratio of emitter contact metal vertical coverage height (coverage height of emitter contact metal on the prism unit cell sidewall) to hexagonal aperture diagonal dimension (L/d) for an emitter contact metal sheet resistance of $R_{thm}$=0.005 Ω/square (assuming a silver bulk resistivity of roughly 1.6 μΩ/square, this corresponds to a 3.2 micron thick silver layer used as the emitter contact metallization layer). In this case, L/d of more than 0.07 may meet the requirement of less than 1% interconnect ohmic losses (power loss less than 0.08 W). Thus, for d=150 microns, L≧10.5 microns may meet the negligible (<1%) interconnect power loss requirement. Similarly for d=300 microns, L≧21 microns may meet the less than 1% interconnect loss requirement.

Figure 28:
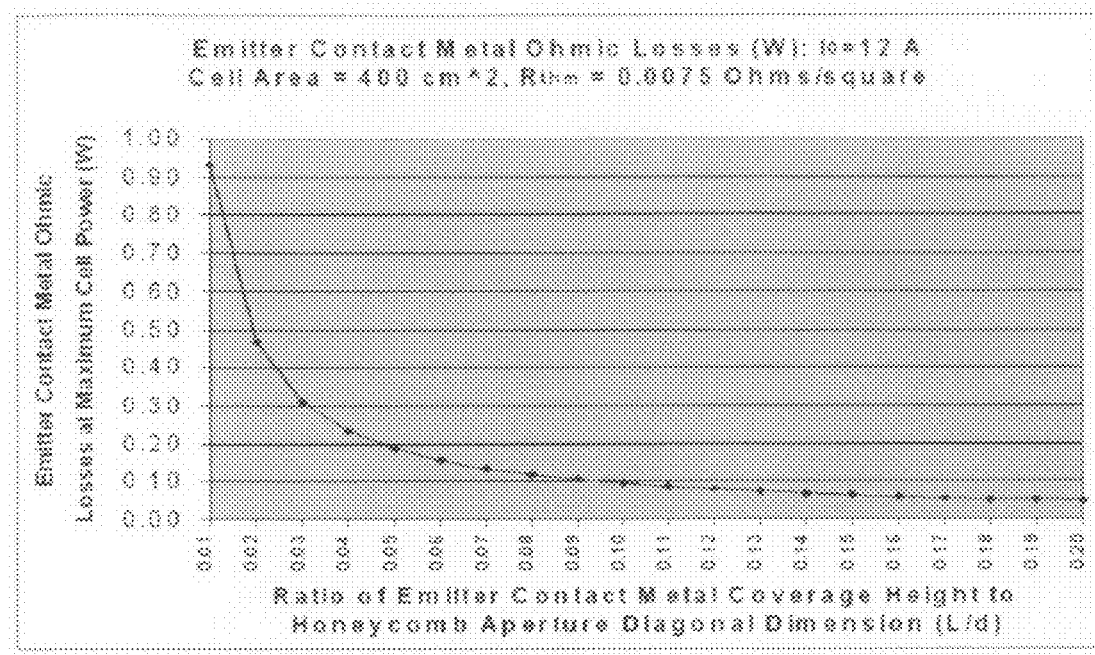

FIG. 28 shows interconnect (emitter contact metallization) ohmic losses at maximum cell power (200 W/m$^2$) versus the ratio of emitter contact metal coverage height (coverage height of emitter contact metal on the prism unit cell sidewall) to hexagonal aperture diagonal dimension (L/d) for an emitter contact metal sheet resistance of $R_{thm}$=0.0075 Ω/square (assuming a silver bulk resistivity of roughly 1.6 μΩ/square, this corresponds to a 2.1 micron thick silver layer used as the emitter contact metallization layer). In this case, L/d of more than 0.12 may meet the requirement of less than 1% interconnect ohmic losses (power loss less than 0.08 W). Thus, for d=150 microns, L≧18 microns may meet the negligible (less than 1%) interconnect power loss requirement. Similarly for d=300 microns, L≧36 microns may meet the <1% interconnect loss requirement. If the interconnect ohmic loss limit is raised to roughly 2% of the photogenerated power (i.e., 0.02× 8=0.16 W), L/d>0.06 may meet the requirement of less than 2% interconnect ohmic losses (power loss less than 0.16 W). Thus, for d=150 microns, L≧9 microns may meet this revised interconnect power loss requirement. Similarly for d=300 microns, L≧18 microns may meet the <2% interconnect loss requirement.

Figure 29:
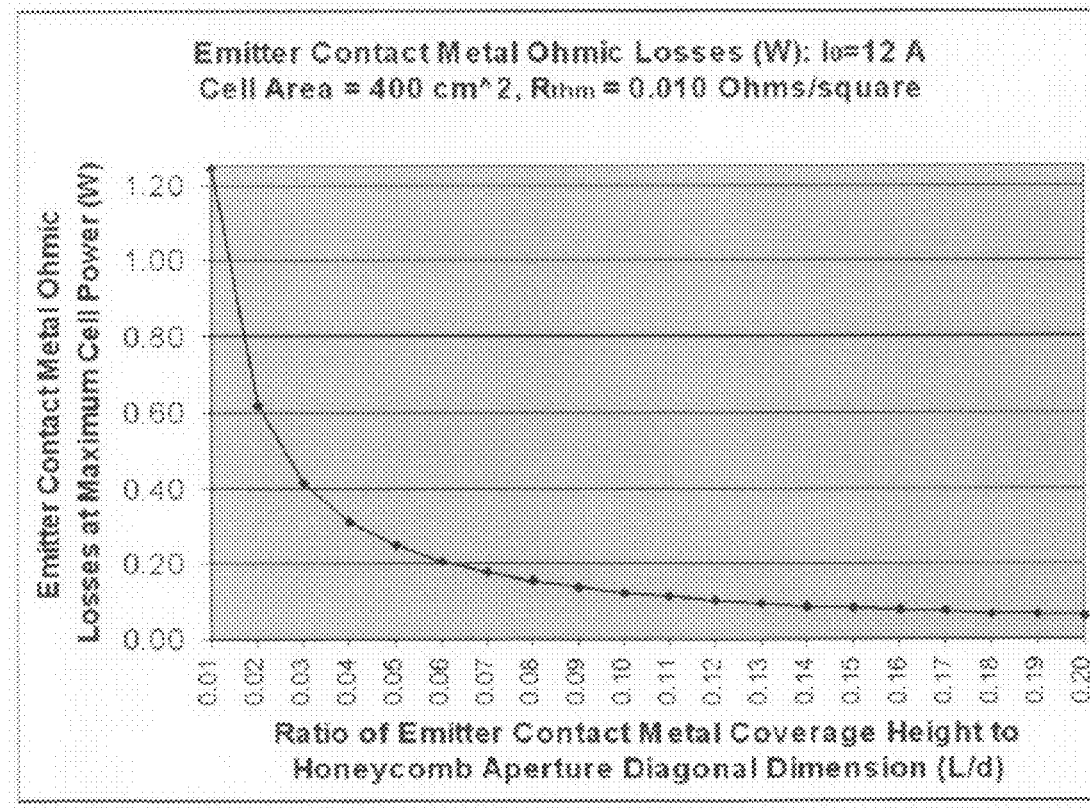

FIG. 29 shows the emitter contact metal ohmic losses at maximum cell power (200 W/m$^2$) versus the ratio of emitter contact metal coverage height (coverage height of emitter contact metal on the prism unit cell sidewall) to hexagonal aperture diagonal dimension (L/d) for $R_{thm}$=0.010 Ω/square (corresponding to a 1.6 micron thick silver layer used as the emitter contact metallization layer).

Figure 30:
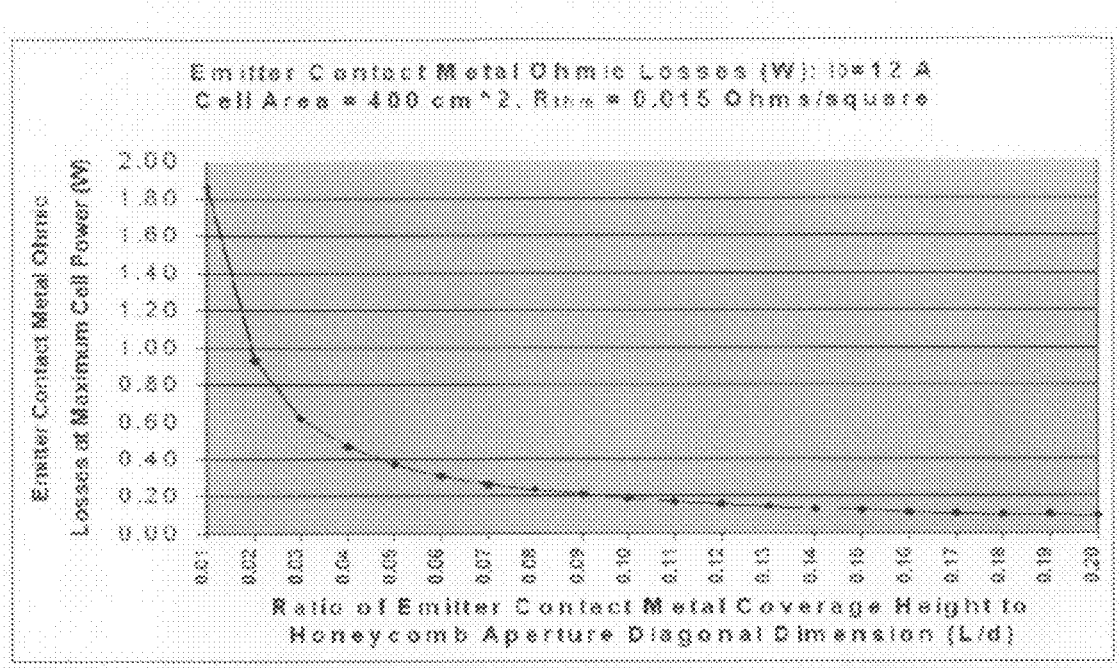

FIG. 30 shows the emitter contact metal ohmic losses at maximum cell power (200 W/m$^2$) versus the ratio of emitter contact metal coverage height (coverage height of emitter contact metal on the prism unit cell sidewall) to hexagonal aperture diagonal dimension (L/d) for $R_{thm}$=0.015 Ω/square (corresponding to a 1.07 micron thick silver layer used as the emitter contact metallization layer).

Figure 31:
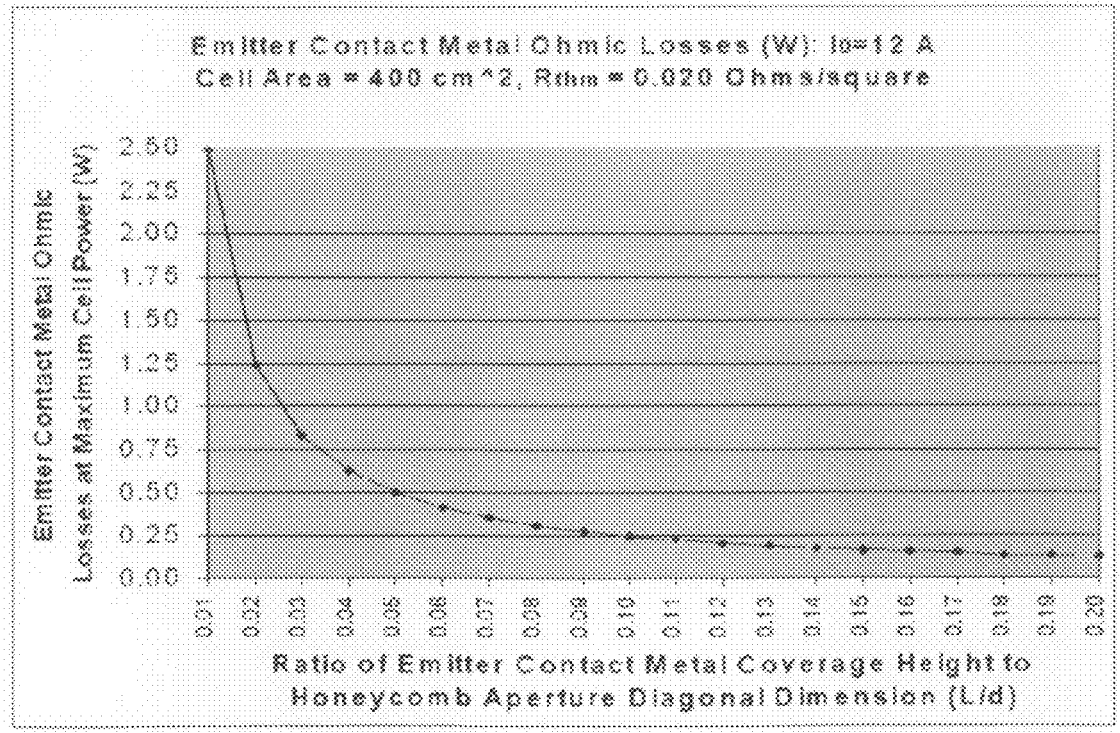

FIG. 31 shows the emitter contact metal ohmic losses at maximum cell power (200 W/m$^2$) versus the ratio of emitter contact metal coverage height (coverage height of emitter contact metal on the prism unit cell sidewall) to hexagonal aperture diagonal dimension (L/d) for $R_{thm}$=0.020 Ω/square (corresponding to a 0.8 micron thick silver layer used as the emitter contact metallization layer).

As shown in FIGS. 26 through 31, as the emitter contact metal (e.g., silver) sheet resistance is increased (or the emitter contact metal thickness is reduced), the vertical coverage of the emitter contact metal over the prism sidewall should be increased (as a fraction of the hexagonal prism unit cell aperture diameter) in order to maintain the interconnect ohmic losses below a pre-specified threshold value (e.g., less than 1%). In practice, the desired emitter contact metallization may comprise silver with a thickness on the order of 3 to 12 microns thick and with a vertical height coverage on the order of 5 to 20 microns.

As noted in FIG. 9, the first step in manufacturing a solar module assembly is the fabrication of a template.

In the following section, alternative embodiments of process flows for fabricating templates using either lithography and etch techniques or laser micromachining (or laser drilling) are described. The templates are then used and reused numerous times to fabricate the 3-D TFSC substrates with single-aperture or dual-aperture configurations (either with or without rear base silicon layers) for 3-D TFSC fabrication, which are then used in the formation of 3-D TFSCs, which are used in thin-film solar module assemblies of the disclosed subject matter.

Templates may be fabricated using electronic-grade silicon wafers, solar-grade silicon wafers, or lower-cost metallurgical-grade silicon wafers. Moreover, templates made of silicon can be fabricated either using monocrystalline or multicrystalline silicon wafers. The starting template wafer may either be a standard polished wafer (after saw damage removal) or even a lower grade wafer immediately after wire sawing (without saw damage removal). The latter may further reduce the cost of the templates. The relatively low cost of each template is spread over numerous 3-D thin-film TFSC substrates, resulting in much lower TFSC substrate and finished module costs compared to the standard state-of-the-art (e.g., 200 microns thick) solar-grade monocrystalline and multicrystalline silicon wafers and associated modules.

For further explaining how a template is fabricated, FIG. 32 shows an embodiment of a process flow 330. The process begins with step 332, where an unpatterned monocrystalline silicon or multicrystalline silicon, either square-shaped or round substrate (e.g., 200 mm×200 mm square or 200-mm round) is provided. The starting template wafer may be a wafer prepared by wire saw either with or without saw damage removal (the latter may further reduce the cost of template). The starting template wafer may also be made of a lower purity (and lower cost) metallurgical-grade silicon. In one embodiment, the substrate is roughly 200 to 800 microns thick. Optionally, step 332 includes performing gettering on a low-cost metallurgical-grade silicon and/or performing a surface texturing etch (e.g., using isotropic acid texturing by a mixture of nitric acid and hydrofluoric acid, or using alkaline texturing in KOH/IPA) to create an optional textured template surface. Step 334 uses photolithography patterning (in one embodiment, using a lower cost contact or proximity aligner/ patterning) to produce a prism-array mask pattern such as hexagonal-array pattern in photoresist (i.e., interconnected hexagonal openings in the photoresist layer). The process sequence includes the formation of an oxide and/or nitride (optional) layer, photoresist coating (e.g., spin-on or spray coating) and pre-bake, photolithography exposure through a hexagonal-array mask, and photoresist development and post-bake. One embodiment includes a hard mask layer ($SiO_2$ and/or $SiN_x$; for example, a thin thermally grown oxide layer can be used as an optional hard mask) below the photoresist (although the process may be performed without the use of any hard mask layer by placing the photoresist coating directly on silicon). When using a hard mask layer, the exposed portions of the hard mask layer are etched after photoresist patterning (thus, forming hexagonal openings). Such etching of the exposed hard mask layer may be simply performed using a wet etchant such as hydrofluoric acid for oxide hard mask. Step 336 involves formation of hexagonal prisms using anisotropic plasma etch; where a high-rate deep reactive ion etch (DRIE) process forms a closely-packed array of deep (e.g., 100 to 400 microns) hexagonal-shaped trenches in silicon. The photoresist and/or oxide and/or nitride hard mask layer(s) are used for pattern transfer from the patterned photoresist layer to silicon. In one embodiment, the deep RIE (DRIE) process parameters are set to produce near-vertical, slightly tapered hexagonal-prism trench sidewalls. In an alternative embodiment, the deep RIE (DRIE) process parameters are set to produce roughly or essentially vertical hexagonal-prism sidewalls. Note that the slightly tapered sidewalls are preferred over the essentially vertical sidewalls. Step 338 involves template surface preparation and cleaning. This process includes stripping the patterned photoresist layer from the substrate. The template substrate is then cleaned in a wet bench prior to subsequent thermal deposition processing to form the TFSC substrates. Such cleaning may involve DRIE-induced polymer removal (using a suitable wet etchant such as a mixture of sulfuric acid and hydrogen peroxide) followed by an isotropic silicon wet etch (such as in a mixture of nitric acid and hydrofluoric acid) in order to isotropically remove a thin layer (e.g., on the order of 10 to 500 nanometers) of silicon from the trench sidewalls and bottoms. This may remove any surface and buried contaminants, such as any surface and embedded metallic and/or polymeric/organic contaminants introduced by the deep RIE (DRIE) process, from the sidewalls and bottoms of the DRIE-produced template trenches. Template processing may complete after a deionized (DI) water rinse and drying. Optionally and if desired, the template wafer may also go through a standard pre-diffusion (or pre-thermal processing) wafer cleaning process such as a so-called RCA wet clean prior to the above-mentioned DI water rinsing and drying. Another optional surface preparation step (either performed instead of or after the wet isotropic silicon etch process) includes performing a short thermal oxidation (e.g., to grow 5 to 100 nanometers of sacrificial silicon dioxide), followed by wet hydrofluoric acid (HF) oxide strip (to remove any residual contaminants from the patterned template). If no optional oxide growth/HF strip is used, an optional dilute HF etch may performed to remove the native oxide layer and to passivate the surface with hydrogen (forming Si—H bonds) in preparation for subsequent 3-D TFSC substrate fabrication. After the completion of step 338, the resulting template may then be used and reused multiple times to fabricate 3-D (e.g. hexagonal-prism) thin-film TFSC substrates.

FIG. 33 shows a top view of a lithography exposure mask design 340 which may be used for fabrication of a template, as described in step 334 of process flow 330 above. Dark regions 342 are an opaque coating such as Cr on a transparent mask plate. Light regions 344 are areas where the opaque coating (e.g., Cr) has been etched to allow for exposure of a photoresist layer. In one embodiment, the width of the hexagonal line ($L_M$) 346 on the mask plate is between 1 and 30 microns, and the diagonal distance between hexagonal prism points (d) 348 or the hexagonal-prism aperture diameter is between 50 and 500 microns.

Figure 34:
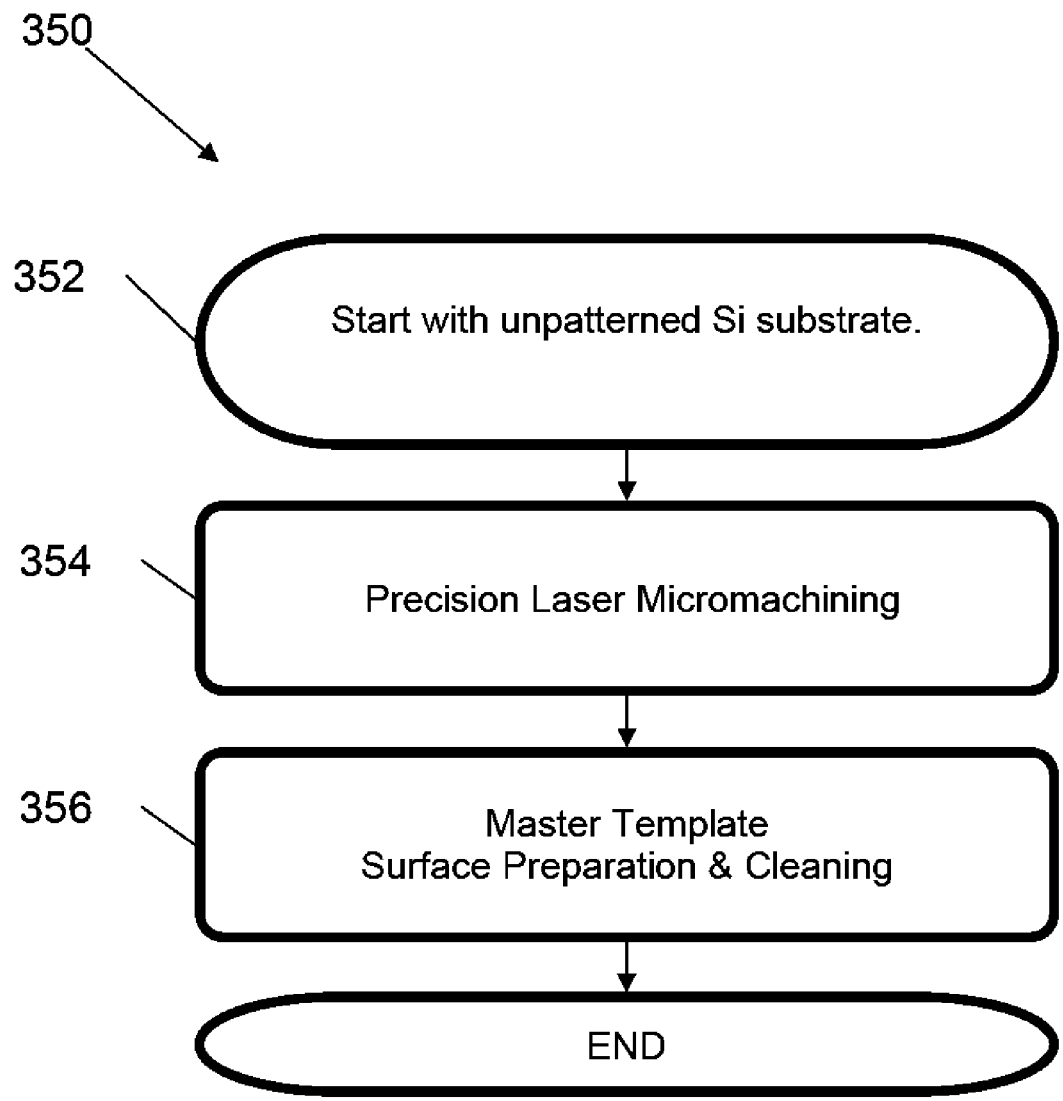

An alternative embodiment of a process flow 350 for patterning of a template is outlined in FIG. 34, which uses direct laser micromachining instead of photolithography and reactive-ion etch. Step 354 (providing an unpatterned substrate) corresponds to step 332 of FIG. 32. Step 354 involves the use of programmable precision laser micromachining to form the desired periodic array of deep trenches. This process may be performed in a controlled atmospheric ambient based on either physical ablation or a combination of physical ablation and laser-assisted chemical etching. Step 356 (surface preparation and cleaning) corresponds to step 338 of FIG. 32. After the completion of step 356, the resulting template may then be used and reused to fabricate multiple 3-D TFSC substrates.

Figure 35:
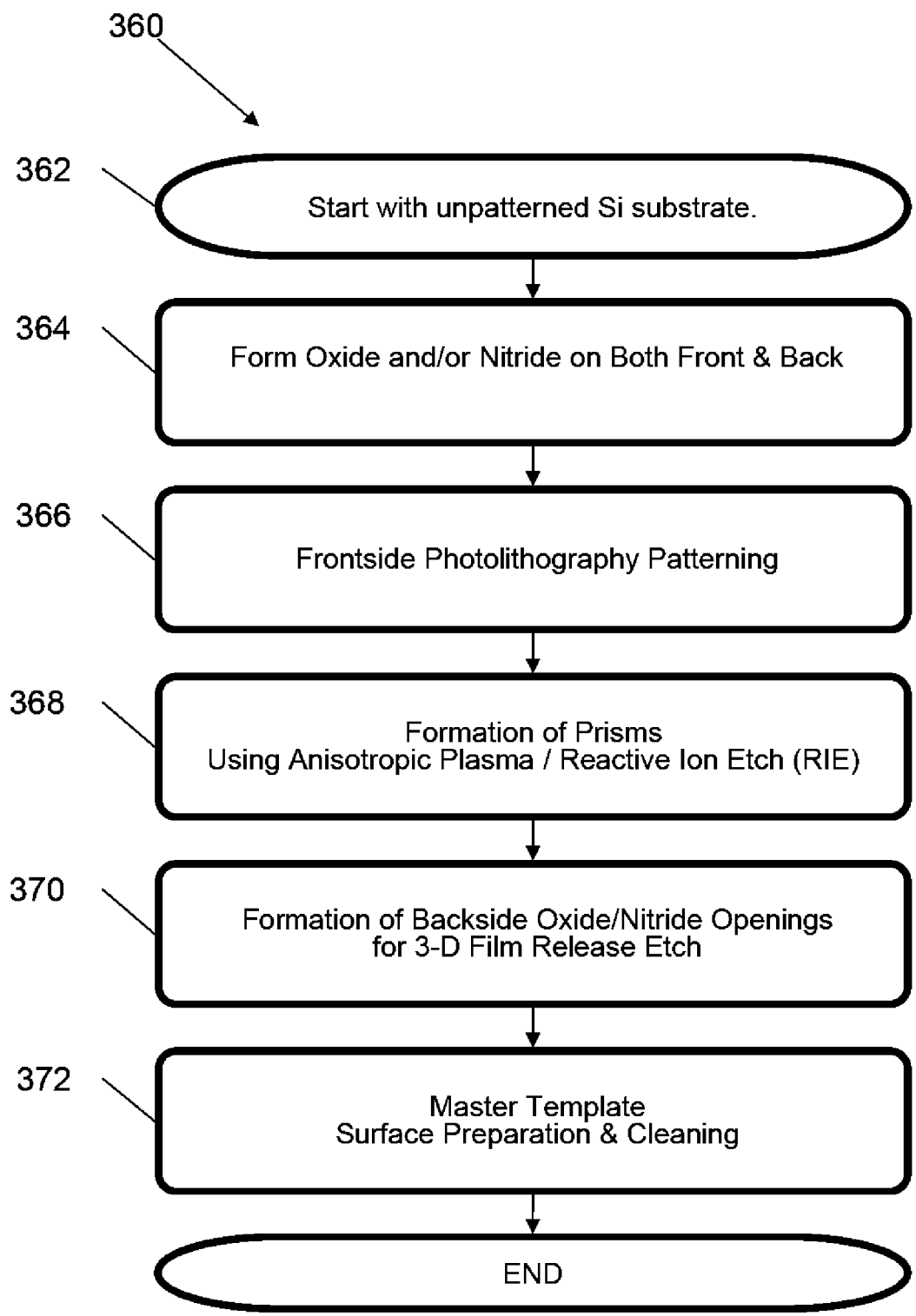

Another alternative embodiment of a process flow 360 for patterning of a template is outlined in FIG. 35, which uses photolithography and etch to produce through-wafer trenches. Step 362 (providing an unpatterned substrate) corresponds to step 352 in FIG. 34. Step 364 involves forming a silicon dioxide ($SiO_2$) layer and/or a silicon nitride ($SiN_x$) layer on both the frontside and backside of the substrate (this step is optional and may not be used). In one embodiment, the $SiO_2$ layer thickness is between 100 and 1000 nanometers. The $SiO_2$ layer is formed by steam oxidation or LPCVD and may be followed by a layer of $SiN_x$ formed by LPCVD or PECVD. In one embodiment, the $SiN_x$ layer thickness is between 100 and 1000 nanometers. These layers may be formed on both sides of the silicon substrate (as shown in FIG. 34), or only on the substrate frontside or backside. Alternatively, only one layer (either oxide or nitride) may be used. Step 366 (patterning) corresponds to step 334 in FIG. 32; and step 368 (etch) corresponds to step 336. Step 370 involves formation of backside oxide/nitride openings for 3-D TFSC substrate release etching. Photoresist lithography patterning and plasma etch (or wet etch) are used to form a regular array of openings (e.g., a square grid or a line pattern) in oxide/nitride on the substrate backside. These openings may be used during subsequent 3-D TFSC substrate fabrication (for wet etchant access to sacrificial layer from backside). Step 372 (surface preparation and cleaning) corresponds to step 338 in FIG. 32 and may be modified such that the surface preparation and cleaning process does not remove the dielectric layers from the substrate backside. After step 372, the resulting template may then be used to fabricate 3-D TFSC substrates.

Another alternative embodiment of a process flow 380 for fabrication of a template is outlined in FIG. 36, which uses photolithography and etch, enabling fabrication of TFSC substrates with a rear base layer and grooves for formation of self-aligned base contacts. Another alternative embodiment of a process flow 400 for patterning of a template is outlined in FIG. 37, which uses photolithography and etch, enabling fabrication of TFSC substrates with a rear base layer and grooves for formation of self-aligned base contacts. FIGS. 41 through 47 show the Y-Y cross-sectional views of a silicon substrate during the fabrication process flow for making a template based on the process flows of FIG. 36 or FIG. 37. It may be useful to refer to FIGS. 41 through 47 while reviewing the process flow steps of FIGS. 36 and 37.

Referring to FIG. 36, step 382 (providing an unpatterned substrate) corresponds to step 362 in FIG. 35; step 384 (forming oxide and/or nitride layers) corresponds to step 364; step 386 (patterning) corresponds to step 366; and step 388 (etch) corresponds to step 368. Step 390 involves formation of self-aligned shallow trenches which are wider than deep trenches. The self-aligned wider shallow surface trenches are formed by a timed selective isotropic dielectric (hard mask) etch to form hard mask undercuts with known lateral dimension under photoresist, stripping patterned photoresist, and a timed anisotropic silicon RIE to form shallower/wider tapered trenches near surface. Step 392 (formation of backside openings) corresponds to step 370 in FIG. 35; and step 394 (surface preparation and cleaning) corresponds to step 372. After step 394, the resulting template may then be used and reused to fabricate multiple 3-D TFSC substrates. It should be noted that the self-aligned wider shallow trenches (which are wider than the deep trenches) may also be formed as part of the same deep RIE process which forms the deep trenches (i.e., steps 388 and 390 can be merged into a single deep RIE process in a DRIE process equipment), thus, eliminating the need for the above-mentioned timed selective isotropic dielectric hard mask etch to form hard mask undercuts under photoresist (this modified approach may also eliminate the need for the frontside hard mask (i.e., the patterned photoresist layer can be formed directly on the substrate) and further simplify the template fabrication process). This simplified process can be performed by using a DRIE process recipe which first forms the deep hexagonal-prism trenches and subsequently forms the shallow wider trenches (or shoulders) over the deep trenches by performing a less anisotropic (or more isotropic) silicon etch process which primarily affects the upper (topmost) portion of the deep hexagonal-prism trenches. Using this modified approach the sidewall profile of the wider shallow trenches may be slightly or heavily tapered (both are acceptable).

Referring to FIG. 37, step 402 (providing an unpatterned substrate) corresponds to step 382 in FIG. 36. Step 404 involves forming a $SiO_2$ layer and/or a $SiN_x$ layer on the frontside and optionally on the backside of the substrate. In one embodiment, $SiO_2$ layer thickness is between 100 and 1000 nanometers. The $SiO_2$ layer is formed by steam oxidation or LPCVD followed by a layer of $SiN_x$ formed by LPCVD or PECVD. In one embodiment, the $SiN_x$ layer thickness is between 100 and 1000 nanometers. The layers are formed either on front or both sides of the silicon substrate. Alternatively, only one layer (oxide or nitride) may be used. Alternatively, a $SiO_2$ layer only on the frontside and a $SiN_x$ layer only on backside may be formed. Step 406 (patterning) corresponds to step 386 of FIG. 36; step 408 (etch) corresponds to step 388; and step 410 (formation of shallower wider trenches) corresponds to step 390. Again and essentially as described for FIG. 36, the self-aligned wider shallow trenches (which are wider than the deep trenches) may also be formed as part of the same deep RIE process which forms the deep trenches (i.e., steps 408 and 410 can be merged into a single deep RIE process in a DRIE process equipment). Step 412 involves formation of an array of openings on the wafer backside of sufficient depth to connect to at least some portions of the rears (bottoms) of the deep trenches. These openings provide access to at least a portion of each prism unit cell from the substrate backside. These holes are formed by laser drilling (or may be formed using backside lithography and wet or plasma etch) and may be used for 3-D thin-film TFSC substrate release etching (for etchant access to sacrificial layer such as for etching the sacrificial porous silicon layer). Step 414 (surface preparation and cleaning) corresponds to step 394 of FIG. 36. After step 414, the resulting template may then be used and reused to fabricate multiple 3-D TFSC substrates.

FIGS. 36 and 37 result in templates which enable subsequent fabrication of 3-D thin-film TFSC substrates with rear base layers (e.g., such as flat rear silicon base layers) and interconnected shallow grooves or trenches for formation of self-aligned high-conductivity base contact metallization. These 3-D thin-film TFSC substrates may be used for subsequent fabrication of high-efficiency TFSCs with self-aligned base and emitter contacts. The dual-width trenches (or deep trenches with shallower and wider trench shoulders stacked on their top) in the template enable fabrication of self-aligned base metallization contacts beside self-aligned emitter metallization contacts.

In order to better understand the following FIGURES, FIG. 38 is provided to show a top view of a hexagonal prism 3-D TFSC substrate. FIG. 38 shows the reference imaginary Y-Y and Z-Z cross-sectional axes on a hexagonal-prism 3-D TFSC substrate.

FIG. 39 shows a Y-Y cross-sectional view of a template 420 with through-wafer trenches 422 (i.e., trenches formed through the substrate and stopped on backside dielectric). This template 420 may be used to fabricate numerous hexagonal-prism 3-D TFSC substrates, including those without rear base layers (i.e., dual-aperture TFSC substrates).

The template 420 has dimensions of h (horizontal distance between trenches) 424, $T_{st}$ (trench top width) 426, H (height of the trench) 428, $T_{sb}$ (trench rear width) 430, and 2θ 432 (where θ is the average sidewall taper angle). Note that because these are through-wafer trenches 422, H 428 is essentially the same as the silicon thickness of the template substrate. Because the through-wafer trenches 422 produce isolated posts, backside dielectric layer 434 is used and should be sufficiently thick and strong to provide sufficient mechanical support. Backside dielectric layer 434 may be a single dielectric layer such as oxide (or nitride) or a stack of two or more dielectric layers such as oxide/nitride. In one embodiment, backside dielectric layer 434 is composed of a layer of LPCVD $Si_3N_4$ on top of a layer of thin thermal $SiO_2$. The template 420 contains a frontside etch-stop layer 436 (top hard mask layer). In one embodiment, the top hard mask 436 is composed of a layer 436 of LPCVD $Si_3N_4$ on top of a layer 438 of thin thermal $SiO_2$. Alternatively, the top hard mask layer 436 may include a single layer instead of a 2-layer stack (e.g., $Si_3N_4$, $SiC_x$, etc.). Alternatively, there may be no top hard mask layer (patterned photoresist formed directly on silicon).

FIG. 40 shows a Y-Y cross-sectional view of a template 440 with in-wafer trenches 442. This template 440 may also be used to fabricate numerous hexagonal-prism 3-D thin-film TFSC substrates, including those without rear base layers (i.e., dual-aperture TFSC substrates). The trenches 442 are confined within the wafer (within the template substrate) and do not penetrate the entire wafer thickness, leaving remaining wafer thickness R 444; note that for a given template substrate thickness, H 446 is less than H 428 in FIG. 39. Thus, the wafer itself provides sufficient mechanical support without a need for mechanical support from backside dielectrics (thus, eliminating the need for backside dielectrics; backside dielectrics are optional here).

The trenches formed in the templates shown in FIGS. 39 and 40 may have vertical sidewalls or slightly tapered sidewalls (in one embodiment, producing deep trenches with gradually and slightly decreasing trench width moving from the trench top towards the trench bottom). In one embodiment, sidewall angles are in the range of 0° to 10° (preferably in the range of 0° to 1°). Trenches with negative or re-entrant sidewall angles (i.e., trenches with increasing trench width moving from the trench top towards the trench bottom) are not desirable and may cause difficulty with 3-D TFSC substrate release and, therefore, should be avoided.

Both template 420 (FIG. 39) and template 440 (FIG. 40) are made using one of the template process flows outlined in FIGS. 34-36. These flowcharts describe the preferred process steps used for fabricating the templates used for subsequent fabrication of numerous 3-D thin-film TFSC substrates.

FIGS. 41 through 47 show one embodiment of a process flow and evolution of a template structure for a template version with in-wafer trenches 442 and design to enable formation of self-aligned base contacts during various stages of the template process flows outlined in FIGS. 34-36.

Figure 41:
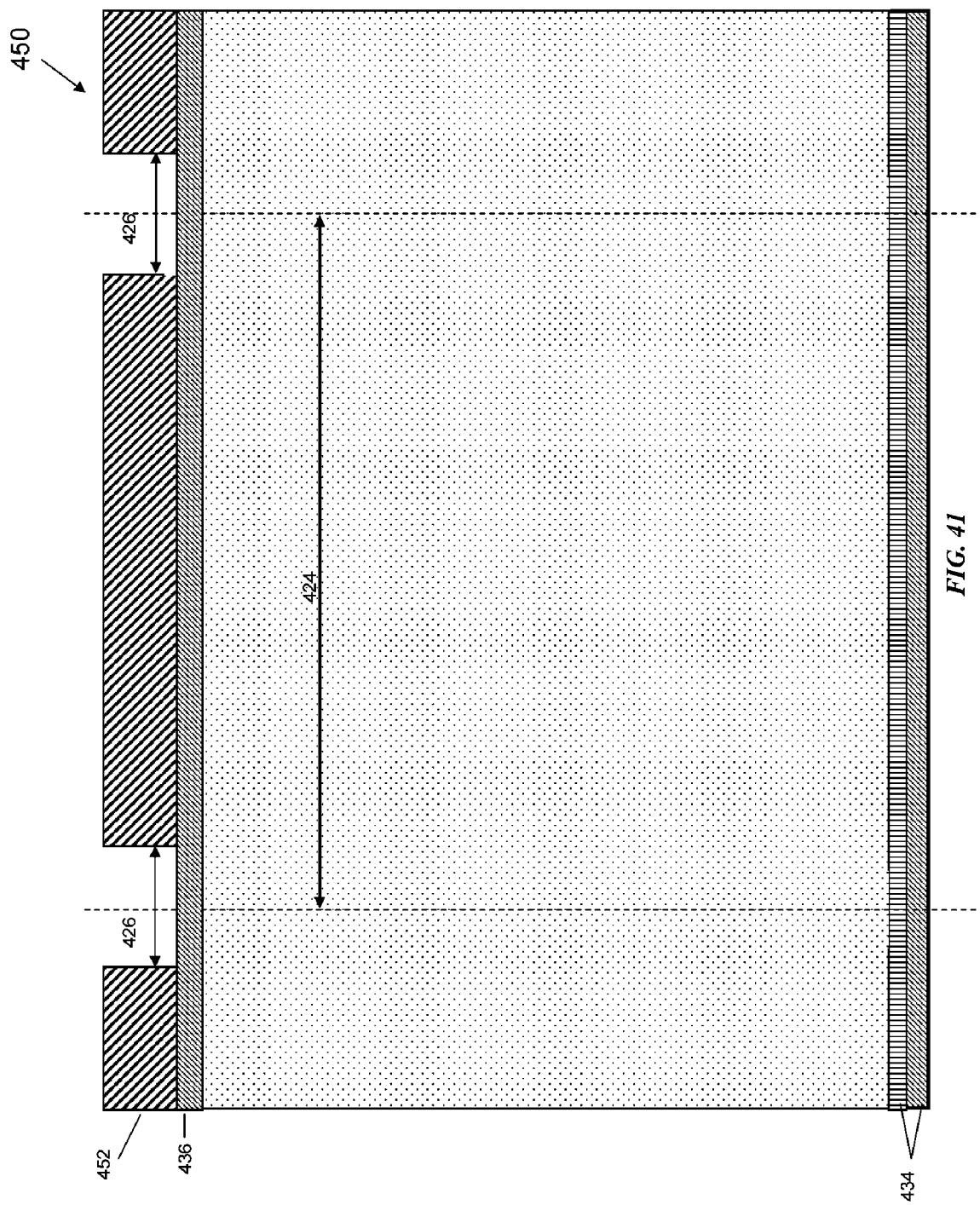
Figure 42:
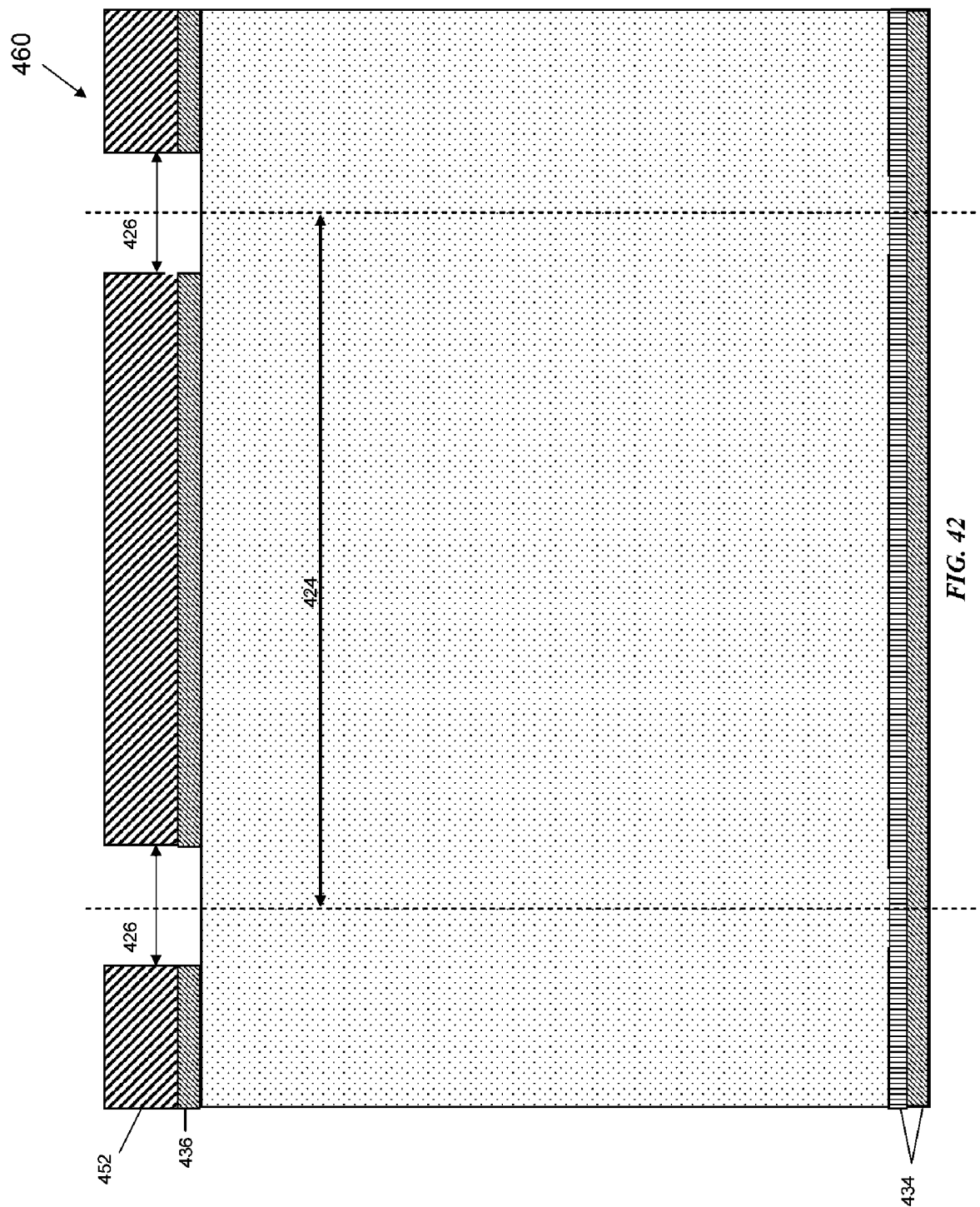
Figure 43:
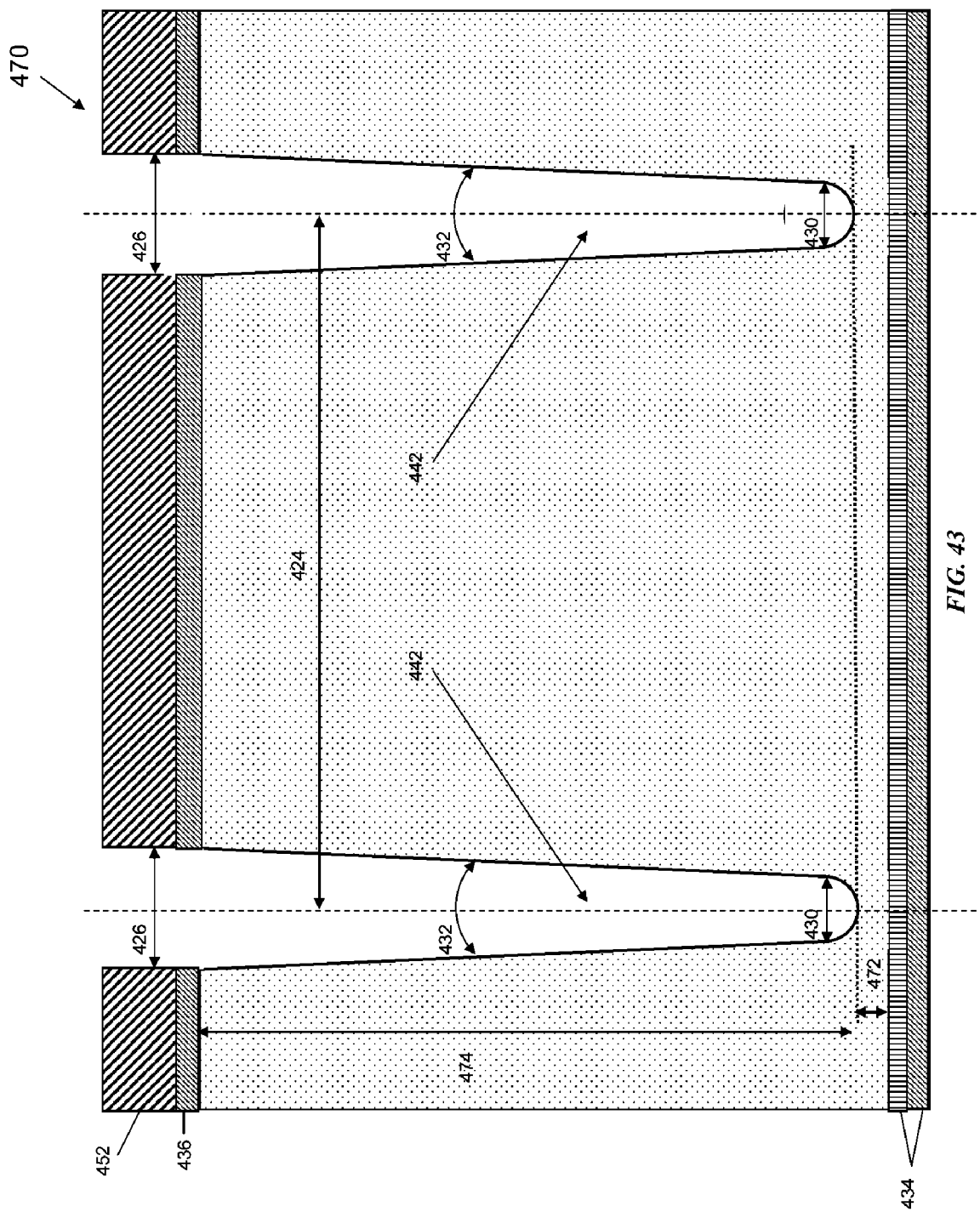
Figure 44:
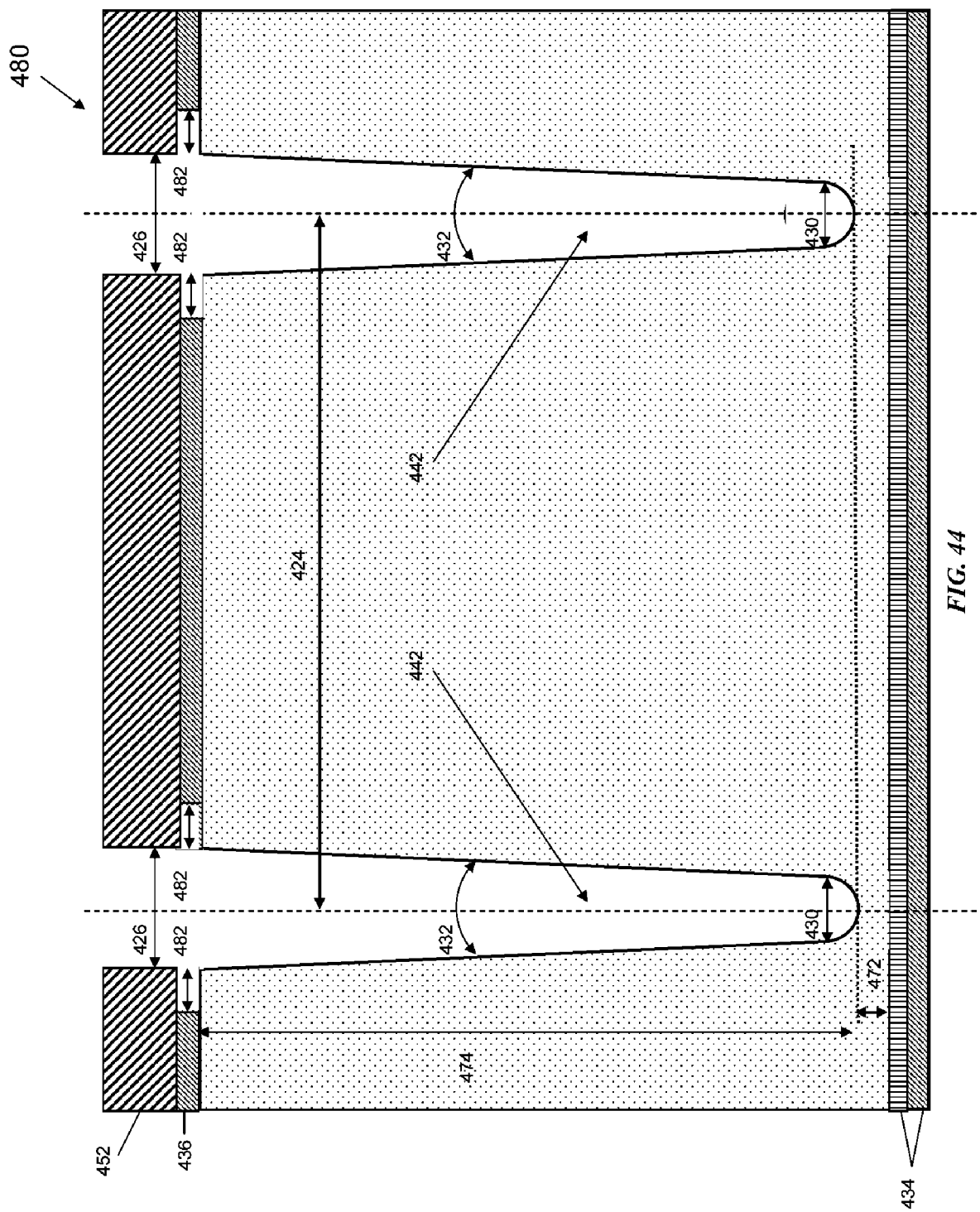
Figure 45:
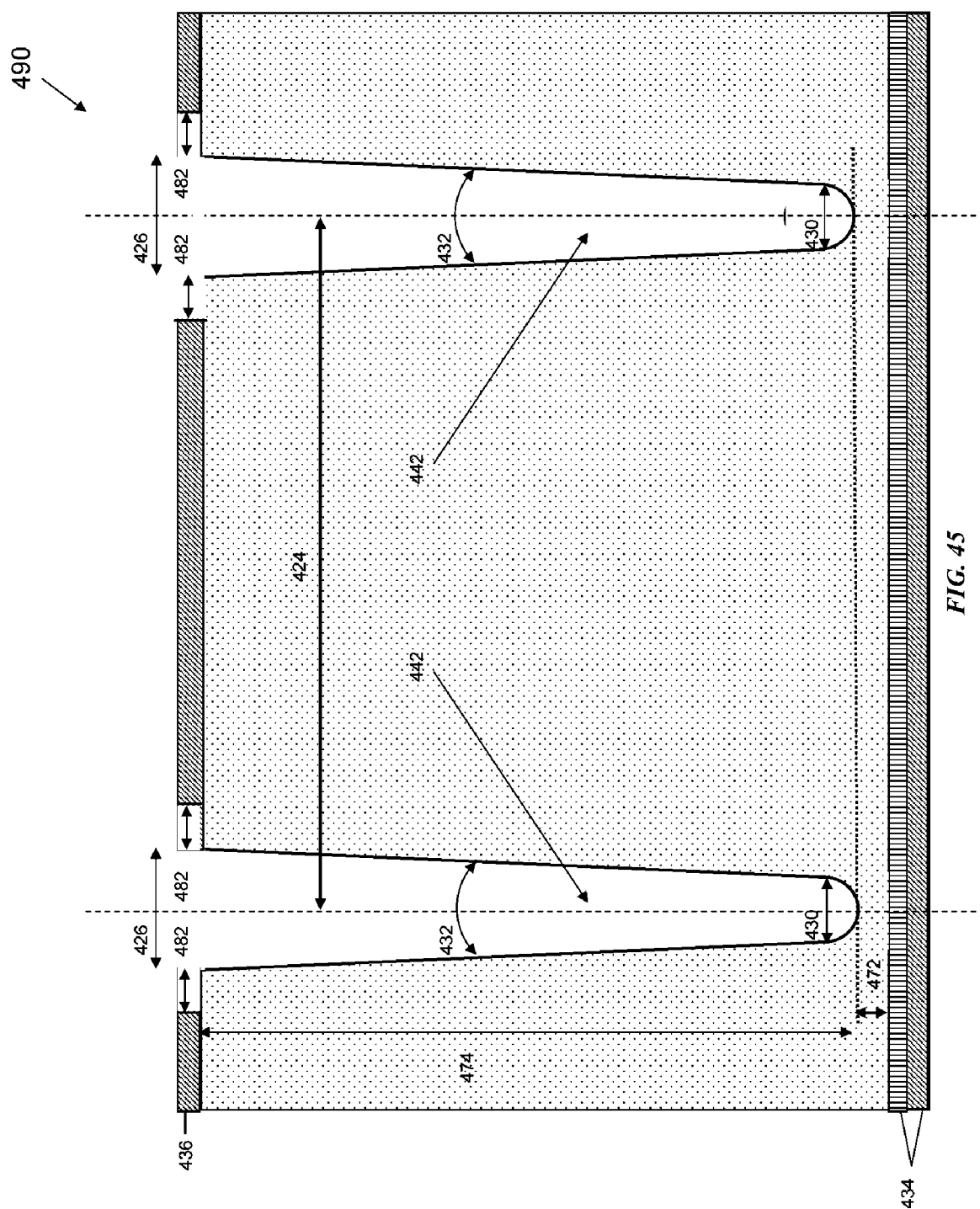
Figure 46:
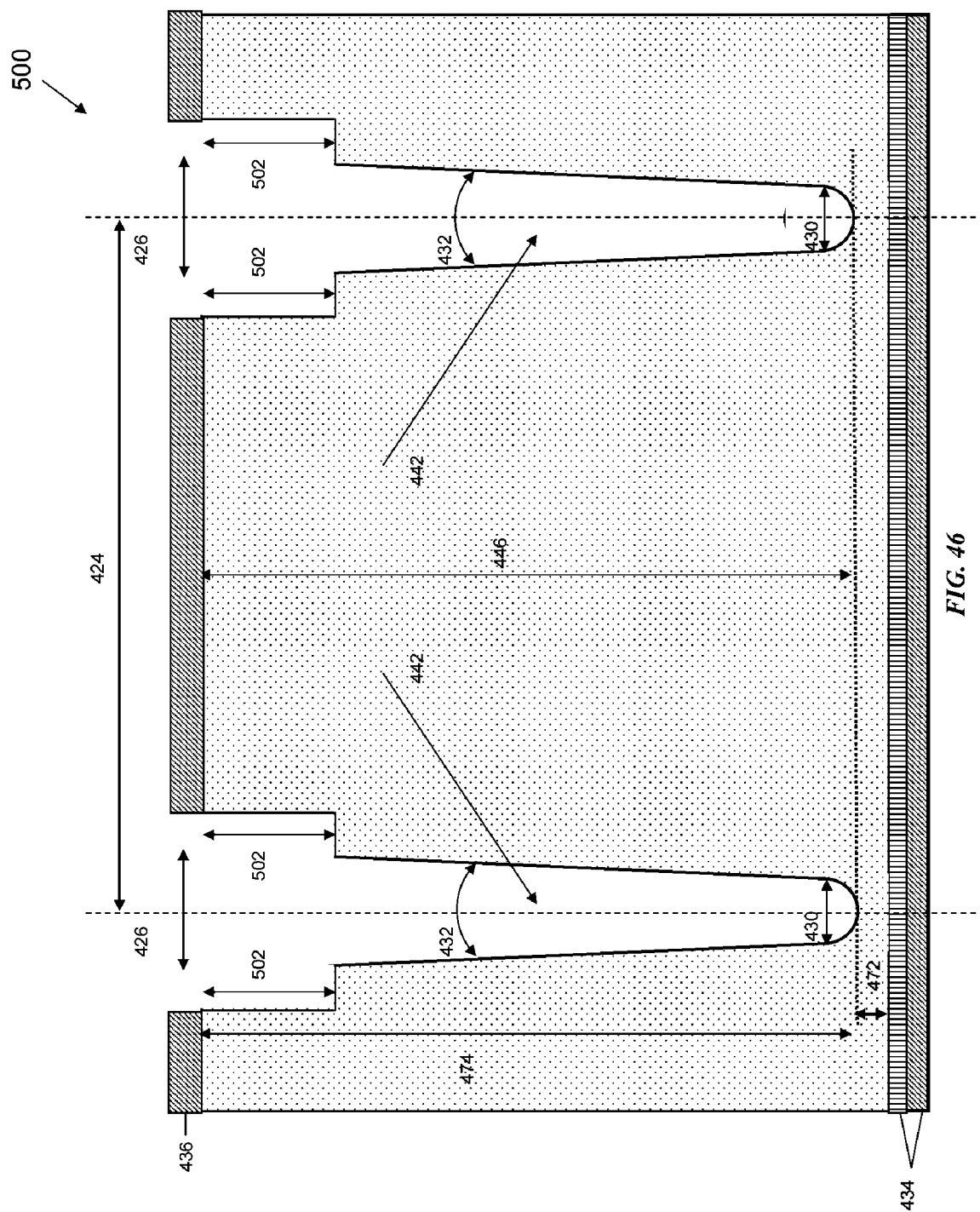
Figure 47:
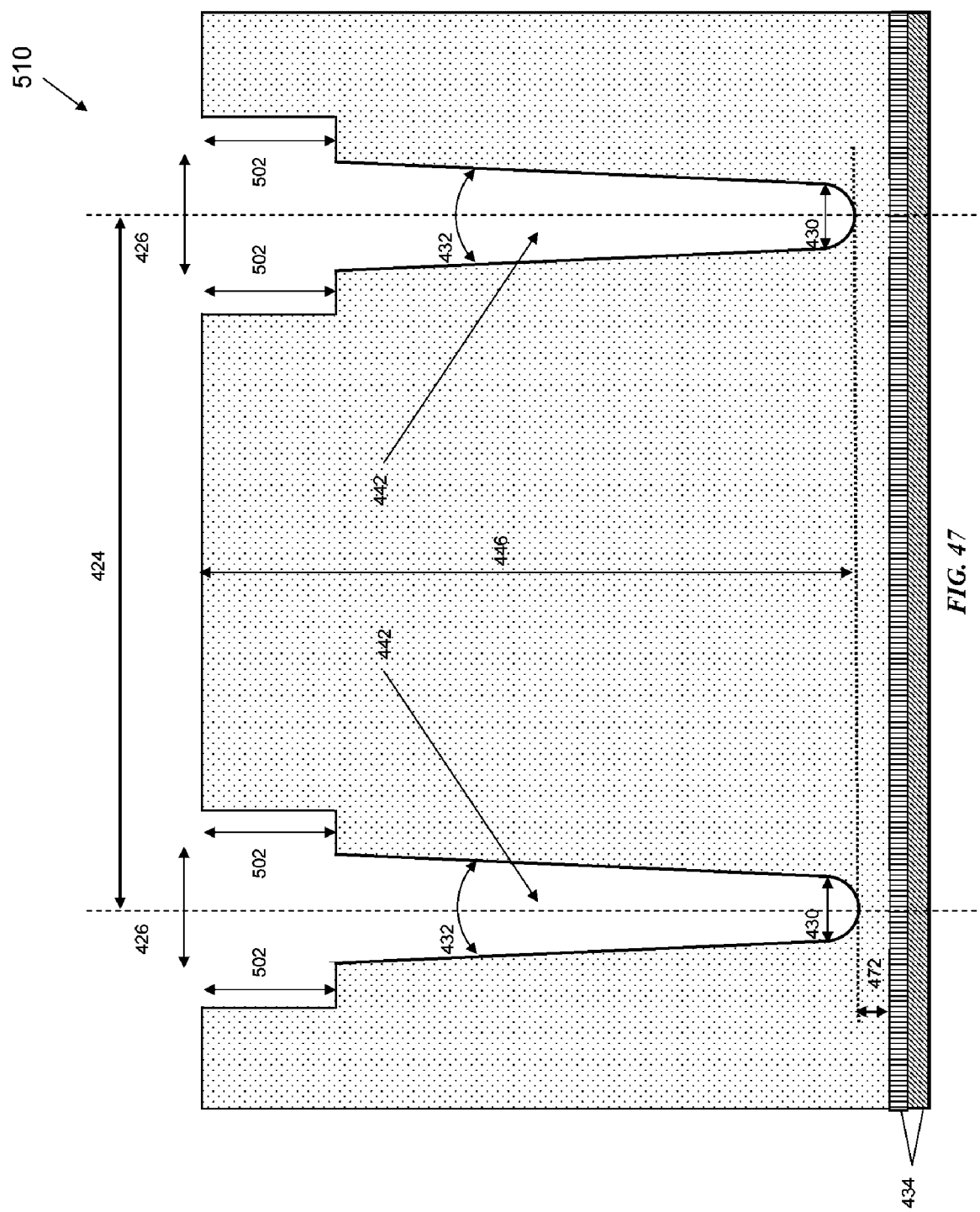

FIG. 41 shows a Y-Y cross-sectional view 450 after formation of a photoresist frontside pattern 452 on dielectric (oxide) hard mask (backside dielectrics 434 are optional and may not be used). FIG. 42 shows a Y-Y cross-sectional view 460 after anisotropic plasma oxide etch (or isotropic wet oxide etch) through the photoresist frontside pattern 452. FIG. 43 shows a Y-Y cross-sectional view 470 after formation of deep hexagonal-prism trenches using deep RIE (DRIE). FIG. 43 further shows remaining wafer thickness R' 472 and trench height H' 474. FIG. 44 shows a Y-Y cross-sectional view 480 after timed selective isotropic hard mask etch (e.g., oxide etch using HF) to form controlled lateral undercuts 482 under patterned photoresist 452 with width $W_{ox}$. FIG. 45 shows a Y-Y cross-sectional view 490 after photoresist strip. Note that the top hard mask layer 436 remains and the photoresist layer has been removed. FIG. 46 shows a Y-Y cross-sectional view 500 after anisotropic silicon etch to form wider shallow trenches with controlled height (L) 502 on the top of the narrower and deeper trenches 442. FIG. 47 shows a Y-Y cross-sectional view of a completed template 510 after isotropic oxide etch to strip the top hard mask layer 436 as shown in FIG. 46. While shown here, the backside dielectric layers may also be removed (or may not be used at all). This template 510 may also be used to fabricate numerous hexagonal prism 3-D TFSC substrates. As described before, the combination of deep trenches and wider shallow trenches (top shoulders) may be formed using a single DRIE process sequence (anisotropic deep trench RIE followed by a less anisotropic silicon etch to form the top shoulders), thus, eliminating the need for the top dielectric hard mask layer 436 and the associated process steps reflected in FIGS. 44 and 45.

The following FIGURES (FIGS. 48 to 51) illustrate several alternative embodiments of completed templates.

Figure 48:
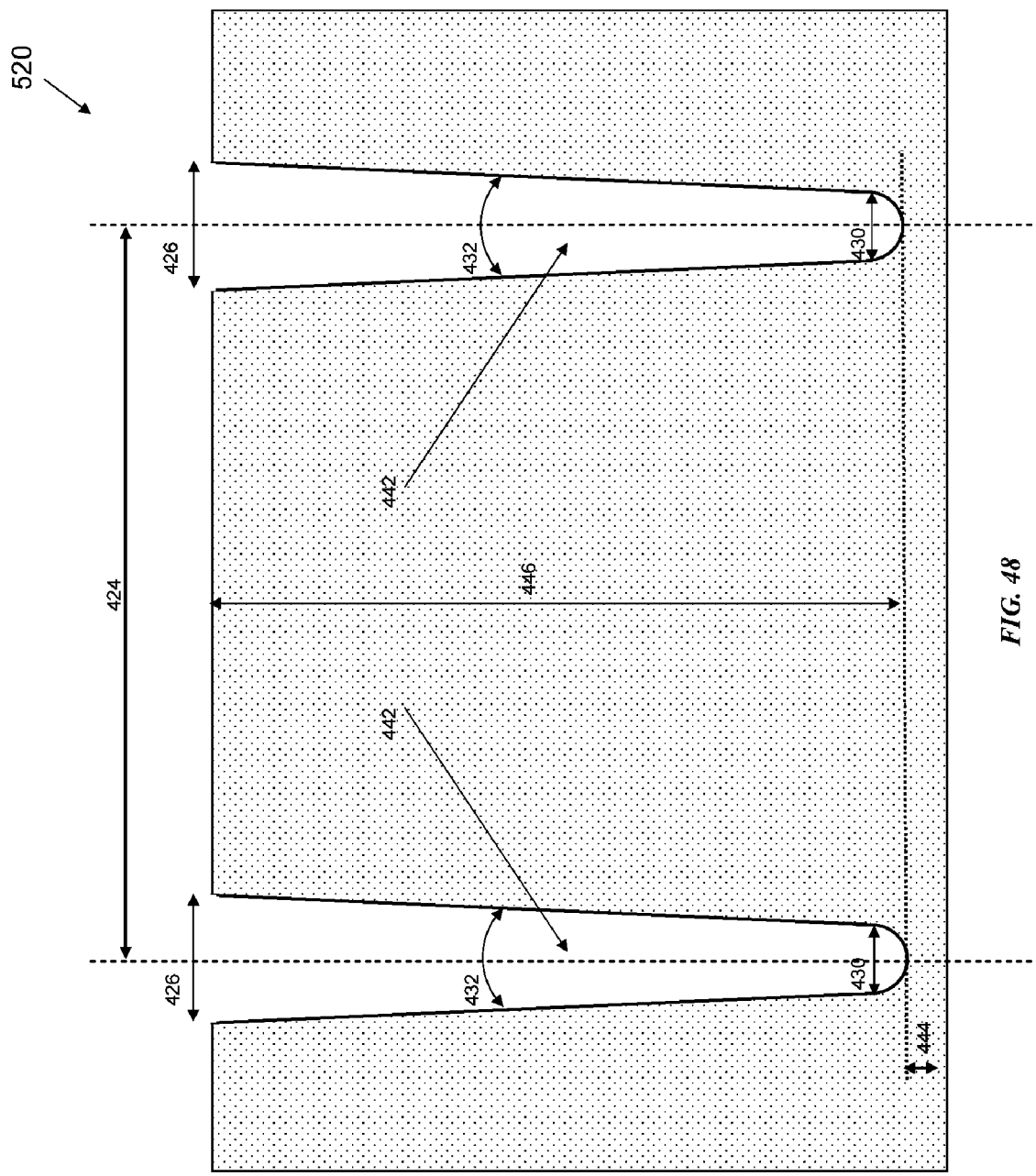
Figure 49:
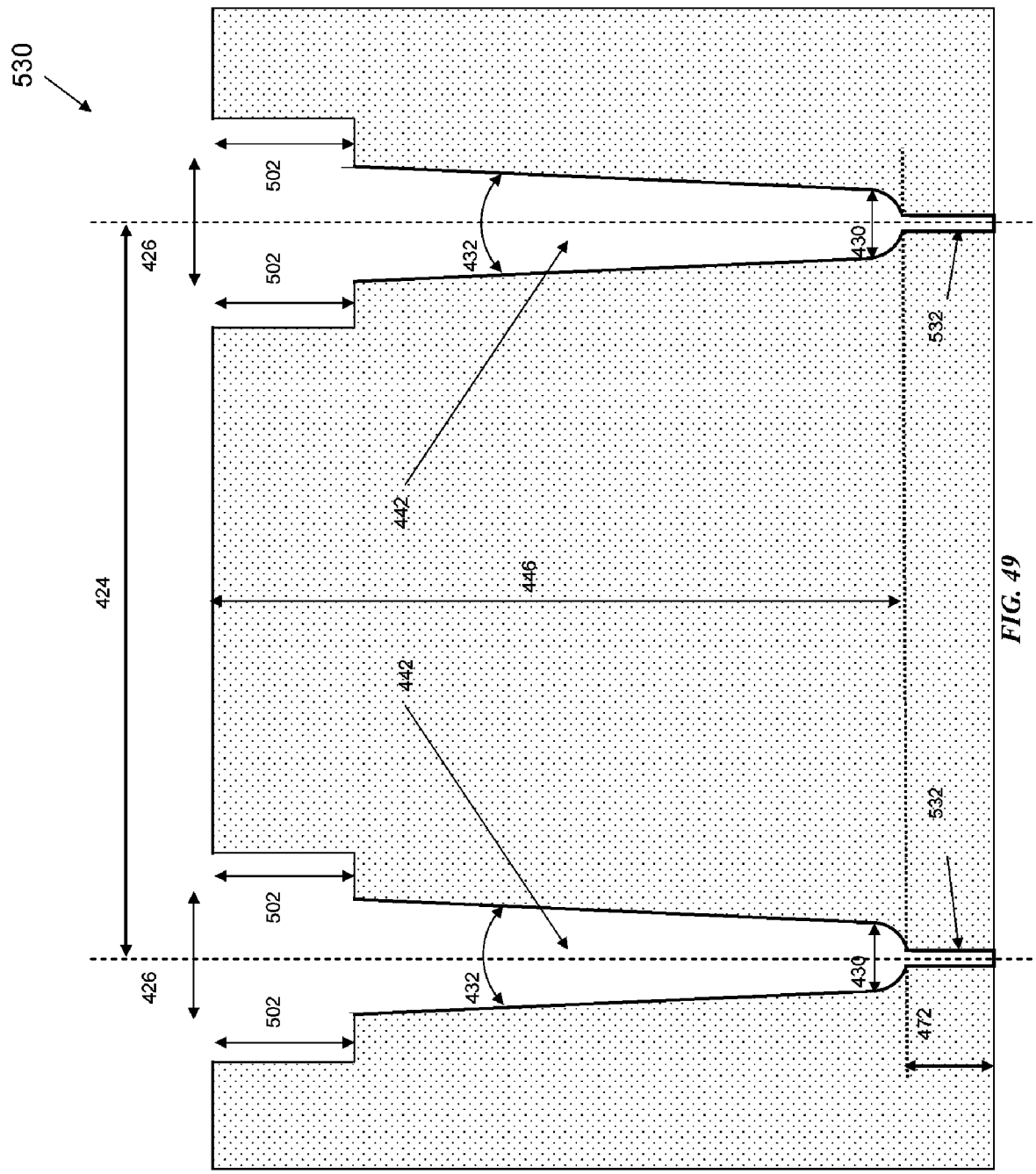
Figure 50:
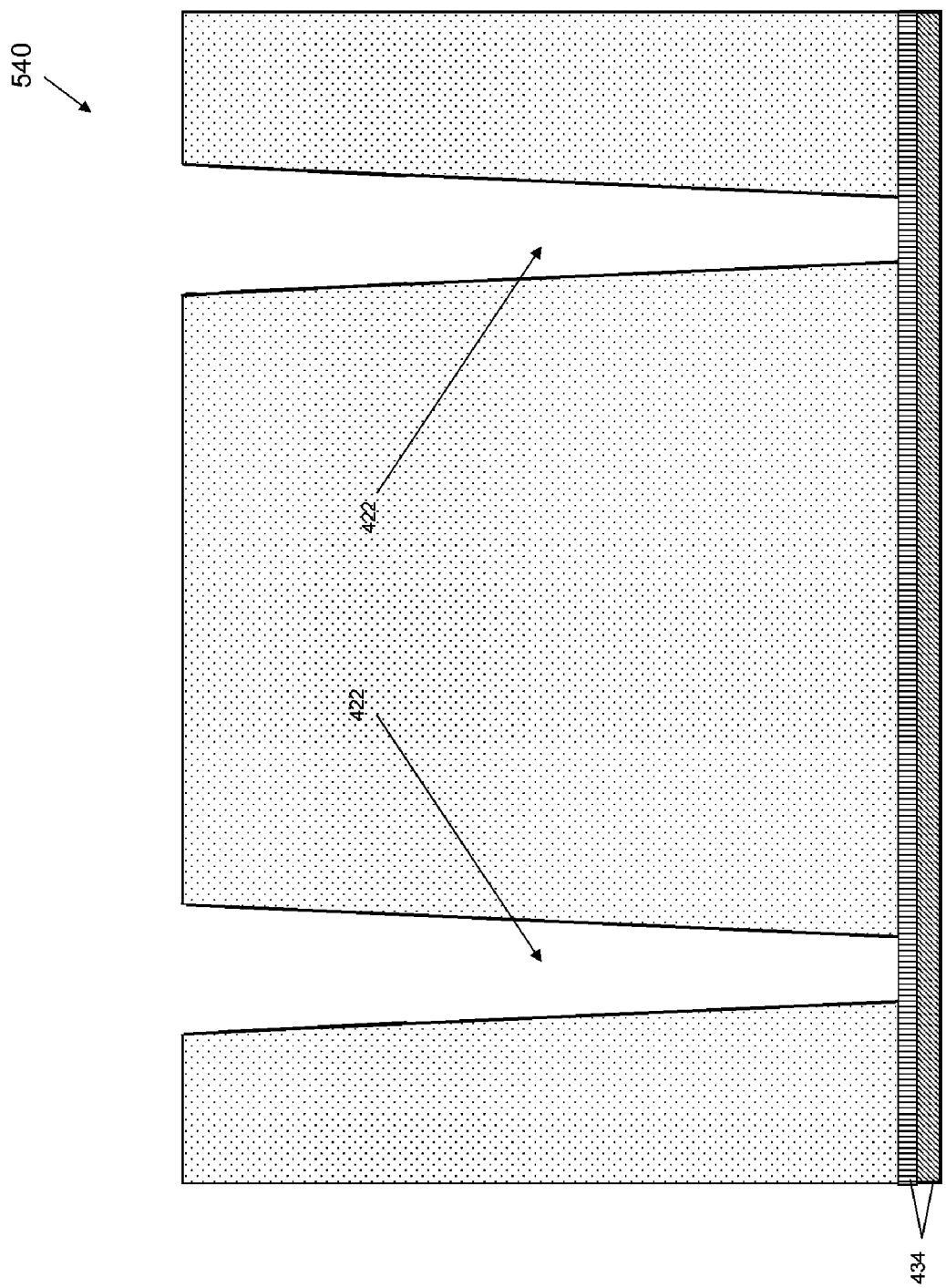
Figure 51:
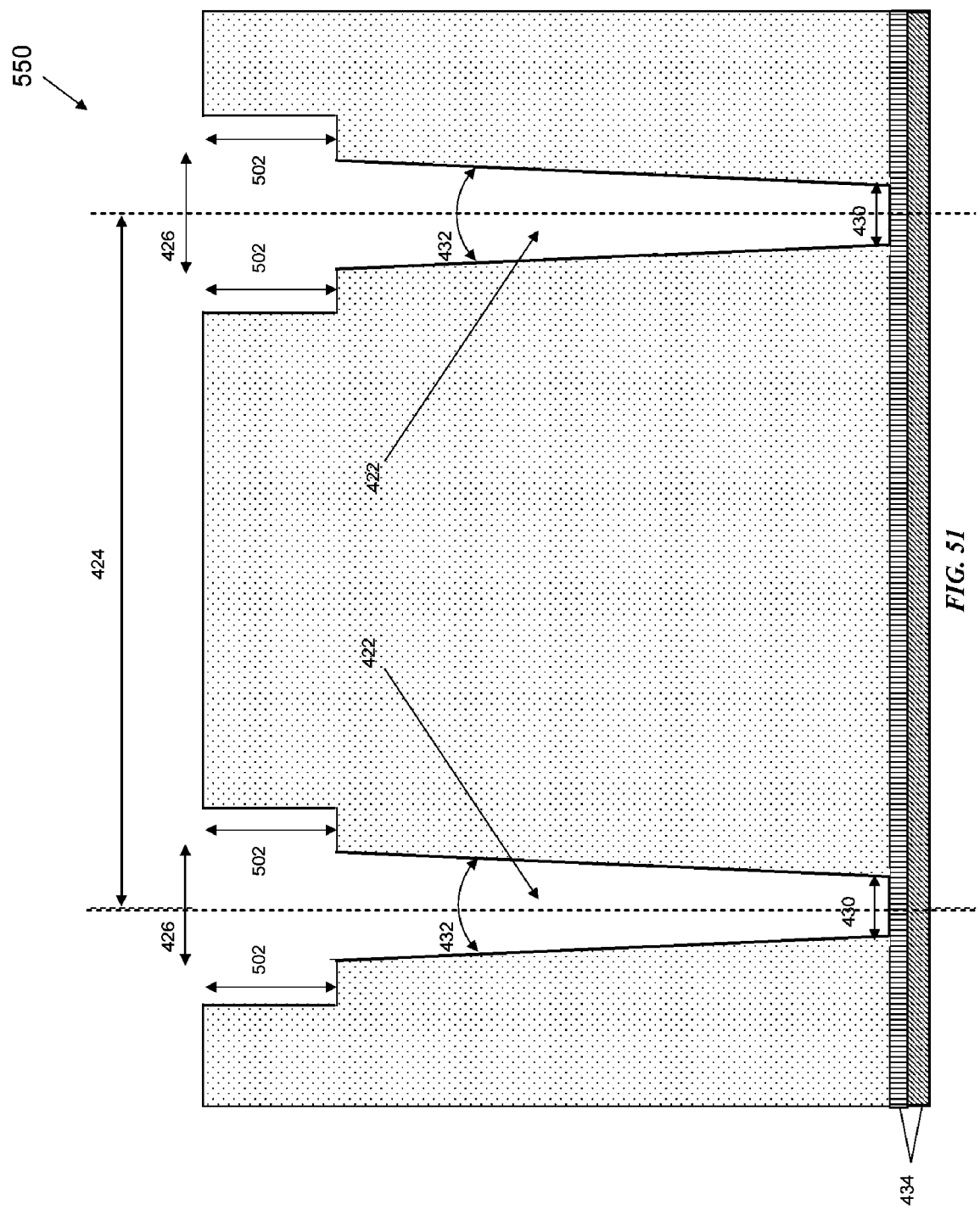

FIG. 48 shows a Y-Y cross-sectional view of a template 520 with in-wafer trenches 442 without a dielectric top mask layer or a dielectric rear mask layer. FIG. 49 shows a Y-Y cross-sectional view of a template 530 with in-wafer trenches 442 without a dielectric top mask layer or a dielectric rear mask layer, compared to the embodiment shown in FIG. 48. This view also shows template backside holes 532 used to allow for 3-D TFSC substrate release etching. These backside holes 532 may be fabricated using either lithography and etch, or laser micromachining or drilling. FIG. 50 shows a Y-Y cross-sectional view of a template 540 with through-wafer trenches 422 without a top hard mask layer 436 as shown in FIG. 39. FIG. 51 shows a Y-Y cross-sectional view of a template 550 with through-wafer trenches 422 without a top hard mask layer 436, compared to FIG. 46. Note further that the through-wafer trenches 422 in FIG. 51 have wider trenches (top shoulders) with controlled height (L) 502 on the top of the narrower and deeper hexagonal trenches, like the trenches in FIG. 47. However, note that FIG. 51 shows through-wafer trenches 422, whereas FIG. 47 shows within-wafer trenches 442.

Figure 52:
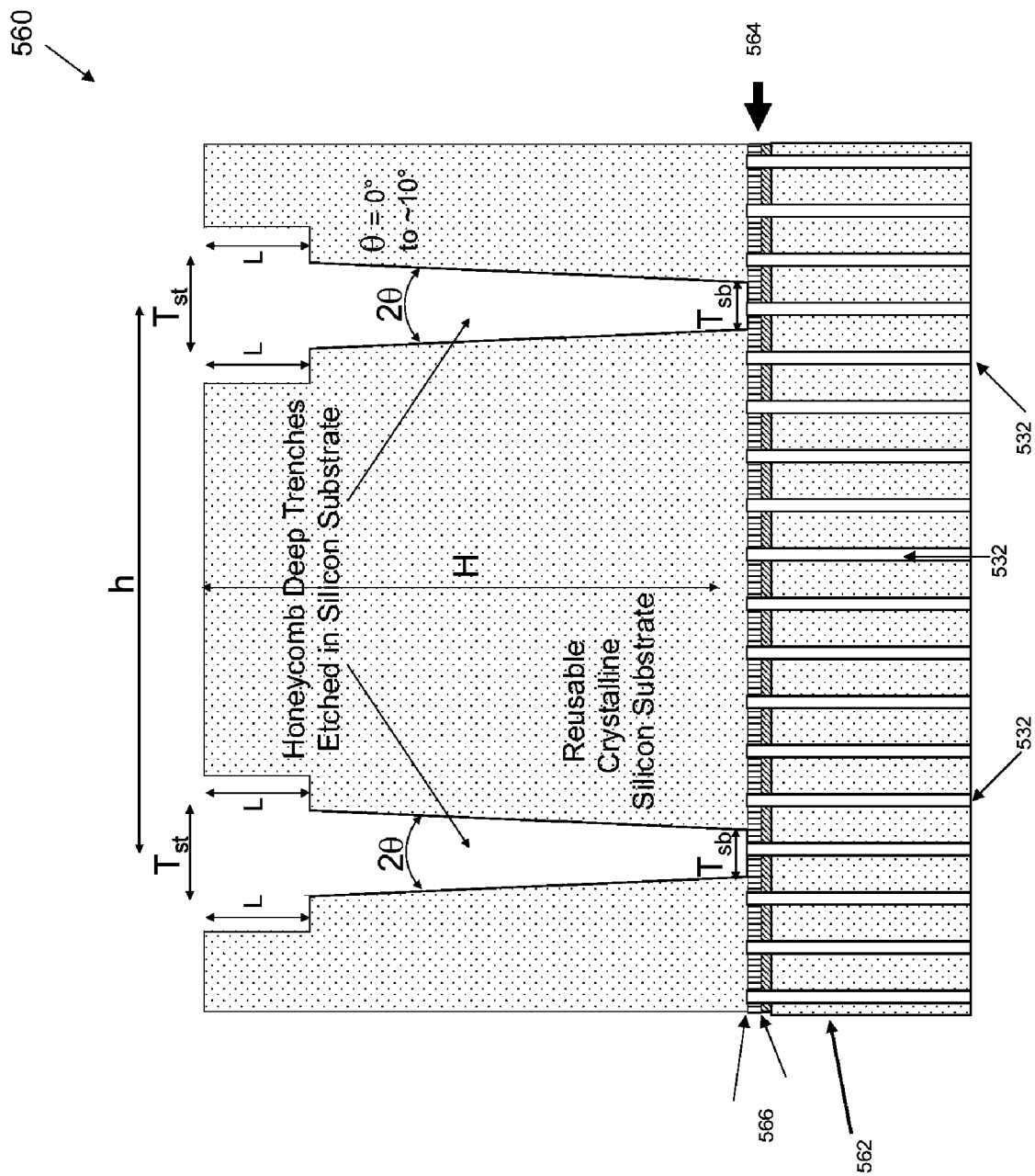

For templates with through-wafer trenches, mechanical support may be provided by either using a backside dielectric stack of sufficient strength (such as oxide, nitride, polysilicon, or a combination thereof as described before), or using a backside-bonded silicon wafer. FIG. 52 shows a view of a template 560 with through-wafer trenches and without any frontside dielectrics, suitable for fabrication of hexagonal-prism single-aperture 3-D TFSC substrates with rear base layers. This template 560 includes a mechanical support rear silicon wafer 562 bonded at a bonded interface 564 (e.g., via a dielectric such as oxide or a dielectric stack 566 such as oxide/nitride between the wafers). The mechanical support rear silicon wafer 562 provides wet etchant access to the template trenches through holes 568, which may be created either by laser drilling or reactive ion etching. This template 560 enables fabrication of 3-D TFSC substrates with capability for formation of self-aligned base and emitter contacts during subsequent hexagonal prism 3-D TFSC substrate fabrication. In an alternative embodiment, mechanical support rear silicon wafer 562 may instead be formed by a layer of polysilicon deposited by LPCVD over the backside dielectric (or dielectric stack) 566, thus, eliminating the need for wafer bonding.

FIGS. 53 and 54 show views 570 and 580, respectively, of two examples of mask designs (out of many possible designs), the first one a square-array mask and the second one a line-array mask, which may be used to pattern the template backside to produce backside openings for 3-D TFSC substrate release etching. This patterning is performed only once on each template.

FIG. 53 shows a square-array mask 570, where each square-array unit cell 572 has a square-array unit cell width 574 and a square array unit cell spacing 576. In one embodiment, both of these are approximately 1 to 5 microns (may be smaller or larger as well). FIG. 54 shows a line-array mask 580, where the pattern shown is repeated over the entire mask as a periodic array. In one embodiment, the line widths and spaces are all 1 to 10 microns (may be smaller or larger as well). The pattern has a pattern width 582, which in one embodiment is approximately 50 to 500 microns. Other mask patterns (e.g., lines, circles, etc.) enabling etchant access to remove the sacrificial layer may be used instead of square array or orthogonal line array. Alternatively, it is possible to use laser drilling or laser micromachining instead of lithography/etch to create the backside holes/openings for etchant access.

An alternative to the backside patterning outlined in FIGS. 53 and 54 uses a frontside mask to enable release of single-aperture hexagonal-prism 3-D thin-film TFSC substrates with flat base layers by providing etchant access pathways from the template frontside.

FIG. 55 shows an alternative frontside hexagonal-prism mask design 590 with center holes 592, shown as white circles on the mask plate. In one embodiment, center holes 592 are roughly 1 to 5 microns in diameter. Note that the hexagonal-prism array design is the same as in FIG. 33. Dark regions 342 are opaque coating (e.g., Cr) on the mask plate. Light regions 344 and 592 are areas to be etched. In one embodiment, the width of the line mask ($L_M$) 346 is between 1 and 30 microns, and the diagonal distance between hexagonal-prism points (d) 348 is between 50 and 500 microns.

FIG. 56 shows a view 600 of the template frontside mask design 590 shown in FIG. 55, also shown with dotted squares 572 indicating a superimposed image of one embodiment of the backside mask design (in order to see the relative alignment of the frontside mask and backside mask from the frontside mask perspective).

FIG. 57 shows a top view of a template backside mask design 610, with the superimposed image of the hexagonal array of the mask design 590 from FIGS. 55 and 56 shown as gray hexagonal-array pattern in order to see the relative alignment of the frontside mask and backside mask from the backside mask perspective).

FIGS. 58 through 66 show an alternative template version during various stages of the template process flows outlined in FIGS. 36 and 37.

Figure 58:
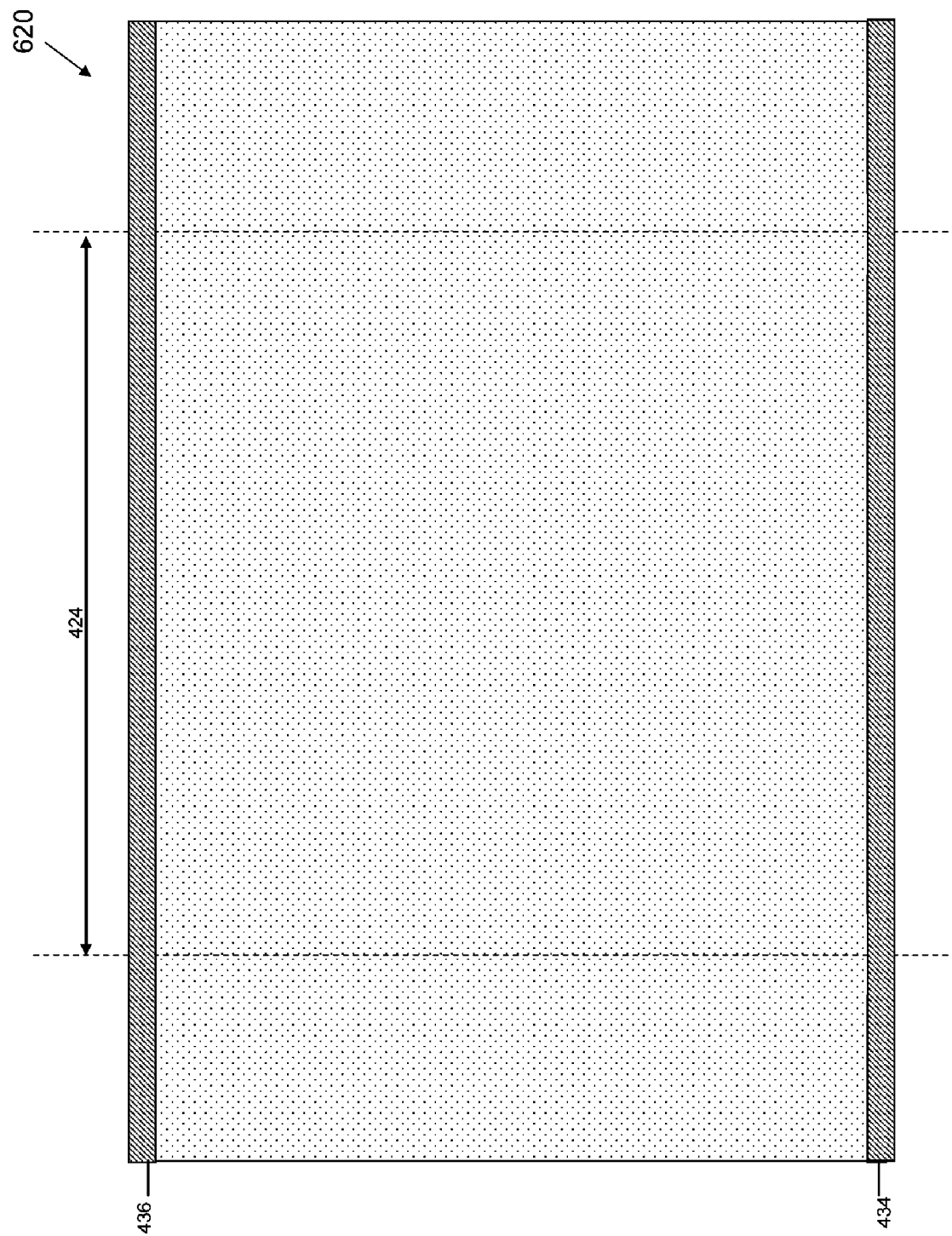
Figure 59:
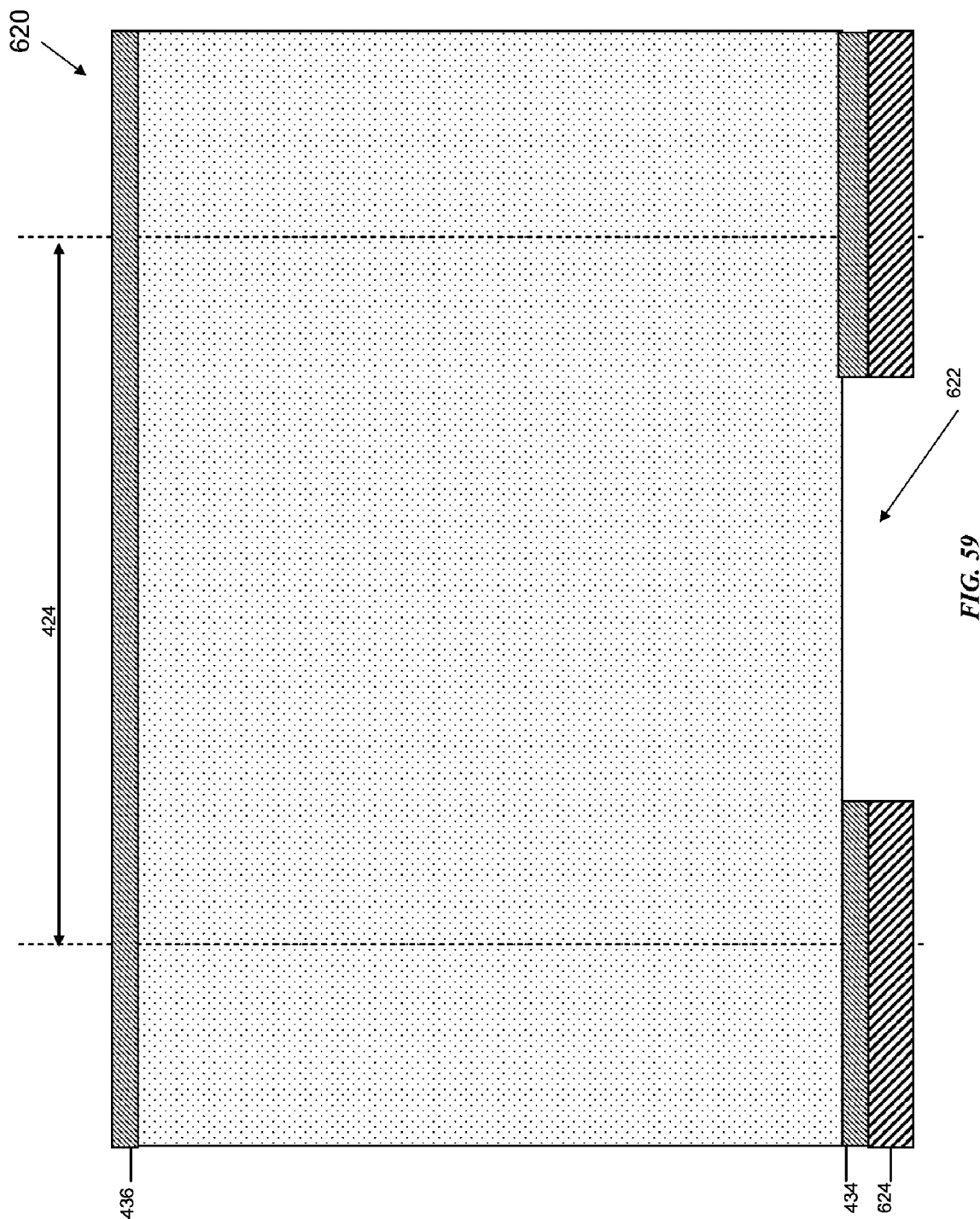
Figure 60:
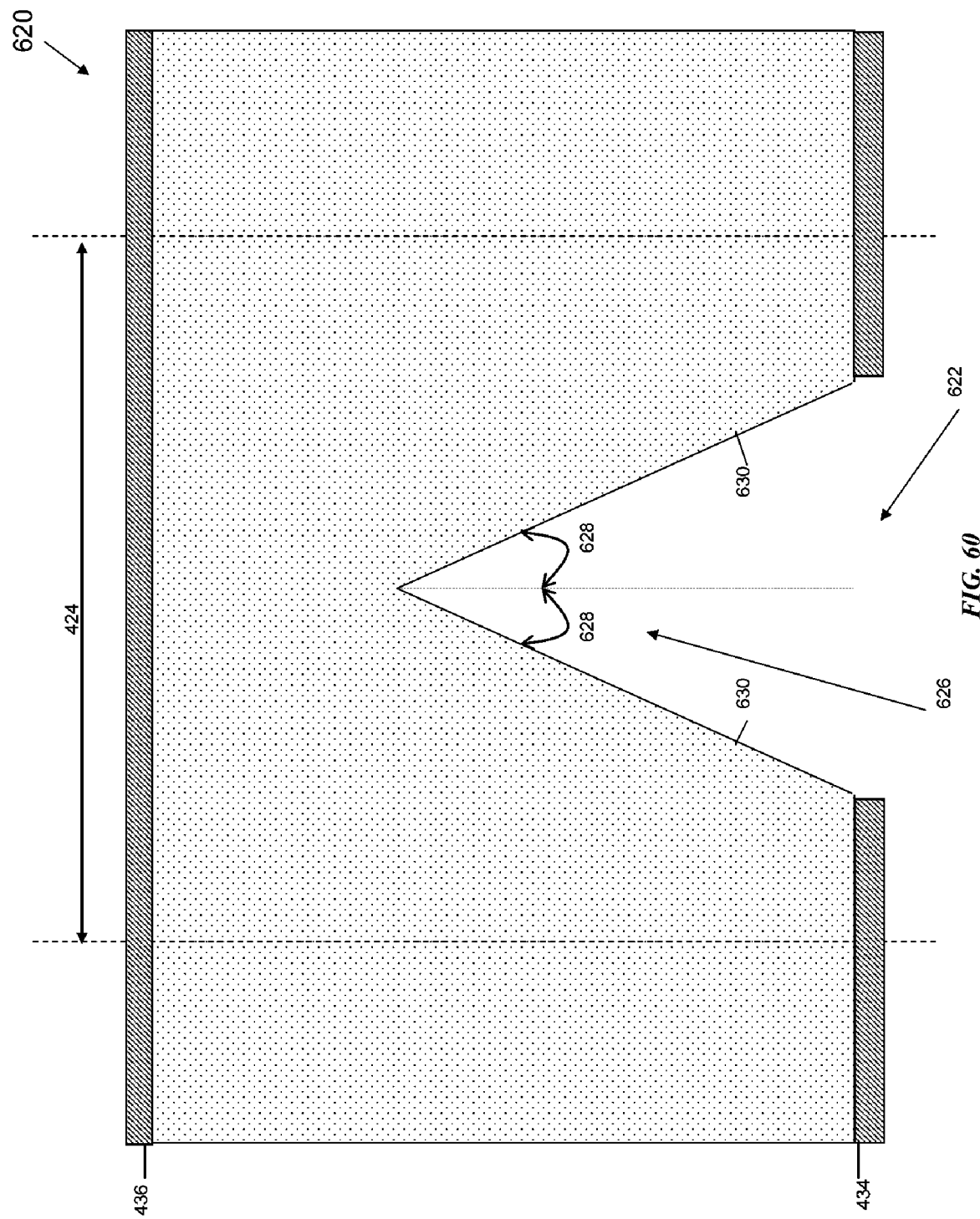
Figure 61:
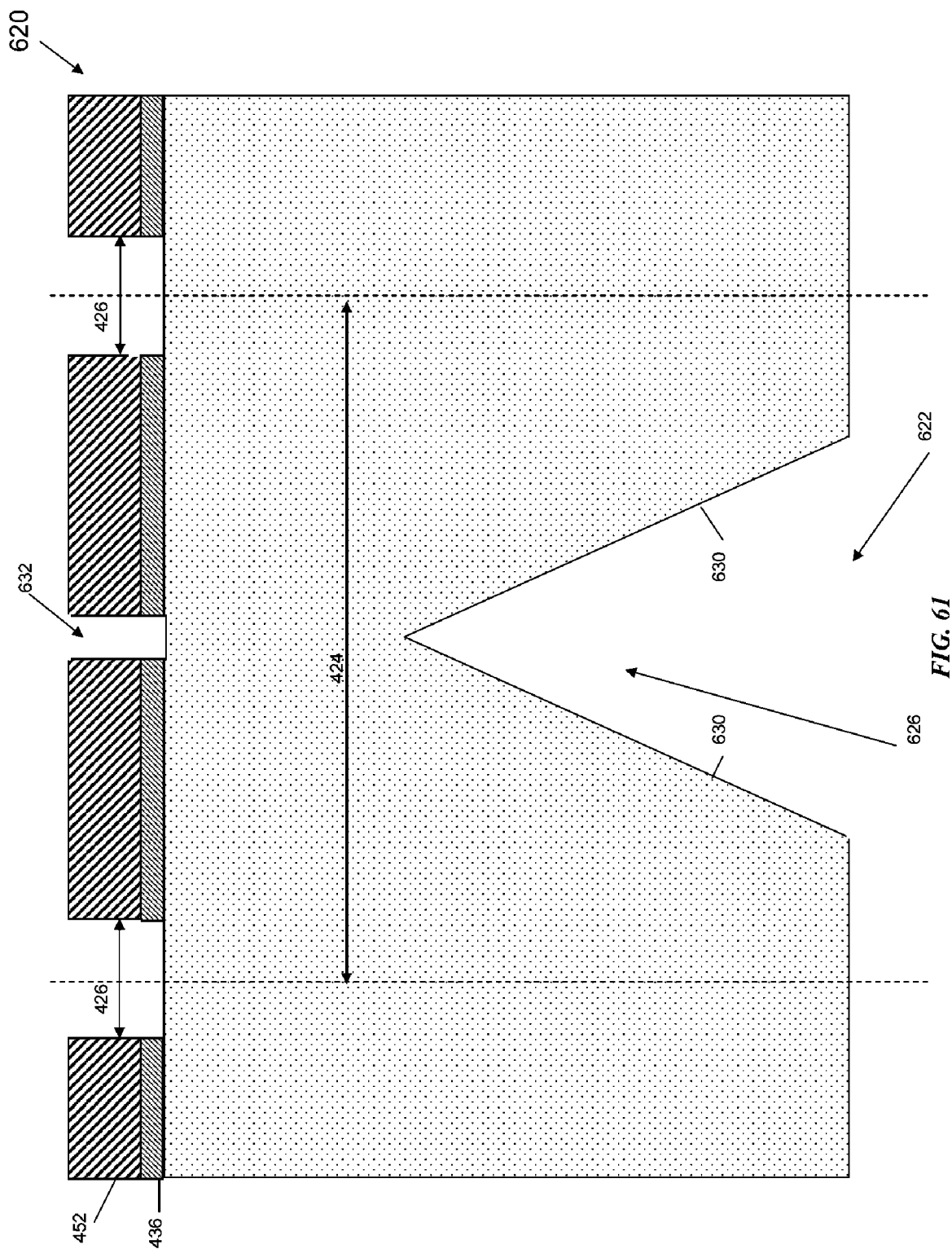
Figure 62:
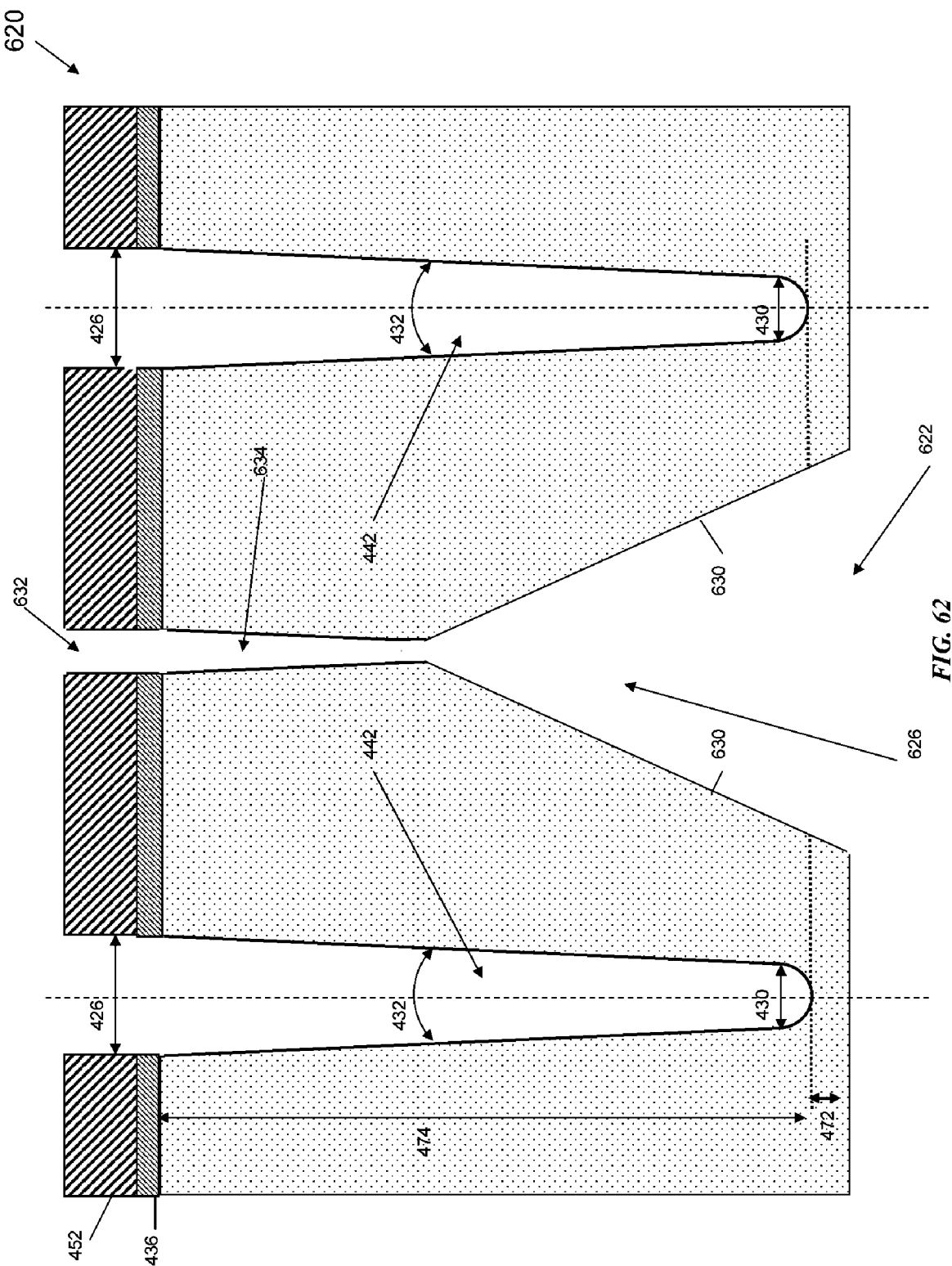
Figure 63:
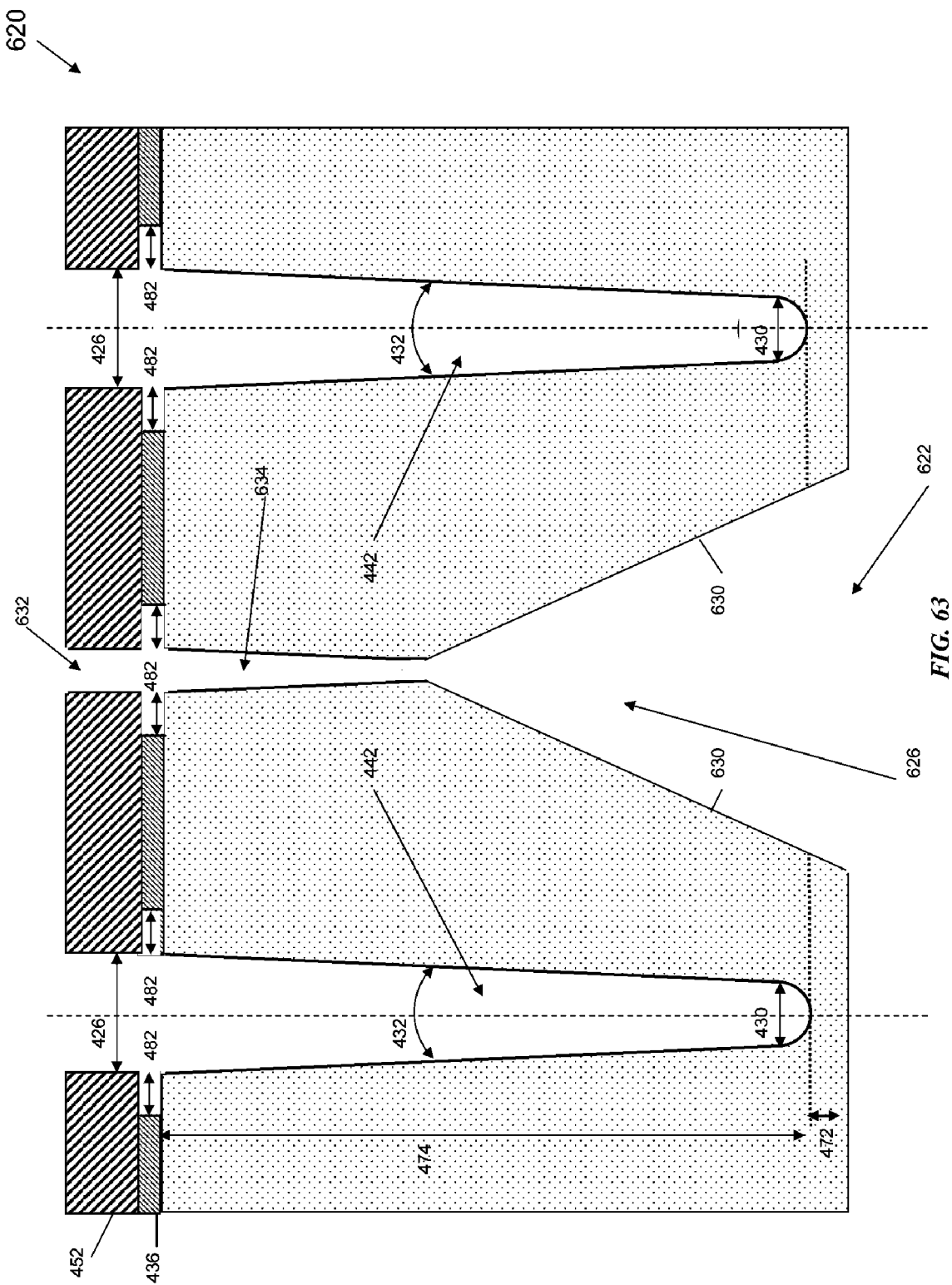
Figure 64:
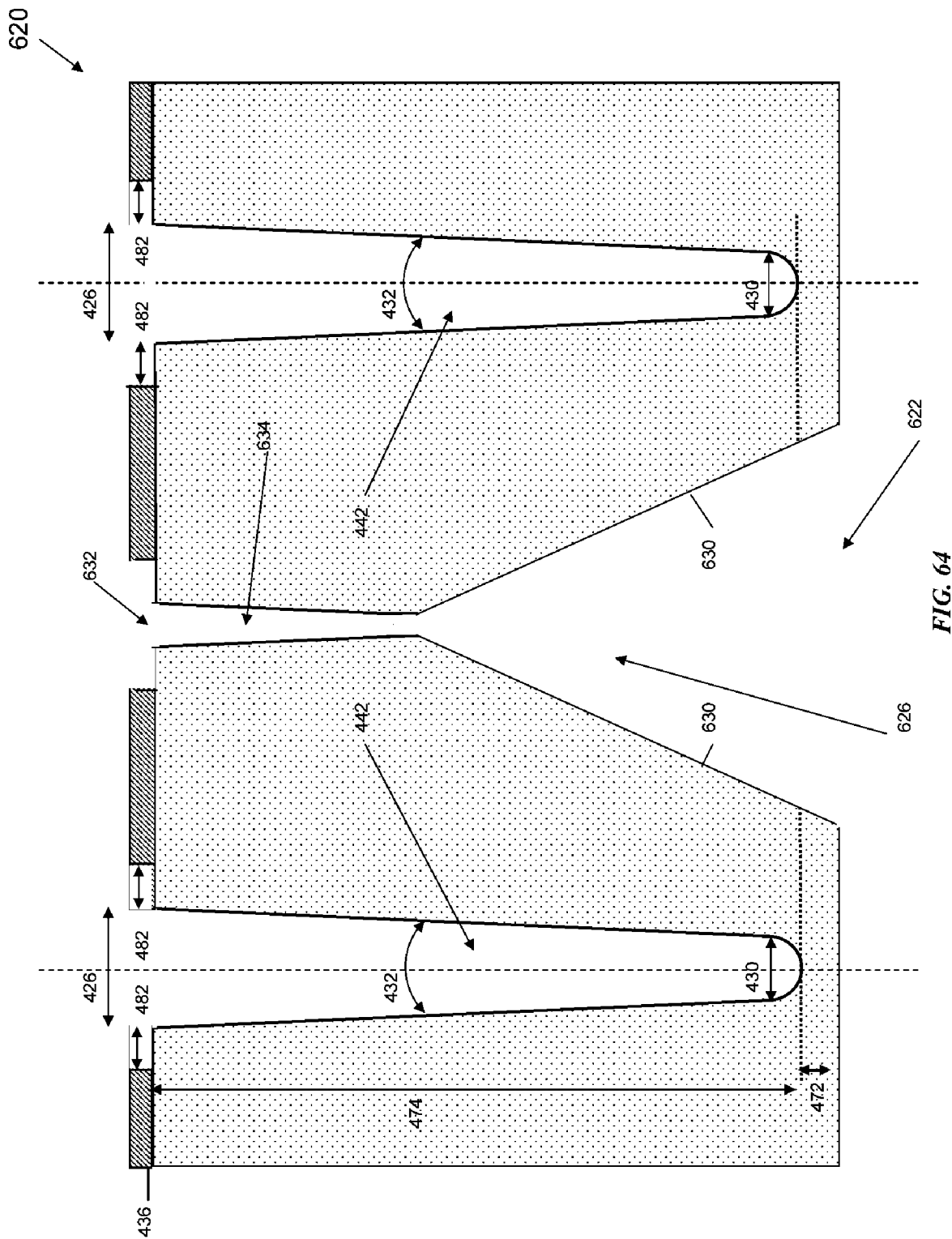
Figure 65:
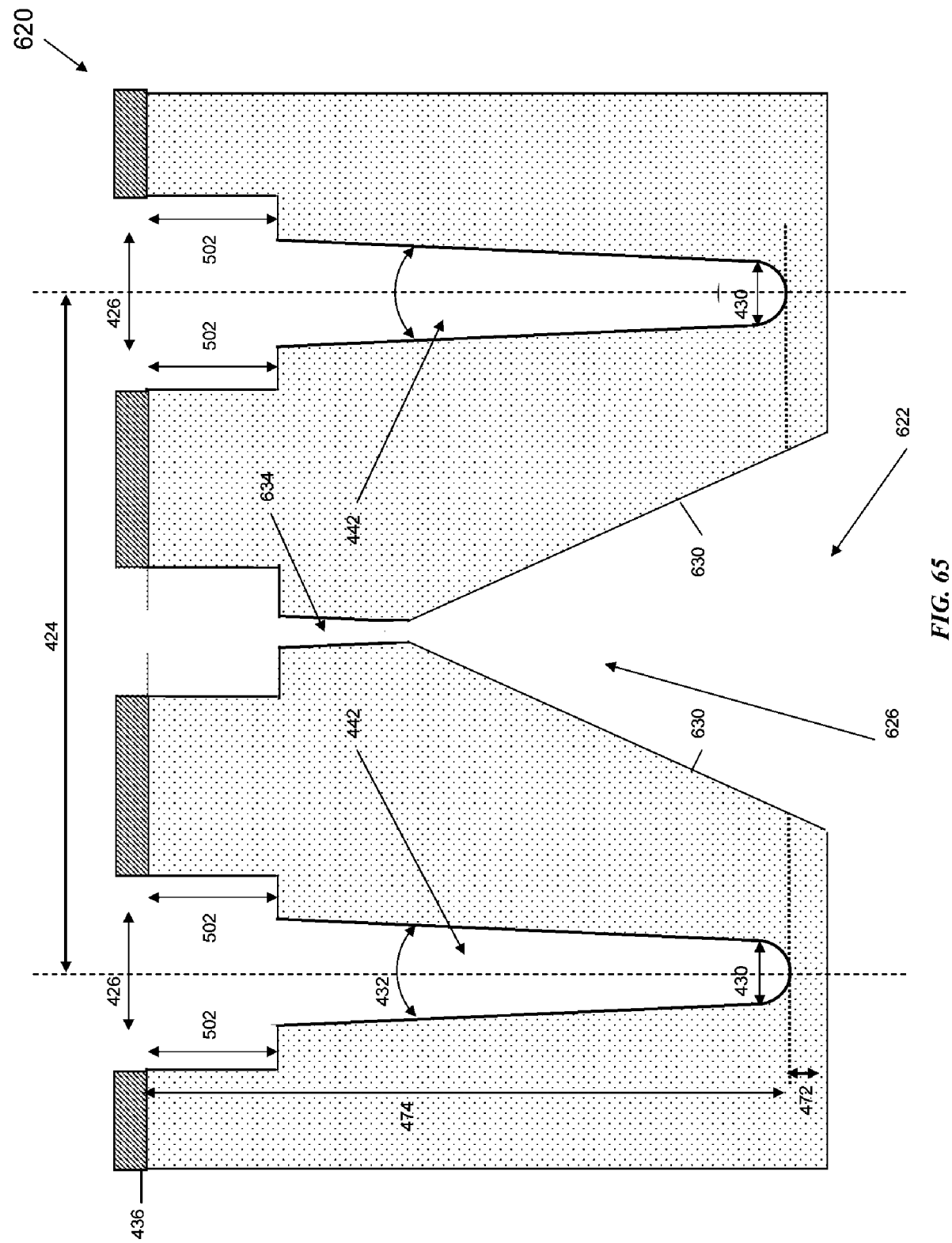

FIG. 58 shows a Y-Y cross-sectional view of an n-type (e.g., phosphorus-doped) [100] silicon substrate 620 after formation of a top hard mask layer 436 and a backside hard mask layer 434 using thermal oxidation. Note that before oxidation, an optional surface texturing wet etch (such as using an acid texturing etch or an alkaline texturing etch) may be performed using a suitable etchant such as KOH in order to texture the silicon surface. FIG. 59 shows the substrate 620 in FIG. 58 after backside lithography to form a patterned photoresist layer 624 comprising an array of square-shaped openings 622 and after wet or anisotropic plasma etching of the backside hard mask layer 434 in the exposed areas. Note that in order to use anisotropic wet etch to form the backside channels, the backside mask square pattern for the substrate 620 backside is properly aligned to produce [111] sidewalls, [110] directed edges, and directed ribs. FIG. 60 shows the substrate 620 in FIG. 59 after anisotropic etching of template from backside using an anisotropic wet etchant (e.g., KOH or TMAH) to form an array of pyramids 626 with square bases and after stripping photoresist layer 624 from template backside. Note the angle 628 of the pyramids 626. In one embodiment, this angle is 35.26°. The backside lithography mask square pattern is properly aligned to produce [111] plane sidewalls 630, [110] directed edges, and [211] directed ribs. FIG. 61 shows the substrate 620 in FIG. 60 after frontside patterning and anisotropic oxide plasma etch (or isotropic oxide wet etch) through patterned resist 452 in preparation for formation of honeycomb-prism trenches and concurrently forming frontside-etched small-diameter release trenches 632, and removing backside oxide layer 434. In one embodiment, the diameter ($D_R$) of the release access trenches 632 is between 1 and 5 microns. FIG. 62 shows the substrate 620 in FIG. 61 after frontside deep silicon RIE. Note that frontside-etched small-diameter trenches 632 connect to the backside release channels 626 through shallower cone-shaped trenches 634 (in one embodiment, at the centers of the hexagonal-prism posts). FIG. 63 shows the substrate 620 in FIG. 62 after timed selective isotropic hard mask ($SiO_2$) etch to form controlled lateral undercuts 482 under patterned photoresist. FIG. 64 shows the substrate 620 in FIG. 63 after photoresist 452 strip, with oxide hard mask 436 remaining. FIG. 65 shows the substrate 620 in FIG. 64 after anisotropic silicon reactive-ion etch to form wider trenches with controlled height (L) 502 on top of the narrower and deeper hexagonal-prism within-wafer trenches 442. FIG. 66 shows the substrate 620 in FIG. 65 after isotropic oxide etch to strip top oxide 436. After this step an optional timed silicon wet etch may be performed in HNA or TMAH to remove about 5 to 500 nanometers of silicon to remove any DRIE-induced trench sidewall damage and/or polymeric/metallic contamination. At this point, the substrate 620 may serve as a reusable template for formation of 3-D thin-film TFSC substrates. Again as described before, the combination of deep trenches and wider shallow trenches (top shoulders) may be formed using a single DRIE process sequence (anisotropic deep trench RIE followed by a less anisotropic silicon etch to form the top shoulders), thus, eliminating the need for the top dielectric hard mask layer 436 and the associated process steps reflected in FIGS. 64 and 65. This alternative process flow also eliminates the need for the oxide hard mask (thus, photoresist can be applied directly on silicon for frontside and backside patterning steps).

FIGS. 67 through 75 show a template version during various stages of the template fabrication process flow outlined in FIGS. 36 and 37. FIGS. 67 through 75 are substantially similar to FIGS. 58 through 66, except the initial silicon substrate is an n-type [110] substrate 640, which results in backside release channels 642 in the shape of rectangular trenches with vertical sidewalls, rather than pyramids. The resulting substrate 640 shown in FIG. 75 may serve as a reusable template for formation of 3-D thin-film TFSC substrates. Again as described before, the combination of deep trenches and wider shallow trenches (top shoulders) may be formed using a single DRIE process sequence (anisotropic deep trench RIE followed by a less anisotropic silicon etch to form the top shoulders), thus, eliminating the need for the top dielectric hard mask layer 436 and the associated process steps reflected in FIGS. 73 and 74. This alternative process flow also eliminates the need for the oxide hard mask (thus, photoresist can be applied directly on silicon for frontside and backside patterning steps).

Another approach to implement the template release channels is to place them on the template substrate backside such that they connect to the bottoms of the hexagonal-prism deep trenches (instead of tops of the posts or pillars as shown before). FIGS. 76 and 79 through 86 show a template version (with the release channels connected to the bottoms of the deep trenches) during various stages of the template process flows outlined in FIGS. 36 and 37. This embodiment uses a backside lithography mask design as shown in FIG. 77 (other types of backside mask patterns for backside release channels are also possible). FIG. 78 shows the backside lithography mask shown in FIG. 77, with the frontside hexagonal-prism array mask pattern shown as a superimposed gray pattern for reference (to show the relative alignment of the frontside and backside masks patterns).

Figure 76:
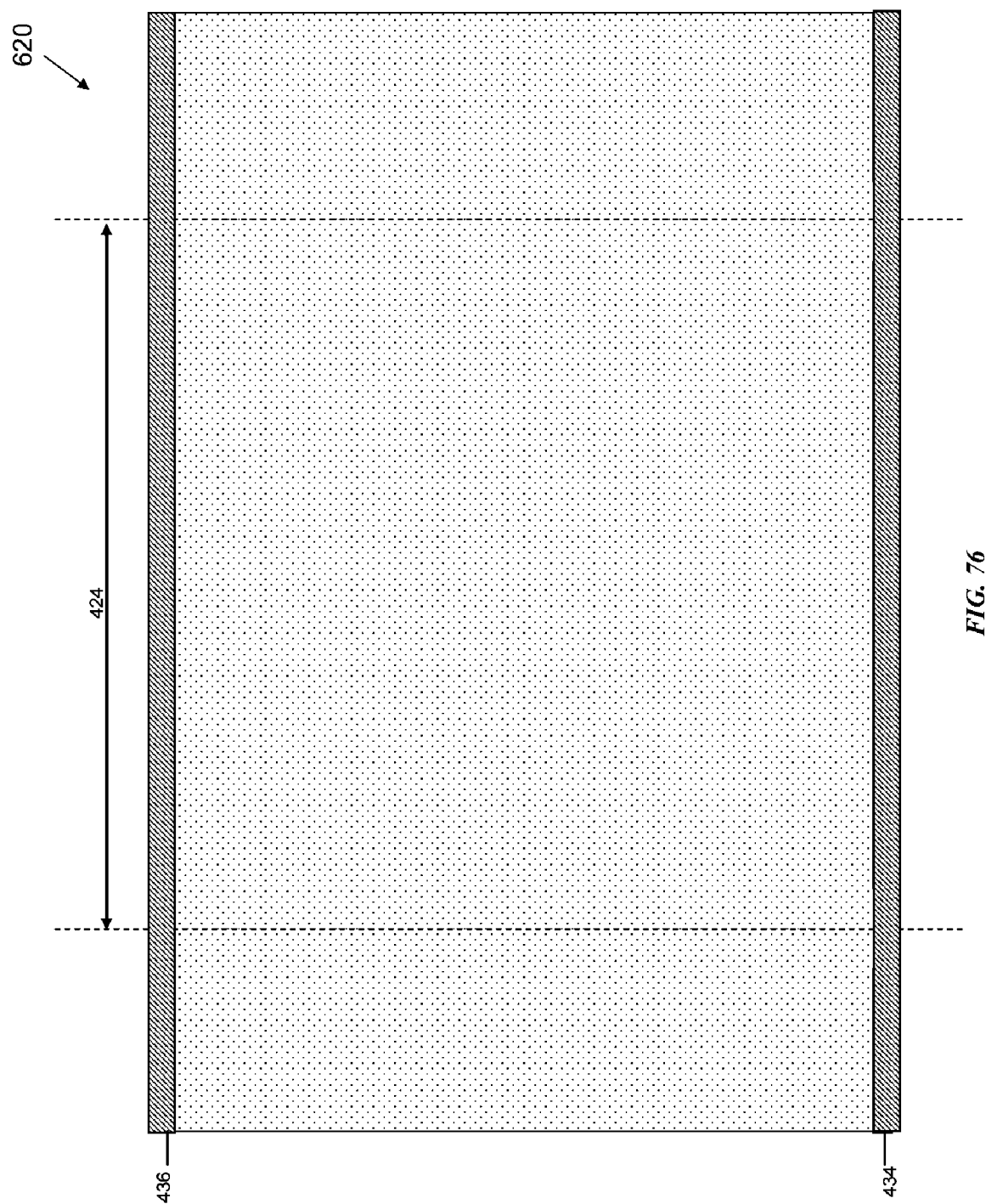
Figure 79:
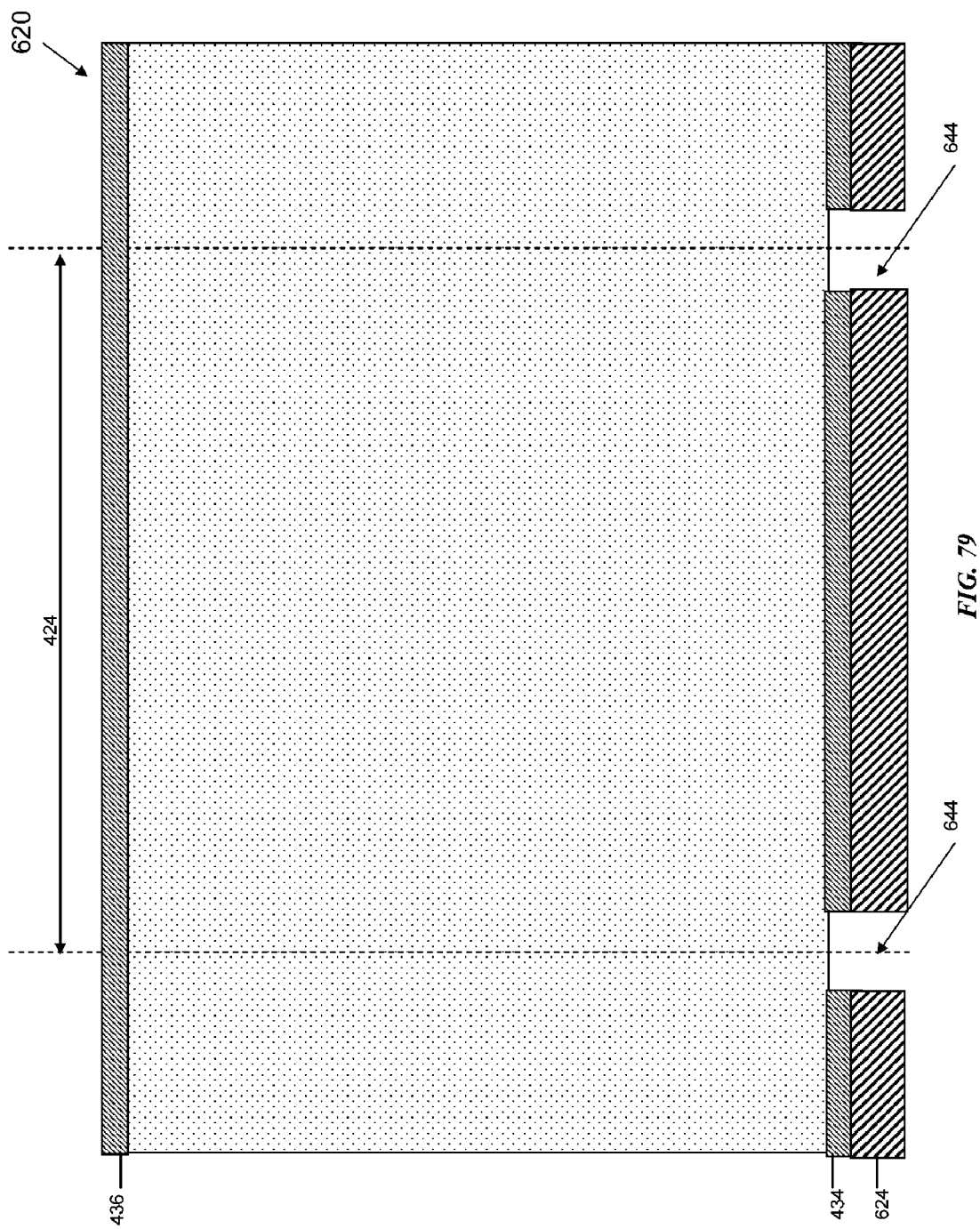
Figure 80:
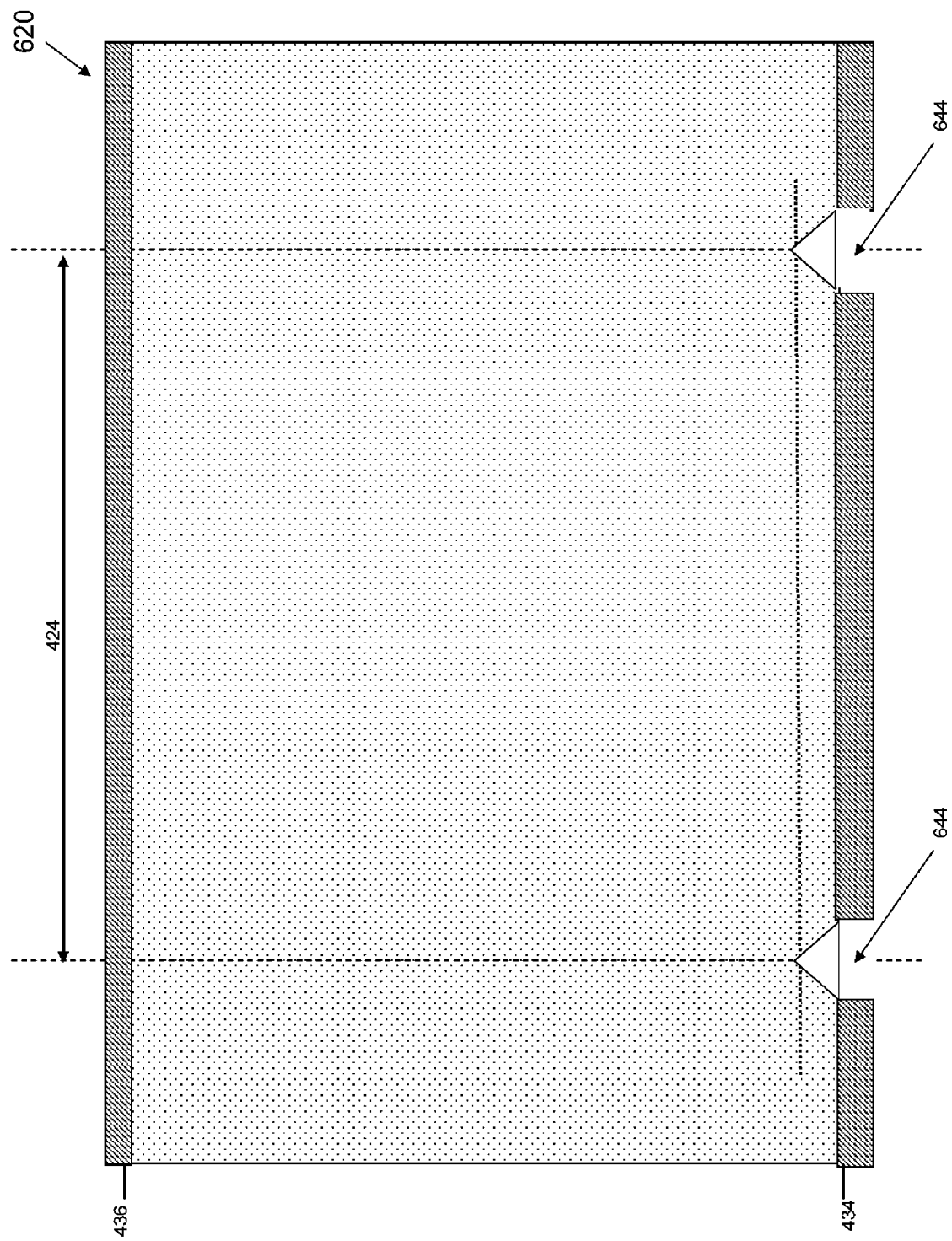
Figure 81:
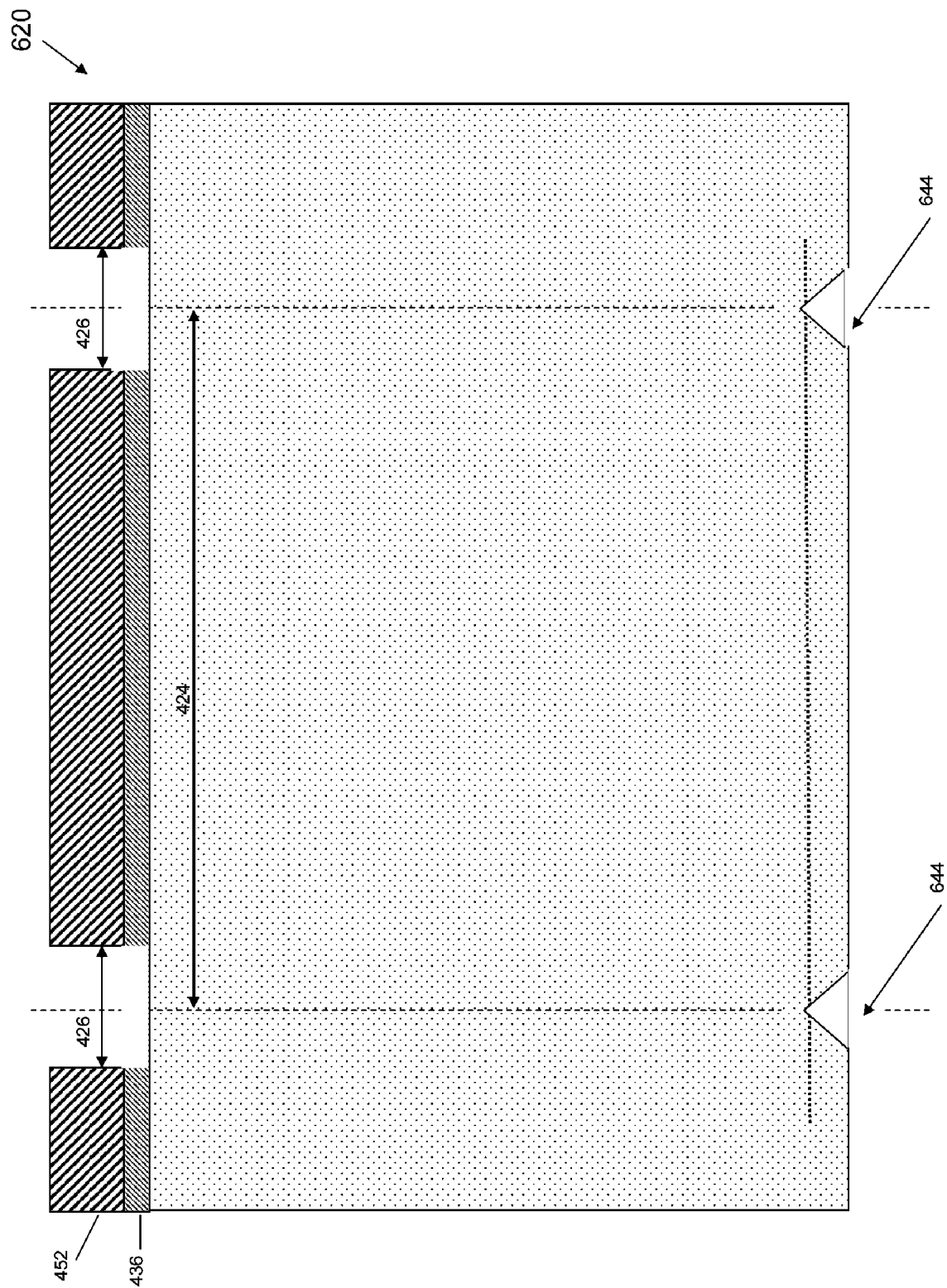
Figure 82:
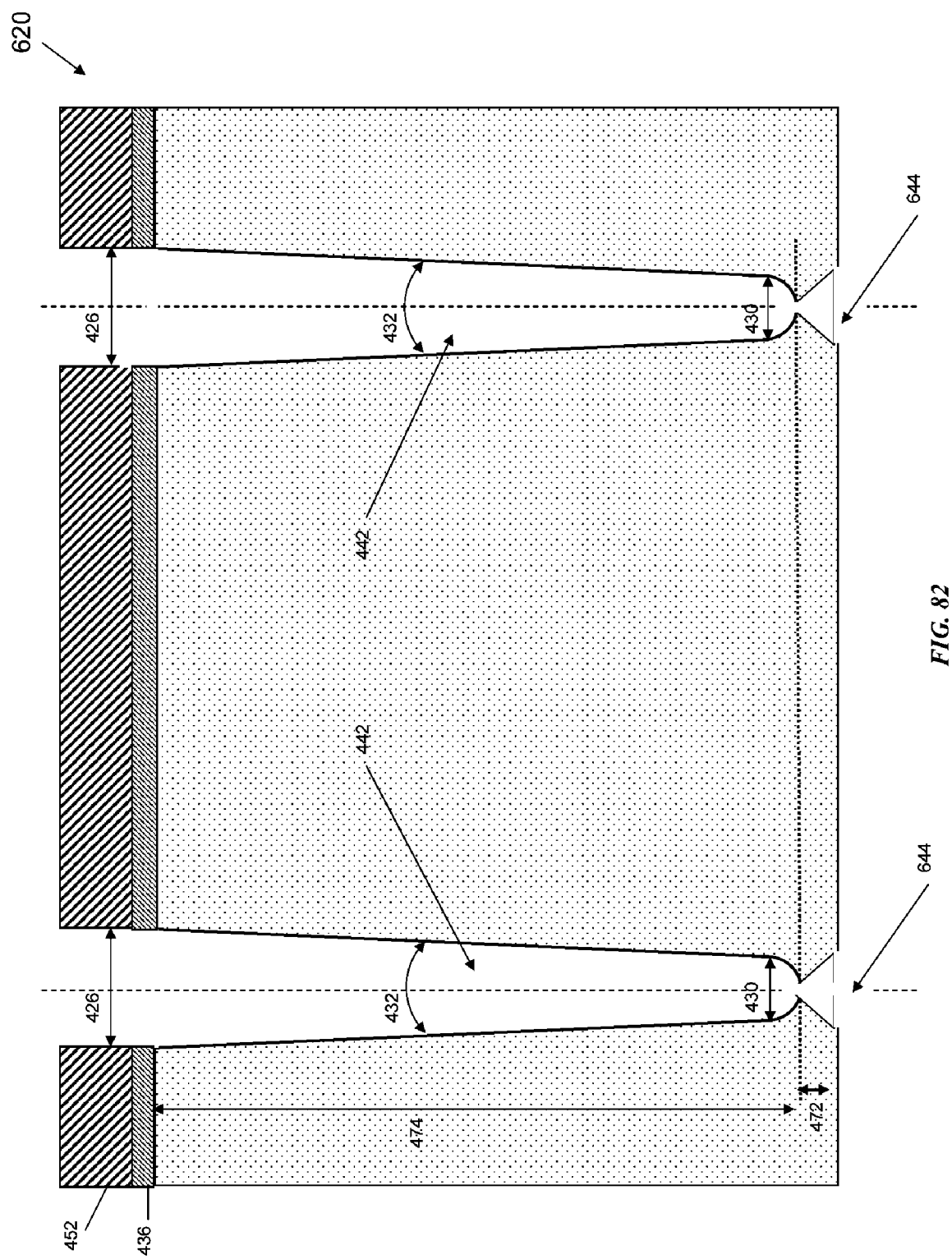
Figure 83:
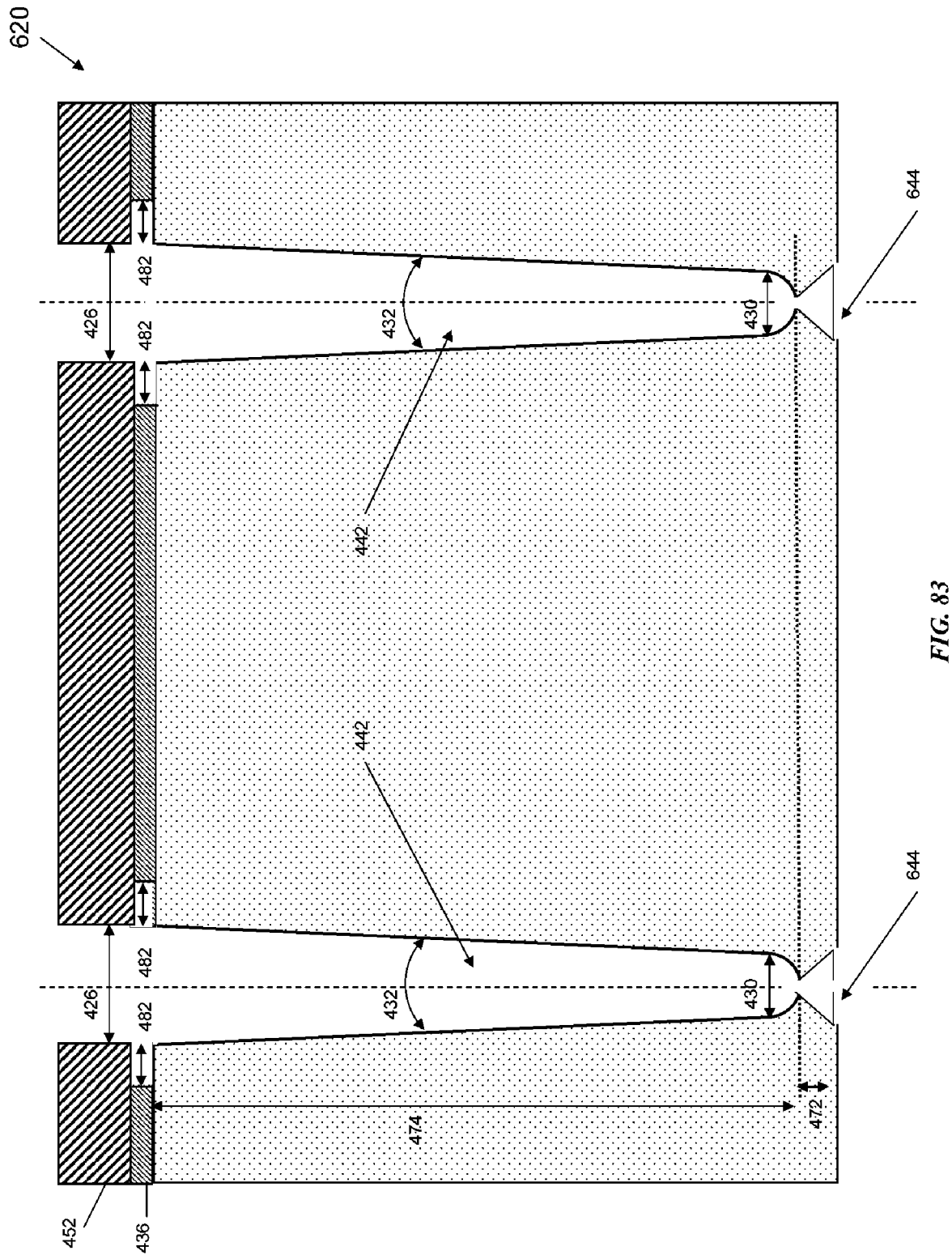
Figure 84:
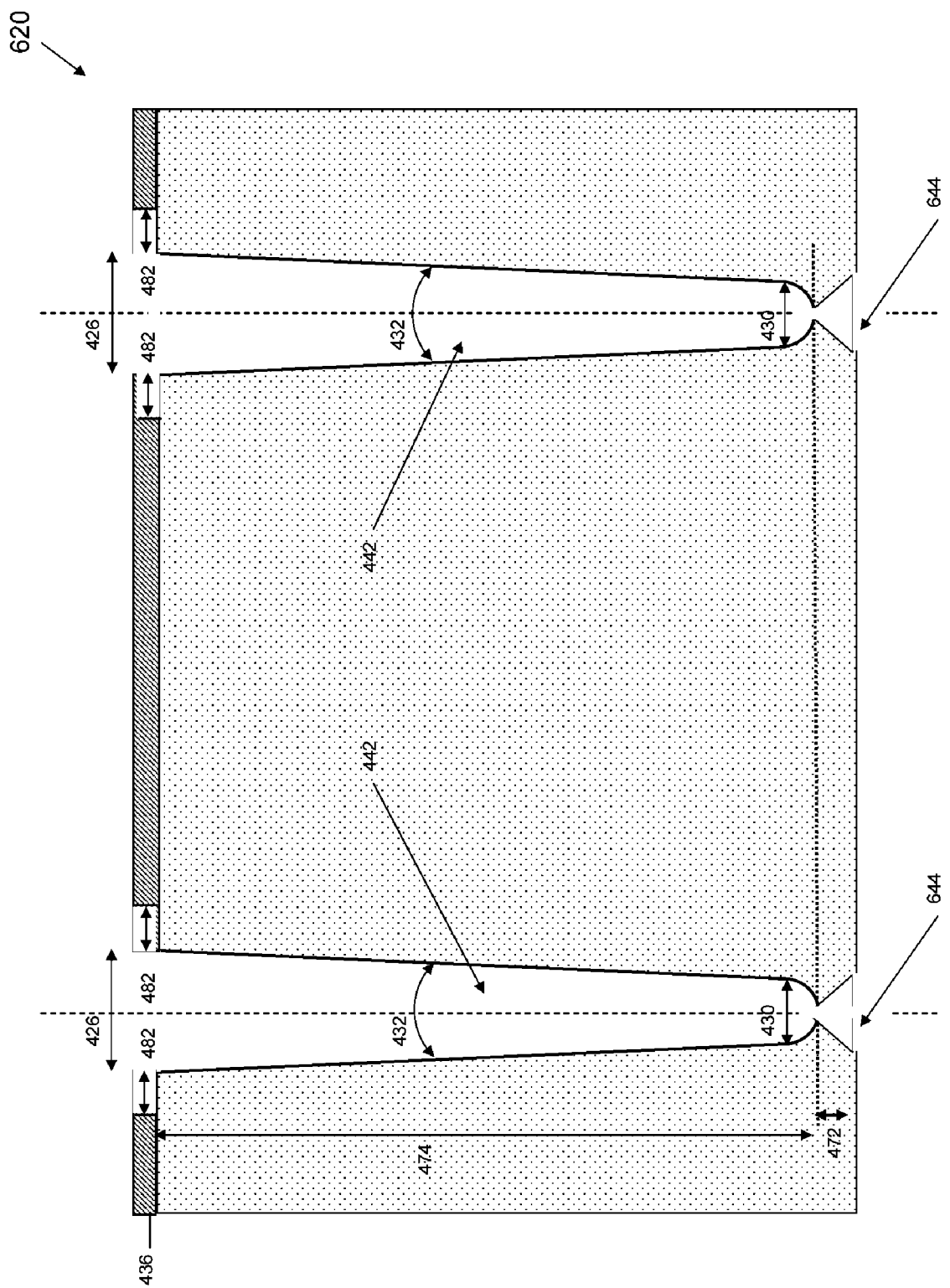
Figure 85:
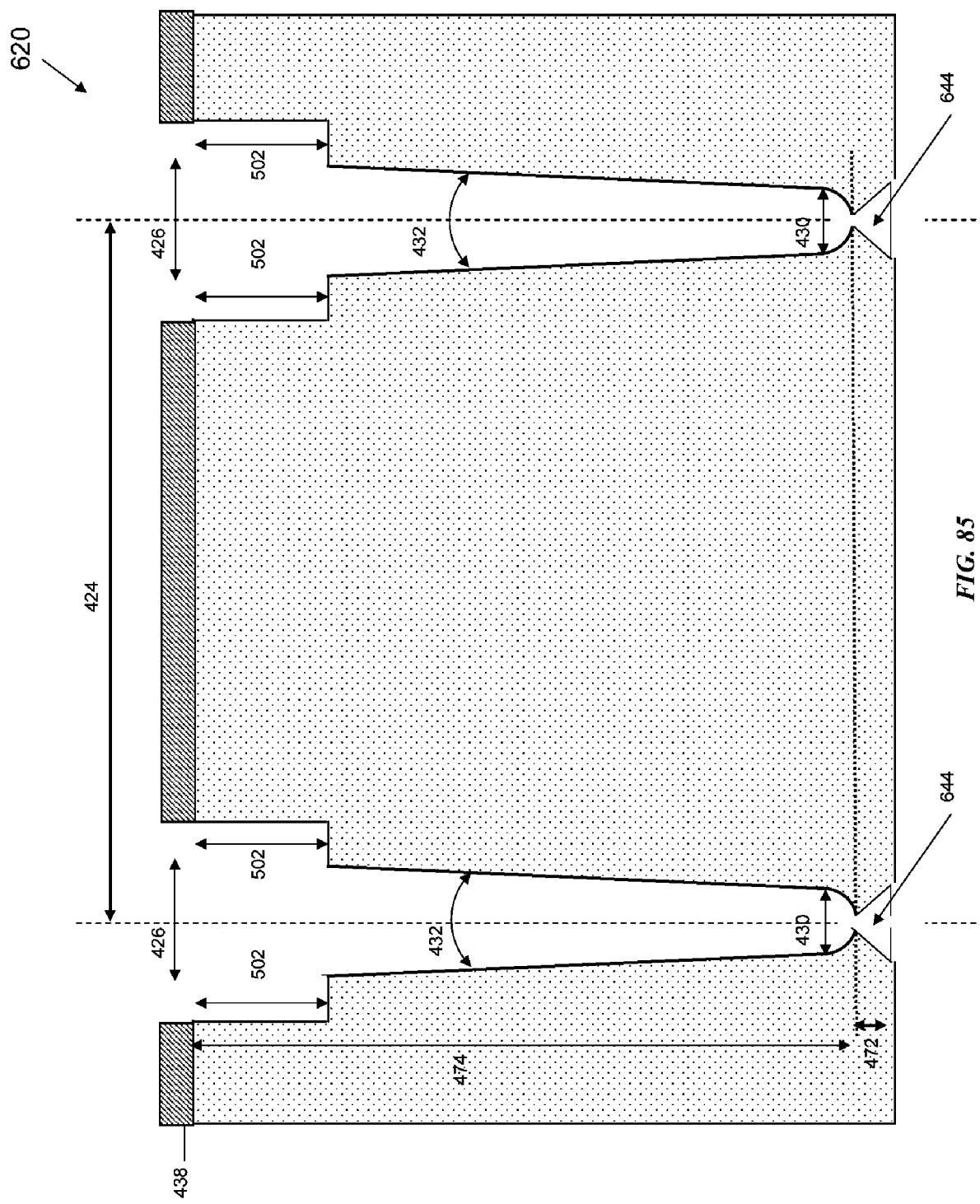

FIG. 76 is substantially similar to FIG. 58 above, showing an initial n-type (e.g., phosphorus doped) [100] substrate 620. FIG. 79 is substantially similar to FIG. 59 above, except the mask design aligns backside release channels 644 with the bottoms of deep prism trenches 442 to be formed. FIG. 80 shows the substrate 620 shown in FIG. 79 after anisotropic wet etching (e.g., using anisotropic alkaline etching such as KOH-based etching) of the template backside to form an array of pyramids with square bases (note that the anisotropic etching may also be performed using anisotropic reactive ion etching and the backside openings may be circular or other shapes instead of square-shaped). FIG. 81 shows the substrate 620 in FIG. 80 after frontside patterning and after wet oxide etch through patterned resist in preparation for formation of deep trenches. This also removes the backside oxide layer 434. FIG. 82 shows the substrate 620 in FIG. 81 after formation of hexagonal-prism trenches 442 using deep RIE (DRIE). Note that the bottoms of prism trenches 442 essentially align with the backside release channel holes 644. FIG. 83 shows the substrate 620 in FIG. 82 after timed selective isotropic hard mask (in one embodiment $SiO_2$) wet etch to form controlled lateral undercuts 482 under patterned photoresist. FIG. 84 shows the substrate 620 in FIG. 83 after top photoresist 452 strip using a photoresist stripper. FIG. 85 shows the substrate 620 in FIG. 84 after anisotropic silicon etch (using the oxide layer as a hard mask) to form wider trenches (top shoulders) with controlled height (L) 502 on top of the narrower and deeper hexagonal-prism within-wafer trenches 442. FIG. 86 shows the substrate 620 in FIG. 85 after isotropic oxide etch to strip top oxide 436. After this step an optional timed isotropic silicon wet etch may be performed in HNA or TMAH (or another suitable isotropic silicon wet etchant) to etch approximately 5 to 500 nanometers of silicon to remove any DRIE-induced trench sidewall contaminants (such as metallic and/or polymeric contaminants) and surface damage. At this point, the substrate 620 may serve as a template for formation of 3-D thin-film TFSC substrates. Again as described before, the combination of deep trenches and wider shallow trenches (top shoulders) may be formed using a single DRIE process sequence (anisotropic deep trench RIE followed by a less anisotropic or more isotropic silicon plasma etch to form the top shoulders), thus, eliminating the need for the top dielectric hard mask layer 436 and the associated process steps reflected in FIGS. 83 and 84. This alternative process flow also eliminates the need for the oxide hard mask (thus, photoresist can be applied directly on silicon for frontside and backside patterning steps).

Various embodiments of the templates shown earlier may be used to produce one hexagonal-prism (or other prism geometries) 3-D thin-film TFSC substrate per process pass. It is also possible to fabricate templates which are capable of producing two hexagonal-prism 3-D thin-film TFSC substrates concurrently per process pass (thus, doubling the 3-D TFSC substrate fabrication throughput). FIGS. 87 and 88 show cross-sectional views of two such templates capable of doubling the hexagonal-prism 3-D thin-film TFSC substrate production throughput.

FIG. 87 shows a Y-Y cross-sectional view of a stacked template structure 650 for fabricating two hexagonal prism 3-D thin-film TFSC substrates per process pass. FIG. 87 shows a template structure 650 with in-wafer trenches 442. Note the similarity to the template 440 in FIG. 40. Template structure 650 is made of two similar templates, a top template 652 and a rear template 654, which are first fabricated based on one of the embodiments outlined before and then bonded together backside to backside (e.g., using direct thermal bonding of the wafer backsides or thermal bonding of dielectric layers formed on the wafer backsides) at a backside interface 656. Note that the dielectric hard masks on the template frontsides may not be present (they are optional for subsequent use of the templates for TFSC substrate fabrication). FIG. 88 shows Y-Y cross-sectional view of an alternative stacked template structure 660 for concurrently fabricating two hexagonal-prism 3-D TFSC substrates per process pass. FIG. 88 shows a template structure 660 with through-wafer trenches 422. Note the similarity to the template 420 in FIG. 39. Template structure 660 is made of two similar templates, a top template 662 and a rear template 664, which are first fabricated based on one of the embodiments outlined before and then bonded together backside to backside (e.g., either through direct bonding of the substrate backsides or using thermal bonding of dielectric layers formed on the wafer backsides) at a backside interface 656. Note that the dielectric hard masks on the template frontsides may not be present (they are optional for subsequent use of the templates for TFSC substrate fabrication).

While FIGS. 87 and 88 show representative stacked template structures suitable for higher throughput fabrication of hexagonal-prism dual-aperture 3-D thin-film TFSC substrates without rear base layers, it is also possible to make stacked template structures for fabrication of hexagonal prism 3-D thin-film TFSC substrates with rear base layers. This may be done by first fabricating the suitable individual templates based on one of the process flow embodiments shown in FIGS. 36 and 37, corresponding to the template structure shown in FIG. 40 (this one shown with in-wafer trenches; it is also possible to fabricate templates with through-wafer trenches such as the structures shown in FIG. 51 or FIG. 52). Assuming we use a pair of templates with the structure shown in FIG. 40 (or a template structure with wider and shallow trenches or shoulders stacked on top of the deep trenches), these templates are then processed to create a series of large lateral/radial microchannels in conjunction with an array of holes/openings which communicate with the rears of trenches. The two templates are then bonded together backside-to-backside (e.g., by thermal bonding of the backside surfaces together). The radial/lateral microchannels sandwiched between the bonded wafers extend all the way to the periphery of the stacked/bonded templates and provide easy access for the wet etchant to reach the sacrificial layer (e.g., porous silicon formed by anodic etching of monocrystalline or microcrystalline silicon layer) in each template in order to selectively remove the sacrificial layer in each template and to release the embedded hexagonal-prism 3-D thin-film TFSC substrates from the top and rear templates in the stack (thus, concurrently forming two hexagonal-prism 3-D thin-film TFSC substrates per process pass). The microchannels on the template backsides may be formed before template bonding by laser ablation or a combination of lithography and etch. The microchannels are sufficiently large to allow for easy movement of wet etchant and etch byproducts between the inner portions of the wafers in the bonded stack and the peripheral openings of the microchannels in the middle of the bonded stack.

While one embodiment of the 3-D TFSC substrate unit cell structure of this disclosure is a regular hexagonal-prism unit cell (with equilateral hexagonal cross sections or ridges), this disclosure also covers a wide range of other 3-D prism unit cell geometrical designs with various polygon prism unit cell aperture designs. The prism array may be a uniform array of a single polygon prism unit cell or a hybrid (two or more) of multiple polygon-prism unit cell designs.

Figure 89B:
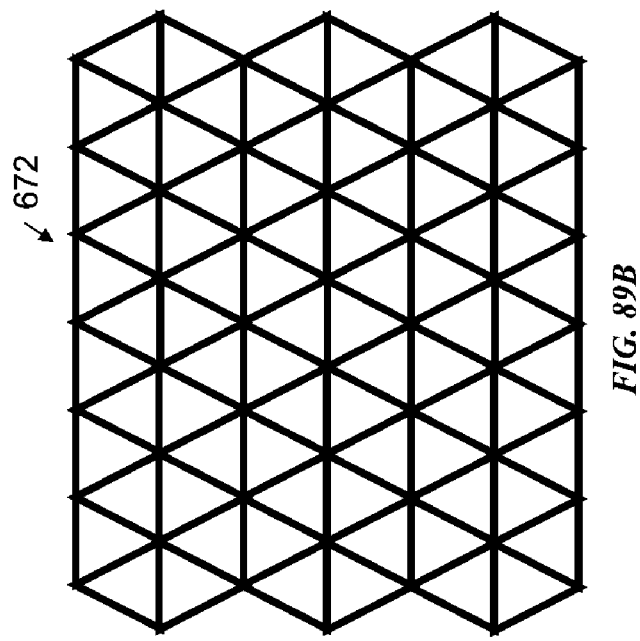
Figure 89A:
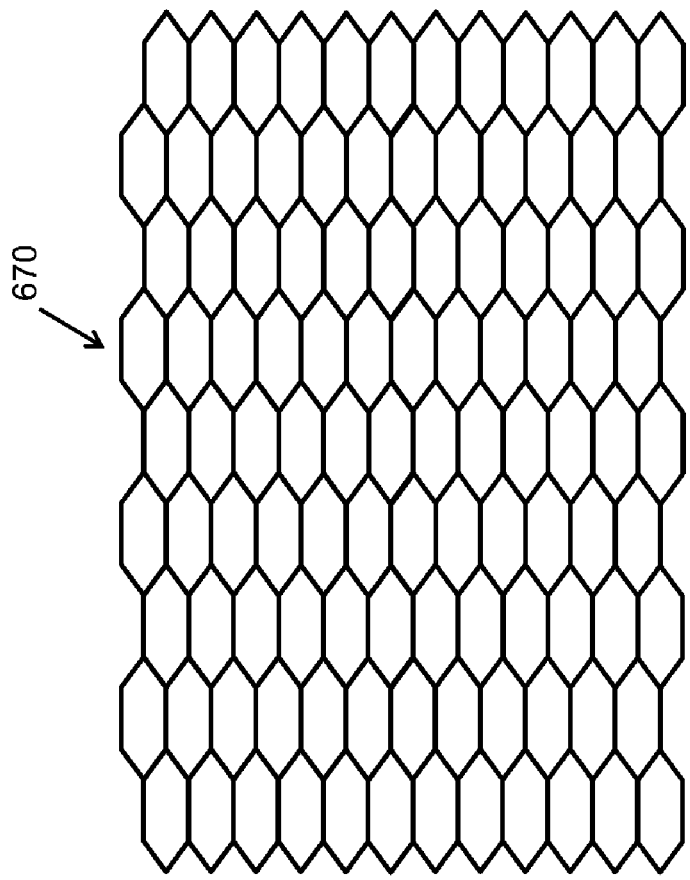
Figure 90B:
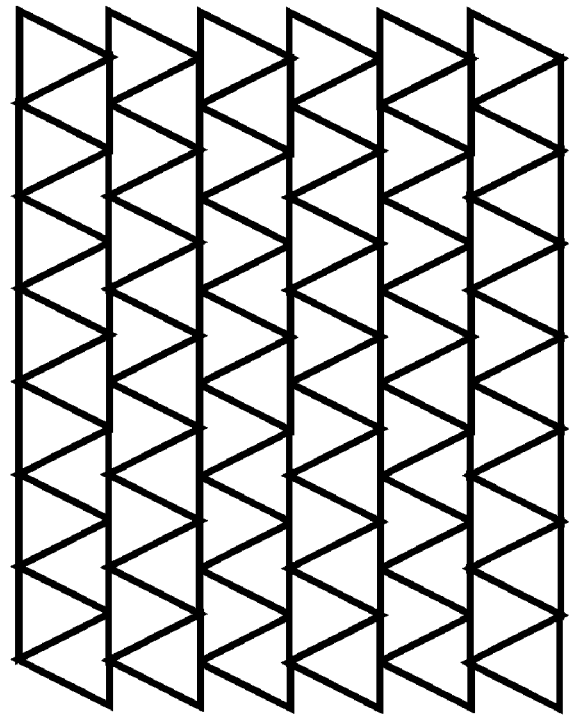
Figure 90A:
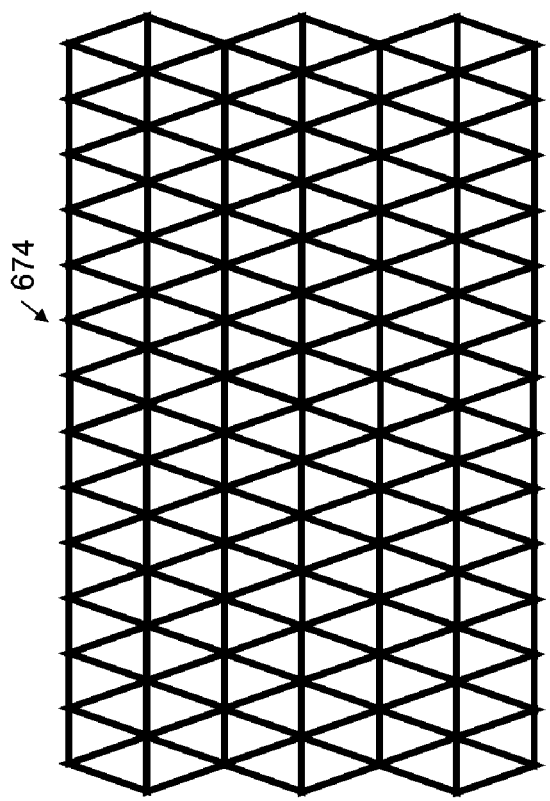
Figure 92B:
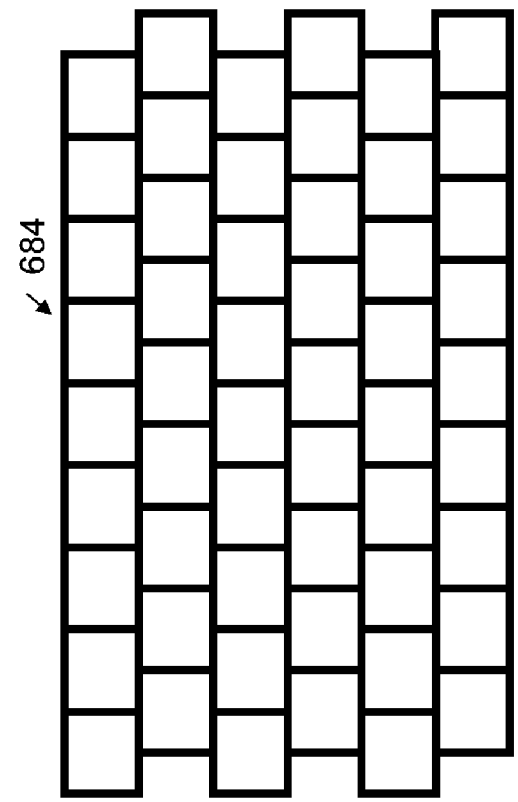
Figure 92A:
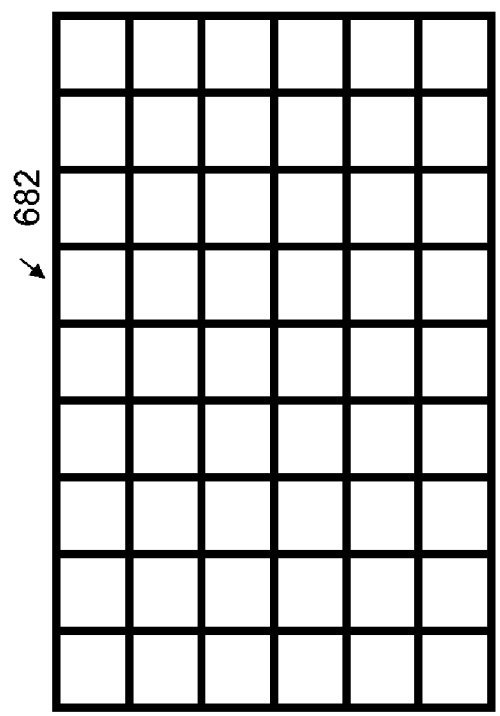
Figure 93B:
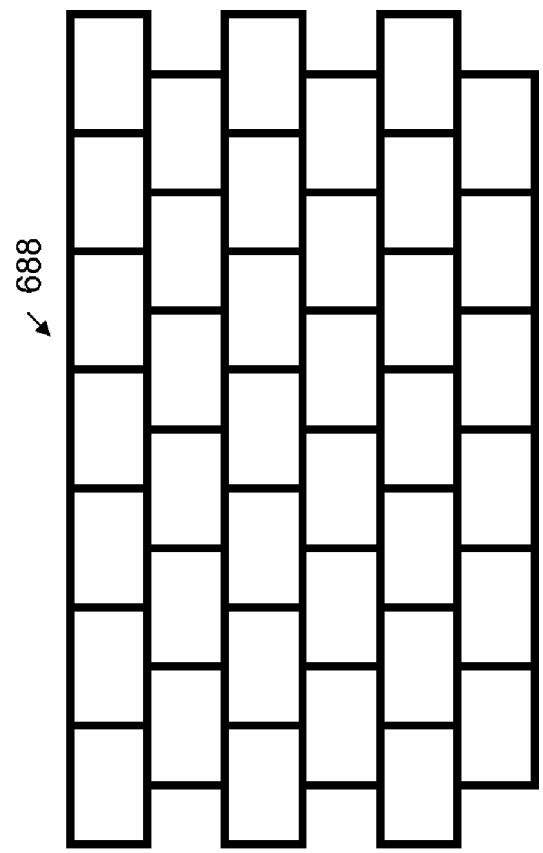
Figure 93A:
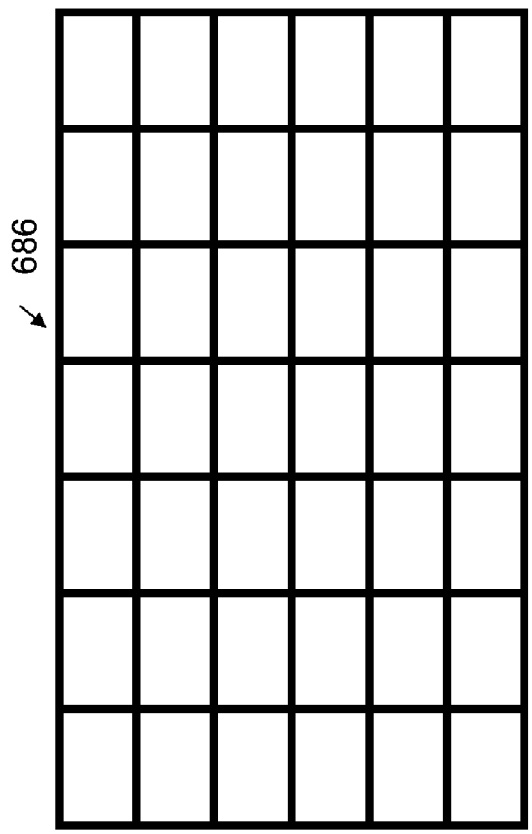
Figure 94B:
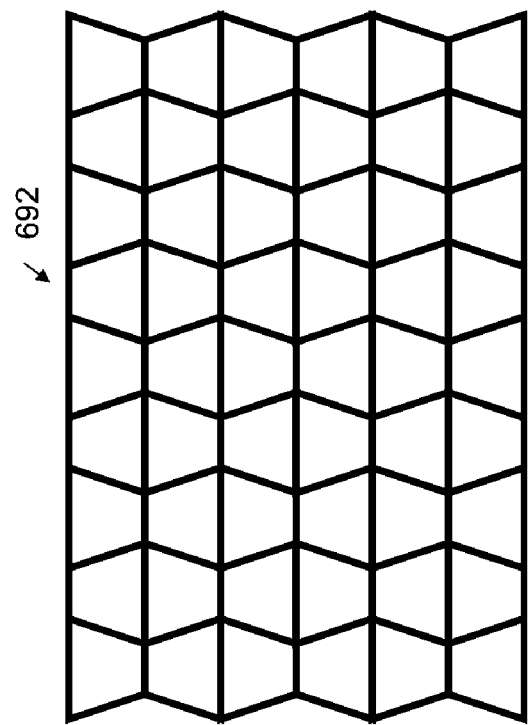
Figure 94A:
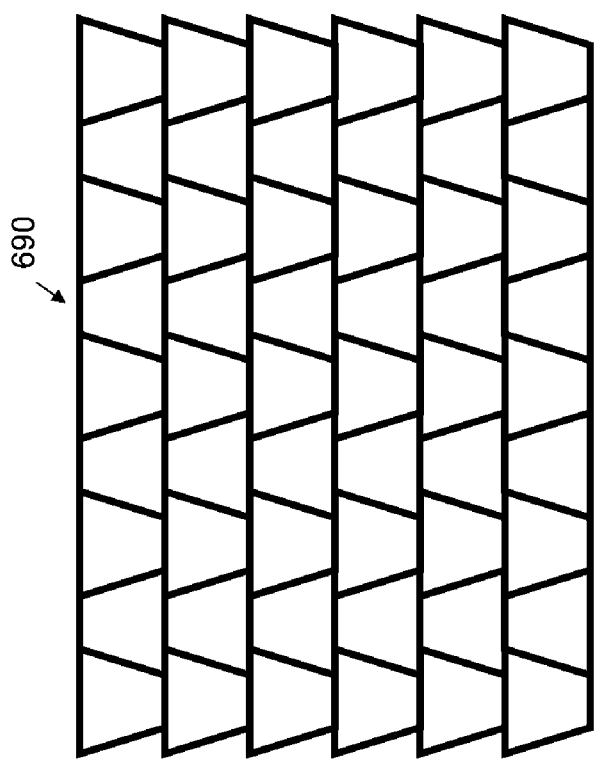
Figure 95B:
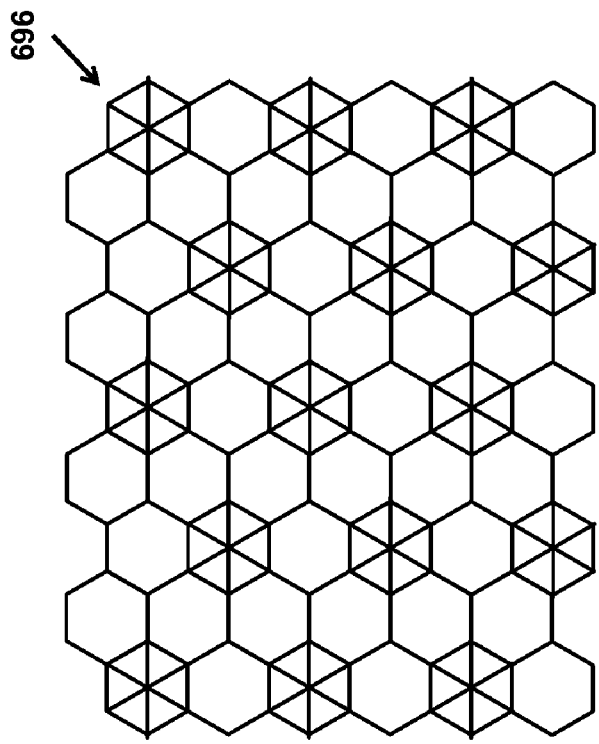
Figure 95A:
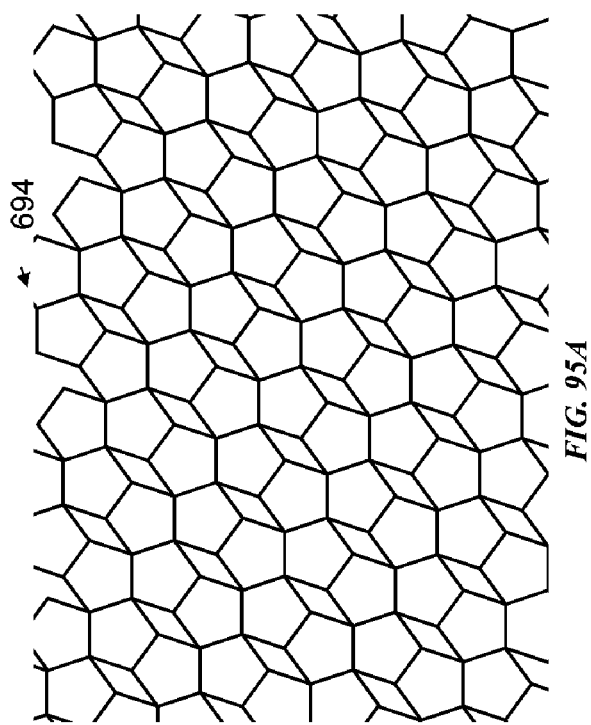
Figure 95C:
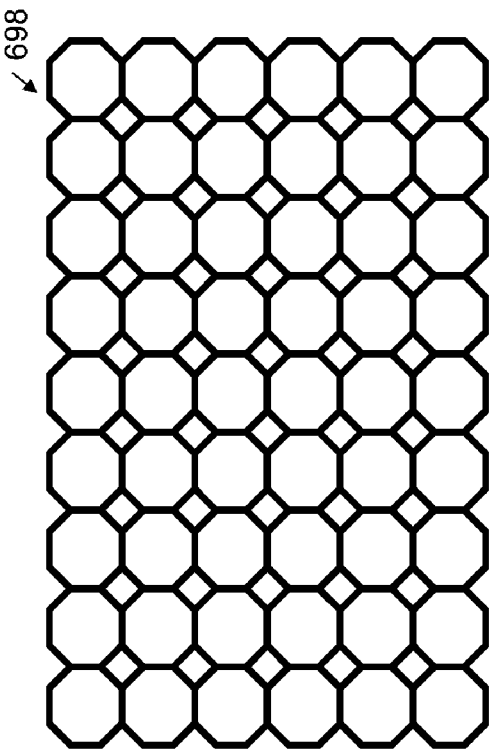

FIGS. 89A through 95C show examples of several 3-D polygon-prism thin-film TFSC substrates with various unit cell prism geometrical designs and arrangements. FIG. 89A shows a top view 670 of a prism design with hexagonal unit cell angles not equal to one another or 120°. FIG. 89B shows a top view 672 of a prism design with equilateral triangular prism unit cells. FIG. 90A shows a top view 674 of a prism design with non-equilateral triangular prism unit cells. FIG. 90B shows a top view 676 of a prism design with alternating equilateral triangular prism unit cells. FIG. 91A shows a top view 678 of a prism design with offset parallelogram prism unit cells. FIG. 91B shows a top view 680 of a prism design with parallelogram prism unit cells. FIG. 92A shows a top view 682 of a prism design with aligned square prism unit cells. FIG. 92B shows a top view 684 of a prism design with shifted square prism unit cells. FIG. 93A shows a top view 686 of a prism design with aligned rectangular prism unit cells. FIG. 93B shows a top view 688 of a prism design with shifted rectangular prism unit cells. FIG. 94A shows a top view 690 of a prism design with trapezoidal prism unit cells. FIG. 94B shows a top view 692 of a prism design with alternating trapezoidal prism unit cells. FIG. 95A shows a top view 694 of a prism design with hybrid pentagon-parallelogram prism unit cells. FIG. 95B shows a top view 696 of a prism design with hybrid hexagon-triangle prism unit cells. FIG. 95C shows a top view 698 of a prism design with hybrid octagon-square prism unit cells.

In addition to these alternative TFSC designs, many other polygon-prism as well as other non-polygon prism unit cell designs (e.g., cylindrical-prism, elliptical-prism, etc.) are covered by this disclosure. In general, the 3-D TFSC substrates of this disclosure cover any arrays of one or more prism unit cells arranged to make a lightweight, enlarged-surface-area thin-film TFSC substrate for solar cell fabrication. Typically, there are millions (or as few as thousands) of these prism unit cells forming a large-area (e.g., 210 mm×210 mm) 3-D TFSC substrate. In one embodiment, the 3-D TFSC substrate film thickness is in the range of 1 to 30 microns, and preferably in the lower-end range of 2 to 10 microns. This is substantially less (by a factor of roughly 20× to 100×) than the current state-of-the-art silicon solar cell wafer thickness (roughly 200 microns).

As noted in FIG. 9, the templates described above may be used for formation of 3-D thin-film TFSC substrates, which are then used in the formation of 3-D TFSCs, which are used in thin-film solar module assemblies of the disclosed subject matter.

FIGS. 96 through 102 show various embodiments of hexagonal-prism 3-D thin-film TFSC substrate fabrication process flows for fabricating hexagonal-prism (or other prism-array shapes) dual-aperture 3-D thin-film TFSC substrates without rear base layers based on the use of templates described earlier. These 3-D thin-film TFSC substrates are then used in the formation of 3-D dual aperture TFSCs. The resulting hexagonal prism 3-D dual aperture TFSCs are uniquely suited for aesthetically appealing solar glass modules as shown in FIG. 21.

All of the embodiments shown in FIGS. 96 through 102 use sacrificial layer formation (e.g., porous silicon sacrificial layer) and trench-fill deposition processes (e.g., epitaxial silicon deposition) which may be highly conformal, for conformal formation of the sacrificial (porous silicon) layer and subsequent seamless void-free filling of the trenches with a semiconductor absorber layer such as in-situ-doped (e.g., in-situ boron doped) monocrystalline or multicrystalline silicon layer. One embodiment uses a patterned single-crystal (monocrystalline) silicon or multicrystalline silicon (mc-Si) square-shaped (or round) template, with dimensions of approximately 150 mm×150 mm to over 200 mm×200 mm. Alternative embodiments may use much lower cost metallurgical-grade or solar-grade silicon.

FIG. 96 shows an embodiment of a process flow 700 for fabrication of self-supporting (free standing) hexagonal-prism 3-D thin-film TFSC substrates using layer release processing. This process flow results in dual-aperture hexagonal-prism 3-D TFSC substrates with hexagonal prisms with open apertures formed on both the top and rear (there is no rear base layer). In step 702, a patterned hexagonal-prism (or another prism array) template is provided. This template has already been processed to form an embedded array of deep hexagonal-prism trenches. There is a patterned dielectric (oxide and/or nitride) hard mask on the template top and rear surfaces. Step 704 involves a multi-layer blanket epitaxial semiconductor deposition in an epitaxial growth reactor. Step 704 first involves an $H_2$ or $GeH_4/H_2$ in-situ bake cleaning, which is performed after a standard pre-epitaxial wet clean (the latter if necessary). Next, a thin sacrificial epitaxial layer is deposited on the frontside only. In one embodiment, $Ge_xSi_{1-x}$ is used for the sacrificial epitaxial layer and is between 10 and 2000 nanometers (in another embodiment a layer of porous silicon is directly deposited for the sacrificial layer). Next, a doped monocrystalline silicon epitaxial layer is deposited (in one embodiment, on the frontside only). In one embodiment, the layer is p-type, boron-doped and has a thickness between 1 and 30 microns. Step 706 involves selective silicon etch to selectively strip the top silicon layer, stopping on the sacrificial layer. First, the top silicon layer is removed using a selective (wet or dry) silicon etch process until the top $Ge_xSi_{1-x}$ epitaxial layer (or porous silicon) or oxide/nitride hard mask is exposed. When using a plasma (dry) etch process, one embodiment uses optical end-point detection to ensure complete removal of the top silicon layer and exposure of the top sacrificial ($Ge_xSi_{1-x}$ or porous silicon) layer. Step 708 involves 3-D thin-film TFSC substrate release using a selective etchant to etch the sacrificial layer. A highly selective isotropic (in one embodiment, wet) etch of $Ge_xSi_{1-x}$ is performed, with very high selectivity with respect to silicon (in one embodiment, with etch selectivity much better than 100:1). In one embodiment, a mixture of hydrofluoric acid, nitric acid and acetic acid (HNA) is used to etch the sacrificial $Ge_xSi_{1-x}$ layer (etchants such as $H_2O_2+H_2O$ or TMAH may be used to selectively etch porous silicon). Alternatively, a mixture of ammonia, peroxide, and water ($NH_4OH+H_2O_2+H_2O$) may be used. This process releases the crystalline silicon layer as a hexagonal-prism 3-D thin-film TFSC substrate, which may then be used for subsequent 3-D TFSC fabrication.

Figure 97:
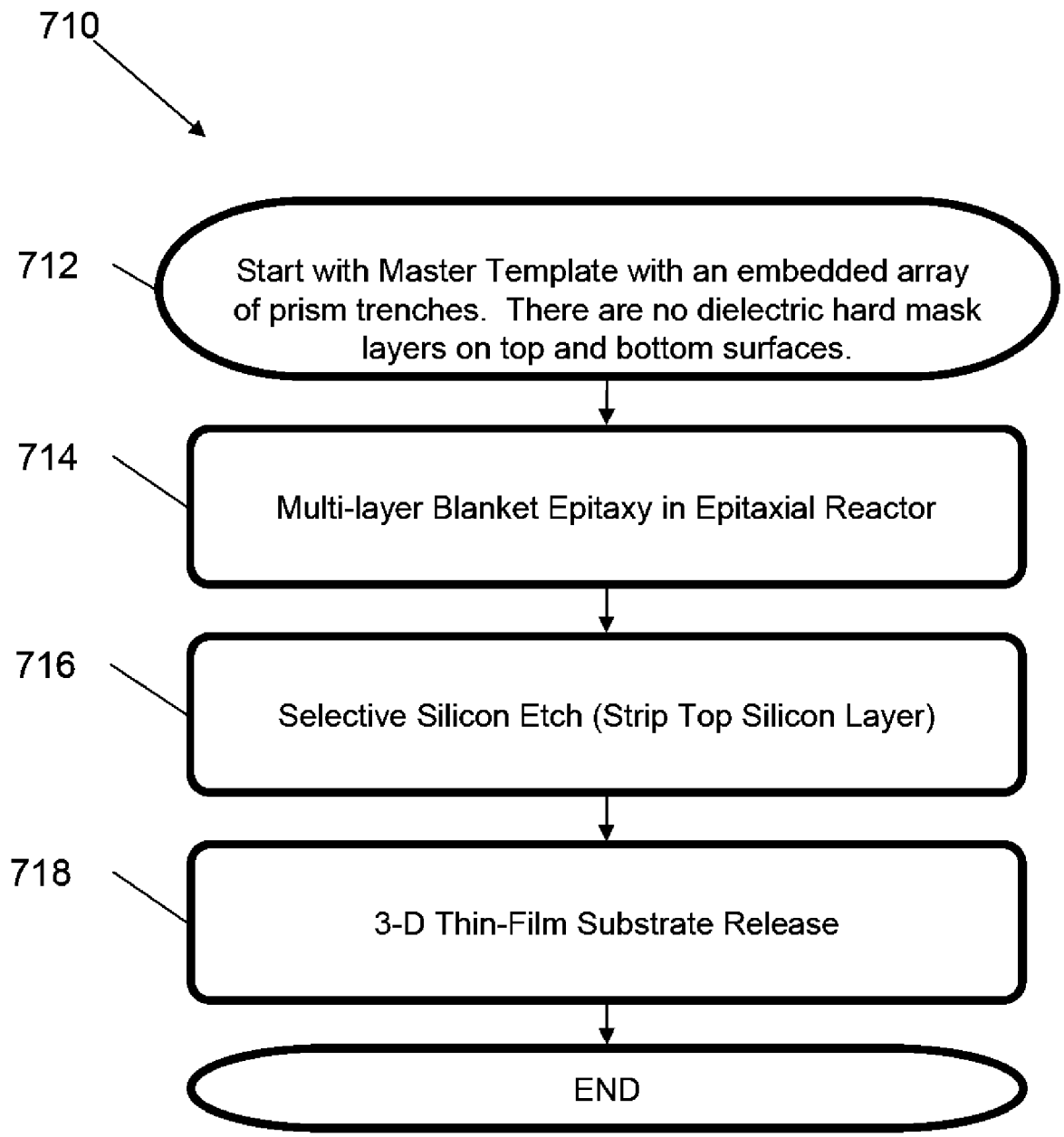

FIG. 97 shows a process flow 710 of an embodiment of a process flow for fabrication of self-supporting hexagonal-prism dual-aperture 3-D thin-film TFSC substrates using layer release processing. This process flow results in hexagonal-prism 3-D thin-film TFSC substrates comprising hexagonal-prisms with open apertures formed on both the 3-D thin-film TFSC substrate top and rear (there is no rear base layer). In step 712, a patterned hexagonal-prism template is provided. This template has already been processed to form an embedded array of deep trenches as described before. In this case, there are no dielectric hard mask layers on the template top and rear surfaces. Step 714 (multi-layer blanket epitaxial deposition) corresponds to step 704 in FIG. 96; step 716 (selective silicon etch) corresponds to step 706; step 718 (substrate release) corresponds to step 708. The resulting hexagonal-prism 3-D thin-film TFSC substrate may then be used for subsequent 3-D TFSC fabrication.

In the process flows described in FIGS. 96 and 97, while crystalline $Ge_xSi_{1-x}$ is used as a sacrificial layer between the template and the in-situ-doped epitaxial silicon layer, other suitable sacrificial layers may be used. Alternative suitable materials include crystalline porous silicon (embodiments include microporous or mesoporous silicon), crystalline GeSiC, or SiC, among others. In the embodiments which use $Ge_xSi_{1-x}$ as the sacrificial layer, the $Ge_xSi_{1-x}$ layer is preferably between 50 nanometers and 3 microns thick, and more preferably between 0.1 and 1 micron. The germanium mole fraction (x) in the sacrificial layer is preferably between x=10% to x=45%, and more preferably between x=25% to x=40% in order to provide sufficient etch selectivity with respect to silicon. The germanium mole fraction should be high enough to achieve an acceptable high etch selectivity for removal of the $Ge_xSi_{1-x}$ layer with minimal etching of silicon, while low enough to produce high-quality epitaxial silicon with sufficiently low defect density over the $Ge_xSi_{1-x}$ sacrificial layer. The sacrificial layer may have a fixed germanium mole fraction throughout the sacrificial $Ge_xSi_{1-x}$ layer or may also have graded mole fraction transition regions between the $Ge_xSi_{1-x}$ layer and the template as well as between the $Ge_xSi_{1-x}$ layer and the top in-situ-doped epitaxial silicon layer. Graded mole fraction transition regions result in a trapezoidal germanium mole fraction profile, first increasing from an x of 0% to an x of between 25% and 40% in the first transition region next to the template, then a $Ge_xSi_{1-x}$ region with a fixed x between 25% and 40%, and a second transition region with x decreasing from an x of 40% to an x of 0% under the in-situ-doped epitaxial silicon layer. The transition regions with graded x and the middle layer with a fixed x may each be roughly between 10 nanometers and 1 micron thick.

Depending on the emitter doping type (n-type or p-type), the in-situ base doping type is chosen to be p-type (e.g., boron) or n-type (e.g., phosphorus). The embodiments shown in FIGS. 96 and 97 provide examples of boron-doped hexagonal prism 3-D thin-film TFSC substrates which may be used to fabricate TFSCs with n-type, phosphorus-doped selective emitters. In an alternative embodiment, all the doping polarities may be inverted, resulting in phosphorus-doped hexagonal-prism 3-D thin-film TFSC substrates which may be used for fabricating cells with boron-doped selective emitters.

Figure 98:
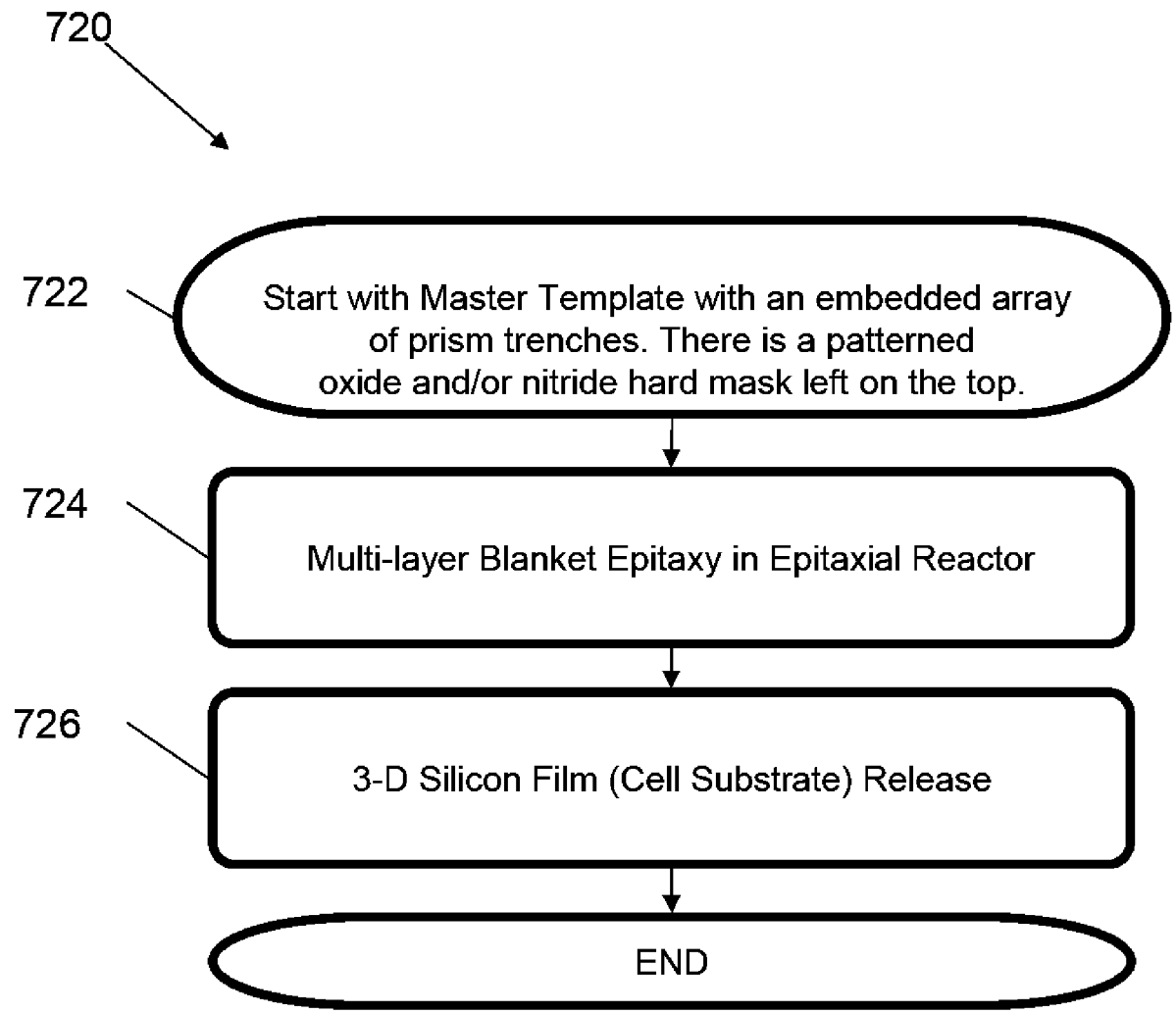

FIGS. 96 through 98 show embodiments of process flows which utilize $Ge_xSi_{1-x}$ as the sacrificial layer between the template and the epitaxial silicon TFSC substrate. FIGS. 96 and 97 depict embodiments of process flows which utilize blanket epitaxial silicon deposition as part of the process flow. On the other hand, FIG. 98 shows an alternative embodiment of a process flow 720 using selective epitaxial silicon deposition and layer release processing. The resulting 3-D dual-aperture thin-film TFSC substrates of FIG. 98 have open apertures on both substrate top and rear. In step 722, a patterned hexagonal-prism template is provided. This template has already been processed to form an embedded array of deep trenches. There is a patterned dielectric oxide and/or nitride (and/or another suitable dielectric such as diamond-like carbon or DLC, thin-film diamond, etc.) hard mask on the template top surfaces. Step 724 (multi-layer blanket epitaxy) corresponds to step 704 in FIG. 96. Note, however, that both the $Ge_xSi_{1-x}$ sacrificial layer and the epitaxial silicon layer are selectively grown inside the trenches only. No layer is grown on the template top dielectric layer due to selective epitaxy (there is a patterned dielectric hard mask on top, such as oxide, nitride, DLC, etc.). Step 726 (substrate release) corresponds to step 718 in FIG. 97. The hexagonal-prism 3-D thin-film TFSC substrate may then be used for subsequent 3-D TFSC fabrication.

Figure 99:
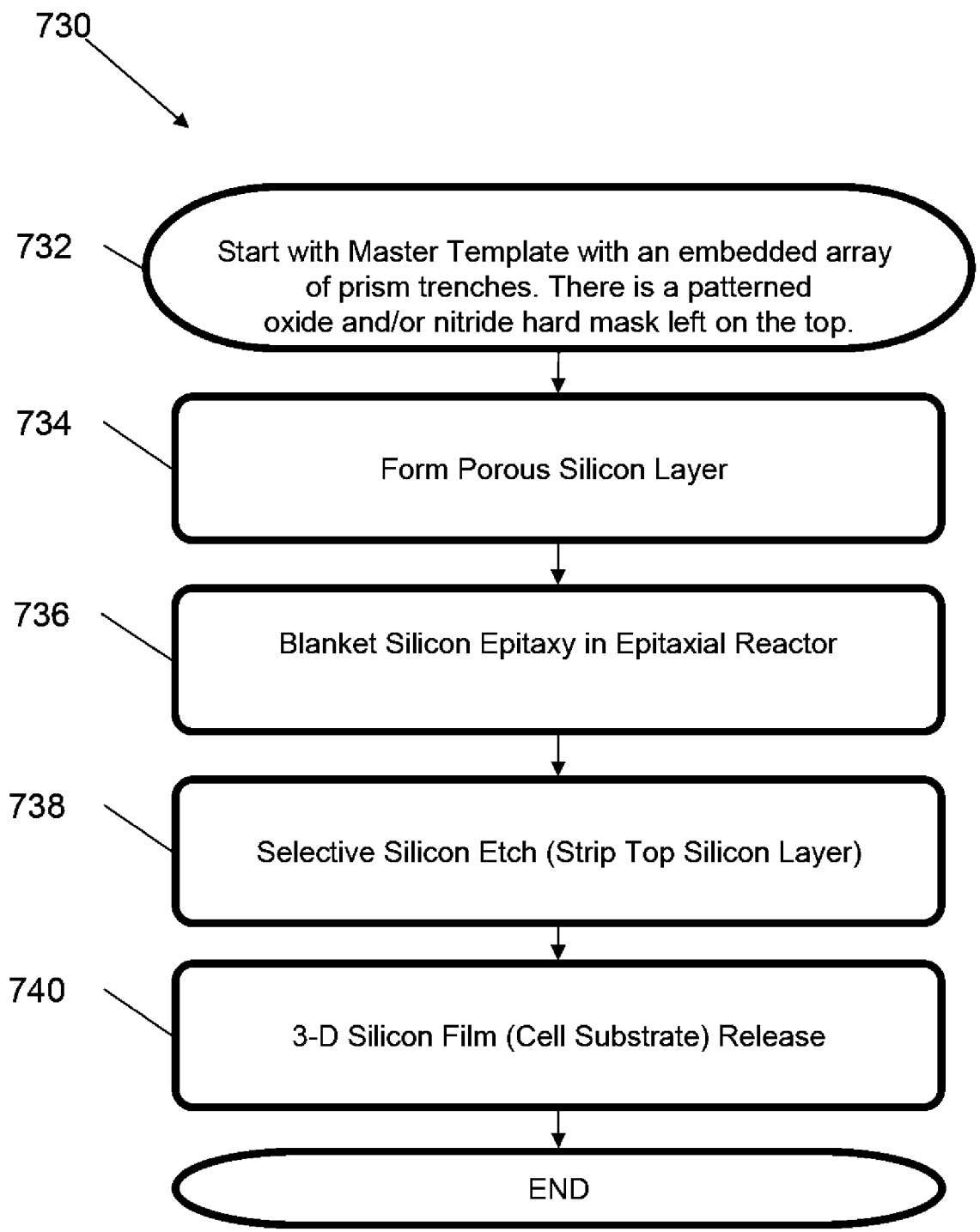

FIG. 99 depicts a process flow 730 of an embodiment of a process flow for fabrication of self-supporting hexagonal-prism 3-D dual-aperture thin-film TFSC substrates without rear base layers using layer release processing. Process flow 730 uses monocrystalline or quasi-monocrystalline porous (microporous or mesoporous) silicon (instead of $Ge_xSi_{1-x}$) as the sacrificial layer, and blanket epitaxial silicon fill. The dual-aperture hexagonal-prisms have open apertures on both top and rear. Step 732 (providing a substrate) corresponds to step 722 in FIG. 98. Step 734 involves forming a thin porous silicon sacrificial layer on template deep trenches (trench sidewalls and bottoms) using electrochemical HF etching (also known as electrochemical anodization of silicon). The porous silicon layer may be formed by one of two primary techniques as follows: (i) deposit a thin conformal crystalline silicon layer (in one embodiment, a p-type boron-doped silicon layer in the range of 0.2 to 2 microns) on an n-type template substrate, using silicon epitaxy, followed by conversion of the p-type epitaxial layer to porous silicon using electrochemical HF etching; or (ii) convert a thin layer of the template substrate (in one embodiment, a p-type template) to porous silicon (in one embodiment, in the thickness range of 0.01 to 1 micron). The sacrificial porous silicon formed by one of these two techniques also serves as a seed layer for subsequent epitaxial silicon deposition. Step 736 involves performing a hydrogen bake (at 950° to 1150° C.) to clean the surface and to form a continuous sealed monocrystalline surface layer on the surface of the porous silicon sacrificial layer, followed by depositing a blanket layer of doped silicon epitaxy (top only) in an epitaxial processing reactor. In one embodiment, the layer is p-type, boron-doped and has a thickness between 1 and 30 microns. Step 738 uses a selective (wet or dry) silicon etch process to strip the top silicon layer, until the top layer of porous silicon is exposed. When using a plasma (dry) etch process, one embodiment uses optical end-pointing to ensure complete removal of top silicon layer and exposure of the top porous silicon layer. Step 740 involves 3-D thin-film TFSC substrate release. A highly selective isotropic wet or dry etch of porous silicon is performed, with very high selectivity with respect to silicon. In one embodiment, a mixture of hydrofluoric acid, nitric acid and acetic acid (HNA) is used to etch the porous silicon layer. Alternatively, a mixture of ammonia, peroxide, and water ($NH_4OH+H_2O_2+H_2O$) or a mixture of hydrogen peroxide and hydrofluoric acid ($H_2O_2+HF$) or a suitable composition of tri-methyl-ammonium-hydroxide (TMAH) may be used. The etch composition and temperature may be adjusted to achieve maximum etch selectivity for porous silicon with respect to silicon. This process releases the embedded 3-D crystalline silicon structure as a hexagonal-prism 3-D thin-film TFSC substrate, which may then be used for subsequent 3-D TFSC fabrication.

Figure 100:
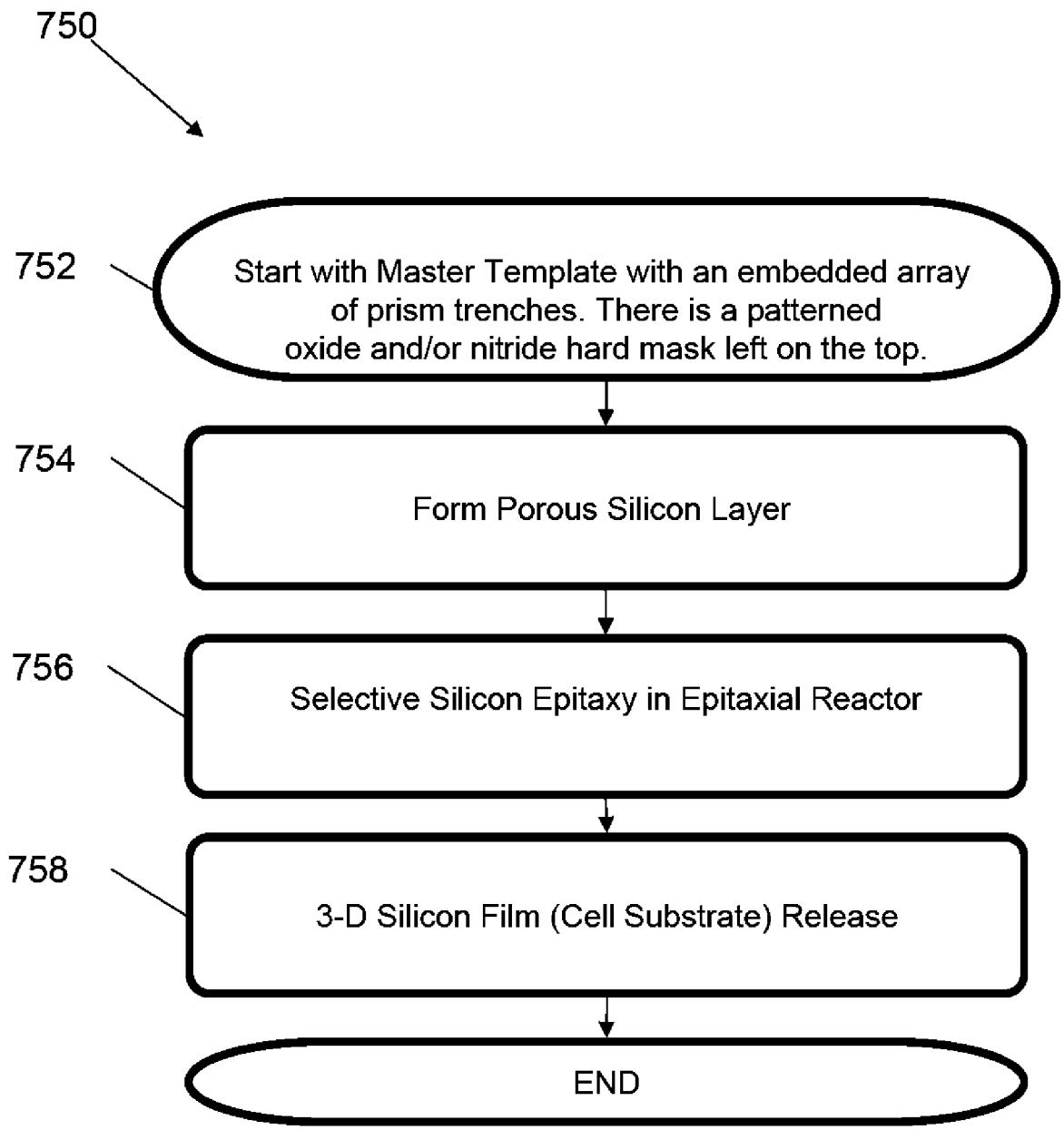

FIG. 100 depicts a process flow 750 of an embodiment of a process flow for fabrication of self-supporting dual-aperture hexagonal-prism 3-D thin-film TFSC substrates without rear base layers using a porous silicon sacrificial layer and selective epitaxial silicon deposition. The main difference between FIGS. 99 and 100 is the epitaxial growth method. FIG. 100 uses selective epitaxy instead of blanket epitaxy as in FIG. 99. The use of selective epitaxy eliminates a process step to etch the top silicon layer before removal of the sacrificial layer for layer release. Referring to FIG. 100, step 752 (providing a substrate) corresponds to step 732 in FIG. 99; and step 754 (formation of porous silicon sacrificial layer) corresponds to step 734. In step 756, epitaxial silicon is selectively grown inside the template trenches only. In one embodiment, the epitaxial silicon layer is p-type, in-situ-boron-doped and has a thickness between 1 and 30 microns. No silicon layer is grown on the template top surface due to selective epitaxial growth, as there is a patterned dielectric (e.g., oxide and/or nitride) hard mask on top. Step 758 (substrate release) corresponds to step 738 in FIG. 99. The hexagonal-prism 3-D thin-film TFSC substrate may then be used for subsequent 3-D TFSC fabrication. While FIGS. 99 and 100 show the use of porous silicon sacrificial layers for fabrication of dual-aperture TFSC substrates (without rear base layers), porous silicon can also be used as a sacrificial layer for fabrication of single-aperture TFSC substrates with rear base layers (using the appropriate template structure for single-aperture TFSC substrates, as described before).

The preceding FIGURES outline process flow embodiments which result in hexagonal-prism 3-D TFSC substrates made of a crystalline (monocrystalline or multicrystalline) semiconductor material (preferably crystalline silicon), through the use of conformal epitaxial deposition techniques. In alternative embodiments, 3-D TFSC substrates are made from polycrystalline or amorphous semiconductor materials (such as polysilicon or amorphous silicon). However, the resulting 3-D TFSCs may exhibit lower efficiencies compared to the 3-D TFSCs made from a crystalline semiconductor (e.g., monocrystalline or multicrystalline silicon).

Figure 101:
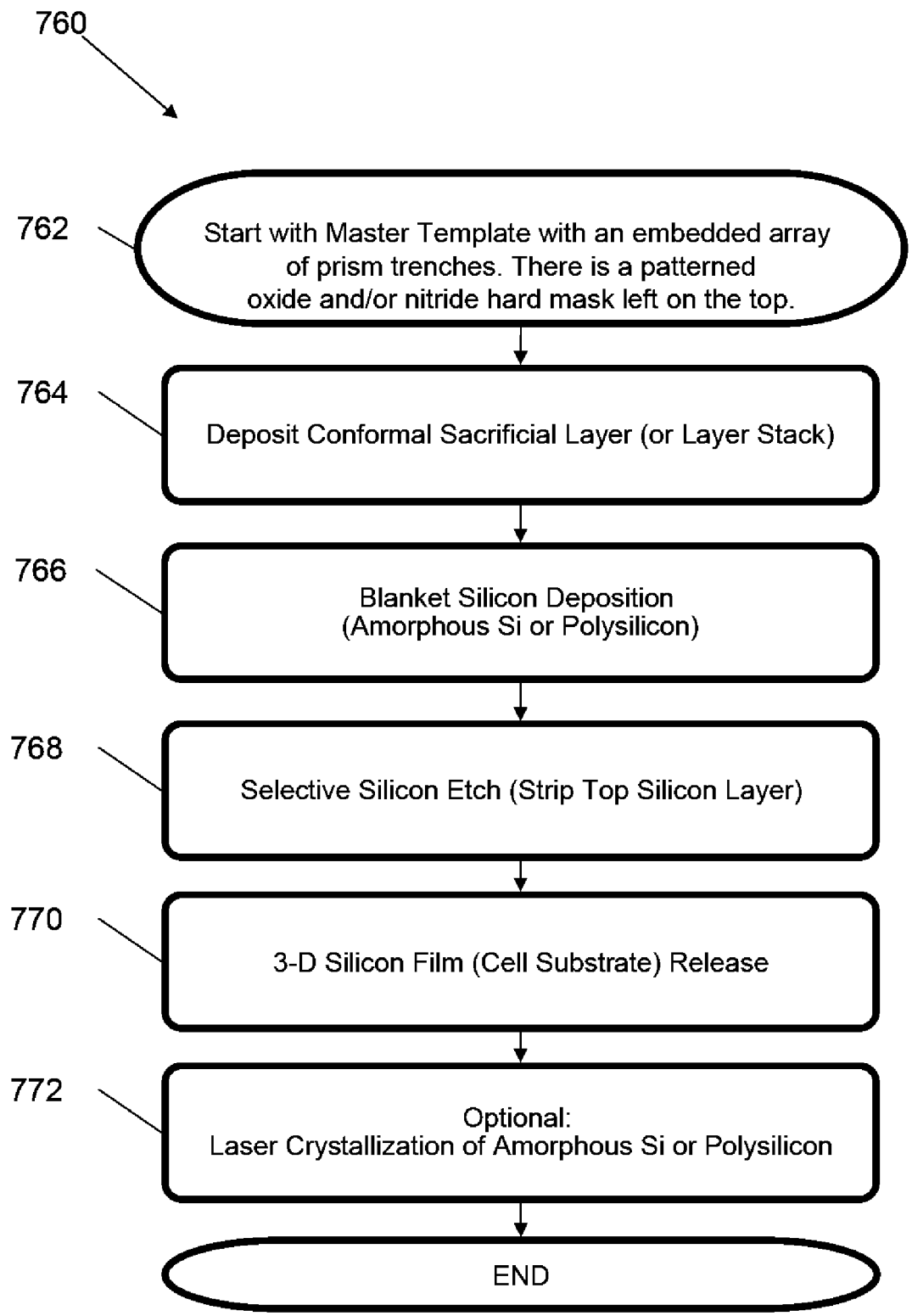
Figure 102:
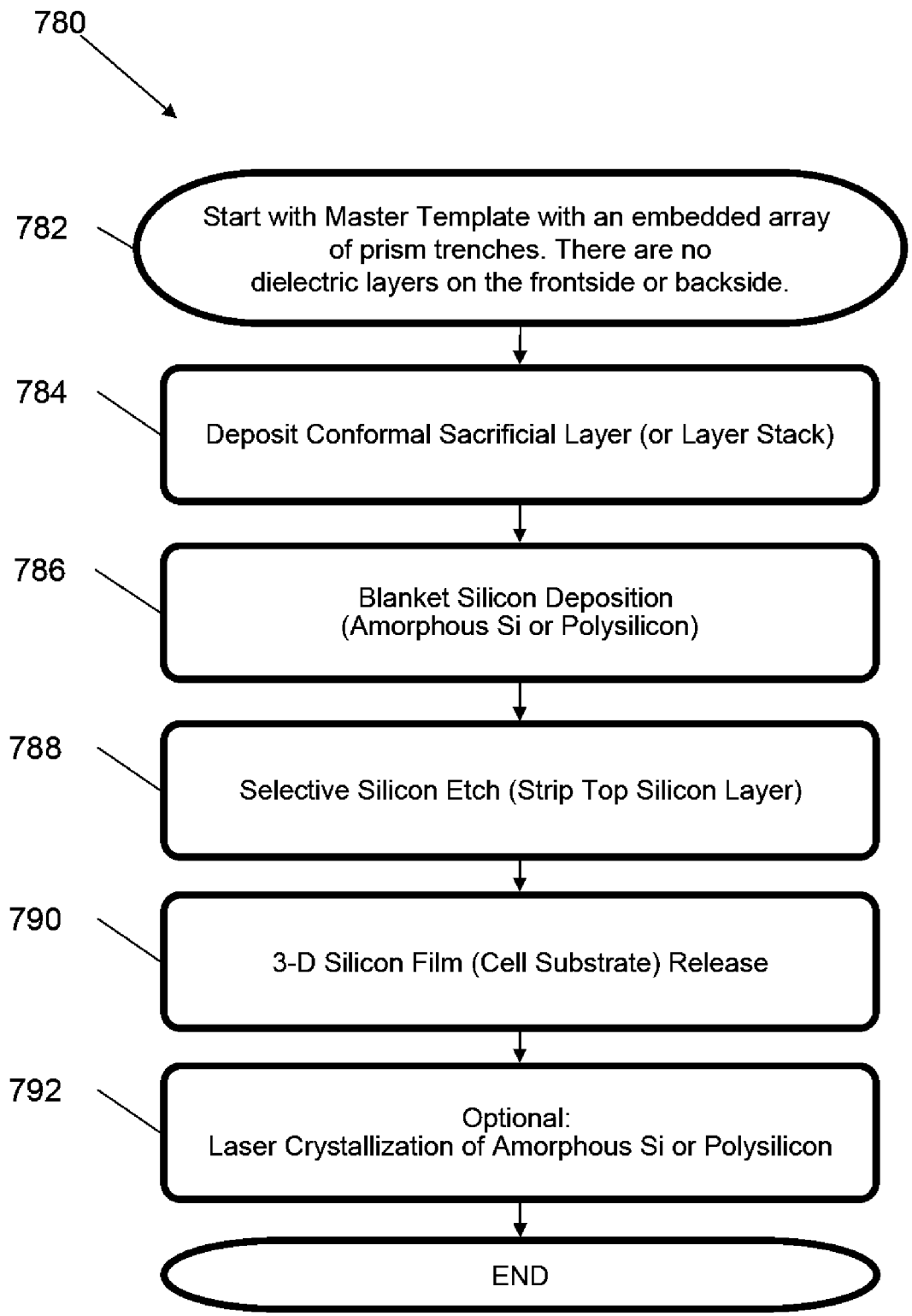

FIGS. 101 and 102 depict embodiments of two process flows 760 and 780 for fabrication of self-supporting hexagonal-prism 3-D dual-aperture thin-film TFSC substrates without rear base layers using layer release processing but without the use of silicon epitaxy, unlike FIGS. 96 to 100 above. The template used in FIG. 101 has a patterned dielectric on the template frontside, while the template used in FIG. 102 has no dielectrics on either the frontside or backside. The sacrificial layer used in these process flows is simply a sacrificial dielectric layer such as $SiO_2$. The silicon material is amorphous silicon and/or polysilicon, which may optionally be subsequently crystallized using laser crystallization to form large-grain polysilicon or multicrystalline silicon (and thermally annealed in order to reduce silicon film stress to facilitate release from the template). These process flows result in 3-D dual-aperture thin-film TFSC substrates with hexagonal-prism unit cells with open apertures on both top and rear.

Referring to FIG. 101, step 762 (providing a substrate) corresponds to step 752 from FIG. 100. Step 764 involves depositing a conformal sacrificial layer (or a layer stack). First, a thin layer of a sacrificial material is deposited by conformal layer formation (LPCVD or thermal oxidation). In one embodiment, the sacrificial material is $SiO_2$, with a thickness of between 50 and 2000 nanometers. This sacrificial oxide layer conformally covers the hexagonal-prism trench walls and the template frontside. If subsequent laser crystallization is used (see step 772 below), step 764 also includes depositing a thin nitride layer by LPCVD. In one embodiment, this nitride layer is $Si_3N_4$, with a thickness between 100 and 1000 nanometers. The sacrificial layer may be made of porous silicon instead of oxide and/or nitride. Step 766 involves deposition of a blanket silicon layer using conformal deposition. In one embodiment, this blanket silicon layer may be amorphous silicon or polysilicon, p-type in-situ doped with boron, having a thickness between 1 and 30 microns. Step 768 uses selective silicon (wet or dry) etch to strip the top silicon layer, until the top surface of sacrificial layer (e.g., silicon dioxide or silicon nitride or porous silicon) is exposed. When using plasma (dry) etch process, one embodiment uses optical end-pointing to ensure complete removal of top silicon layer and exposure of the top porous silicon layer. If optional nitride is used, the top $Si_3N_4$ layer is etched using selective wet or dry etch. Step 770 involves 3-D thin-film TFSC substrate release. In one embodiment and when using a silicon dioxide sacrificial layer, hydrofluoric acid (HF) is used to etch the oxide sacrificial layer. In another embodiment and when using a porous silicon sacrificial layer, a mixture of ammonia, peroxide, and water ($NH_4OH+H_2O_2+H_2O$) or a mixture of hydrogen peroxide and hydrofluoric acid ($H_2O_2+$ HF) or a suitable composition of tri-methyl-ammonium-hydroxide (TMAH) may be used. The etch composition and temperature may be adjusted to achieve maximum etch selectivity for porous silicon with respect to silicon. This process releases the hexagonal-prism 3-D thin-film TFSC substrate. An optional step 772 involves laser crystallization and/or thermal annealing of the released 3-D thin-film amorphous silicon or polysilicon substrate to form a large-grain polysilicon microstructure (and to reduce any residual stress for the embedded silicon structure), where the nitride layer serves as protective cap. The nitride layer is then selectively stripped. The hexagonal prism 3-D thin-film TFSC substrate may then be used for subsequent 3-D TFSC fabrication.

Referring to FIG. 102, in step 782, a patterned hexagonal-prism template is provided. This template has already been processed to form an embedded array of deep interconnected trenches. In this case, there are no dielectric hard mask layers on the template top and rear surfaces. Step 784 (conformal deposition of sacrificial layer) corresponds to step 764 of FIG. 101; step 786 (blanket silicon deposition) corresponds to step 766; step 788 (selective silicon etch) corresponds to step 768; step 790 (substrate release) corresponds to step 770; and step 792 (optional laser crystallization) corresponds to step 772. The hexagonal-prism 3-D thin-film TFSC substrate may then be used for subsequent 3-D TFSC fabrication.

FIGS. 103 through 107 show Y-Y cross-sectional views of the evolution of one prism unit cell of a template with through-wafer trenches 422, as it goes through several key process steps for fabricating a hexagonal-prism dual-aperture 3-D thin-film TFSC substrate without a rear base layer. The process flow outlined in these FIGURES includes the use of both blanket and selective epitaxial growth based on the relevant process flow embodiments described earlier. While shown with a dielectric stack on the template frontside and backside, the process flow using blanket epitaxial deposition may proceed without using the dielectric stack on the template frontside.

Figure 103:
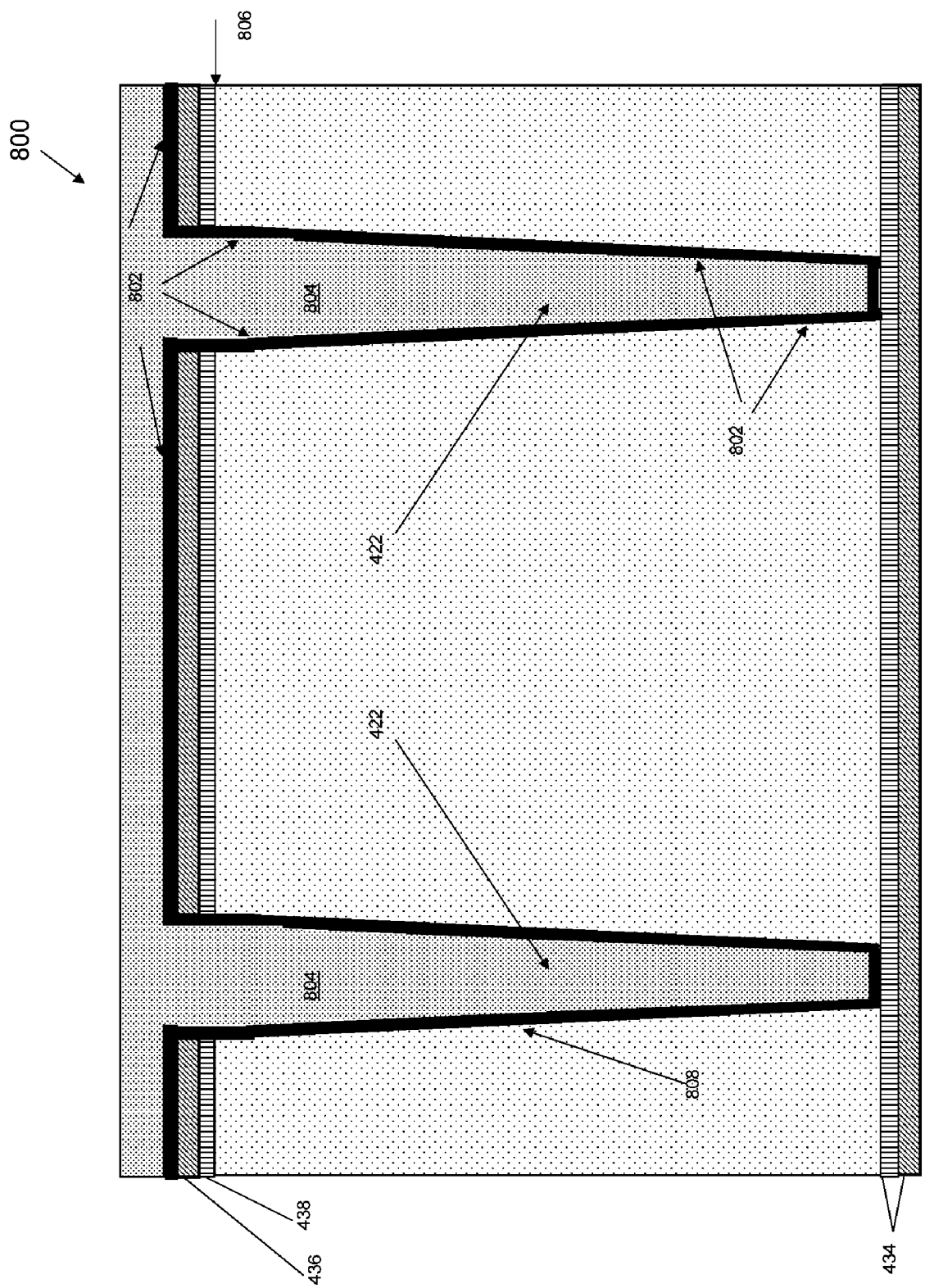

FIG. 103 shows a Y-Y cross-sectional view 800 of a template with through-wafer trenches 422 after deposition of a thin sacrificial layer (epitaxial $Ge_xSi_{1-x}$ or porous silicon) 802 followed by deposition of a blanket in-situ-doped (e.g., boron-doped for p-type base) epitaxial silicon layer 804. The dielectric top hard mask layer is composed of a first top hard mask layer 436 of $Si_3N_4$ on top of a second top hard mask layer 438 of $SiO_2$ on top of the template top surface 806. The sacrificial layer 802 forms a thin layer on both the sidewalls 808 and on the template top surface 806 (being formed on the top surface of the frontside dielectric 436). This sacrificial layer 802 forms a thin layer (e.g., 100 to 2000 nanometers thick) between the in-situ-doped (boron-doped) epitaxial silicon 804 and the template.

Figure 104:
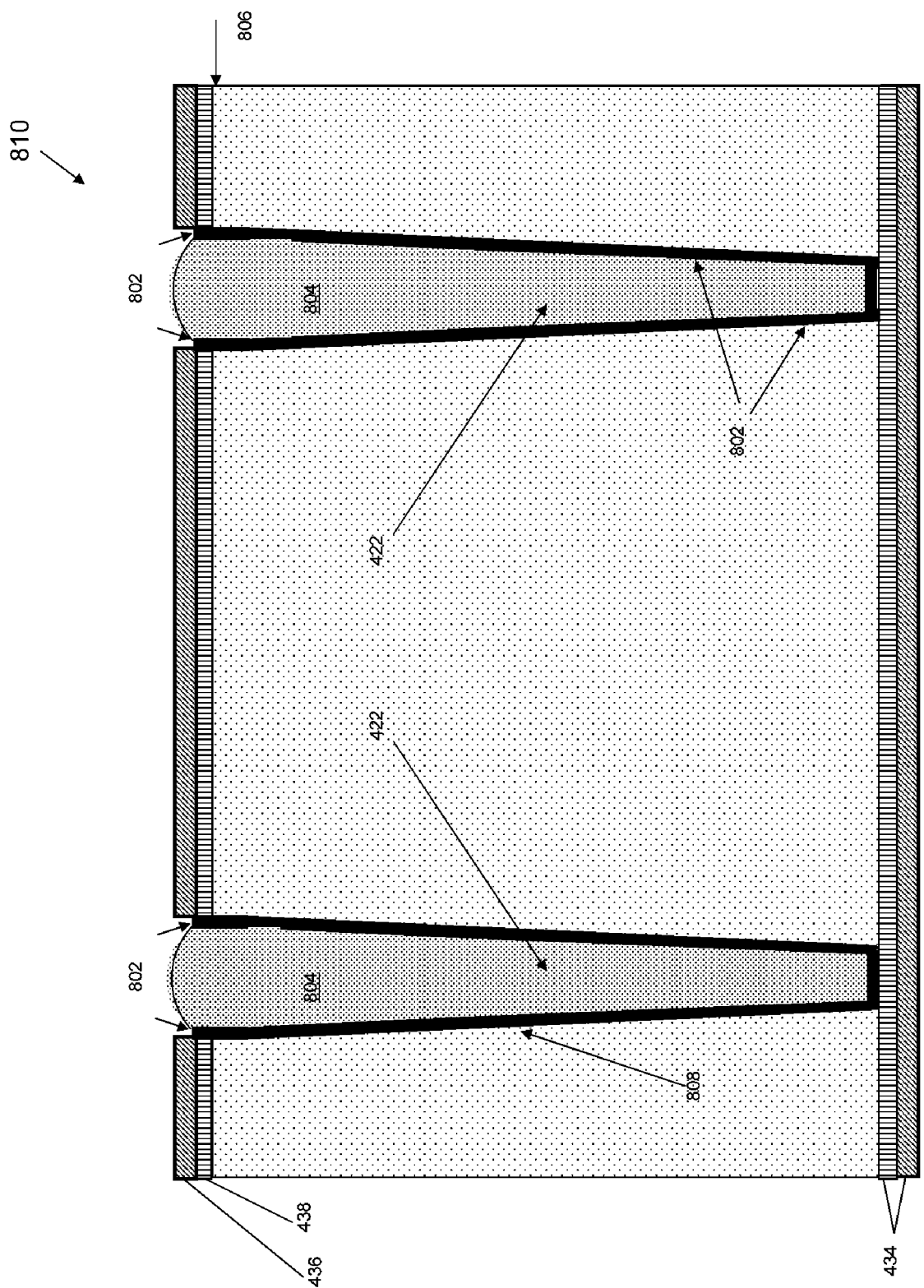
Figure 105:
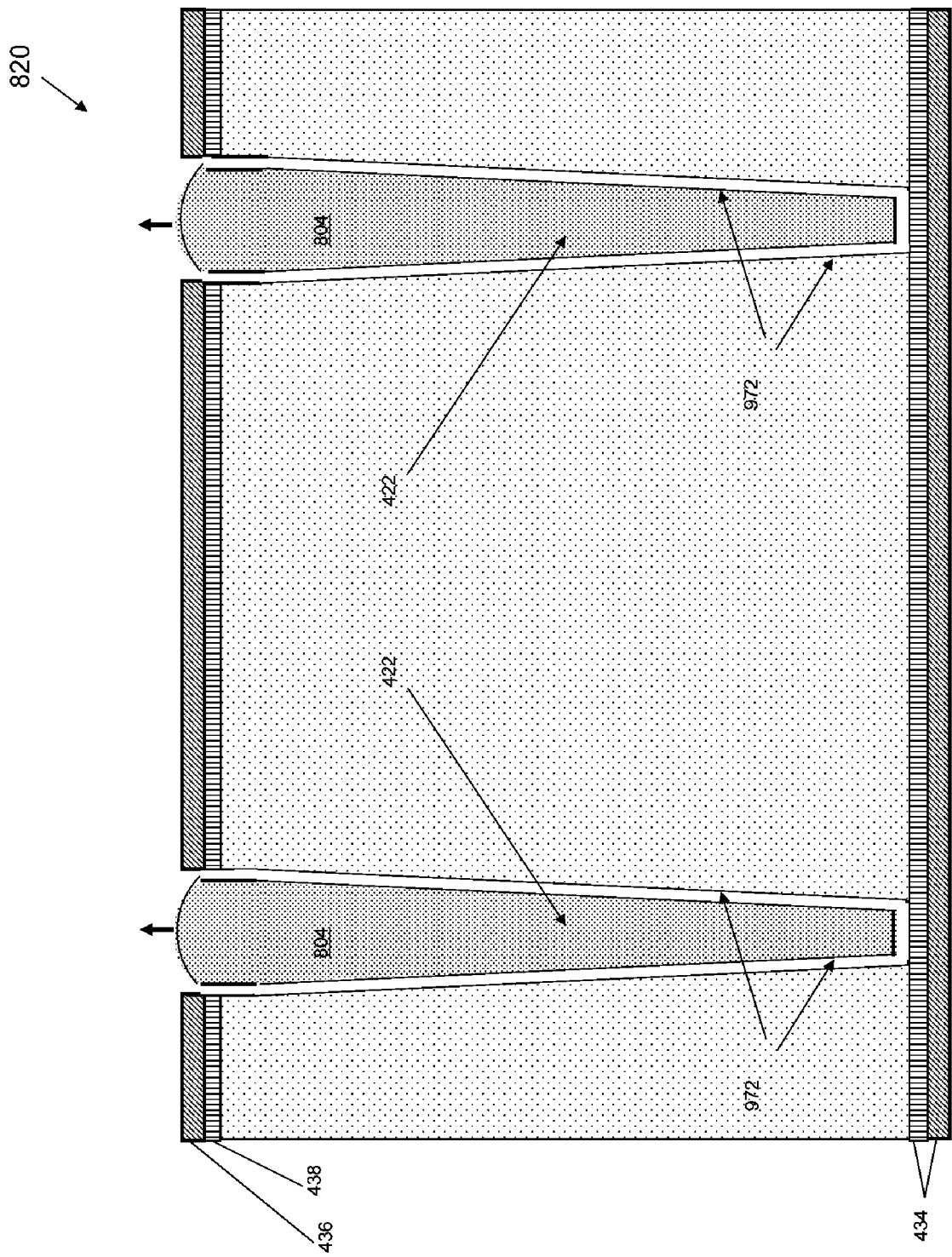
Figure 106:
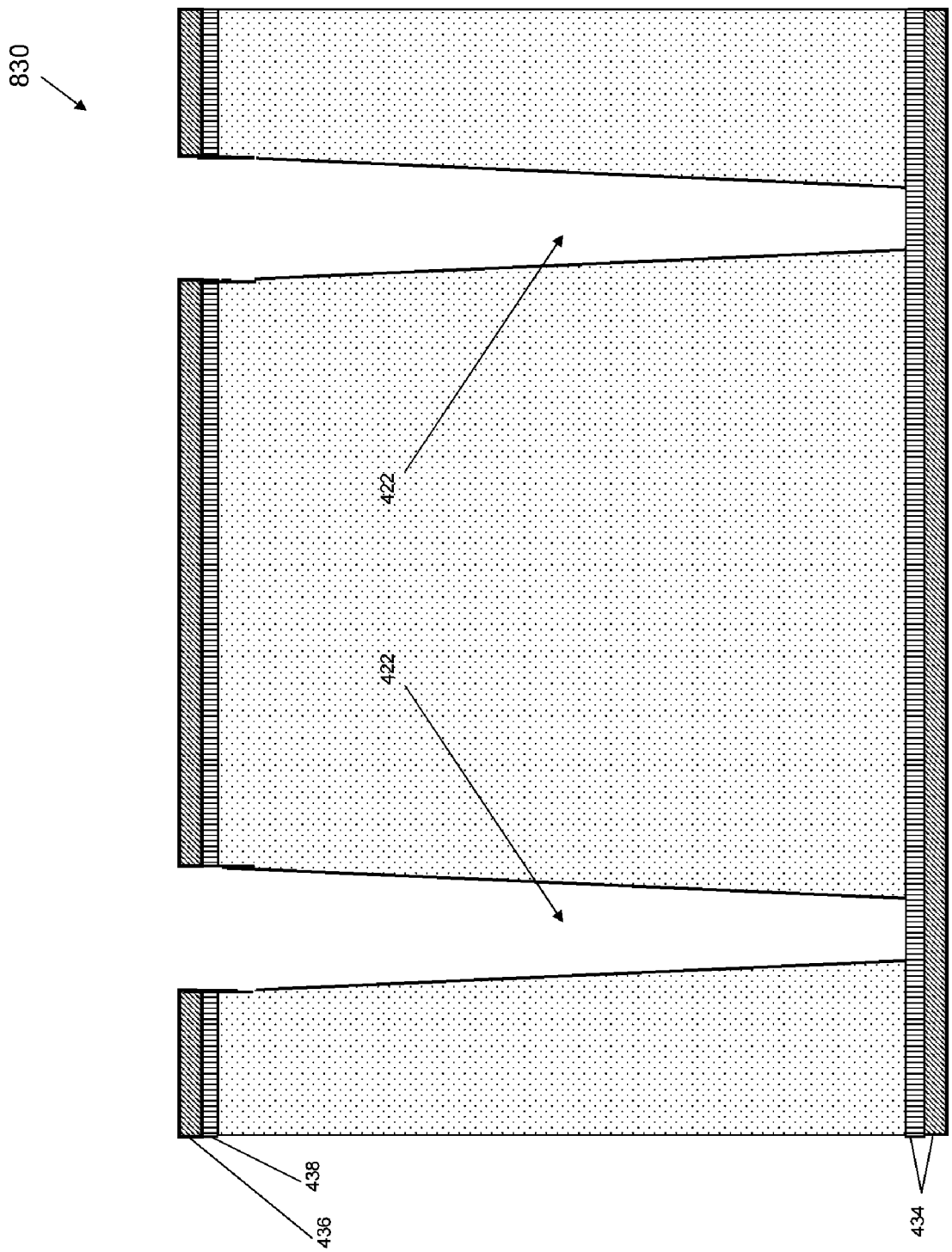

FIG. 104 shows a view 810 after a controlled silicon etch to remove the p-type silicon epitaxial layer 804 from the top of the template only (leaving epitaxial silicon in trenches). FIG. 105 shows a template view 820 after a highly selective wet etch process to remove the sacrificial layer 802 ($Ge_xSi_{1-x}$ or porous silicon or another suitable layer) shown in FIG. 104. Removal of the sacrificial layer 802 results in the formation of a gap 972 between the template and the p-type silicon epitaxial layer (i.e., the 3-D thin-film TFSC substrate) 802, allowing for release and removal of the 3-D thin-film TFSC substrate from the template. Release of the substrate 804 may be facilitated by ultrasonic agitation and/or magnetically coupled etchant stirring during selective wet etching of the sacrificial layer 802. FIG. 106 shows a view 830 of the template after lifting off the p-type silicon epitaxial layer 804. The template 420 (see FIG. 39) is ready for multiple reuse cycles.

Figure 107:
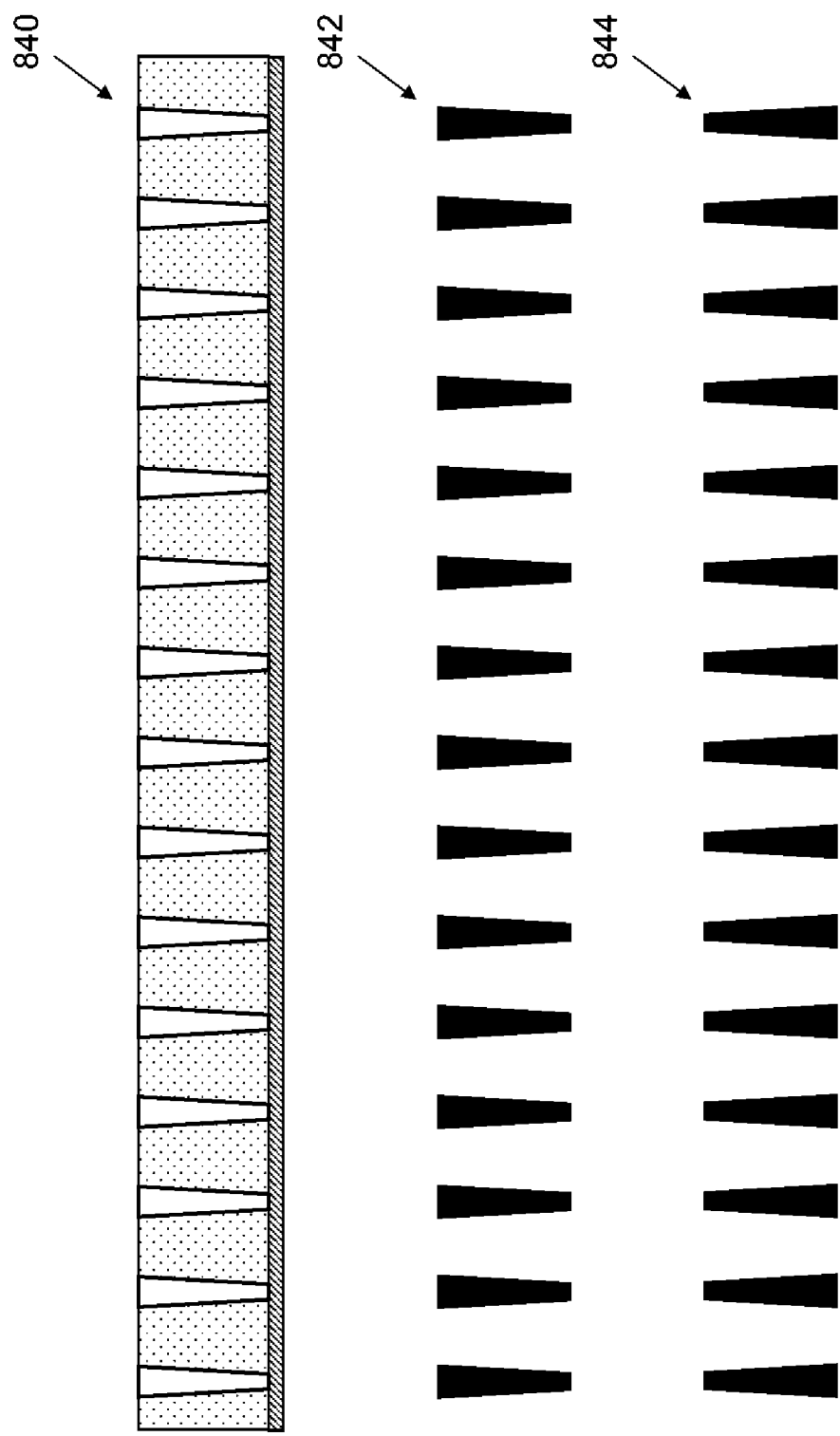

FIG. 107 shows three cross-sectional views. View 840 shows a larger Y-Y cross-sectional view of the template shown in FIG. 106, with multiple prism unit cells shown. View 842 shows a Y-Y cross-sectional view of the hexagonal-prism 3-D TFSC substrate 804 after release from the template shown in view 840 (with the emitter side down). Note that the base and emitter sides are shown on the top and rear, respectively. View 844 shows a Y-Y cross-sectional view of the hexagonal-prism 3-D thin-film TFSC substrate 804 (vertically flipped view compared to view 842) after release from the template shown in view 840. Note that the emitter and base sides are shown on the top and rear, respectively.

FIGS. 108 through 111 show Y-Y cross-sectional views of the evolution of one prism unit cell within a template with in-wafer trenches 442 and no dielectric layers on the template frontside or template backside, as it goes through several key process steps for fabricating a hexagonal-prism dual-aperture 3-D TFSC substrate without a rear base layer. The process flow outlined in these FIGURES includes the use of both blanket and selective epitaxial growth based on the relevant process flow embodiments described earlier.

Figure 108:
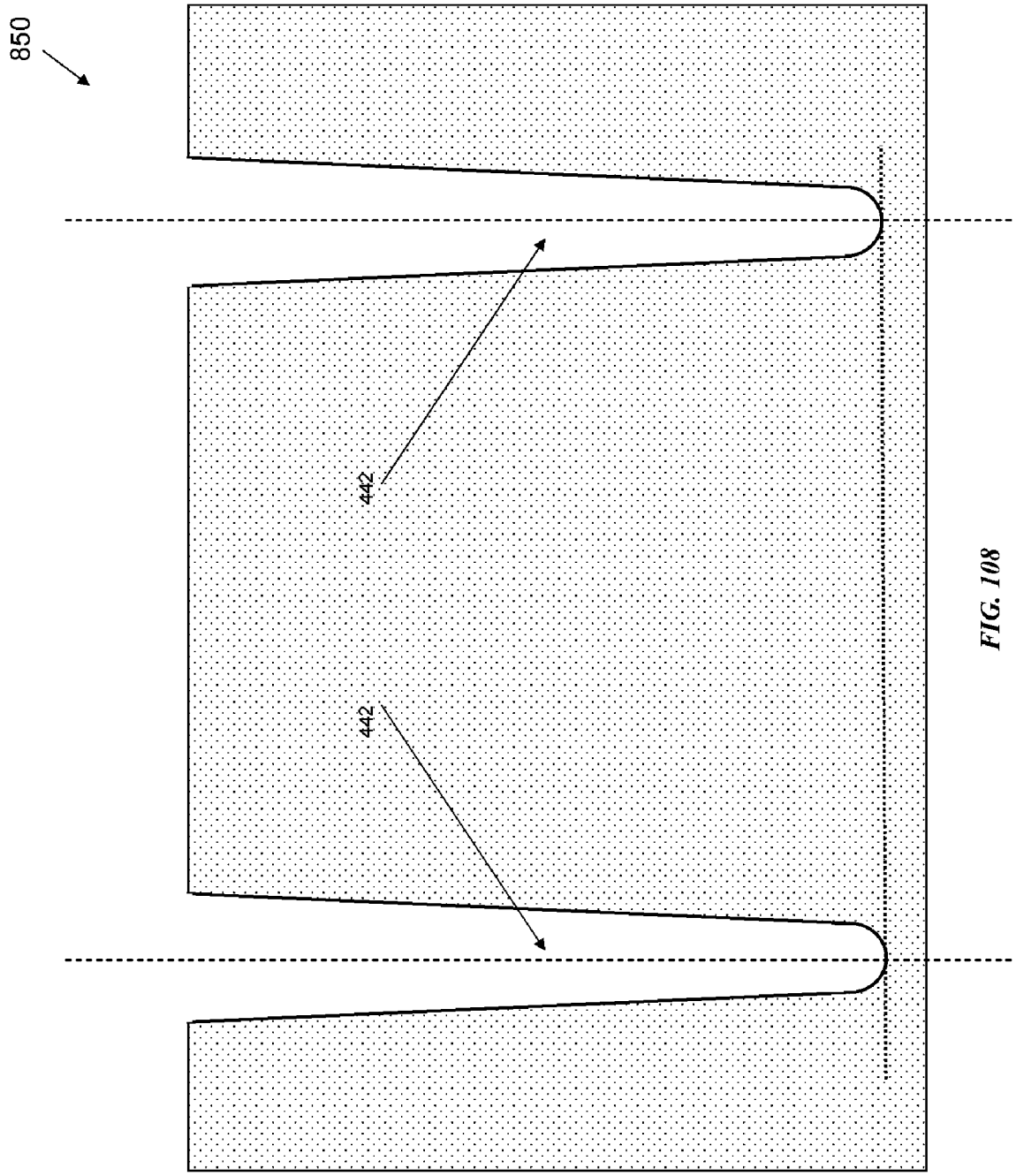
Figure 109:
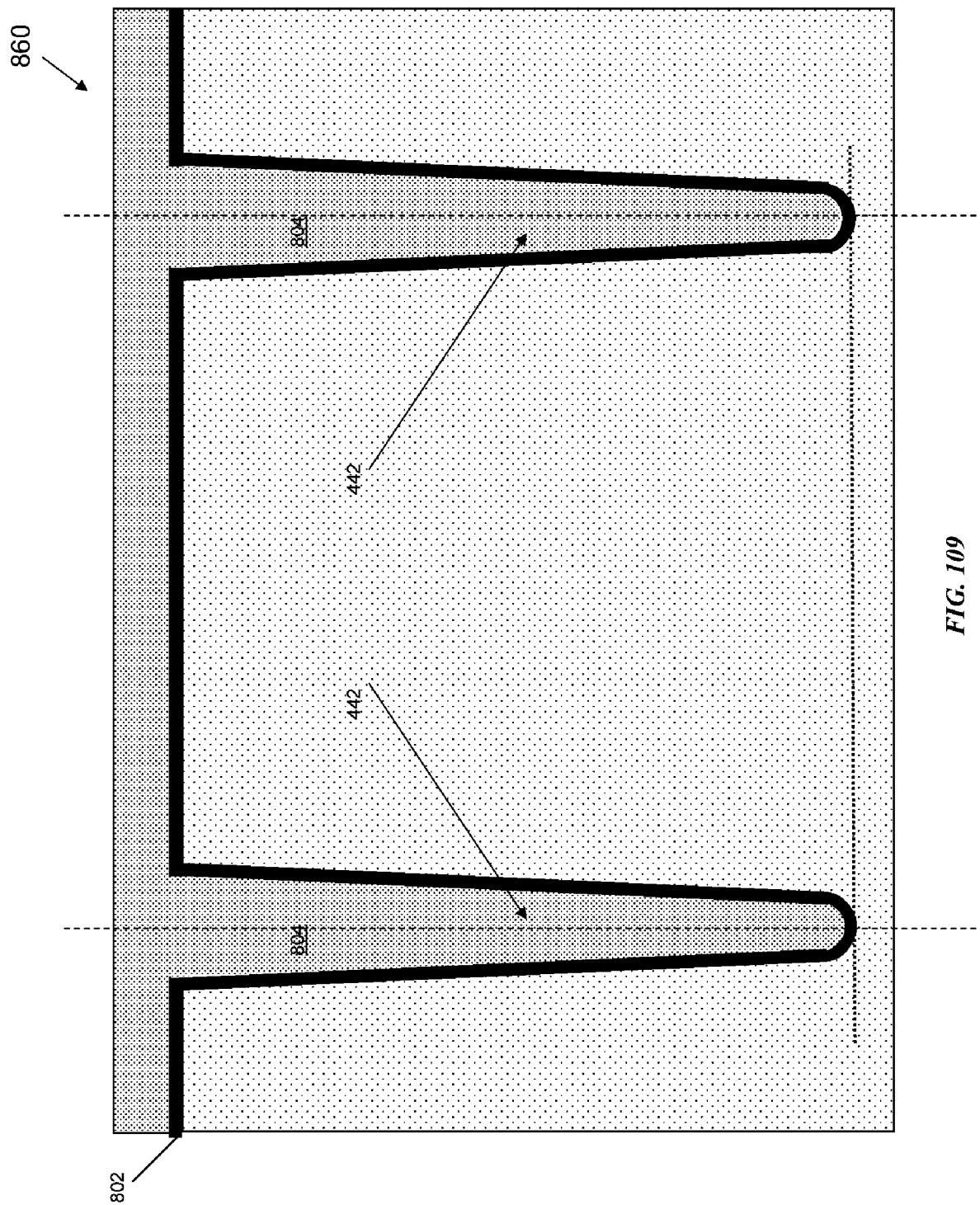
Figure 110:
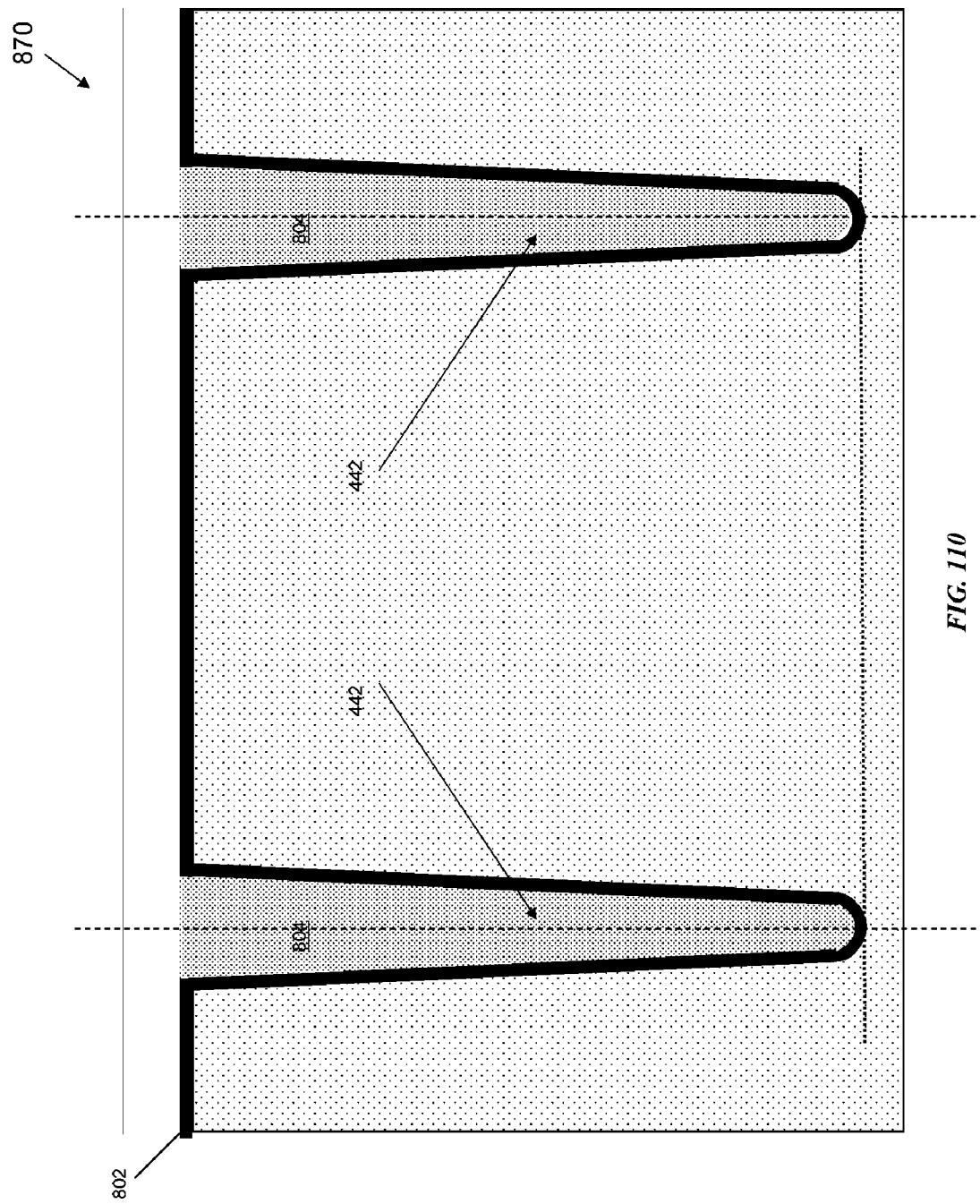
Figure 111:
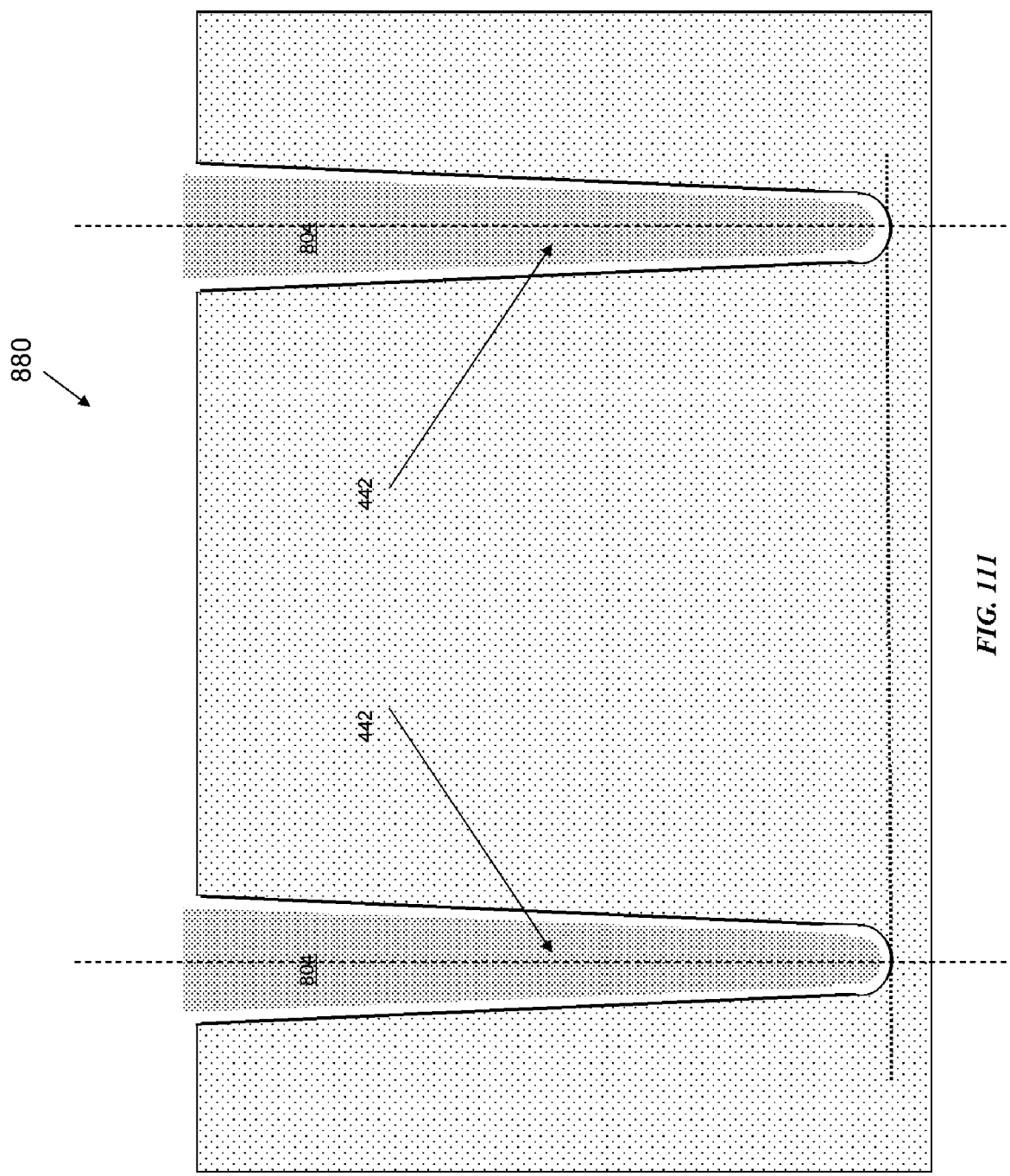

FIG. 108 shows a Y-Y cross-sectional view 850 of a version of the template 520 (see FIG. 48) with in-wafer trenches 442 without a dielectric top mask layer or a dielectric rear mask layer. The deep trenches may be formed using lithography patterning and deep RIE (DRIE). FIG. 109 shows a view 860 after deposition of the relatively thin (e.g., 200 to 2000 nanometers) sacrificial layer 802 (epitaxial $Ge_xSi_{1-x}$ or porous silicon or another suitable material) and the in-situ-doped (boron doped for p-type base or phosphorus doped for n-type base) epitaxial silicon layer 804 to fill the hexagonal-prism trenches. FIG. 110 shows a view 870 after controlled plasma or wet etching of the in-situ-doped (boron-doped for p-type base) epitaxial silicon layer 804 on the template frontside, endpointing or stopping the etch on the top of or within the frontside sacrificial layer 802. FIG. 111 shows a view 880 after highly selective wet etching of sacrificial layer 802 (epitaxial $Ge_xSi_{1-x}$ or porous silicon) to release the hexagonal-prism 3-D thin-film TFSC substrate 804. The dual-aperture 3-D TFSC substrate with embedded silicon sidewalls 804 is ready to be detached and removed from the template.

FIGS. 112 through 115 illustrate Y-Y cross-sectional views of a template 540 (see FIG. 50) with through-wafer trenches 422 and a backside layer 434 (trenches penetrating through the template bulk and terminated on the supporting backside dielectric layer 434) and no dielectrics on the template frontside, as it goes through the key process steps to fabricate a hexagonal-prism dual-aperture 3-D TFSC substrate without a rear base layer. Again, the flow used for this fabrication process flow is based on one of the embodiments outlined earlier.

Figure 112:
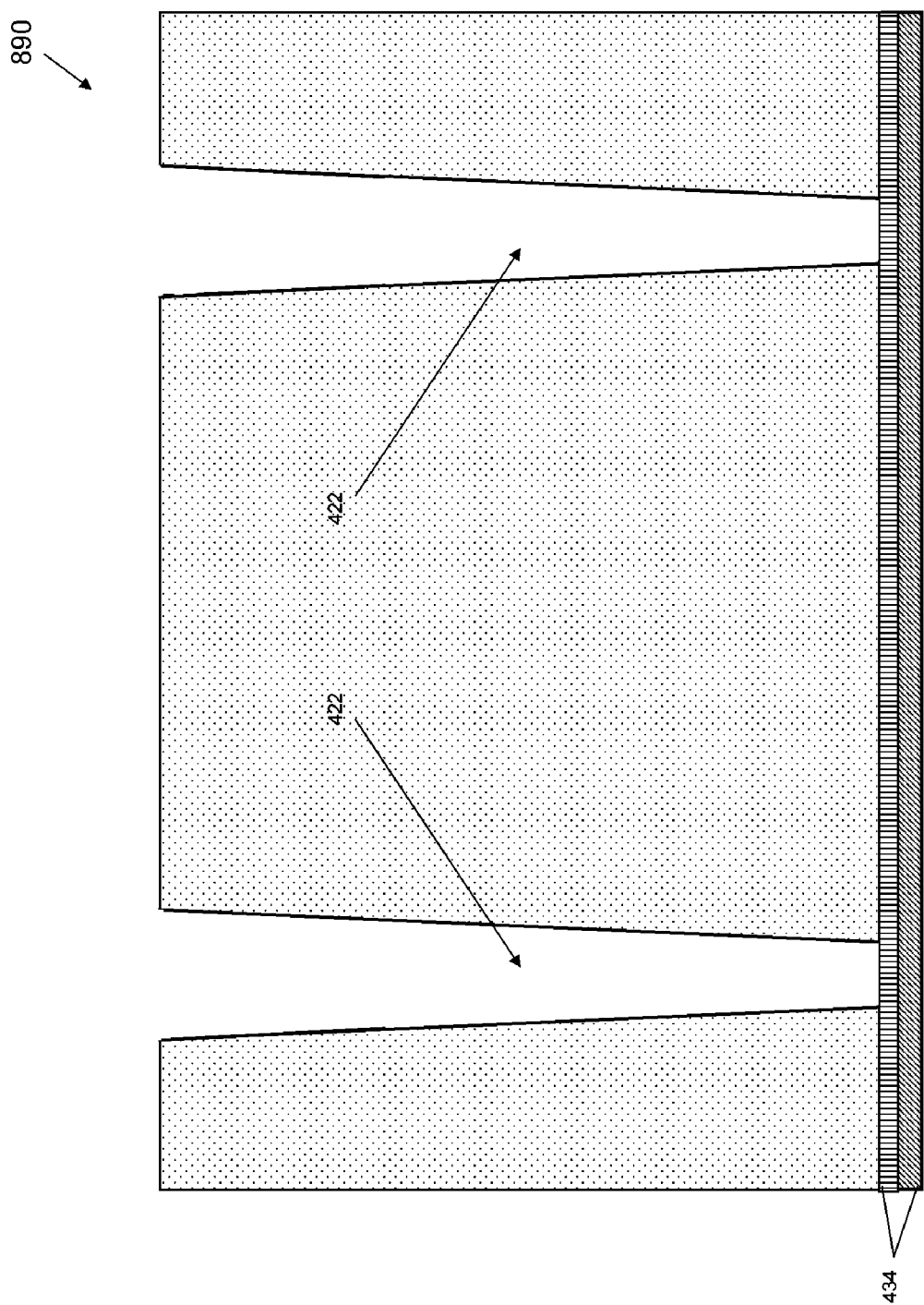
Figure 113:
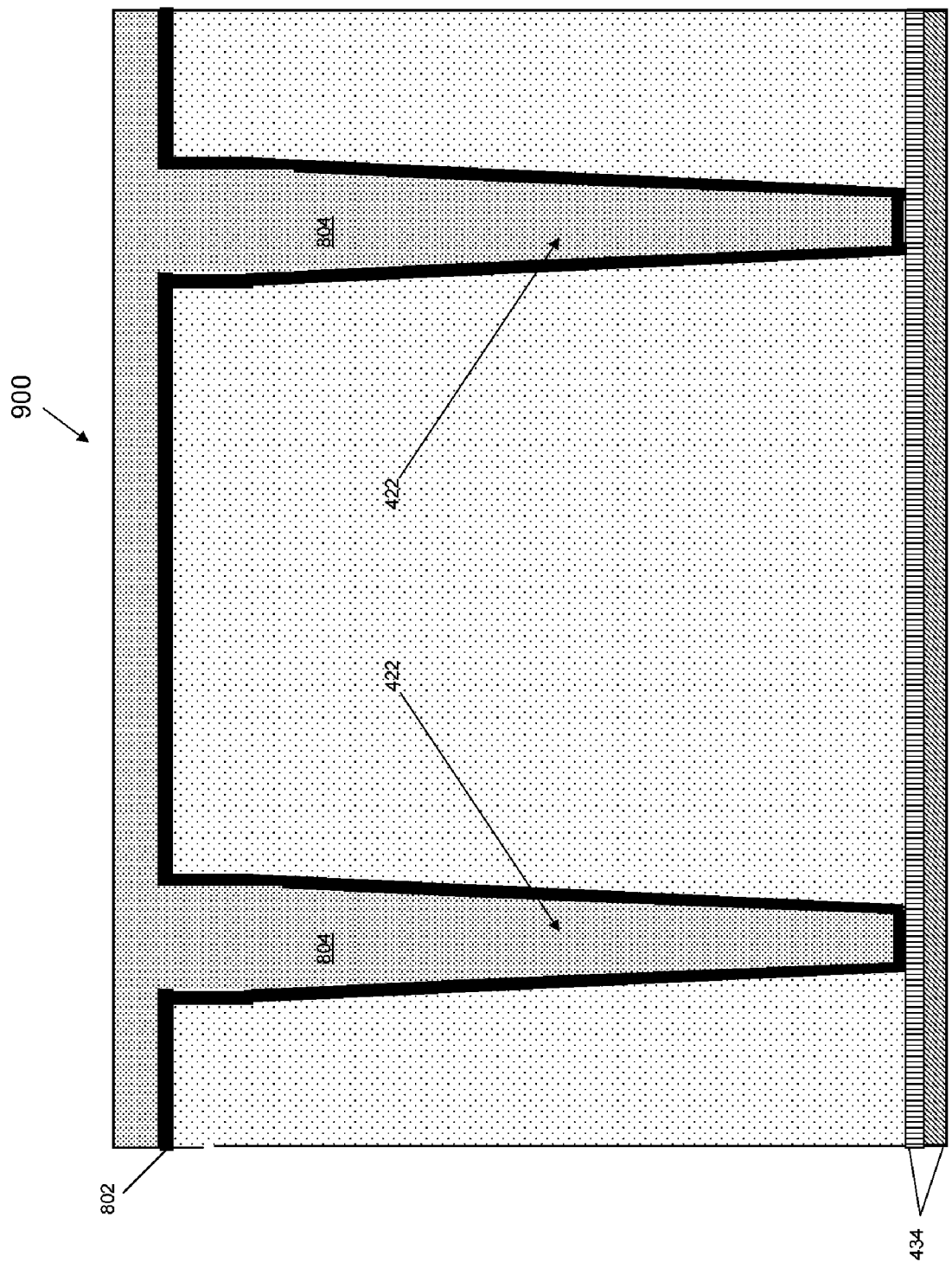
Figure 114:
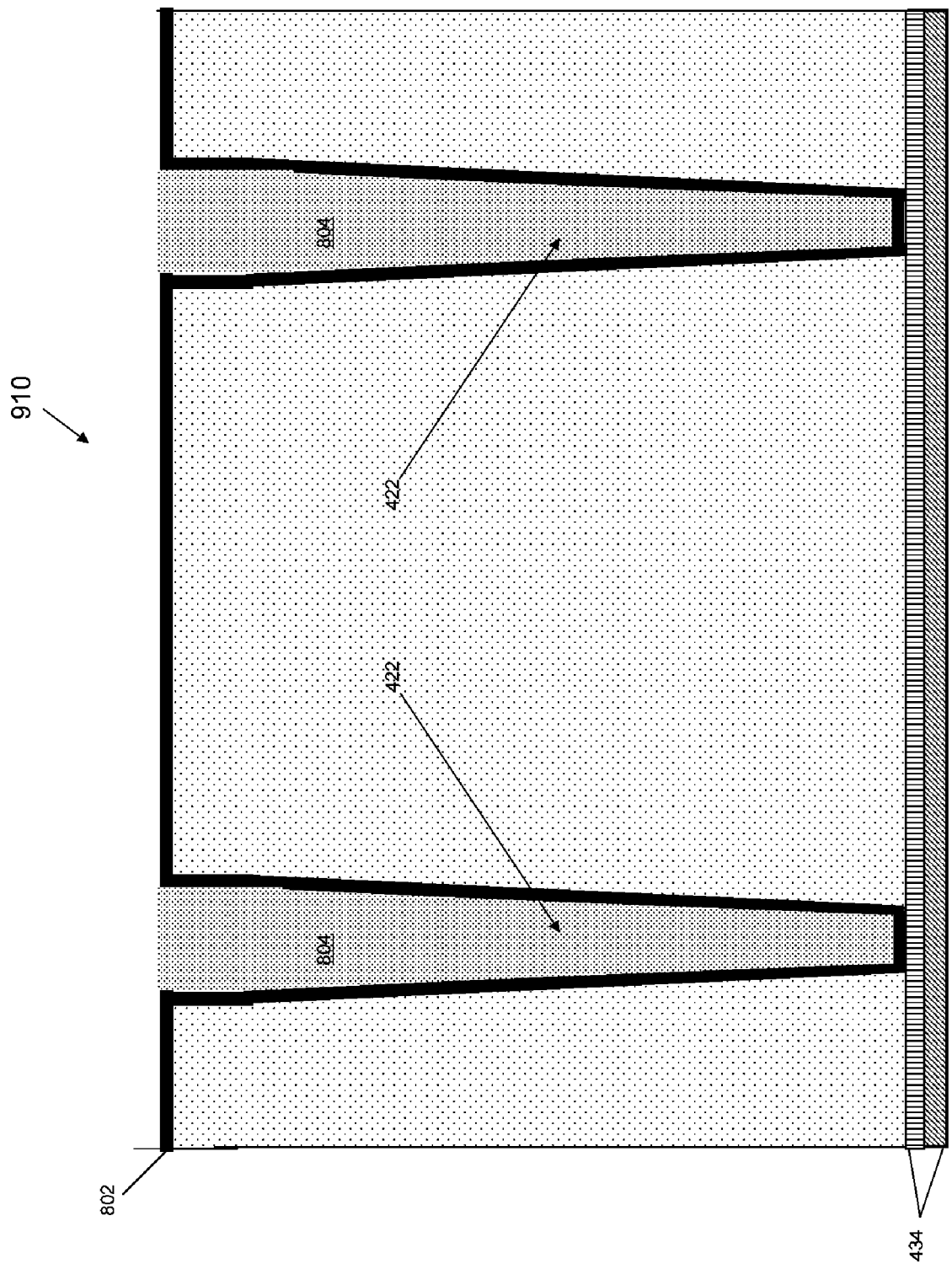
Figure 115:
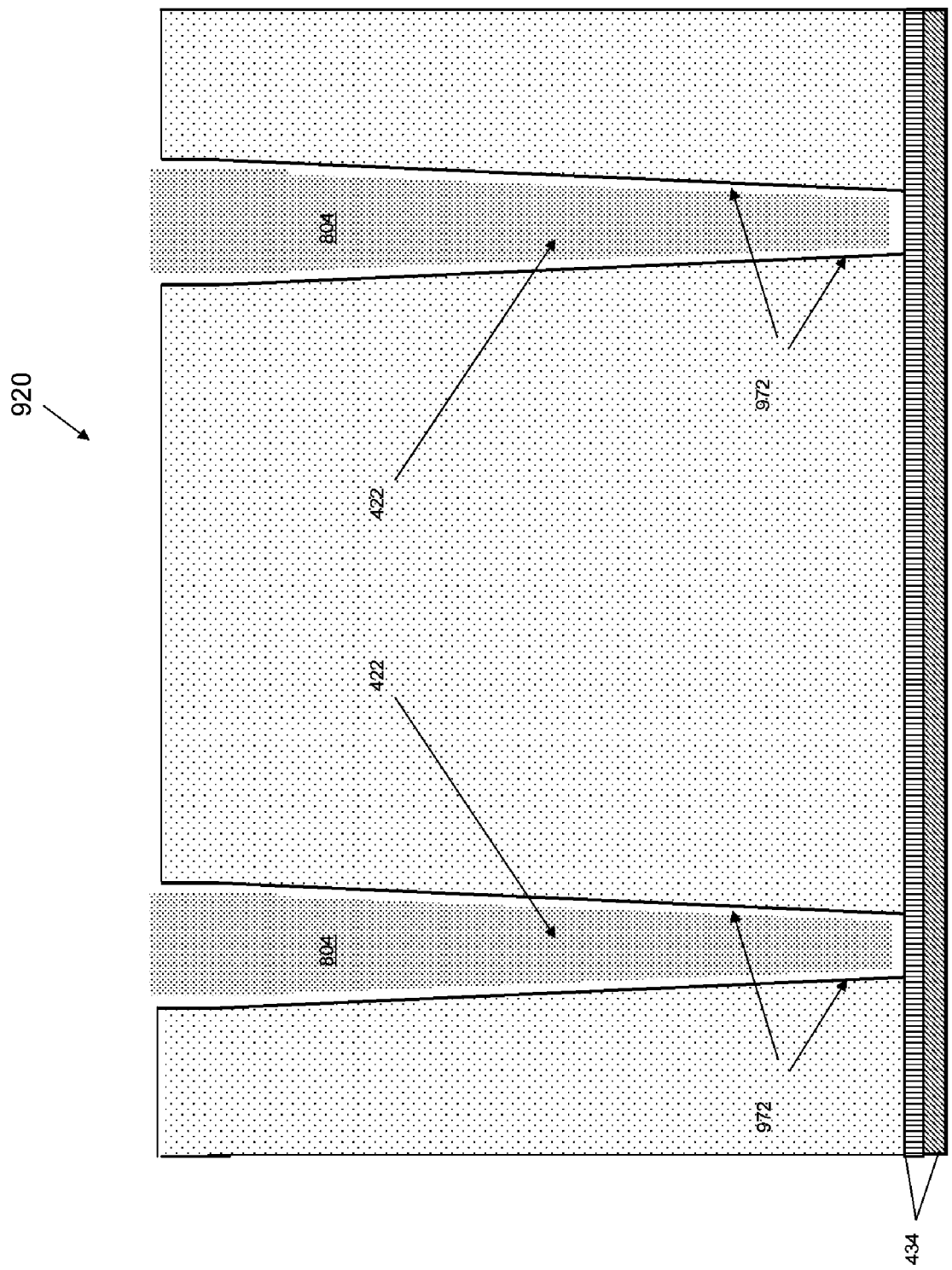

FIG. 112 shows a Y-Y cross-sectional view 890 of a version of the template 540 with through-wafer trenches 422 without a top hard mask layer, but with a backside mechanical support layer 434. FIG. 113 shows a view 900 after formation or deposition of the relatively thin sacrificial layer 802 (epitaxial $Ge_xSi_{1-x}$ or porous silicon or another suitable material) and the in-situ-doped (boron-doped epitaxial for p-type base) epitaxial silicon layer 804. FIG. 114 shows a view 910 after controlled plasma or wet etching of the epitaxial silicon layer 804 on the template frontside, endpointing or stopping the etch on the top of or within the frontside sacrificial layer 802. FIG. 115 shows a view 920 after selective wet etching of the sacrificial layer 802 (epitaxial $Ge_xSi_{1-x}$ or porous silicon) to release the hexagonal-prism 3-D thin-film TFSC substrate 804. The dual-aperture 3-D TFSC substrate with embedded silicon sidewalls 804 is ready to be detached and removed from the template.

The following section describes embodiments of hexagonal-prism 3-D thin-film TFSC substrate fabrication process flows for fabricating hexagonal-prism dual-aperture 3-D thin-film TFSC substrates with rear base layers.

FIGS. 116 and 117 show two different process flow embodiments for fabricating hexagonal-prism dual-aperture 3-D thin-film TFSC substrates with rear base layers (using a suitable template such as the one shown in FIG. 47). FIG. 116 depicts an embodiment of a process flow 930 using layer release processing. This flow is based on the use of $Ge_xSi_{1-x}$ sacrificial layer deposition and blanket or selective in-situ-doped epitaxial silicon deposition. The resulting hexagonal-prism unit cells have open apertures on prism top and are terminated at the rear with a rear base layer (in one embodiment, a relatively flat thin silicon layer). Again, the process flow of this embodiment may be easily adjusted in order to use polysilicon, amorphous silicon, or a non-silicon crystalline or polycrystalline/amorphous silicon material. In step 932, a patterned honeycomb-prism template is provided. This template has already been processed to form an embedded array of trenches along with shallower/wider trenches (or trench shoulders) stacked on top of narrower/deeper trenches (see FIG. 47). There is no dielectric layer on the template frontside, and there is a patterned oxide and/or nitride dielectric layer (or stack) with openings left on the template backside. In step 934, a multi-layer blanket epitaxy is performed in an epitaxial reactor, including the following in-situ process steps. First, $H_2$ bake or $GeH_4/H_2$ bake is used for in-situ surface cleaning. Next, a thin $Ge_xSi_{1-x}$ epitaxial layer is deposited (in one embodiment, on the top only). In one embodiment, this layer is between 10 and 1000 nanometers. Next, a doped silicon epitaxial layer is deposited on the top only. In one embodiment, this layer is p-type, boron-doped and between 1 and 30 microns thick. The in-situ doping (boron doping) profile may be flat or graded. In case of grading, boron doping concentration is gradually increased during the deposition of the silicon epitaxial layer, with a lower concentration at the beginning and a higher concentration towards the end of the epitaxial growth process. This graded base doping may provide a field-assisted drift component for efficient collection of photo-generated carriers, substantially reducing the impact of recombination losses. It also reduces base sheet resistance and ohmic losses. The silicon epitaxial layer thickness is set such that the deep trenches are fully filled with silicon while the shallow (wider) trenches (top trench shoulders) receive epitaxy on their sidewalls and their central regions are left with self-aligned shallow hexagonal troughs. In step 936, the 3-D thin-film TFSC substrate is released. A highly selective isotropic wet or dry etch of $Ge_xSi_{1-x}$ is performed, with very high selectivity with respect to silicon. In one embodiment, a mixture of hydrofluoric acid, nitric acid and acetic acid (HNA) is used to selectively etch the $Ge_xSi_{1-x}$ layer. Alternatively, a mixture of ammonia, peroxide, and water ($NH_4OH+H_2O_2+H_2O$) may be used. The wet etchant selectively removes the sacrificial $Ge_xSi_{1-x}$ layer by reaching the sacrificial layer through the template backside dielectric openings. This process releases the hexagonal prism 3-D TFSC substrate, which may then be used for subsequent 3-D TFSC fabrication. Note that the template backside openings may be formed directly in silicon backside without a need for the backside dielectric.

FIG. 117 depicts an embodiment of a process flow 940 for fabrication of self-supporting hexagonal-prism single-aperture 3-D thin-film polysilicon or amorphous silicon TFSC substrates with rear base layers made of polysilicon or amorphous silicon using layer release processing, without the use of epitaxial silicon processing. The amorphous silicon or polysilicon layer may be optionally crystallized using laser crystallization as part of the flow. This process flow uses a dielectric sacrificial layer such as $SiO_2$ (deposited using LPCVD or thermally grown) in conjunction with conformal amorphous silicon or polysilicon deposition for the silicon absorber layer. Step 942 (providing a substrate) corresponds to step 932 in FIG. 116. Step 944 involves depositing a conformal sacrificial layer (or a layer stack). First, a thin layer of a sacrificial material is deposited by conformal layer formation (LPCVD or thermal oxidation). In one embodiment, the sacrificial material is $SiO_2$, with a thickness of between 50 and 2000 nanometers. This sacrificial oxide layer conformally covers the hexagonal-prism trench walls and the template frontside. If subsequent laser crystallization is used (see step 952 below), step 944 also includes depositing a thin nitride layer by LPCVD. In one embodiment, this nitride layer is $Si_3N_4$, with a thickness between 100 and 1000 nanometers. The sacrificial layer may be made of porous silicon instead of oxide and/or nitride. Step 946 involves deposition of a blanket silicon layer using conformal deposition. In one embodiment, this blanket silicon layer may be amorphous silicon or polysilicon, p-type in-situ doped with boron, having a thickness between 1 and 30 microns. Note that the silicon thickness is set such that the deep trenches are fully filled with silicon while the shallow (wider) near-surface trenches receive silicon on sidewalls, and their central regions are left with self-aligned relatively shallow hexagonal troughs or trenches. Step 948 involves depositing an optional thin silicon nitride dielectric layer on top by LPCVD or PECVD to serve as a protective cap for silicon layer. In one embodiment, this layer is between 100 and 1000 nanometers. Step 950 involves 3-D thin-film TFSC substrate release. In one embodiment and when using a silicon dioxide sacrificial layer, hydrofluoric acid (HF) is used to etch the oxide sacrificial layer. In another embodiment and when using a porous silicon sacrificial layer, a mixture of ammonia, peroxide, and water ($NH_4OH+H_2O_2+H_2O$) or a mixture of hydrogen peroxide and hydrofluoric acid ($H_2O_2+HF$) or a suitable composition of tri-methyl-ammonium-hydroxide (TMAH) may be used. The etch composition and temperature may be adjusted to achieve maximum etch selectivity for porous silicon with respect to silicon. Note that the wet etchant selectively removes the sacrificial $Ge_xSi_{1-x}$ layer (or porous silicon sacrificial layer) by reaching the sacrificial layer through the template backside dielectric openings (note that backside openings may be formed directly in the template substrate backside without using any dielectric on the template backside). This process releases the hexagonal-prism 3-D thin-film TFSC substrate from the template. An optional step 952 involves laser crystallization of the released 3-D thin-film amorphous silicon or polysilicon substrate to form a large-grain polysilicon microstructure. The silicon nitride layer surrounding silicon serves as protective cap. The nitride layer is then selectively stripped. The hexagonal-prism 3-D thin-film TFSC substrate may then be used for subsequent 3-D TFSC fabrication.

While multiple embodiments are shown in FIGS. 96 to 102 and FIGS. 116 and 117 to depict various hexagonal-prism 3-D TFSC substrate fabrication methods of this disclosure, the embodiments shown may be used to develop additional process flows and variations based on the overall concepts, designs, embodiments, and methodologies.

FIGS. 118 through 122 illustrate Y-Y cross-sectional views of a template 510 (see FIG. 47) with in-wafer hexagonal-prism trenches 442 and no dielectrics on the template frontside and an optional backside layer 434 (the template may be fabricated without any frontside and backside dielectric layers), as it goes through the key process steps to fabricate a hexagonal-prism single-aperture 3-D thin-film TFSC substrate with a rear base layer. Again, the flow used for this fabrication process flow is based on one of the embodiments outlined earlier.

Figure 118:
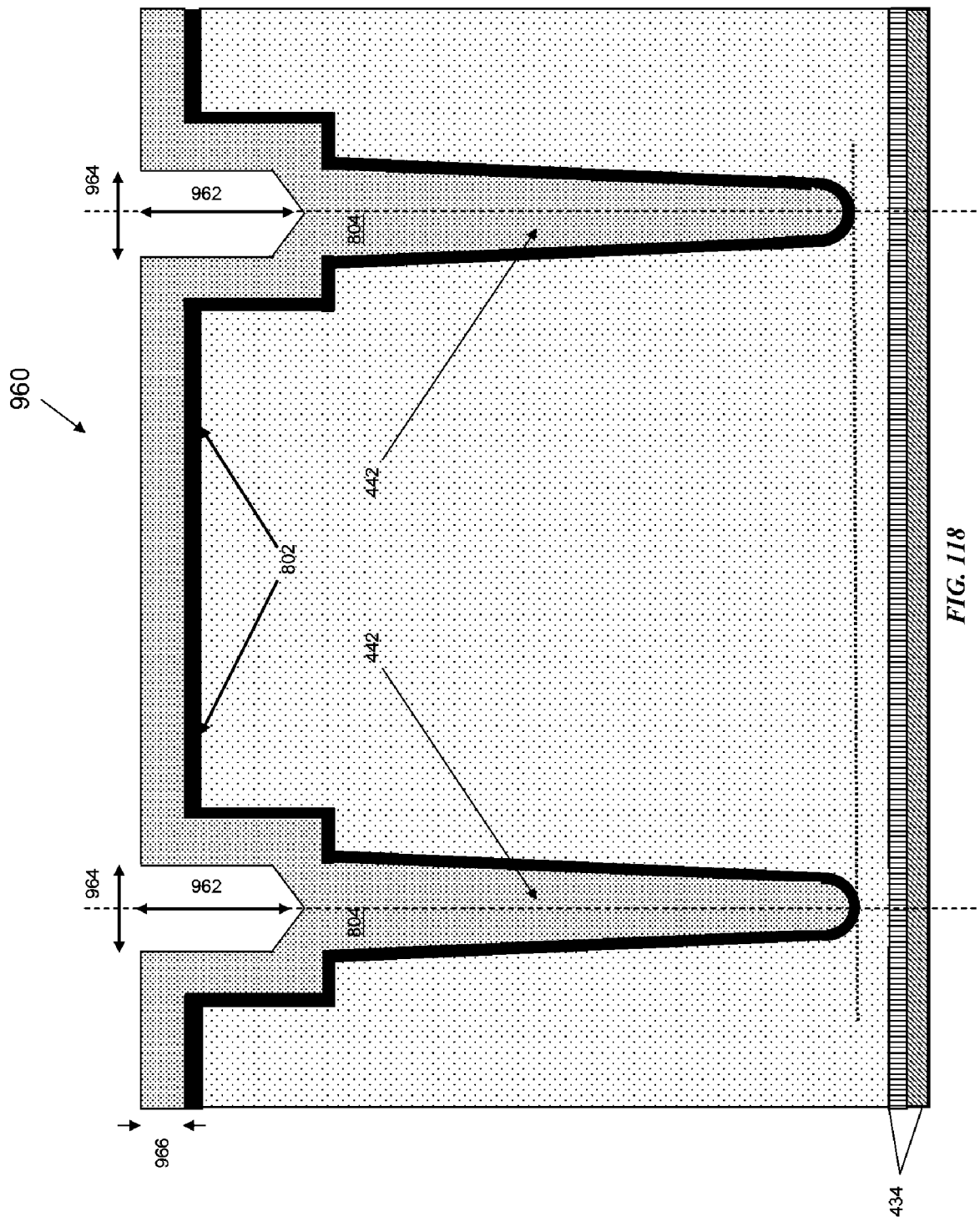

FIG. 118 shows a view 960 after deposition of the thin (e.g., 200 to 2000 nanometers thick) sacrificial layer 802 (epitaxial $Ge_xSi_{1-x}$ or porous silicon or another suitable material) and the in-situ-doped (boron-doped for p-type base) epitaxial silicon layer 804. The epitaxial silicon deposition process fills the trenches (void-free trench fill) while leaving relatively shallow troughs (trenches) near the top. This may be done by stopping the epitaxial deposition process after the deeper/narrower trenches are fully filled with epitaxial silicon and before filling of the wider/shallower trenches on the template frontside (thus, forming the shallower troughs with height (L) 962 and width ($W_m$) 964 in conjunction with the top epitaxial silicon layer 804 of thickness ($W_f$) 966. FIG. 119 shows a view 970 of the template in FIG. 118 after highly selective etching of the sacrificial layer 802, forming gaps 972 thus allowing for release and removal of the 3-D TFSC substrate 804 from the template. FIGS. 120 and 121 illustrate Y-Y cross-sectional views 980 and 990 of the released substrate 804 from FIG. 119. The released substrate 804 has a base side 982, an emitter side 984. The substrate 804 has dimensions of $T_{st}$ 426 (silicon sidewall thickness near the base side of the hexagonal-prism vertical sidewalls), $T_{sb}$ 430 (silicon sidewall thickness near the emitter side of the hexagonal-prism vertical sidewalls), hexagonal-prism height 986, and tapered hexagonal-prism thin-film TFSC substrate sidewalls 988. Referring to the view 980 in FIG. 120, the base side 982 is shown on the top and the emitter side 984 is shown on the bottom (TFSC substrate as released from the template). In the view 990 in FIG. 121, the base side 982 is shown on the bottom and the emitter side 984 is shown on the top. FIG. 122 shows a Y-Y cross-sectional view 1000 of the template shown in FIG. 119 after releasing and separating/removing the embedded hexagonal-prism single-aperture 3-D thin-film TFSC substrate with a rear base layer (see template 510 in FIG. 47). The template 510 is ready for multiple reuse cycles.

FIGS. 123 through 125 illustrate Y-Y cross-sectional views of the template 620 from FIG. 59 with square-based pyramid (shown as triangular cavity cross section) backside release channels 626, allowing for release etchant access from template backside and subsequent release of the 3-D thin-film TFSC substrate. FIG. 123 shows a view 1010 after formation of a suitable sacrificial layer 1012 (made of porous silicon, silicon germanium, or another suitable material). Note that the through-wafer small-diameter (e.g., 500 to 5000 nanometers) holes 634 are pinched off by porous (microporous or mesoporous) silicon. Porous silicon sacrificial layer may be formed by epitaxial deposition of a thin conformal layer of p-type silicon and its subsequent conversion to porous silicon (or alternatively by direct conversion of a thin surface layer of the template to sacrificial porous silicon). FIG. 124 shows a view 1020 after epitaxial deposition of in-situ-doped (e.g., boron-doped for p-type base) silicon 804. This step may fill the deep trenches and form the shallow troughs/trenches stacked over the epitaxy-filled deep trenches. FIG. 125 shows a view 1030 after selective wet chemical etching of sacrificial porous silicon layer 1012 (e.g., in $HF/H_2O_2$ or TMAH or another suitable selective etchant for porous silicon) to release and remove the 3-D TFSC substrate 804 from the template 620.

Figure 68:
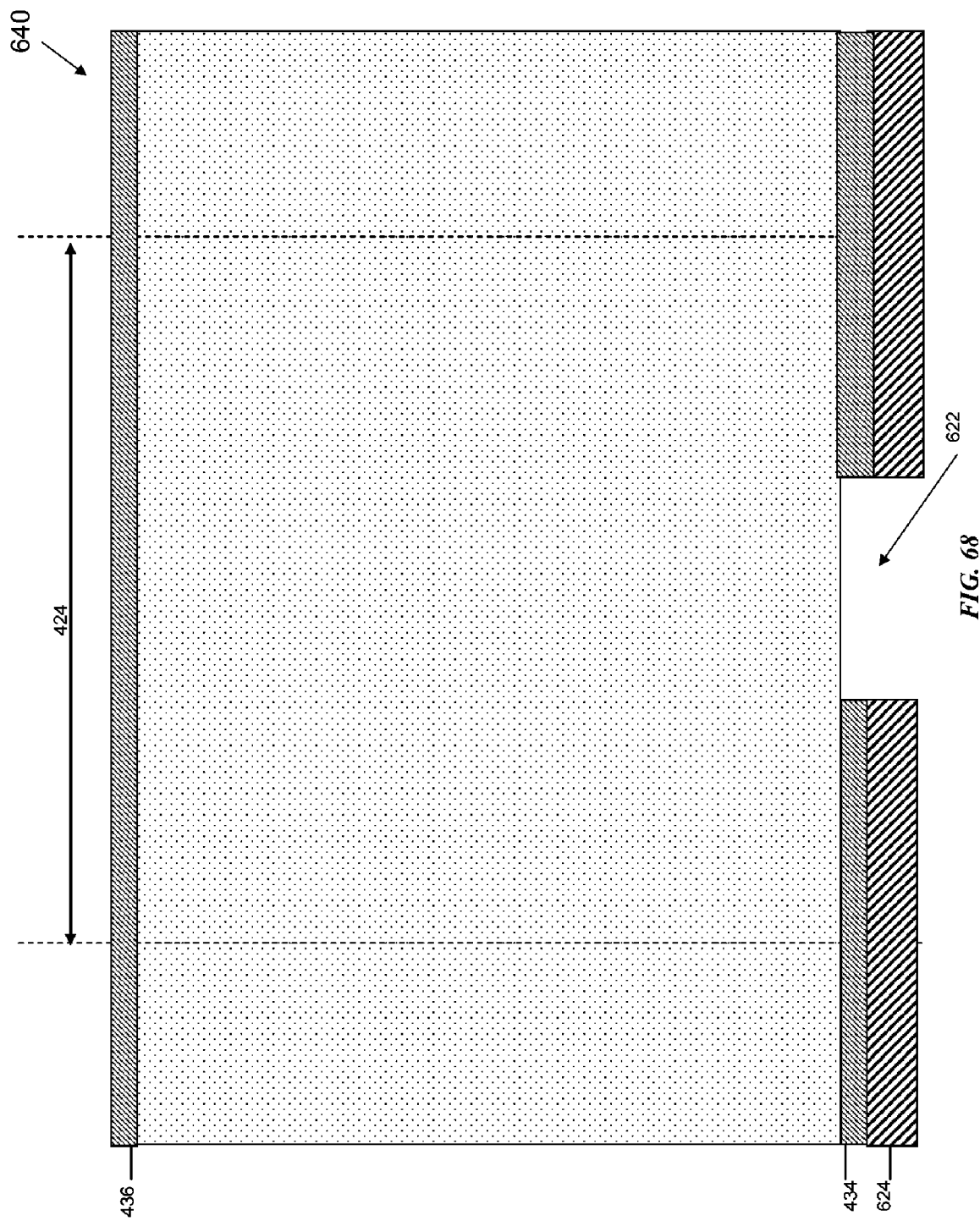
Figure 69:
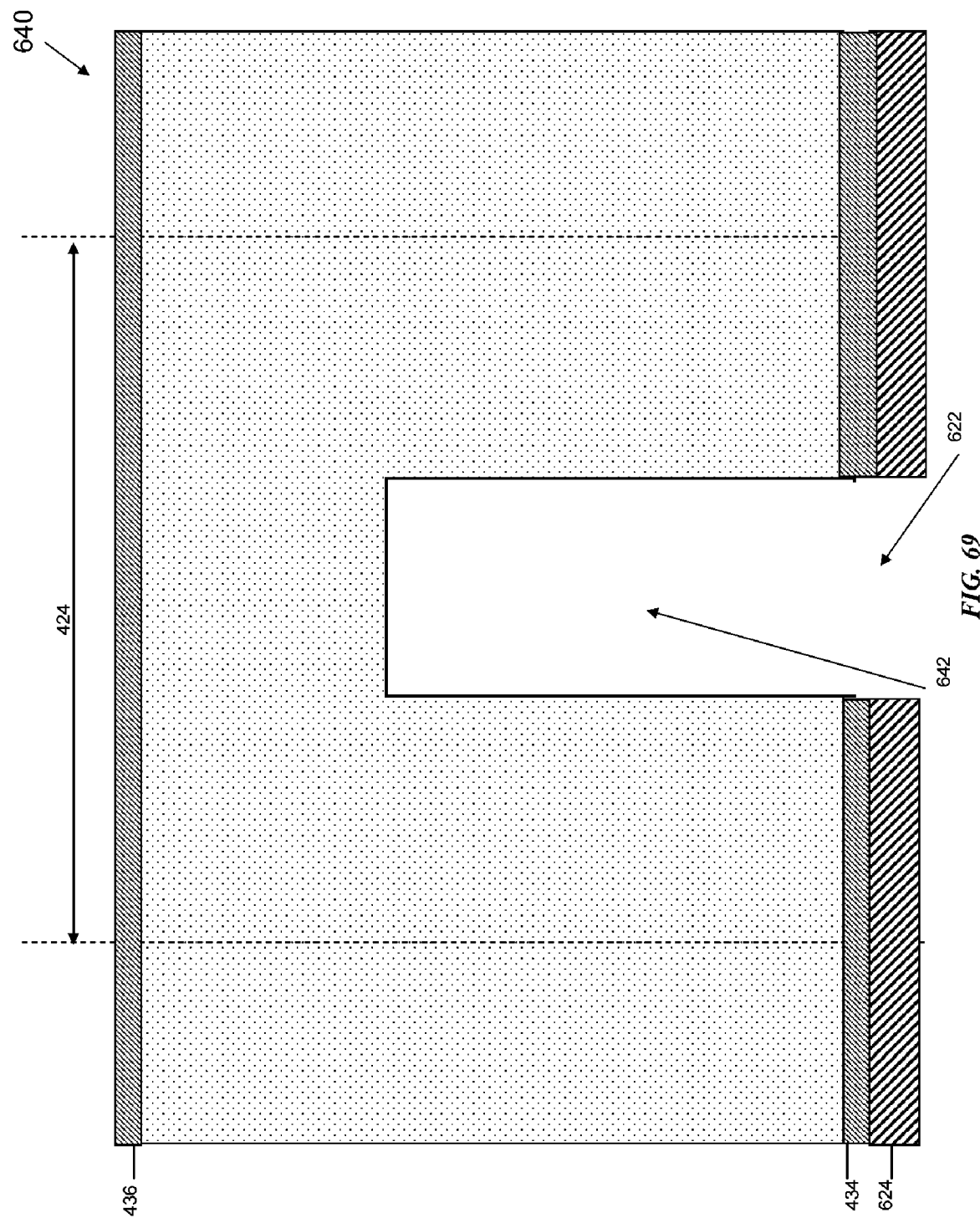
Figure 70:
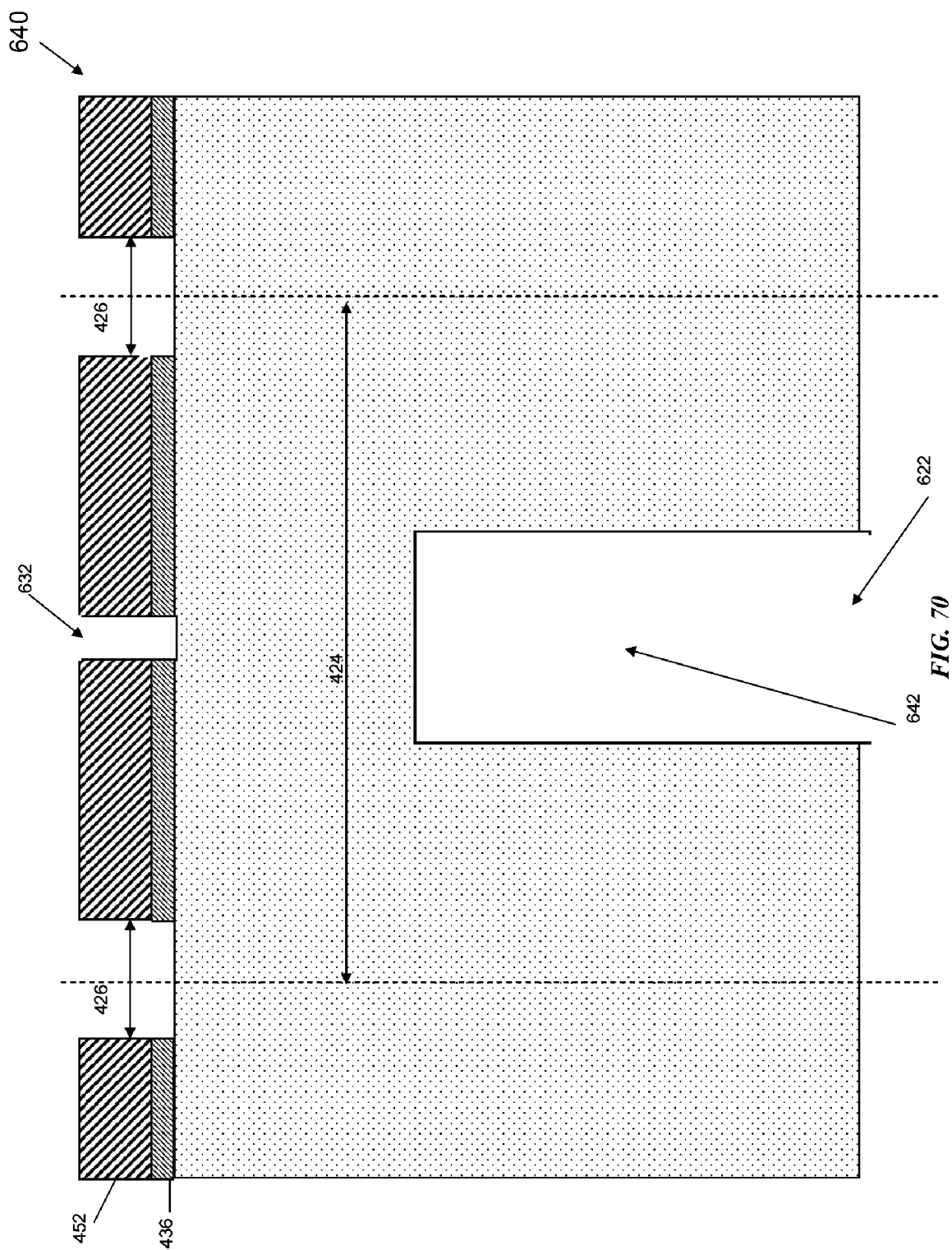
Figure 71:
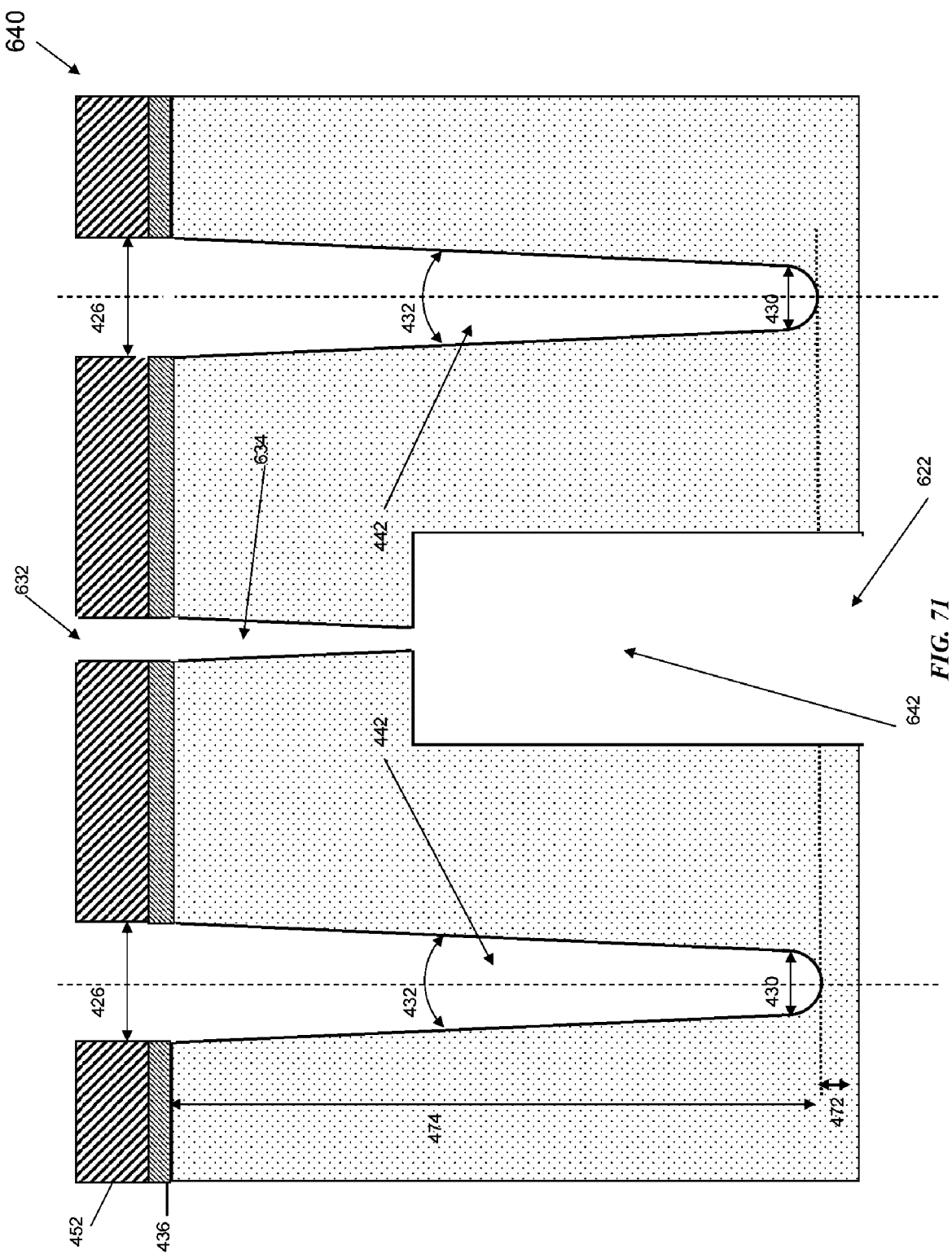
Figure 72:
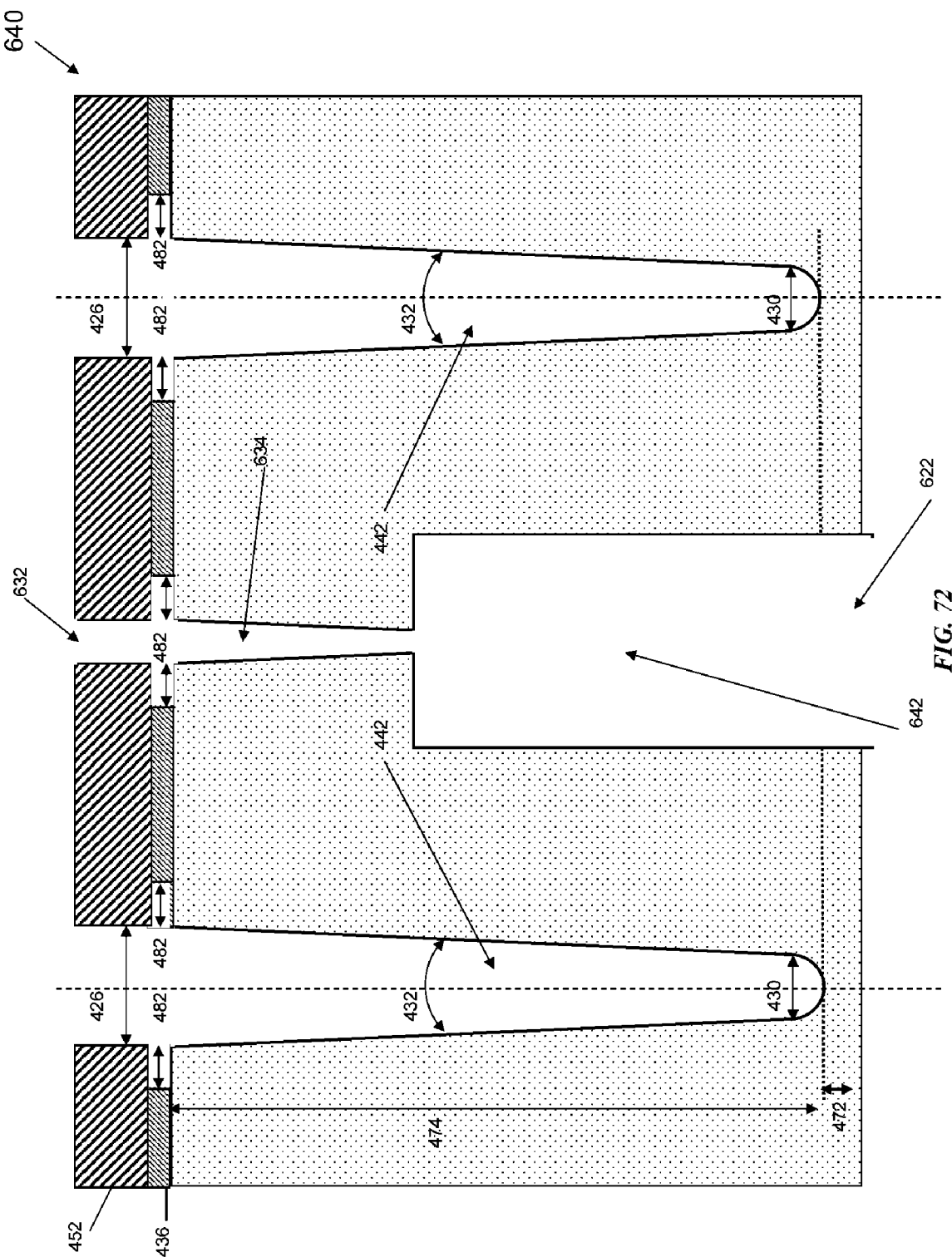
Figure 73:
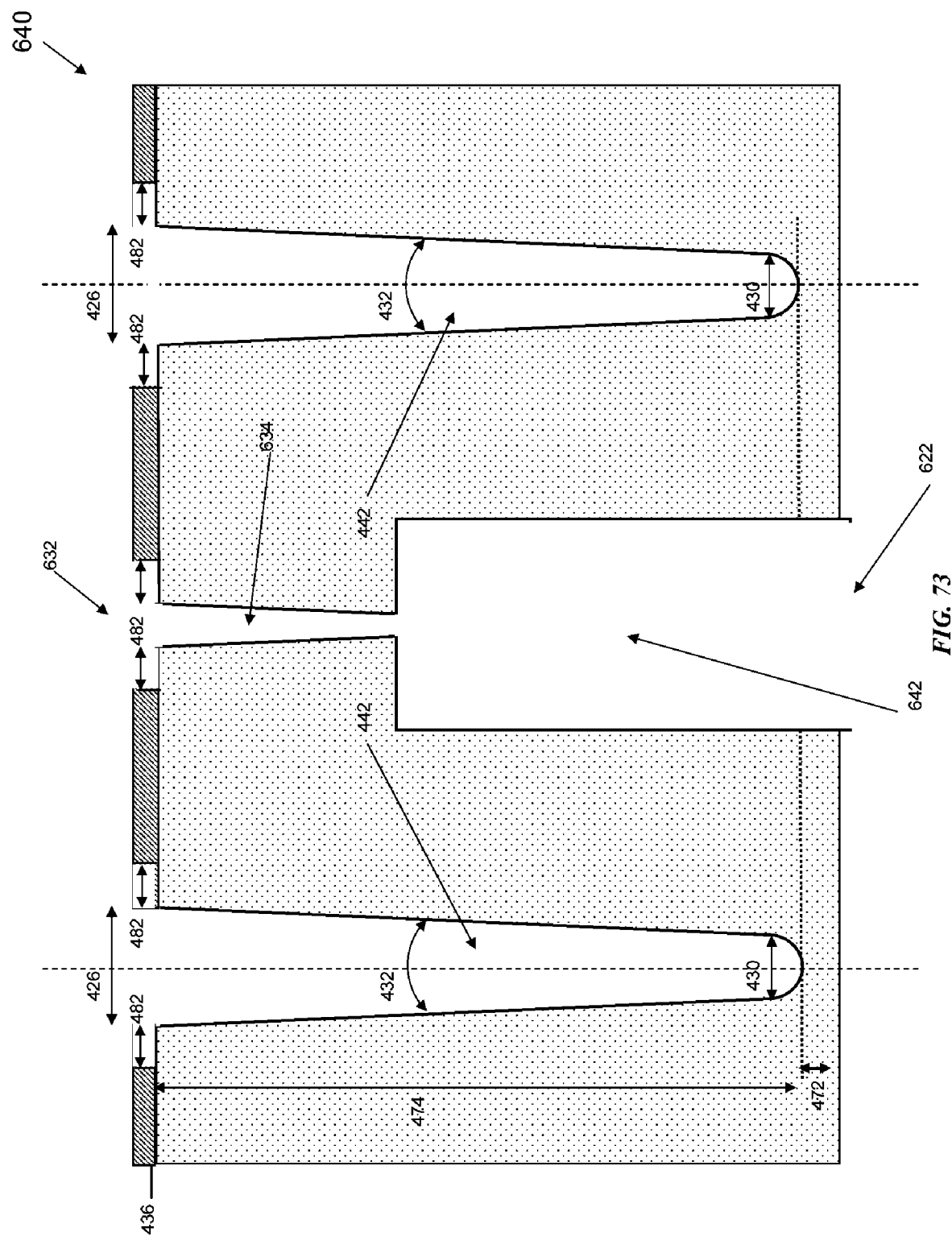
Figure 74:
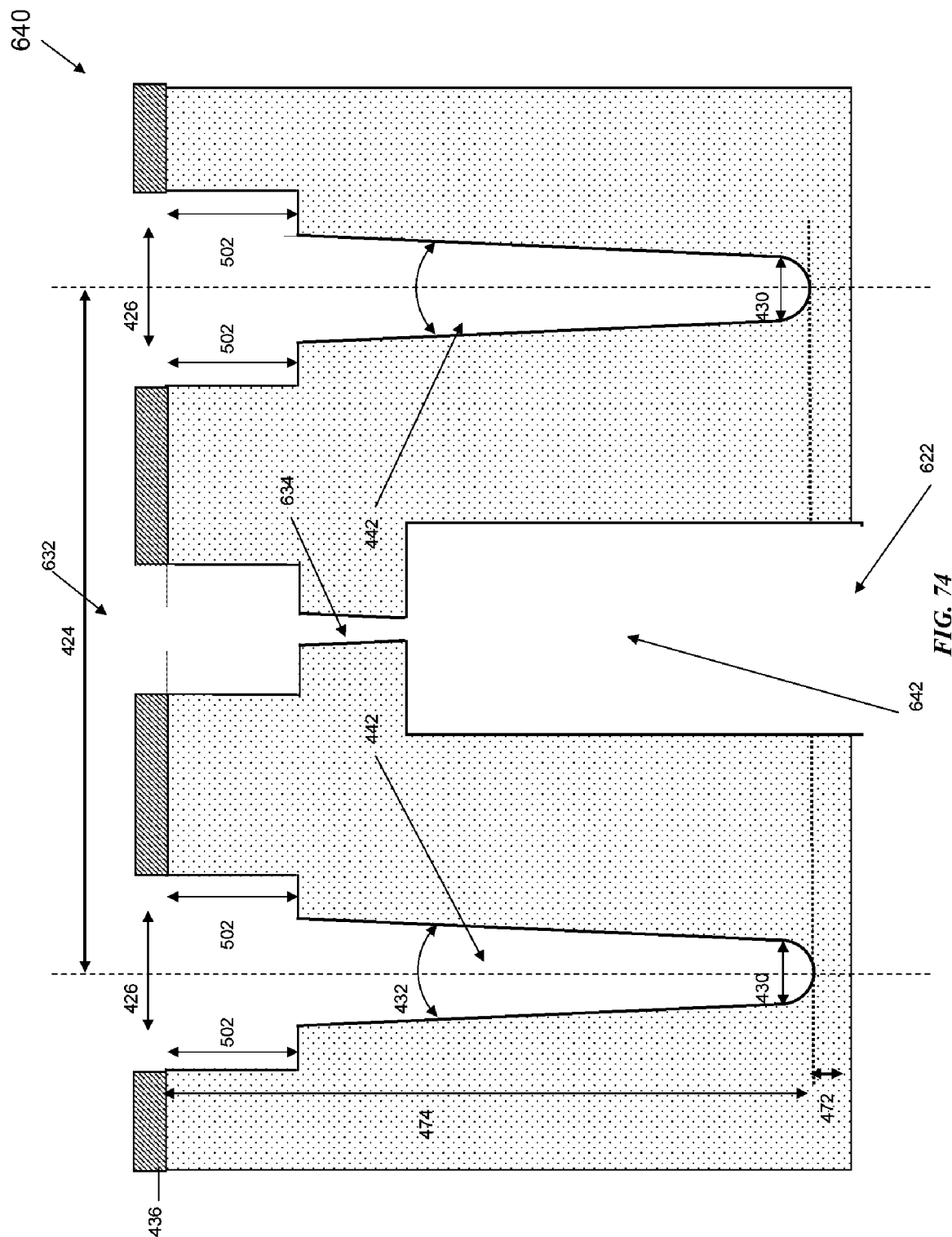

FIGS. 126 through 128 illustrate Y-Y cross-sectional views of the template 640 from FIG. 68 with square-based (rectangular-shaped) backside release channels 642, allowing for etchant access from the template backside and subsequent release of the 3-D thin-film TFSC substrate. FIG. 126 shows a view 1040 after formation of a thin sacrificial layer 1012 of porous silicon. Note that the through-wafer small-diameter holes 634 may be pinched off by porous (microporous or mesoporous) silicon. FIG. 127 shows a view 1050 after epitaxial deposition of in-situ-doped silicon 804. This step may fill the deep trenches and form the shallow troughs/trenches stacked over the epitaxy-filled deep trenches. FIG. 128 shows a view 1060 after selective wet chemical etching of sacrificial porous silicon layer 1012 (e.g., in $HF/H_2O_2$ or TMAH or another suitable selective etchant) to release the 3-D TFSC substrate 804 from the template 640.

FIGS. 129 through 131 illustrate Y-Y cross-sectional views of the template 620 from FIG. 79 with backside release channels 644 aligned with the bottoms of trenches, allowing for backside etchant access and subsequent release of the 3-D thin-film TFSC substrate. FIG. 129 shows a view 1070 after formation of a thin (and relatively conformal) sacrificial layer

1012 of porous silicon. FIG. 130 shows a view 1080 after epitaxial deposition of in-situ-doped silicon 804. This step may fill the deep trenches and form the shallow troughs/trenches stacked over the epitaxy-filled deep trenches. FIG. 131 shows a view 1090 after selective wet chemical etching of sacrificial porous silicon layer 1012 (e.g., in $HF/H_2O_2$ or TMAH or another suitable selective wet etchant) to release and remove the 3-D TFSC substrate 804 from the template 620.

The following section describes the use of 3-D thin-film TFSC substrates in fabrication of 3-D TFSCs.

FIG. 132 shows a schematic view 1100 of a hexagonal-prism single-aperture 1102 (on top 1104) 3-D TFSC substrate with the hexagonal-prism 3-D TFSC substrate rear side 1106 monolithically connected to a relatively flat planar thin film 1108 (rear base layer).

FIG. 133 shows a schematic magnified top view 1110 of a regular (equilateral) hexagonal-prism 3-D thin-film TFSC substrate showing a plurality of prism unit cells 116. Each hexagonal unit cell 116 contains hexagonal unit cell boundary points ($H_1, H_2, H_3, H_4, H_5,$ and $H_6$) 1112, 1114, 1116, 1118, 1120, 1122. FIG. 133 shows the hexagonal-prism 3-D thin-film TFSC substrate sidewalls 808; the long diagonal dimension of the unit cell hexagon (d) 1124; and the short diagonal dimension of the hexagonal unit cell (h) 1126. In one embodiment, the hexagonal-prism 3-D thin-film TFSC substrate sidewalls 808 are between 2 and 30 microns thick.

FIG. 134A shows a Y-Y cross-sectional view 1130 of the hexagonal-prism single-aperture 3-D thin-film TFSC substrate with a rear base layer shown in FIG. 133. FIG. 134B shows a Z-Z cross-sectional view 1140 of the hexagonal-prism 3-D thin-film TFSC substrate shown in FIG. 133. These FIGURES also show the hexagonal thin silicon walls 808 monolithically attached to the rear base layer 1108.

FIGS. 135 through 140 show six different process flow embodiments of this disclosure for fabricating single-aperture hexagonal-prism 3-D TFSCs with rear base layers. While these process flow embodiments are outlined for fabricating silicon-based TFSCs, the overall concepts and methodologies may be extended and applied to other homojunction and heterojunction semiconductor materials (such as multicrystalline silicon, polycrystalline silicon, CIGS, etc.). While the process flows shown are for fabrication of 3-D c-Si TFSCs, the embodiments may be easily adjusted and modified to fabricate silicon-based TFSCs using polysilicon, amorphous silicon, and/or multicrystalline silicon films.

FIGS. 135 through 140 show six different process flow embodiments 1150, 1180, 1210, 1240, 1270, and 1300 of this disclosure for fabrication of single-aperture hexagonal-prism 3-D TFSCs with rear base layers (i.e., the honeycomb-prism structures have a monolithically attached thin base layer). These embodiments may use one of the templates described and shown previously. These TFSC substrates may be fabricated using templates with trenches with shallow wider trenches (shoulders) on top of deeper narrower trenches (or using deep trenches with flared out regions on top of the trenches, that is, trench widths larger on the top of the deep trenches compared to the trench widths in the lower sections of the deep trenches). These six embodiments all result in single-aperture hexagonal-prism 3-D TFSCs with self-aligned selective emitter and base diffusion regions in silicon as well as self-aligned emitter and base contact metallization regions. These embodiments include either detached rear mirrors (for instance, mirrors provided by silver-coated copper or silver-coated aluminum pads on solar module printed-circuit boards) or preferably integrated/attached rear mirrors deposited directly on the rear surface of the cell passivation dielectric (e.g., on thermal oxide) layer on the rear base layer. Both the detached and integrated/attached mirrors may also serve as the base interconnect planes (electrically connected to the hexagonal base contact metallization). In one embodiment, the material for a high-reflectivity mirror is silver (alternatively, aluminum may be used).

Figure 135:
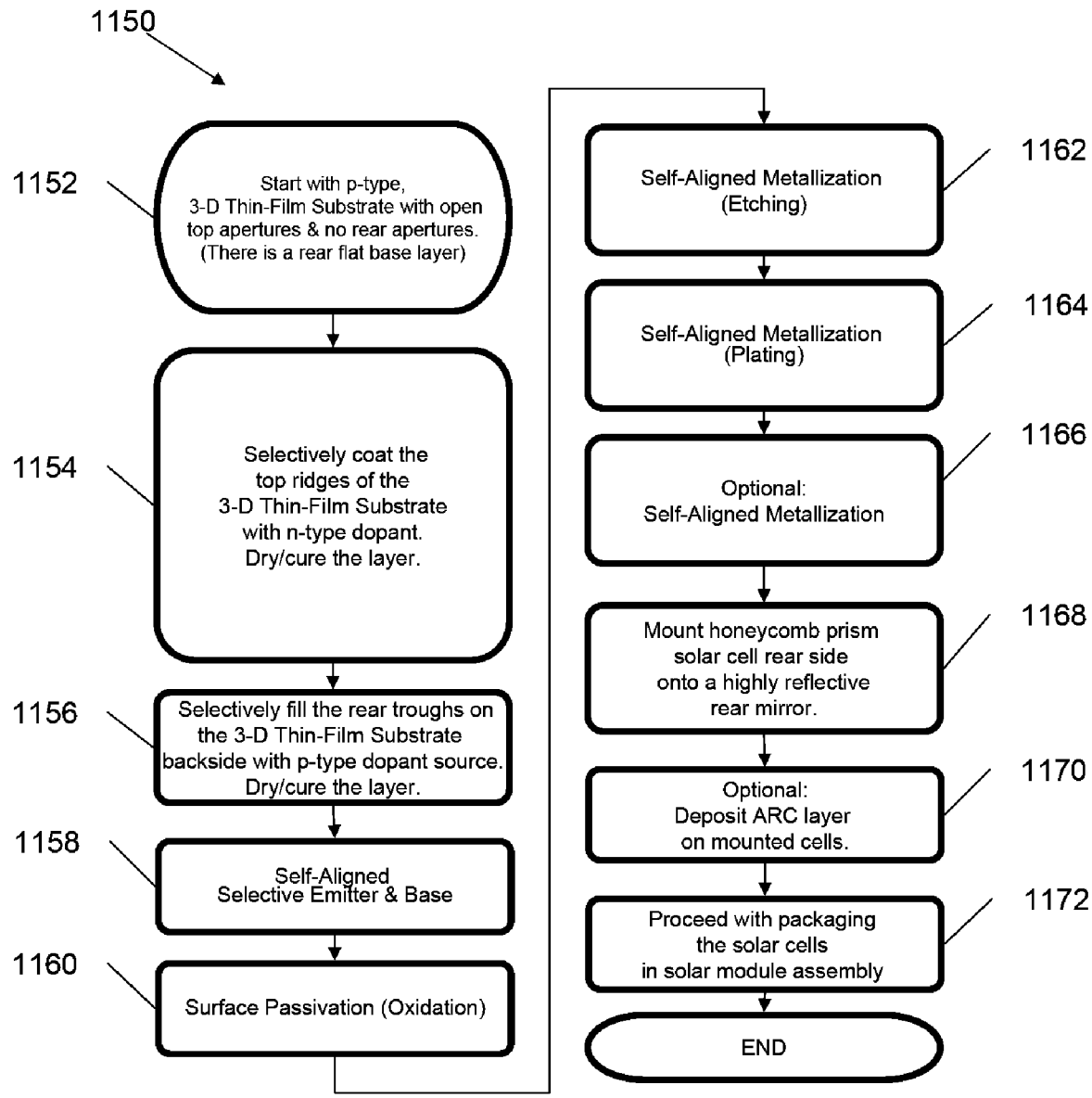

FIG. 135 shows a process flow 1150 for fabrication of single-aperture hexagonal-prism 3-D TFSCs with rear base layers using self-aligned selective plating metallization with boron-doped $p^{++}$ rear base contacts by selective base doping (besides selective emitter doping). This hexagonal-prism 3-D TFSC with rear base layer uses a detached rear mirror (i.e., rear mirror is not an integrated layer directly deposited on the rear base layer). In step 1152, cell processing starts with a single-crystal (or multicrystalline or polycrystalline) p-type (for n-type selective emitter), 3-D silicon TFSC substrate (e.g., a 3-D array of honeycomb hexagonal prisms). As with any other cells in this disclosure, the substrate doping polarity may be changed to n-type (for p-type selective emitter). The 3-D honeycomb prism TFSC substrate has open top apertures and no rear apertures (due to the rear base layer). There is a rear relatively flat base silicon layer monolithically and integrally attached to the honeycomb-prism cell. Step 1154 involves selectively coating the top ridges of the 3-D honeycomb prisms (in one embodiment, the top 2 to 10 microns) with an n-type dopant source. In one embodiment, this n-type dopant source is phosphorus. Selective coating may be done by self-aligned roller coating using paste/liquid source, liquid-dip coating by dipping in a known liquid source depth, ink-jet coating, or spray coating. Next, the n-type dopant source layer is dried and cured (e.g., by thermal curing at 250° C. to 400° C. or UV irradiation). Step 1156 involves selectively filling the rear base troughs on the substrate backside with a p-type liquid/paste dopant source layer. In one embodiment, the p-type dopant source is boron. Selective filling may be done by boron source layer coating (e.g., roller, spin-on, ink-jet, or spray coating) followed by selective etch-back (e.g., by solvent spin-on) to form filled troughs. Next, the p-type dopant source layer is dried and cured (e.g., by thermal curing at 250° C. to 400° C. or UV exposure). Step 1158 involves forming self-aligned selective emitter and base regions. The top $n^{++}p$ emitter diffusion contact, top aperture $n^+p$ selective emitter junctions, rear $p^{++}$ base contacts and selectively doped $p^+$ base regions (the latter are optional) are concurrently formed. This may be done using thermal anneal in a diffusion furnace at 800° C. to 950° C. In one embodiment, the 3-D TFSC substrate is annealed while placed in an in-line diffusion furnace, or with stacks of 3-D TFSC substrates in face-to-face contact to facilitate vapor-phase doping formation of $n^+$ emitter and $p^+$ base. Step 1160 involves surface passivation (oxidation), where a thermal oxide layer is grown, in one embodiment by steam oxidation (e.g., 10 to 200 nanometers at 800° C. to 950° C.). Step 1160 may be merged into the prior diffusion step in multi-zone furnace, to be performed sequentially after the selective emitter and base diffusion step. In one embodiment, the diffusion/oxidation steps result in selective emitter and emitter contact sheet resistance values of 80-150 Ω/square and 10-70 Ω/square, respectively. Step 1162 involves selective etching of the cured layers in preparation for self-aligned metallization. The dopant source layers are selectively etched (i.e., the n-type coating on top honeycomb prism ridges and the p-type coating in rear filled troughs) with a suitable dielectric etchant (e.g., an HF-based etchant) with high selectivity with respect to thermal oxide. This selectively strips the cured doped and undoped dielectrics on the top and rear portions of the substrate and exposes silicon in those regions, while removing only a small fraction of thermal oxide from other 3-D TFSC substrate regions. Step 1164 involves self-aligned metallization (in one embodiment, by plating). The front and rear emitter and base metallized regions are concurrently formed using selective electroplating and/or electroless plating and/or galvanic plating to form single or multilayer high-conductivity metallized regions (silver, aluminum, nickel, titanium, cobalt, tantalum). For instance, the plated metal stack may include a thin (50 to 500 nanometers) barrier and adhesion layer such as nickel (nickel) followed by a relatively thick (2 to 15 microns) layer of high-conductivity metal (silver or copper or aluminum). If a high-conductivity metal other than silver is used for the thick metallization layer, a final flash coat of silver may be used to create a high-reflectivity surface coating in order to improve light reflection and trapping into the 3-D cells (by the emitter metallization contact). Step 1166 involves an optional forming-gas anneal. A forming gas anneal may be performed (e.g., 350° C. to 450° C.) to reduce front and rear interconnect resistance values and help with surface/bulk passivation. Step 1168 involves mounting honeycomb prism TFSC rear side (base side) onto a highly reflective (diffuse with a rough surface or specular with a smooth surface) rear mirror. This rear mirror may be made of an silver-coated aluminum or copper foil and may also serve as the TFSC base interconnect plane on a printed-circuit board (PCB) in a solar module. Step 1170 involves an optional step of depositing a passivation and ARC layer on mounted cells. In one embodiment, this passivation and ARC layer is PVD or PECVD $SiN_x$ with thickness between 50 and 200 nanometers. Step 1172 involves proceeding with packaging the honeycomb prism TFSCs in solar module assembly.

Figure 136:
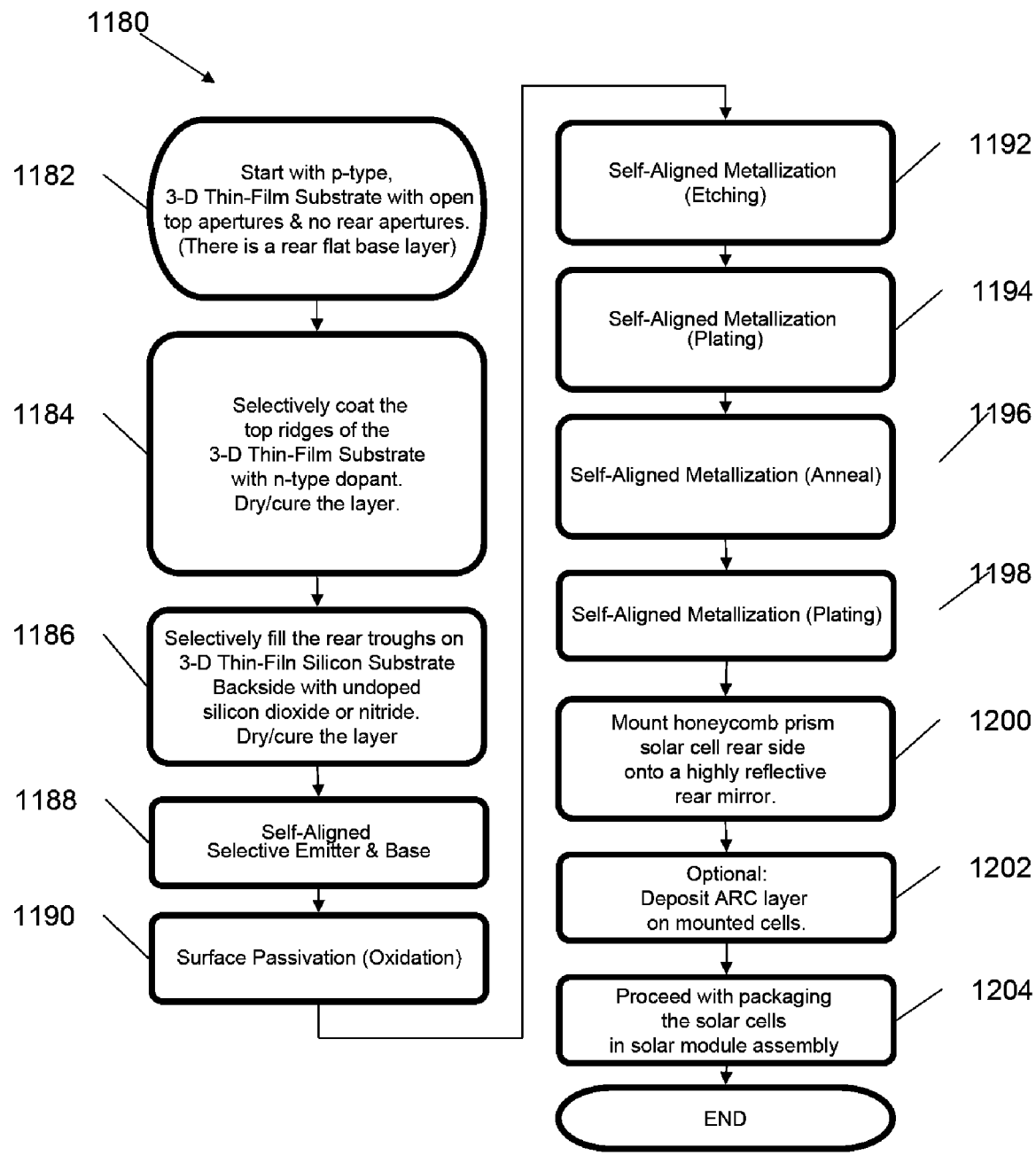

FIG. 136 shows an alternative process flow 1180 for fabrication of single-aperture hexagonal-prism 3-D TFSCs with rear base layers using self-aligned selective plating metallization without boron-doped $p^{++}$ rear base contacts by selective base doping. The $p^{++}$ base contact doping is performed by aluminum doping using aluminum from base contact metallization and an anneal (contact firing process). As in FIG. 135, this process flow uses cured phosphorus source layer and a thermal anneal to form the $n^+$ phosphorus-doped selective emitter regions and the $n^{++}$ phosphorus-doped emitter contact diffusion regions. This single-aperture hexagonal-prism 3-D TFSC with rear base layer also uses a detached rear mirror (i.e., rear mirror is not an integrated layer directly deposited on the rear base layer). Step 1182 (providing a substrate) corresponds to step 1152 of FIG. 135; and step 1184 (selective coating) corresponds to step 1154. Step 1186 (selective filling) involves selectively filling the rear base troughs on the TFSC substrate backside with an undoped sealant dielectric (e.g., oxide and/or nitride) using a dielectric liquid/paste source layer. Selective filling may be done by undoped dielectric source layer coating (e.g., roller, spin-on, ink-jet, or spray coating) followed by selective etch-back (e.g., by solvent spin-on) to form filled troughs. Next, the undoped dielectric source layer is dried and cured (e.g., by thermal curing at 250° C. to 400° C. or UV exposure). Step 1188 involves self-aligned selective emitter and base. The top $n^{++}p$ emitter contact and honeycomb top apertures $n^+p$ selective emitter junctions are concurrently formed using thermal anneal at 800° C. to 950° C. In one embodiment, the 3-D TFSC substrate may be annealed while placed in an in-line diffusion furnace, or with stacks of 3-D TFSC substrates in face-to-face contact to facilitate vapor-phase doping formation of $n+p$ selective emitter and $n^{++}p$ emitter contact regions. Step 1190 (surface passivation oxidation) corresponds to step 1160 of FIG. 135. Step 1192 involves selective etching of the cured layers in preparation for self-aligned metallization. The dopant source layer (i.e., the n-type coating on top honeycomb prism ridges) and the undoped dielectric filling in rear filled troughs) are selectively etched with a suitable etchant (e.g., an HF etchant) with high selectivity with respect to thermal oxide. This selectively strips the cured dopant source dielectrics on the top and rear portions of the 3-D TFSC substrate and exposes silicon in those regions, while removing only a small fraction of thermal oxide from other 3-D TFSC substrate regions. Step 1194 involves self-aligned metallization (embodiments include electroless plating, galvanic plating, and/or electroplating). The rear base aluminum metallized regions are selectively formed by selective electroplating or electroless plating. In one embodiment, this aluminum plating process limited to the rear base regions. Step 1196 involves an anneal or firing process to form rear aluminum-doped $p^+$ contacts. An optional forming gas anneal (e.g., 350° C. to 450° C.) is performed to reduce interconnect resistance and help with surface/bulk passivation. Step 1198 involves self-aligned metallization (plating). A suitable high-conductivity metal such as silver or copper (e.g., 2 to 12 microns) is selectively/concurrently deposited on the top honeycomb ridges (emitter) and rear aluminum-filled troughs (aluminum metallized base contacts) by plating. If necessary, the plating process may first involve selective deposition of a suitable refractory metal barrier and adhesion layer (e.g., 50 to 200 nanometers nickel) followed by the deposition of the thicker higher conductivity metal (silver and/or copper). If necessary, the metallized regions are then flash coated with a thin layer of silver in order to establish a high optical/IR reflectivity (this step may be merged into the prior plating step). If silver is used as the main metallization layer, then the top solver flash coating may not be needed. Step 1200 (mounting) corresponds to step 1168 of FIG. 135; step 1202 (ARC layer) corresponds to step 1170; and step 1204 (proceeding with packaging) corresponds to step 1172.

Figure 137:
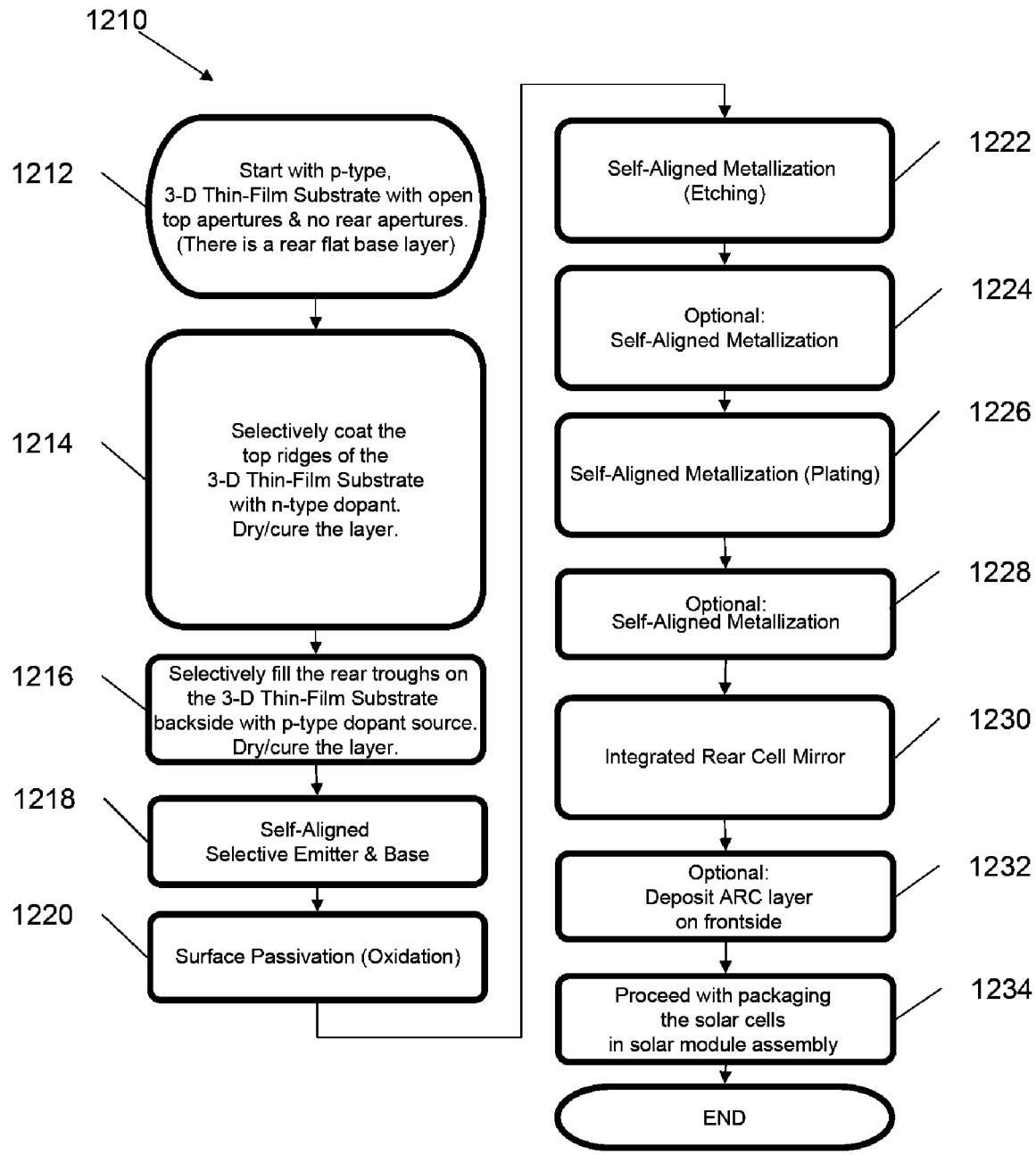

FIG. 137 shows another alternative process flow 1210 for fabrication of hexagonal prism 3-D TFSCs with rear base layers using self-aligned selective plating metallization with boron-doped $p^{++}$ rear base contacts by selective base doping (besides selective emitter doping). This single-aperture hexagonal-prism 3-D TFSC with rear base layer uses an integrated rear mirror which is directly deposited (e.g., silver or aluminum formed by sputtering, evaporation, or another method such as non-selective plating) on the rear base passivation dielectric layer (the rear base passivation layer may be a thermal oxide layer). Optionally, the rear base passivation dielectric (e.g., oxide) layer surface may be treated (e.g., with plasma) to produce a rough dielectric surface (e.g., with an RMS surface roughness in the range of tens to hundreds of nanometers) prior to mirror layer deposition. This may produce a diffuse integrated mirror directly on the rear surface of the rear base layer passivation layer. Alternatively, the TFSC substrate may already be textured as a result of using a textured template, resulting in a diffuse rear mirror. Step 1212 (providing a substrate) corresponds to step 1182 of FIG. 136; and step 1214 (selective coating) corresponds to step 1184. Step 1216 involves selectively filling the rear base troughs on the 3-D TFSC substrate backside with p-type (e.g., boron) liquid/paste dopant source. This may be done by boron source layer coating (e.g., roller, spin-on, ink-jet, or spray coating) followed by etch-back (e.g., by solvent spin-on) to form filled troughs. The layer is then dried and cured (using thermal curing at 250° C. to 400° C. or UV exposure). Step 1218 involves self-aligned selective emitter and base. The top $n^{++}p$ emitter contact, honeycomb top apertures $n+p$ selective emitter junctions, the rear $p^{++}$ base contact and selectively doped $p^+$ base regions are concurrently formed using thermal anneal at 800° C. to 950° C. In one embodiment, the 3-D TFSC substrate is annealed while placed in an in-line diffusion furnace, or with stacks of 3-D TFSC substrates in face-to-face contact to facilitate vapor-phase doping formation of $n^+$ emitter and $p^+$ base. Step 1220 (surface passivation oxide) corresponds to step 1190 of FIG. 136. Step 1222 involves selective etching of the cured layers in preparation for self-aligned metallization. The dopant source layers (i.e., the n-type coating on top honeycomb prism ridges and the p-type coating in rear filled troughs) are selectively etched with a suitable dielectric etchant (e.g., an HF-based etchant) with a relatively high selectivity with respect to thermal oxide. This selectively strips the cured dopant layers on the top and rear portions of the 3-D thin-film TFSC substrate and exposes silicon in those regions, while removing only a small fraction of thermal oxide from other 3-D thin-film TFSC substrate regions (e.g., thermal oxide coating remains on all selective emitter regions and rear base backside regions outside the base contact area). Step 1224 involves an optional plasma treatment step. A plasma treatment process may be performed to roughen the thermal oxide layer on the substrate backside (for integrated diffuse rear mirror). Step 1226 involves self-aligned metallization (plating). The front and rear emitter and base metallized regions are concurrently formed using selective electroplating and/or electroless plating and/or galvanic plating to form single or multilayer high-conductivity metallized regions (silver, aluminum, nickel, titanium, cobalt, tantalum). For instance, the plated metal stack may include a thin (50 to 500 nanometers) barrier and adhesion layer such as nickel (nickel) followed by a relatively thick (2 to 15 microns) layer of high-conductivity metal (silver or copper or aluminum). If a high-conductivity metal other than silver is used for the thick metallization layer, a final flash coat of silver may be used to create a high-reflectivity surface coating in order to improve light reflection and trapping into the 3-D cells (by the emitter metallization contact). Step 1228 involves an optional forming gas anneal step is (e.g., performed at 350° C. to 450° C.) to reduce front and rear interconnect resistance values and help with surface/bulk passivation. Step 1230 involves addition of an integrated rear cell mirror. A thin (e.g., 50 to 1000 nanometers) layer of high-reflectance metal (silver and/or aluminum, among others) is deposited on TFSC substrate backside (e.g., by PVD, non-selective plating, or evaporation). This thin layer also serves as base interconnect plane. Step 1232 involves an optional step of depositing an ARC (e.g., 50 to 200 nanometers PVD or PECVD hydrogenated $SiN_x$ or $AlO_x$) layer on substrate frontside. This step is may be performed either before or after mounting the cells in the module assembly. Step 1234 (proceeding with packaging) corresponds to step 1204 of FIG. 136.

Figure 138:
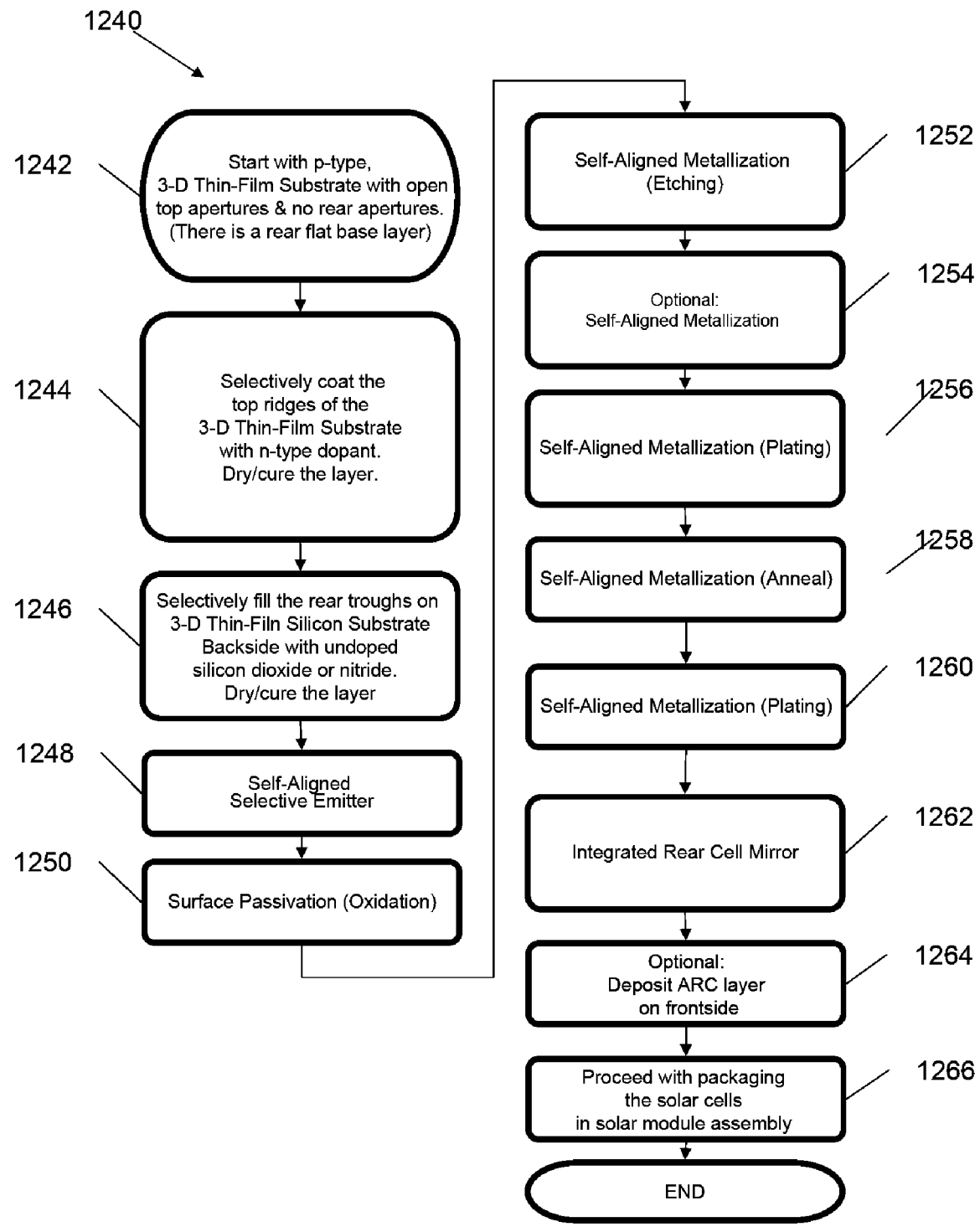

FIG. 138 shows another alternative process flow 1240 for fabrication of single-aperture hexagonal-prism 3-D TFSCs with rear base layers using self-aligned selective plating metallization without boron-doped $p^{++}$ rear base contacts by selective base doping. The $p^{++}$ base contact doping is performed by aluminum doping (aluminum contact firing) using aluminum from base contact metallization and an anneal (firing process). This process flow uses cured phosphorus source layer and a thermal anneal to form the $n^+$ phosphorus-doped selective emitter regions and the $n^{++}$ phosphorus-doped emitter contact regions (the latter underneath the cured phosphorus doping layer). This single-aperture hexagonal-prism 3-D TFSC with rear base layer uses an integrated rear mirror which is directly deposited (embodiments include silver and/or aluminum deposited by PVD, evaporation, or non-selective plating) on the rear base passivation dielectric layer. As an option, the rear base passivation dielectric (e.g., oxide) layer surface may be treated (e.g., with plasma) to produce a roughened dielectric surface (e.g., with an RMS surface roughness of roughly tens to hundreds of nanometers) prior to mirror layer deposition. This produces a diffuse integrated mirror directly on the rear surface of the rear base layer passivation layer. Alternatively, the TFSC substrate rear base layer may be pre-textured by a textured template surface (thus, eliminating the need for such plasma treatment). Step 1242 (providing a substrate) corresponds to step 1212 of FIG. 137; and step 1244 (selective coating) corresponds to step 1214. Step 1246 (selective filling) corresponds to step 1186 of FIG. 136; step 1248 (self-aligned selective emitter and base) corresponds to step 1188 of FIG. 136; step 1250 (surface passivation) corresponds to step 1190 of FIG. 136; and step 1252 (etch) corresponds to step 1192 of FIG. 136. Step 1254 (optional plasma treatment step as part of self-aligned metallization) corresponds to step 1224 of FIG. 137. Step 1256 (plating) corresponds to step 1194 of FIG. 136; step 1258 (anneal) corresponds to step 1196 of FIG. 136; and step 1260 (plating) corresponds to step 1198 of FIG. 136. Step 1262 (integrated mirror) corresponds to step 1220 of FIG. 137; step 1264 (ARC layer) corresponds to step 1222 of FIG. 137; and step 1266 (proceeding with packaging) corresponds to step 1224 of FIG. 137.

Figure 139:
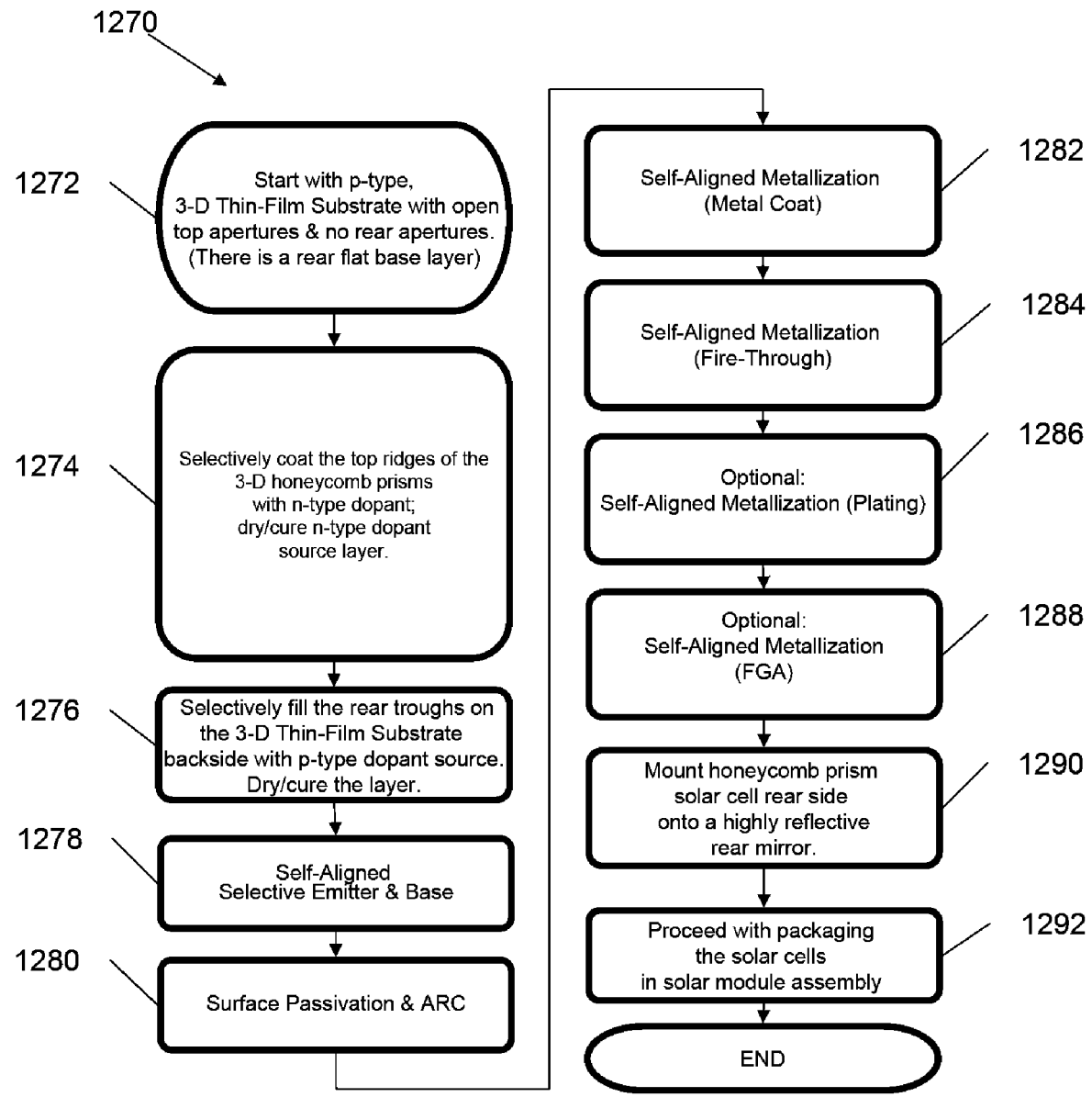

FIG. 139 shows another alternative process flow 1270 for fabrication of single-aperture hexagonal-prism 3-D TFSCs with rear base layers using self-aligned fire-through metallization with boron-doped $p^{++}$ rear base contacts by selective base doping (besides selective emitter doping). This hexagonal-prism 3-D TFSC with rear base layer uses a detached rear mirror in module assembly (i.e., rear mirror is not an integrated layer directly deposited on the rear base layer). Step 1272 (providing a substrate) corresponds to step 1212 of FIG. 137; step 1274 (selective coating) corresponds to step 1214; step 1276 (selective filling) corresponds to step 1216; and step 1278 (self-aligned selective emitter and base) corresponds to step 1218. Step 1280 involves formation of surface passivation and ARC. The top (emitter phosphorus) dopant source layer, rear (base boron) dopant source layer, and any native oxide are stripped using a suitable etchant (e.g., using HF etchant). A thin oxide layer (e.g., 5 to 100 nanometers) is grown by steam oxidation (e.g., 3 to 300 nanometers at 800° C. to 950° C.). This thermal oxidation step is optional. Next, an ARC layer (e.g., 3 to 100 nanometers hydrogenated $SiN_x$) is deposited by PECVD or PVD, with passivation layer formed on prism top and sidewalls (coverage on the cell rear is optional). The PECVD or PVD $SiN_x$ (or $AlO_x$) also provides H passivation of the 3-D TFSC substrate. In one embodiment, the diffusion/oxidation steps result in selective emitter and emitter contact diffusion sheet resistance values of 80-150 Ω/square and 10-70 Ω/square, respectively. Step 1282 involves self-aligned metallization (metal coat). The top portions of the honeycomb prisms are selectively coated (to a height equal to or less than the dopant source layer) with metal (in one embodiment, silver) liquid or paste using self-aligned roller, inkjet, liquid dip, or spray coating. Next, this layer is dried and cured (250° C. to 400° C. or UV). The rear base troughs on the substrate backside are then selectively filled with metal liquid or paste (silver and/or aluminum). This may be done by roller, spin-on, ink-jet, or spray coating followed by etch-back (e.g., by solvent spin-on or selective cell backside etchback) to form filled troughs. This layer is then dried and cured (250° C. to 400° C. or UV). Step 1284 involves self-aligned metallization (fire-through). The cell front (silver) and rear (aluminum and/or silver) metallized regions are formed by firing through the oxide/PECVD (or PVD) $SiN_x$ layers. Step 1286 involves an optional self-aligned plating metallization step. A layer of silver or copper (e.g., roughly 1 to 5 microns) is selectively/concurrently deposited on the metallized top honeycomb ridges (emitter) and rear honeycomb ridges (base) by plating. If necessary, a refractory metal barrier layer such as nickel may be deposited by plating before copper or silver plating. Next, the metallized regions are flash coated with silver. Step 1288 (optional FGA) corresponds to step 1228 of FIG. 137. Step 1290 (mounting) corresponds to step 1200 of FIG. 136. Step 1292 (proceeding with packaging) corresponds to step 1266 of FIG. 138.

Figure 140:
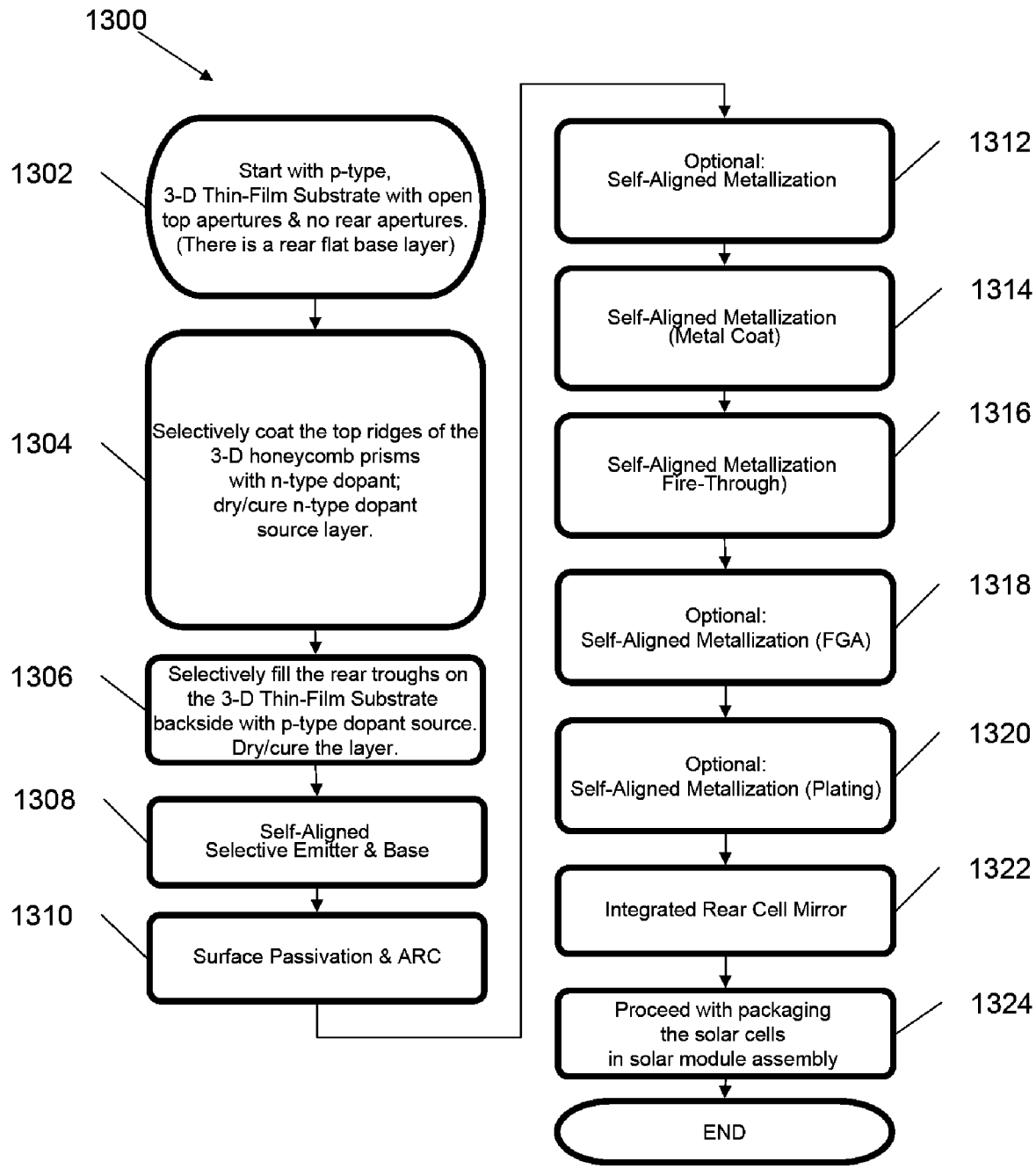

FIG. 140 shows another alternative process flow 1300 for fabrication of single-aperture hexagonal-prism 3-D TFSCs with rear base layers using self-aligned fire-through metallization and with boron-doped $p^{++}$ rear base contacts formed by selective base doping (besides selective emitter doping). This hexagonal-prism 3-D TFSC with rear base layer uses an integrated (attached) rear mirror which is directly deposited (e.g., silver or aluminum by PVD or evaporation or non-selective plating) on the rear base passivation dielectric layer. As an option, the rear base passivation dielectric (e.g., oxide) layer surface may be treated (e.g., with plasma) to produce a rough dielectric surface (e.g., with an RMS surface roughness of roughly tens to hundreds of nanometers) prior to mirror layer deposition. This may produce a diffuse integrated mirror directly on the rear surface of the rear base layer passivation layer. Alternatively, a textured TFSC substrate base layer may be formed by using a textured template (thus, eliminating the need for an optional plasma treatment step). Step 1302 (providing a substrate) corresponds to step 1272 of FIG. 139; step 1304 (selective coating) corresponds to step 1274; step 1306 (selective filling) corresponds to step 1276; step 1308 (self-aligned emitter and base) corresponds to step 1278; and step 1310 (surface passivation and ARC) corresponds to step 1280. Step 1312 involves an optional plasma treatment step to roughen the thermal oxide layer on the substrate backside (for integrated diffuse rear mirror). Step 1314 (metal coat) corresponds to step 1282 of FIG. 139; step 1316 (fire-through) corresponds to step 1284; step 1318 (optional FGA) corresponds to step 1288; and step 1320 (plating) corresponds to step 1286. The plating and FGA process steps are reversed. Step 1322 (integrated mirror) corresponds to step 1262 of FIG. 138; and step 1324 (proceeding with packaging) corresponds to step 1266.

In regard to the n-type (e.g., phosphorus) dopant liquid/paste covering the top portion of the hexagonal ridges, a single furnace anneal process in a diffusion furnace (e.g., at roughly 800° C. to 950° C.) produces more heavily-doped regions with higher surface phosphorus concentrations on the top silicon hexagonal ridges directly in contact with and underneath the cured n-type dopant solid source layer compared to other regions not covered with the cured dopant source layer. The TFSC substrates may be processed with the emitter side facing down through an in-line diffusion furnace. Through vapor-phase transport of the vaporized dopant source to the adjacent frontside regions within the hexagonal prism unit cell cavities, the furnace anneal concurrently dopes the remaining frontside surface regions not covered with the solid dopant source layer with phosphorus with smaller surface concentration (e.g., $1\times10^{19}$ to $5\times10^{19}$ cm$^{-3}$), thus, creating self-aligned selective emitter regions. These less heavily doped regions with higher sheet resistance values (in one embodiment, in the range of 100 Ω/square to 150 Ω/square) improve the blue response of the 3-D TFSC, while the more heavily doped honeycomb ridges may minimize the frontside emitter contact resistance of the 3-D TFSC. Similarly, the same furnace anneal process produces more heavily doped $p^+$-doped hexagonal prism diffused based contacts for low base contact resistance. For hexagonal-prism 3-D TFSCs with rear base layers, the remaining rear base layer rear surface base regions are less heavily doped on the surface, resulting in selective base doping (and a back-surface field or BSF region).

FIG. 149 shows a 3-D view 1330 of multiple adjacent prism unit cells from regular hexagonal prism TFSC of this disclosure, after cell fabrication, including self-aligned base and emitter contact metallization. The dark region on the top 1332 of the unit cell is the self-aligned emitter contact metal; the rear 1334 of the unit cell is the self-aligned base contact metal. The prism sidewall surfaces are doped to form the selective emitter junctions (e.g., shallow $n^+p$ junctions with a junction depth of 0.2 to 0.5 micron in boron-doped silicon base). The view 1330 is after mounting the cell rear base side (base contact metal regions 1334) onto a rear mirror 1336. The rear mirror 1336 may be made of a suitable planar material (e.g., copper or aluminum) flash-coated with silver or aluminum (e.g., using plating). The rear mirror may be copper interconnect pads or islands (plated with silver and/or aluminum) on a printed-circuit board (PCB) within a solar module assembly. Thus, the rear mirrors may also serve as base electrical interconnect planes. The rear base contact metal regions 1334 may be soldered or glued (or simply placed) onto the plated copper pads on the solar module PCB assembly. There is an optional step of silver flash coating of the assembled module structure to coat the solder joint surfaces with optically reflective silver (silver).

FIGS. 142A through 148 show various cross-sectional views of hexagonal-prism unit cells with rear base layers, with detached or integrated/attached rear mirrors. These FIGURES correspond to the cell fabrication process flow embodiments outlined in FIGS. 135-140. The cell doping polarities may be inverted (e.g., phosphorus-doped base and $p^+n$ selective emitter). While depicted for c-Si cells, this cell structure may also be applied to polysilicon, amorphous silicon, and non-Si absorber TFSCs. The substrates shown have tapered prism sidewalls (narrower emitter and wider base). Alternatively, the substrate may have vertical prism sidewalls.

Figure 142B:
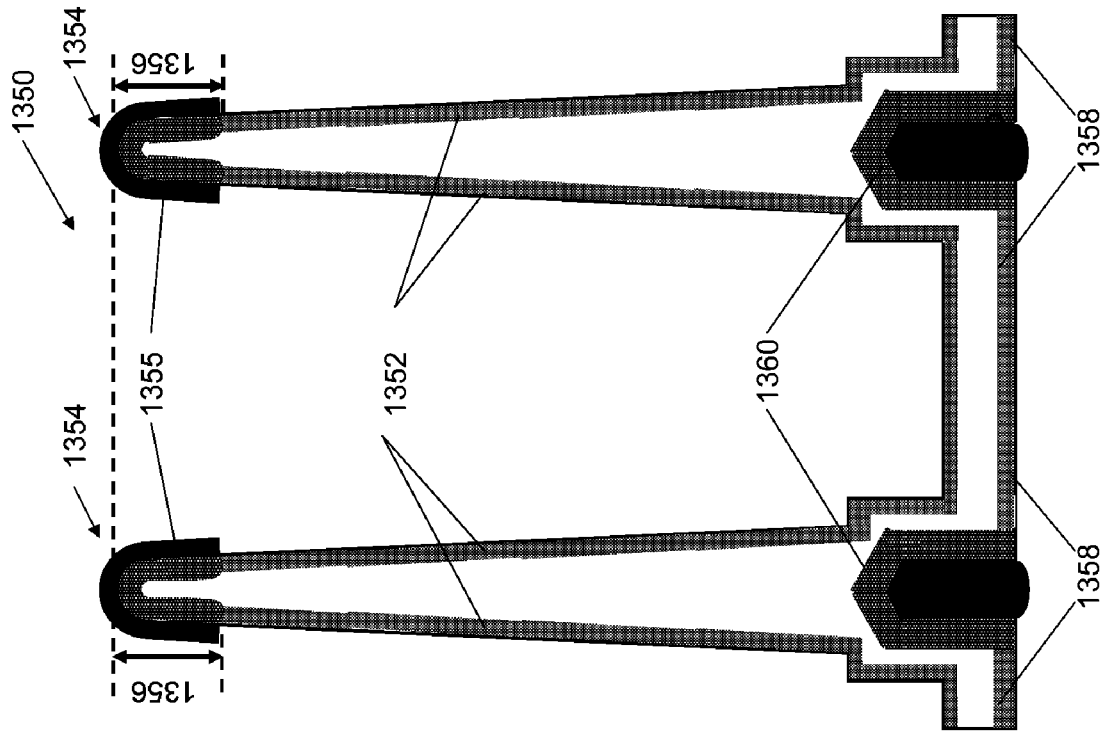
Figure 142A:
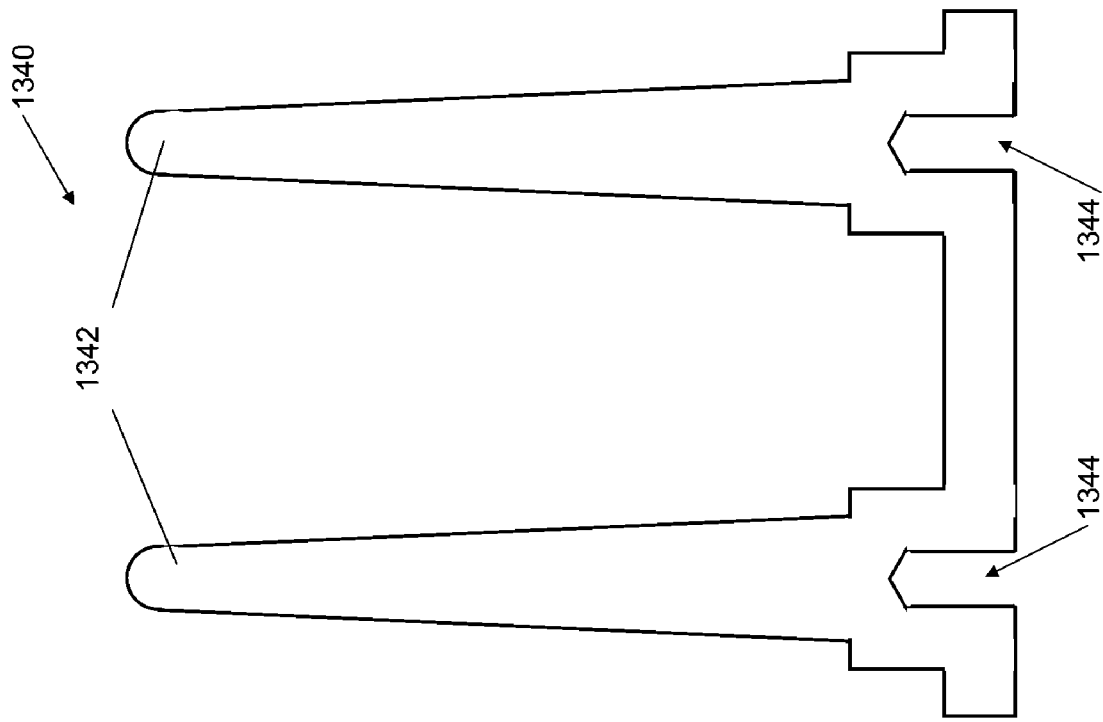

FIG. 142A shows a Y-Y cross-sectional view 1340 of a unit cell within a single-aperture hexagonal-prism 3-D thin-film TFSC substrate with a rear base layer (released and removed from its template) before cell fabrication. For subsequent $n^+p$ selective emitter formation, the hexagonal-prism sidewalls are in-situ-doped with boron to form the base region at the time of 3-D thin-film TFSC substrate fabrication. The sidewalls are doped with boron (in one embodiment, at the time of silicon deposition into the template), either uniformly or in a graded profile, more lightly doped at the prism sidewall surface and more heavily doped towards the sidewall vertical center axis. Similarly, the hexagonal-prism rear base layer is in-situ-doped at the time of 3-D TFSC substrate fabrication. The base layer is doped with boron, either uniformly or in a graded profile, more lightly doped at the rear base layer top surface and more heavily doped towards the rear base layer rear surface, creating a built-in back-surface-field effect in the rear base layer, improving the cell performance. The prism top (emitter side) ridges 1342 are used for emitter contact diffusion and metal contact formation and the hexagonal troughs 1344 for base contact diffusion and buried metal contact formation.

FIG. 142B shows a Y-Y cross-sectional view 1350 of a unit cell within the hexagonal prism 3-D TFSC of this disclosure (using the hexagonal prism 3-D TFSC substrate with a rear base layer as shown in FIG. 142A) after self-aligned formation of: selective emitter regions 1352 (e.g., less heavily-doped with phosphorus, $n^+$ selective emitter on the hexagonal prism sidewall surfaces as shown); heavily-doped emitter contact regions 1354 with coverage height $L_e$ 1356 (e.g., more heavily-doped with phosphorus, $n^{++}$ doped emitter contact regions on the hexagonal prism top hexagonal ridges as shown); selective base regions 1358 on the rear surface of the rear base layer (e.g., less heavily-doped with boron, $p^+$ selective base on the rear base layer rear surface as shown); and heavily-doped (boron-doped $p^{++}$) base contact diffusion regions 1360 in the rear base layer trenches/troughs (e.g., more heavily-doped with boron, $p^{++}$ doped base contact regions). The cured solid dopant source layers for emitter 1355 and base regions 1362 are shown as dark segments on the top hexagonal-prism ridges and within the rear base rear filled trenches (troughs), respectively.

Figure 144B:
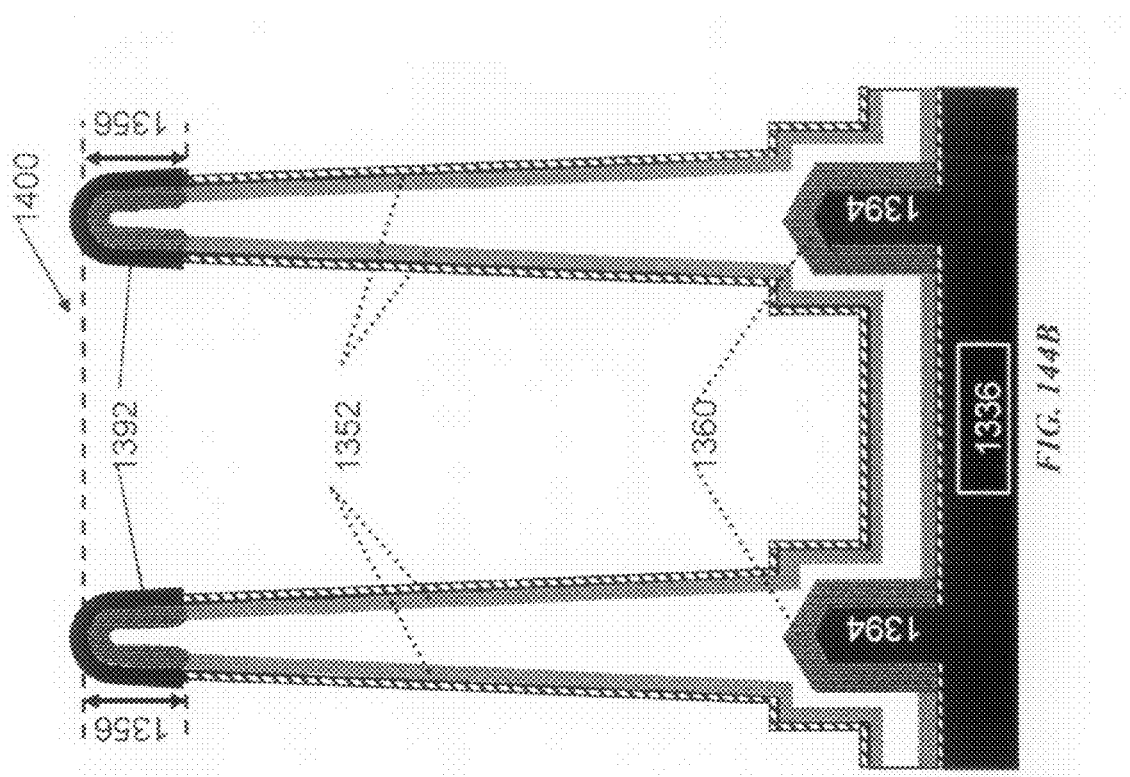
Figure 144A:
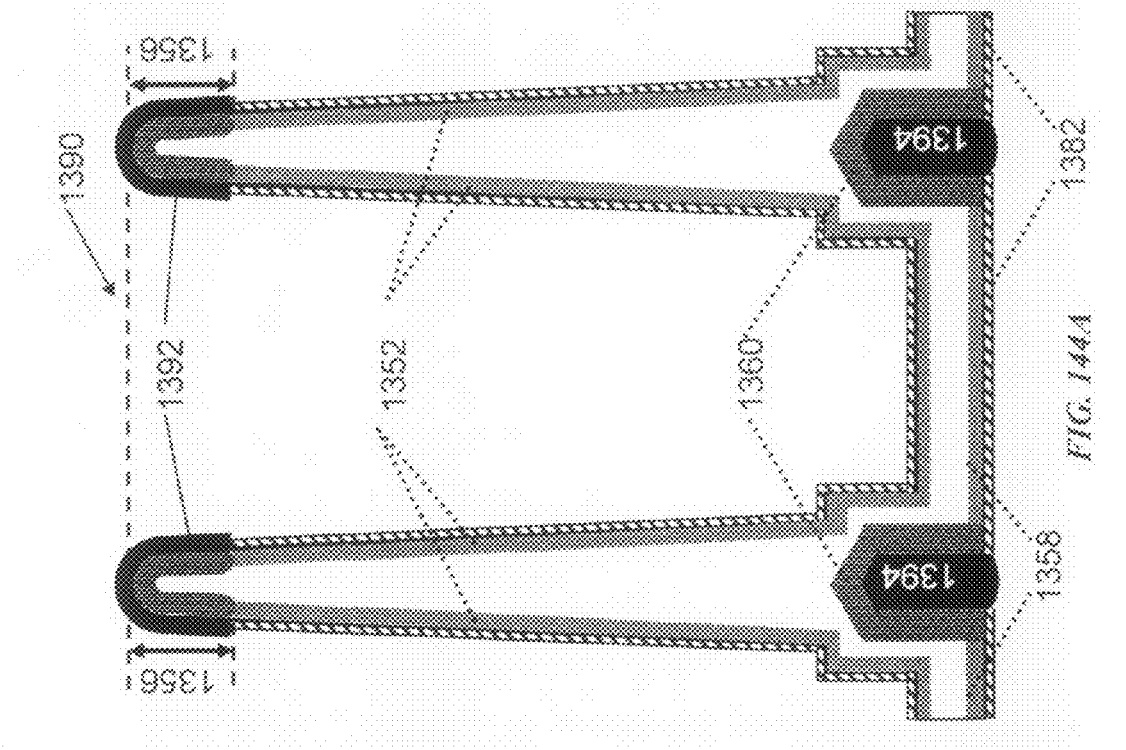

FIG. 143A shows a Y-Y cross-sectional view 1370 after the cured n-type and p-type dopant layers have been removed and before the thermal diffusion process. FIG. 143B shows a Y-Y cross-sectional view 1380 after formation of surface passivation and anti-reflection coating (thermal $SiO_2$ and/or PVD or PECVD $SiN_x$ or $AlN_x$ ARC) dielectric layers 1382. Note $L_e$ 1384 and cured boron doped glass 1386. FIG. 144A shows a Y-Y cross-sectional view 1390 after formation of emitter 1392 and base 1394 contact metals (silver, aluminum, copper, etc.) by fire-through and/or selective plating. FIG. 144B shows a Y-Y cross-sectional view 1400 after the addition of a detached highly reflective rear specular or diffuse mirror 1336 (e.g., silver or aluminum coating on a base interconnect plane on a PCB in the solar module assembly; the mirror may contact the rear base contacts as shown).

Figure 145:
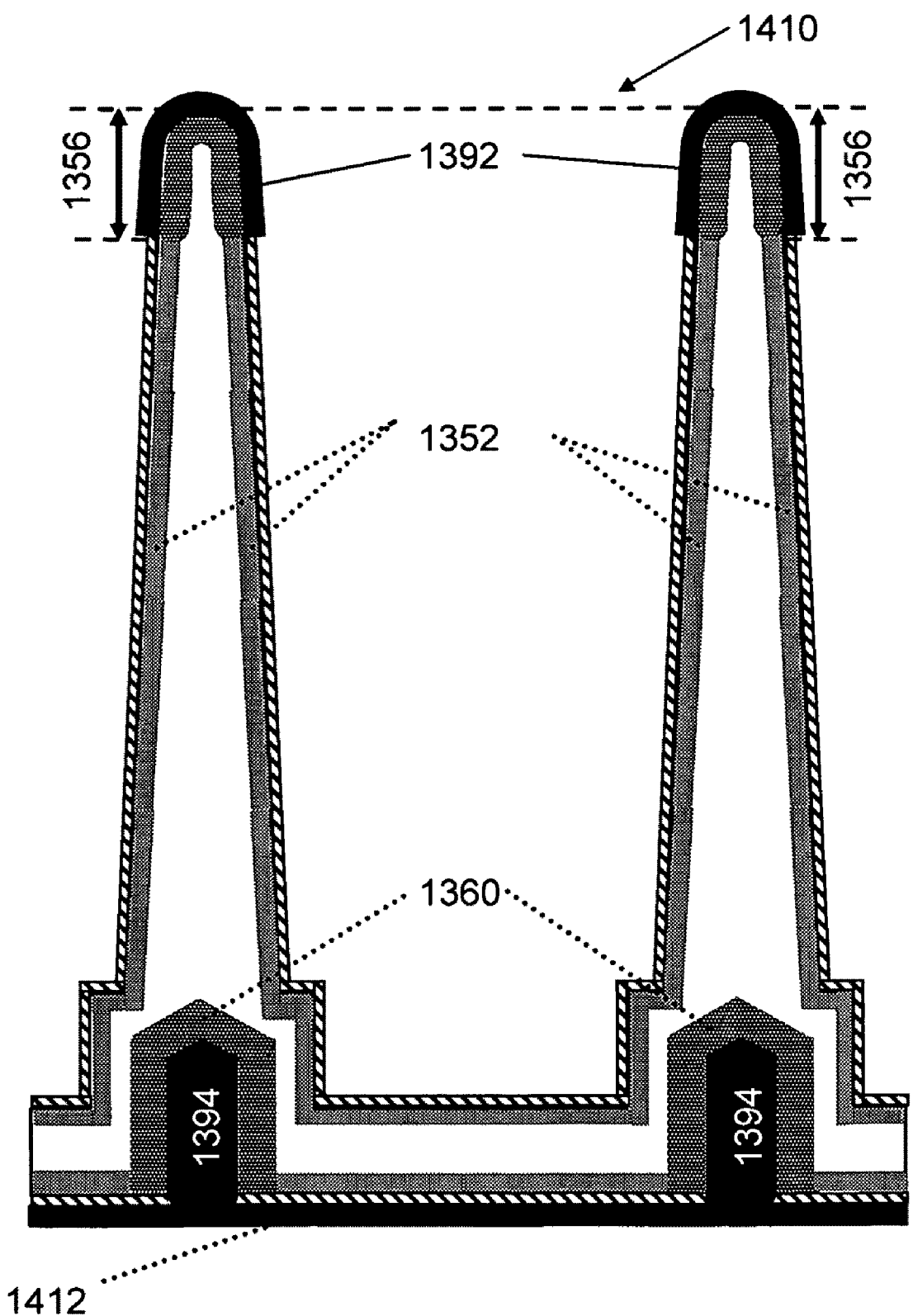

FIG. 145 shows a Y-Y cross-sectional view 1410 after the addition of an integrated/attached highly reflective thin rear specular or diffuse mirror (e.g., a thin layer 1412 of silver or aluminum coating deposited by PVD or plating on the rear base layer rear surface as shown; for diffuse mirror, the dielectric layer on the rear base layer rear surface is roughened by a surface roughening process such as a plasma treatment or ion bombardment before mirror metal deposition). Alternatively, the base layer may already be textured by a pre-textured template from which the TFSC substrate is released.

Figure 146:
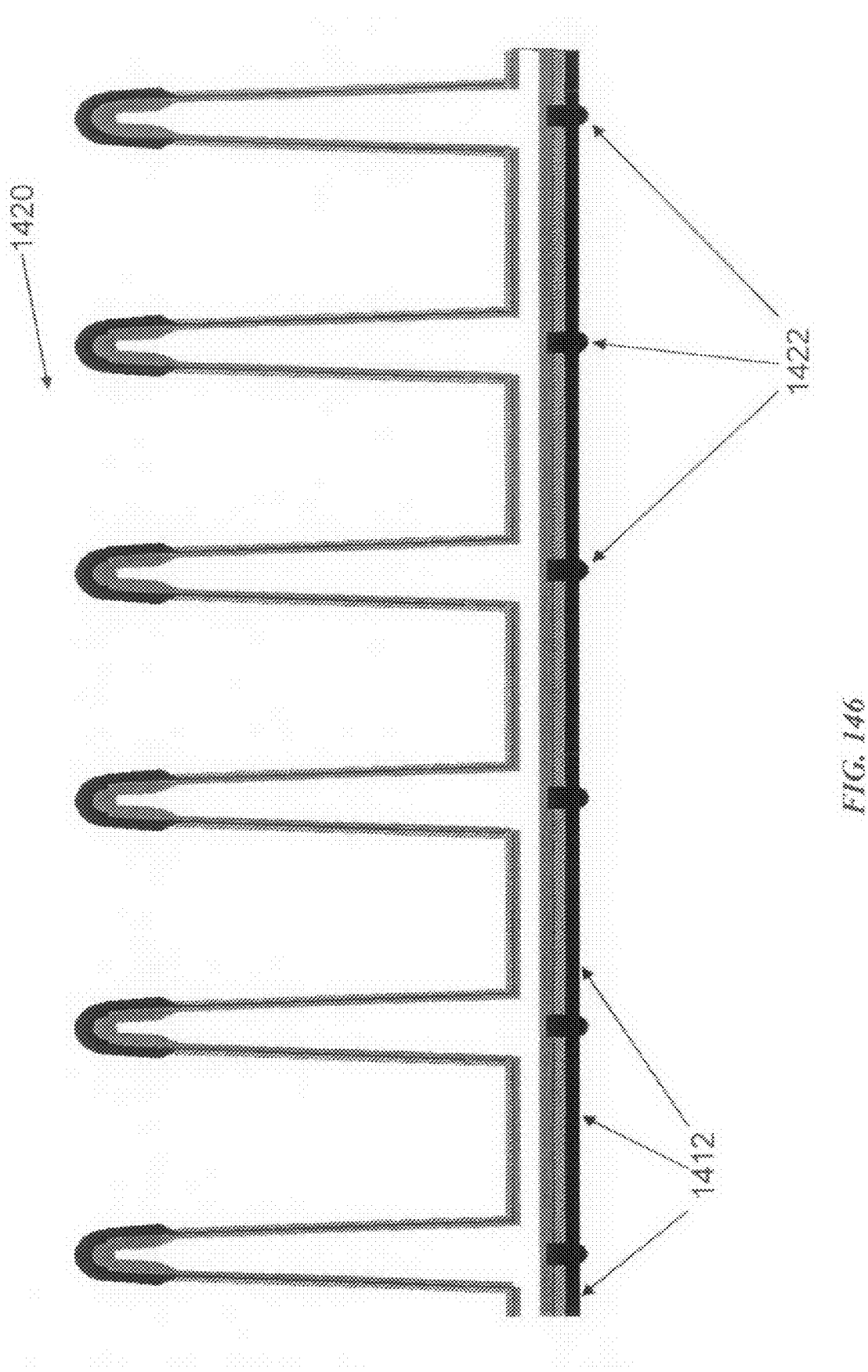

FIG. 146 shows a Y-Y cross-sectional view 1420 of the TFSC in FIG. 145 (showing multiple prism unit cells). The TFSC includes an integrated (attached) high-reflectivity rear mirror 1412, made of silver or aluminum, which may be deposited (e.g., by PVD or plating or evaporation or another coating technique such as roller or spray coating followed by curing) on the rear passivation oxide (and ARC) layer(s) formed on the rear surface of the rear base layer. Rear mirror 1412 is also the base interconnect plane, electrically connecting to the self-aligned hexagonal base contacts 1422 (e.g., silver and/or aluminum and/or copper or other metals) on the rear base layer. The rear mirror may be deposited on a smooth or roughened rear base dielectric layer surface (for specular or diffuse mirror, respectively). Again, the base layer may already be textured by a pre-textured template from which the TFSC substrate is released.

Figure 147:
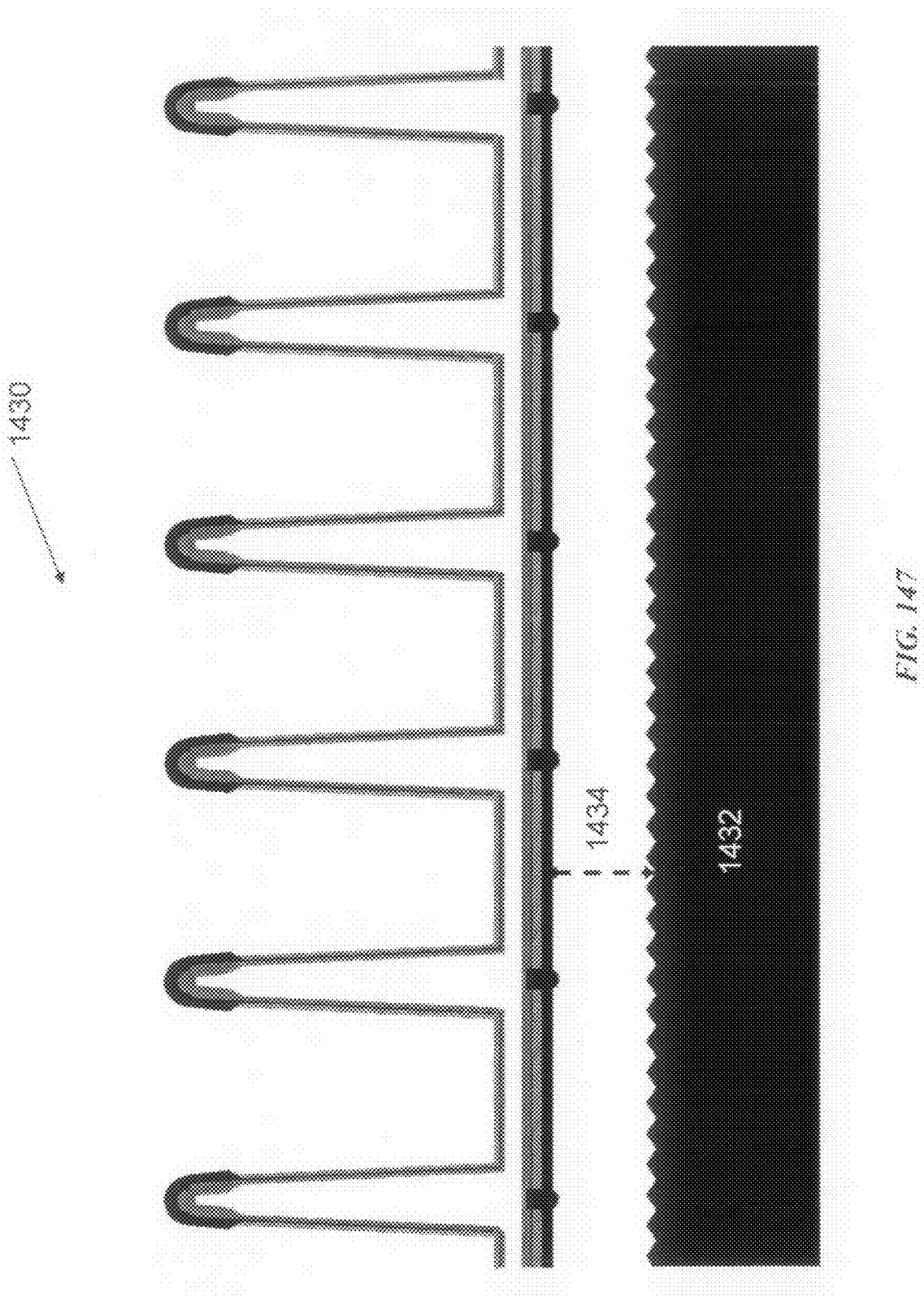

FIG. 147 shows a Y-Y cross-sectional view 1430 of the TFSC in FIGS. 145 and 146, with multiple prism unit cells shown. The TFSC includes a detached diffuse high-reflectivity rear mirror 1432, made of silver or aluminum (mirror coating), placed below the rear surface of the rear base layer. This FIGURE shows the module assembly interconnect plane placed at a spacing of S 1434 below the rear surface of the rear base layer, where S may be in the range of 0 (i.e., interconnect plane in contact with the rear base layer rear surface) up to roughly H (where H is the height of the hexagonal prism unit cell and may be in the range of 100 to 500 microns). In this latter structure, the rear mirror is not electrically connected to the base contact metal. Without the integrated mirror, the interconnect plane with a suitable coating (in one embodiment, silver) may serve as a detached rear mirror.

Figure 148:
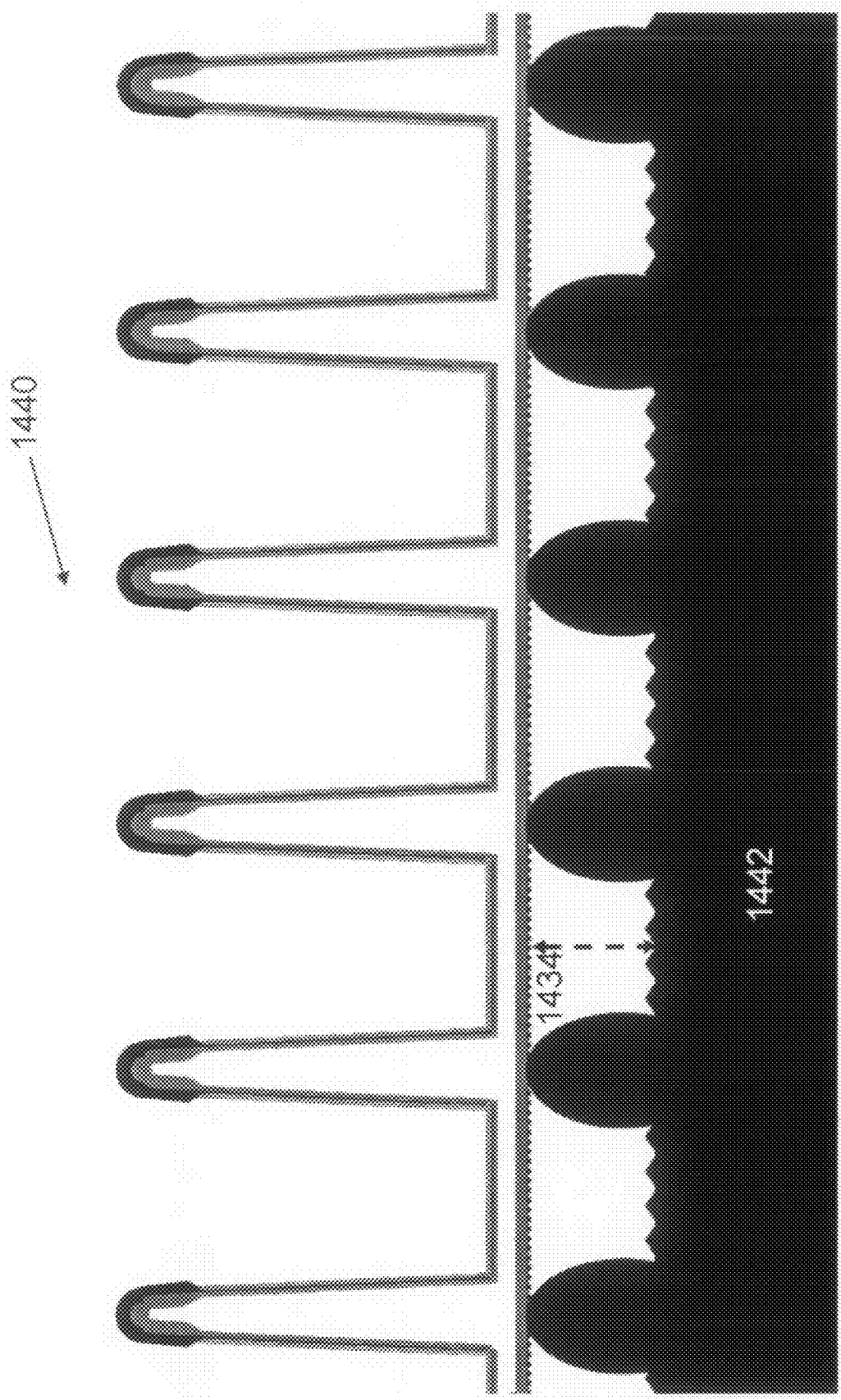

FIG. 148 shows a schematic Y-Y cross-sectional view 1440 of the TFSC in FIG. 144A, with multiple prism unit cells shown. The TFSC includes a detached diffuse high-reflectivity rear mirror 1442, made of silver or aluminum (mirror coating), placed below the rear surface of the rear base layer. This FIGURE shows the mirror placed at a spacing of S below the rear surface of the rear base layer, where S may be in the range of 0 (i.e., mirror in contact with the rear base layer rear surface) up to roughly H (where H is the height of the hexagonal prism unit cell and may be in the range of 100 to 500 microns). In this structure, the rear mirror is electrically connected to the base contact metal. Thus, the rear mirror shown here also serves as the base interconnect plane.

The above process steps may be performed on integrated in-line process equipment. For example, FIG. 149 shows a view 1450 of a setup for performing the two process steps of liquid/paste coating and UV or IR curing prior to furnace anneal, allowing for subsequent formation of selective emitter and base regions after anneal in an in-line diffusion furnace. This integrated in-line process equipment allows for self-aligned formation of dopant liquid or paste coating on the 3-D TFSC substrate hexagonal-prism top ridges and hexagonal-prism rear ridges by roller coating. Roller coating may be performed using an atmospheric-pressure, belt-driven coating and curing equipment integrated in line with a diffusion furnace. In one embodiment, the top ridges are coated with n-type dopant liquid/paste; the rear ridges are coated with p-type dopant liquid/paste.

The 3-D TFSC substrate 1452 is shown moving in 1454 on input conveyor belt 1456. The rotating top rollers 1458, with top roller pads 1460, apply a controlled downward force to coat the top hexagonal prism ridges with n-type paste. The rotating rear rollers 1462, with rear roller pads 1464, apply a controlled upward force to coat the rear hexagonal prism ridges with p-type paste. Multilayer materials may be coated on each side of the 3-D TFSC substrate by applying (or flowing) a different liquid or paste material to each roller on the top 1458 and/or rear 1462 set of rollers. The 3-D TFSC substrate 1452 next moves into the curing area where the dopant liquid/paste layers are concurrently formed using a curing lamp 1466 which uses IR or UV curing beams 1468. The 3-D TFSC substrate 1452 is next shown moving out 1470 to the output conveyor belt 1472, which may move the substrate 1452 to an in-line diffusion furnace, where the $n^+$ and $p^+$ contacts and selective emitter regions are concurrently formed.

A similar roller coater setup may be properly configured and used for applying metal liquid/paste coatings (e.g., silver and/or aluminum liquid or paste sources), curing the metal liquid/paste source, and performing subsequent thermal anneal in an in-line atmospheric furnace (resistively-heated or lam-heated furnace) for fire-through metallization in order to form the emitter and base contact metallization (and whenever applicable, also to form the aluminum-doped $p^{++}$ base contact regions).

FIG. 150 shows a view 1480 of an alternative setup design to perform the same processes as the roller coater/curing/furnace setup of FIG. 149. The setup in FIG. 150 may be used for self-aligned formation of dopant source liquid/paste coating on the 3-D TFSC substrate top ridges and hexagonal-prism rear ridges by angled spray coating. This setup also may utilize an in-line atmospheric-pressure coating and curing and diffusion equipment configuration which can be easily integrated with an in-line diffusion furnace. As with the roller coater setup in FIG. 149, multilayer materials may be coated on each side of the substrate by using multiple sets of spray nozzles connected to different liquid sources (not shown here) and applying (or flowing) a different liquid source material to each nozzle on the top and/or rear set of spray nozzles. This is an alternative technique to the roller coating system shown in FIG. 149. In one embodiment, the top ridges are coated with n-type dopant liquid/paste (such as phosphorus); the rear ridges are coated with p-type dopant liquid/paste (such as boron). Referring to FIG. 150, the 3-D TFSC substrate 1452 is shown moving in 1454 on input conveyor belt 1456. Angled nozzles 1422 spray n-type dopant liquid onto the surface at a sharp angle with respect to the surface (nozzles cover wafer width). This n-type dopant liquid comes from an n-type liquid dopant source and nozzle reservoir/pump 1424. Angled nozzles 1486 spray p-type dopant liquid onto the surface at a sharp angle with respect to the surface (nozzles cover wafer width). This p-type dopant liquid comes from a p-type liquid dopant source and nozzle pump 1488. The 3-D TFSC substrate 1452 next moves into the curing area where the dopant liquid/paste layers are concurrently formed using a curing lamp 1466 which uses IR or UV curing beams 1468. The 3-D TFSC substrate 1452 is next shown moving out 1470 to the output conveyor belt 1472, which may move the substrate 1452 to an in-line diffusion furnace, where the $n^+$ and $p^+$ contacts and selective emitter regions are concurrently formed.

The angled spray technique limits the vertical height of the liquid/paste coating to a portion of the hexagonal ridges and prevents the liquid source from coating the inner parts of the hexagonal prism cavity sidewalls and/or rears. This type of in-line (or another drive method) processing system may also be used for applying metal source liquid (e.g., silver and/or aluminum source liquid) for fire-through metallization applications as well as applying liquid etchant for selective etching of dielectrics (e.g., oxide and/or solid dopant source layer) from the top and/or rear hexagonal prism ridges.

FIG. 151 shows a view 1490 of another alternative setup to perform the same processes as the in-line roller coater/curing setup of FIG. 149 and the in-line spray coater/curing setup of FIG. 150. The setup in FIG. 151 may be used for self-aligned formation of dopant liquid/paste coating on the 3-D TFSC substrate hexagonal top ridges and hexagonal prism rear ridges by liquid-dip coating. This setup also may utilize an in-line atmospheric-pressure coating and curing equipment configuration to be attached to the input stage of an in-line diffusion (or fire-through) furnace.

In one embodiment, the top ridges are coated with n-type dopant liquid/paste (such as phosphorus); the rear ridges are coated with p-type dopant liquid/paste (such as boron). The 3-D TFSC substrate 1452 is shown moving in 1454 on input conveyor belt 1456. Liquid film dispenser containing n-type liquid dopant source 1492 applies a controlled thickness n-type liquid dopant film 1494. This n-type dopant liquid comes from n-type liquid dopant source and liquid level and depth controller 1496. Liquid film dispenser containing p-Type liquid dopant source (with peripheral air levitation) 1498 applies a controlled thickness p-type liquid dopant film 1500. This p-type dopant liquid comes from p-type liquid dopant source and liquid level and depth controller 1502. The 3-D TFSC substrate 1452 next moves into the curing area where the dopant liquid/paste layers are concurrently formed using a curing lamp 1466 which uses IR or UV curing beams 1468. The 3-D TFSC substrate 1452 is next shown moving out 1470 to the output conveyor belt 1472, which may move the substrate 1452 to an in-line diffusion furnace, where the $n^+$ and $p^+$ contacts and selective emitter regions are concurrently formed.

As in the setups in FIGS. 134 and 135, multilayer materials may be coated on each side of the 3-D TFSC substrate by using multiple sets of liquid-dip applicators (not shown here) and applying (or flowing) a different liquid source material to each liquid-dip applicator on the top and/or rear set of applicators. This type of processing system may also be used for applying metal liquid for fire-through metallization as well as applying liquid etchant for selective etching of dielectrics (e.g., oxide and/or solid dopant source layer) from the top and/or rear hexagonal prism ridges.

FIG. 152 shows a view 1510 of a hexagonal-prism dual-aperture 3-D thin-film TFSC substrate after release from a template where the hexagonal-prism 3-D TFSC substrate has both top (emitter) open apertures 1102 and rear (base) apertures (not shown). The top ridges 1104 are used for $n^{++}$ emitter diffusion and contact metal, while the rear ridges 1106 are used for $p^{++}$ base diffusion and contact metal. FIG. 153A shows a Y-Y cross-sectional view 1530 of a hexagonal prism 3-D thin-film TFSC substrate shown in FIG. 152. Note that the 3-D thin-film TFSC substrate has height 1132 (typically a value in the range of 100 to 350 microns). FIG. 153B shows a Z-Z cross-sectional view 1540 of hexagonal-prism 3-D thin-film TFSC substrate shown in FIG. 152. Note that the Z-Z view shows thin-film walls with width d/2 182 (compared to the hexagonal aperture long diagonal diameter d).

FIGS. 154 through 159 show six different process flow embodiments of this disclosure for fabricating dual-aperture hexagonal-prism 3-D TFSCs without rear base layers. While these process flow embodiments are outlined for fabricating silicon-based TFSCs, the overall concepts and methodologies may be extended and applied to other homojunction and heterojunction semiconductor materials (such as multicrystalline silicon, polycrystalline silicon, CIGS, etc.). While the process flows shown are for fabrication of 3-D c-Si TFSCs, the embodiments may be easily adjusted and modified to fabricate silicon-based TFSCs using polysilicon, amorphous silicon, and/or multicrystalline silicon films.

All of the fabrication process flow embodiments of FIGS. 154 to 159 result in dual-aperture hexagonal-prism 3-D TFSCs without rear base layers and with rear diffuse or specular reflective mirrors. The rear mirrors may be metal (e.g., silver-coated copper or silver-coated aluminum) pads on thin printed-circuit boards used for assembling TFSCs into packaged solar modules.

Figure 154:
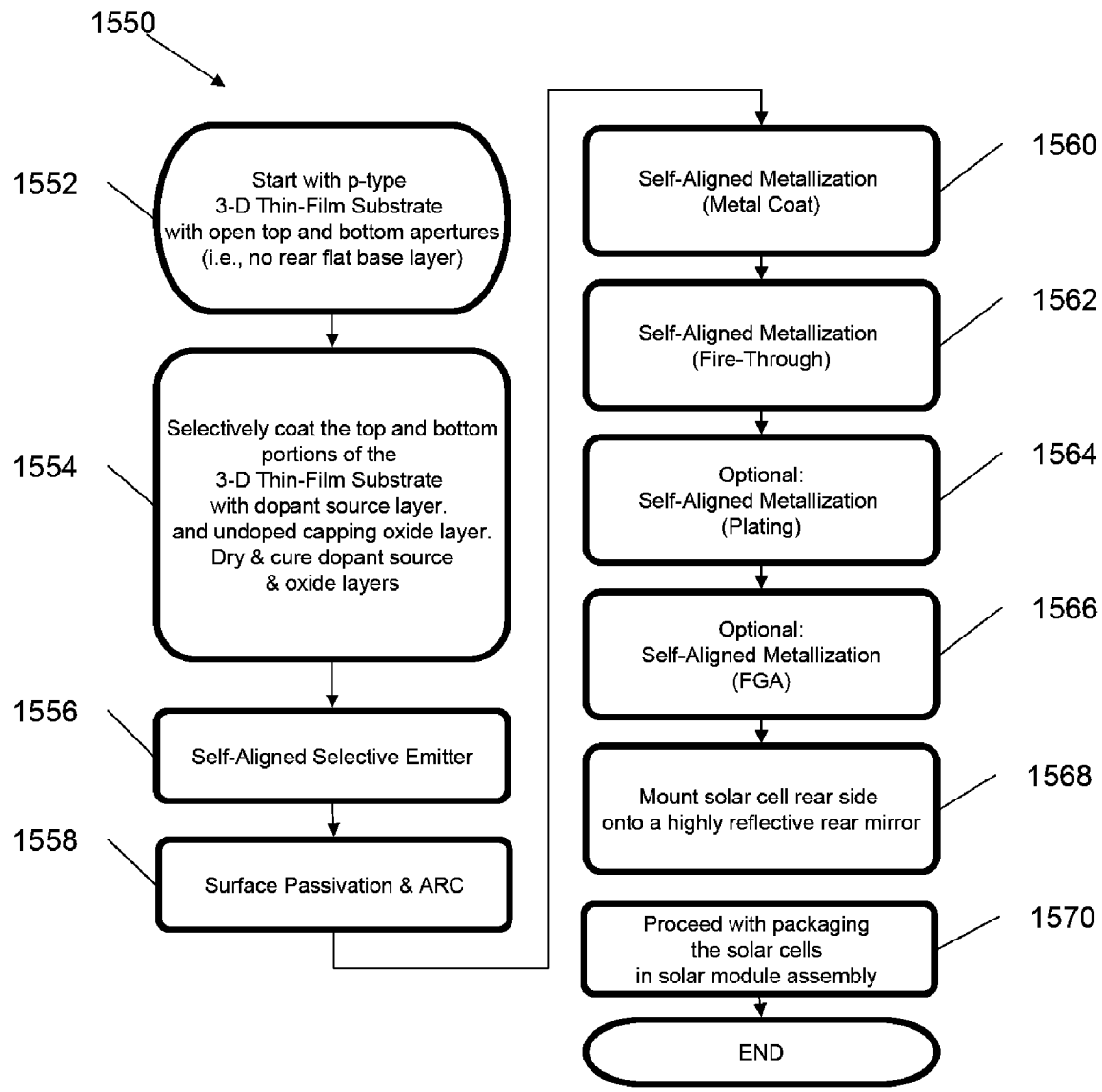

FIG. 154 describes a first process flow 1550 for fabricating dual-aperture hexagonal-prism 3-D TFSCs without rear base layers. This flowchart describes the process flow for fabrication of hexagonal-prism 3-D TFSCs using self-aligned fire-through metallization with an optional forming-gas anneal (FGA) process being performed after an optional selective silver (silver) or selective copper (copper) plating process. This process flow uses roller coating (or spray coating, inkjet spray coating, or liquid-dip coating) and curing of liquids or pastes of dopant and metal materials to form the selectively doped emitter regions as well as emitter and base contact metallization regions. In this embodiment, while the heavily $n^{++}$ (phosphorus) doped emitter contact regions (for subsequent emitter contact metallization) are formed by using a cured solid phosphorus dopant source layer formed over the hexagonal-prism top ridges (after thermal anneal), the heavily $p^{++}$ doped base contact regions (for subsequent base contact metallization) are formed by aluminum doping of silicon during the fire-through metallization process (on the rear hexagonal ridges coated with cured aluminum liquid/paste layer).

Figure 155:
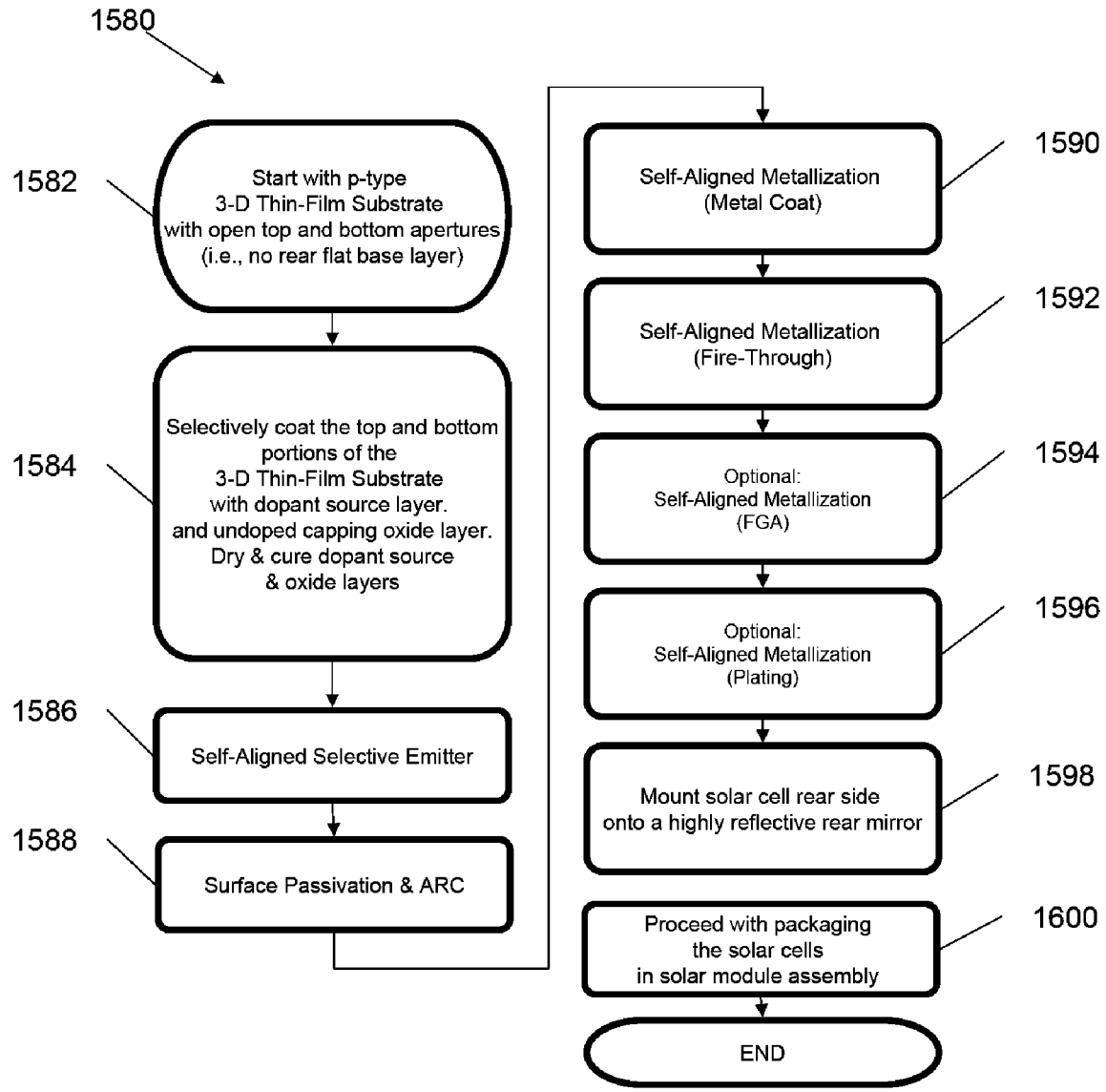

Referring to FIG. 155, step 1552 starts with a dual-aperture 3-D thin-film TFSC substrate (e.g., with in-situ p-type base doping formed during TFSC substrate fabrication), with open top and rear apertures (i.e., no rear flat base silicon layer). In step 1554, the top and rear portions of the 3-D substrate are selectively coated with n-type dopant (e.g., phosphorus-containing liquid or paste) and an undoped capping dielectric sealant (e.g., oxide), respectively, from liquid sources. In one embodiment, these coatings are between 2 and 10 microns in height on each side of the 3-D TFSC substrate and the n-type dopant is phosphorus. The rear (base side hexagonal ridges) portion of the substrate is selectively coated with undoped capping dielectric sealant such as an oxide. These coatings are applied using liquid or paste sources. Various coating embodiments include self-aligned 2-sided roller coating using paste/liquid sources, liquid-dip coating by controlled dipping in a controlled liquid source depth, ink-jet coating, spray coating, or another suitable coating method. The dopant source and oxide layers are then dried and cured at 150° C. to 400° C. using flash IR lamp or UV radiation. Step 1556 involves formation of self-aligned selective emitter junctions and heavily doped emitter contacts. The top heavily doped $n^{++}p$ emitter contact and honeycomb prism sidewall $n^+p$ selective emitter junctions are concurrently formed by a thermal anneal process (in one embodiment, at 800° C. to 950° C.). Drying/curing and emitter anneal may both be performed sequentially in a belt furnace. The 3-D thin-film TFSC substrates, in one embodiment arranged with pairs or stacks of 3-D substrates in face-to-face contact, may be annealed in a heated belt furnace in order to facilitate gas-phase doping formation of $n^+$ selective emitter junctions. The rear cap dielectric (e.g., oxide) coating prevents phosphorus doping of the base contact regions. Step 1558 involves surface passivation and anti-reflection coating (ARC). First, the top dopant source layer, rear undoped oxide layer, and native oxide are stripped using hydrofluoric acid or another suitable etchant (e.g., dilute HF). Next, a thin oxide layer is grown, in one embodiment by steam oxidation. In one embodiment, this layer is between 3 and 300 nanometers, performed at 800° C. to 950° C. Next, a passivation and ARC layer is deposited by PECVD or PVD, with coating formed on prism top (emitter side) and selective emitter sidewalls (coating on the base side is optional). In one embodiment, this layer is between 3 and 150 nanometers (preferably between 50 and 100 nanometers) of $SiN_x$ or $AlO_x$. PECVD $SiN_x$ or $AlO_x$ also provides H passivation of the 3-D TFSC substrate. In one embodiment, the diffusion/oxidation steps result in selective emitter junction and emitter contact sheet resistance values of 80-150 Ω/square and 10-70 Ω/square, respectively. Step 1560 involves self-aligned metallization (application of a metal coat). The top portions of the substrate is selectively coated (to a height equal to or less than the dopant source layer; in one embodiment, between 5 and 20 microns) with metal (in one embodiment, silver) paste or liquid using self-aligned liquid-dip coating, roller coating, inkjet coating, or spray coating. Next, this metal coat is dried and cured. Next, the rear portions of the TFSC substrate are selectively coated (to a height equal to or less than the rear cap dielectric layer) with metal (in one embodiment, aluminum) to form $p^{++}$ base contact and metallization) paste/liquid by self-aligned liquid-dip coating, roller coating, inkjet coating, or spray coating. Next, these metal coatings are dried and cured. Step 1562 involves self-aligned metallization (fire-through). The cell front (e.g., silver) and rear (aluminum) metallized regions are formed by firing through the passivation layer or layer stack (oxide and/or PVD or PECVD $SiN_x$ layers). Step 1564 involves an optional self-aligned metallization step in which silver and/or copper is selectively/concurrently deposited (e.g., 1 to 5 microns) on the metallized top honeycomb ridges (emitter) and rear honeycomb ridges (base) by plating (such as electroless plating or galvanic plating), with further flash coating of the metallized regions with silver. If desired, the plating process may also include an initial layer of a refractory metal barrier such as nickel (prior to silver and/or copper plating). Step 1566 involves another optional self-aligned metallization step. A forming gas anneal (FGA) is performed (e.g., at 300° C. to 450° C.) to reduce front and rear interconnect resistance values and help with surface/bulk passivation. This forming gas annealing step may not be needed due to the prior metallization firing step. Step 1568 involves mounting dual-aperture honeycomb-prism TFSC rear side (base side) onto a highly reflective rear mirror. This rear mirror may be a diffuse mirror with a rough surface or specular with a smooth surface (a diffuse mirror is usually preferred). The rear mirror may be made of an silver-coated aluminum or copper pad (foil) and may also serve as the TFSC base interconnect plane on a printed-circuit board placed in a solar module assembly. In step 1570, the honeycomb prism TFSCs are packaged in solar module assembly.

FIG. 155 shows an alternative process flow 1580 for fabricating dual-aperture hexagonal-prism 3-D TFSCs without rear base layers. Except for the order of the optional FGA and optional plating processes in the flow, the process flows of FIGS. 154 and 155 are otherwise similar and comparable. Specifically, steps 1582 to 1592 in FIG. 155 are comparable to steps 1552 to 1562 in FIG. 154. Step 1594 in FIG. 155 involves the optional FGA, before step 1596 which involves the optional plating process. Steps 1598 (mounting) and 1600 (proceeding with packaging) are the same as steps 1568 and 1570 in FIG. 154.

Figure 156:
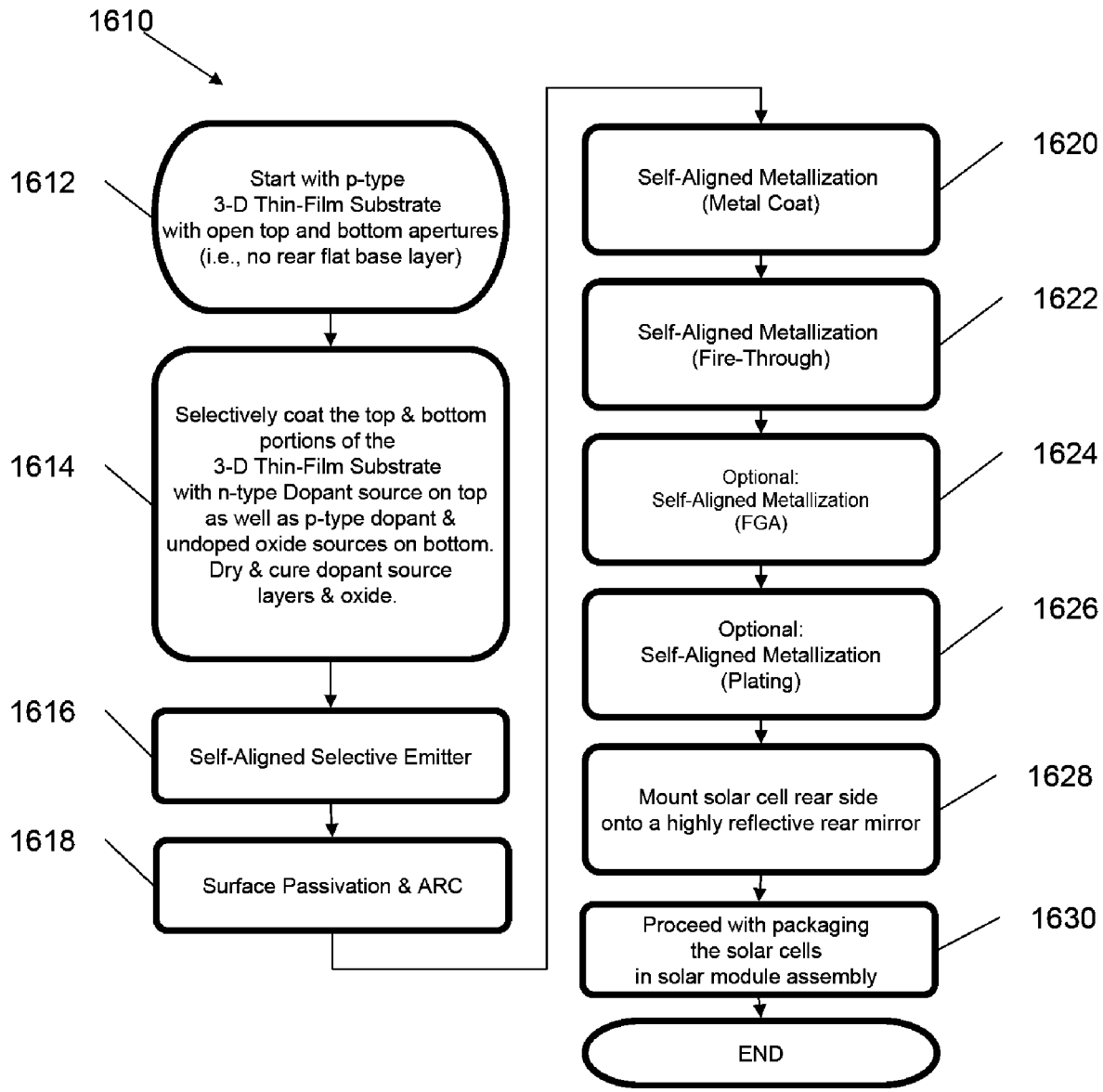

FIG. 156 shows an alternative process flow 1610 for fabricating dual-aperture hexagonal-prism 3-D TFSCs without rear base layers. The process flow of this embodiment uses a fire-through metallization process to form the self-aligned emitter and base contact metallization. This flowchart describes the process flow for fabrication of hexagonal-prism 3-D TFSCs using self-aligned fire-through metallization with boron-doped $p^{++}$ rear base contacts as well as phosphorus-doped $n^{++}$ emitter contacts (including selective emitter doping on the 3-D prism sidewalls). While the $p^{++}$ base contacts in the embodiments of FIGS. 154 and 155 are formed by aluminum doping during fire-through metallization, as mentioned above, the $p^{++}$ base contacts in the embodiment of FIG. 156 are formed by boron doping from a cured boron source layer. Step 1612 (providing a substrate) of FIG. 156 corresponds to step 1552 of FIG. 155. Step 1614 involves selectively coating the top and rear portions of the 3-D honeycomb-prisms (in one embodiment, the top and rear 2 to 10 microns) with phosphorus (i.e., n-type dopant) liquid/paste source on top as well as boron (i.e., p-type dopant) and undoped dielectric (e.g., oxide) liquid/paste sources on rear (boron layer capped by dielectric sealant such as oxide). This selective coating may be done using self-aligned 2-sided roller coating using paste/liquid sources, liquid-dip coating by dipping in a controlled liquid source depth, ink-jet coating, or spray coating. Next, the dopant source layers and dielectric (oxide) cap layer are dried and cured (250° C. to 400° C. thermal curing or UV). Step 1616 involves formation of self-aligned selective emitter junction as well as the heavily doped emitter and base contact diffusion regions. The top $n^{++}p$ emitter contact diffusion and honeycomb-prism sidewall n+p selective emitter junctions as well as rear p$^{++}$ base contacts are concurrently formed by thermal anneal (e.g., at 800° C. to 950° C.). Drying/curing and emitter anneal may both be performed sequentially in a diffusion or in-line belt-driven furnace. In one embodiment, the 3-D TFSC substrate, or stacks of 3-D TFSC substrates in face-to-face contact, may be annealed while placed in a diffusion furnace, in order to facilitate gas-phase doping formation of n$^+$ selective emitter junctions. The rear cap dielectric (e.g., oxide) layer prevents boron counter doping of selective emitter prism sidewalls. Step 1618 (surface passivation and ARC) corresponds to step 1588 in FIG. 155; step 1620 (metal coat) corresponds to step 1590; step 1622 (fire through) corresponds to steps 1592; step 1624 (FGA) corresponds to step 1594; step 1626 (plating) corresponds to step 1596; step 1628 (mounting) corresponds to step 1598; and step 1630 (proceeding with packaging) corresponds to step 1600.

Figure 157:
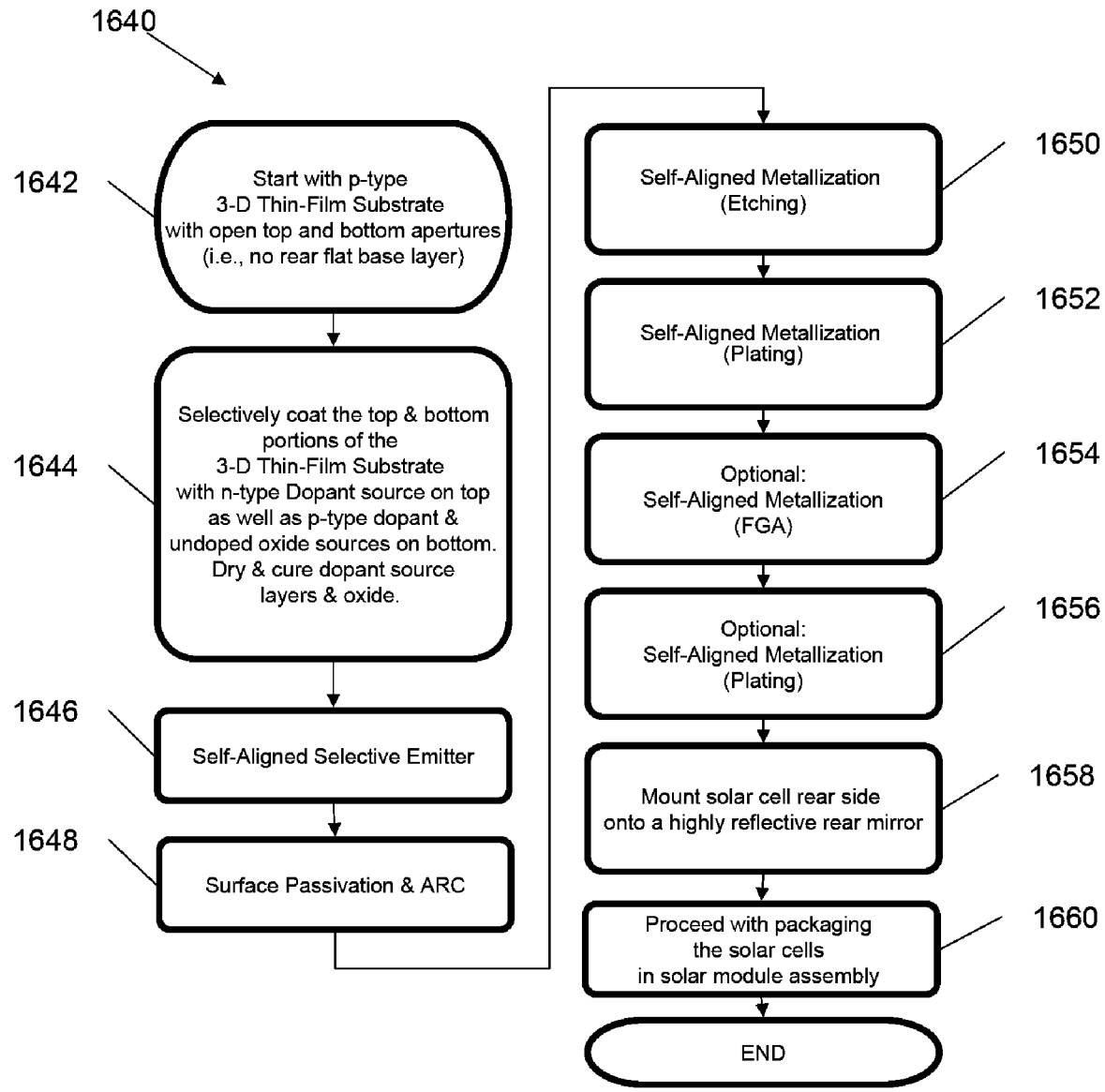
Figure 158:
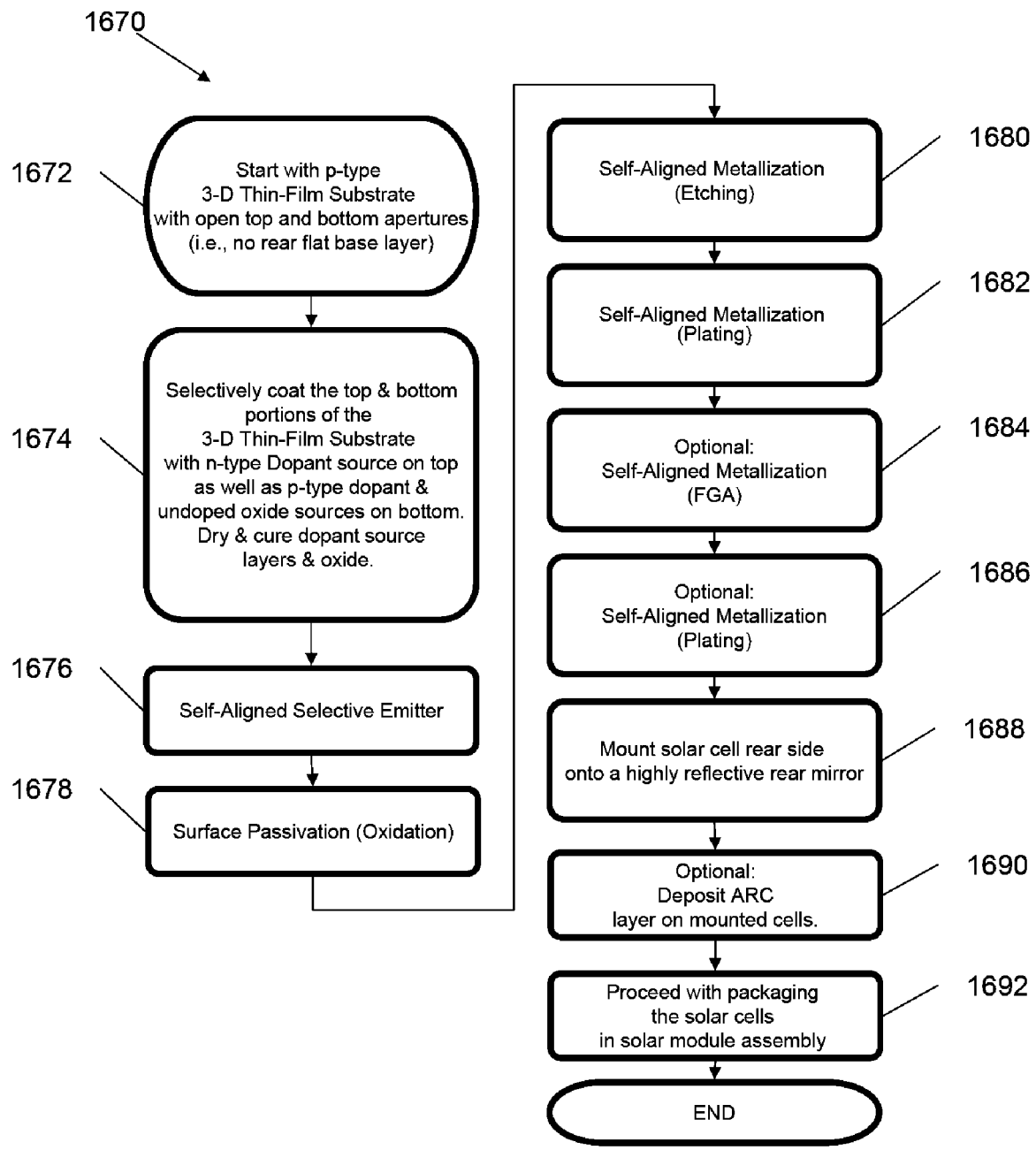
Figure 159:
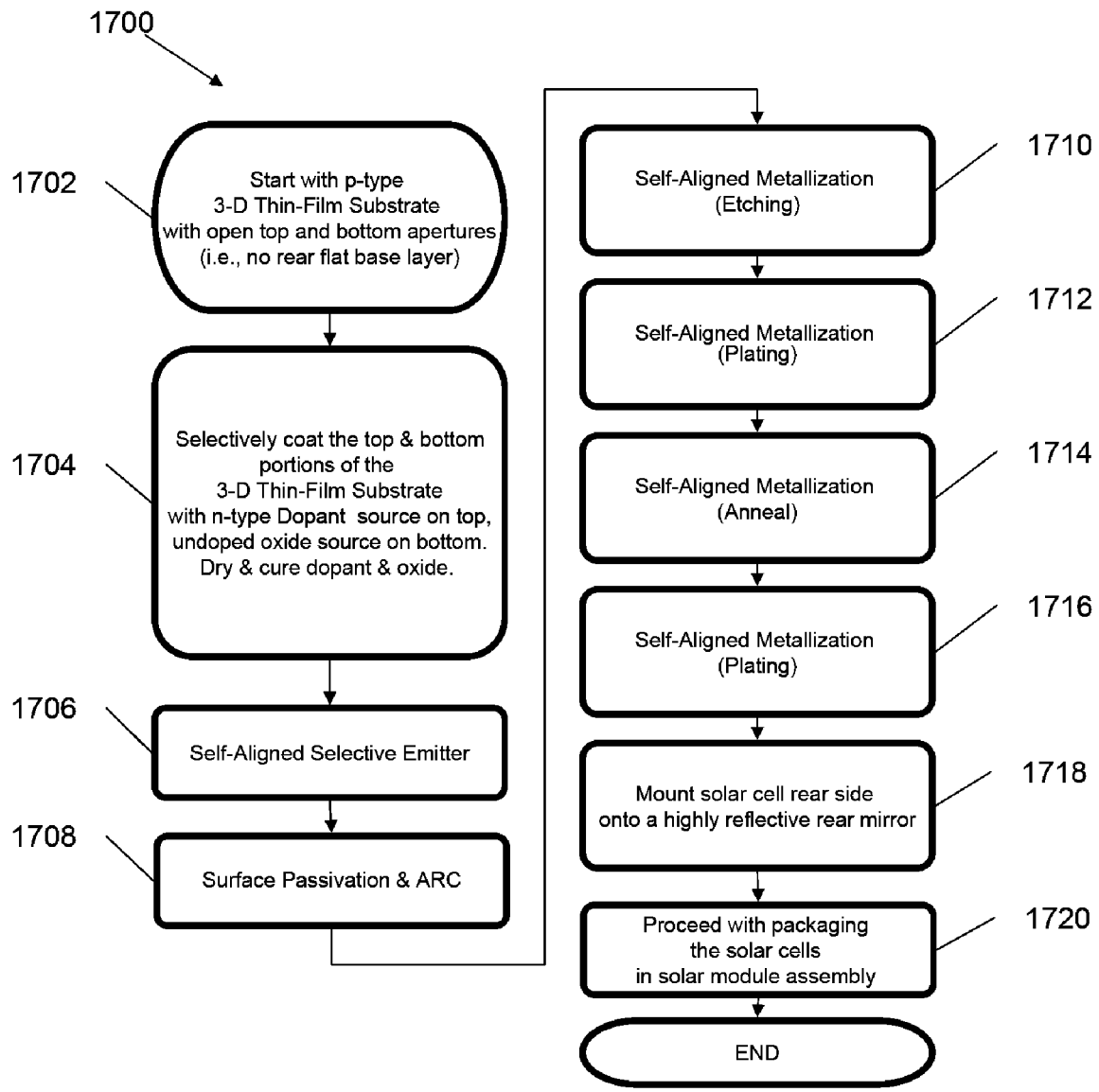

FIGS. 157 through 159 show additional alternative process flow embodiments 1640, 1670, and 1700 for fabricating dual-aperture hexagonal-prism 3-D TFSCs without rear base layers. While the process flow embodiments of FIGS. 154 to 156 use a fire-through metallization process to form the emitter and base contact metallization regions (and in FIGS. 154 and 155 also to form the p$^{++}$ heavily doped base contact regions), the process flow embodiments of FIGS. 157 to 159 employ selective plating (electroplating and/or electroless plating and/or galvanic plating) to selectively form the emitter and base contact metallization regions. Thus, the process flows outlined in FIGS. 157 to 159 eliminate the need for a medium or high-temperature (e.g., 700° C. to 850° C.) fire-through metallization process and can result in improved metallization contacts with reduced dark current and junction leakage.

FIG. 157 shows an alternative process flow 1640. Step 1642 (providing a substrate) corresponds to step 1612 of FIG. 156; step 1644 (selective coating) corresponds to step 1614; step 1646 (self-aligned selective emitter) corresponds to step 1616; and step 1648 (surface passivation and ARC) corresponds to step 1618. Step 1650 involves self-aligned metallization etching. The top and rear portions of the honeycomb prisms are selectively coated (to heights equal to or less than the n-type and p-type dopant source layers, respectively) with dielectric etchant liquid or paste layers. This dielectric etchant coating may be done by self-aligned single-sided or double-sided roller coating using paste/liquid sources, liquid-dip coating by dipping in a specified liquid etchant source depth, ink-jet coating, or spray coating. This etching step strips, to controlled heights, dielectric layer or layer stack (e.g., oxide or oxide/nitride) from top and rear portions of honeycomb prisms to expose silicon. Next, the TFSC substrate is rinsed and subsequently dried. Step 1652 involves self-aligned metallization (using electroless plating, galvanic plating, or electroplating). The exposed front and rear emitter and base metallized regions are concurrently formed using selective electroplating and/or electroless plating to form a single layer or multiple layers of high-conductivity metallized regions. Embodiments include silver, aluminum, nickel, titanium, cobalt, or tantalum. For instance, the plated metal stack may include a thin (50 to 500 nanometers) barrier and adhesion layer such as nickel (nickel) followed by a relatively thick (2 to 15 microns) layer of high-conductivity metal (silver or copper or aluminum). If a high-conductivity metal other than silver is used for the thick metallization layer, a final flash coat of silver may be used to create a high-reflectivity surface coating in order to improve light reflection and trapping into the 3-D cells (by the emitter metallization contact). Step 1654 (optional FGA) corresponds to step 1624 of FIG. 156; step 1656 (optional plating) corresponds to step 1626; step 1658 (mounting) corresponds to step 1628; and step 1660 (proceeding with module assembly and packaging) corresponds to step 1630.

FIG. 159 shows an alternative process flow 1670. Step 1672 (providing a substrate) corresponds to step 1642 of FIG. 157; step 1674 (selective coating) corresponds to step 1644; and step 1676 (self-aligned selective emitter) corresponds to step 1646. Step 1678 involves surface passivation thermal oxidation. A thermal oxide layer is grown, in one embodiment by steam oxidation. In one embodiment, this layer is between 5 and 300 nanometers (preferably 10 to 50 nanometers), with the oxidation performed at 800° C. to 950° C. (lower temperatures and thinner oxides preferred). Alternatively, this step may be merged into the prior diffusion step in the diffusion furnace, to be performed sequentially in a multi-zone in-line diffusion furnace after the selective emitter and base diffusion step. In one embodiment, the combined thermal budget associated with the diffusion and thermal oxidation steps results in 3-D honeycomb-prism selective emitter and heavily-doped emitter contact sheet resistance values of 80-150 Ω/square and 10-70 Ω/square, respectively. Step 1680 involves self-aligned metallization (etching). The 3-D TFSC substrate is covered with the cured dopant source layers on top (emitter side) and rear (base side) and an undoped dielectric cap (sealant such as cured oxide) layer on rear. The top and rear cured dielectric and solid dopant source portions are selectively etched using a suitable dielectric etchant (e.g., an HF-based etchant) with relatively high selectivity with respect to thermal oxide. This selectively strips the cured dopant source segments and undoped capping (oxide) dielectric on the top and rear portions of the honeycomb prisms and exposes silicon in those regions, while removing only a small fraction of thermal oxide from honeycomb-prism sidewalls. Therefore, the honeycomb-prism sidewalls corresponding to the selective emitter regions and outside the emitter and base contact regions remain covered with thermal oxide. Step 1682 (plating) corresponds to step 1652 of FIG. 157; step 1684 (FGA) corresponds to step 1654; step 1686 (plating) corresponds to step 1656; and step 1688 (mounting) corresponds to step 1658. Step 1690 involves an optional step of depositing a passivation and anti-reflection coating (ARC) layer (e.g., 50-200 nanometers of PVD or PECVD SiN$_x$) layer on mounted cells. Step 1692 (proceeding with packaging) corresponds to step 1660 of FIG. 157.

FIG. 159 shows an alternative process flow 1700. Step 1702 (providing a substrate) corresponds to step 1672 of FIG. 158. Step 1704 involves selectively coating the top and rear portions of the 3-D substrate (in one embodiment, the top and rear 2 to 10 microns in height) with a phosphorus (i.e., n-type dopant) liquid/paste source on top and an undoped capping (sealant) dielectric such as oxide liquid/paste source on rear. This coating may be done by self-aligned single-sided or 2-sided roller coating using liquid/paste sources, liquid-dip coating by dipping in a controlled liquid source depth, ink-jet coating, or spray coating. Next, the dopant and capping dielectric (oxide) layers are dried and cured (e.g., using thermal curing at 250° C. to 400° C. or by UV irradiation). Step 1706 (self-aligned selective emitter) corresponds to step 1676 of FIG. 158. Step 1708 (surface passivation and ARC) corresponds to step 1648 of FIG. 157. Step 1710 involves selectively etching the top and rear portions of the cells in preparation for self-aligned metallization The top and rear portions of the honeycomb prisms (to heights equal to or less than the n-type and p-type dopant source layers, respectively) are selectively coated with dielectric etchant liquid or paste layers. This coating may be done by self-aligned single-sided or double-sided roller coating using paste/liquid sources, liquid-dip coating by dipping in a specified liquid etchant source depth, ink-jet coating, or spray coating) to strip controlled heights of oxide/nitride dielectrics from top and rear portions of honeycomb prisms to expose silicon at the honeycomb ridges. Next, the TFSC substrate is rinsed and dried. Step 1712 involves self-aligned metallization (in one embodiment, using plating). The rear base aluminum metallized regions are formed by selective electroplating or electroless plating. This aluminum plating process may be limited to the rear base regions. Step 1714 involves self-aligned metallization (anneal). The substrate goes through an annealing or firing process to form rear aluminum-doped p$^+$ base contacts. Then, an optional forming gas anneal (FGA) is performed (e.g., 350° C. to 450° C.) to reduce interconnect resistance and help with surface/bulk passivation. Step 1716 involves self-aligned metallization (plating). A high-conductivity metal (such as silver or copper) (e.g., 2 to 12 microns) is selectively/concurrently deposited on the top honeycomb ridges (emitter) and rear honeycomb ridges (aluminum metallized base contacts) by plating. If necessary, a suitable thin (e.g., 50 to 200 nanometers) refractory metal barrier layer such as nickel is first selectively deposited by plating (in one embodiment, electroless plating) before depositing the silver or copper layer. Next, if necessary, the TFSC substrate may be flash coated with a thin layer of high-reflectivity silver (not needed if the thick metallization layer is also silver). Alternatively, this may be merged into the prior plating step. Step 1718 (mounting) corresponds to step 1688 of FIG. 158; step 1720 (proceeding with packaging) corresponds to step 1692.

The above process steps may be performed on integrated belt-driven process equipment, as shown in FIGS. 149 through 151 above for 3-D single aperture TFSC designs.

The following section describes the use of 3-D dual aperture thin-film TFSC substrates in 3-D TFSCs.

FIG. 160A shows a Y-Y cross-sectional view 1740 of a self-supporting hexagonal-prism dual-aperture 3-D thin-film TFSC substrate with a thin silicon frame 1742 and without a rear base layer, before TFSC fabrication. In this embodiment, the thin silicon frame 1742 is square-shaped with the same thickness as 3-D thin-film TFSC substrate, with a silicon frame width 114 of 50 to 250 microns. The final 3-D thin-film TFSC substrate is may be square-shaped, with dimensions ranging from roughly 125 mm×125 mm to greater than 200 mm×200 mm.

FIG. 160B shows a view 1750 of the substrate of FIG. 160A after TFSC fabrication, indicating the emitter and base metal contacts for the hexagonal-prism 3-D TFSC without a thick silicon frame. The thin silicon frame also shows the wrap-around (may be made wrap through instead) emitter contact metal for ease of module assembly (making the cell emitter and base contacts to the module from the cell backside). The thin silicon frame extension may be made during the 3-D substrate fabrication process. For example, the thin frame may be made by the silicon deposition process as the hexagonal-prism structure is formed in the template. A self-aligned peripheral frontside contact 1752 is connected to the 3-D TFSC hexagonal frontside emitter contact at the frame edge (connected to the distributed self-aligned emitter contact 1754). The self-aligned emitter contact 1754 may be formed by roller coating, liquid-dip coating, or spray-jet-coating and fired through the passivation layer (nitride or oxide/nitride stack). Alternatively, the self-aligned emitter contact 1754 may be formed using a selective plating process. A self-aligned wrap-around emitter contact is on the thin silicon frame (the wrap-around contact may be replaced with a wrap-through contact). Both frontside and backside contacts are accessible on the rear side of the cell for automated module assembly.

FIG. 161A shows a Y-Y cross-sectional view 1760 of a self-supporting hexagonal-prism dual-aperture 3-D thin-film TFSC substrate with a thick peripheral silicon frame 1762. FIG. 161B shows a view 1770 of the substrate of FIG. 161A after cell fabrication, indicating the emitter and base metal contact metals. The thick-Si frame also shows the self-aligned wrap-around emitter contact metal 1752 (on thick silicon frame 1762) for ease of module assembly (the wrap-around contact may be replaced with a wrap-through contact). The thick silicon frame may be separately made of low-cost silicon wafers (e.g., laser cut from wafers) and then attached to the hexagonal prism 3-D TFSC substrate by a suitable technique. For example attachment may occur during the epitaxial silicon deposition process, to seal the frame to the hexagonal-prism structure, or by electron-beam welding, etc. The hexagonal-prism 3-D TFSC fabrication process flows of this disclosure utilize roller coating, spray coating or liquid-dip coating followed by thermal or UV curing for self-aligned formation of solid dopant layers and metal layers (the latter for the cell fabrication process flow embodiments using fire-through metallization). In one of the process flow embodiments, a roller coating (or spray coating or liquid-dip coating) process may also be used for controlled dielectric etching from hexagonal ridges. Also shown are the self-aligned backside hexagonal base contacts 1772 (roller-coated, dip-ink-coated, or spray-jet-coated and fired through the passivation layer such as nitride or oxide/nitride stack). Both frontside emitter metallization contact and backside base contact are accessible on the rear side of the cell for automated module assembly.

FIGS. 162A to 166 show various representative dual-aperture hexagonal-prism 3-D TFSC structures (with tapered prism sidewalls). One embodiment uses crystalline silicon (c-Si) for the TFSCs; polysilicon, amorphous silicon, as well as non-Si absorbers may also be used in alternative embodiments. These TFSCs are fabricated based on the process embodiments described earlier in FIGS. 154-159. These cross-sectional views correspond to dual-aperture hexagonal-prism 3-D TFSCs without rear base layers. The hexagonal prism 3-D TFSCs shown in these FIGURES have tapered prism sidewalls (in one embodiment, narrower emitter silicon width on the top and wider base silicon width at the bottom).

FIG. 162A shows a Y-Y cross-sectional view 1780 of a single unit cell within a dual-aperture hexagonal-prism 3-D TFSC without a rear base layer, with tapered prism posts 1342. The central region 1782 of the prism post 1342 contains p-type silicon serving as the base region. The cell view 1780 is after self-aligned formation of: heavily-doped emitter contact diffusion regions 1784 (e.g., more heavily-doped with phosphorus, n$^{++}$ doped emitter contact regions on the hexagonal prism top hexagonal ridges as shown); selective emitter regions 1786 (e.g., less heavily-doped with phosphorus, n$^+$ selective emitter on the hexagonal-prism sidewall surfaces as shown); and heavily-doped base contact regions 1788 (e.g., more heavily-doped with boron, p$^{++}$ doped base contact regions on the hexagonal prism rear hexagonal ridges as shown). The hexagonal-prism sidewalls are in-situ-doped (at the time of 3-D TFSC substrate fabrication) with boron (either uniformly or in a graded profile, more lightly doped at the prism sidewall surface and more heavily doped towards the sidewall vertical center axis). The cell view 1780 is before formation of emitter and base contact metallization. Further, each sidewall 1342 has a top silicon thickness ($T_{st}$) 426 and bottom silicon thickness ($T_{sb}$) 430. Each sidewall 1342 has an off-normal taper sidewall angle, θ 432.

Compared to the doping polarities shown in FIG. 162A, all the cell doping polarities may be inverted. FIG. 162B shows a view 1790 of the same TFSC as in FIG. 162A but with inverted doping polarities (i.e., n-type base and p-type emitter regions).

FIG. 162B shows a Y-Y cross-sectional view 1790 of a single unit cell within a dual-aperture hexagonal-prism 3-D TFSC without a rear base layer, with tapered prism posts 1342. The central region 1792 of the prism post 1342 contains n-type silicon serving as the cell base region. The cell view 1790 is after self-aligned formation of: heavily-doped $p^{++}$ emitter contact regions 1794; selective $p^{+}$ selective emitter regions 1352; and heavily-doped $n^{++}$ base contact regions 1796. The cell view 1790 is before formation of emitter and base contact metallization.

Figures 163A, 163B:
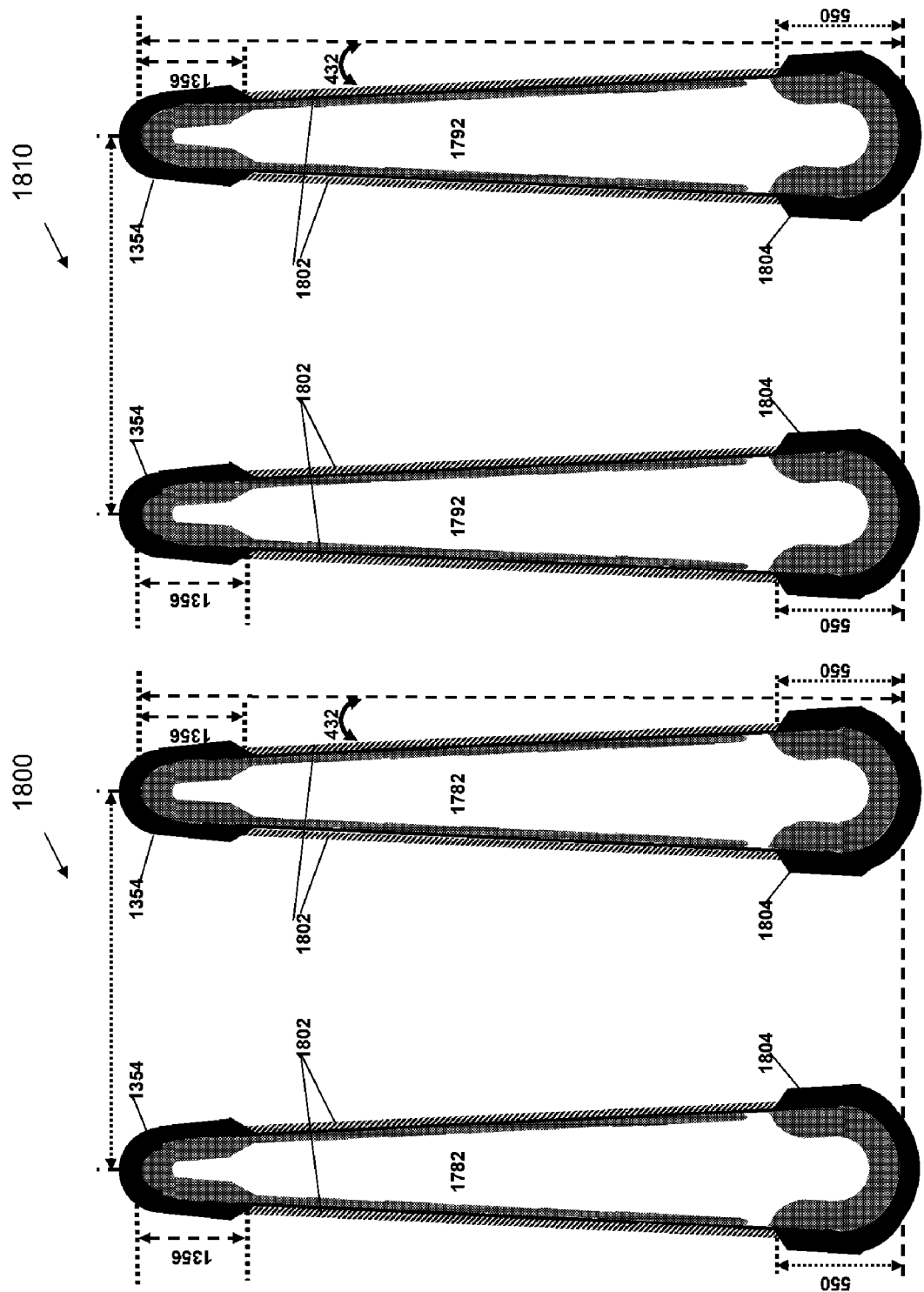

Continuing from FIG. 162A, FIG. 163A shows a Y-Y cross-sectional view 1800 of a unit cell within a hexagonal prism 3-D TFSC, with p-type prism posts 1342. The cell view 1800 is after self-aligned formation of: surface passivation oxide and anti-reflection coating (ARC) layer(s) 1802; emitter contact metal 1354 (e.g., silver, copper, aluminum; using a refractory metal barrier if necessary) with coverage height $L_{em}$ 1356 and base contact metal 1804 (silver, copper, aluminum; using a refractory metal barrier if necessary) with coverage height $L_{bm}$ 1806 by fire-through and/or selective plating. The hexagonal-prism sidewalls are in-situ-doped (at the time of 3-D TFSC substrate fabrication) with boron (either uniformly or in a graded profile, more lightly doped at the prism sidewall surface and more heavily doped towards the sidewall vertical center axis). The cell view is before mounting the cells onto a highly reflective rear mirror.

As noted above, all the cell doping polarities may be inverted. Continuing from FIG. 162B, FIG. 163B shows a Y-Y cross-sectional view 1810 of a unit cell within a dual-aperture hexagonal-prism 3-D TFSC, with n-type prism posts 1792. All the cell doping polarities are opposite of those shown in FIG. 163A. The cell view 1810 is after self-aligned formation of: surface passivation oxide and anti-reflection coating (ARC) layer(s) 1802; emitter contact metal 1354 (silver, copper, aluminum; using a refractory metal barrier if necessary) with coverage height $L_{em}$ 1356 and base contact metal 1804 (silver, copper, aluminum; using a refractory metal barrier if necessary) with coverage height $L_{bm}$ 1806 by fire-through and/or selective plating. The hexagonal-prism sidewalls are in-situ-doped (at the time of 3-D TFSC substrate fabrication) with phosphorus (either uniformly or in a graded profile, more lightly doped at the prism sidewall surface and more heavily doped towards the sidewall vertical center axis). The cell view is before mounting the cells onto a highly reflective rear mirror.

Continuing from FIG. 163A, FIG. 164A shows a Y-Y cross-sectional view 1820 of a unit cell after mounting the cell onto a detached highly reflective rear specular mirror 1336 with a polished mirror surface. A detached mirror is not integrated through direct material deposition on the cell. In one embodiment, the mirror is made of silver and/or aluminum (or a polished disk coated with silver and/or aluminum and/or Au), with reflectance greater than 95% for λ between 800 and 1200 nanometers. The rear mirror surface to base contact spacing (S) 1434 may be in the range of 0 (i.e., direct contact between the rear mirror and the hexagonal base contact; in this case the rear mirror also serves as the base electrical interconnect plane) up to roughly H (or a spacing as much as the height of the hexagonal prism cell—up to 100 to 500 microns).

Continuing from FIG. 163B, FIG. 164B shows a Y-Y cross-sectional view 1830 of a unit cell after mounting the cell onto a highly reflective rear diffuse mirror 1432 with textured mirror surface. In one embodiment, the mirror is silver-coated, with reflectivity greater than 95% for λ between 800 and 1200 nanometers.

FIG. 165A shows a cross-sectional view 1840 of several prism unit cells from the hexagonal-prism TFSC shown in FIG. 164A.

FIG. 165B shows a cross-sectional view 1850 of several prism unit cells from the hexagonal-prism TFSC shown in FIG. 164B.

FIG. 166 shows a cross-sectional view 1860 of the hexagonal prism TFSC above, mounted on and in contact with a detached diffuse (rough) high-reflectivity rear mirror 1432 (made of silver and/or aluminum and/or Au or their coatings). The rear mirror surface to base contact spacing (S) depicted here is zero and, thus, there is direct contact between the rear diffuse mirror and the cell base contact metal. Therefore, the rear mirror also serves as the base electrical interconnect plane. The rear mirror may be part of the solar module assembly (e.g., a printed-circuit board with silver-coated copper interconnects connecting to the cell emitter and base contact metallization and connecting the cells in series). This FIGURE shows several prism unit cells and corresponds to the same hexagonal-prism TFSC shown in FIG. 164B but with a zero mirror-to-base contact spacing 1434 (FIG. 164B shows one unit cell).

Figure 167A:
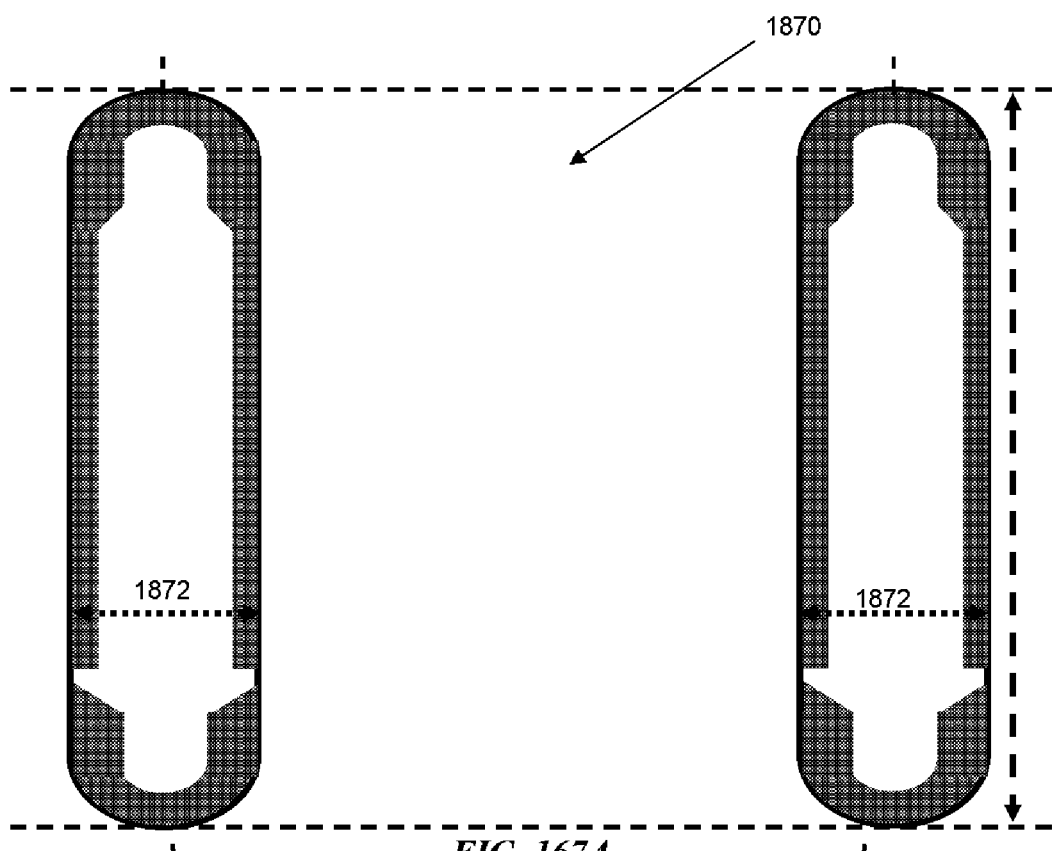

FIGS. 162A to 166 show 3-D TFSCs of this disclosure with tapered prism sidewalls. It is also possible to fabricate hexagonal-prism 3-D TFSCs (with or without rear base layers) which have substantially vertical prism sidewalls. For example, FIG. 167A shows a Y-Y cross-sectional view 1870 of a unit cell. Except for the sidewall profile (being vertical), other cell design features are essentially similar to those of the tapered-wall cell shown in FIG. 162A. Note the uniform hexagonal wall thickness ($T_s$) 1872 compared to FIG. 162A.

Figure 167B:
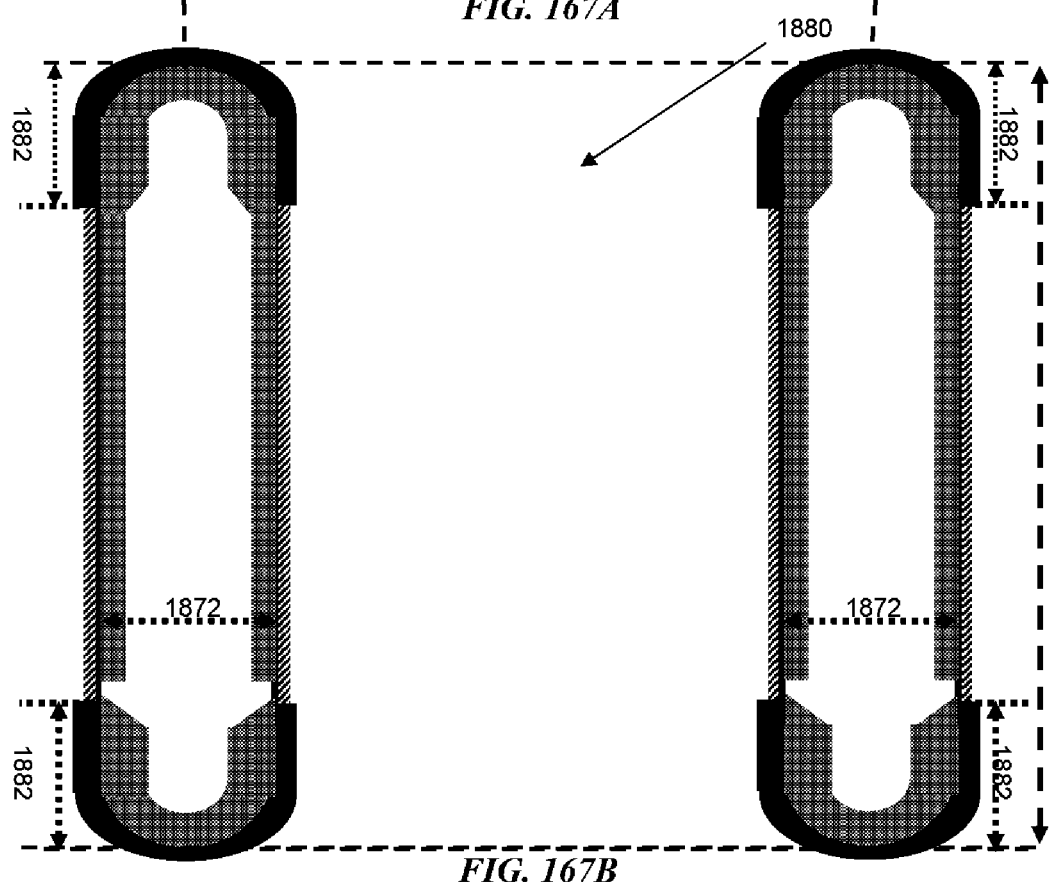

Continuing from FIG. 167A, FIG. 167B shows a Y-Y cross-sectional view 1880 of a unit cell. Except for the sidewall profile (being vertical), other cell features are essentially similar to those of the tapered-wall cell shown in FIG. 162A. Note $L_{tm}$ 1882 compared to FIG. 162A.

Figure 168:
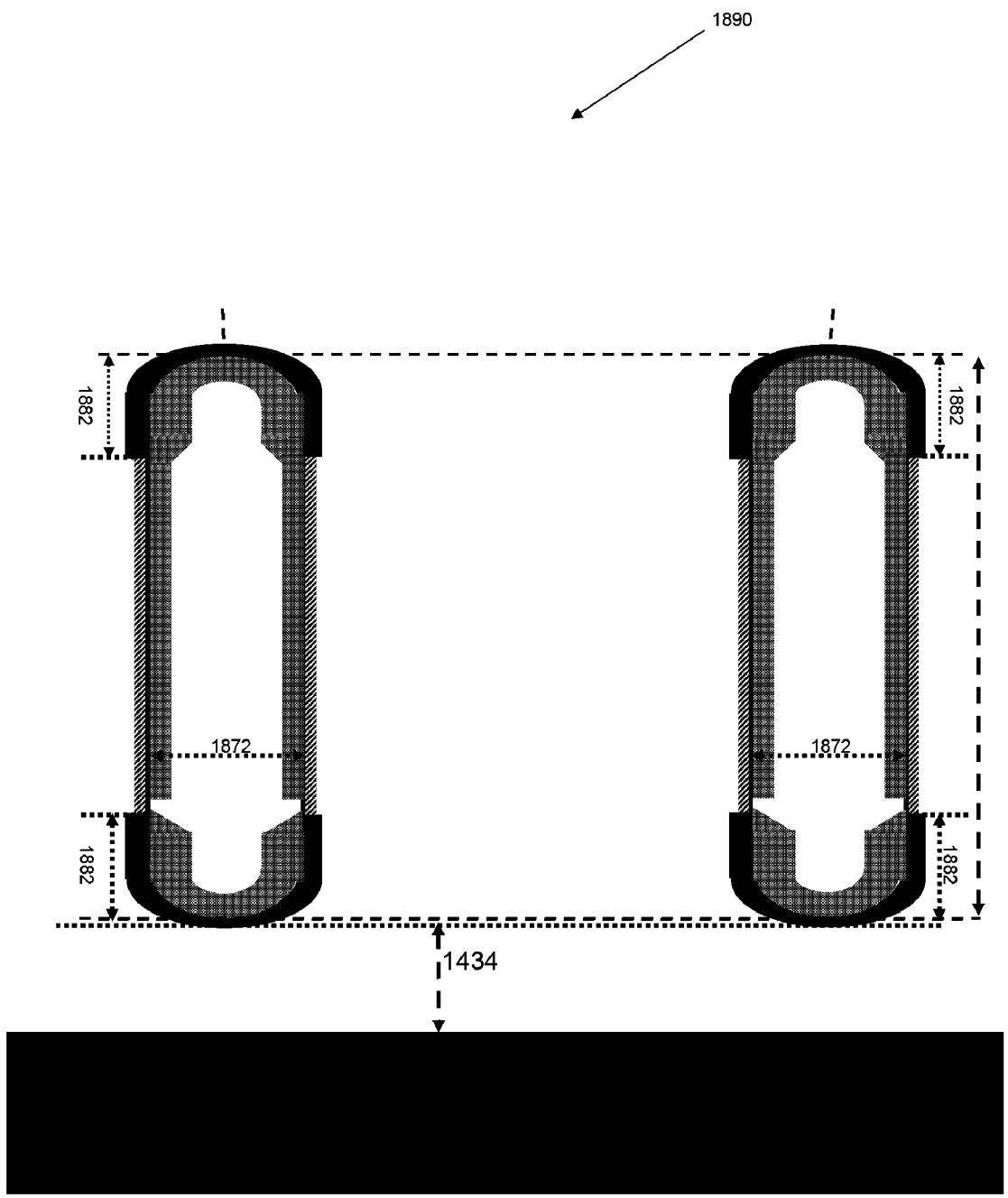

Continuing from FIG. 167B, FIG. 168 shows a Y-Y cross-sectional view 1890 of a unit cell after mounting the cell onto a reflective specular rear mirror 1336. This hexagonal prism cell has vertical prism sidewalls (i.e., equal top emitter and rear base prism sidewall widths). Except for the sidewall profile (being vertical), other cell features are essentially similar to those of the tapered-wall cell shown in FIG. 164A. Again, note $L_{tm}$ 1882 and the uniform hexagonal wall thickness ($T_s$) 1872.

Figure 169:
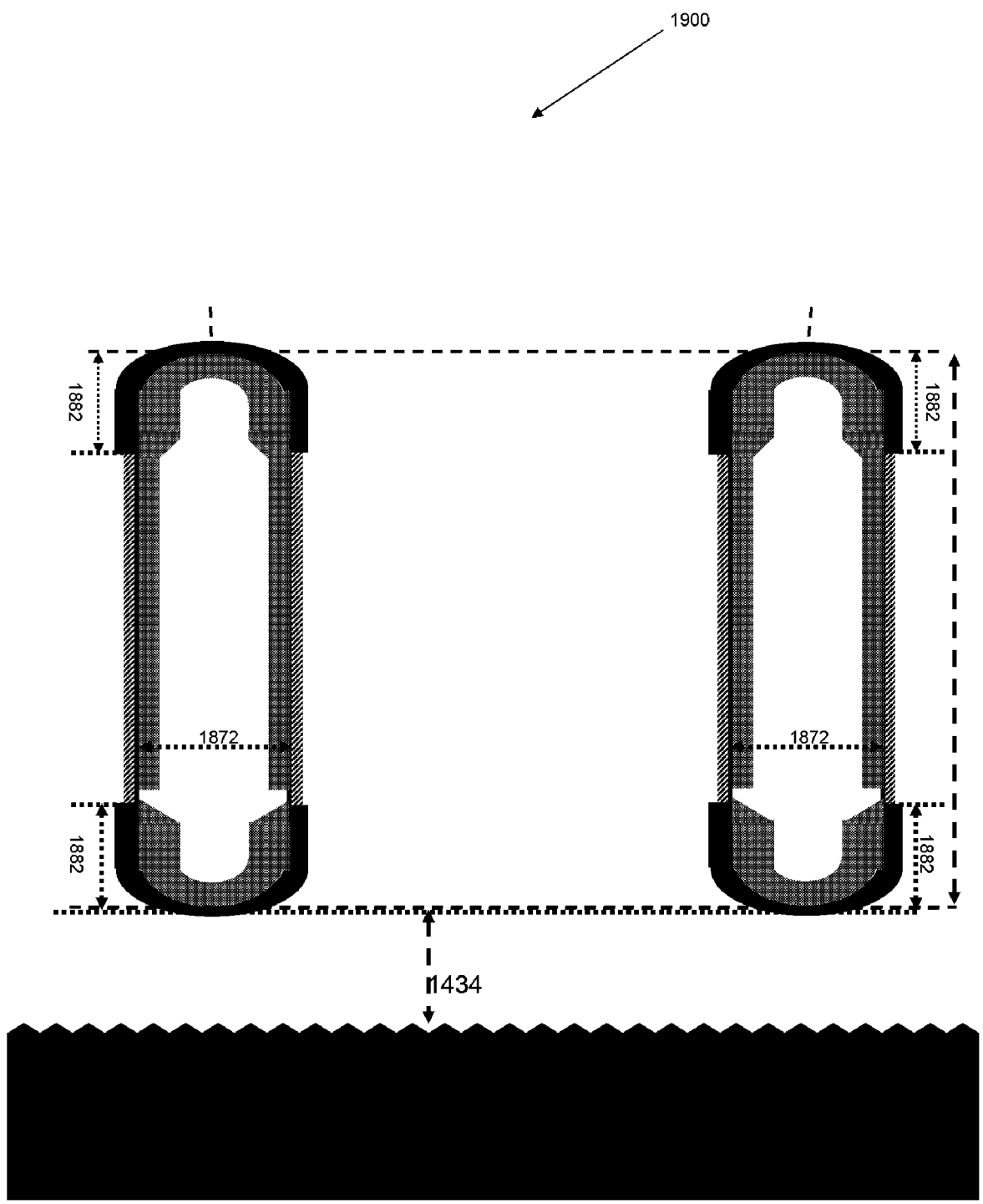

Again continuing from FIG. 167B, FIG. 169 shows a Y-Y cross-sectional view 1900 of a unit cell after mounting the cell onto a diffuse rear mirror 1432. This hexagonal prism cell has vertical prism sidewalls (i.e., equal top emitter and rear base prism sidewall widths). Except for the sidewall profile (being vertical), other cell features are similar to those of the tapered-wall cell shown in FIG. 164B. Again, note $L_{tm}$ 1882 and the uniform hexagonal wall thickness ($T_s$) 1872.

Figure 170:
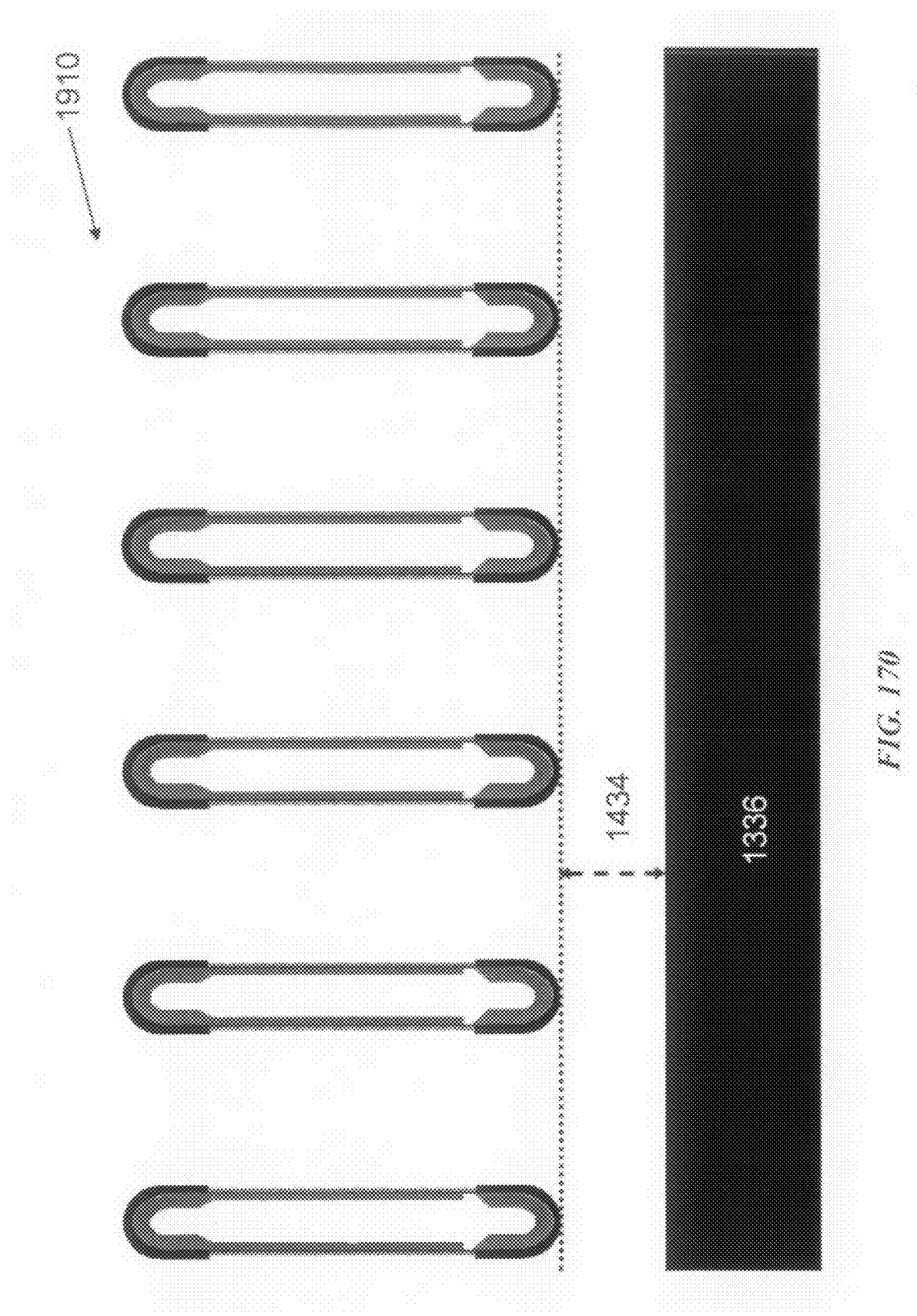

FIG. 170 shows a Y-Y cross-sectional view 1910 of a dual-aperture hexagonal-prism 3-D TFSC with vertical prism sidewalls and without a flat base layer, mounted on a detached specular high-reflectivity rear mirror 1336 (made of silver and/or aluminum and/or Au or their coatings). The rear mirror surface to base contact spacing (S) 1434 may be in the range of 0 (i.e., direct contact between the rear mirror and the base contact; in this case the rear mirror also serves as the base interconnect plane) up to roughly H (or a spacing as much as the height of the hexagonal prism cell). This FIGURE shows several prism unit cells and corresponds to the same hexagonal-prism cell shown in FIG. 168 (which shows one unit cell).

Figure 171:
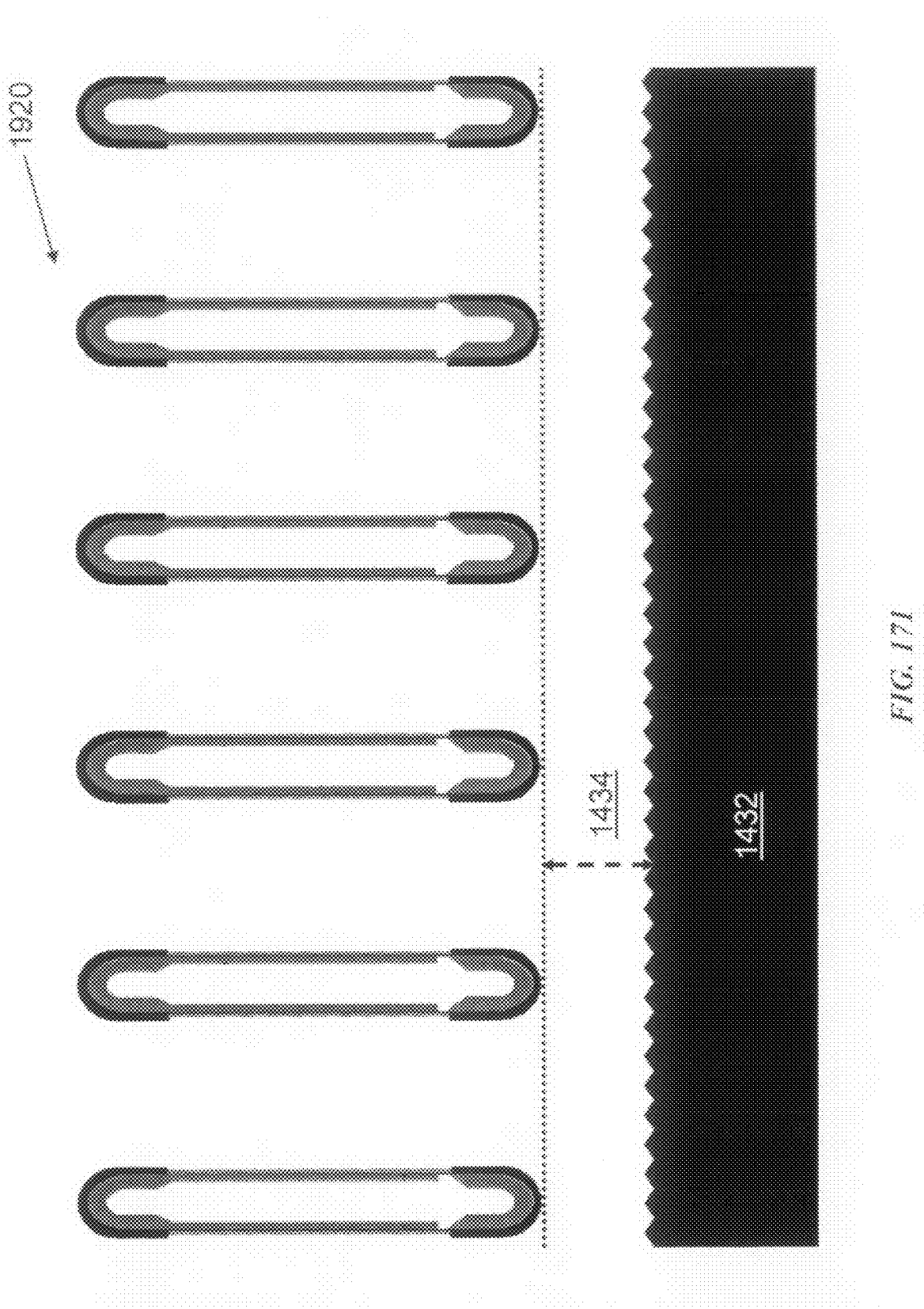

FIG. 171 shows a Y-Y cross-sectional view 1920 of a dual-aperture hexagonal-prism 3-D TFSC with vertical prism sidewalls and without a flat base layer, mounted on a detached diffuse high-reflectivity rear mirror 1432 (made of silver and/or aluminum and/or Au or their coatings). The rear mirror surface to base contact spacing (S) 1434 may be in the range of zero (i.e., direct contact between the rear mirror and the base contact; in this case the rear mirror also serves as the base interconnect plane) up to roughly H (or a spacing as much as the height of the hexagonal prism cell). This FIGURE shows several prism unit cells and corresponds to the same hexagonal prism cell shown in FIG. 169 (which shows one unit cell).

FIGS. 172A and 172B show enlarged views of a hexagonal-prism unit cell in a hexagonal-prism 3-D TFSC of this disclosure, both before and after cell fabrication (shown before and after self-aligned cell metallization).

FIG. 172A shows a quasi 3-D view 1930 of a single unit cell from a regular dual-aperture hexagonal-prism TFSC of this disclosure (shown for the cell without a rear base layer), before self-aligned base and emitter contact metallization. The prism sidewall surfaces are doped to form the selective emitter junctions (e.g., $n^+p$ junctions in boron-doped silicon base). This FIGURE corresponds to the cell fabrication process flow embodiments in FIGS. 154-159. FIG. 172A shows top hexagonal opening 1104, which may form the frontside self-aligned emitter metallization contacts; and rear (bottom) hexagonal opening 1106, which may form the rear selective base self-aligned contacts.

FIG. 172B shows a quasi 3-D view 1940 of a single unit cell from a regular hexagonal prism TFSC of this disclosure, after cell fabrication, including self-aligned base and emitter contact metallization. The dark region on the top 1332 of the unit cell is the self-aligned emitter contact metal; the rear 1334 of the unit cell is the self-aligned base contact metal. The prism sidewall surfaces are doped to form the selective emitter junctions (e.g., shallow $n^+p$ junctions with a junction depth of 0.2 to 0.5 micron in boron-doped silicon base).

FIG. 173 shows a partial view 1950 of multiple adjacent prism unit cells (compared to a single unit cell in FIG. 172B) after mounting the cell rear base side (base contact metal regions 1334) onto a rear mirror 1952 (specular 1336 or diffuse rear mirror 1432, as shown in previous FIGURES). The rear mirror 1952 may be made of a suitable planar material (e.g., copper or aluminum) flash-coated with silver or aluminum (e.g., using plating). The rear mirror may be copper interconnect pads or islands (plated with silver and/or aluminum) on a printed-circuit board (PCB) within a solar module assembly. Thus, the rear mirrors may also serve as base electrical interconnect planes. The rear base contact metal regions 1334 may be soldered or glued (or simply placed) onto the plated copper pads on the solar module PCB assembly. There is an optional step of silver flash coating of the assembled module structure to coat the solder joint surfaces with optically reflective silver (silver).

One of the important features of the hexagonal-prism 3-D TFSCs of this disclosure (both with and without rear base layers) is highly efficient collection of photogenerated carriers due to the unique device structure. For instance, the selective emitter junctions cover both surfaces of the prism sidewalls. Therefore, in the case of hexagonal-prism 3-D TFSCs with $n^+$ selective emitter junctions and in-situ-boron-doped starting hexagonal-prism 3-D thin-film TFSC substrates, any photogenerated electrons in the prism sidewalls are efficiently collected by the selective emitter junctions that cover both surfaces of the prism sidewalls. This makes the cells of this disclosure less demanding in terms of substrate defects or minority carrier diffusion length.

A minority carrier diffusion length just a few times larger than the prism sidewall thickness (e.g., by a factor of 2 to 5) provides sufficient material quality for effective collection of the photogenerated carriers with negligible recombination losses by one of the two selective emitter junctions located nearby in the adjacent sidewall surfaces. For instance, for a prism sidewall silicon film thickness of 5 microns, a minority carrier diffusion length of greater than 10 to 15 microns should provide sufficient substrate lifetime quality for achieving ultra-high cell efficiency due to minimal recombination losses. This is a key advantage compared to the current silicon wafer solar cells, where the photogenerated carriers may have to travel as far as 150 to 200 microns to be collected (thus, requiring a minority carrier diffusion length of at least hundreds of micrometers). As a result of this key advantage, it is possible to fabricate high-performance hexagonal-prism 3-D TFSCs based on the embodiments and designs of this disclosure (and their many derivatives) using a polycrystalline semiconductor absorber such as multicrystalline silicon or polysilicon, instead of the more expensive monocrystalline silicon.

FIG. 174 shows a view 2200 of a single unit cell 116 from the hexagonal-prism 3-D thin-film TFSC substrate for reference with calculations of the unit cell prism sidewall area, hexagonal-prism unit cell aperture area, and the sidewall to planar base area ratio. These calculations are performed for both types of single-aperture and dual-aperture hexagonal-prism 3-D TFSC substrates, both with and without rear base layers. The long diagonal dimension of the unit cell hexagon (d) 1124 may be chosen in the range of roughly 50 microns to roughly 500 microns, with more typical values in the range of 100 to 250 microns. The hexagonal-prism aspect ratio (H/d or height 1132 to long hexagonal diagonal dimension 1124 ratio) may be anywhere between roughly 0.5 and 5, with more typical values between 1 and 3. The silicon film thickness W 118 may be in the range of roughly 1 to 30 microns, with typical values in the range of 2 to 10 microns. Point A 2202 is the mid-point between $H_5$ 1120 and $H_6$ 1122. Point B 2204 is the mid-point between $H_2$ 1114 and $H_3$ 1116.

Short hexagonal diagonal distance between opposite unit cell points 2202 and 2204 (h)

$$h=(\sqrt{3}/2)d=0.866d$$

Planar surface Area of hexagonal-prism 3-D TFSC substrate hexagonal top (or rear) base ($S_{hb}$)

$$S_{hb}=[(3\sqrt{3})/8]\cdot d^2$$

Surface Area of hexagonal-prism unit cell cavity walls (for dual-aperture cell without rear flat silicon layer) ($S_{hp}$)

$$S_{hp}=3\cdot d\cdot H$$

Surface Area of hexagonal-prism unit cell cavity walls (for cell with rear flat silicon layer) ($S_{hp}$)

$$S_{hp}=3\cdot d\cdot H+[(3\sqrt{3})/8]\cdot d^2$$

For dual-aperture hexagonal-prism TFSC substrate without rear flat silicon layer:

$$S_{hp}/S_{hb}=[8/\sqrt{3}]\cdot(H/d)$$

For single-aperture hexagonal-prism TFSC substrate with rear flat silicon layer:

$$S_{hp}/S_{hb}=[8/\sqrt{3}]\cdot(H/d)+1$$

For the following calculations, assume W is the hexagonal prism sidewall silicon film thickness. Also assume that W/2 is the prism base silicon thickness for hexagonal-prism TFSC substrate with rear flat silicon layer:

Volume of silicon per prism unit cell for dual-aperture hexagonal-prism without rear flat silicon layer is:

$$V_{hp} = 3 \cdot d \cdot H \cdot (W/2) = (3/2) d \cdot H \cdot W$$

Volume of silicon per prism unit cell for single-aperture hexagonal-prism with rear flat silicon layer is:

$$V_{hp} = (3/2) d \cdot H \cdot W + [(3\sqrt{3}/8] \cdot d^2 (W/2)$$

The ratio of silicon volume $V_{hp}/V_F$ (or mass $M_{hp}/M_F$) for the hexagonal-prism 3-D thin-film TFSC substrate with prism sidewall thickness of W to volume (or mass) for a flat silicon wafer or film with the wafer thickness $W_F$ is as follows (shown for dual-aperture honeycomb-prism TFSC substrate without rear flat silicon layer):

$$V_{hp}/V_F = M_{hp}/M_F = (4/\sqrt{3})[(H/d) \cdot (W/W_F)]$$

The ratio for the single-aperture honeycomb-prism TFSC substrate with the rear flat silicon layer is as follows:

$$V_{hp}/V_F = M_{hp}/M_F = (4/\sqrt{3})[(H/d) \cdot (W/W_F)] + [W/(2 \cdot W_F)]$$

FIGS. 175 and 176 help to illustrate the important results of the above calculations. FIG. 175 shows a graph of hexagonal-prism area ratio, for TFSC substrates with and without rear base layers. The Y-axis is the ratio of hexagonal-prism unit cell aperture area to hexagonal-prism unit cell base area. The X-axis is the ratio of hexagonal-prism unit cell height to unit cell base diagonal dimension (H/d or unit cell aspect ratio). FIG. 176 shows a graph of hexagonal-prism mass ratio, for 3-D TFSC substrates with and without rear base layers. The Y-axis is the ratio of honeycomb-prism substrate silicon mass to the mass of a flat silicon wafer. The X-axis is the ratio of honeycomb prism sidewall thickness to the thickness of a flat silicon wafer.

FIGS. 175 and 176 show that the hexagonal-prism 3-D TFSC substrates may be designed such that they have much larger solar absorption surface area (in conjunction with a 3-D structure facilitating light capture/trapping) while consuming much less silicon volume (and hence much less silicon mass) compared to standard flat silicon wafers.

For a hexagonal-prism TFSC substrate without a rear flat layer, the total unit cell absorber silicon volume (or mass) is half the volume (or mass) of the unit cell prism sidewalls. This is because only half of the sidewall volume or mass belongs to each unit cell. For a hexagonal-prism TFSC substrate with a rear flat layer, the total unit cell absorber volume (or mass) includes the sum of half the volume (or mass) of the unit cell prism sidewalls and the volume (or mass) of the rear base layer.

As indicated, the 3-D thin-film hexagonal-prism TFSC substrate designs of this disclosure have substantially smaller silicon volume (or mass) compared to the current state-of-the-art solar cell silicon wafers, which typically use wafers with thicknesses of more than 200 microns. This is particularly true for designs with unit cell aspect ratios (H/d) of less than 3. For a given thin silicon film thickness and substrate size, the amount of silicon material used (as measured by the total silicon surface area, volume, or mass) in the hexagonal prism 3-D TFSC substrate is larger than that of a co-planar (flat) substrate with the same dimensions. However, the amount of silicon used is considerably less than the amount of silicon used in standard crystalline silicon (c-Si) wafer solar cells. The hexagonal-prism 3-D TFSCs of the current disclosure consume 3 times to over 10 times less silicon than standard c-Si wafer solar cells.

To achieve efficient light capture/trapping within the 3-D thin-film hexagonal-prism cell structure and very low effective surface reflectance with a reasonable (i.e., not excessive) area enlargement factor of $S_{hp}/S_{hb}$, the prism aspect ratio H/d may be in the range of 1 to 3.

One of the major advantages of the hexagonal prism 3-D TFSCs of this disclosure is negligible shadowing (optical reflectance loss) effects of the emitter and base contact metallization. Essentially any reflections from the base hexagonal contact metal may be received by the hexagonal prism silicon absorber and may contribute to the photogenerated current. Also, the combination of the thin prism sidewall on the top emitter side in conjunction with the rounding of the top hexagonal ridges before emitter contact metallization and the unit folded structure of the emitter contact metallization may ensure that most of the sunlight reflections would be redirected into the prism cavity sidewalls and/or the hexagonal prism cavity base layer (the rear base silicon layer in the case of cells with rear base layers and also the rear mirror, in the case of all hexagonal prism cell designs with and without rear base layers). A small fraction of the sunlight incident on the top of the reflective emitter contact may escape the hexagonal prism cell cavity/aperture. This may be further minimized by coating the cell with an additional layer of mechanical protection and ARC layer during glassless module assembly. As an example, FIG. 177 shows a schematic diagram 2210 of ray tracing for solar rays 2212 incident on a hexagonal prism unit cell reflective emitter contact. As indicated here, most of the sunlight rays (including incident rays $R_1$ 2214, $R_2$ 2216, $R_3$ 2218, $R_4$ 2220, $R_5$ 2222) incident on the folded emitter contact are reflected back (shown as reflected rays $R_1$ 2215, $R_2$ 2217, $R_3$ 2219, $R_4$ 2221, $R_5$ 2223, with $R_1$ 2225 being the lone exception) into the prism unit cell cavity 2224 and/or onto the rear mirror 2226 (or the rear base layer in the case of cells with rear base layers) and ultimately contribute to the TFSC electricity generation (due to the folded emitter contact metal design on the hexagonal prism top ridges). The prism sidewall and the emitter contact metal on the top may be optimally tapered in order to minimize any shadowing losses due to the emitter contact metal. Moreover, a protective transparent coating layer formed over the cell during the final solar module assembly (e.g., a proper coating layer formed by liquid spraying and curing over the cell) may further reduce the reflection losses associated with the top emitter contact metal. Optical waveguiding of the rays incident on the top of the emitter contact metal redirects the incident rays from the top of the emitter contact metal into the hexagonal-prism unit cell cavity 2224.

Figure 178:
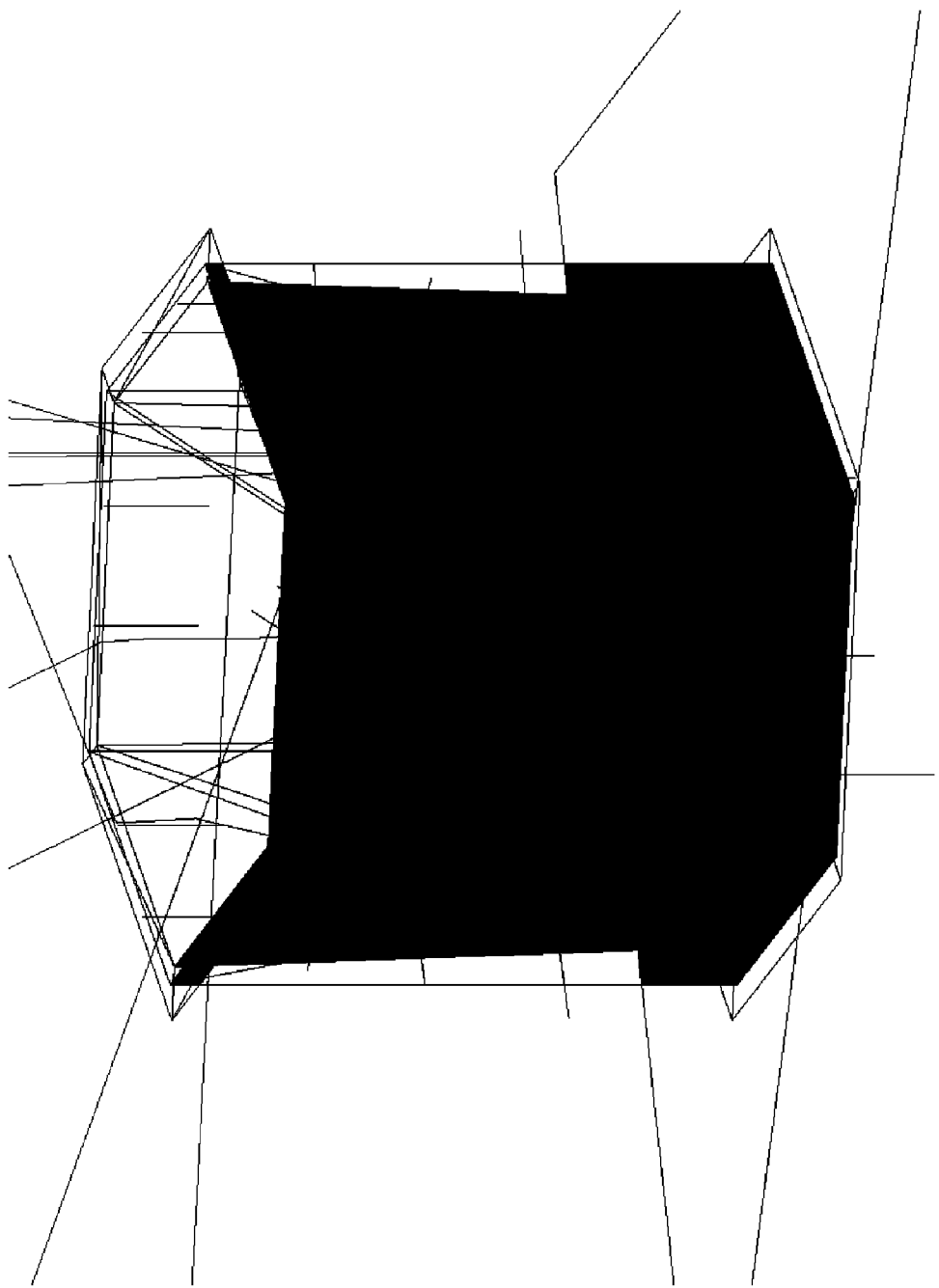
Figure 179:
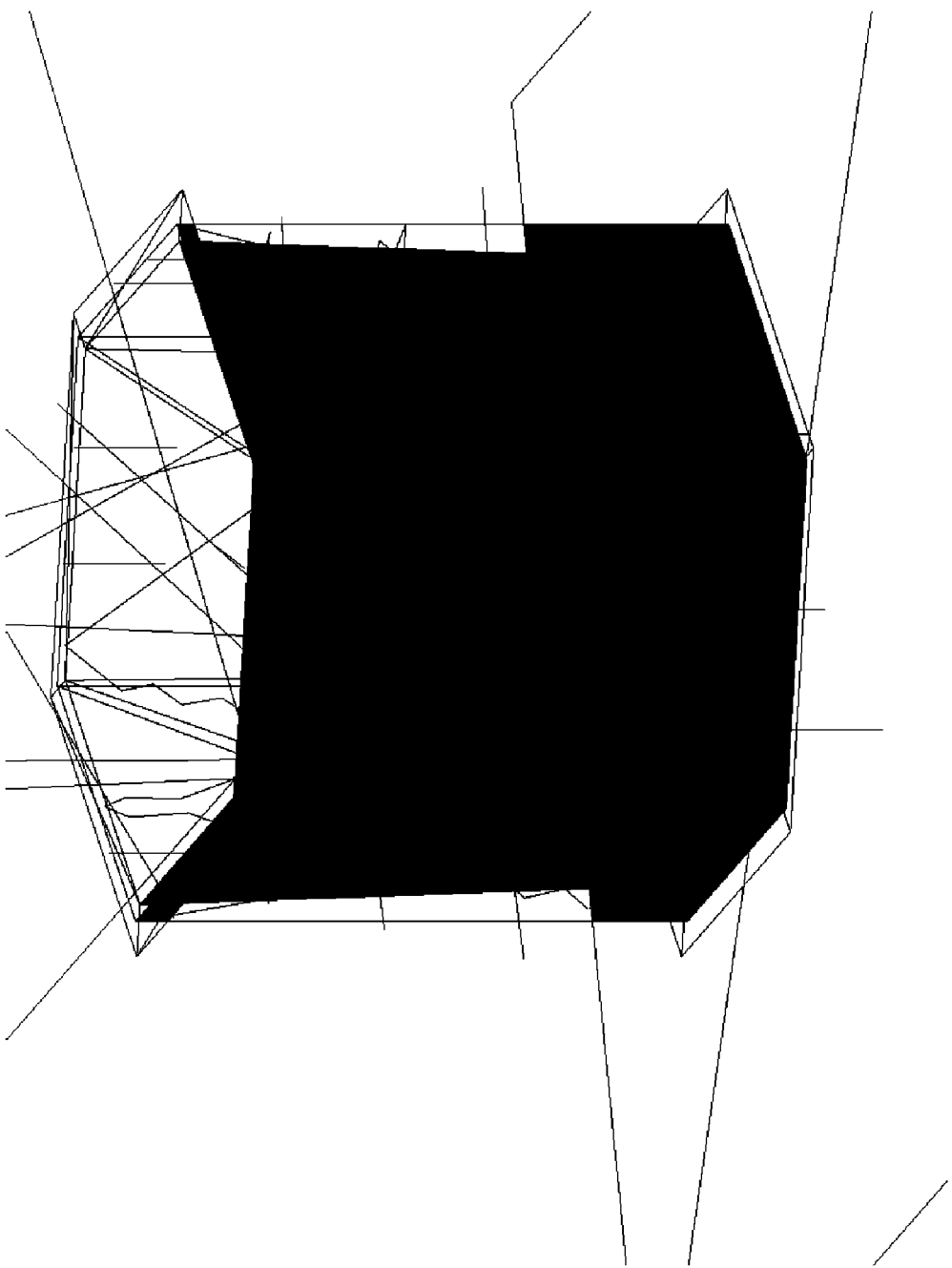
Figure 180:
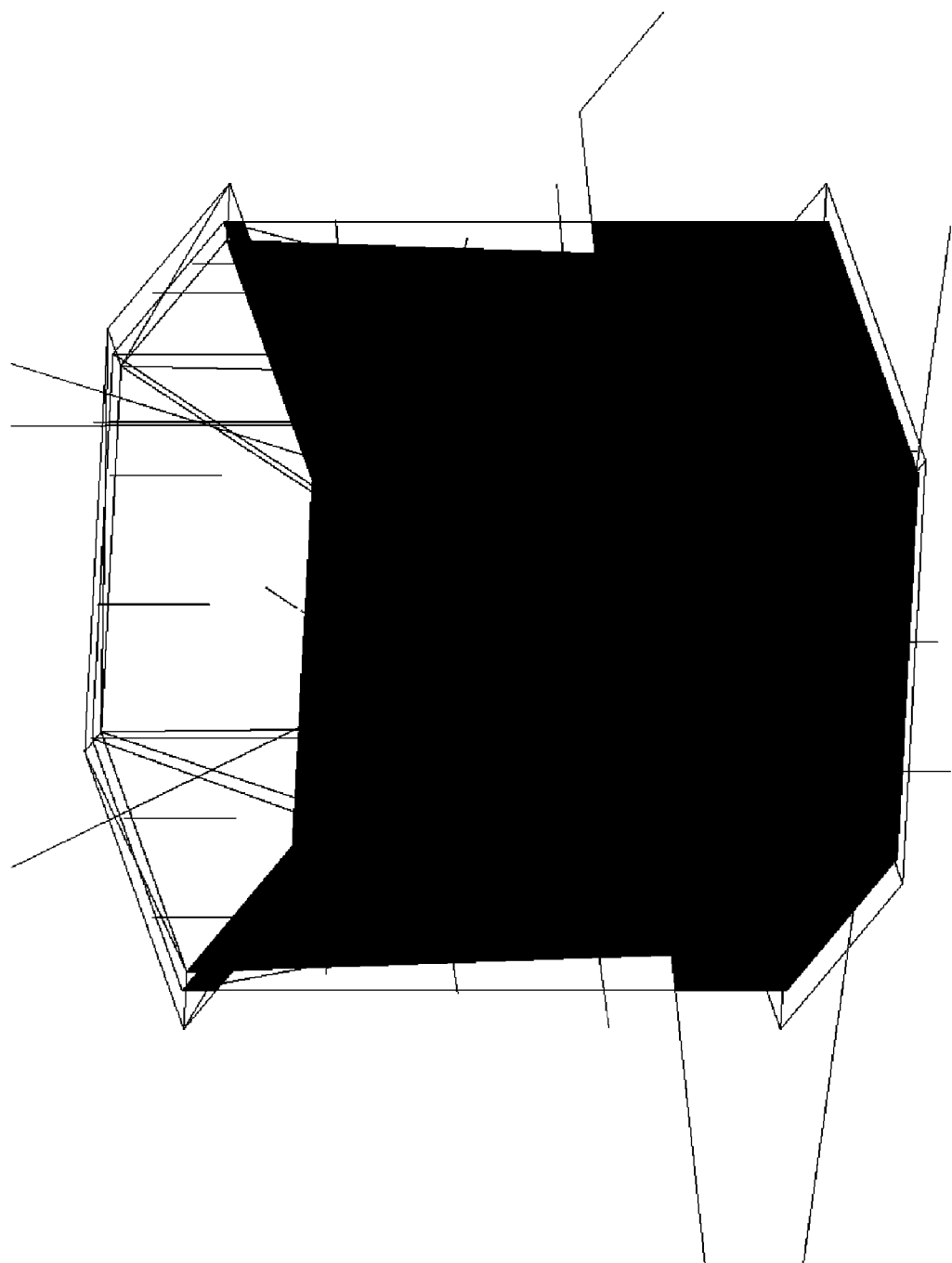
Figure 181:
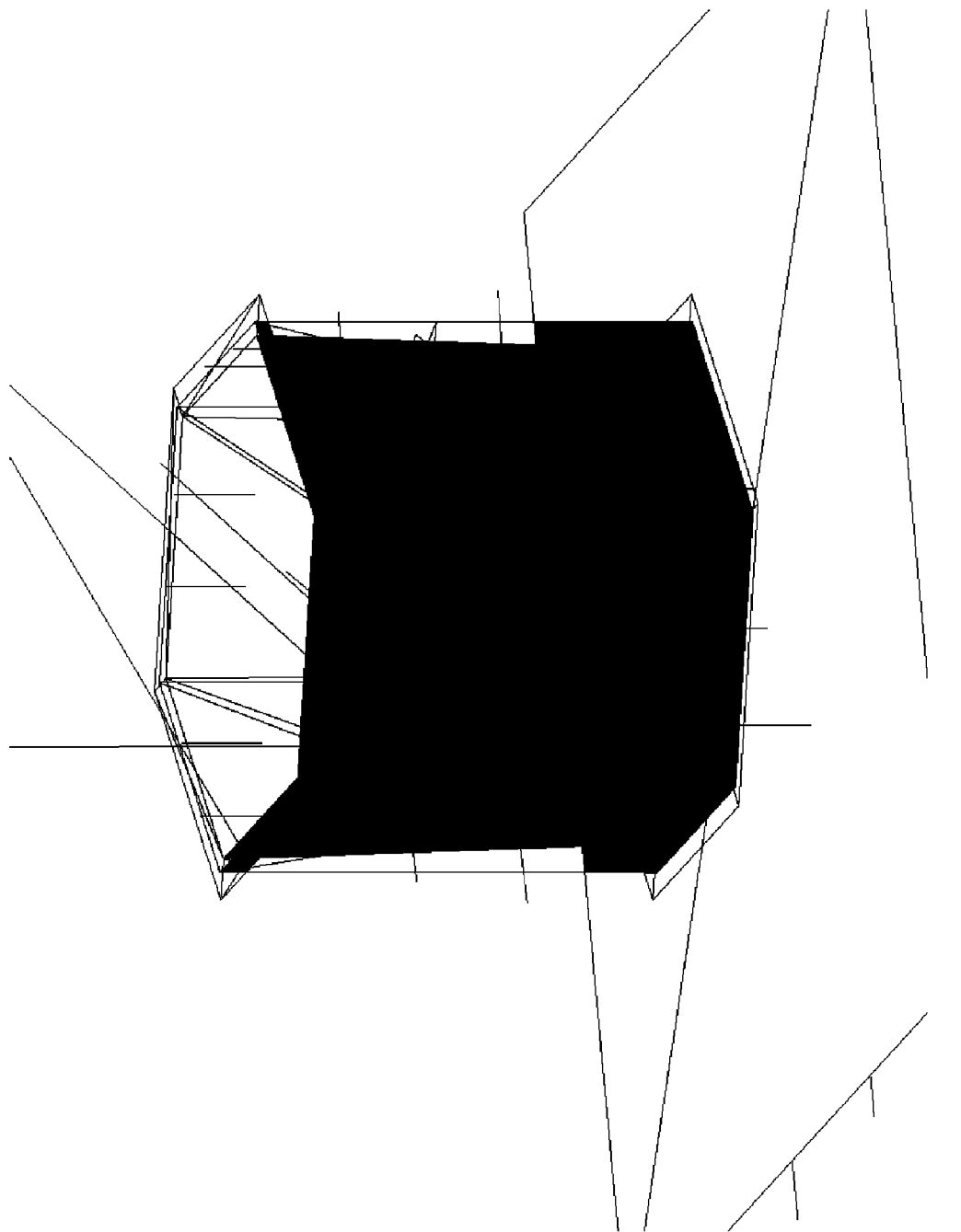

FIG. 178 shows ten rays 2212 incident on a hexagonal-prism unit cell at a normal angle of incidence for the purpose of ray tracing calculations. FIG. 179 shows ten rays 2212 at an angle of incidence of 45 degrees for the purpose of ray tracing calculations. FIG. 180 shows three rays 2212 at a normal angle of incidence for the purpose of ray tracing calculations. FIG. 181 shows three rays 2212 at an angle of incidence of 45 degrees for the purpose of ray tracing calculations.

FIG. 182 shows a summary graph of short circuit current density versus angle of incidence for several embodiments of the solar cells of the current disclosure. FIG. 182 also shows the ray tracing results for a hexagonal-prism unit cell with a base layer, indicating super-efficient light trapping. FIG. 183 shows a summary graph of the basic ray tracing modeling results for a single-aperture hexagonal-prism cell design of this disclosure, indicating both the STC cell efficiency and short-circuit current versus unit cell prism height. Note that ultra-high-efficiency (greater than 25% STC efficiency) capability of the cell designs of this invention has been verified through modeling. FIG. 184 shows a summary graph of the results of ray tracing modeling results in a single-aperture hexagonal-prism cell design of this invention (with a base layer), with maximum photocurrent plotted against incident angle. This FIGURE indicates that the emitter wrap-around metallization actually increases the photogenerated current density as a result of improved light trapping within the prism sidewalls.

Throughout descriptions of various embodiments of this disclosure, it has been stated that the hexagonal-prism 3-D TFSC substrate may be doped in-situ during semiconductor layer deposition (e.g., epitaxial silicon growth) onto the reusable templates. The hexagonal-prism 3-D TFSC substrate base doping may be uniform or graded. In case of optimal grading of the hexagonal prism 3-D TFSC substrate doping, the substrate may provide an internal electric field due to the graded substrate doping which may facilitate or aid photogenerated carrier collection due to a field-assisted carrier drift component. Dopant concentration grading may be done linearly, logarithmically, or in another suitable scaling method. As an example, FIG. 185 shows a graph of the selective emitter phosphorus and 3-D substrate boron doping profiles (prism sidewall-to-sidewall doping profile) in hexagonal prism 3-D TFSCs of this disclosure, indicating a representative graded base doping profile. As indicated before, the graded base doping profile helps with photogenerated carrier collection efficiency and a reduction of the base parasitic resistance (and the resulting ohmic losses), thus, improving the short circuit current and fill factor of the cells. This example is shown for a boron-doped base and phosphorus-doped emitter. In the case of hexagonal-prism cells with rear base layers, the graded base doping also creates a graded boron doping profile with the boron concentration being lower on the top surface (emitter side) of the rear base layer and increasing towards the lower surface (base side) of the rear base layer. This provides a desirable back-surface field (BSF) effect which improves the carrier collection efficiency in the rear base layer as well and reduces the surface recombination velocity in the rear base layer.

In order to maximize the hexagonal-prism 3-D TFSC efficiency, it is important to design the cell such that the ohmic losses associated with the electron and hole currents within the cell structure are minimized. This is in addition to the need to make the emitter and base interconnect metallization ohmic losses negligible. Assuming a boron-doped base and an n$^+$ selective emitter, the ohmic losses within the hexagonal-prism cell structure are dominated by the emitter-collected electrons traveling along the selective emitter region towards the emitter contact metal on the prism top (or the emitter current traveling from the emitter contact metal towards the selective emitter) as well as the base-collected holes (or the base current) traveling along the hexagonal prism boron-doped sidewall bulk towards the base contact metal at the rear of the cell (the above-mentioned carrier polarities would be inverted for phosphorus-doped n-type base and p$^+$ selective emitter).

Referring to FIG. 186, the following section outlines the summary calculation of the hexagonal prism TFSC ohmic losses due to the base current along the prism sidewalls. These calculations assume that all photogenerated current is in the prism sidewalls (and assume that the photogenerated current is negligible in the rear base layer in the cells with rear base layers). The results should be fairly similar to those obtained even after taking into account the photogenerated current due to the rear base layer for the cells with rear base layers. It is also assumed that the photogenerated current contribution is uniform along the height of the prism sidewall (i.e., each fixed small vertical segment of the prism sidewall contributes equally to the photogenerated current. Thus, the base ohmic losses may be estimated through a simple integration of the differential ohmic losses along the prism sidewall from rear to top of the prism (or from top to rear of the prism) as the photogenerated current increases from 0 to the maximum hexagonal-prism unit cell current. For the base ohmic losses to be negligible (less than 0.1% or $\frac{1}{1000}$ of the maximum cell power, assuming 200 W/m$^2$ maximum cell power generation), it is determined that the prism sidewall base sheet resistance should be less than roughly 300 Ω/square. This determines the minimum base boron doping concentration. In practice, the sheet resistance is chosen to be roughly 300 Ω/square and not much below that in order to prevent lowering of the minority carrier lifetime as a result of excessive base doping concentration. Minority carrier lifetimes in the range of more than 10 to more than 100 microseconds, or minority carrier diffusion length $L_{eff}$ on the order of a multiple (e.g., by a factor of more than 2 to 5) of the hexagonal prism sidewall thickness should meet the high-efficiency requirements for the cells.

To calculate base ohmic losses, assume all base current is produced in the prism sidewall. The photo-generated base current is assumed to increase linearly between z=0 and z=H from 0 to $I_0$ (where $I_0$ is the photo-generated current per prism unit cell). The base current is collected at the base contact metal at z=H (at the rear of the honeycomb prism base layer). The base ohmic loss per unit cell ($P_{uc}$) is calculated as follows ($R_{sb}$ is the prism sidewall base sheet resistance; $I_0=J_0 S_{hb}$, where $J_0$ is the solar cell maximum-power current density and $S_{hb}$ is the surface area of the prism hexagonal aperture).

$$P_{uc} = \int_0^H \frac{2R_{sb}dz}{3d}\left(\frac{I_0 z}{H}\right)^2 = \frac{2R_{sb}I_0^2}{9}\left(\frac{H}{d}\right) = \frac{2R_{sb}J_0^2 S_{hb}^2}{9}\left(\frac{H}{d}\right)$$

The base ohmic loss per unit area ($P_{bl}$) is calculated by dividing Puc by the hexagonal aperture area:

$$P_{bl} = P_{uc}/S_{hb}$$
$$= \frac{2R_{sb}J_0^2 S_{hb}}{9}\left(\frac{H}{d}\right)$$
$$= \frac{2R_{sb}J_0^2}{9}\left(\frac{H}{d}\right)[3\sqrt{3}/8]\cdot d^2$$
$$P_{bl} = \frac{\sqrt{3}\,R_{sb}J_0^2\,dH}{12}$$

Assume d=100 microns, H=300 microns and $J_0$=40 mA/cm$^2$:

$$P_{bl}=(\sqrt{3}/12)R_{sb}(40\times10^{-3}\times10^4)^2(100\times10^{-6})(300\times10^{-6})$$

$$P_{bl}=6.93\times10^{-4}R_{sb}\text{ (units are in W/m}^2\text{)}$$

Assume $P_{bl}$ is much less than 200 W/m$^2$; for instance, assume: $P_{bl}=(\frac{1}{1000})\,200=0.2$ W/m$^2$:

$$P_{bl}=0.2=6.93\times10^{-4}R_{sb}\rightarrow R_{sb}=288.6\text{ Ω/square}$$

Thus, $R_{sb}$ should be less than 300 Ω/square in order for the base ohmic losses to be negligible.

The selective emitter sheet resistance is typically in the range of roughly 75 Ω/square up to roughly 150 Ω/square. Thus, the ohmic losses associated with the selective emitter current are expected to be less than the ohmic losses due to the base current (for base sheet resistance values on the order of 300 Ω/square as shown above. In summary, we may conclude that for optimal hexagonal prism 3-D TFSCs of this disclosure, both with and without rear base layers, the overall internal (within Si) ohmic losses due to the base and emitter current components may be made negligible (or roughly 0.1% of the photogenerated cell power or less), when the cells use prism sidewall layers (and rear base layers in the case of cells with such rear base layers) which have sufficient base doping to produce a sheet resistance of roughly 300 Ω/square (or less), and have selective emitter with a sheet resistance value of less than 150 Ω/square. Of course, these sheet resistance values may still be increased while maintaining the internal ohmic losses to much less than 1% of the photogenerated cell power.

The hexagonal prism 3-D TFSC maximum base sheet resistance value calculated above may be used in conjunction with the silicon thickness forming the hexagonal prism sidewalls in order to determine the optimal (or near-optimal) base resistivity and doping concentration.

Assuming a boron-doped p-type base, FIG. 187 shows the approximate desired base boron doping concentration and electrical resistivity values for different values of hexagonal prism 3-D silicon film thickness in the range of 2 to 30 microns in order to keep the base ohmic losses to below 0.1% of the TFSC power. These values were obtained based on the calculations outlined above. The same methodology may be applied to optimizing the cell doping concentrations and profiles for cells using other absorber materials other than c-Si (such as polysilicon, amorphous silicon, or a non-Si semiconductor material). Moreover, while these calculations are shown for determining the approximate optimal doping concentrations for uniformly doped base regions, they may also serve as guides for determining the desired in-situ-doped graded base profiles.

Assume $P_{bl}$ is much less than 200 W/m$^2$; e.g., assume: $P_{bl}=(1/1000)\ 200=0.2$ W/m$^2$:

$$P_{bl}=0.2=6.93\times 10^{-4}R_{sb} \rightarrow R_{sb}=288.6\ \Omega/\text{square}$$

Thus, $R_{sb}$ should be less than 300 Ω/square in order for the base ohmic losses to be negligible.

$$R_{sb}\approx\rho/W \rightarrow \rho\approx R_{sb}\times W, \text{ where } W \text{ is the silicon thickness.}$$

For $R_{sb}\approx 300$ Ω/square, the maximum base resistivity values for various prism silicon thicknesses are shown in FIG. 187. Note that the results are shown for a hexagonal-prism substrate with d of 100 microns and H of 300 microns. Selective emitter sheet resistance is chosen to be on the order of 100 Ω/square to 150 Ω/square; therefore, the emitter current ohmic losses are less than the base current ohmic losses and are expected to be much less than 0.1% of the maximum cell power generation.

The hexagonal-prism 3-D TFSC substrates of this disclosure may utilize peripheral thick silicon frames, both for added mechanical support and also to facilitate formation of wrap-through or wrap-around emitter contact metallization (for ease of solar module assembly). FIGS. 161A and 161B show the Y-Y cross-sectional views of a hexagonal-prism 3-D TFSC substrate using a thick silicon frame, before and after TFSC fabrication (relative substrate dimensions not shown to scale since in practice the a large substrate such as a 200 mm×200 mm substrate has thousands to millions of prism unit cells). The thick silicon frame may be separately made from very low-cost silicon material (such as metallurgical grade or reclaim silicon wafers). FIG. 188 shows various schematic views 2230 of the thick silicon frame, the silicon frame slivers, and representative method to produce (e.g., cut) silicon slivers from very-low-cost round (e.g., reject silicon from microelectronics) or square-shaped (or rectangular) cast silicon (or reclaim Si) substrates. The slivers may be made of very low-cost crystalline or multicrystalline silicon such as metallurgical-grade cast Si. A round 2232 or square-shaped 2234 silicon wafer (e.g., a 200 mm×200 mm cast metallurgical-grade silicon substrate) may be used to produce hundreds of silicon slivers 2236 by a cutting process such as laser cutting (four slivers used to make a thick silicon frame for a 3-D TFSC substrate by a welding process such as electron-beam welding).

These slivers 2236 may be used to make the thick silicon frames for the substrates shown in FIGS. 161A and 161B. The separately fabricated thick silicon frame may then be integrally attached to the hexagonal-prism 3-D TFSC substrates, in embodiment before 3-D thin-film cell processing, by one of the following techniques: electron-beam welding at several peripheral spots/junctions; attachment during the hexagonal prism 3-D TFSC substrate fabrication silicon deposition by placing the peripheral thick silicon frame on the template and allowing seamless attachment of the thick silicon frame to the 3-D TFSC substrate by the silicon deposition process; or a clean cured epoxy.

Top view 2240 shows a thick silicon frame to be fused to the 3-D TFSC substrate. The silicon frame thickness 2242 is roughly 50 to 500 microns. There are welded (e.g., e-beam-welded) joints 2244 (four welded joints), where L 2246 is roughly 150 to 300 millimeters, and where W 2248 is roughly 100 to 1000 microns. The slivers 2236 may also have through-holes (shown in view 2250) to help with the wrap-through/wrap-around emitter metallization contacts.

The main sources of efficiency drop from the cell-level efficiency to the module-level efficiency (efficiency gap between the cells and modules) in the state-of-the-art prior art commercial solar cells and modules are: ohmic power losses due to the cell electrical contacts and interconnects; ohmic power losses due to the cell-to-module electrical interconnects as well as the module cell-to-cell electrical interconnects (connecting the cells in series and/or in combination series/parallel); ratio of total active front cell area to the total module front area (area cells-to-module area ratio); and frontside glass cover reflectance (and transmittance) losses. The combination of these losses may cause a cell-to-module efficiency drop or gap of at least roughly 4% to 7% in the state-of-the-art prior art solar modules. The solar cell and module assembly designs of this disclosure enable a substantial reduction of this cell-to-module efficiency gap to below roughly 1% to 3%. This is accomplished by: high ratio of active cell area to module area (more than 99%); much reduced ohmic power losses due to the cell and module electrical contact/interconnects (to well below 1% to 2% due to the unique cell and module contact and interconnect designs and the printed-circuit board assembly features); and substantially reduced frontside cover optical reflectance/transmittance losses due to glassless module passivation or textured-glass-covered module designs (optical reflectance/transmittance losses reduced to less than 1%).

In summary, the disclosed subject matter provides solar module structures and methods for assembling solar module structures. The solar module structures comprise three-dimensional single and dual aperture thin-film solar cells arranged in solar module structures. The three-dimensional thin-film solar cell comprises a semiconductor substrate with self-aligned selective emitter regions and self-aligned base diffusion regions. The solar module structures using three-dimensional dual-aperture thin-film solar cells may be used in solar glass. The solar module structures using three-dimensional single-aperture thin-film solar cells may be used in building and rooftop applications.

The foregoing description of the preferred embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:

1. A solar photovoltaic module structure having reduced manufacturing cost and improved conversion efficiency, comprising:
   a plurality of three-dimensional monocrystalline silicon thin-film solar cells within said solar photovoltaic module structure, each three-dimensional monocrystalline silicon thin-film solar cell comprising:
   a three-dimensional monocrystalline silicon thin-film solar cell substrate having an area measuring at least 125 mm×125 mm and having a set of structural surface topography features;
   said set of structural surface topography features at predetermined locations on said three-dimensional monocrystalline silicon thin-film solar cell substrate comprising a plurality of discrete and isolated hexagonal cavities having sidewalls and with central axes of said discrete and isolated hexagonal cavities being positioned substantially perpendicular to a light capturing surface of said three-dimensional monocrystalline silicon thin-film solar cell substrate, said discrete and isolated hexagonal cavities associated with a first set of geometrical aspect ratios and dimensions, said first set of geometrical aspect ratios comprising a ratio between height and hexagonal diagonal dimension and being approximately in the range of 0.5 to 5;
   said sidewalls comprising a plurality of interconnected continuous cavity boundary walls interspersed among and bordering said plurality of discrete and isolated hexagonal cavities associated to construct said three-dimensional monocrystalline silicon thin-film solar cell substrate as a contiguous free-standing substrate and further associated with a second set of geometrical aspect ratios and dimensions, said second set of dimensions comprising cavity boundary wall widths ranging between 2 to 10 microns on said light capturing surface of said three-dimensional monocrystalline silicon thin-film solar cell substrate;
   said three-dimensional monocrystalline silicon thin-film solar cell substrate and said set of structural surface topography features cooperating to comprise a free-standing, self-supporting three-dimensional monocrystalline silicon thin-film solar cell with sufficient mechanical rigidity and resilience for assembly in said solar photovoltaic module structure, said solar photovoltaic module utilizing said plurality of three-dimensional monocrystalline silicon thin-film solar cells with a solar cell efficiency of at least approximately 20%;
   base and emitter regions on said three-dimensional monocrystalline silicon thin-firm solar cell substrate; and
   base and emitter metallization regions on said base and emitter regions;
   a top encapsulant material layer positioned on said light capturing surface of said three-dimensional monocrystalline silicon thin-film solar cell substrate;
   a printed circuit board positioned on a surface other than said light capturing surface of said three-dimensional monocrystalline silicon thin-film solar cell substrate and electrically interconnecting said base and emitter metallization regions of said plurality of three-dimensional monocrystalline silicon thin-film solar cells;
   a rear encapsulant layer adjacent to said printed circuit board opposite said three-dimensional monocrystalline silicon thin-film solar cells; and
   a protective back sheet adjacent to said rear encapsulant layer.

2. The solar photovoltaic module structure of claim 1, further comprising a glass layer.

3. The solar photovoltaic module structure of claim 2, wherein said glass layer comprises a separate glass cover.

4. The solar photovoltaic module structure of claim 1, wherein said protective back sheet comprises a Tedlar protective back sheet.

5. The solar photovoltaic module structure of claim 1, wherein each three-dimensional monocrystalline silicon thin-film solar cell further comprises a peripheral cell frame.

* * * * *